US010686141B2

(12) United States Patent
Hatakeyama et al.

(10) Patent No.: US 10,686,141 B2
(45) Date of Patent: Jun. 16, 2020

(54) POLYCYCLIC AROMATIC COMPOUND

(71) Applicants: Kwansei Gakuin Educational Foundation, Nishinomiya, Hyogo (JP); JNC Corporation, Chiyoda-ku, Tokyo (JP)

(72) Inventors: Takuji Hatakeyama, Hyogo (JP); Soichiro Nakatsuka, Hyogo (JP); Hajime Gotoh, Hyogo (JP); Yasuyuki Sasada, Chiba (JP); Motoki Yanai, Chiba (JP); Toshiaki Ikuta, Chiba (JP)

(73) Assignees: Kwansei Gakuin Educational Foundation, Hyogo (JP); JNC Corporation, Tokyo (JP)

( * ) Notice: Subject to any disclaimer, the term of this patent is extended or adjusted under 35 U.S.C. 154(b) by 176 days.

(21) Appl. No.: 15/696,527

(22) Filed: Sep. 6, 2017

(65) Prior Publication Data

US 2018/0069182 A1 Mar. 8, 2018

(30) Foreign Application Priority Data

Sep. 7, 2016 (JP) ................................ 2016-174209

(51) Int. Cl.

*H01L 51/50* (2006.01)
*H01L 51/00* (2006.01)

(Continued)

(52) U.S. Cl.

CPC ............ *H01L 51/0071* (2013.01); *C07F 5/02* (2013.01); *C07F 7/0816* (2013.01); *C07F 7/2208* (2013.01); *C07F 7/2224* (2013.01); *C07F 7/30* (2013.01); *C07F 9/6584* (2013.01); *C07F 9/65683* (2013.01); *C07F 9/65685* (2013.01); *C07F 9/90* (2013.01); *C07F 9/94* (2013.01);

(Continued)

(58) Field of Classification Search

None

See application file for complete search history.

(56) References Cited

U.S. PATENT DOCUMENTS

2004/0131881 A1 7/2004 Zheng et al.
2007/0106103 A1 5/2007 Ikeda et al.

(Continued)

FOREIGN PATENT DOCUMENTS

EP 3109253 A1 12/2016
JP 2001-172232 A 6/2001

(Continued)

OTHER PUBLICATIONS

Krebs et al.Synthesis, Structure, and Properties of 4,8,12-Trioxa-12c-phospha-4,8,12,12c-tetrahydrodibenzo[cd,mn]pyrene, a Molecular Pyroelectric, 1997, Journal of the American Chemical Society, 119(6) 1208-1216 (Year: 1997).*

Faldt et al., Synthesis, structure and properties of various molecules based on the 4,8,12-trioxa-4,8,12,12c-tetrahydrodibenzo[cd, mn]pyrene system with an an evaluation of the effect of differing molecular substitution patterns on space group symmetry, 1997, J. of Chem. Soc. Perkin Transaction 2, 11, 2219-2227.*

*Primary Examiner* — Gregory D Clark

(74) *Attorney, Agent, or Firm* — Foley & Lardner LLP

(57) ABSTRACT

By providing a novel polycyclic aromatic compound in which a plurality of aromatic rings are linked via a boron atom, a nitrogen atom, or the like, options of a material for an organic EL element are increased. In addition, by using the novel polycyclic aromatic compound as a material for an organic electroluminescent element, an excellent organic EL element is provided.

18 Claims, 1 Drawing Sheet

(51) Int. Cl.

| | |
|---|---|
| ***C07F 7/30*** | (2006.01) |
| ***C07F 9/6568*** | (2006.01) |
| ***C07F 7/22*** | (2006.01) |
| ***C07F 9/94*** | (2006.01) |
| ***C07F 7/08*** | (2006.01) |
| ***C07F 9/90*** | (2006.01) |
| ***C07F 5/02*** | (2006.01) |
| ***C07F 9/6584*** | (2006.01) |

(52) U.S. Cl.
CPC ...... *H01L 51/0059* (2013.01); *H01L 51/0077* (2013.01); *H01L 51/0094* (2013.01); *H01L 51/5084* (2013.01); *H01L 51/5092* (2013.01); *H01L 51/008* (2013.01); *H01L 51/0085* (2013.01); *H01L 51/5016* (2013.01); *H01L 51/5056* (2013.01); *H01L 51/5072* (2013.01)

(56) References Cited

U.S. PATENT DOCUMENTS

| | | | | |
|---|---|---|---|---|
| 2009/0295275 | A1* | 12/2009 | Parham ................ | C09B 23/148 313/504 |
| 2012/0319052 | A1 | 12/2012 | Brocke et al. | |
| 2014/0058099 | A1 | 2/2014 | Wakamiya et al. | |
| 2015/0236274 | A1 | 8/2015 | Hatakeyama et al. | |

FOREIGN PATENT DOCUMENTS

| | | | | |
|---|---|---|---|---|
| JP | 2005-170911 A | | 6/2005 | |
| JP | 2016219487 | * | 12/2016 | ............ H01L 51/50 |
| JP | 2017079267 | * | 4/2017 | ............ H01L 51/50 |
| WO | WO 2004/061047 A2 | | 7/2004 | |
| WO | WO 2011/107186 A2 | | 9/2011 | |
| WO | WO 2012/118164 A1 | | 9/2012 | |
| WO | WO 2015/102118 A1 | | 7/2015 | |

* cited by examiner

POLYCYCLIC AROMATIC COMPOUND

CROSS-REFERENCE TO RELATED APPLICATIONS

This application claims priority from Japanese application JP 2016-174209, filed Sep. 7, 2016.

BACKGROUND

Technical Field

The present invention relates to a polycyclic aromatic compound, and an organic electroluminescent element, an organic field effect transistor, and an organic thin film solar cell using the polycyclic aromatic compound, as well as a display apparatus and a lighting apparatus.

Related Art

Conventionally, a display apparatus employing a luminescent element that is electroluminescent can be subjected to reduction of power consumption and thickness reduction, and therefore various studies have been conducted thereon. Furthermore, an organic electroluminescent element formed from an organic material has been studied actively because weight reduction or size expansion is easily achieved. Particularly, active research has been hitherto conducted on development of an organic material having luminescence characteristics for blue light, which is one of the three primary colors of light, and development of an organic material having charge transport capability for holes, electrons, and the like (having a potential for serving as a semiconductor or a superconductor), irrespective of whether the organic material is a high molecular weight compound or a low molecular weight compound.

An organic EL element has a structure having a pair of electrodes composed of a positive electrode and a negative electrode, and a single layer or a plurality of layers disposed between the pair of electrodes and containing an organic compound. The layer containing an organic compound includes alight emitting layer, a charge transport/injection layer for transporting or injecting charges such as holes or electrons, and various organic materials suitable for these layers have been developed.

As a material for a light emitting layer, for example, a benzofluorene-based compound or the like has been developed (WO 2004/061047 A). Furthermore, as a hole transport material, for example, a triphenylamine-based compound or the like has been developed (JP 2001-172232 A). As an electron transport material, for example, an anthracene-based compound or the like has been developed (JP 2005-170911 A).

Furthermore, in recent years, a material obtained by improving a triphenylamine derivative has also been reported as a material used in an organic EL element or an organic thin film solar cell (WO 2012/118164 A). This material is characterized in that flatness thereof has been increased by linking aromatic rings constituting triphenylamine with reference to N,N'-diphenyl-N,N'-bis(3-methylphenyl)-1,1'-biphenyl-4,4'-d iamine (TPD) which has been already put to practical use. In this literature, for example, evaluation of charge transporting characteristics of a NO-linked system compound (compound 1 of page 63) has been made. However, there is no description on a method for manufacturing a material other than the NO-linked system compound. When elements to be linked are different, overall electron states of compounds are different. Therefore, characteristics obtainable from a material other than the NO-linked system compound are not known. Examples of such a compound are also found elsewhere (WO 2011/107186 A and WO 2015/102118 A). For example, since a compound having a conjugated structure involving higher energy of triplet exciton (T1) can emit phosphorescent light having a shorter wavelength, the compound is useful as a material for a blue light emitting layer. There is also a demand for a novel compound having a conjugated structure with high T1 as an electron transport material or a hole transport material including a light emitting layer.

A host material for an organic EL element is generally a molecule in which a plurality of existing aromatic rings of benzene, carbazole, and the like is linked via a single bond, a phosphorus atom, or a silicon atom. This is because a large HOMO-LUMO gap required for a host material (band gap Eg in a thin film) is secured by linking many aromatic rings each having a relatively small conjugated system. Furthermore, a host material for an organic EL element, using a phosphorescent material or a thermally activated delayed fluorescence material needs high triplet excitation energy ($E_T$). However, the triplet excitation energy ($E_T$) can be increased by localizing SOMO1 and SOMO2 in a triplet excitation state (T1) by linking a donor-like or acceptor-like aromatic ring or substituent to a molecule, and thereby reducing an exchange interaction between the two orbitals. However, an aromatic ring having a small conjugated system does not have sufficient redox stability, and an element using a molecule obtained by linking existing aromatic rings as a host material, does not have a sufficient lifetime. Meanwhile, a polycyclic aromatic compound having an extended n-conjugated system generally has excellent redox stability. However, since the HOMO-LUMO gap (band gap Eg in a thin film) or triplet excitation energy ($E_T$) is low, the polycyclic aromatic compound has been considered to be unsuitable as a host material.

WO 2004/061047 A
JP 2001-172232 A
JP 2005-170911 A
WO 2012/118164 A
WO 2011/107186 A
WO 2015/102118 A

SUMMARY

As described above, various materials used in an organic EL element have been developed. However, in order to increase options of a material for an organic EL element, it is desired to develop a material formed from a compound different from a conventional compound. Particularly, organic EL characteristics obtained from a material other than the NO-linked system compounds reported in WO 2004/061047 A, JP 2001-172232 A, JP 2005-170911 A, WO 2012/118164 A, WO 2011/107186 A and WO 2015/102118 A, and manufacturing methods thereof are not known.

The present inventors conducted intensive studies in order to solve the problems described above. As a result, the present inventors have found a novel polycyclic aromatic compound in which a plurality of aromatic rings is linked via a boron atom, a nitrogen atom, or the like and have succeeded in manufacturing the same. In addition, the present inventors have found that an excellent organic EL element is obtained by disposing a layer containing this polycyclic aromatic compound between a pair of electrodes to constitute an organic EL element, and have completed the present invention. That is, the present invention provides such a polycyclic aromatic compound as follows or a dimer thereof, and further provides a material for an organic EL element containing such a polycyclic aromatic compound as follows or a dimer thereof.

Item 1. A polycyclic aromatic compound represented by the following general formula (1) or a dimer of a polycyclic aromatic compound, comprising two structures each represented by the following general formula (1).

(1)

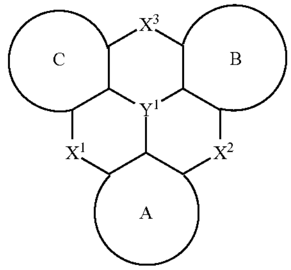

(In the above formula (1), ring A, ring B, and ring C each independently represent an aryl ring or a heteroaryl ring, and at least one hydrogen atom in these rings may be substituted, $Y^1$ represents B, P, P═O, P═S, P(—R)$_2$, Al, Ga, As, Si—R, Ge—R, Sn—R, Sb, Sb═O, Sb═S, Sb(—R)$_2$, Sb to which orthochloranil is bonded, Bi, Bi═O, Bi═S, Bi(—R)$_2$, or Bi to which orthochloranil is bonded, R of the moieties P(—R)$_2$, Si—R, Ge—R, Sn—R, Sb(—R)$_2$, and Bi(—R)$_2$ represents an aryl, an alkyl, an alkoxy, an aryloxy, or a halogen atom, and two Rs among the moieties P(—R)$_2$, Sb(—R)$_2$ and Bi(—R)$_2$ may be bonded to each other via a single bond or by fusing to form a ring, $X^1$, $X^2$, and $X^3$ each independently represent O, N—R, S, or Se, R of the moiety N—R represents an aryl which may be substituted, a heteroaryl which may be substituted, an alkyl, or a cycloalkyl, at least one of $X^1$, $X^2$, and $X^3$ represents N—R, and R of the moiety N—R may be bonded to the ring A, ring B, and/or ring C via a linking group or a single bond or by fusing, and at least one hydrogen atom in the compound or structure represented by formula (1) may be substituted by cyano, a halogen atom, or a deuterium atom.)

Item 2. The polycyclic aromatic compound described in item 1 or a dimer thereof, in which the ring A, ring B, and ring C each independently represent an aryl ring or a heteroaryl ring, at least one hydrogen atom in the ring A, ring B, and ring C may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine oxide, or a substituted or unsubstituted diarylphosphine sulfide, the ring A, ring B, and ring C each have a 5-membered or a 6-membered ring sharing a bond with a fused tricyclic structure at the center of the above formula (1) constituted by $Y^1$, $X^1$, $X^2$, and $X^3$, $Y^1$ represents B, P, P═O, P═S, P(—R)$_2$, Al, Ga, As, Si—R, Ge—R, Sn—R, Sb, Sb═O, Sb═S, Sb(—R)$_2$, Sb to which orthochloranil is bonded, Bi, Bi═O, Bi═S, Bi(—R)$_2$, or Bi to which orthochloranil is bonded, R of the moieties P(—R)$_2$, Si—R, Ge—R, Sn—R, Sb(—R)$_2$, and Bi(—R)$_2$ represents an aryl, an alkyl, an alkoxy, an aryloxy, or a halogen atom, and two Rs among the moieties P(—R)$_2$, Sb(—R)$_2$ and Bi(—R)$_2$ may be bonded to each other via a single bond or by fusing to form a ring, $X^1$, $X^2$, and $X^3$ each independently represent O, N—R, S, or Se, R of the moiety N—R represents an aryl which may be substituted by an alkyl, a heteroaryl which may be substituted by an alkyl, an alkyl, or a cycloalkyl, at least one of $X^1$, $X^2$, and $X^3$ represents N—R, R of the moiety N—R may be bonded to the ring A, ring B, and/or ring C via —O—, —S—, —C(—R)$_2$—, >N—R, an arylene having 6 to 30 carbon atoms, or a single bond, or by fusing, R of the moiety —C(—R)$_2$— represents a hydrogen atom, an alkyl, or an aryl, and R of the moiety>N—R represents an alkyl or an aryl which may be substituted by an alkyl, and at least one hydrogen atom in the compound or structure represented by formula (1) may be substituted by cyano, a halogen atom, or a deuterium atom.

Item 3. The polycyclic aromatic compound described in item 1, represented by the following general formula (2).

(2)

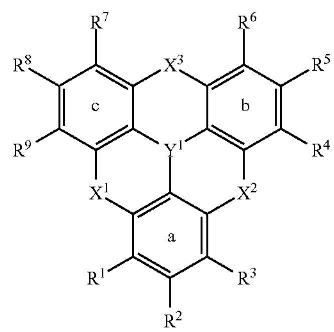

(In the above formula (2), $R^1$ to $R^9$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these may be substituted by an aryl, a heteroaryl, or an alkyl, adjacent groups among $R^1$ to $R^9$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these substituents may be substituted by an aryl, a heteroaryl, or an alkyl, $Y^1$ represents B, P, P═O, P═S, P(—R)$_2$, Al, Ga, As, Si—R, Ge—R, Sn—R, Sb, Sb═O, Sb═S, (—R)$_2$, Sb to which orthochloranil is bonded, Bi, Bi═O, Bi═S, Bi(—R)$_2$, or Bi to which orthochloranil is bonded, R of the moieties P(—R)$_2$, Si—R, Ge—R, Sn—R, Sb(—R)$_2$, and Bi(—R)$_2$ represents an aryl having 6 to 12 carbon atoms, an alkyl having 1 to 6 carbon atoms, an alkoxy having 1 to 6 carbon atoms, an aryloxy having 6 to 12 carbon atoms, or a halogen atom, and two Rs among the moieties P(—R)(—R)$_2$ and Bi(—R)$_2$ may be bonded to each other via a single bond or by fusing to form a ring, $X^1$, $X^2$, and $X^3$ each independently represent O, N—R, S, or Se, R of the moiety N—R represents an aryl having 6 to 12 carbon atoms, a heteroaryl having 2 to 15 carbon atoms, an alkyl having 1 to 6 carbon atoms, or a cycloalkyl having 3 to 6 carbon atoms, at least two of $X^1$, $X^2$, and $X^3$ represent N—R, R of the moiety N—R may be bonded to the ring a, ring b, or ring c via —O—, —S—, —C(—R)$_2$—, >N—R, an arylene having 6 to 12 carbon atoms, or a single bond, or by fusing, R of the moiety —C(—R)$_2$— represents an alkyl having 1 to 6 carbon atoms or an aryl having 6 to 12 carbon atoms, and R of the moiety>N—R represents an alkyl having 1 to 6 carbon atoms or an aryl having 6 to 12 carbon atoms which may be substituted by an alkyl having 1 to 6 carbon atoms, and at least one hydrogen atom in the compound represented by formula (2) may be substituted by cyano, a halogen atom, or a deuterium atom.)

Item 4. The polycyclic aromatic compound described in item 3, in which $R^1$ to $R^9$ each independently represent a hydrogen atom, an aryl having 6 to 30 carbon atoms, a heteroaryl having 2 to 30 carbon atoms, or a diarylamino (the aryl is an aryl having 6 to 12 carbon atoms), adjacent groups among $R^1$ to $R^9$ may be bonded to each other to form an aryl ring having 9 to 16 carbon atoms or a heteroaryl ring having 6 to 15 carbon atoms together with the ring a, ring b, or ring c, and at least one hydrogen atom in the ring thus formed may be substituted by an aryl having 6 to 10 carbon atoms, $Y^1$ represents B, P, P═O, P═S, Si—R, Sb, Sb═O, Sb═S, Sb to which orthochloranil is bonded, Bi, Bi═O, Bi═S, or Bi to which orthochloranil is bonded, R of the moiety Si—R represents an aryl having 6 to 10 carbon atoms or an alkyl having 1 to 4 carbon atoms, $X^1$, $X^2$, and $X^3$ each independently represent O, N—R, or S, R of the moiety N—R represents an aryl having 6 to 10 carbon atoms or an alkyl having 1 to 4 carbon atoms, and at least two of $X^1$, $X^2$, and $X^3$ represent N—R, and at least one hydrogen atom in the compound represented by formula (2) may be substituted by cyano, a halogen atom, or a deuterium atom.

Item 5. The polycyclic aromatic compound described in any one of items 1 to 4 or a dimer thereof, in which the halogen atom is a fluorine atom.

Item 6. The polycyclic aromatic compound described in item 1, represented by the following chemical structural formula.

(1-1)

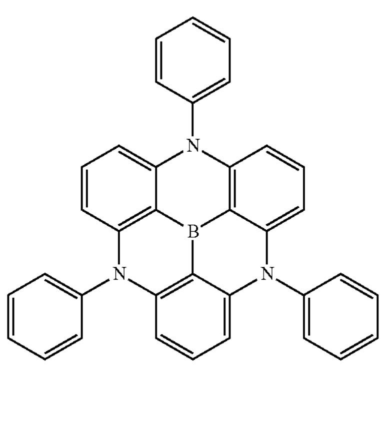

-continued (1-241)

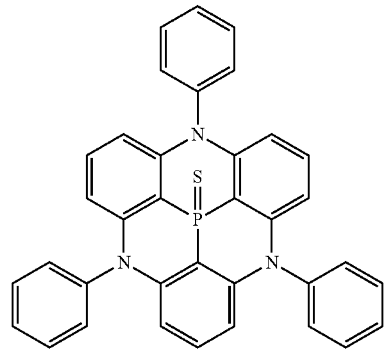

(1-421)

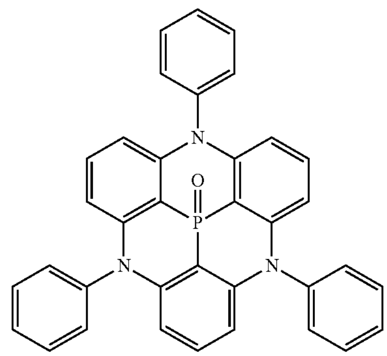

(1-601)

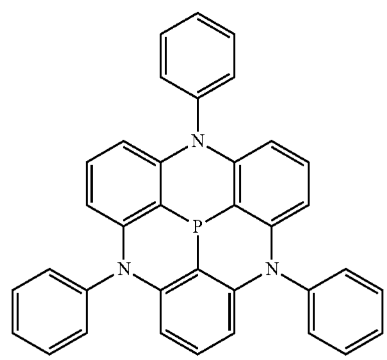

(1-781)

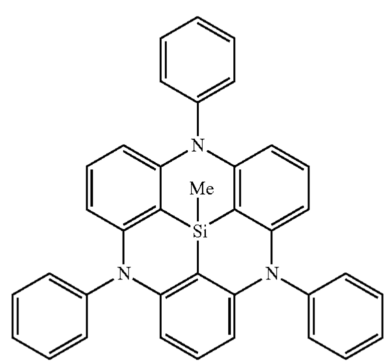

-continued (1-961)

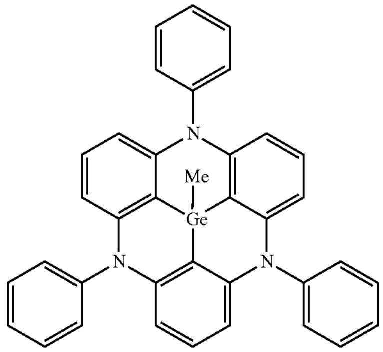

(1-1161)

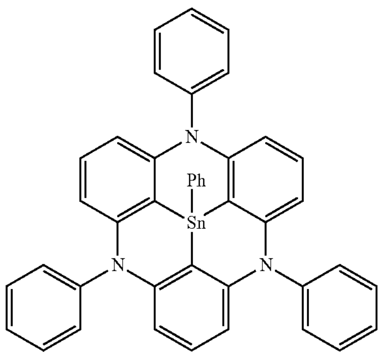

(1-1221)

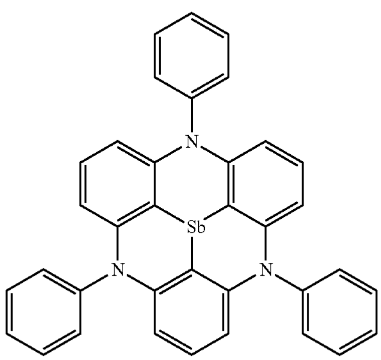

(1-1281)

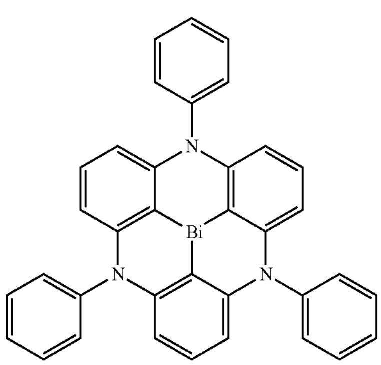

-continued (1-1341)

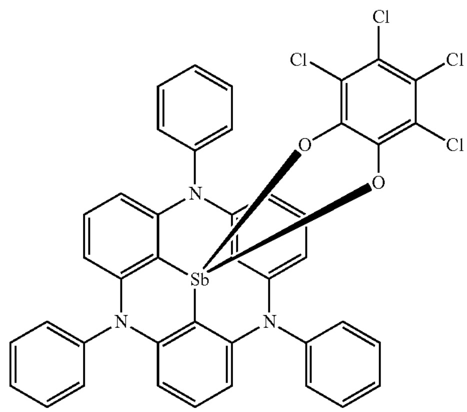

In the formula, Me represents a methyl group and Ph represents a phenyl group.

Item 7. A material for an organic device, comprising the polycyclic aromatic compound described in any one of items 1 to 6 or a dimer thereof.

Item 8. The material for an organic device described in item 7, in which the material for an organic device is a material for an organic electroluminescent element, a material for an organic field effect transistor, or a material for an organic thin film solar cell.

Item 9. The material for an organic electroluminescent element described in item 8, in which the material for an organic electroluminescent element is a material for a light emitting layer.

Item 10. The material for an organic electroluminescent element described in item 8, in which the material for an organic electroluminescent element is a material for an electron injection layer or a material for an electron transport layer.

Item 11. The material for an organic electroluminescent element described in item 8, in which the material for an organic electroluminescent element is a material for a hole injection layer or a material for a hole transport layer.

Item 12. An organic electroluminescent element, comprising: a pair of electrodes composed of a positive electrode and a negative electrode; and a light emitting layer disposed between the pair of electrodes and containing the material for a light emitting layer described in item 9.

Item 13. An organic electroluminescent element, comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer described in item 10.

Item 14. An organic electroluminescent element, comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer described in item 11.

Item 15. The organic electroluminescent element described in any one of items 12 to 14, further comprising an electron transport layer and/or an electron injection layer disposed between the negative electrode and the light emitting layer, in which at least one of the electron transport layer and the electron injection layer contains at least one selected from the group consisting of a quinolinol-based metal complex, a pyridine derivative, a phenanthroline derivative, a borane derivative, and a benzimidazole derivative.

Item 16. The organic electroluminescent element described in item 15, in which the electron transport layer and/or the electron injection layer further comprise/comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

Item 17. A display apparatus comprising the organic electroluminescent element described in any one of items 12 to 16.

Item 18. A lighting apparatus comprising the organic electroluminescent element described in any one of items 12 to 16.

According to a preferable embodiment of the present invention, a novel polycyclic aromatic compound that can be used as, for example, a material for an organic EL element can be provided, and an excellent organic EL element can be provided by using this polycyclic aromatic compound.

Specifically, the present inventors have found that a polycyclic aromatic compound in which aromatic rings are linked via a hetero element such as boron, nitrogen, phosphorus, oxygen, or sulfur, has a large HOMO-LUMO gap (band gap Eg in a thin film) and high triplet excitation energy ($E_T$). It is considered that this is because a decrease in the HOMO-LUMO gap that comes along with extension of a conjugated system is suppressed due to low aromaticity of a 6-membered ring containing a hetero element, and SOMO1 and SOMO2 in a triplet excited state (T1) are localized by electronic perturbation of the hetero element. Furthermore, the polycyclic aromatic compound containing a hetero element according to the present invention reduces an exchange interaction between the two orbitals due to the localization of SOMO1 and SOMO2 in the triplet excited state (T1), and therefore an energy difference between the triplet excited state (T1) and a singlet excited state (S1) is small. In addition, the polycyclic aromatic compound exhibits thermally activated delayed fluorescence, and therefore is also useful as a fluorescent material for an organic EL element. Furthermore, a material having high triplet excitation energy ($E_T$) is also useful as an electron transport layer or a hole transport layer of a phosphorescence organic EL element or an organic EL element using thermally activated delayed fluorescence. In addition, these polycyclic aromatic compounds can arbitrarily shift energy of HOMO and LUMO by introducing a substituent, and therefore ionization potential or electron affinity can be optimized in accordance with a peripheral material.

DETAILED DESCRIPTION

Figure 1:
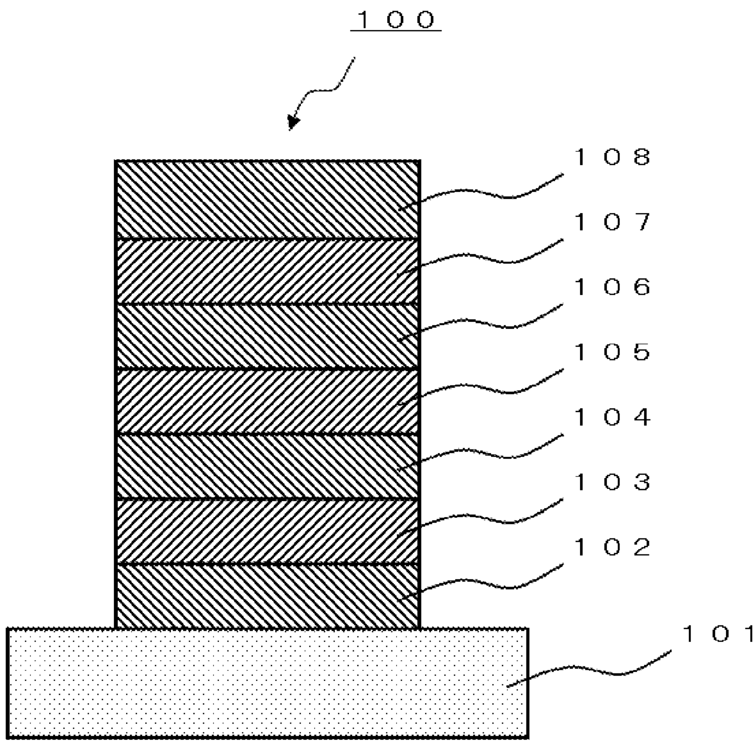
FIG. 1 is a schematic cross-sectional view illustrating an organic EL element according to the present embodiment.

1. Polycyclic Aromatic Compound and Dimer Thereof

The invention of the present application relates to a polycyclic aromatic compound represented by the following general formula (1), or a dimer of a polycyclic aromatic compound having two structures each represented by the following general formula (1). The invention of the present application preferably relates to a polycyclic aromatic compound represented by the following general formula (2), or a dimer of a polycyclic aromatic compound having two structures each represented by the following general formula (2).

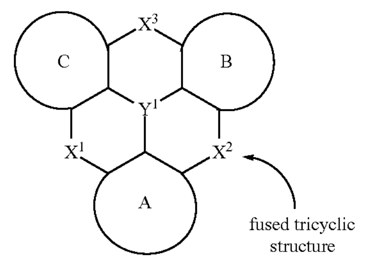

(1)

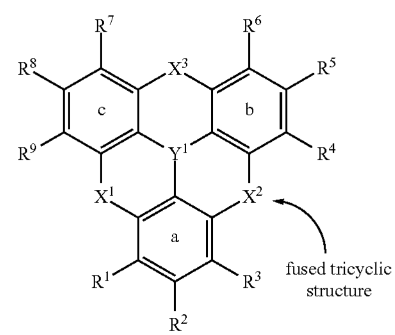

(2)

The ring A, ring B, and ring C in general formula (1) each independently represent an aryl ring or a heteroaryl ring, and at least one hydrogen atom in these rings may be substituted by a substituent. This substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine oxide, a substituted or unsubstituted diarylphosphine sulfide, or cyano. In a case where these groups have substituents, examples of the substituents include an aryl, a heteroaryl, and an alkyl.

Furthermore, the above aryl ring or heteroaryl ring preferably has a 5-membered ring or a 6-membered ring sharing a bond with a fused tricyclic structure at the center of general formula (1) constituted by $Y^1$, $X^1$, $X^2$, and $X^3$ (hereinafter, this structure is also referred to as "structure D").

Here, the "fused tricyclic structure (structure D)" means a structure in which three saturated hydrocarbon rings including $Y^1$, $X^1$, $X^2$, and $X^3$, indicated at the center of general formula (1) are fused. Furthermore, the "6-membered ring sharing a bond with the fused tricyclic structure" means, for example, ring a (benzene ring (6-membered ring)) fused to the structure D as represented by the above general formula (2). Furthermore, the phrase "aryl ring or heteroaryl ring (which is ring A) has this 6-membered ring" means that the ring A is formed only with this 6-membered ring, or the ring A is formed by further fusing another ring or the like to this 6-membered ring so as to include this 6-membered ring. In other words, the "aryl ring or heteroaryl ring (which is ring A) having a 6-membered ring" referred to herein means that the 6-membered ring constituting the entirety or a part of the ring A is fused to the structure D. Similar description applies to the "ring B (ring b)", "ring C (ring c)", and the "5-membered ring".

The ring A (or ring B or ring C) in general formula (1) corresponds to ring a and its substituents $R^1$ to $R^3$ (or ring b and its substituents $R^4$ to $R^6$, or ring c and its substituents $R^7$ to $R^9$) in general formula (2). That is, general formula (2) corresponds to a formula in which "rings A to C each having a 6-membered ring" have been selected as the rings A to C of general formula (1). For this meaning, the rings of general formula (2) are represented by small letters a to c.

In general formula (2), adjacent groups among the substituents $R^1$ to $R^9$ of the ring a, ring b, and ring c may be bonded to each other to form an aryl ring or a heteroaryl ring together with the ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these substituents may be substituted by an aryl, a heteroaryl, or an alkyl. Therefore, in a polycyclic aromatic compound represented by general formula (2), a ring structure constituting a compound changes as represented by the following formulas (2-1) and (2-2) according to a mutual bonding form of substituents in the ring a, ring b, and ring c. Ring A', ring B', and ring C' in the formulas correspond to the ring A, ring B, and ring C in general formula (1), respectively.

(2-1)

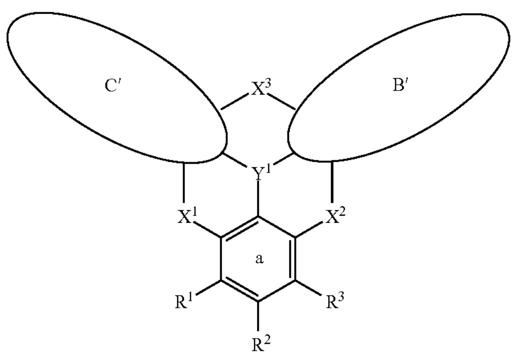

-continued (2-2)

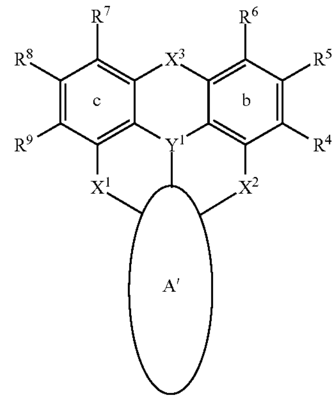

The ring A', ring B' and, ring C' in the above formulas (2-1) and (2-2) each represent, to be described in connection with general formula (2), an aryl ring or a heteroaryl ring formed by bonding adjacent groups among the substituents $R^1$ to $R^9$ together with the ring a, ring b, and ring c, respectively (may also be referred to as a fused ring obtained by fusing another ring structure to the ring a, ring b, or ring c). Incidentally, although not indicated in the formulas, there is also a compound in which all of the ring a, ring b, and ring c have been changed to the ring A', ring B', and ring C', respectively. Furthermore, as apparent from the above formulas (2-1) and (2-2), for example, $R^3$ of the ring a and $R^4$ of the ring b, $R^6$ of the ring b and $R^7$ of the ring c, $R^9$ of the ring c and $R^1$ of the ring a, and the like do not correspond to "adjacent groups", and these groups are not bonded to each other. That is, the term "adjacent groups" means adjacent groups on the same ring.

A compound represented by the above formula (2-1) or (2-2) corresponds to, for example, a compound represented by formula (1-4) or (1-49), listed as a specific compound described below. Examples of these compounds include a compound having ring A' (or ring B' or ring C') formed by fusing a benzene ring, an indane ring (including a dimethyl substitution product or the like), an indole ring, a pyrrole ring, a benzofuran ring, or a benzothiophene ring to a benzene ring which is the ring a (or ring b or ring c). The fused ring A' (or fused ring B' or fused ring C') that has been formed is a naphthalene ring, a fluorene ring (including a dimethyl substitution product or the like), a carbazole ring, an indole ring, a dibenzofuran ring, or a dibenzothiophene ring.

$Y^1$ in general formula (1) represents B, P, P=O, P=S, P(—R)$_2$, Al, Ga, As, Si—R, Ge—R, Sn—R, Sb, Sb=O, Sb=S, Sb(—R)$_2$, Sb to which orthochloranil is bonded, Bi, Bi=O, Bi=S, Bi(—R)$_2$, or Bi to which orthochloranil is bonded, and R of the moieties P(—R)$_2$, Si—R, Ge—R, Sn—R, Sb(—R)$_2$, and Bi(—R)$_2$ represents an aryl, an alkyl, an alkoxy, an aryloxy, or a halogen atom. Two Rs among the moieties P(—R)$_2$, Sb(—R)$_2$ and Bi(—R)$_2$ may be bonded to each other via a single bond or by fusing to form a ring, and the ring thus formed is, for example, orthochloranil or parachloranil. In a case where $Y^1$ represents P=O, P=S, P(—R)$_2$, Si—R, Ge—R, Sn—R, Sb=O, Sb=S, Sb(—R)$_2$, Sb to which orthochloranil is bonded, Bi=O, Bi=S, Bi(—R)$_2$, or Bi to which orthochloranil is bonded, an atom bonded to the ring A, ring B, or ring C is P, Si, Ge, Sn, Sb, or Bi. $Y^1$ preferably represents B, P, P=O, P=S, Si—R, Sb, Sb=O, Sb=S, Sb to which orthochloranil is bonded, Bi, Bi═O, Bi═S, or Bi to which orthochloranil is bonded, more preferably B, P, Sb, or Bi, and particularly preferably B. This description also applies to $Y^1$ in general formula (2).

$X^1$, $X^2$, and $X^3$ in general formula (1) each independently represent O, N—R, S, or Se, and R of the moiety N—R represents an aryl which may be substituted, a heteroaryl which may be substituted, an alkyl, or a cycloalkyl. Here, at least one of $X^1$, $X^2$, and $X^3$ represents N—R, at least two of $X^1$, $X^2$, and $X^3$ preferably represent N—R, and three of $X^1$, $X^2$, and $X^3$ more preferably represent N—R. R of the moiety N—R may be bonded to the ring A, ring B and/or ring C via a linking group or a single bond or by fusing. The linking group is preferably —O—, —S—, —C(—R)$_2$—, >N—R, or an arylene having 6 to 30 carbon atoms. Incidentally, R of the "—C(—R)$_2$—" represents a hydrogen atom, an alkyl, or an aryl. Incidentally, R of the ">N—R" represents an alkyl or an aryl which may be substituted by an alkyl. This description also applies to $X^1$, $X^2$, and $X^3$ in general formula (2).

Here, the provision that "R of the moiety N—R is bonded to the ring A, ring B, and/or ring C via a linking group or a single bond or by fusing" in general formula (1) corresponds to the provision that "R of the moiety N—R is bonded to the ring a, ring b, and/or ring c via —O—, —S—, —C(—R)$_2$—, >N—R, an arylene having 6 to 12 carbon atoms, or a single bond, or by fusing" in general formula (2).

This provision can be expressed by a compound having a ring structure in which $X^2$ or $X^1$ is incorporated into the fused ring B' or fused ring C', represented by the following formula (2-3-1). That is, for example, the compound is a compound having the ring B' (or ring C') formed by fusing another ring to a benzene ring which is the ring b (or ring c) in general formula (2) so as to incorporate $X^2$ (or $X^1$). This compound corresponds to, for example, a compound represented by any one of formulas (1-61) to (1-63), (1-65), (1-73), and (1-74), listed as a specific compound described below, and the fused ring B' (or fused ring C') that has been formed is, for example, a phenoxazine ring, a phenothiazine ring, an acridine ring, or a phenophosphazine ring.

The above provision can be expressed by a compound having a ring structure in which $X^1$ and/or $X^2$ are/is incorporated into the fused ring A', represented by the following formula (2-3-2) or (2-3-3). That is, for example, the compound is a compound having ring A' formed by fusing another ring to a benzene ring which is the ring a in general formula (2) so as to incorporate $X^1$ (and/or $X^2$). This compound corresponds to, for example, a compound represented by formula (1-66) or (1-69), listed as a specific compound described below, and the fused ring A' that has been formed is, for example, a phenoxazine ring, a phenothiazine ring, an acridine ring, or a phenophosphazine ring.

(2-3-1)

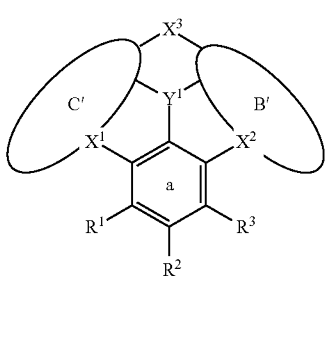

-continued (2-3-2)

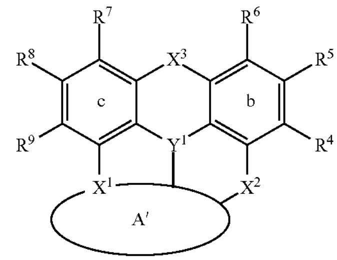

(2-3-3)

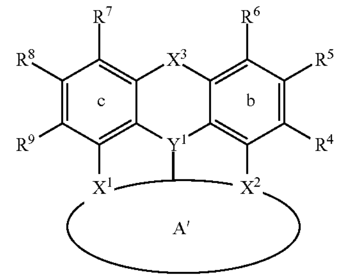

Although not specifically described, the above provision also includes a form in which R of the moiety N—R of $X^3$ is bonded to the ring B and/or the ring C (ring b and/or ring c) via a linking group or a single bond. For example, the compound is a compound having the ring B' (or ring C') formed by fusing another ring to a benzene ring which is the ring b (or ring c) in general formula (2) so as to incorporate $X^3$. This compound corresponds to, for example, a compound represented by formula (1-70) or (1-71), listed as a specific compound described below, and the fused ring B' (or fused ring C') that has been formed is, for example, a phenoxazine ring, a phenothiazine ring, an acridine ring, or a phenophosphazine ring.

Furthermore, the above provision also includes a form combined with a form in which $X^1$, $X^2$, or $X^3$ is incorporated into any one of the fused rings. The compound corresponds to, for example, a compound represented by formula (1-64) or (1-68), listed as a specific compound described below.

Furthermore, examples of a case where the linking group is ">N—R" include a compound represented by formula (1-71) or (1-292), listed as a specific compound described below. Examples of a case where the linking group is an "arylene having 6 to 30 carbon atoms" include a compound represented by formula (1-74). Examples of a case where "R of the moiety N—R is bonded to the ring A, ring B, and/or ring C by fusing" include a compound represented by formula (1-75).

The "aryl ring" as the ring A, ring B or ring C of general formula (1) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^9$ together with the ring a, ring b, or ring c" defined by general formula (2). The ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the “aryl ring” include a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, a naphthacene ring, and a benzofluorene ring which are fused tetracyclic systems; and a perylene ring and a pentacene ring which are fused pentacyclic systems. Furthermore, the fluorene ring and the benzofluorene ring include a structure in which a fluorene ring or a benzofluorene ring is spiro-bonded.

The “heteroaryl ring” as the ring A, ring B, or ring C of general formula (1) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the “heteroaryl ring” include a heterocyclic ring containing 1 to 5 hetero atoms selected from an oxygen atom, a sulfur atom, and a nitrogen atom in addition to a carbon atom as a ring-constituting atom. Incidentally, this “heteroaryl ring” corresponds to the “heteroaryl ring formed by bonding adjacent groups among the $R^1$ to $R^9$ together with the ring a, ring b, or ring c” defined by general formula (2). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the “heteroaryl ring” include a pyrrole ring, an oxazole ring, an isoxazole ring, a triazole ring, an isothiazole ring, an imidazole ring (unsubstituted, substituted by an alkyl such as methyl, or substituted by an aryl such as phenyl), an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a naphthobenzofuran ring, a thiophene ring, a benzothiophene ring, a dibenzothiophene ring, a naphthobenzothiophene ring, a benzophosphole ring, a dibenzophosphole ring, a benzophosphole oxide ring, a dibenzophosphole oxide ring, a furazan ring, an oxadiazole ring, and a thianthrene ring.

At least one hydrogen atom in the above “aryl ring” or “heteroaryl ring” may be substituted by a substituted or unsubstituted “aryl”, a substituted or unsubstituted “heteroaryl”, a substituted or unsubstituted “diarylamino”, a substituted or unsubstituted “diheteroarylamino”, a substituted or unsubstituted “arylheteroarylamino”, a substituted or unsubstituted “alkyl”, a substituted or unsubstituted “cycloalkyl”, a substituted or unsubstituted “alkoxy”, a substituted or unsubstituted “aryloxy”, a substituted or unsubstituted arylsulfonyl, a substituted or unsubstituted diarylphosphine, a substituted or unsubstituted diarylphosphine oxide, or a substituted or unsubstituted diarylphosphine sulfide, which is a primary substituent. Examples of the aryl of the “aryl”, “heteroaryl”, and “diarylamino”, the heteroaryl of the “diheteroarylamino”, the aryl and heteroaryl of the “arylheteroarylamino”, the aryl of the “aryloxy”, the aryl of the “arylsulfonyl”, the aryl of the “diarylphosphine”, the aryl of the “diarylphosphine oxide”, and the aryl of the “diarylphosphine sulfide”, as these primary substituents include a monovalent group of the “aryl ring” or “heteroaryl ring” described above.

Furthermore, the “alkyl” as the primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the “cycloalkyl” as the primary substituent include a cycloalkyl having 3 to 12 carbon atoms. A preferable cycloalkyl is a cycloalkyl having 3 to 10 carbon atoms. A more preferable cycloalkyl is a cycloalkyl having 3 to 8 carbon atoms. A still more preferable cycloalkyl is a cycloalkyl having 3 to 6 carbon atoms. This description can also be cited as description for a cycloalkyl which can be fused to at least one of the ring A, ring B, and ring C.

Specific examples of the “cycloalkyl” include cyclopropyl, cyclobutyl, cyclopentyl, cyclohexyl, methylcyclopentyl, cycloheptyl, methylcyclohexyl, cyclooctyl, and dimethylcyclohexyl.

Furthermore, examples of the “alkoxy” as the primary substituent include a linear alkoxy having 1 to 24 carbon atoms and a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 or 4 carbon atoms) is particularly preferable.

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

A least one hydrogen atom in each of the substituted or unsubstituted “aryl”, the substituted or unsubstituted “heteroaryl”, the substituted or unsubstituted “diarylamino”, the substituted or unsubstituted “diheteroarylamino”, the substituted or unsubstituted “arylheteroarylamino”, the substituted or unsubstituted “alkyl”, the substituted or unsubstituted “cycloalkyl”, the substituted or unsubstituted “alkoxy”, the substituted or unsubstituted “aryloxy”, the substituted or unsubstituted “arylsulfonyl”, the substituted or unsubstituted “diarylphosphine”, the substituted or unsubstituted “diarylphosphine oxide”, and the substituted or unsubstituted “diarylphosphine sulfide”, which are primary substituents, may be substituted by a secondary substituent, as described by the phrase substituted or unsubstituted. Examples of this secondary substituent include an aryl, a heteroaryl, and an alkyl, and for specific examples thereof, the above description on the monovalent group of the "aryl ring" or "heteroaryl ring" and the "alkyl" as the primary substituent can be referred to. Furthermore, the aryl or heteroaryl as the secondary substituent includes a group in which at least one hydrogen atom in the aryl or heteroaryl is substituted by an aryl such as phenyl (specific examples are the groups described above), or an alkyl such as methyl (specific examples are the groups described above). For example, when the secondary substituent is a carbazolyl group, a carbazolyl group in which at least one hydrogen atom at the 9-position is substituted by an aryl such as phenyl or an alkyl such as methyl is also included in the heteroaryl as the secondary substituent.

Examples of the aryl, the heteroaryl, the aryl of the diarylamino, the heteroaryl of the diheteroarylamino, the aryl and heteroaryl of the arylheteroarylamino, or the aryl of the aryloxy in $R^1$ to $R^9$ of general formula (2) include the monovalent groups of the "aryl ring" or "heteroaryl ring" described in general formula (1). Furthermore, for the alkyl or alkoxy in $R^1$ to $R^9$, the above description on the "alkyl" or "alkoxy" as the primary substituent in the above description of general formula (1) can be referred to. In addition, similar description applies to the aryl, the heteroaryl, or the alkyl as a substituent on these groups. Furthermore, similar description applies to the heteroaryl, the diarylamino, the diheteroarylamino, the arylheteroarylamino, the alkyl, the alkoxy, or the aryloxy in a case of forming an aryl ring or a heteroaryl ring by bonding adjacent groups among $R^1$ to $R^9$ together with the ring a, ring b, or ring c, as a substituent on these rings, and the aryl, the heteroaryl, or the alkyl as a further substituent.

The R of the moieties $P(—R)_2$, Si—R, Ge—R, Sn—R, $Sb(—R)_2$, and $Bi(—R)_2$ in $Y^1$ of general formula (1) represents an aryl, an alkyl, an alkoxy, an aryloxy, or a halogen atom, and specific examples of the aryl, the alkyl, the alkoxy, and the aryloxy include the groups described above. Particularly, an aryl having 6 to 12 carbon atoms, an aryl having 6 to 10 carbon atoms (for example, phenyl or naphthyle) an alkyl having 1 to 6 carbon atoms, an alkyl having 1 to 4 carbon atoms (for example, methyl or ethyl), an alkoxy having 1 to 6 carbon atoms, an alkoxy having 1 to 4 carbon atoms (for example, methoxy or ethoxy) an aryloxy having 6 to 12 carbon atoms, an aryl having 6 to 10 carbon atoms (for example, phenyloxy or naphthyloxy) are preferable. Furthermore, examples of the halogen include F, Cl, Br, and I, and F and Cl are particularly preferable. This description also applies to $Y^1$ in general formula (2).

R of the moiety N—R in $X^1$, $X^2$, and $X^3$ of general formula (1) represents an aryl, a heteroaryl, an alkyl, or a cycloalkyl which may be substituted by the secondary substituent described above, and at least one hydrogen atom in the aryl or heteroaryl may be substituted by, for example, an alkyl. Specific examples of this aryl, heteroaryl, alkyl, or cycloalkyl include the groups described above. Particularly, an aryl having 6 to 10 carbon atoms (for example, a phenyl or a naphthyl), a heteroaryl having 2 to 15 carbon atoms (for example, carbazolyl), and an alkyl having 1 to 4 carbon atoms (for example, methyl or ethyl) are preferable. This description also applies to $X^1$, $X^2$, and $X^3$ in general formula (2).

R in the moiety "$—C(—R)_2—$" which is a linking group in general formula (1) represents a hydrogen atom, an alkyl, or an aryl. R in the moiety ">N—R" represents an alkyl or an aryl which may be substituted by an alkyl. Specific examples of this alkyl or aryl include the groups described above. Particularly, an alkyl having 1 to 6 carbon atoms, an alkyl having 1 to 4 carbon atoms (for example, methyl or ethyl), and an aryl having 6 to 12 carbon atoms (phenyl, naphthyl, and the like) which may be substituted by an alkyl having 1 to 6 carbon atoms or an alkyl having 1 to 4 carbon atoms (for example, methyl or ethyl) are preferable. This description also applies to "$—C(—R)_2—$" or ">N—R" as a linking group in general formula (2).

Examples of the "arylene" or the "arylene having 6 to 30 carbon atoms" which is a linking group in general formula (1) include a divalent group having the same structure as the aryl described above. This description also applies to the "arylene having 6 to 12 carbon atoms" which is a linking group in general formula (2).

Furthermore, the invention of the present application relates to a dimer of a polycyclic aromatic compound having two unit structures each represented by general formula (1), and preferably to a dimer of a polycyclic aromatic compound having two unit structures each represented by general formula (2). The dimer is only required to be in a form having two unit structures described above in one compound. For example, the dimer may be in a form in which two unit structures described above are bonded via a single bond or a linking group such as an alkylene group having 1 to 3 carbon atoms, a phenylene group, or a naphthylene group. In addition, the dimer may be in a form in which two unit structures described above are bonded such that any ring contained in the unit structure (ring A, ring B or ring C, or ring a, ring b or ring c) is shared by the two unit structures, or may be in a form in which two unit structures described above are bonded such that any rings contained in the unit structure (ring A, ring B or ring C, or ring a, ring b or ring c) are fused.

Examples of such a dimer include dimers represented by the following formulas (2-4), (2-5), and (2-6). The dimer represented by the following formula (2-4) corresponds to, for example, a compound represented by any one of the following formulas (1-2001) to (1-2035). That is, to be described in connection with general formula (2), the dimer includes two unit structures each represented by general formula (2) in one compound so as to share a benzene ring as the ring a. Furthermore, to be described in connection with general formula (2), the dimer represented by the following formula (2-5) includes two unit structures each represented by general formula (2) in one compound so as to share a benzene ring as the ring a and $X^2$. Furthermore, the dimer represented by the following formula (2-6) corresponds to, for example, a compound represented by any one of the following formulas (1-2041) to (1-2092). That is, to be described in connection with general formula (2), for example, the dimer includes two unit structures each represented by general formula (2) in one compound such that a benzene ring as the ring a (or ring b or ring c) of a certain unit structure and a benzene ring as the ring a (or ring b or ring c) of a certain unit structure are fused. Note that the definitions of $Y^1$, $X^1$, $X^2$, $X^3$, $R^1$, and $R^3$ to $R^9$ in the following formulas are the same as those in formula (2).

(2-4)

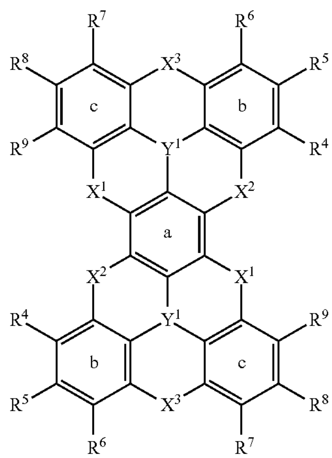

(2-5)

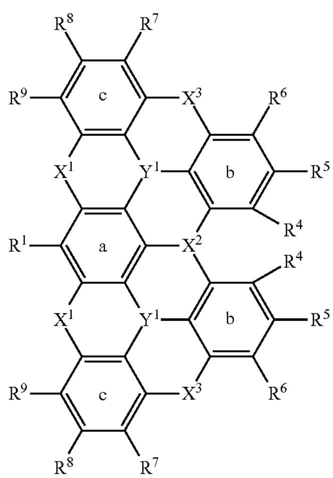

(2-6)

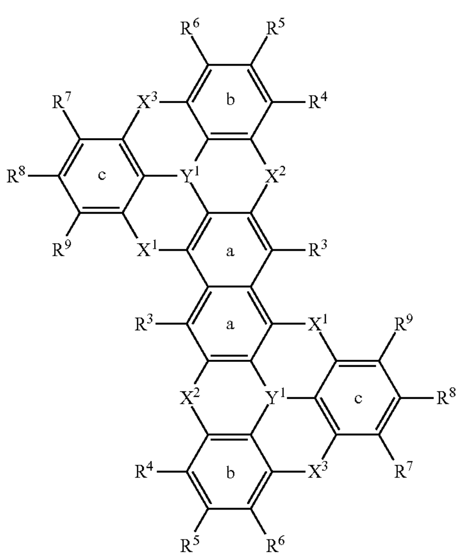

Furthermore, all or a part of hydrogen atoms in a chemical structure of the polycyclic aromatic compound represented by general formula (1) or (2) or a dimer thereof may be cyano groups, halogen atoms, or deuterium atoms. For example, in formula (1), a hydrogen atom in the ring A, ring B, ring C (ring A to ring C are aryl rings or heteroaryl rings), substituents on the ring A to ring C, R (=alkyl, aryl, alkoxy, or aryloxy) when $Y^1$ represents P(—R)$_2$, Si—R, Ge—R, Sn—R, Sb(—R)$_2$, or Bi(—R)$_2$, and R (=alkyl or aryl) when $X^1$, $X^2$, and $X^3$ each represent N—R, can be substituted by cyano, a halogen atom, or a deuterium atom. Among these, a form in which all or a part of the cyano groups or hydrogen atoms in the aryl or heteroaryl have been substituted by halogen atoms or deuterium atoms may be mentioned. The halogen is fluorine, chlorine, bromine, or iodine, preferably fluorine, chlorine, or bromine, and more preferably chlorine.

Furthermore, the polycyclic aromatic compound according to the present invention and a dimer thereof can be used as a material for an organic device. Examples of the organic device include an organic electroluminescent element, an organic field effect transistor, and an organic thin film solar cell. Particularly, in the organic electroluminescent element, a compound in which $Y^1$ represents B, and $X^1$, $X^2$, and $X^3$ each represent N—R, a compound in which $Y^1$ represents B, and one of $X^2$, and $X^3$ represents O and the others represent N—R, and a compound in which $Y^1$ represents B, and two of $X^1$, $X^2$, and $X^3$ represent O and the other represents N—R are preferably used as a dopant material for a light emitting layer. A compound in which $Y^1$ represents B or P═O, and $X^1$, $X^2$, and $X^3$ each represent N—R, a compound in which $Y^1$ represents B or P═O, and one of $X^1$, $X^2$, and $X^3$ represents O and the others represent N—R, and a compound in which $Y^1$ represents B or P═O, and two of $X^1$, $X^2$, and $X^3$ represent O and the other represents N—R are preferably used as a host material for a light emitting layer. A compound in which $Y^1$ represents B or P═O, and two of $X^1$, $X^2$, and $X^3$ represent O and the other represents N—R is preferably used as an electron transport material.

More specific examples of the polycyclic aromatic compound of the present invention include compounds represented by the following chemical structural formulas. Incidentally, in the chemical structural formulas, Me, Et, Pr, and Bu bonded to Si, Ge, Sn, Sb, or Bias a central element represent a methyl group, an ethyl group, an n-propyl group or an iso-propyl group (independently selected in a case where a plurality of Pr's exist in one structural formula), and an n-butyl group or a tert-butyl group (independently selected in a case where a plurality of Bu's exist in one structural formula), respectively. D represents a deuterium atom, Ph represents a phenyl group, and Np represents a naphthyl group.

(1-1)
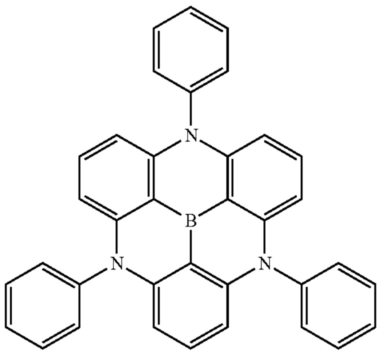
(1-2)
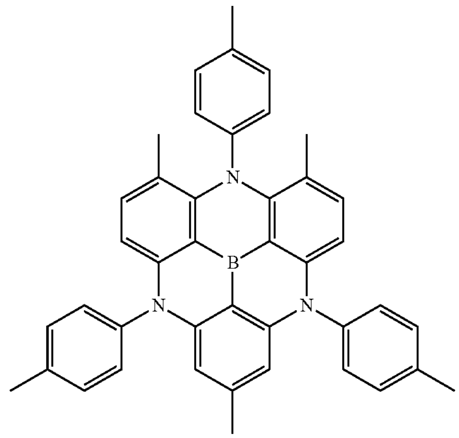
(1-3)
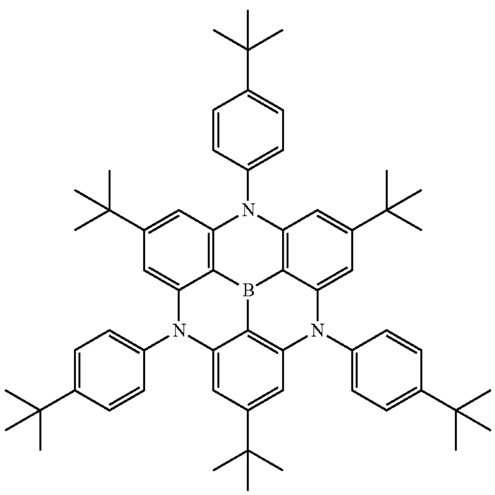
(1-4)
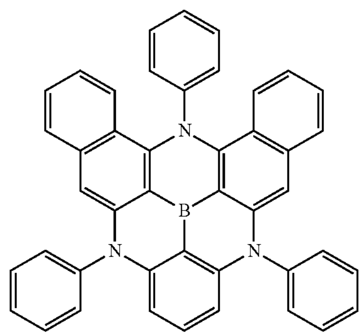
(1-5)
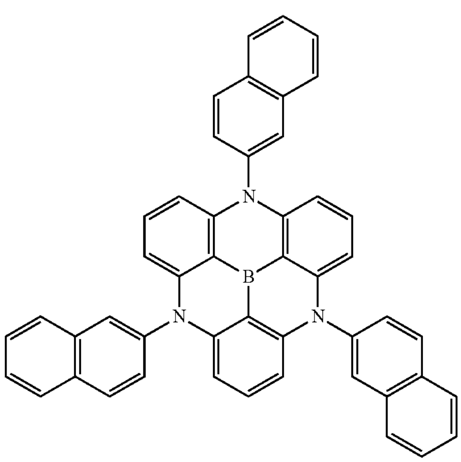
(1-6)
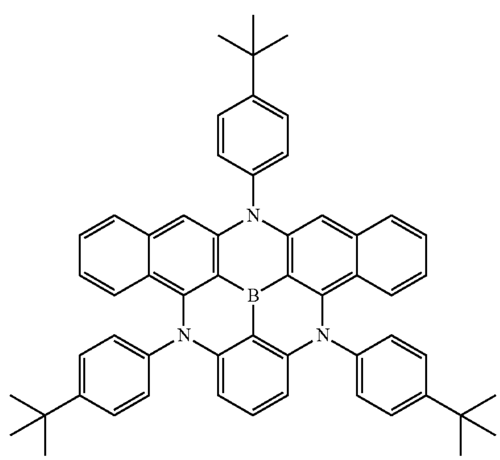

-continued
(1-7)
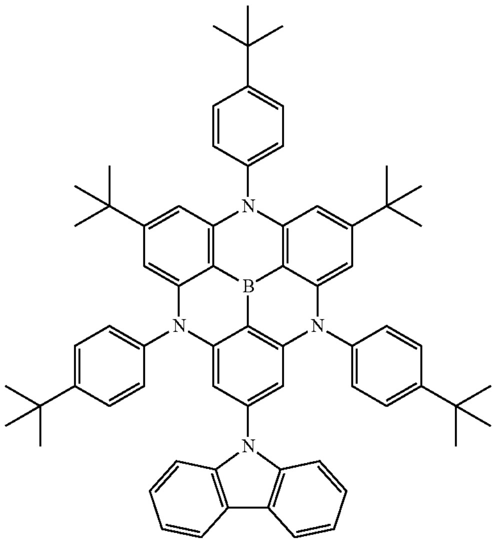
(1-8)
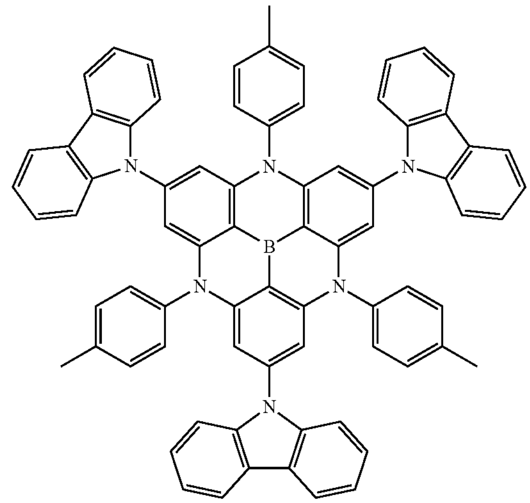
(1-9)
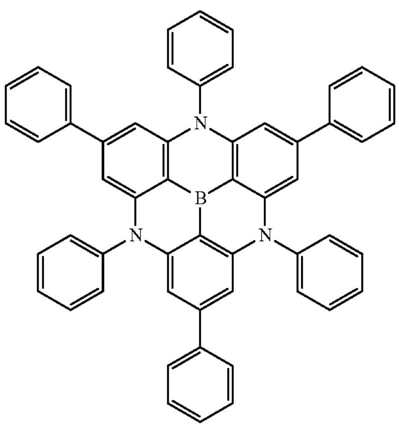
(1-10)
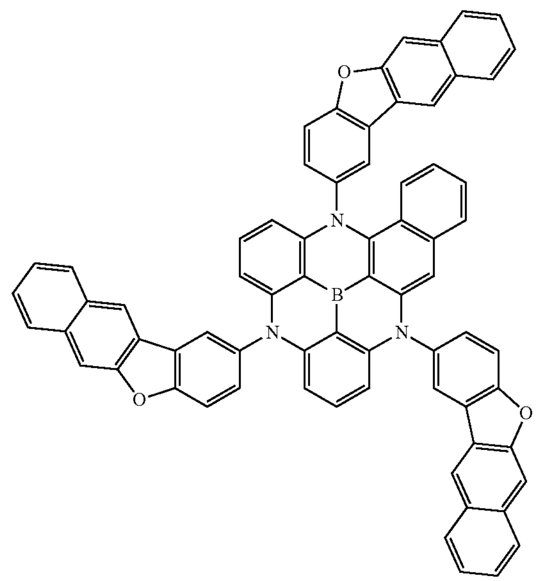
(1-11)
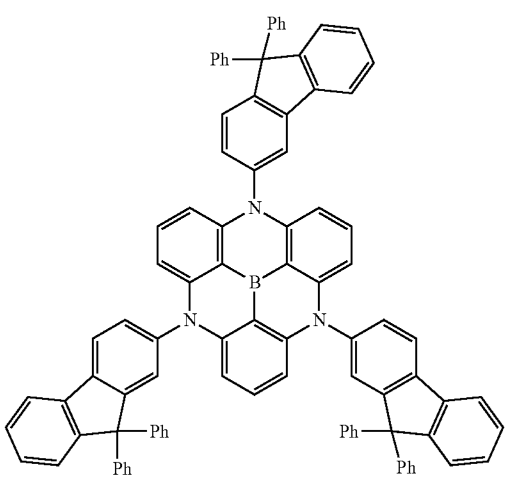
(1-12)
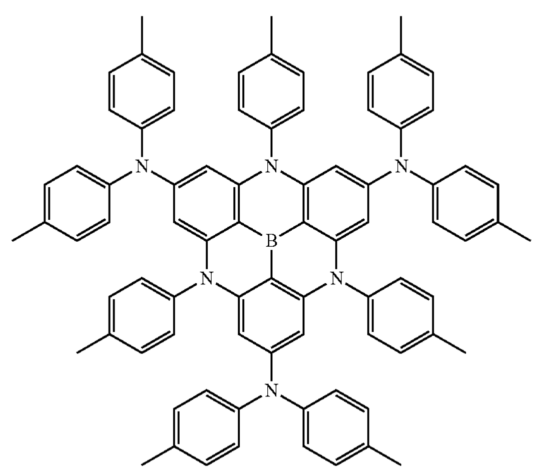

-continued
(1-13)
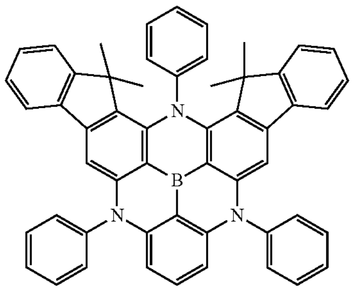
(1-14)
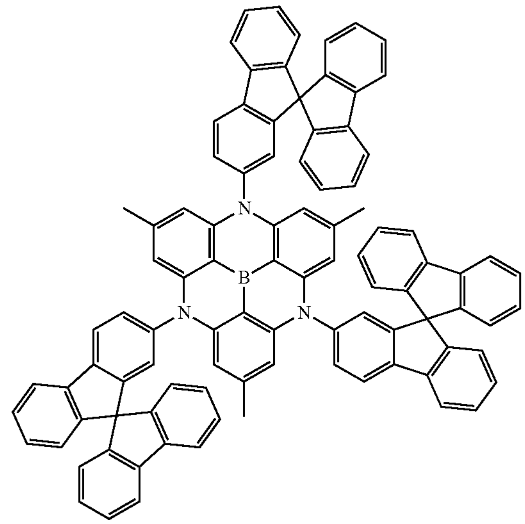
(1-15)
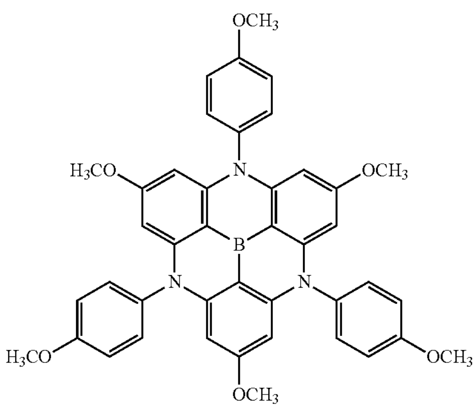
(1-21)
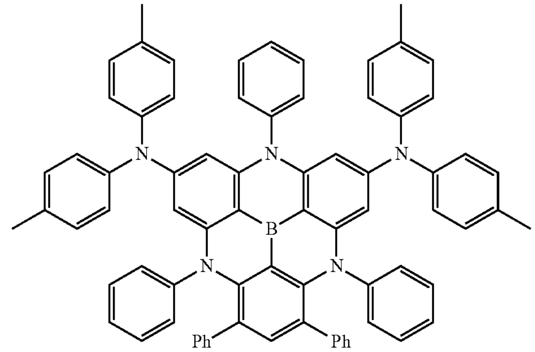
(1-22)
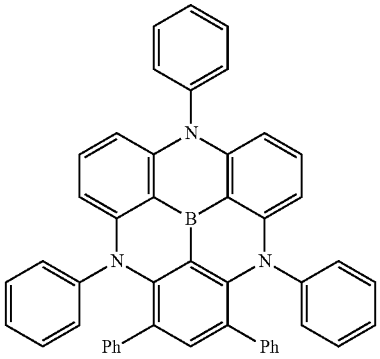
(1-23)
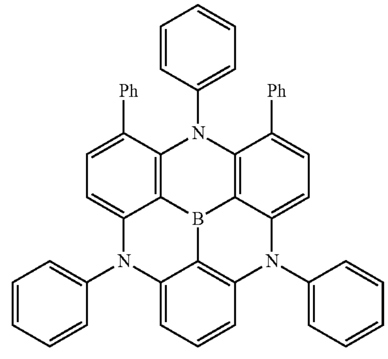

-continued
(1-24)
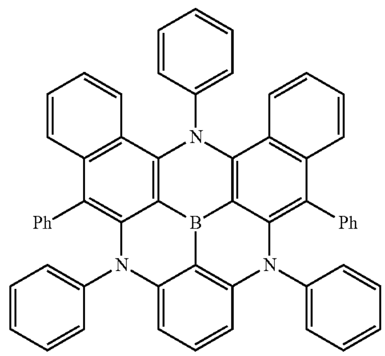
(1-25)
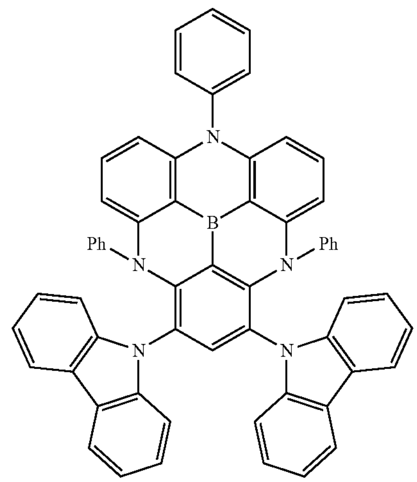
(1-26)
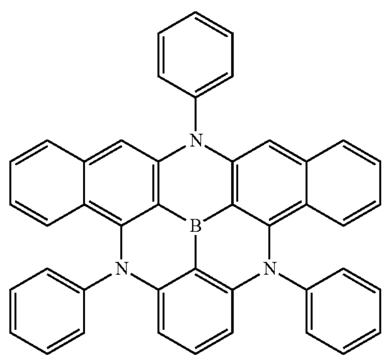
(1-27)
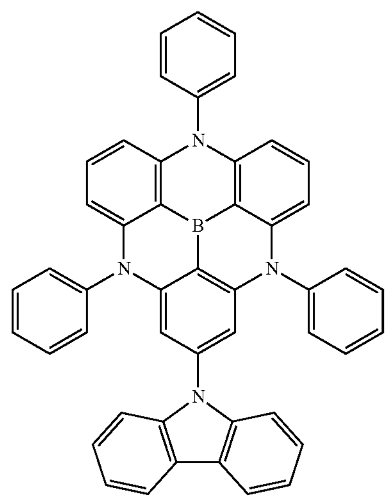
(1-28)
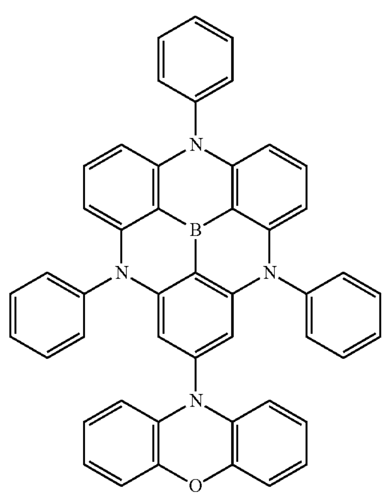
(1-29)
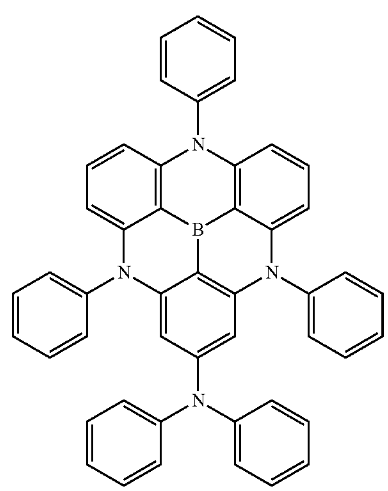

-continued
(1-30)
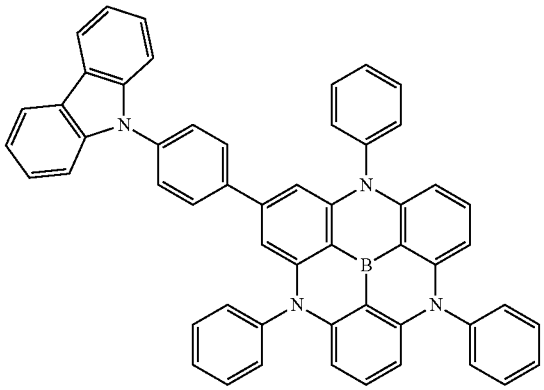
(1-31)
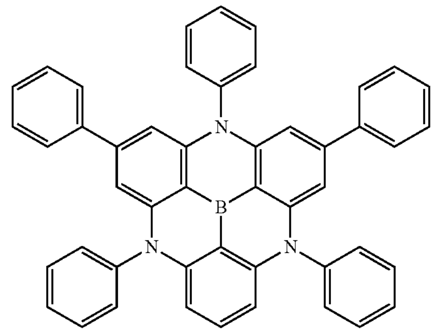
(1-32)
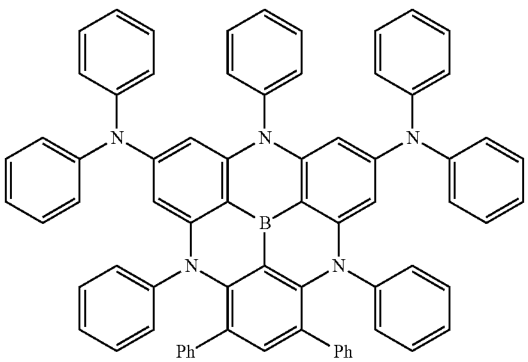
(1-33)
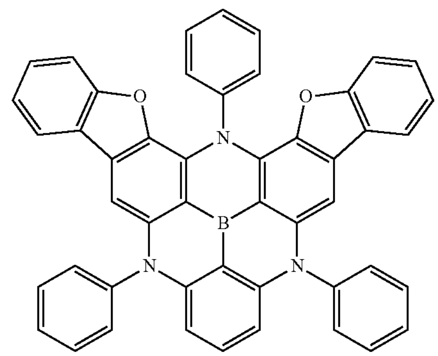
(1-34)
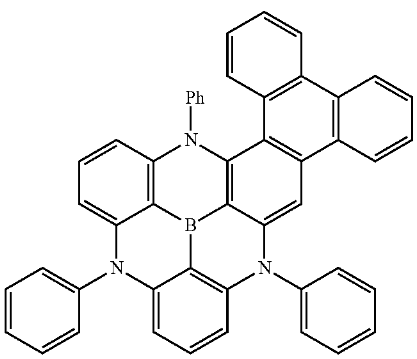
(1-35)
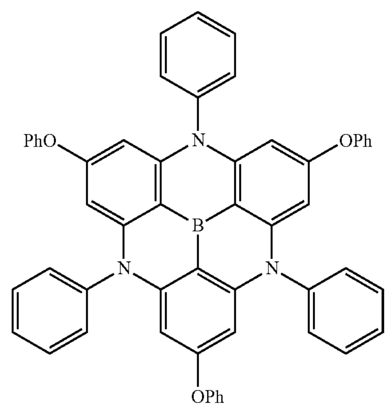
(1-41)
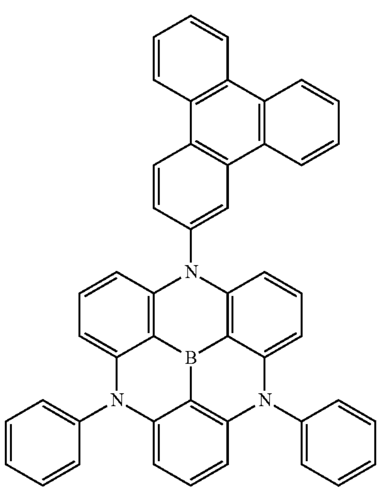
(1-42)
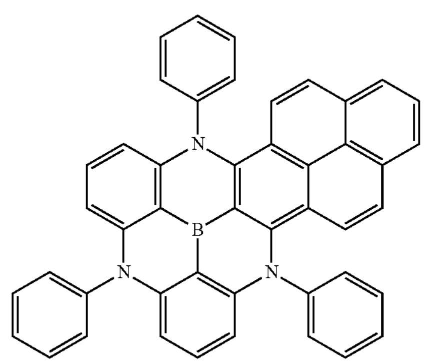

-continued
(1-43)
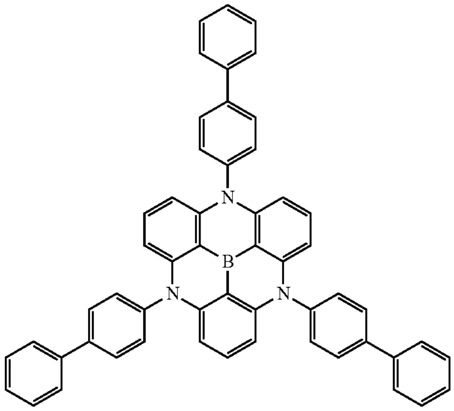
(1-44)
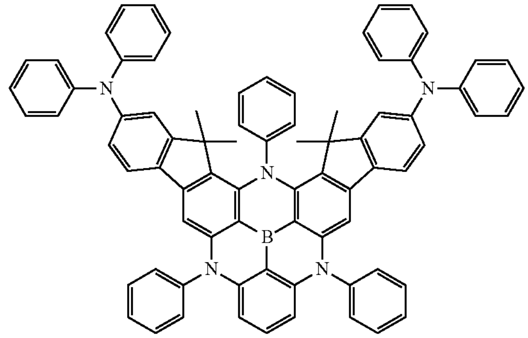
(1-45)
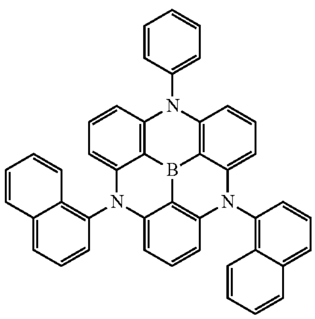
(1-46)
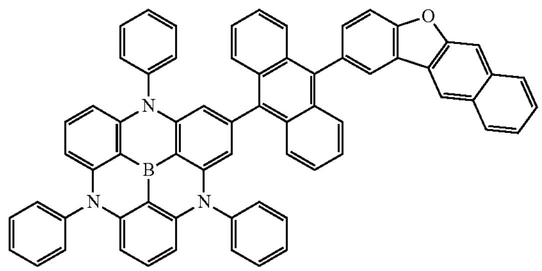
(1-47)
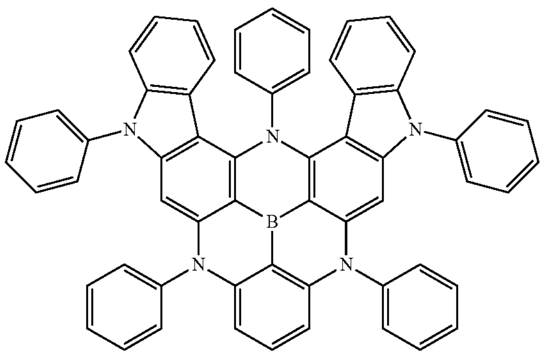
(1-48)
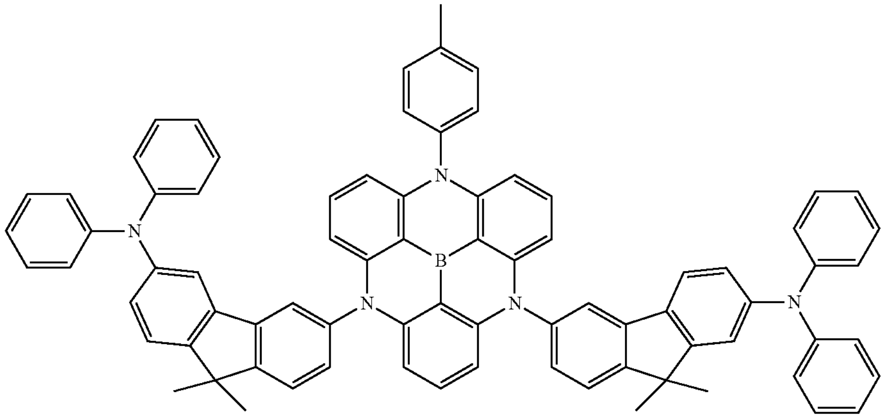

-continued
(1-49)
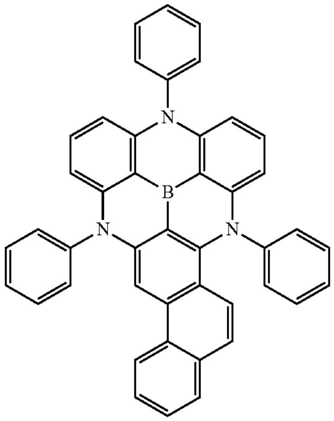
(1-50)
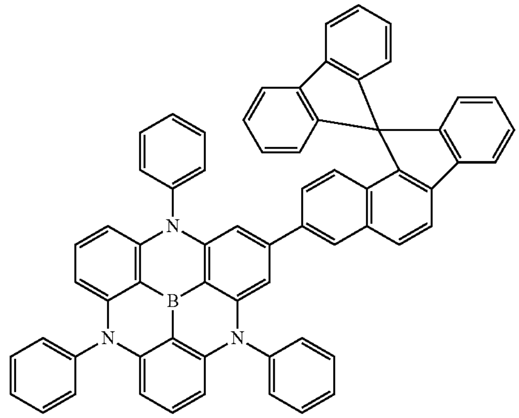
(1-51)
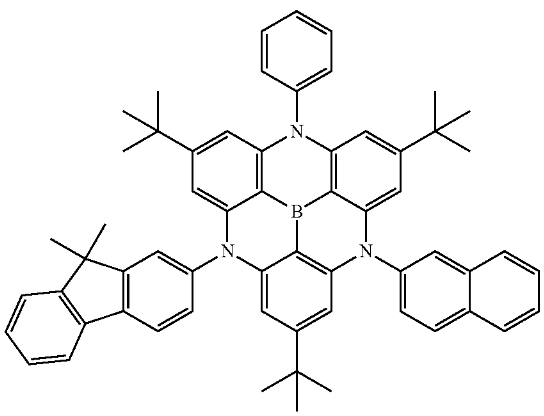
(1-52)
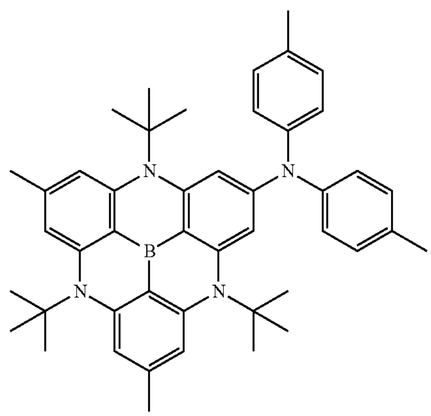
(1-53)
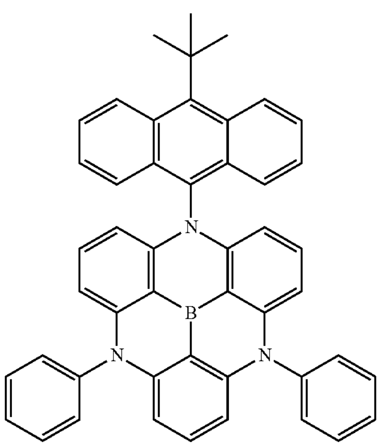
(1-54)
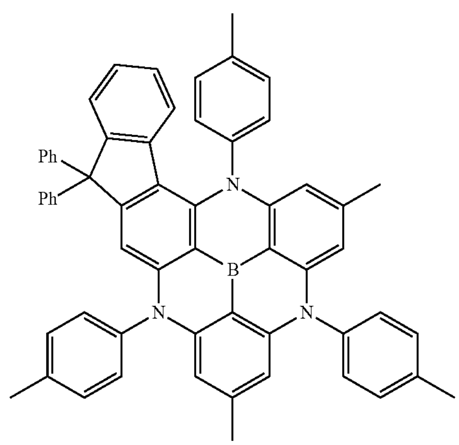

-continued
(1-55)
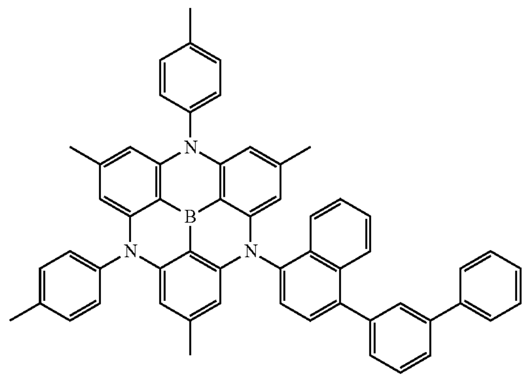
(1-61)
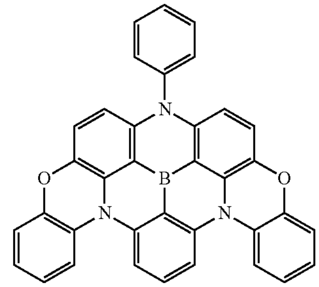
(1-62)
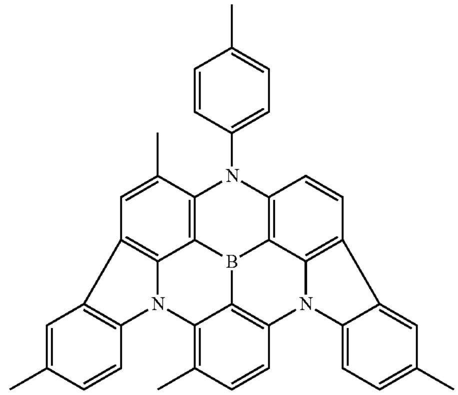
(1-63)
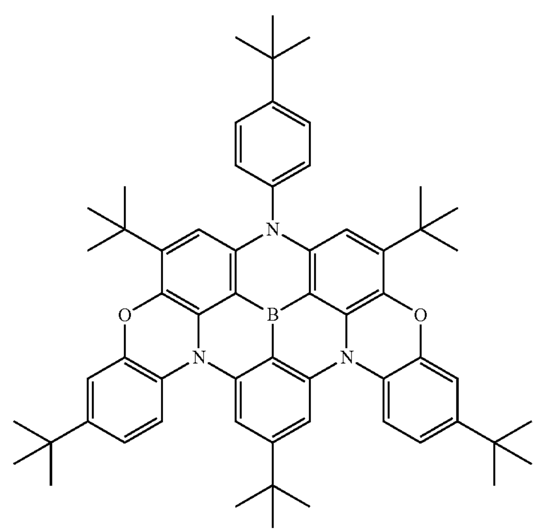
(1-64)
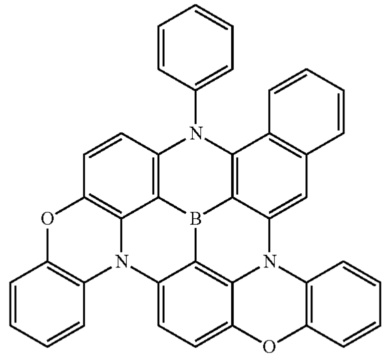
(1-65)
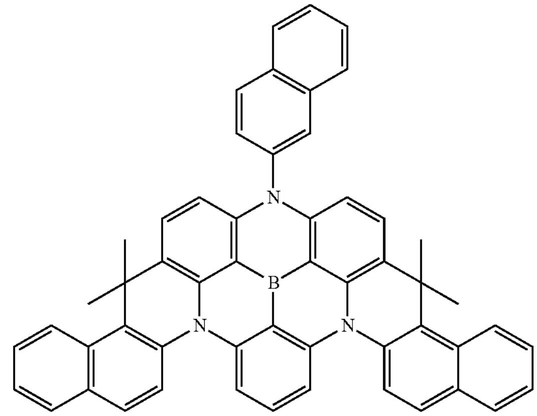

-continued
(1-66)
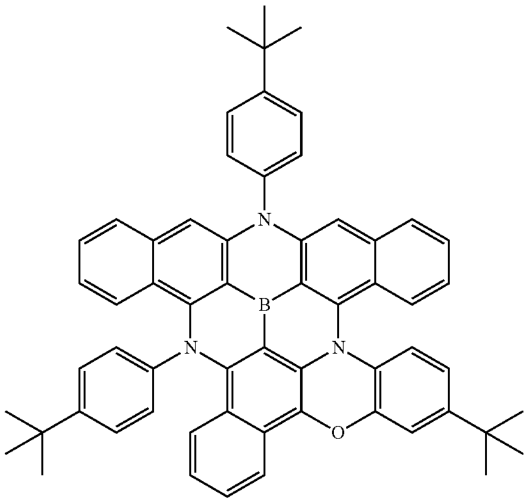
(1-67)
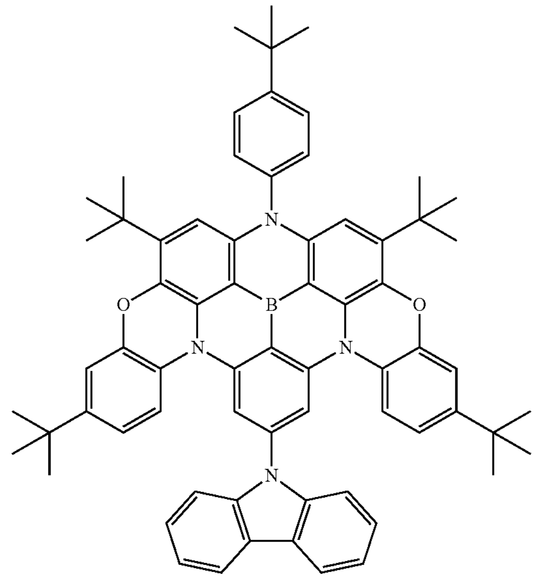
(1-68)
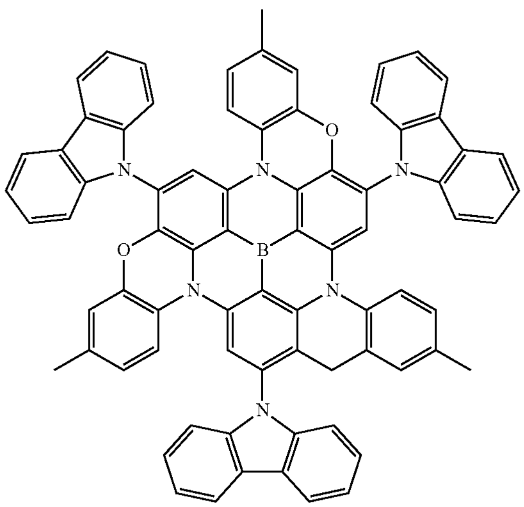
(1-69)
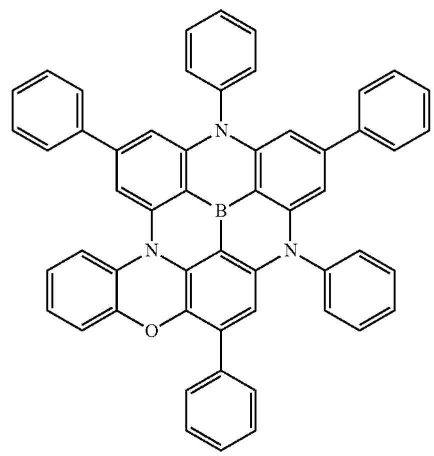
(1-70)
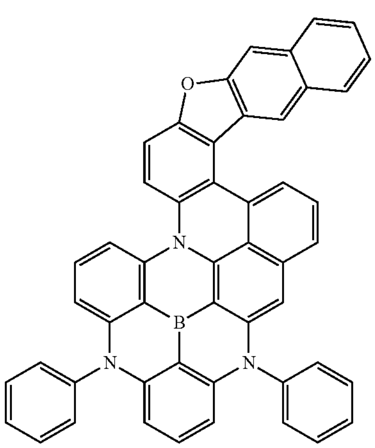
(1-71)
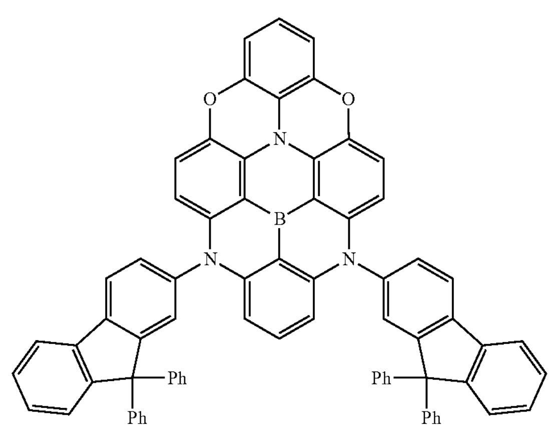

-continued
(1-72)
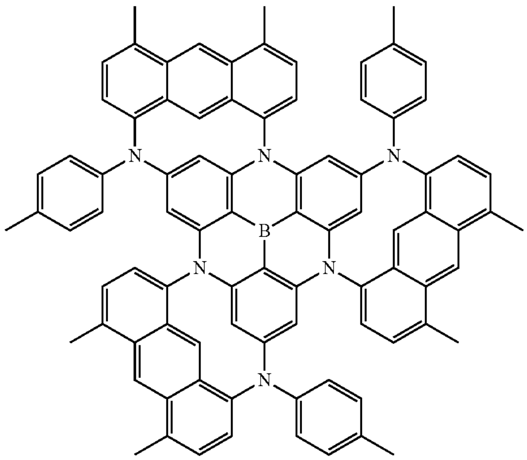
(1-73)
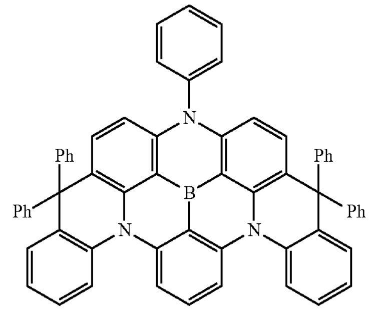
(1-74)
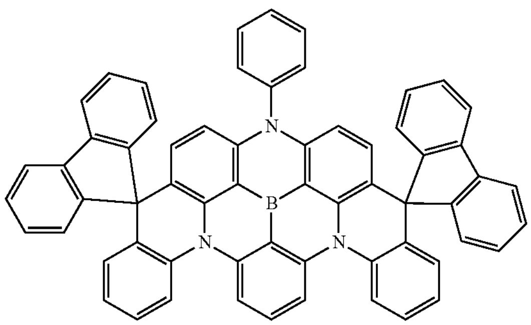
(1-75)
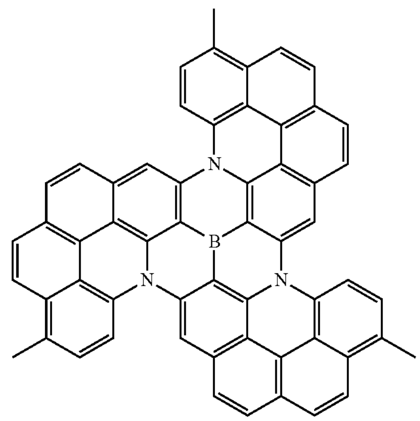
(1-81)
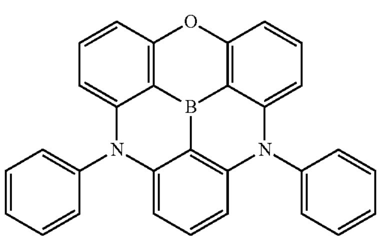
(1-82)
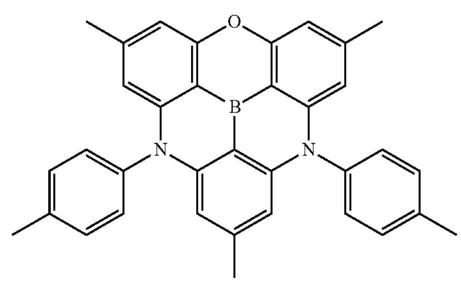
(1-83)
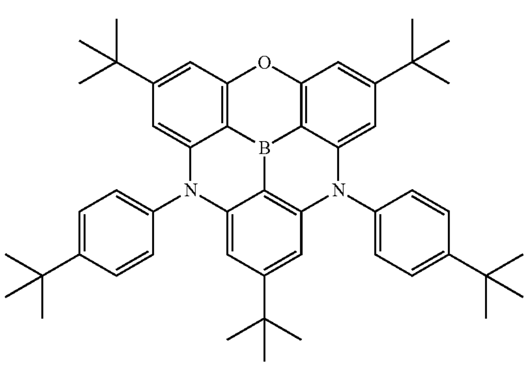

-continued
(1-84)
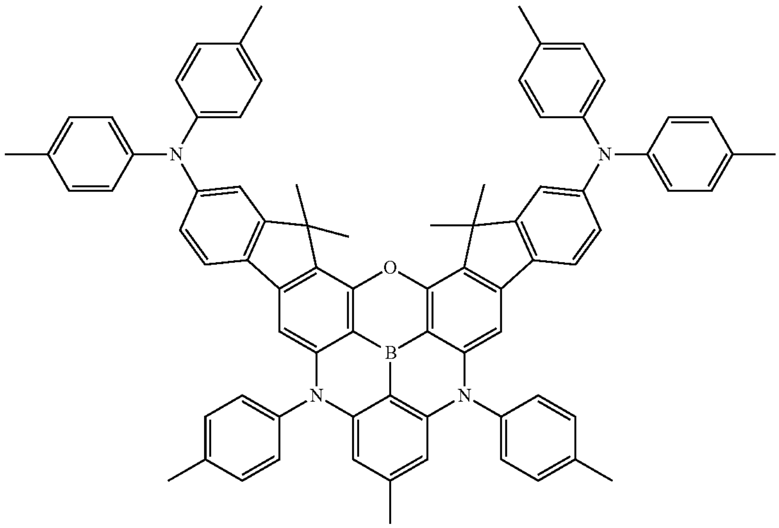
(1-85)
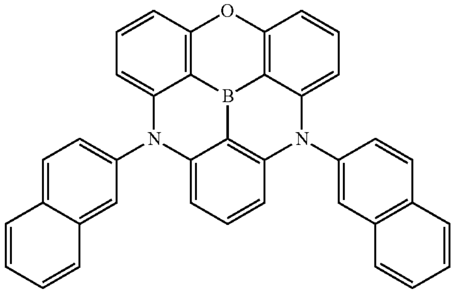
(1-86)
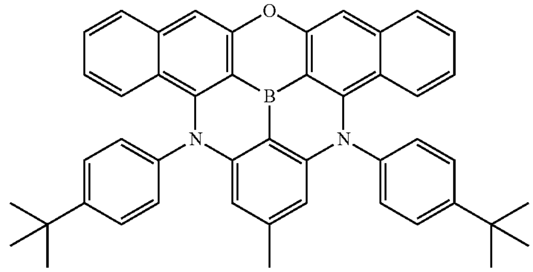
(1-87)
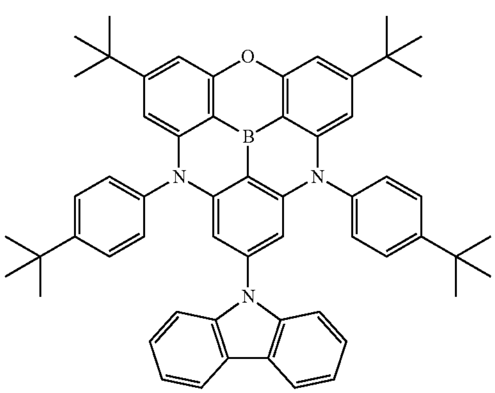
(1-88)
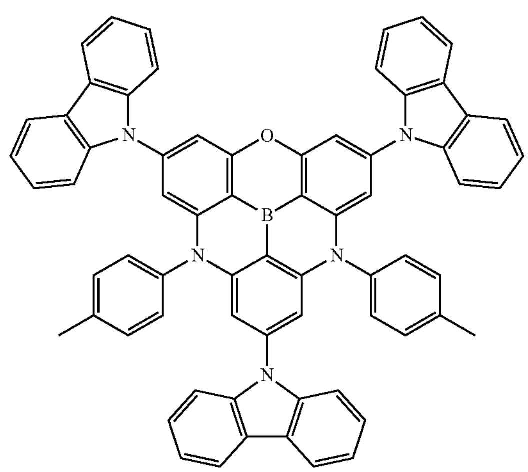

-continued
(1-89)
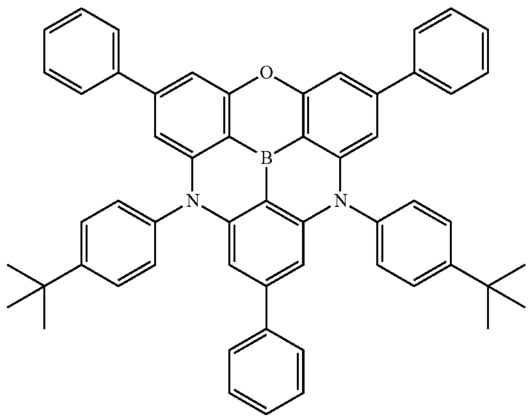
(1-90)
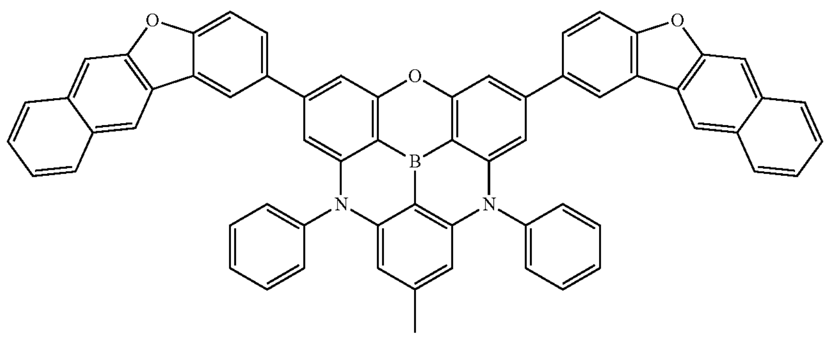
(1-91)
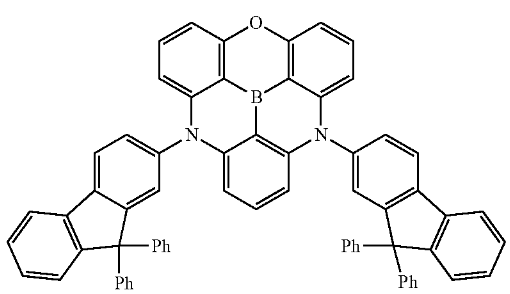
(1-92)
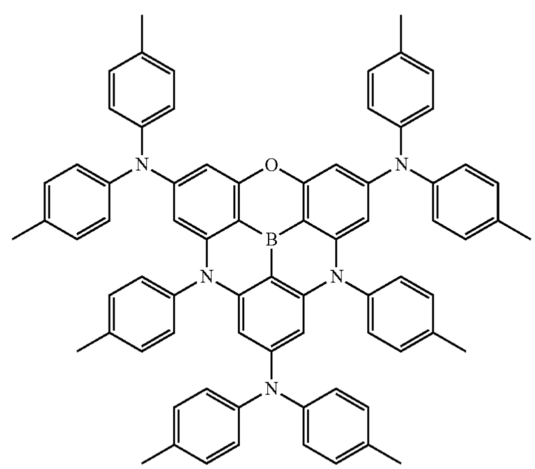
(1-93)
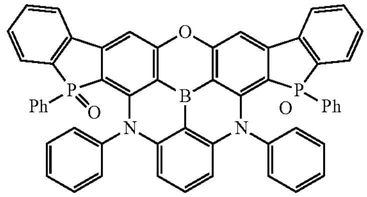
(1-94)
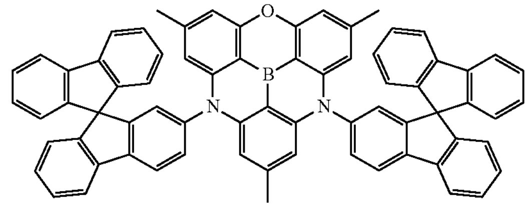

-continued
(1-95)
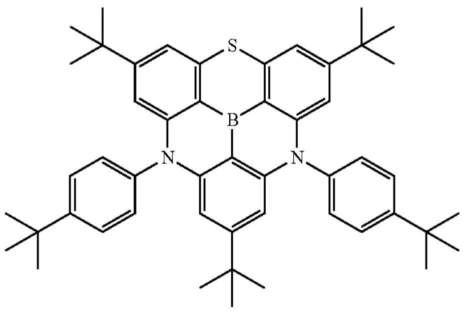
(1-101)
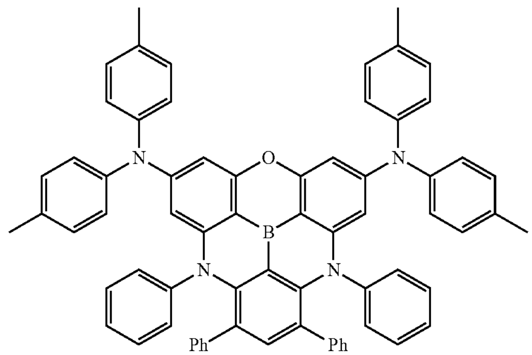
(1-102)
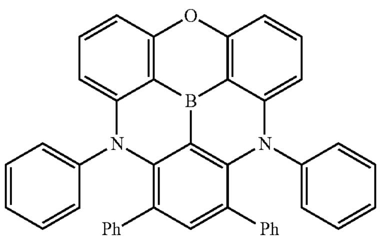
(1-103)
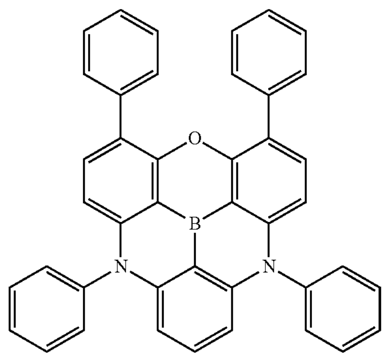
(1-104)
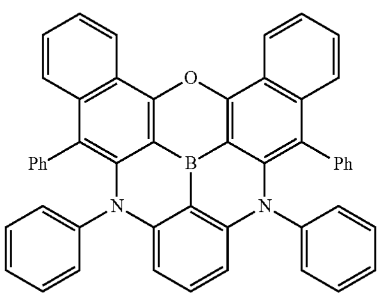
(1-105)
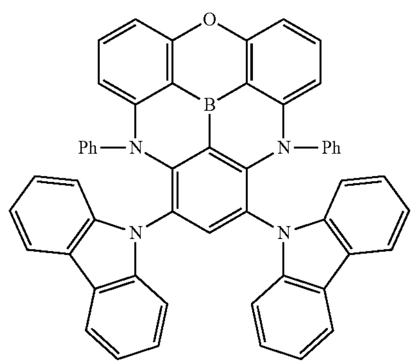
(1-106)
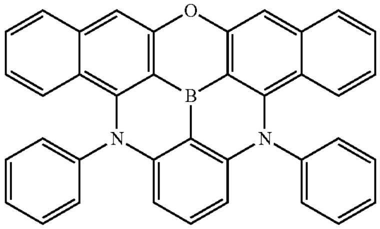
(1-107)
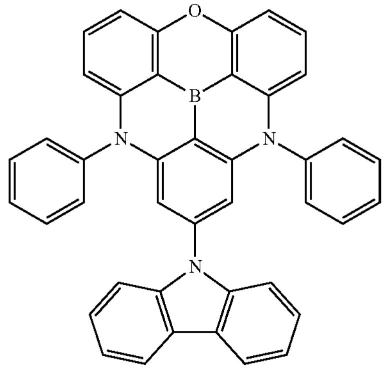

-continued
(1-108)
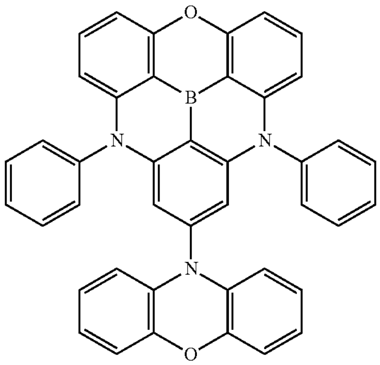
(1-109)
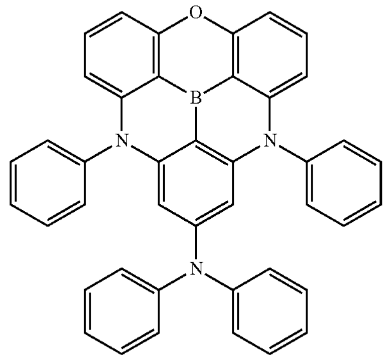
(1-110)
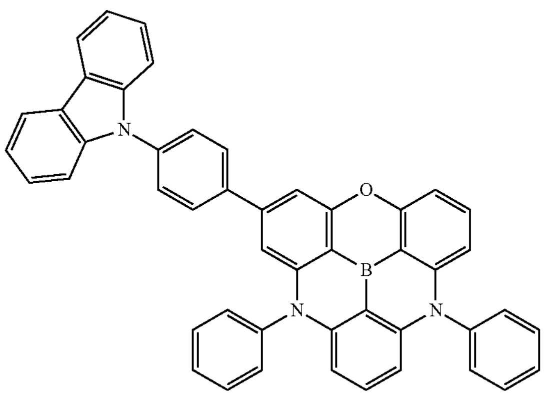
(1-111)
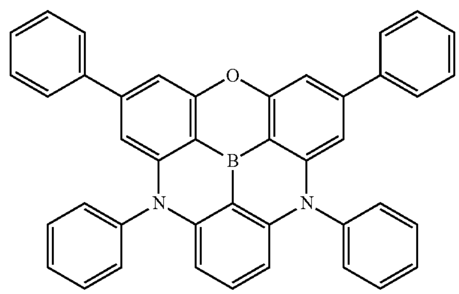
(1-112)
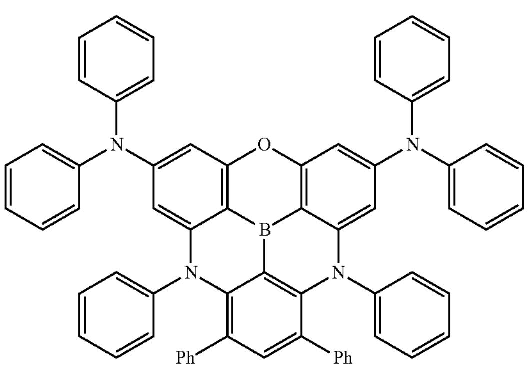
(1-113)
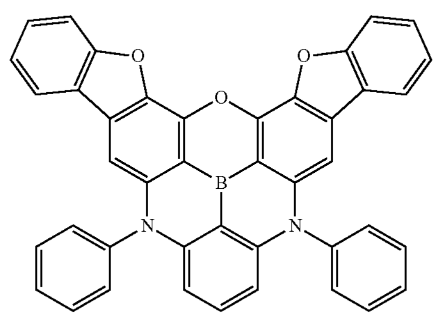
(1-114)
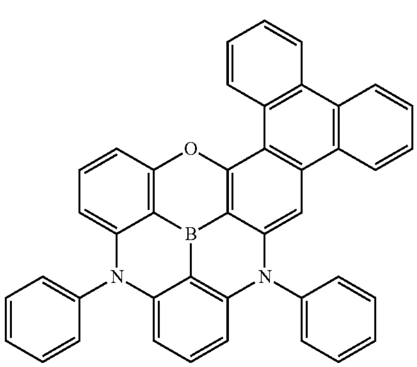
(1-115)
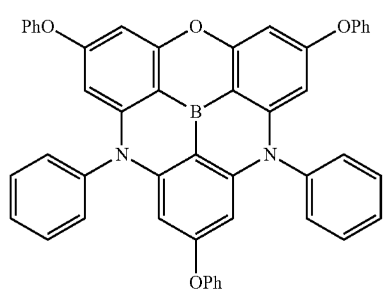

-continued
(1-121)
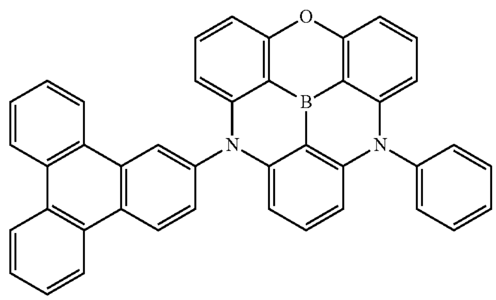
(1-122)
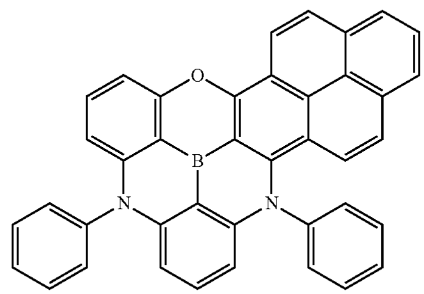
(1-123)
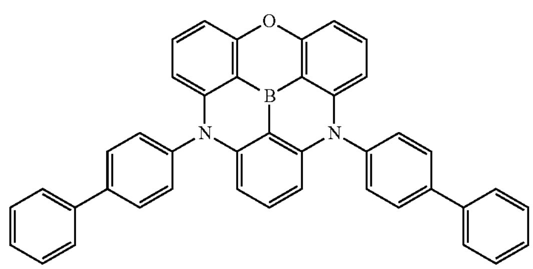
(1-124)
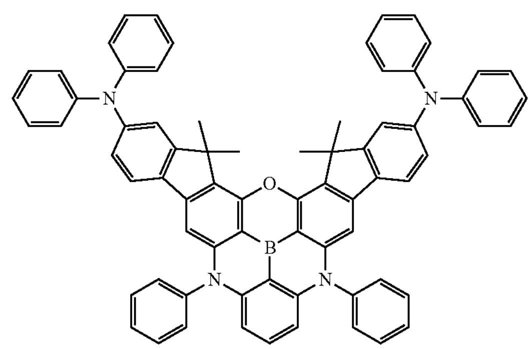
(1-125)
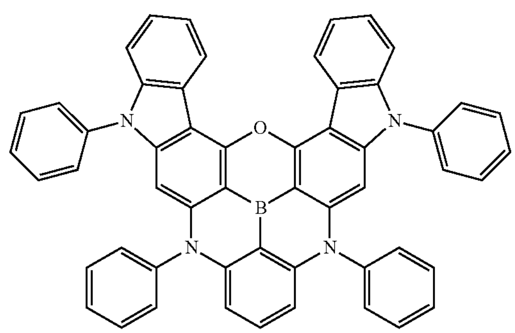
(1-126)
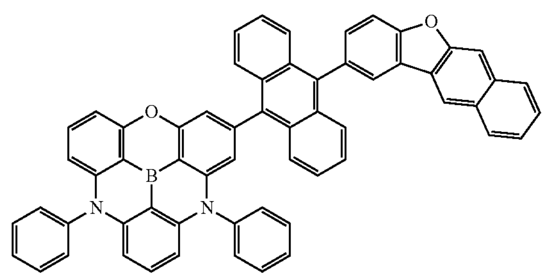
(1-127)
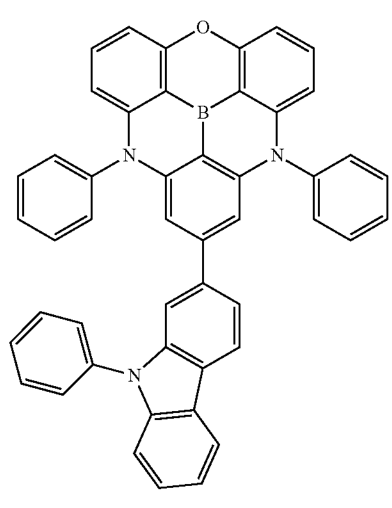

-continued
(1-128)
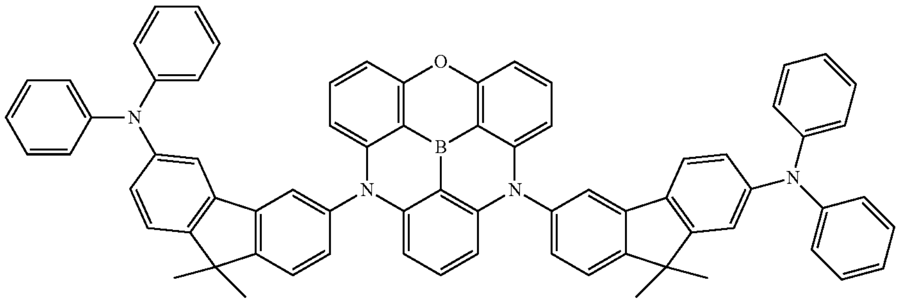
(1-129)
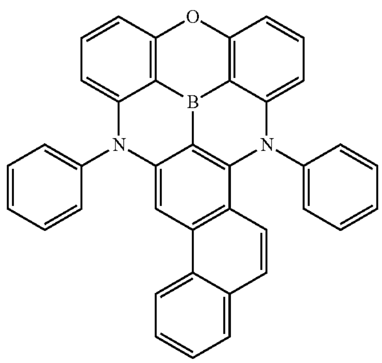
(1-130)
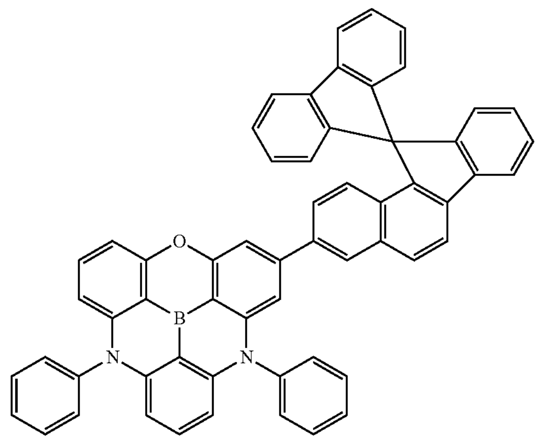
(1-131)
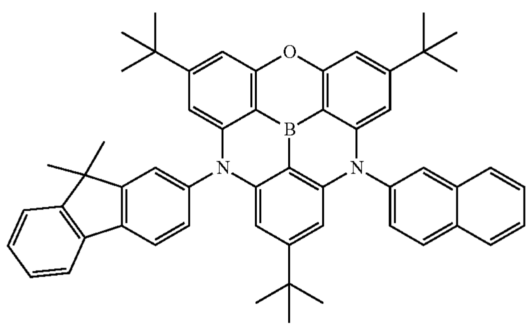
(1-132)
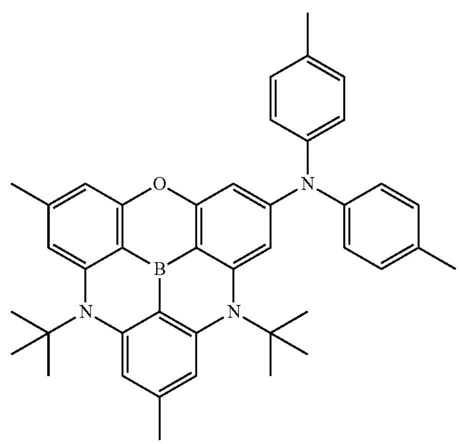
(1-133)
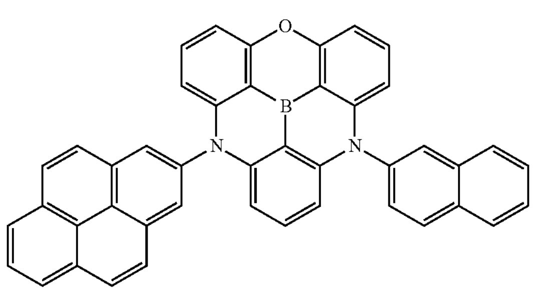
(1-134)
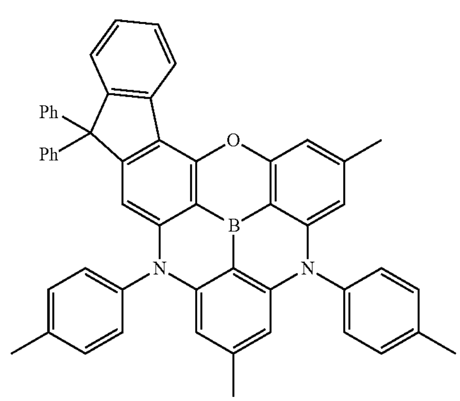

-continued
(1-135)
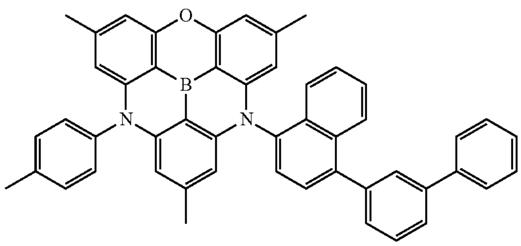
(1-141)
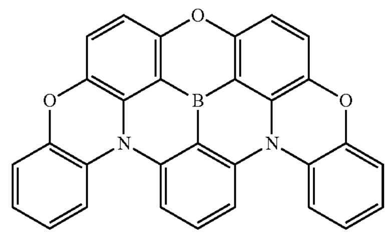
(1-142)
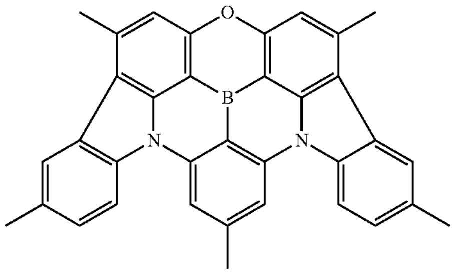
(1-143)
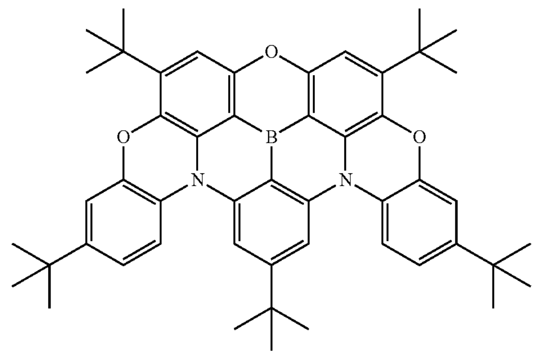
(1-144)
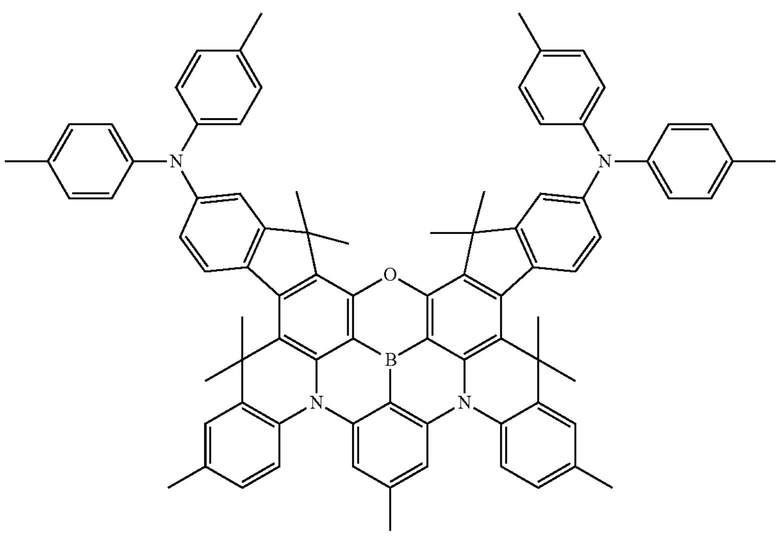
(1-145)
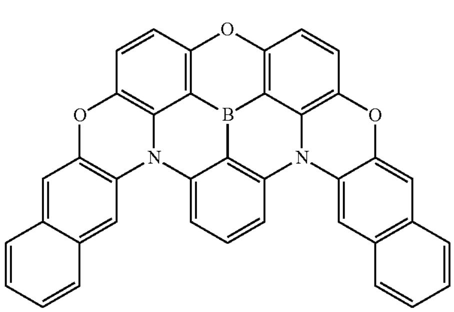
(1-146)
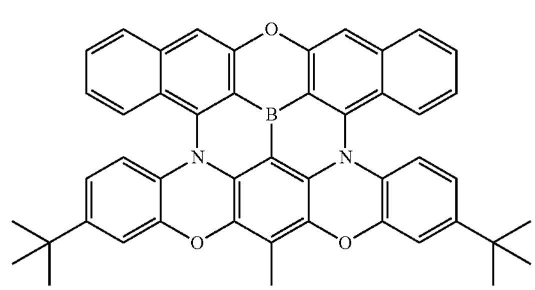

-continued
(1-147)
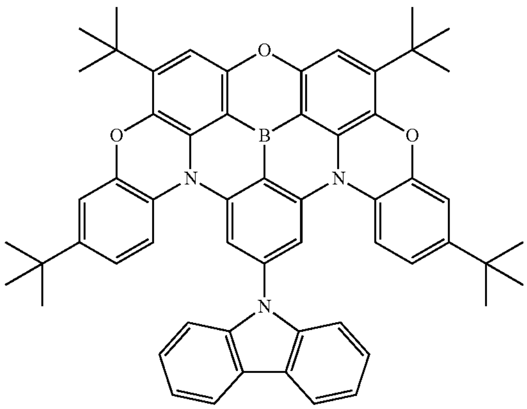
(1-148)
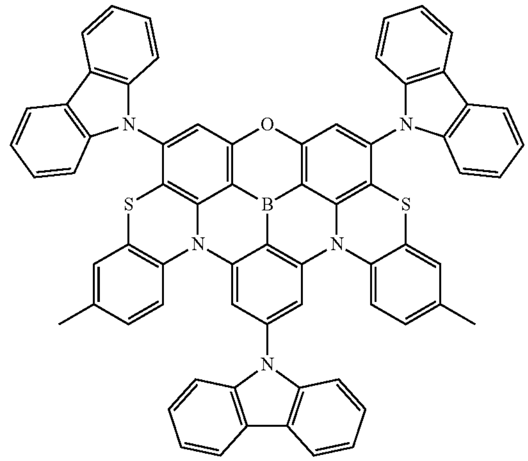
(1-149)
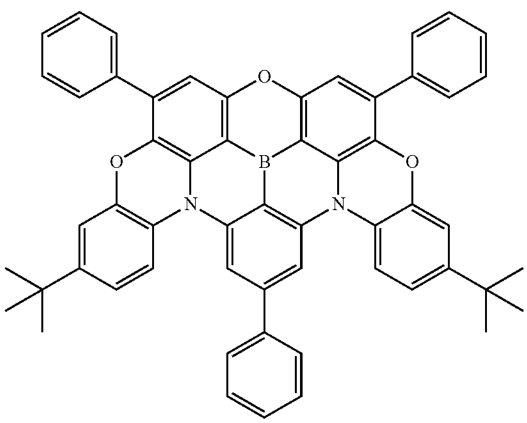
(1-150)
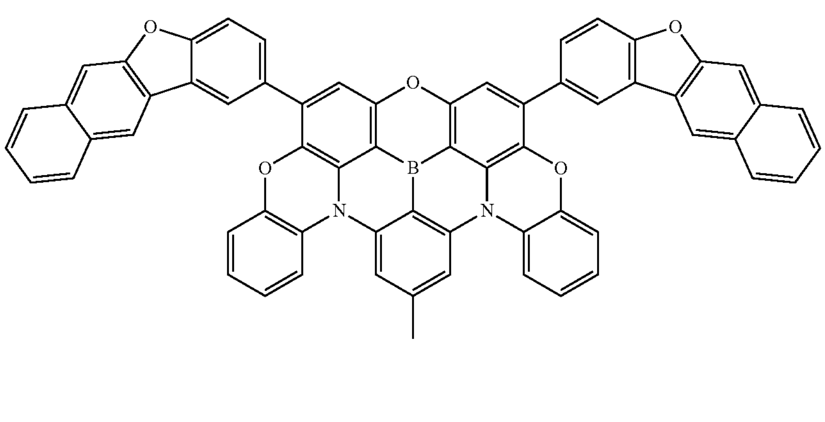

-continued
(1-151)
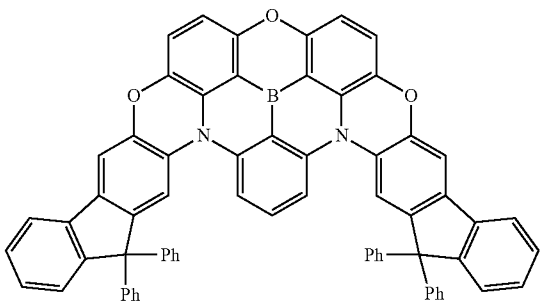
(1-152)
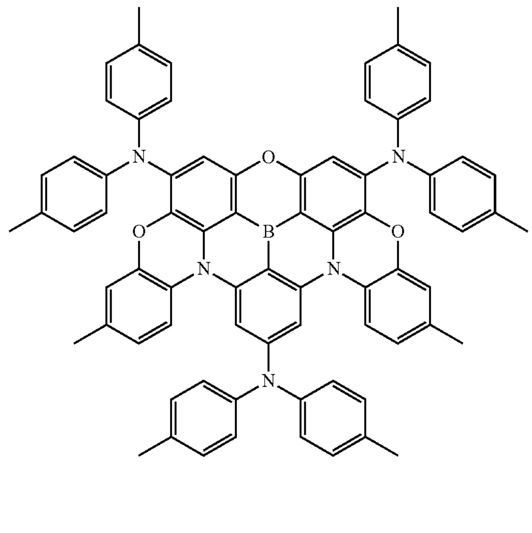
(1-153)
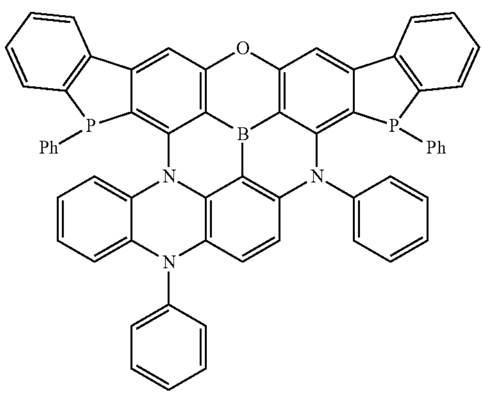
(1-154)
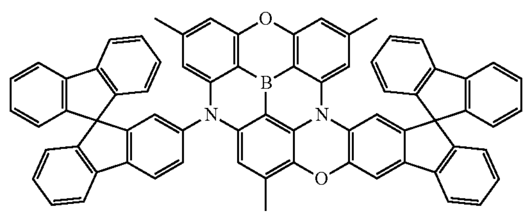
(1-155)
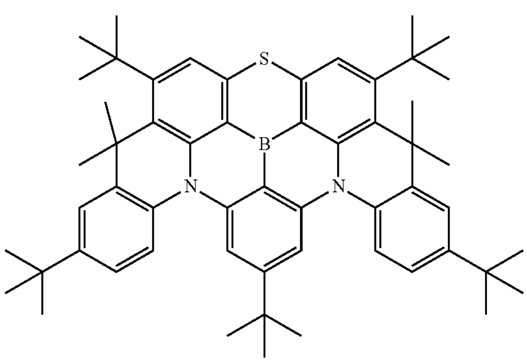
(1-161)
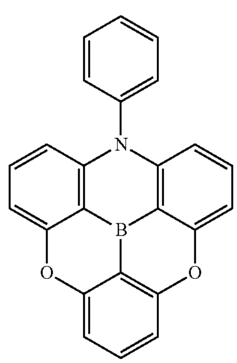

-continued
(1-162)
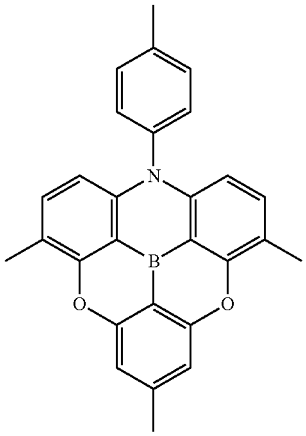
(1-163)
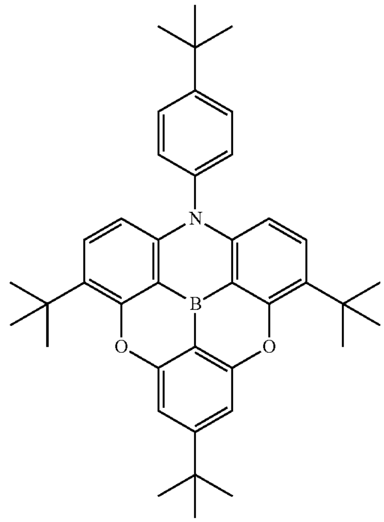
(1-164)
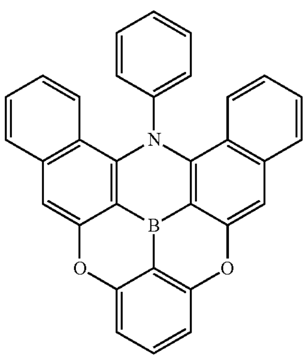
(1-165)
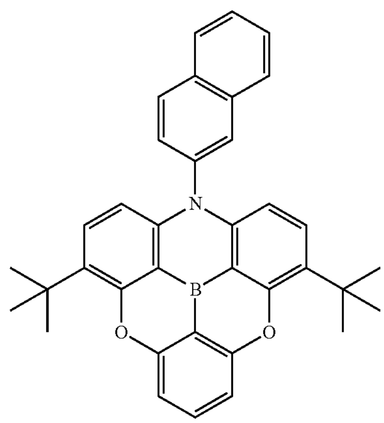
(1-166)
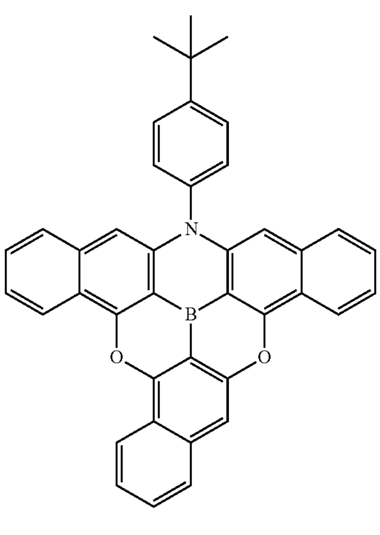
(1-167)
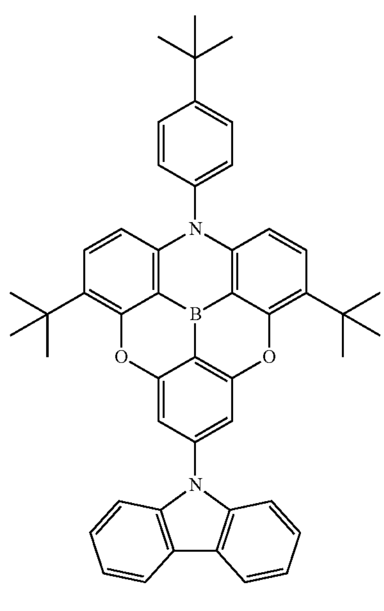

-continued
(1-168)
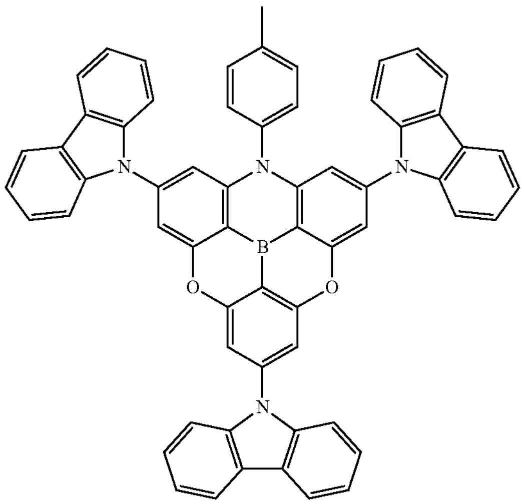
(1-169)
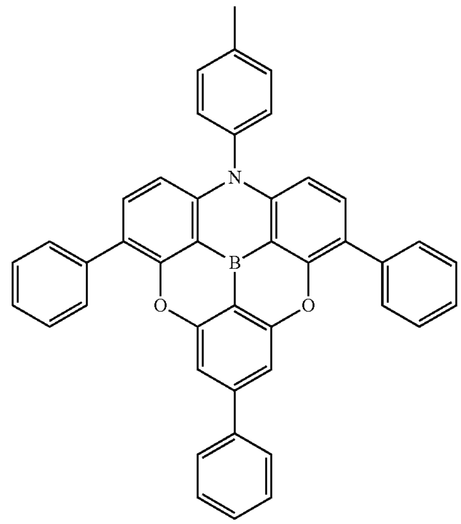
(1-170)
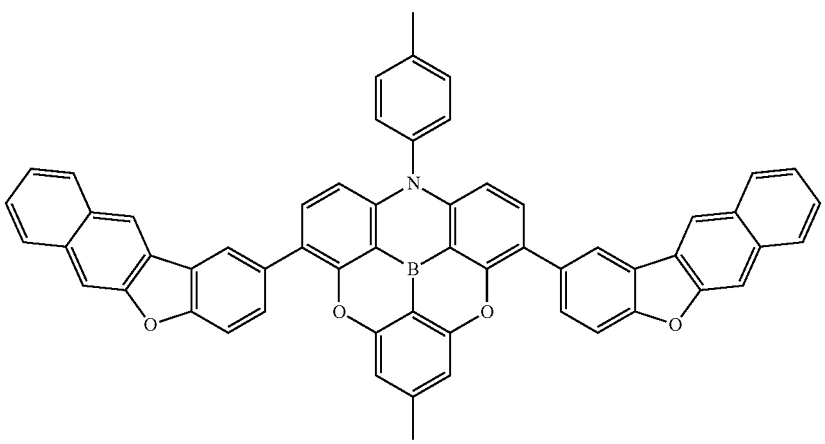
(1-171)
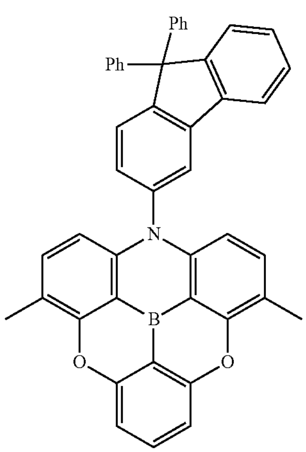
(1-172)
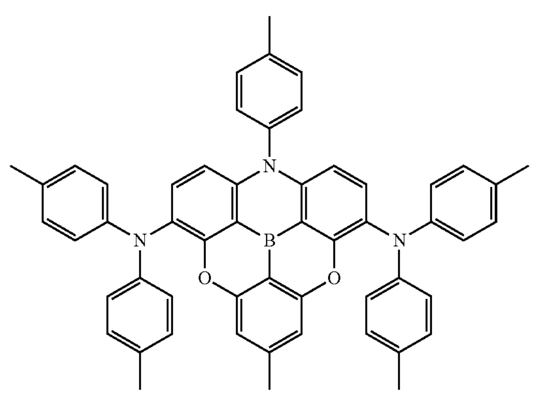

-continued
(1-173)
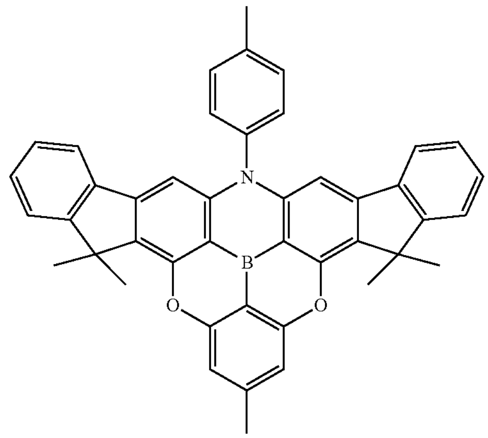
(1-174)
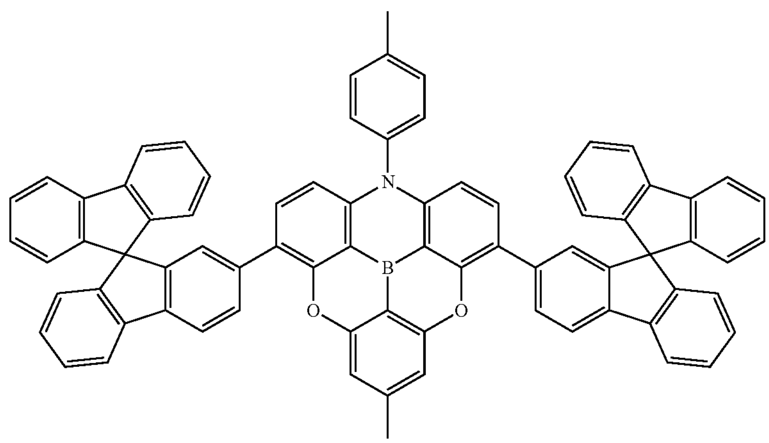
(1-175)
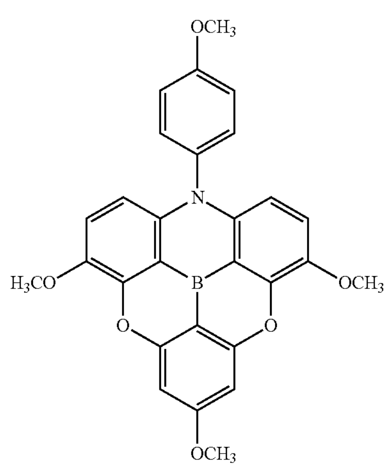
(1-181)
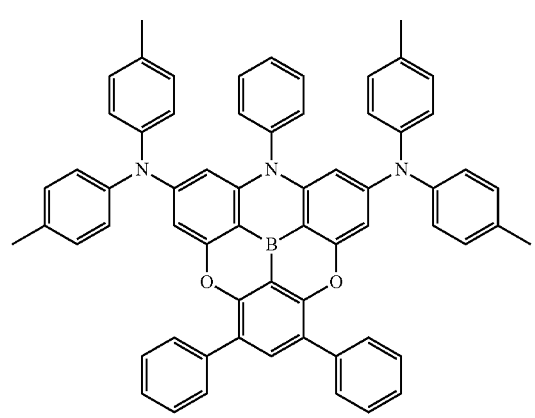

-continued
(1-182)
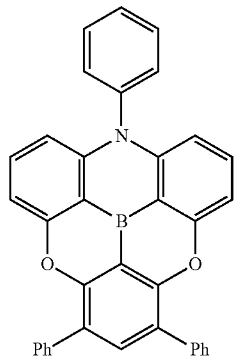
(1-183)
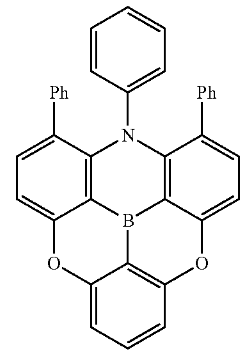
(1-184)
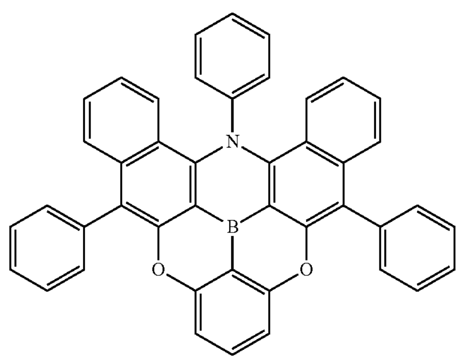
(1-185)
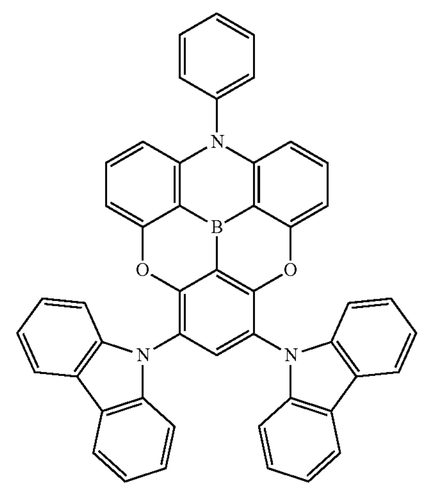
(1-186)
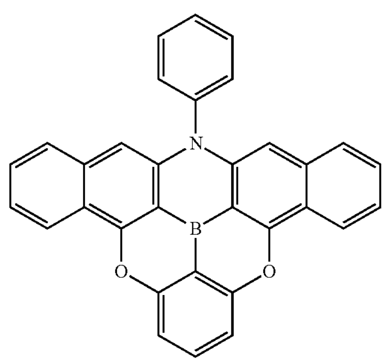
(1-187)
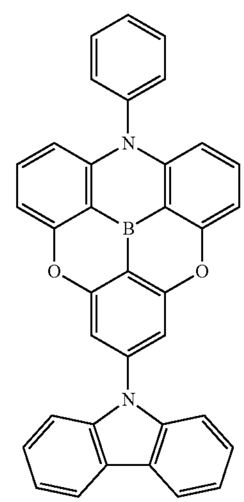

-continued
(1-188)
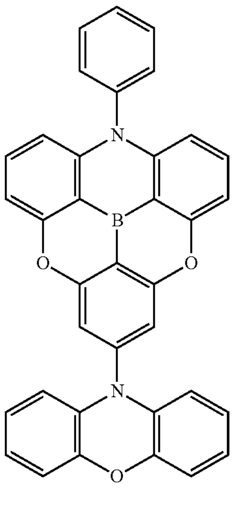
(1-189)
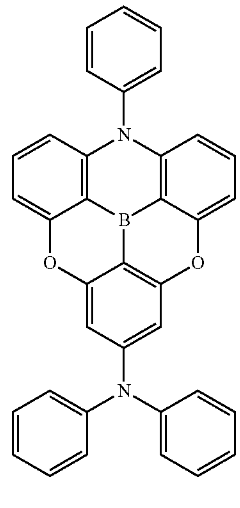
(1-190)
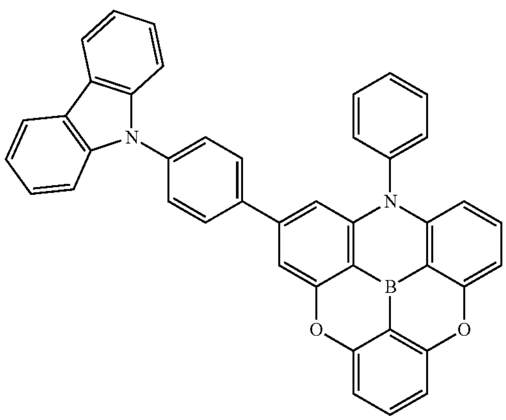
(1-191)
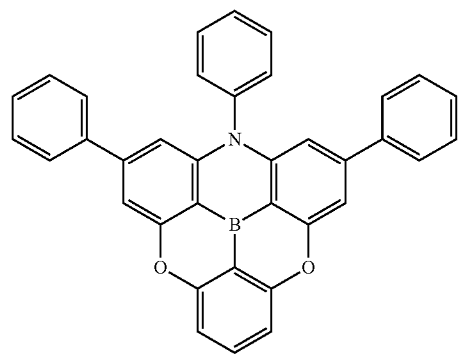
(1-192)
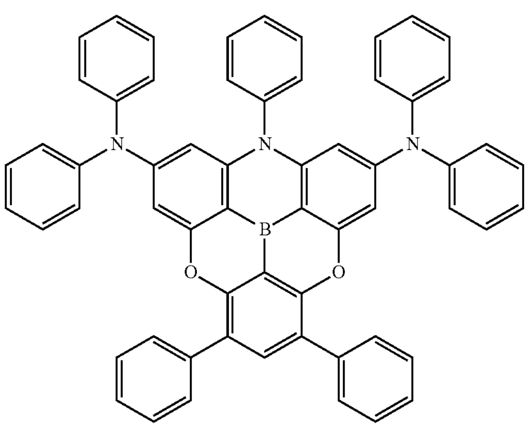
(1-193)
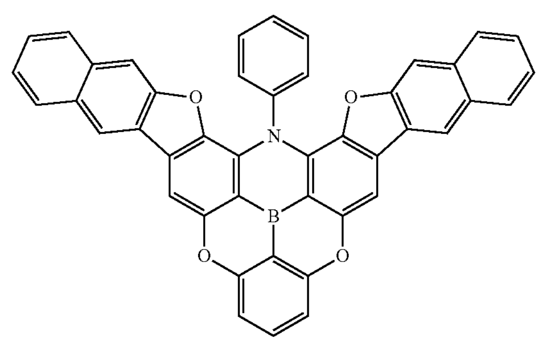

-continued
(1-194)
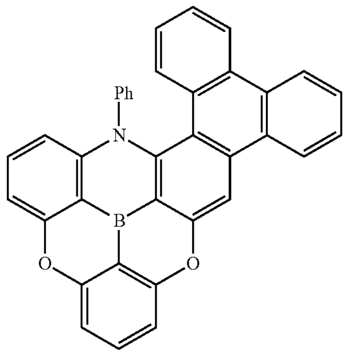
(1-195)
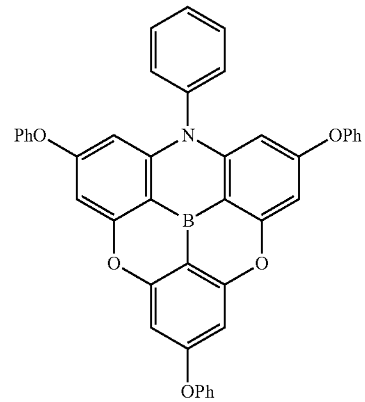
(1-201)
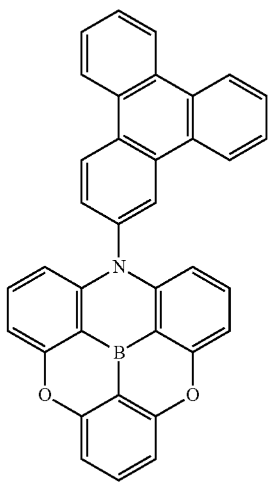
(1-202)
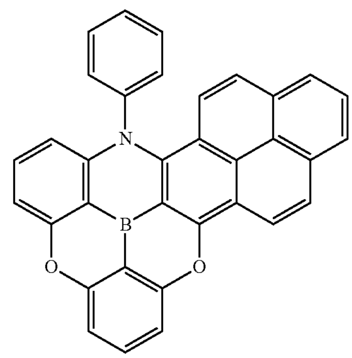
(1-203)
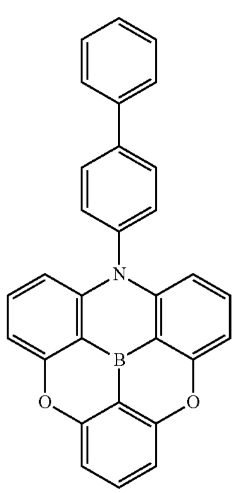
(1-204)
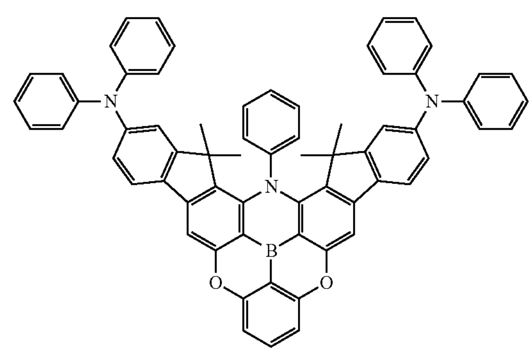

-continued
(1-205)
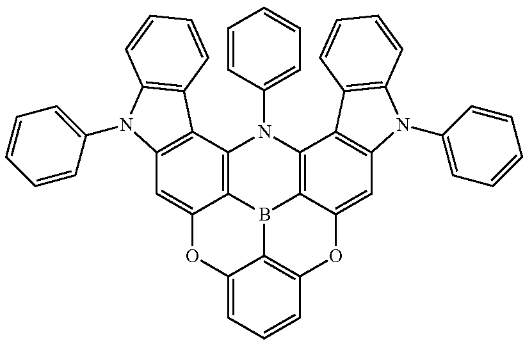
(1-206)
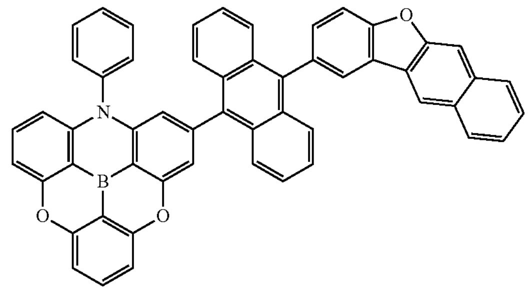
(1-207)
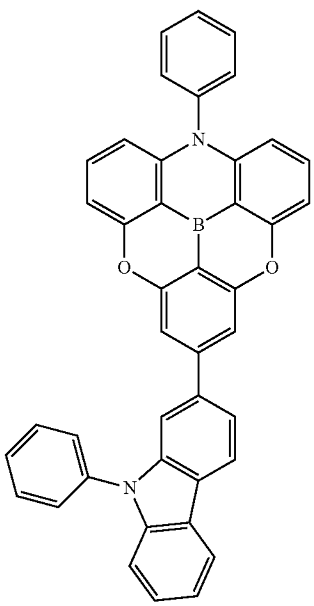
(1-208)
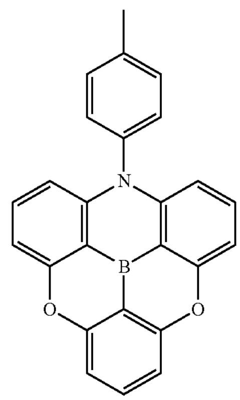
(1-209)
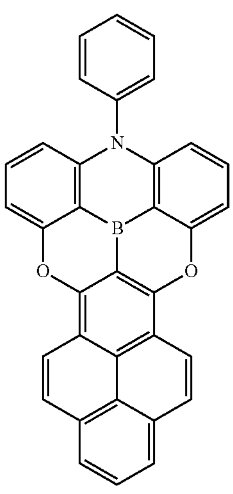
(1-210)
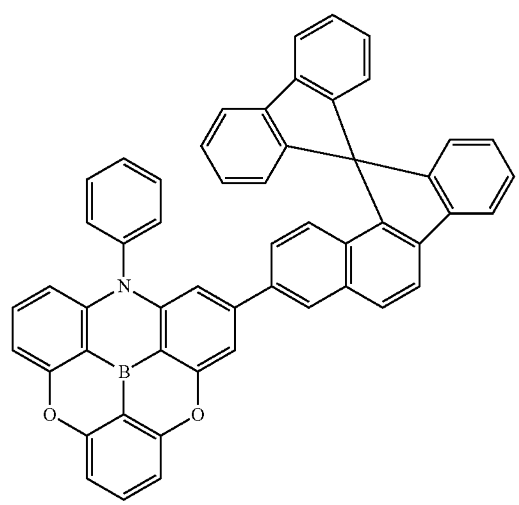

-continued
(1-211)
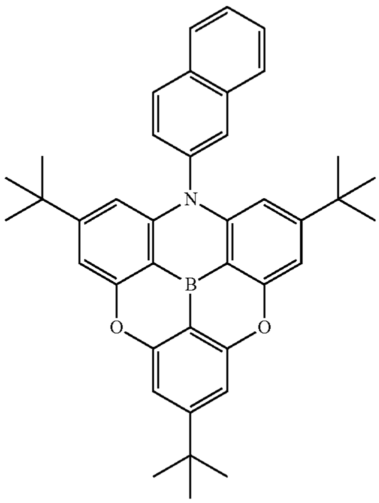
(1-212)
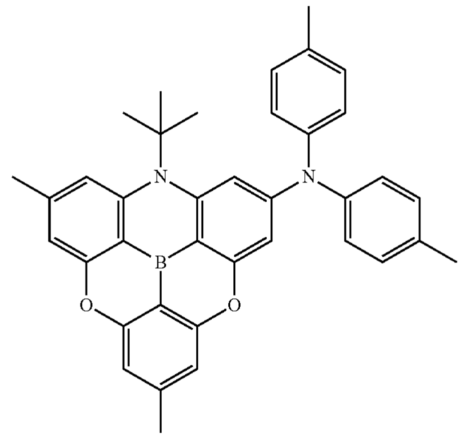
(1-213)
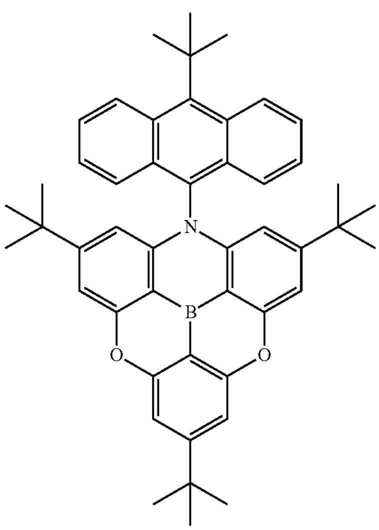
(1-214)
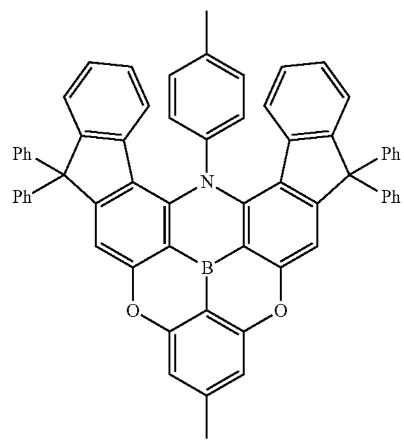
(1-215)
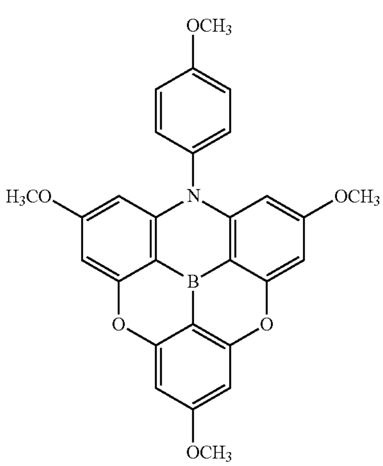
(1-221)
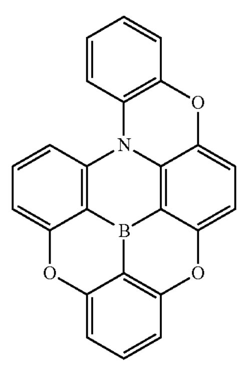

-continued
(1-222)
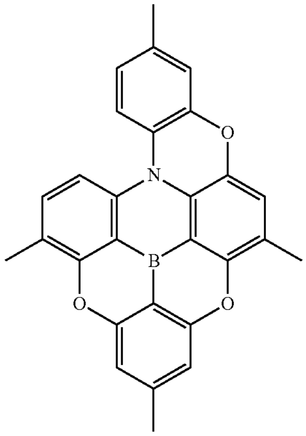
(1-223)
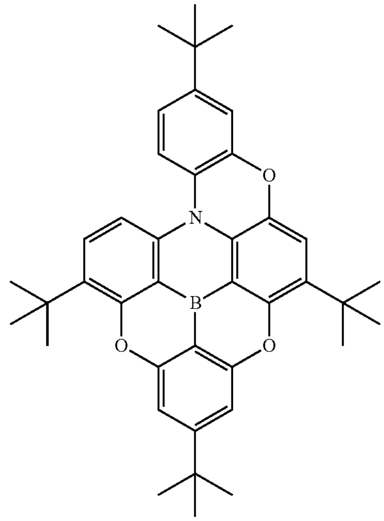
(1-224)
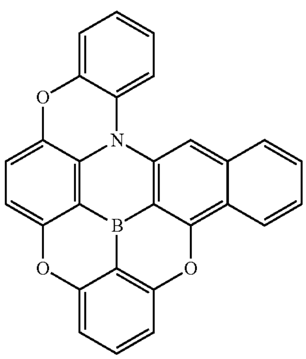
(1-225)
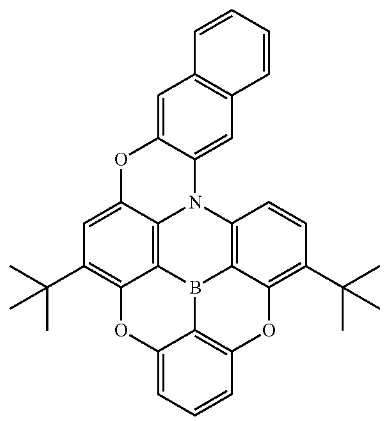
(1-226)
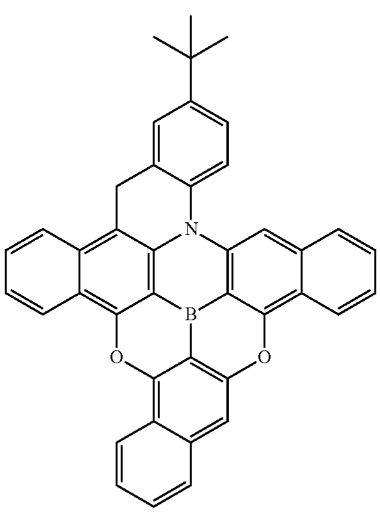
(1-227)
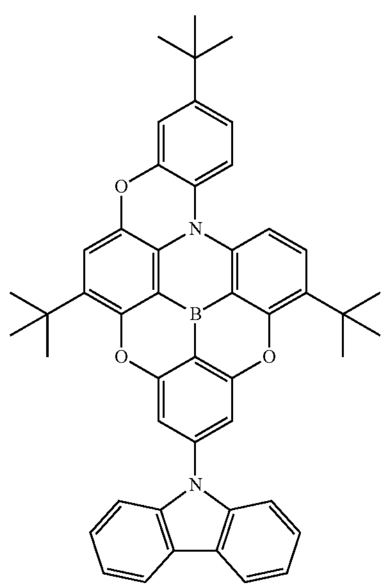

-continued
(1-228)
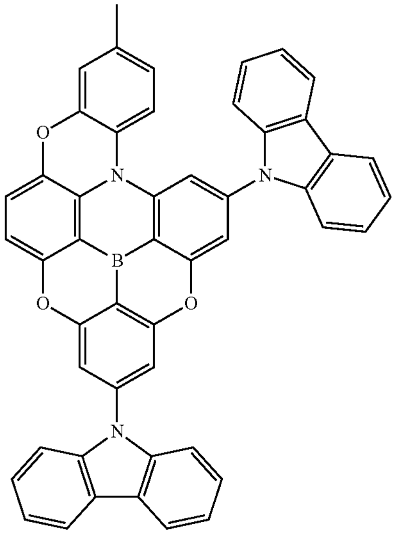
(1-229)
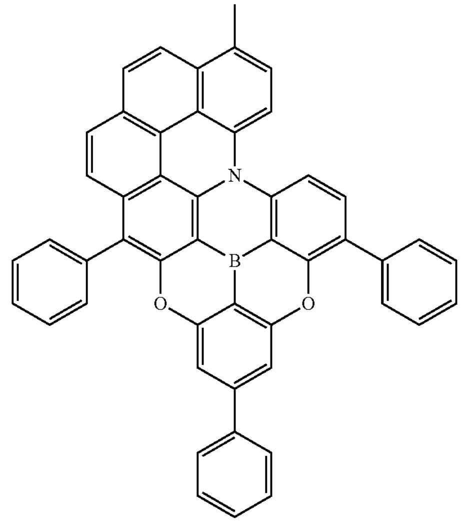
(1-230)
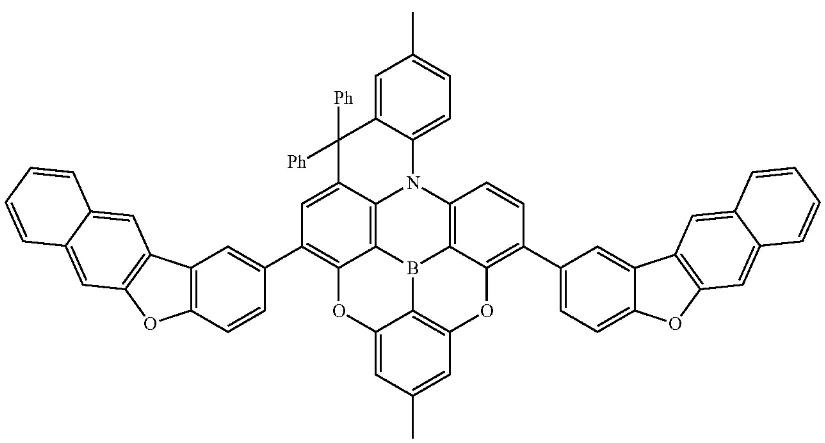
(1-231)
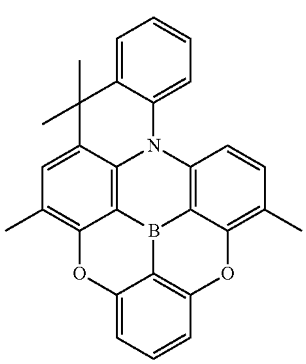
(1-232)
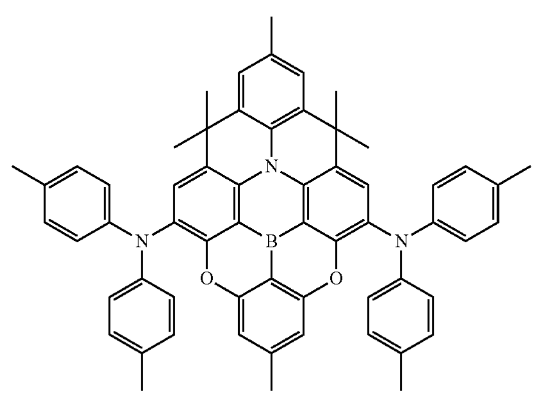

-continued
(1-233)
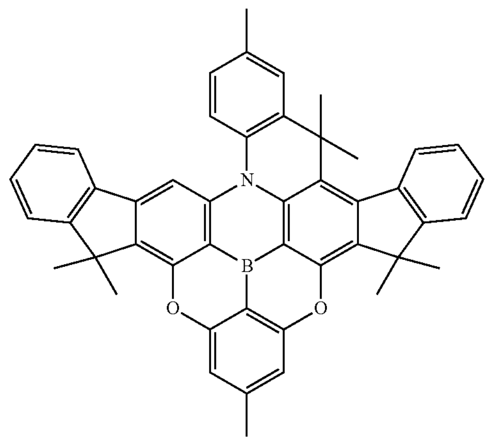
(1-234)
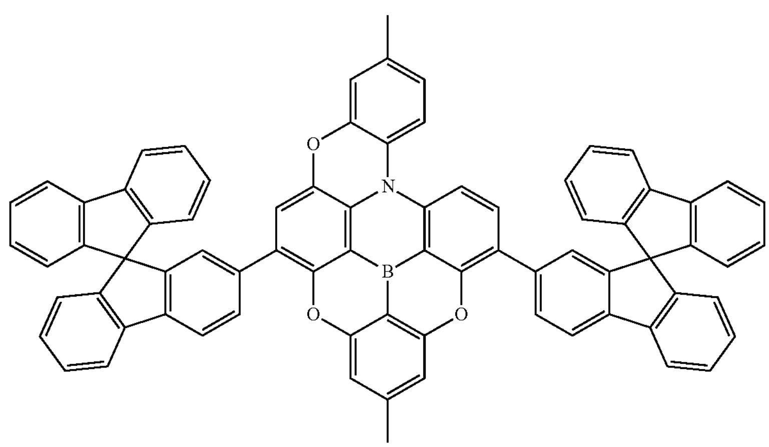
(1-235)
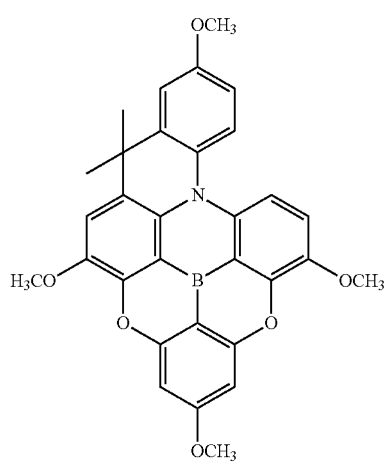
(1-241)
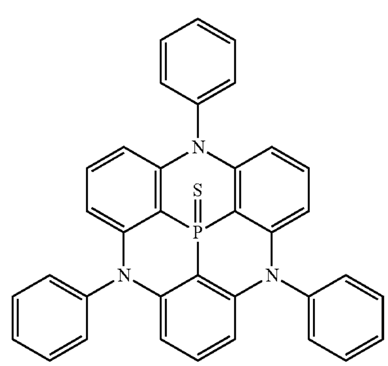

-continued
(1-242)
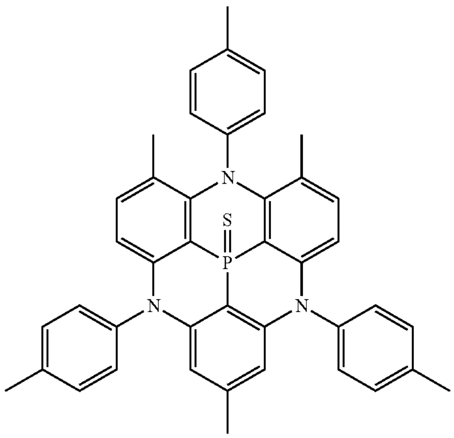
(1-243)
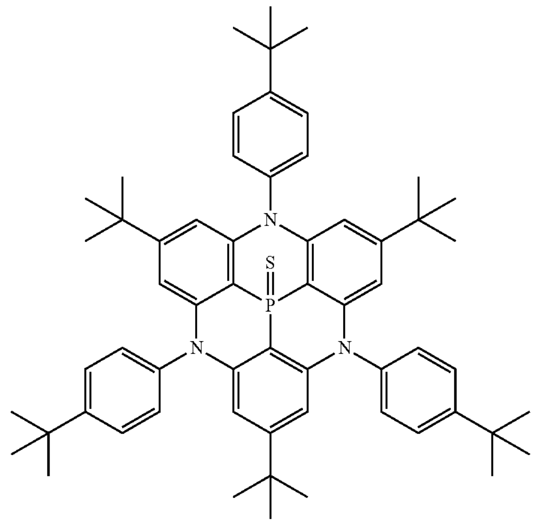
(1-244)
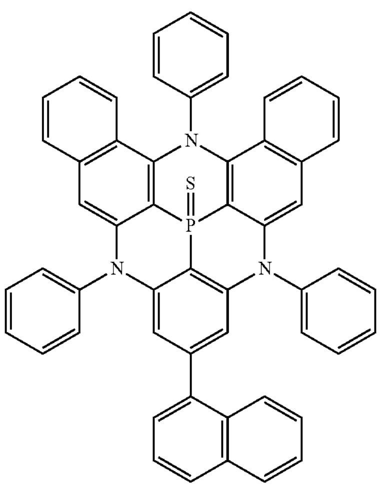
(1-245)
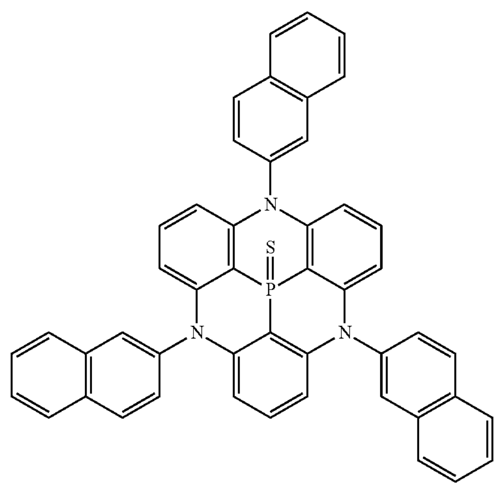
(1-246)
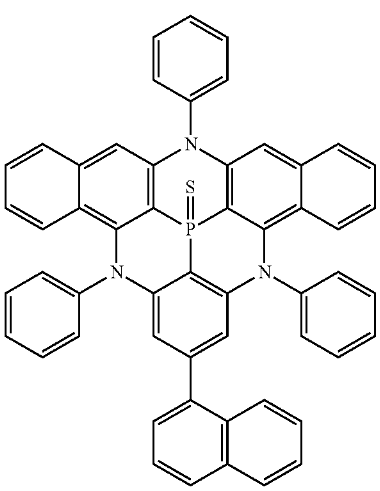
(1-247)
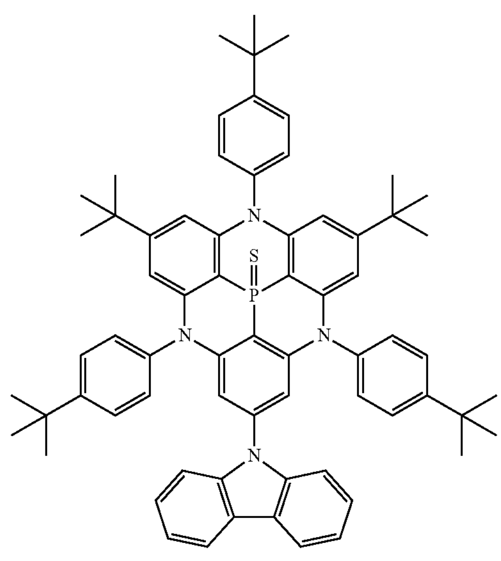

-continued
(1-248)
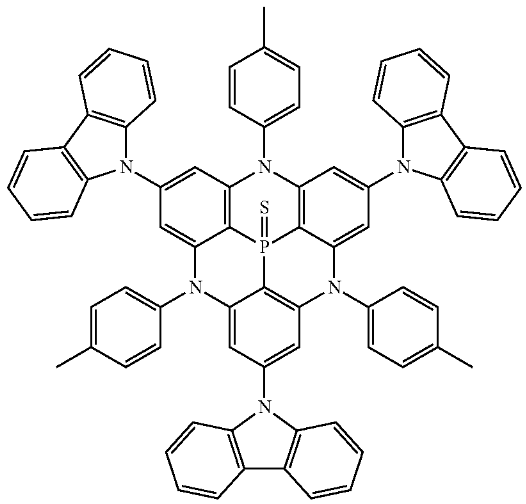
(1-249)
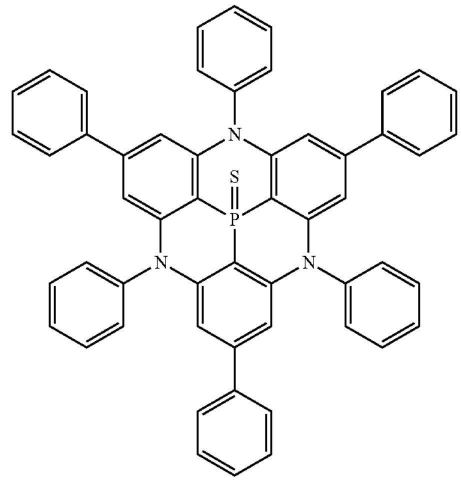
(1-250)
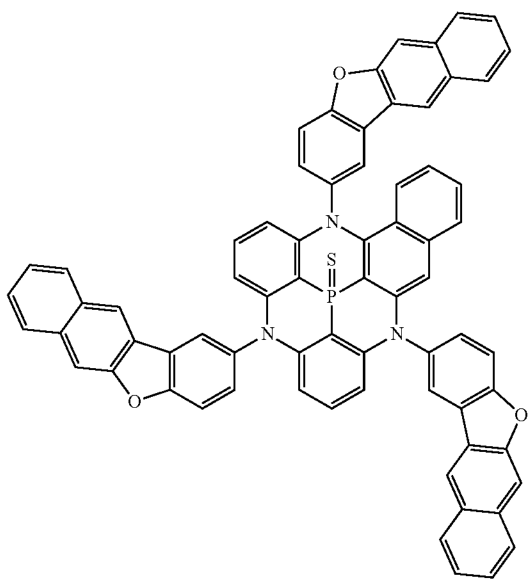
(1-251)
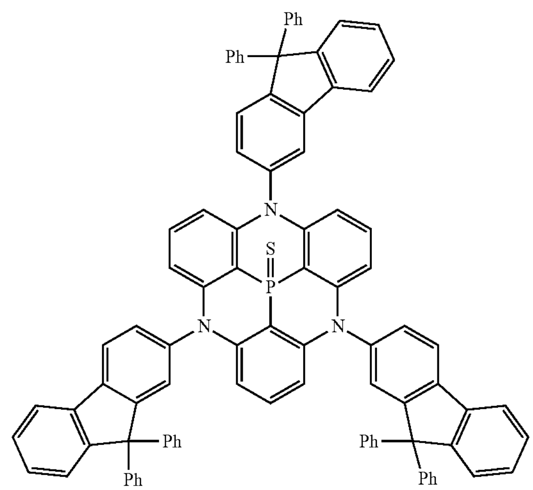
(1-252)
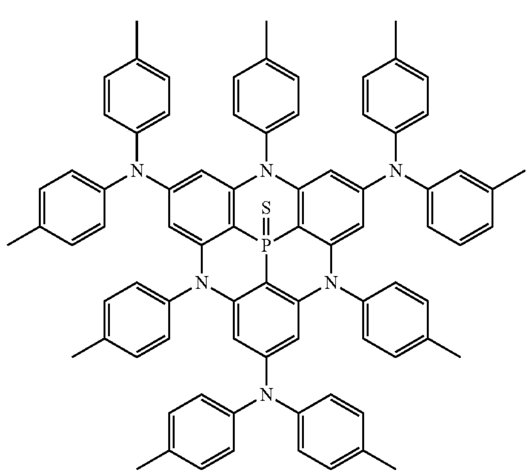
(1-253)
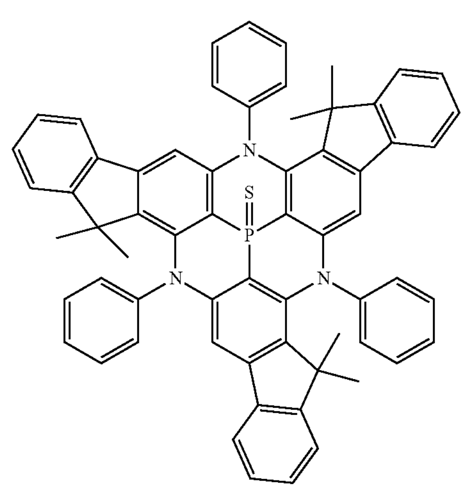

-continued
(1-254)
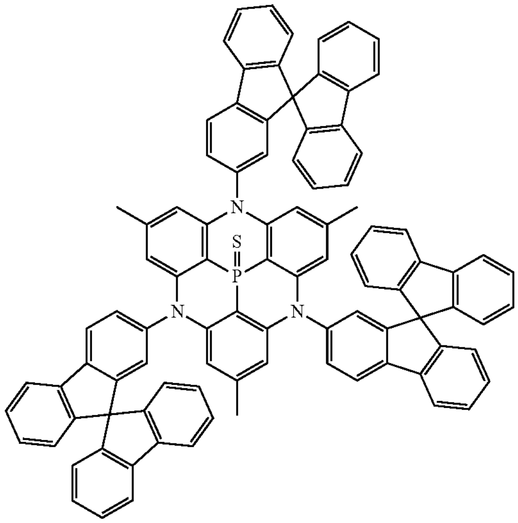
(1-255)
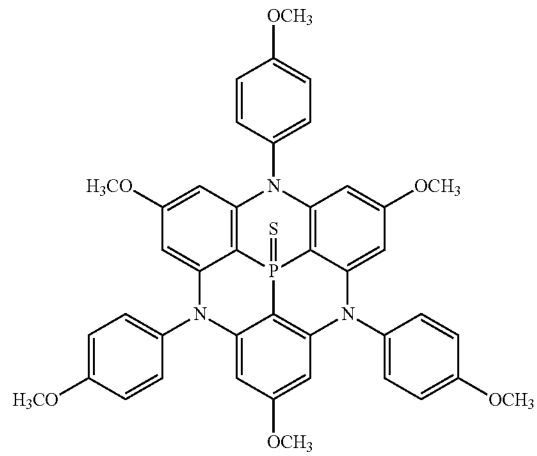
(1-261)
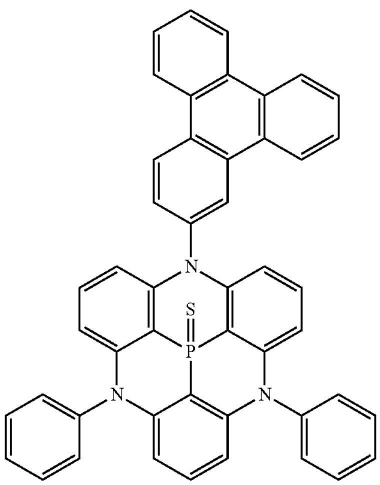
(1-262)
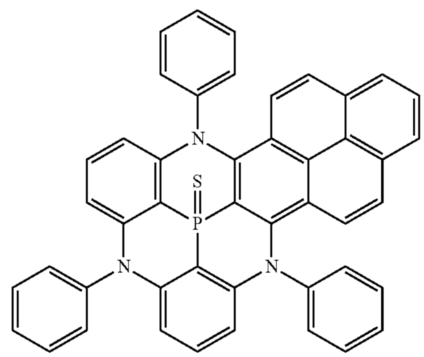
(1-263)
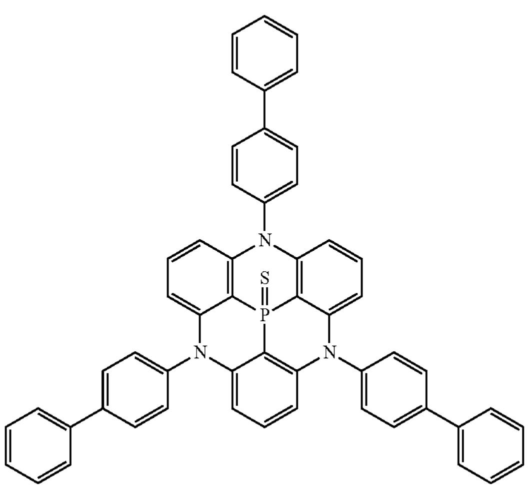
(1-264)
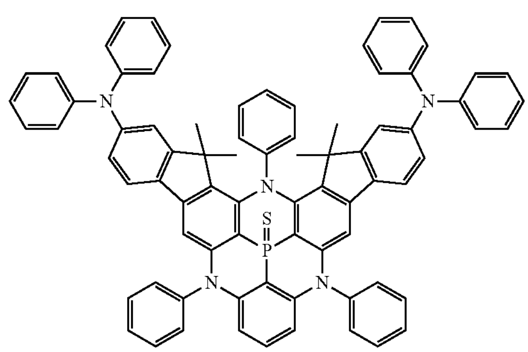

-continued
(1-265)
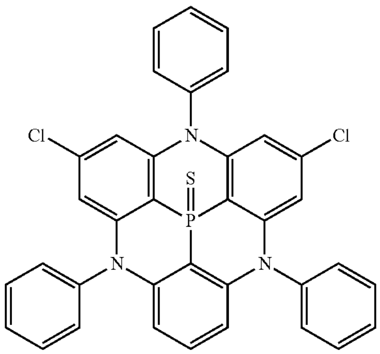
(1-266)
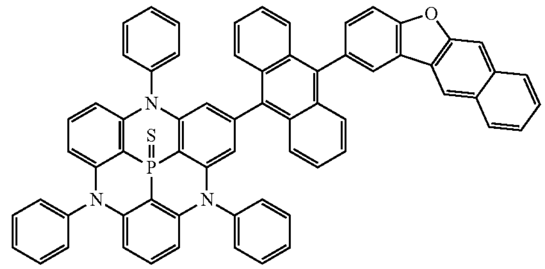
(1-267)
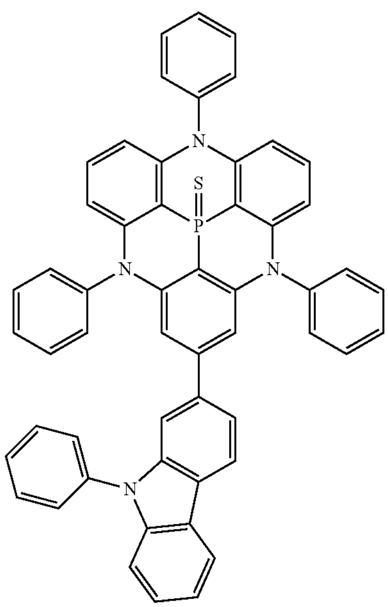
(1-268)
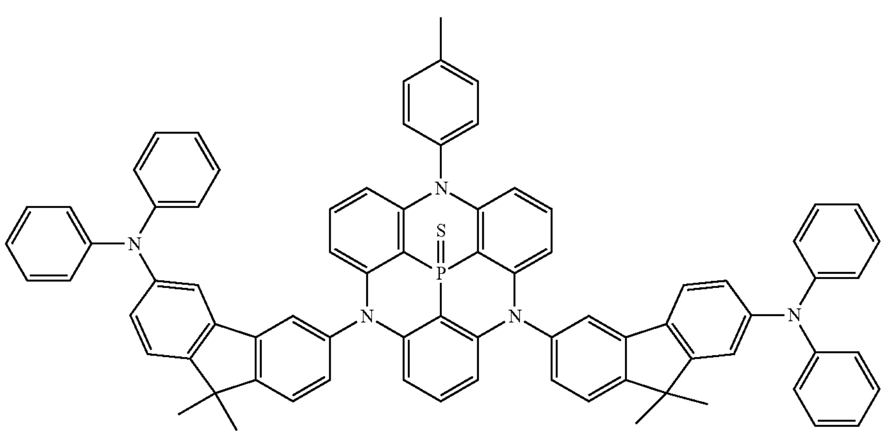

-continued
(1-269)
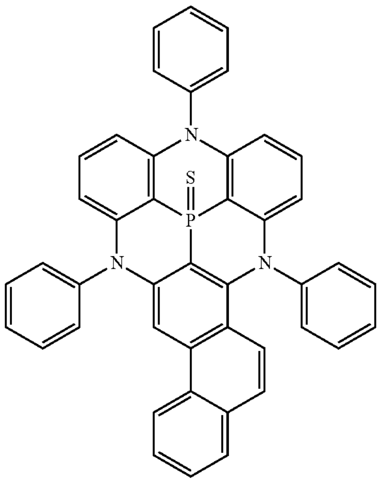
(1-270)
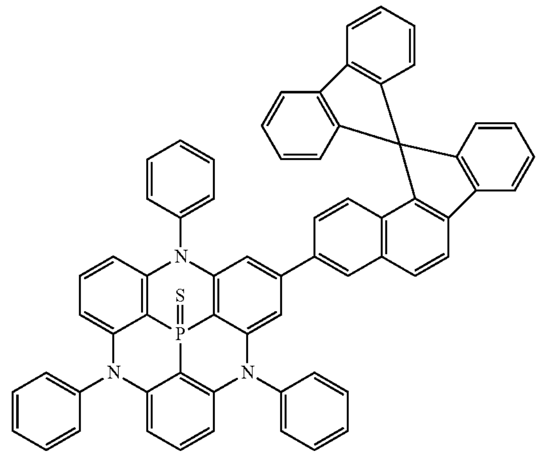
(1-271)
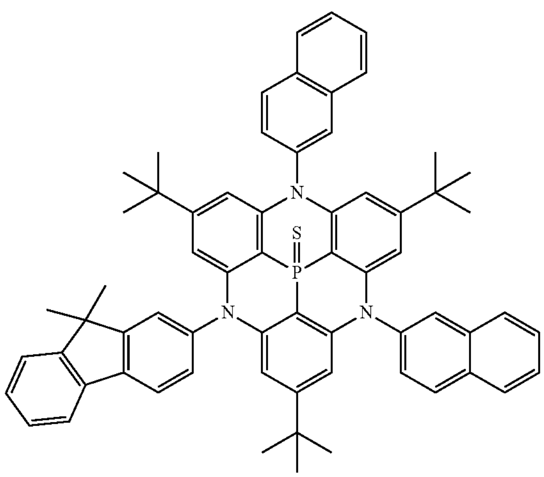
(1-272)
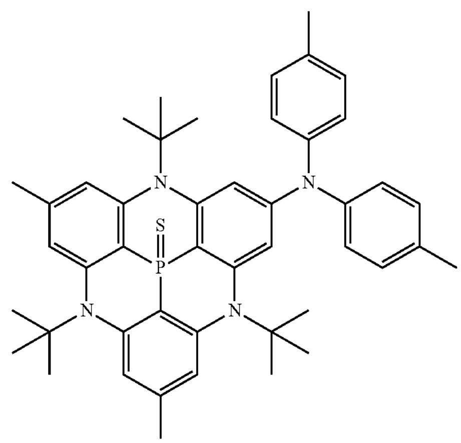
(1-273)
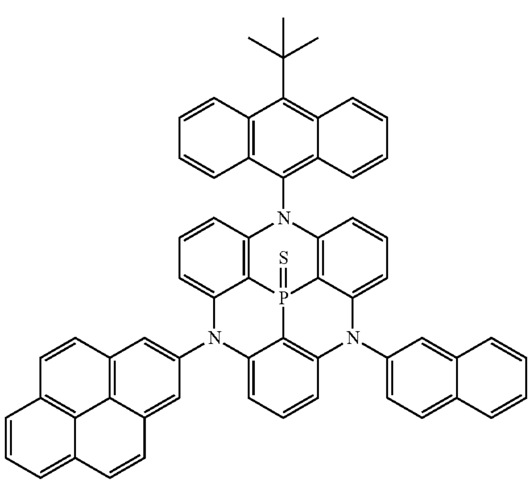
(1-274)
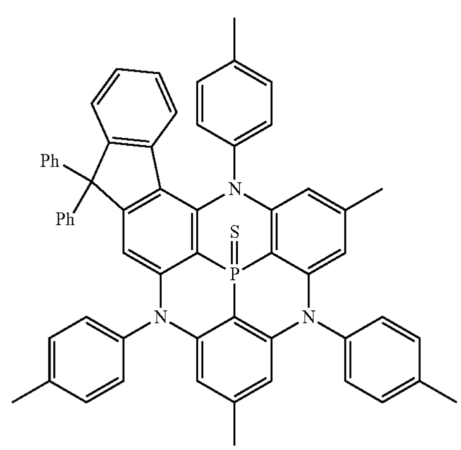

-continued
(1-275)
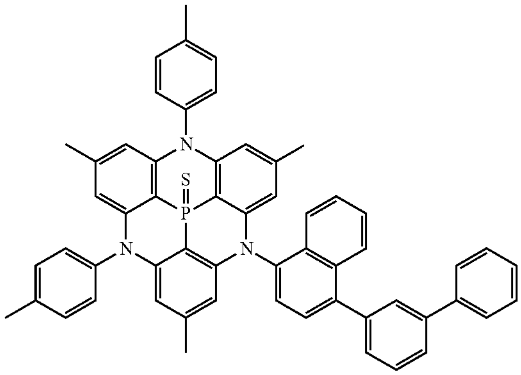
(1-281)
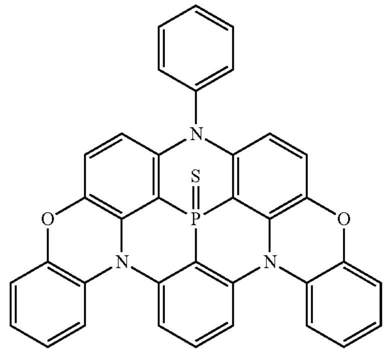
(1-282)
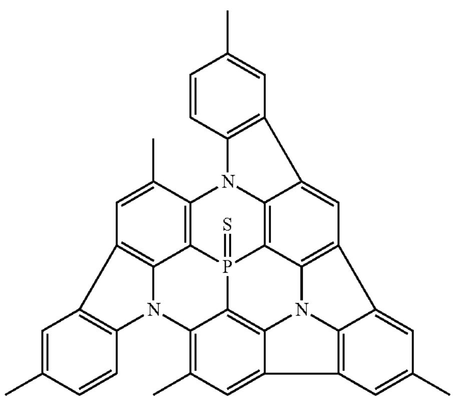
(1-283)
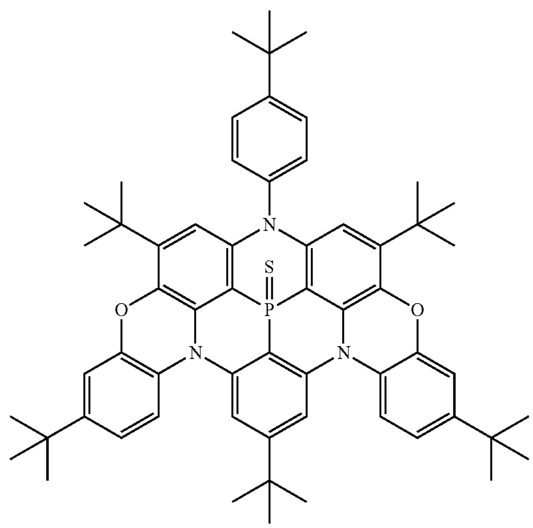
(1-284)
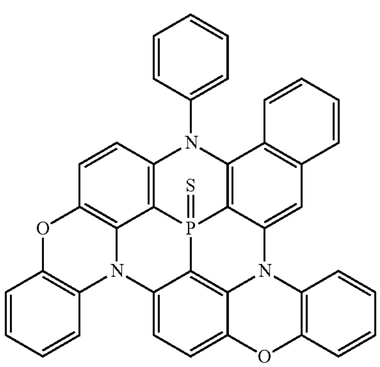
(1-285)
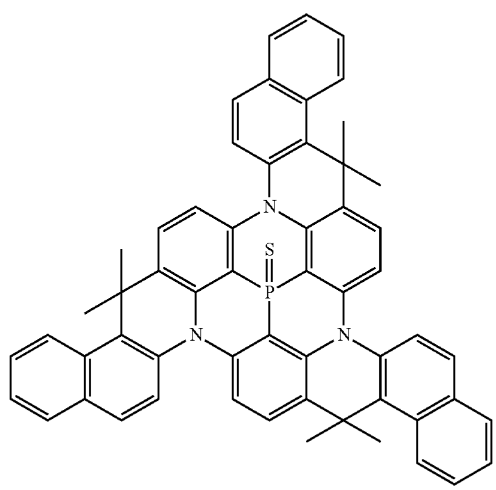

-continued
(1-286)
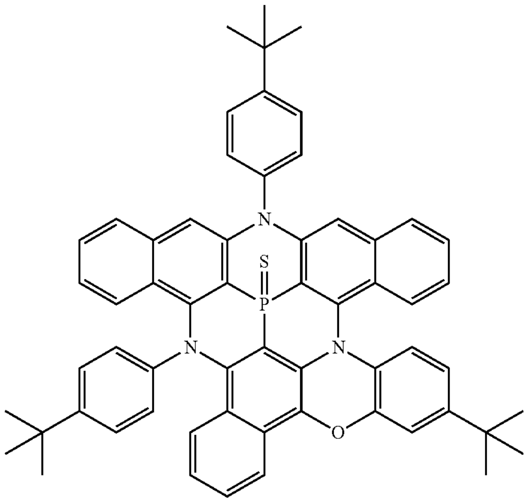
(1-287)
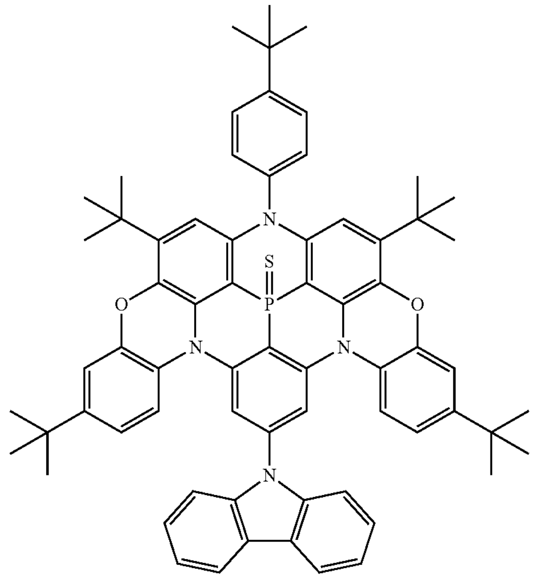
(1-288)
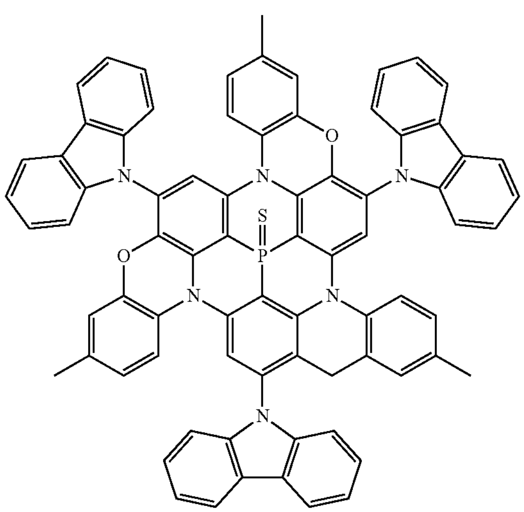
(1-289)
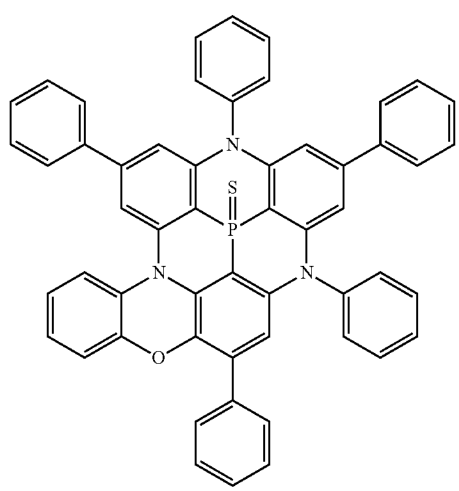

-continued
(1-290)
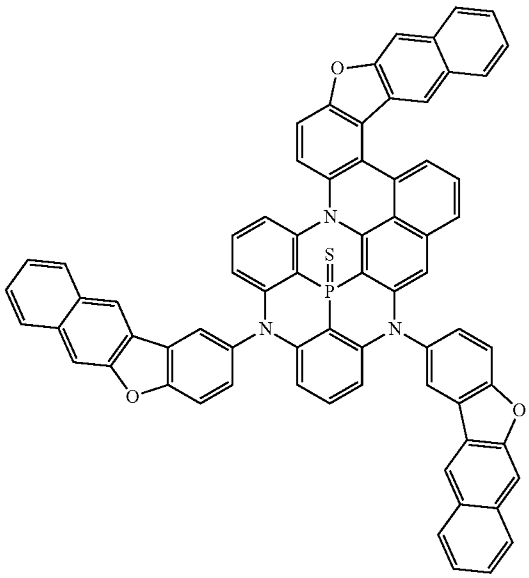
(1-291)
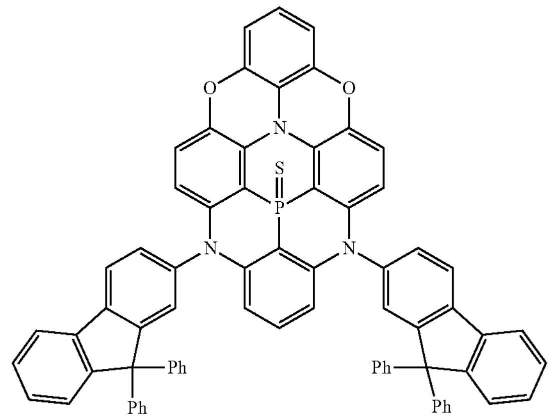
(1-292)
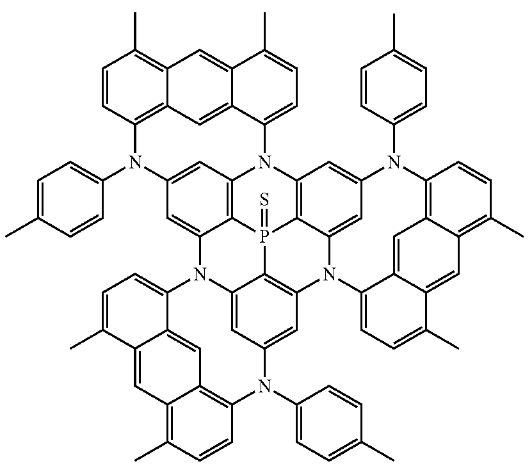
(1-293)
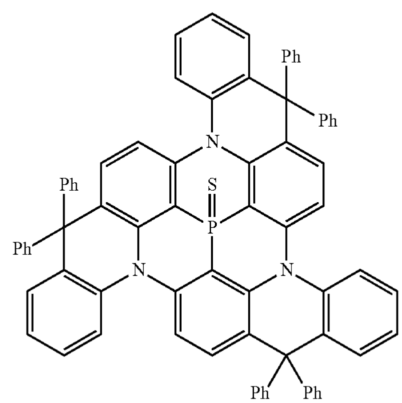
(1-294)
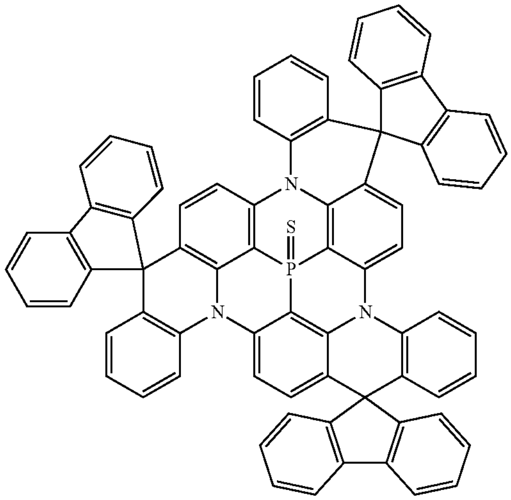
(1-295)
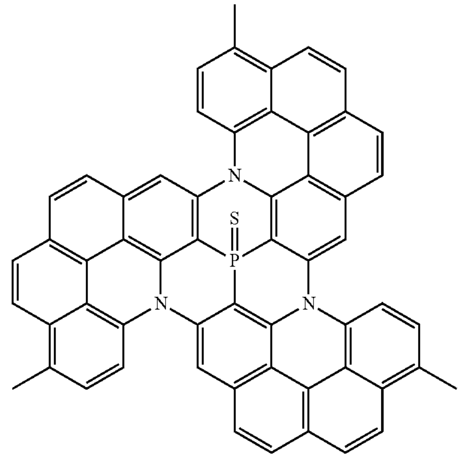

-continued
(1-301)
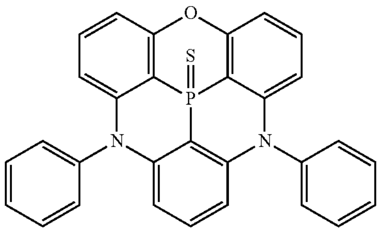
(1-302)
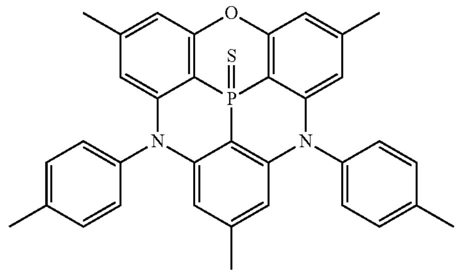
(1-303)
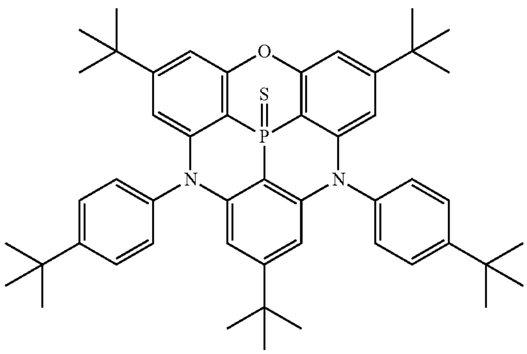
(1-304)
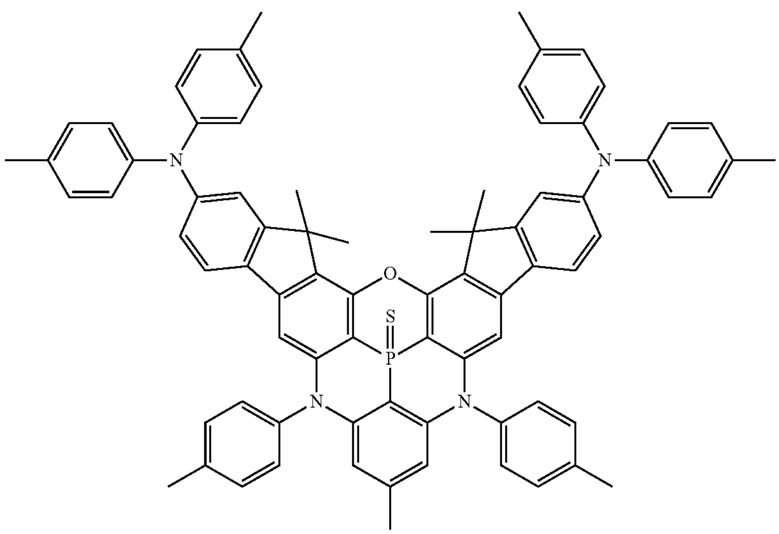
(1-305)
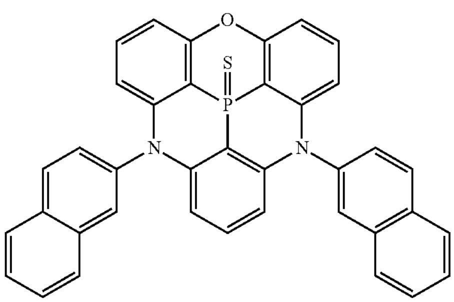
(1-306)
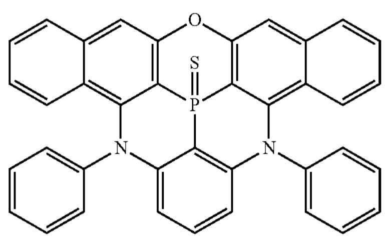

-continued
(1-307)
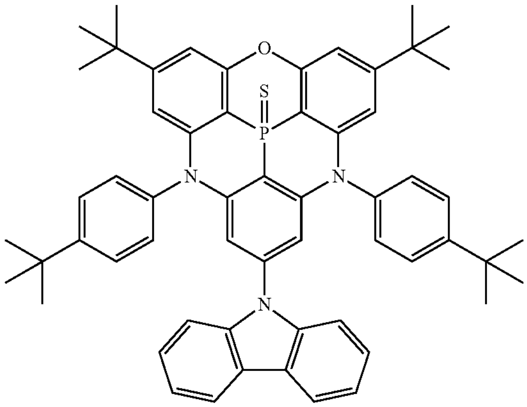
(1-308)
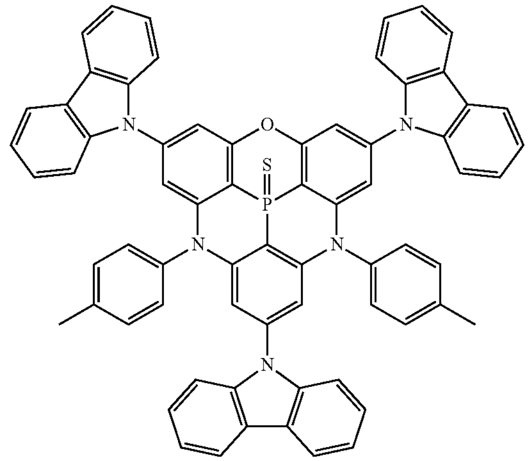
(1-309)
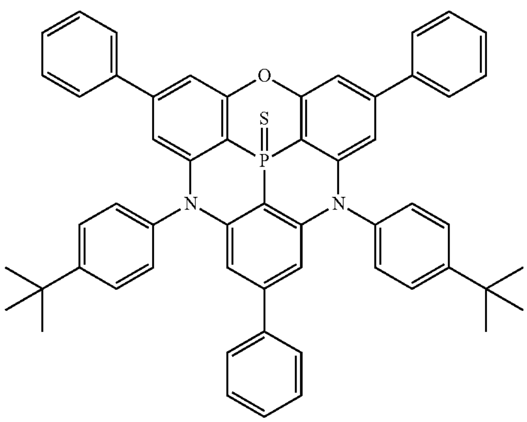
(1-310)
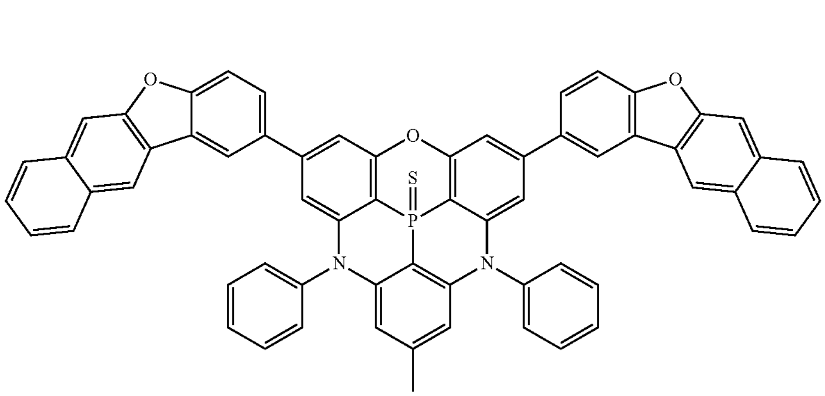

-continued
(1-311)
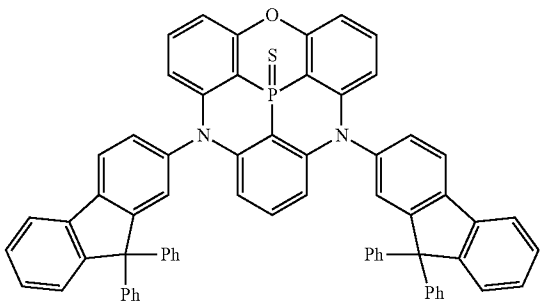
(1-312)
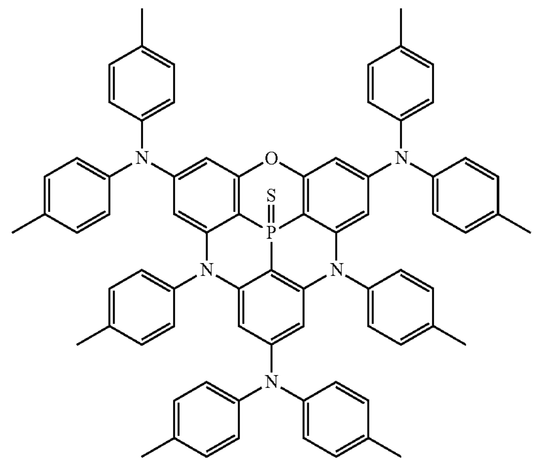
(1-313)
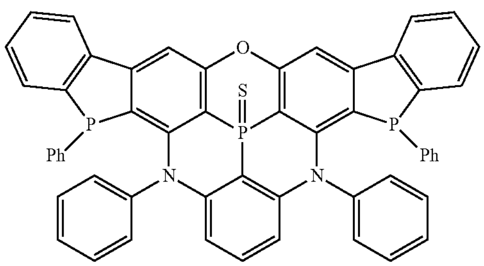
(1-314)
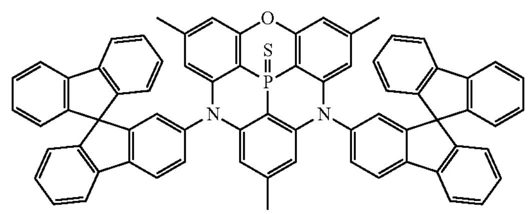
(1-315)
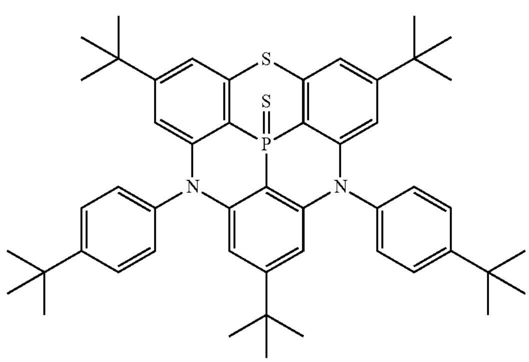
(1-321)
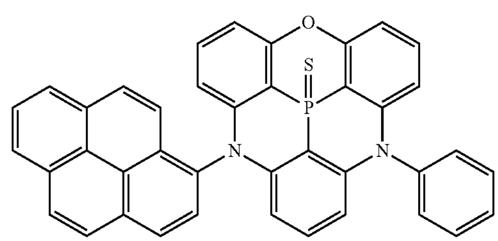
(1-322)
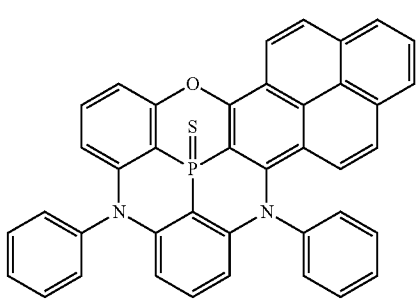
(1-323)
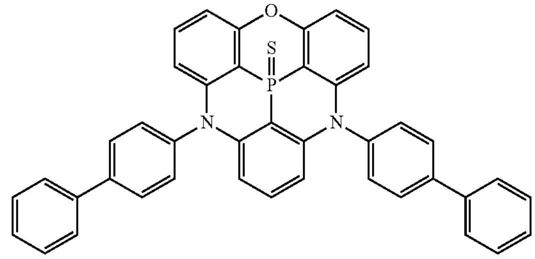

-continued
(1-324)
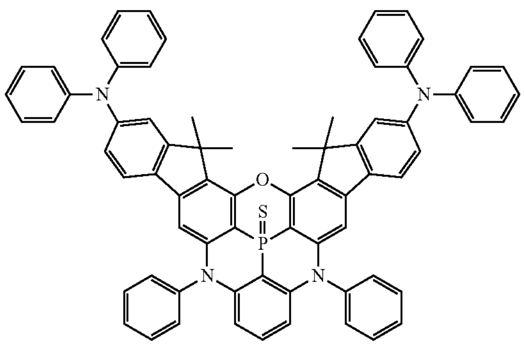
(1-325)
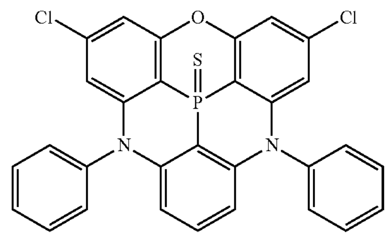
(1-326)
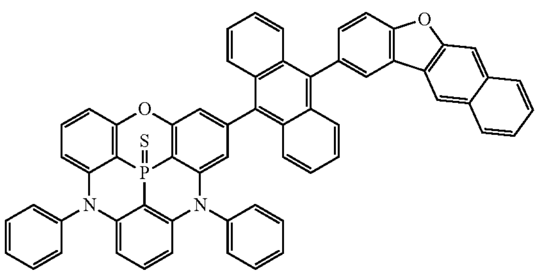
(1-327)
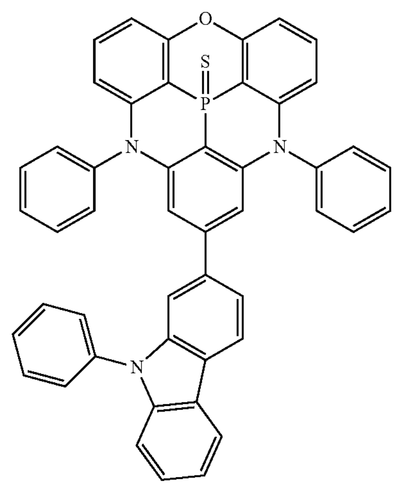
(1-328)
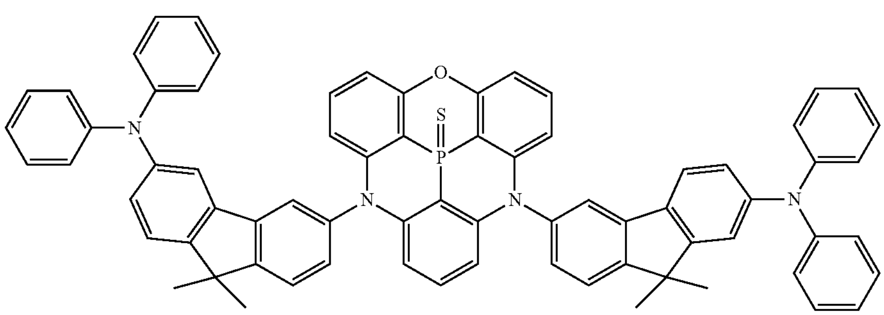
(1-329)
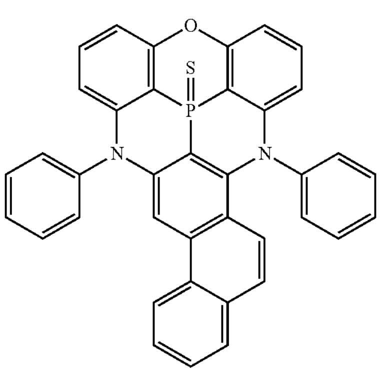
(1-330)
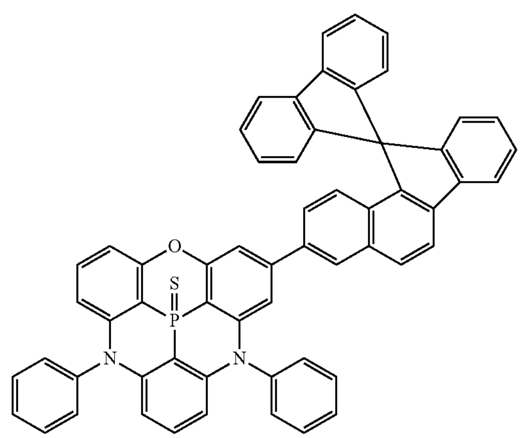

-continued
(1-331)
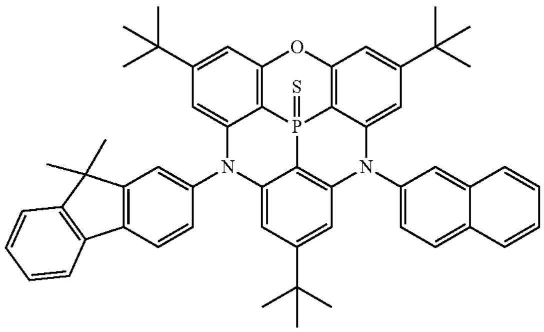
(1-332)
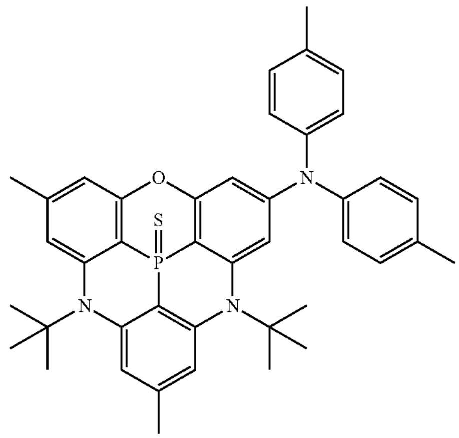
(1-333)
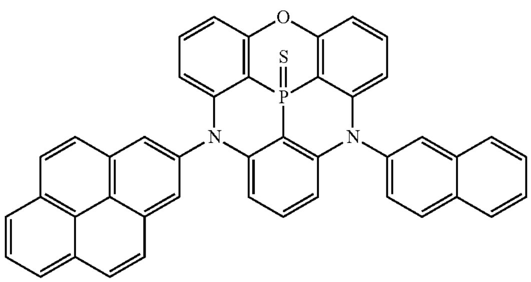
(1-334)
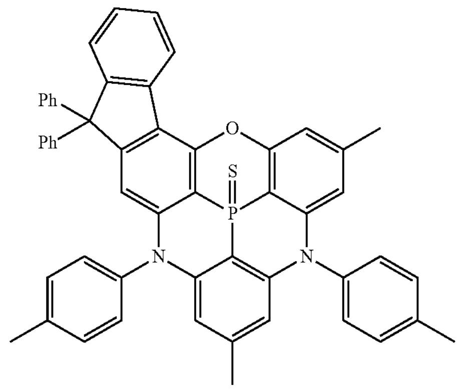
(1-335)
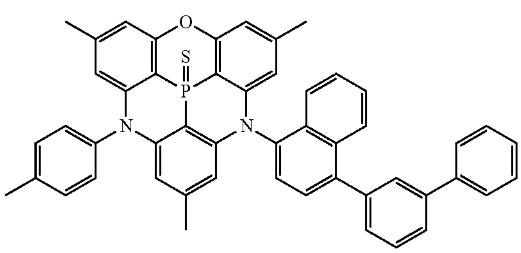
(1-341)
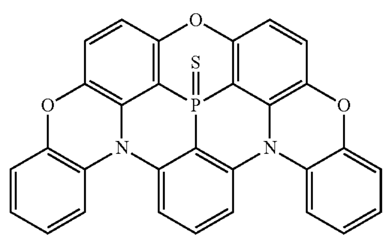
(1-342)
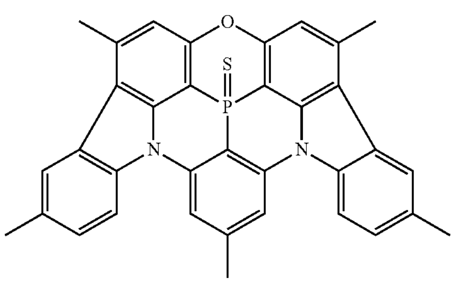
(1-343)
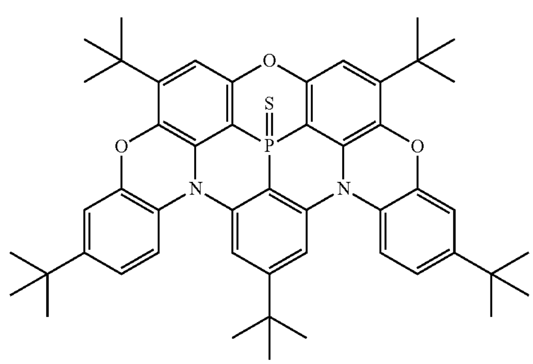

-continued
(1-344)
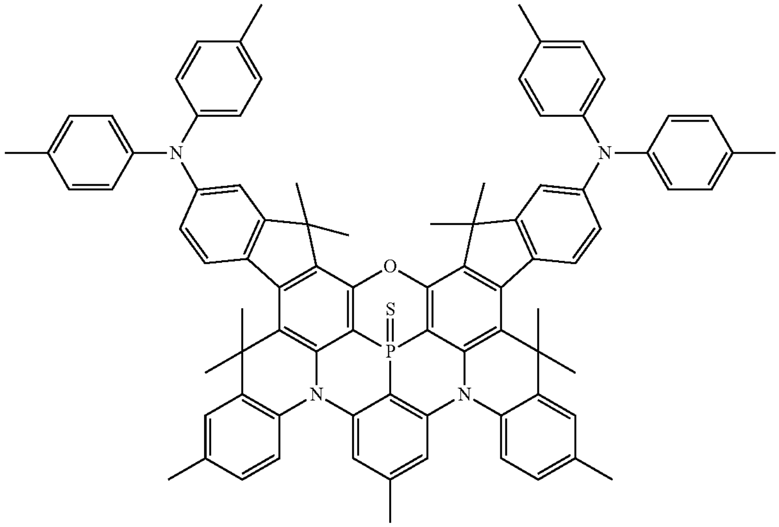
(1-345)
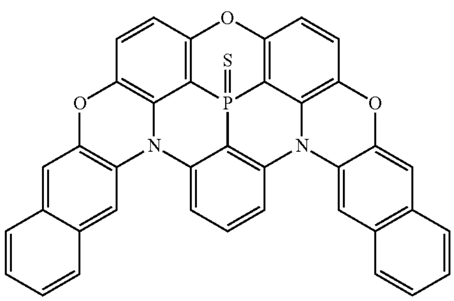
(1-346)
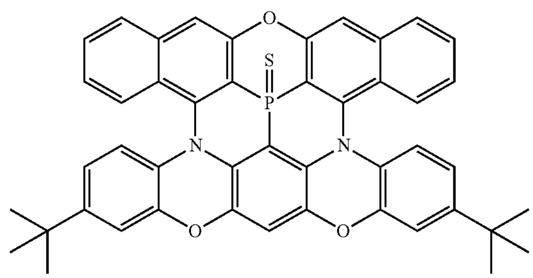
(1-347)
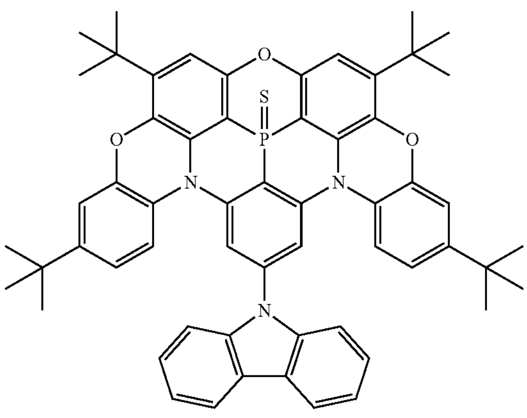
(1-348)
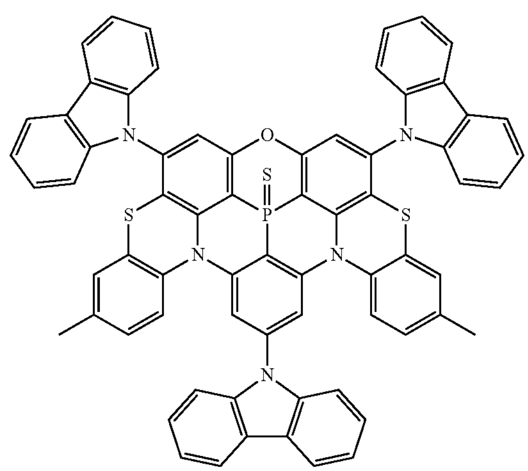

-continued
(1-349)
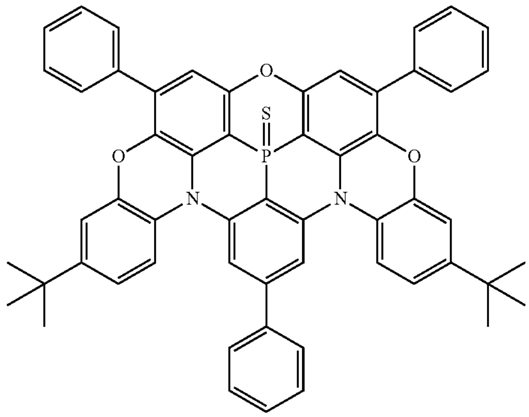
(1-350)
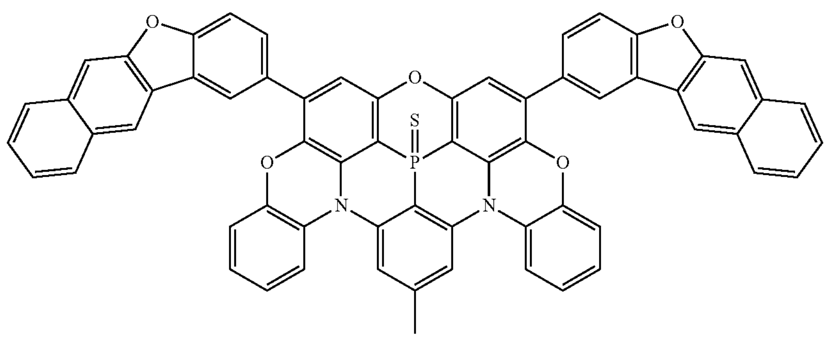
(1-351)
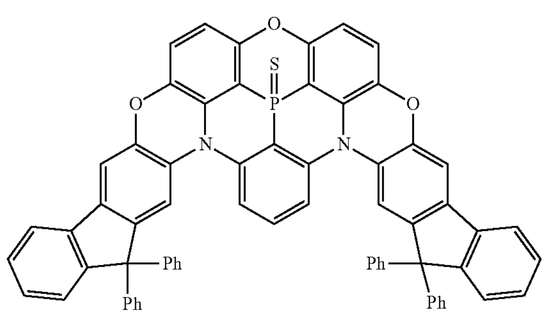
(1-352)
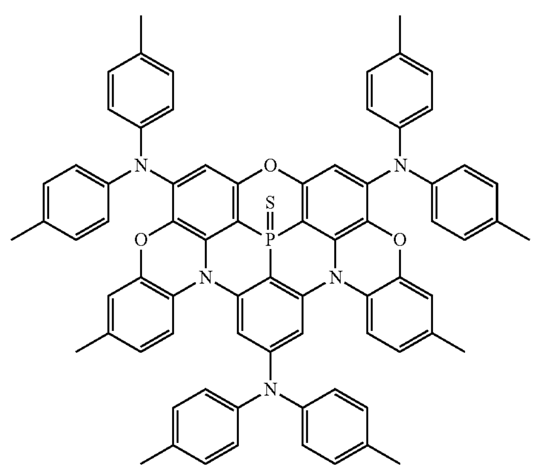
(1-353)
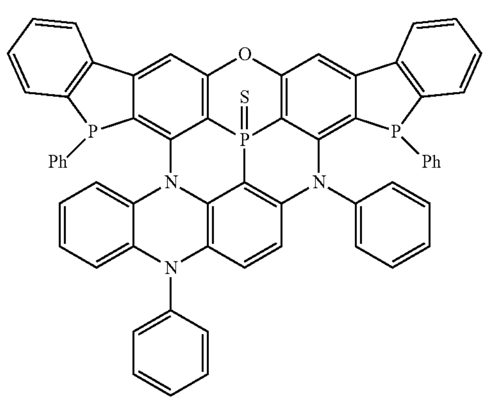
(1-354)
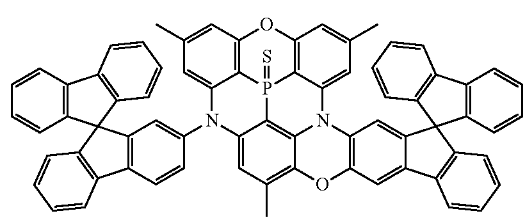

-continued
(1-355)
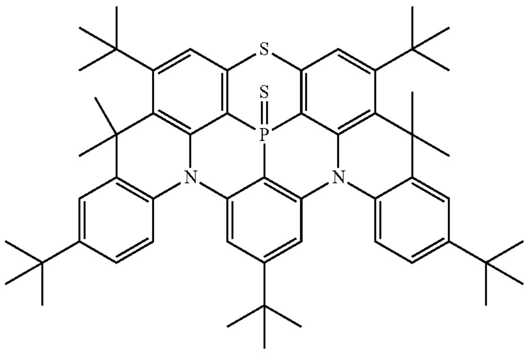
(1-361)
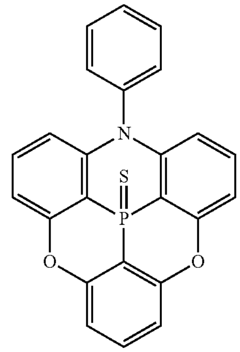
(1-362)
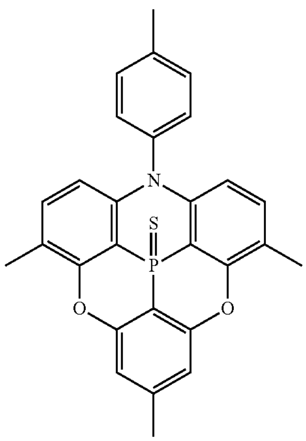
(1-363)
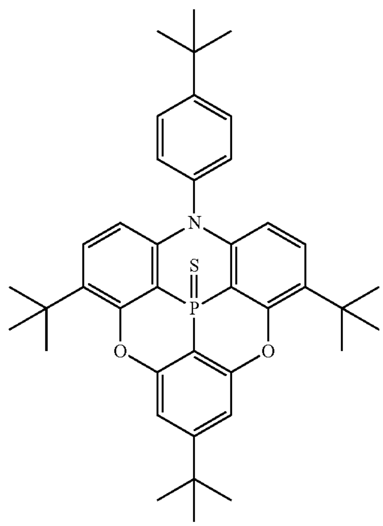
(1-364)
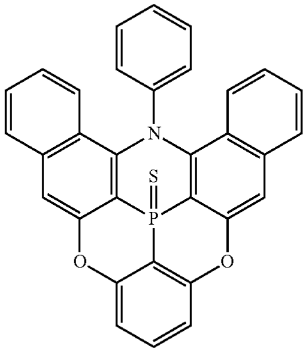
(1-365)
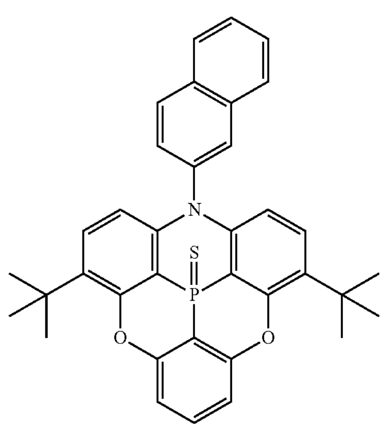

-continued
(1-366)
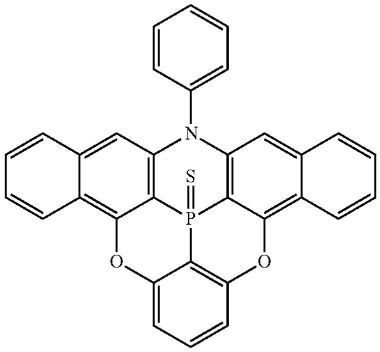
(1-367)
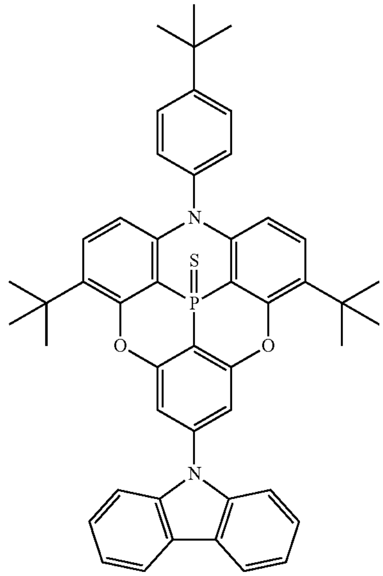
(1-368)
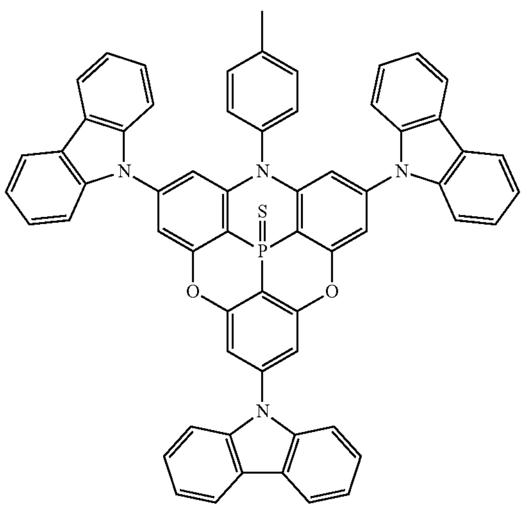
(1-369)
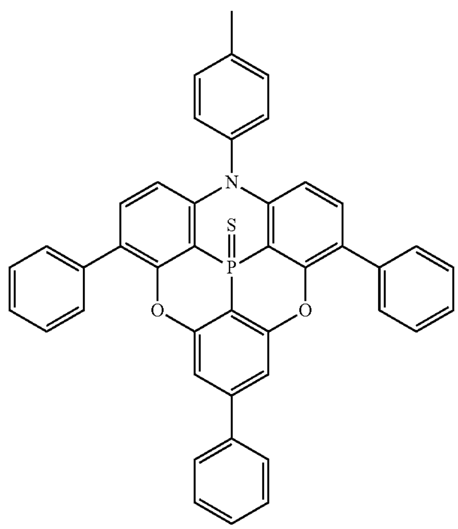
(1-370)
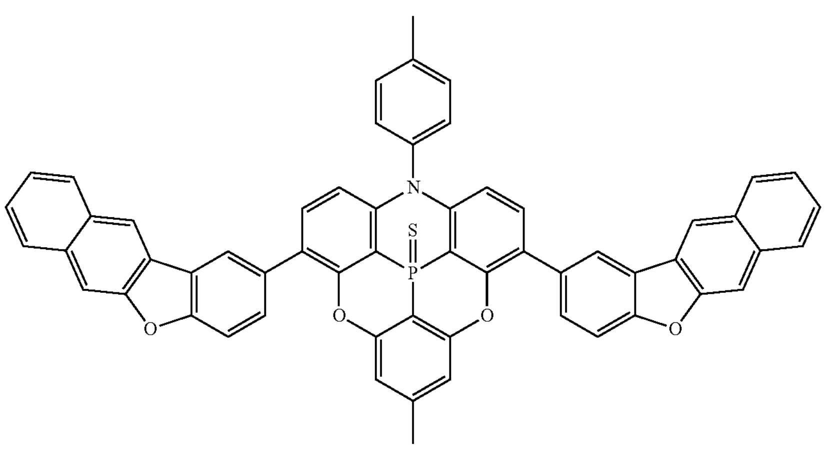

-continued
(1-371)
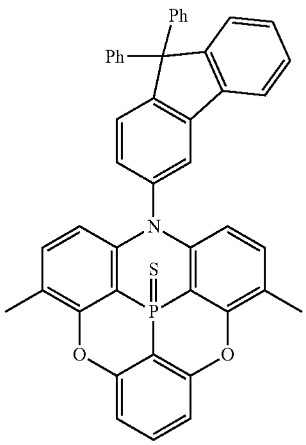
(1-372)
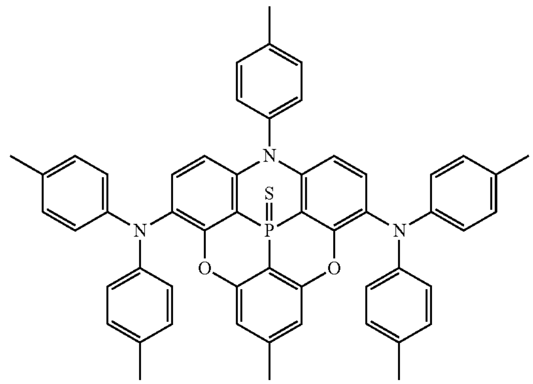
(1-373)
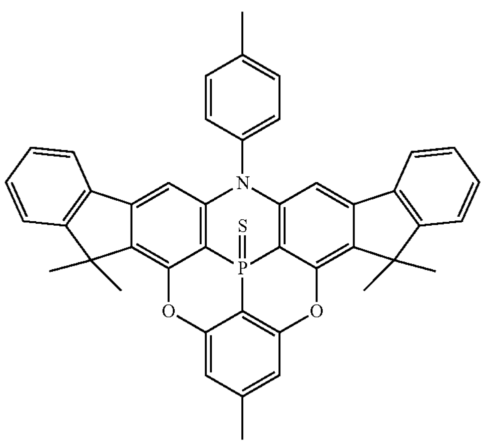
(1-374)
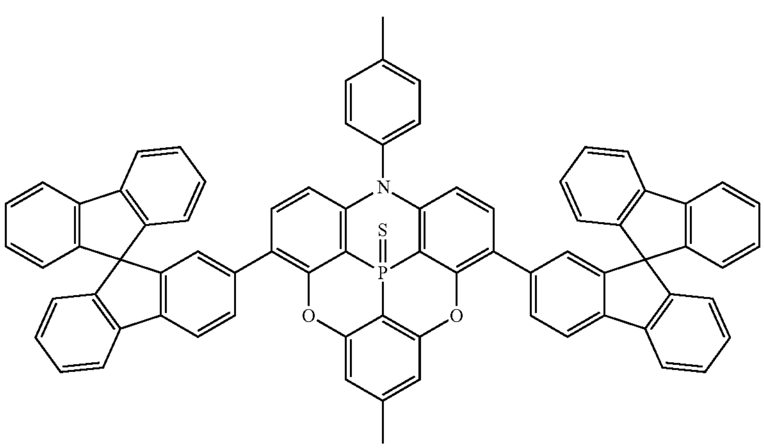

-continued
(1-375)
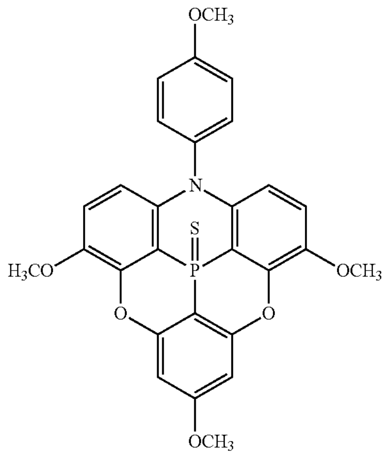
(1-381)
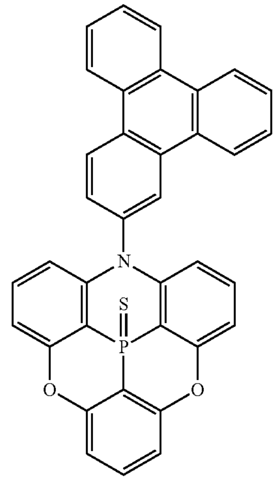
(1-382)
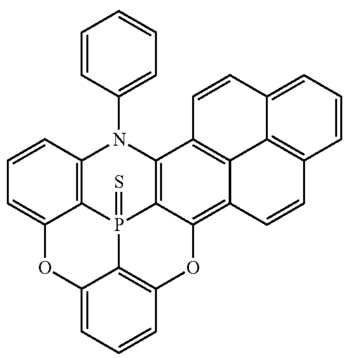
(1-383)
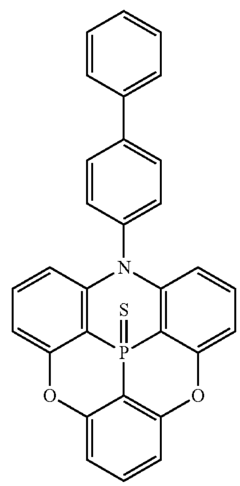
(1-384)
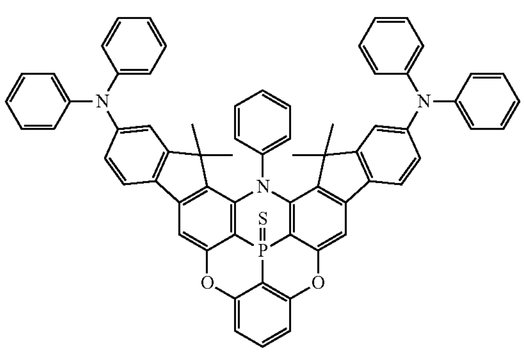
(1-385)
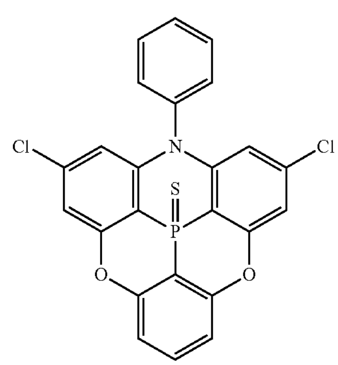

-continued
(1-386)
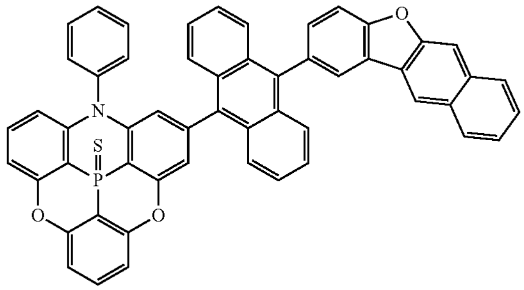
(1-387)
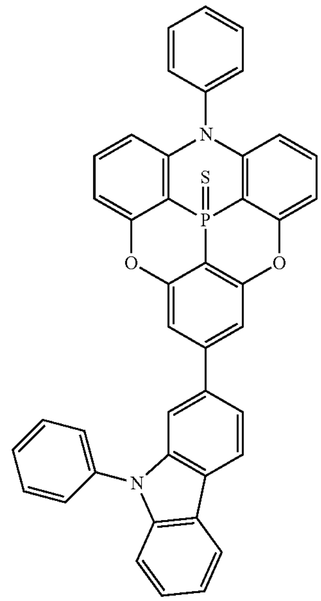
(1-388)
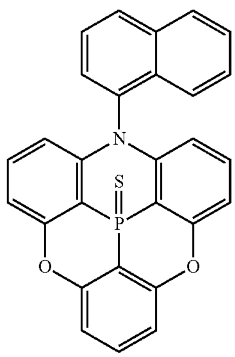
(1-389)
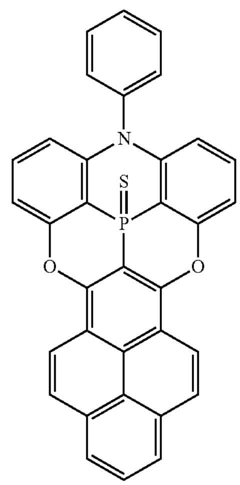
(1-390)
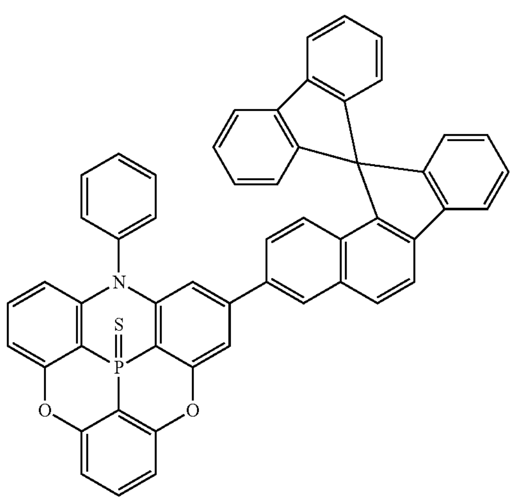
(1-391)
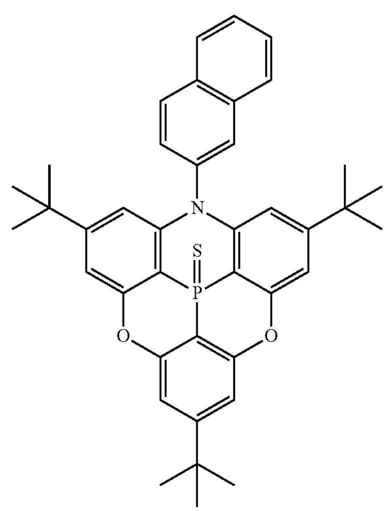

-continued
(1-392)
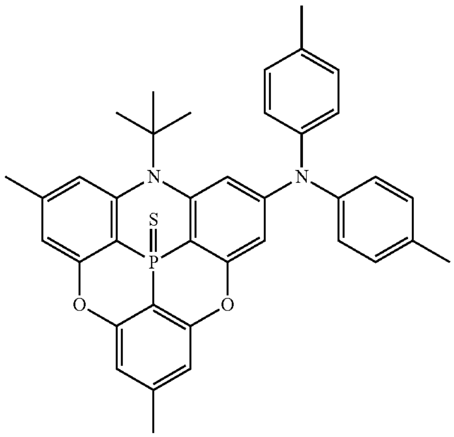
(1-393)
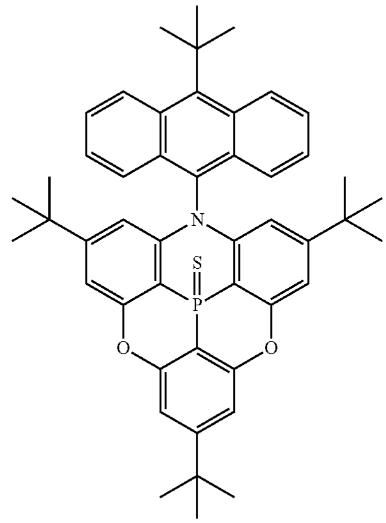
(1-394)
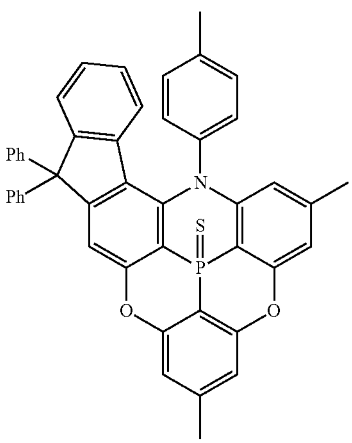
(1-395)
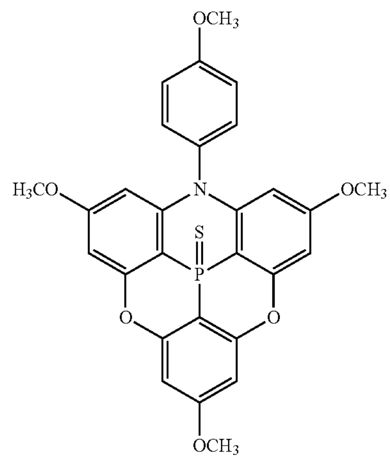
(1-401)
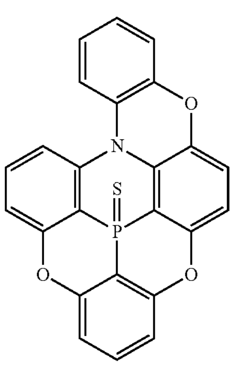
(1-402)
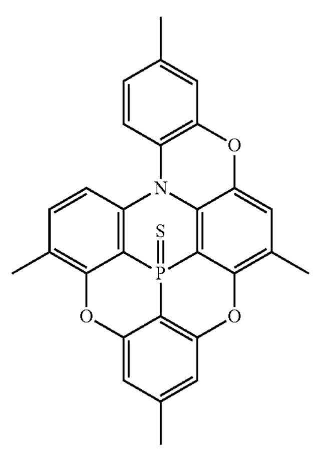

-continued
(1-403)
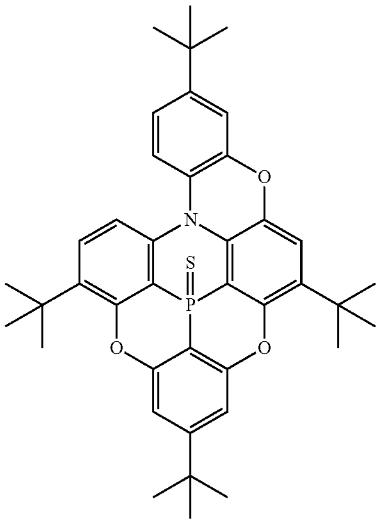
(1-404)
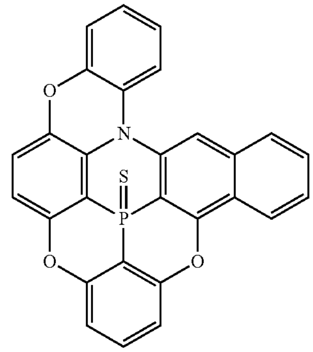
(1-405)
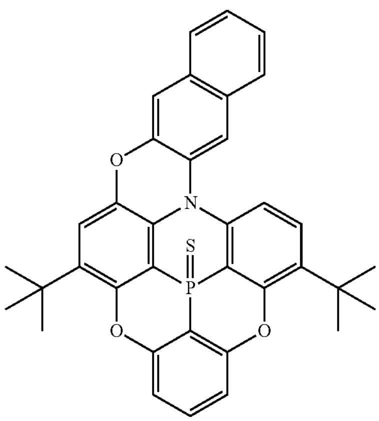
(1-406)
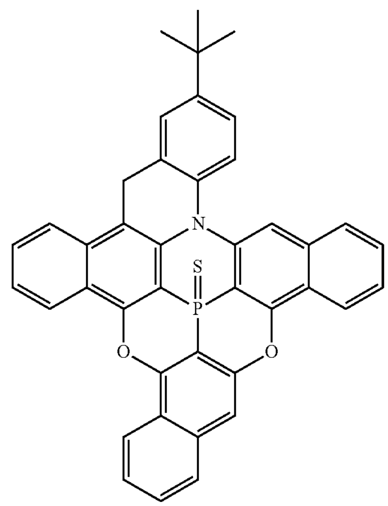
(1-407)
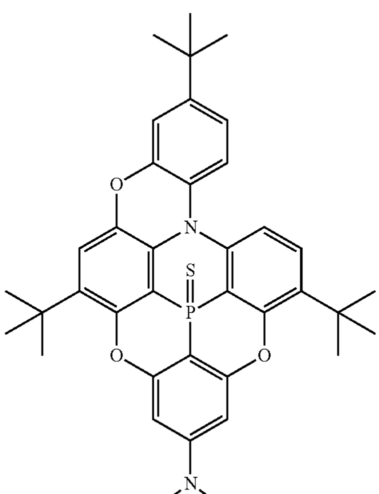
(1-408)
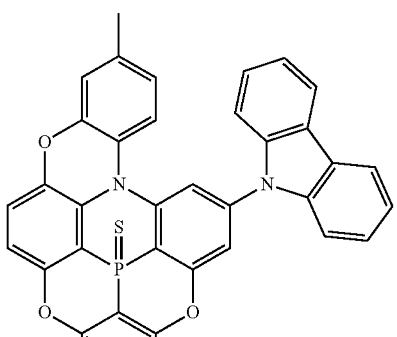

-continued
(1-409)
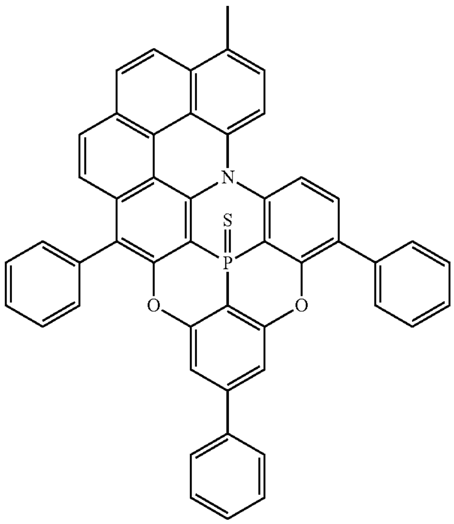
(1-410)
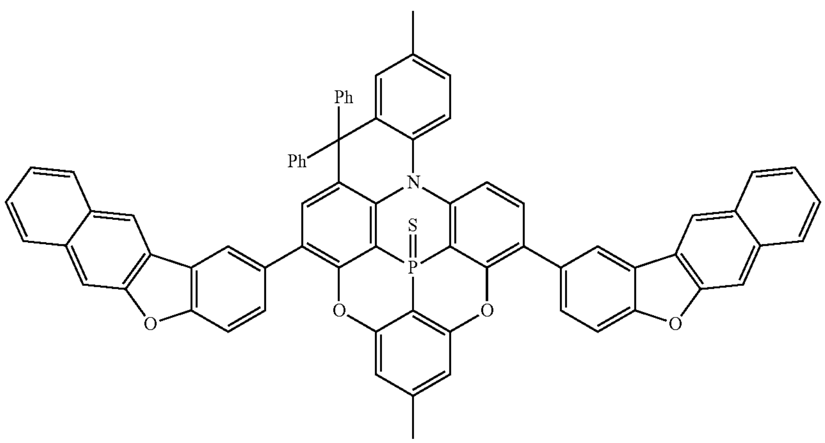
(1-411)
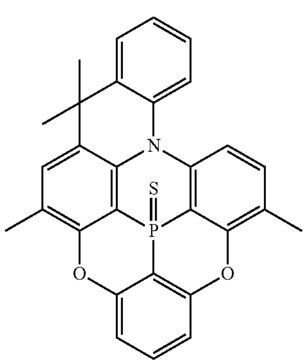
(1-412)
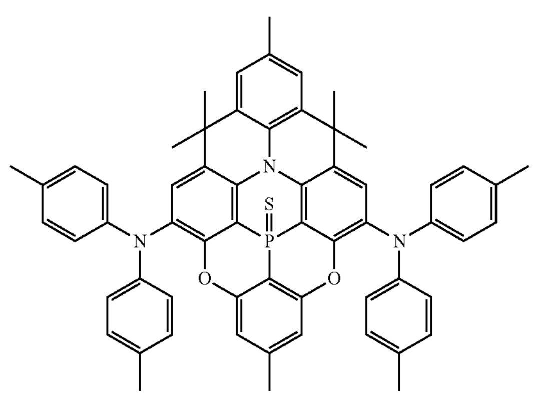

-continued
(1-413)
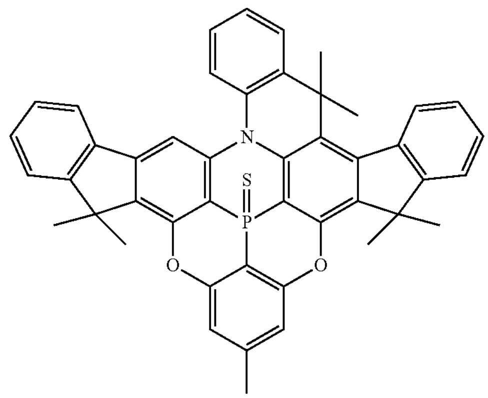
(1-414)
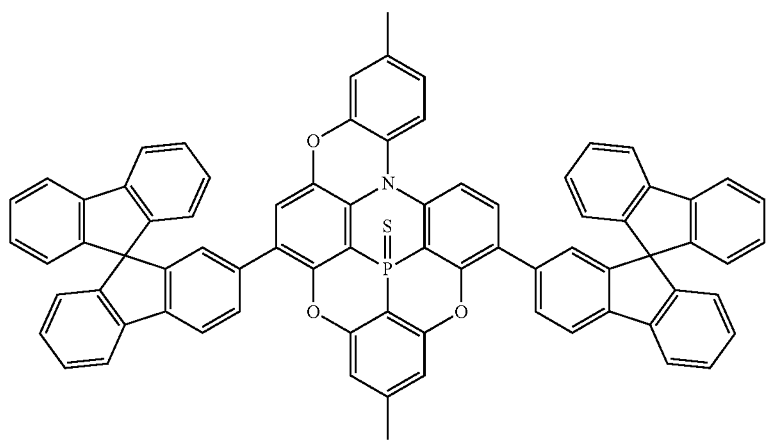
(1-415)
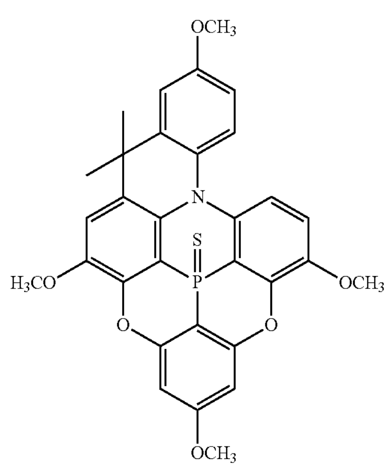

(1-421)
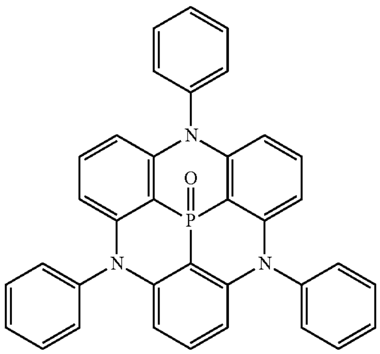
(1-422)
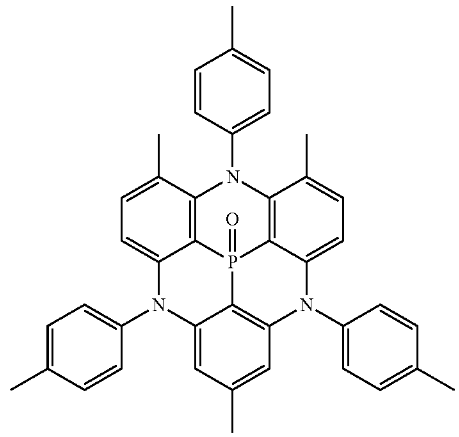
(1-423)
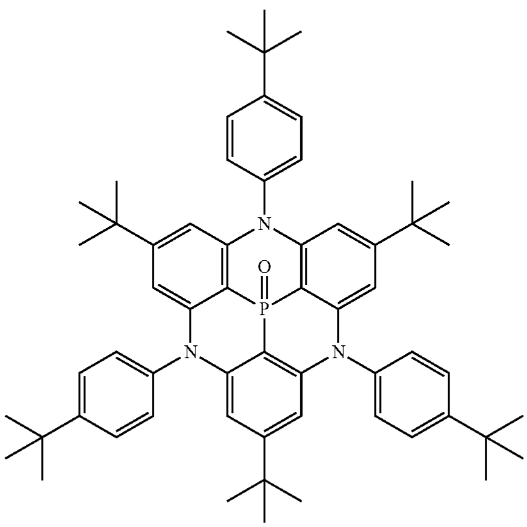
(1-424)
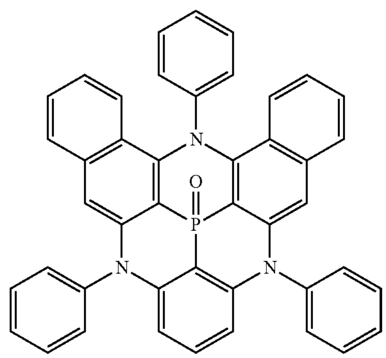
(1-425)
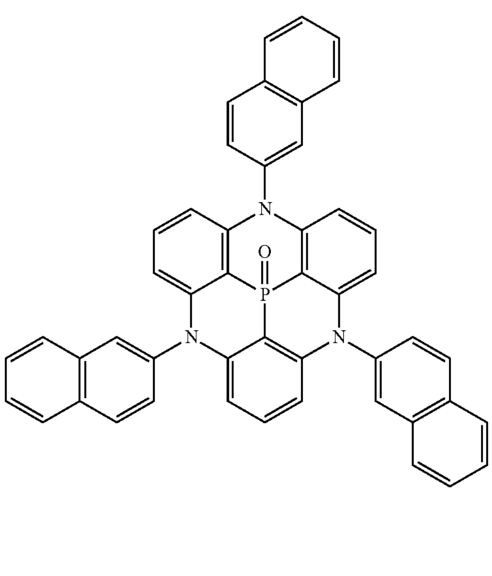
(1-426)
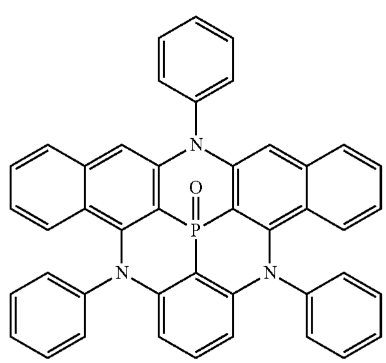

-continued
(1-427)
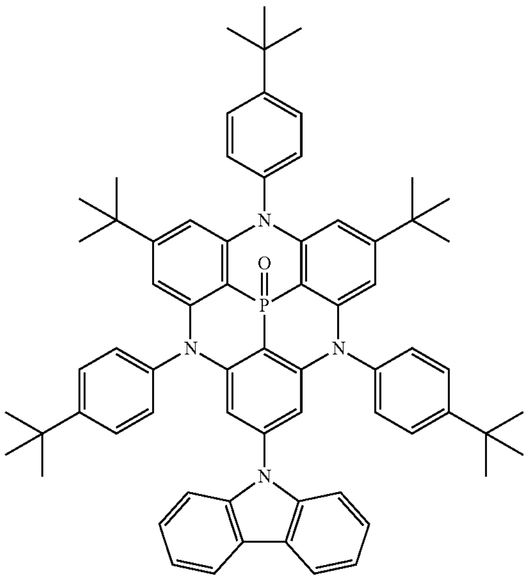
(1-428)
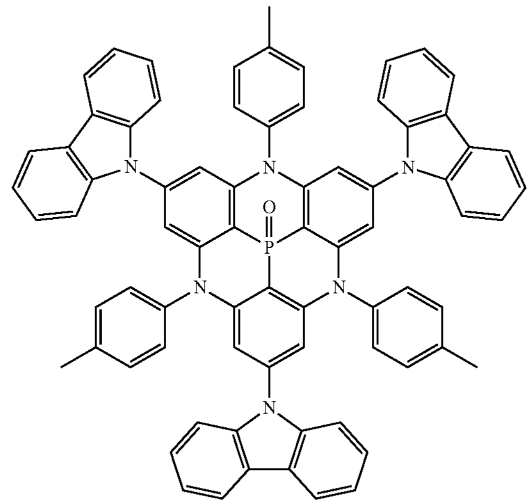
(1-429)
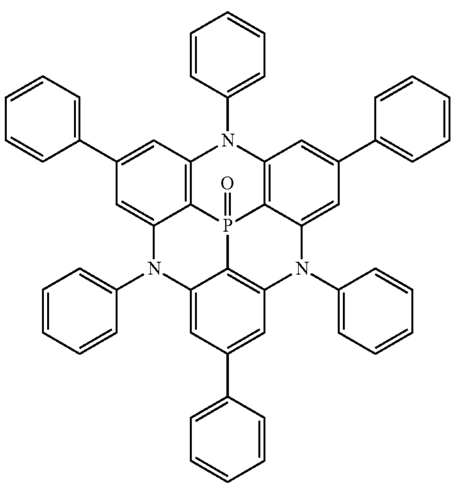
(1-430)
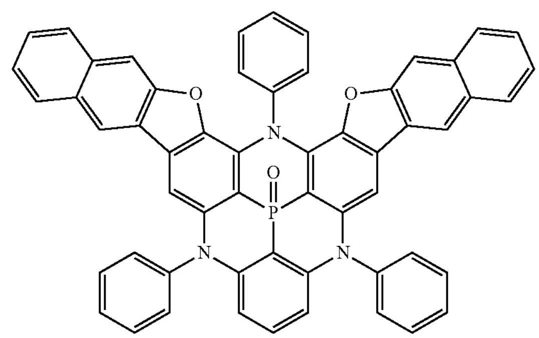
(1-431)
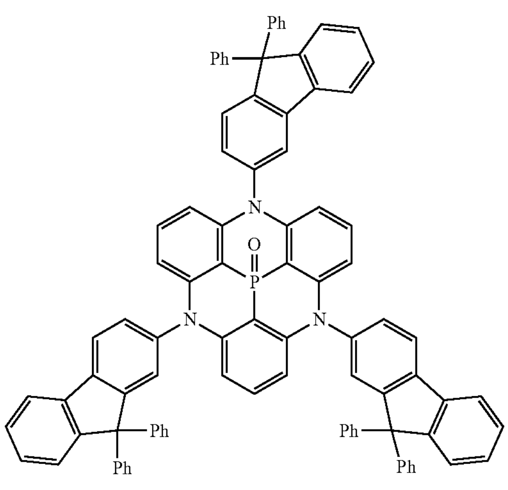
(1-432)
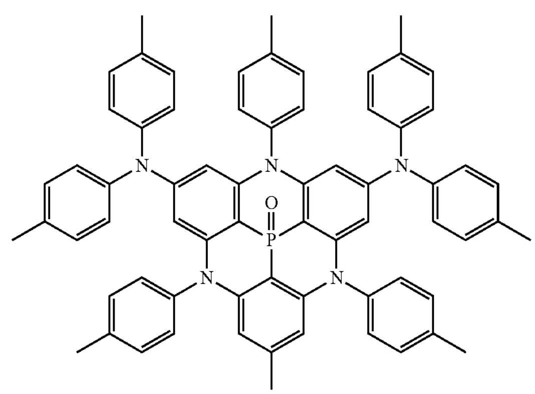

-continued
(1-433)
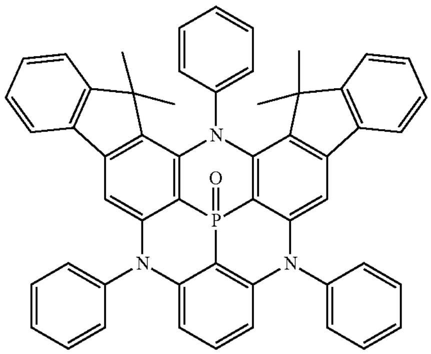
(1-434)
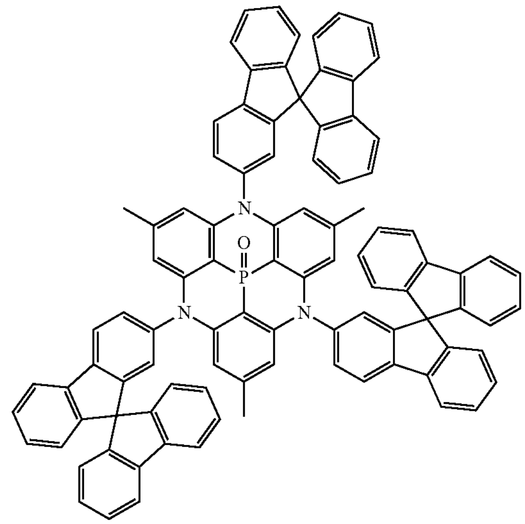
(1-435)
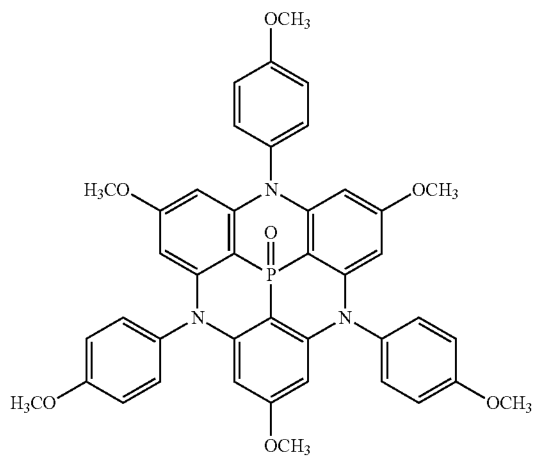
(1-441)
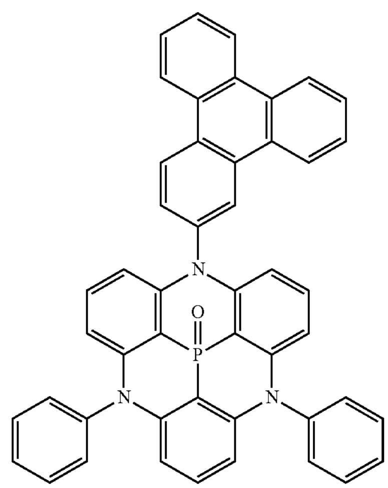
(1-442)
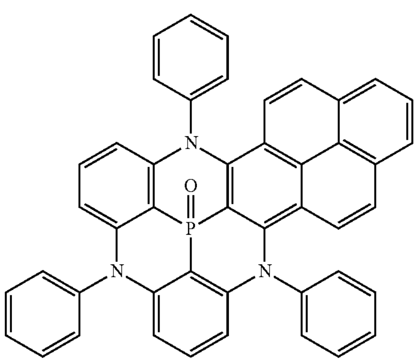
(1-443)
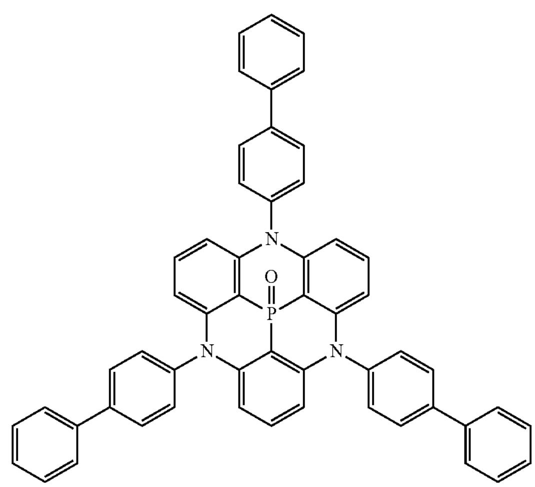

-continued
(1-444)
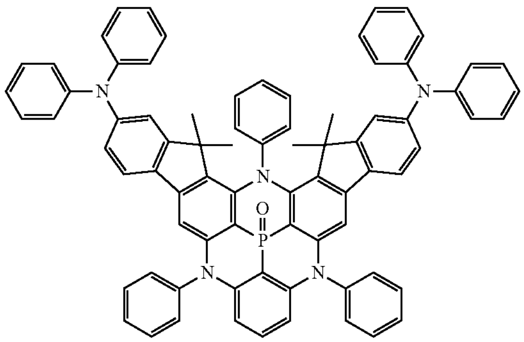
(1-445)
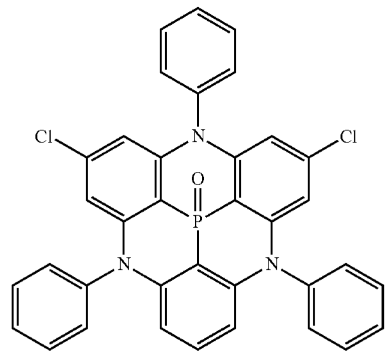
(1-446)
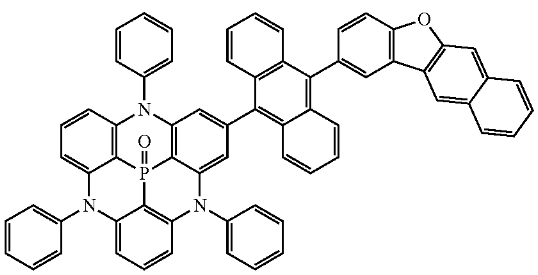
(1-447)
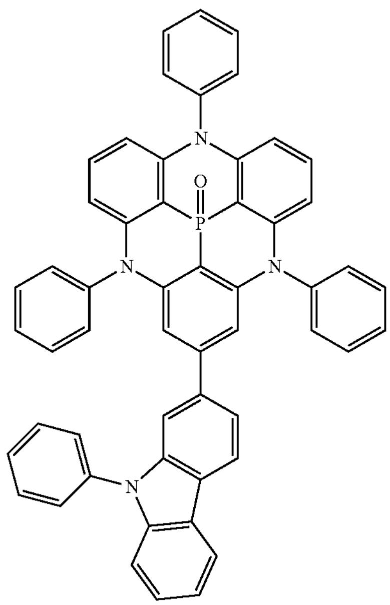
(1-448)
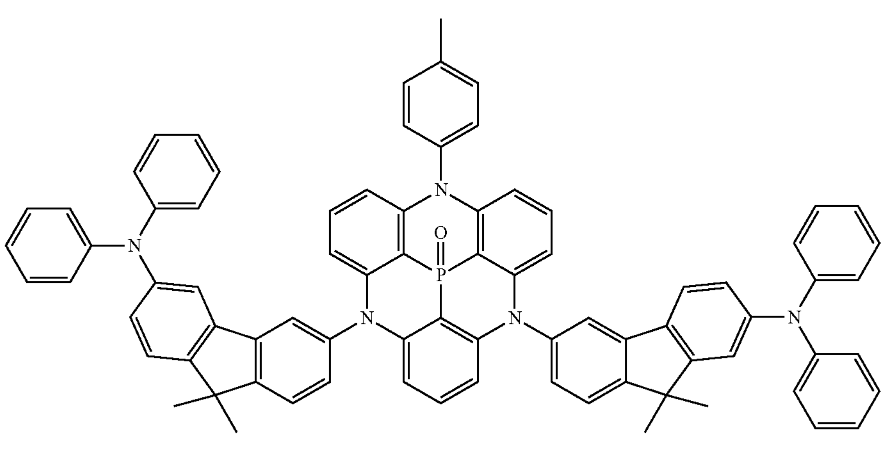

-continued
(1-449)
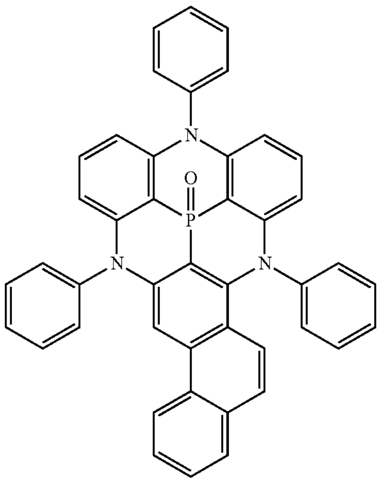
(1-450)
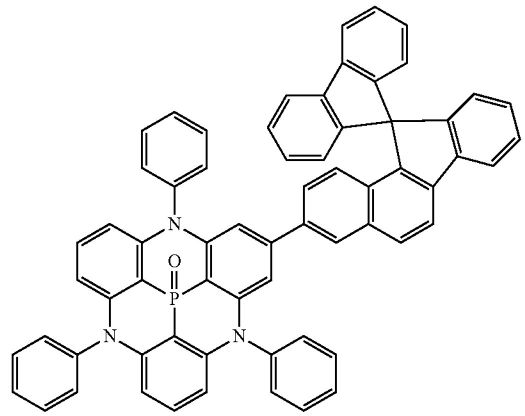
(1-451)
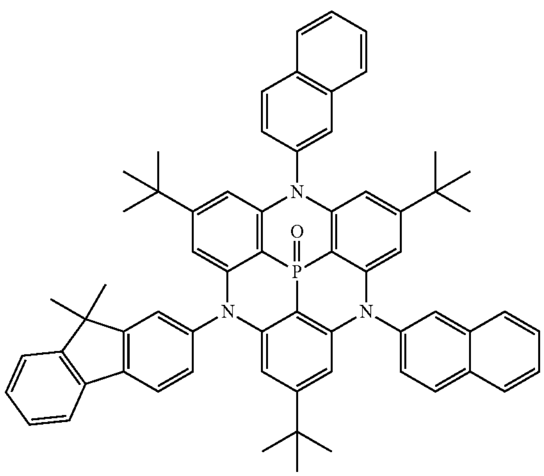
(1-452)
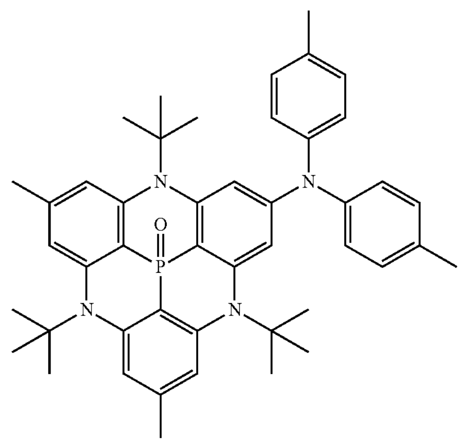
(1-453)
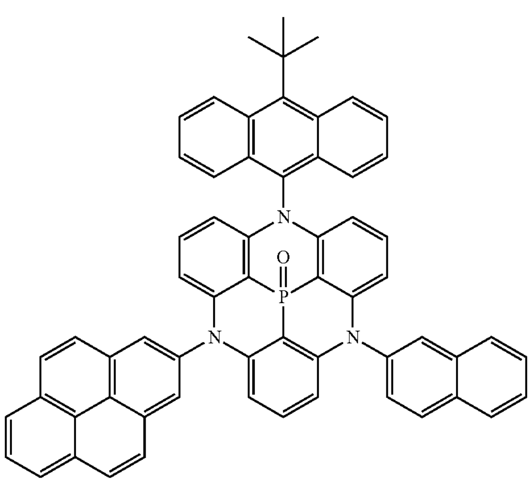
(1-454)
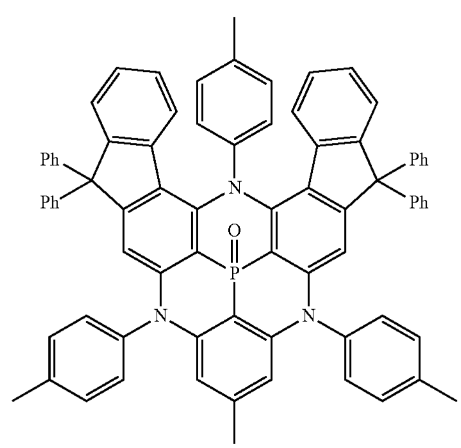

-continued
(1-455)
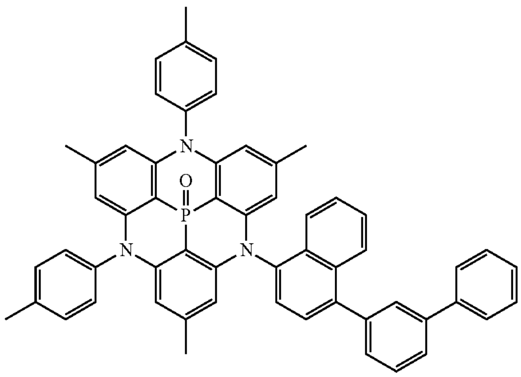
(1-461)
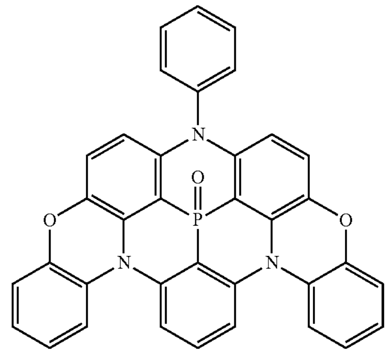
(1-462)
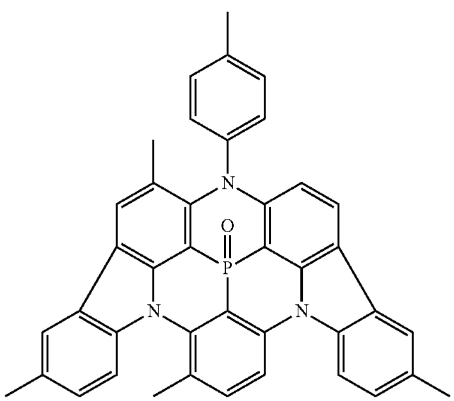
(1-463)
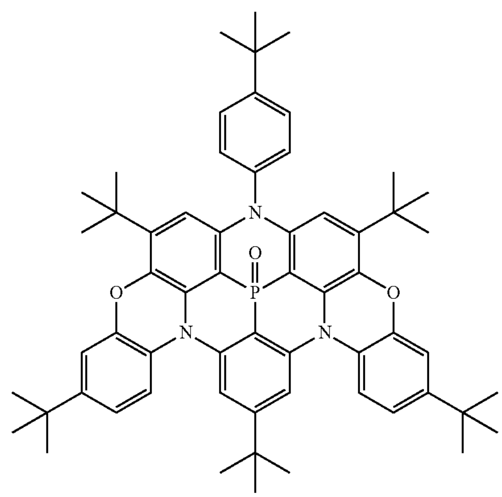
(1-464)
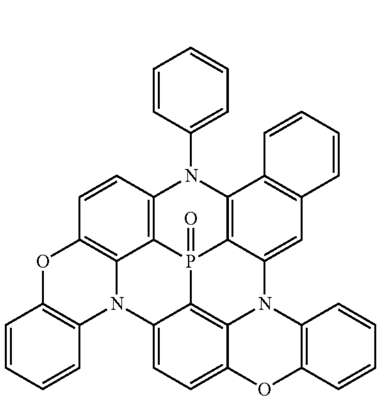
(1-465)
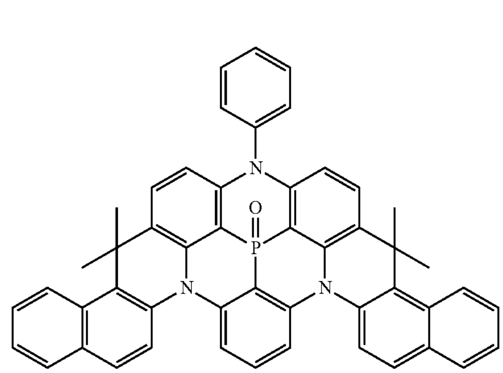

-continued
(1-466)
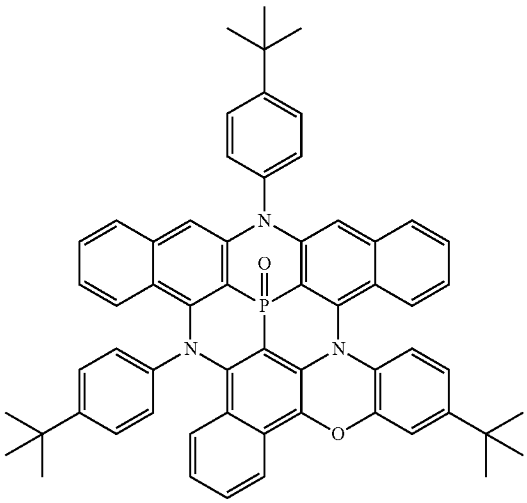
(1-467)
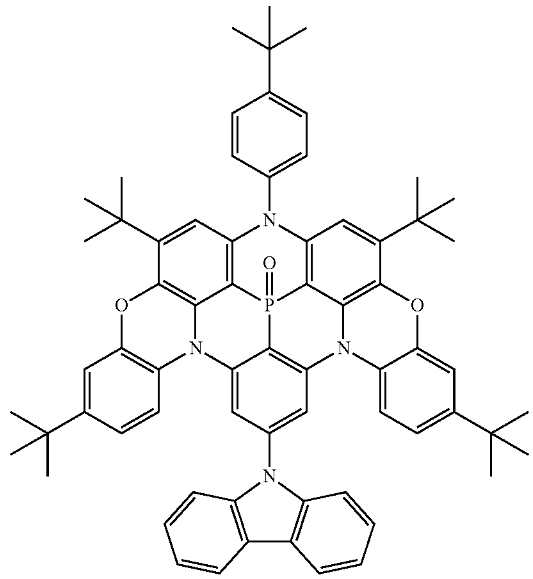
(1-468)
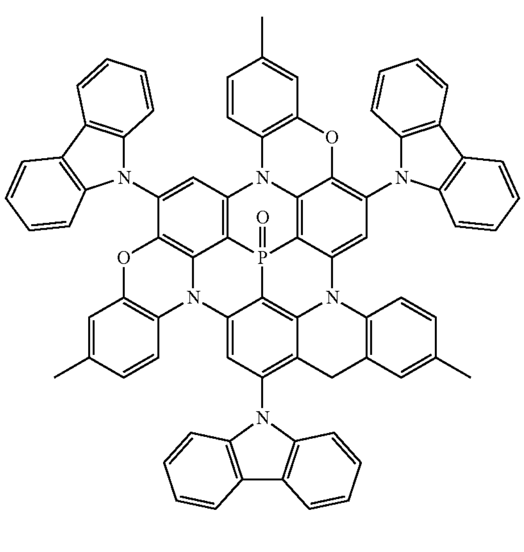
(1-469)
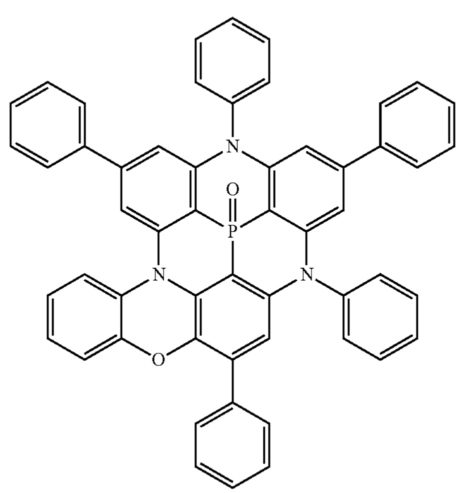

-continued
(1-470)
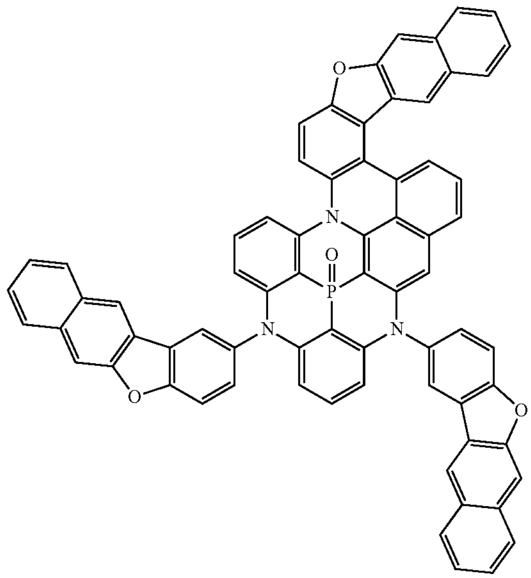
(1-471)
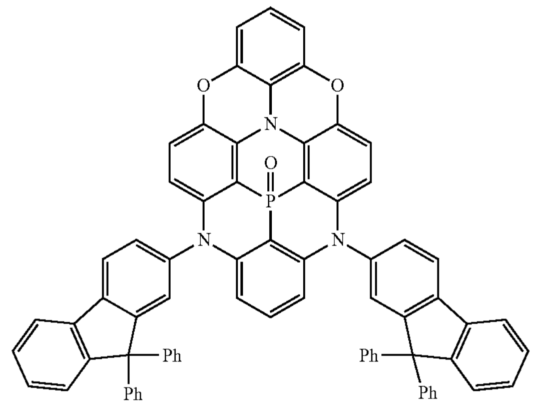
(1-472)
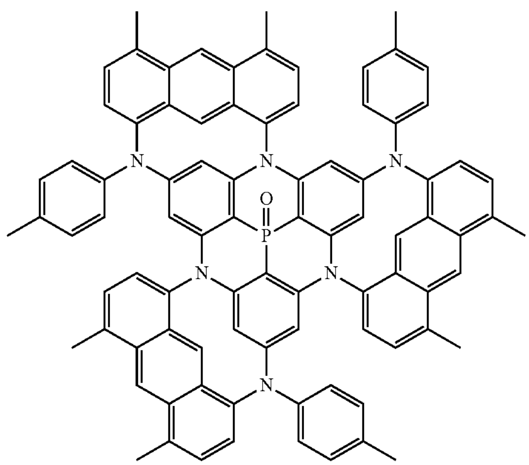
(1-473)
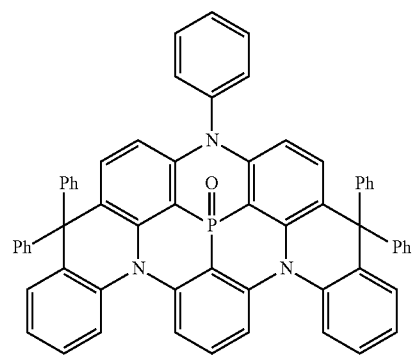
(1-474)
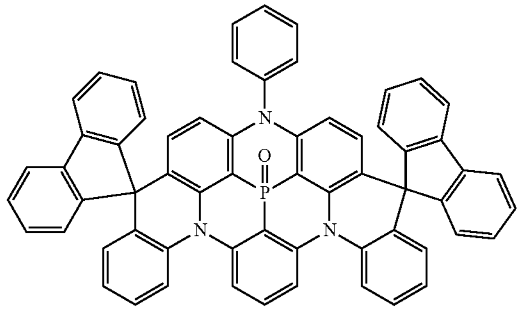
(1-475)
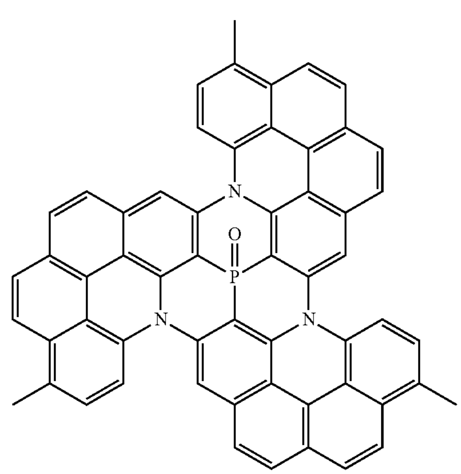

-continued
(1-481)
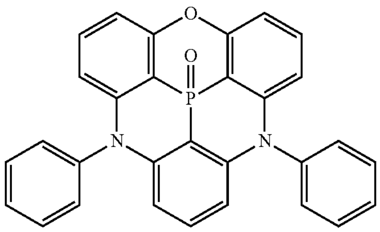
(1-482)
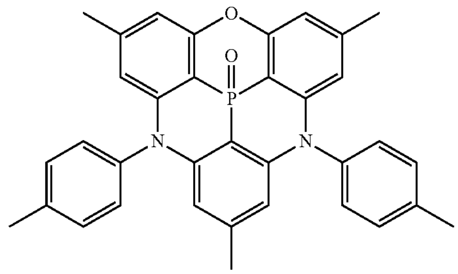
(1-483)
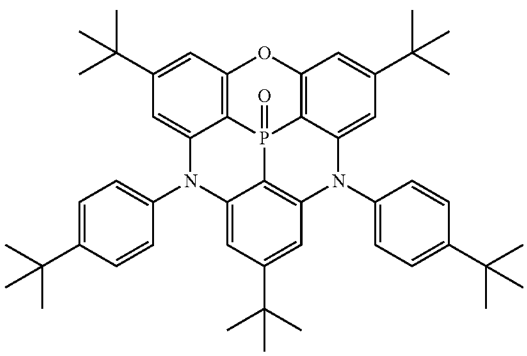
(1-484)
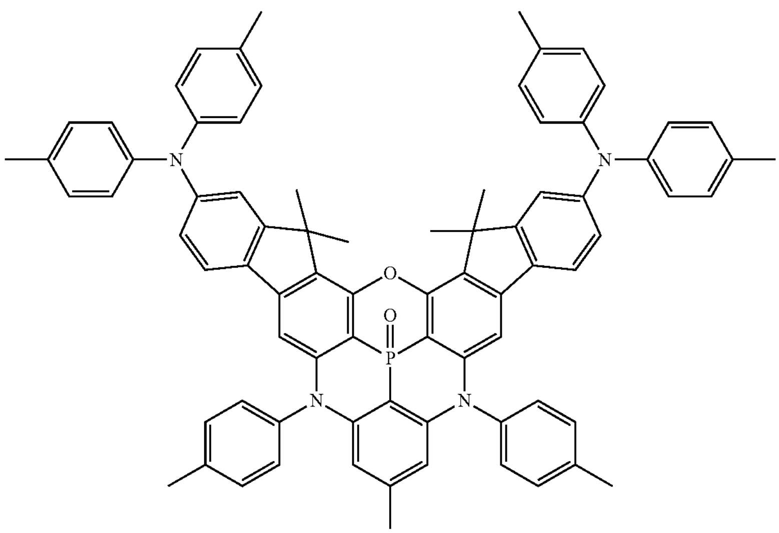
(1-485)
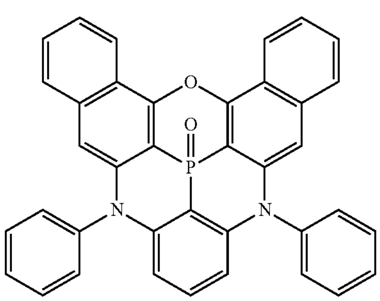
(1-486)
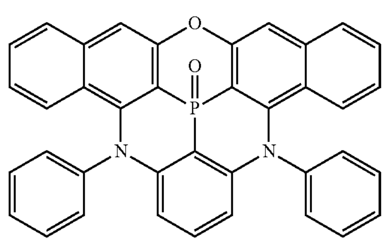

-continued
(1-487)
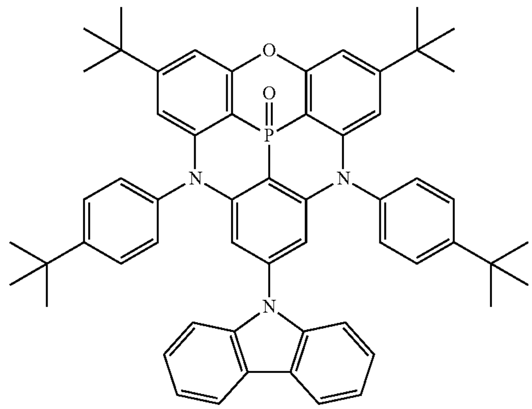
(1-488)
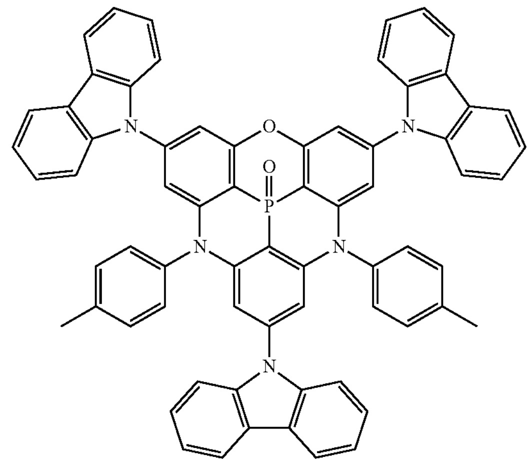
(1-489)
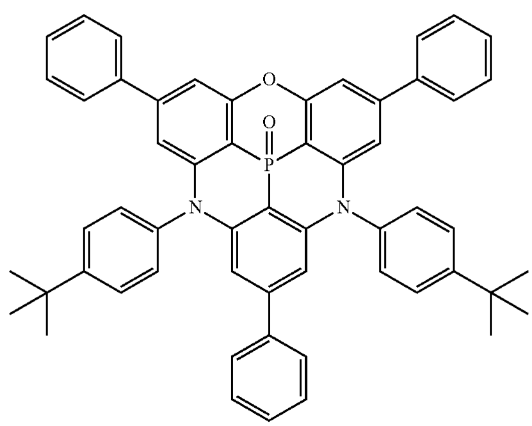
(1-490)
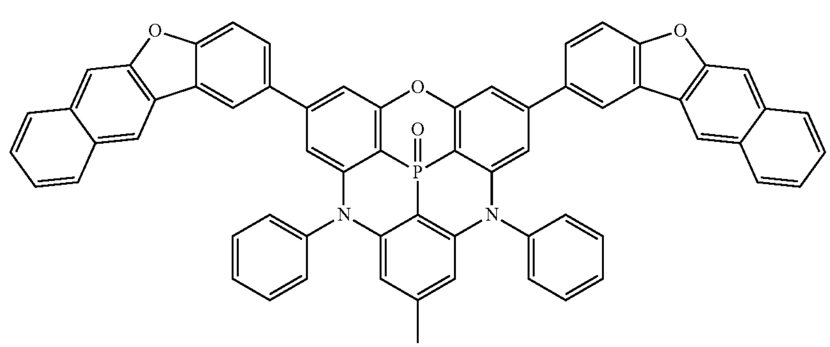

-continued
(1-491)
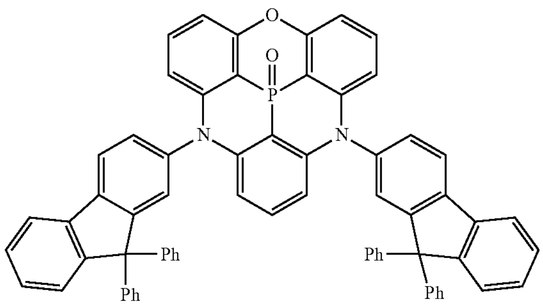
(1-492)
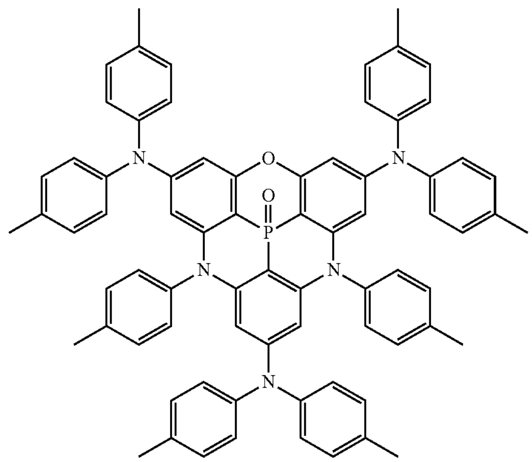
(1-493)
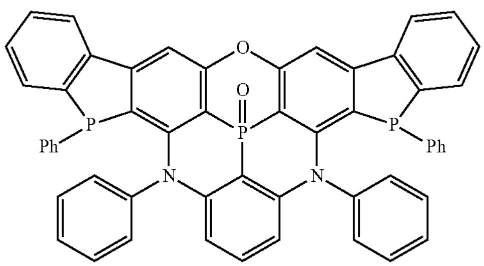
(1-494)
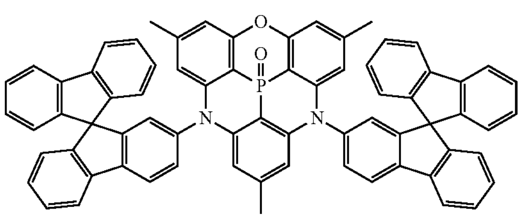
(1-495)
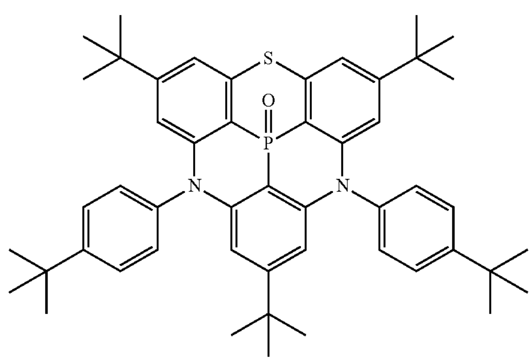
(1-501)
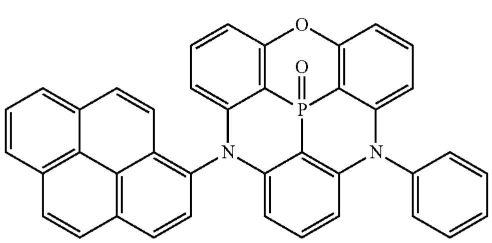
(1-502)
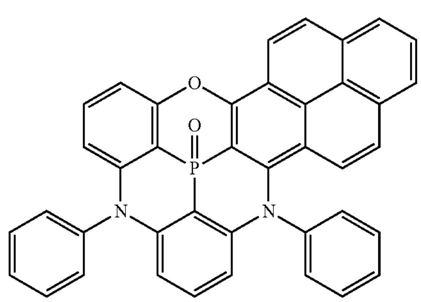

-continued
(1-503)
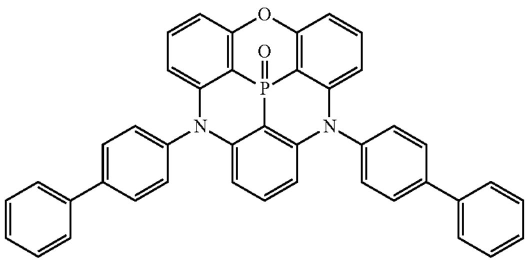
(1-504)
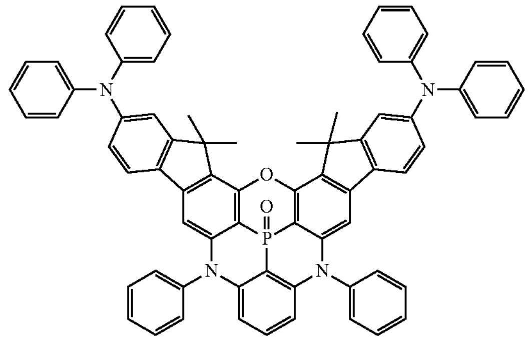
(1-505)
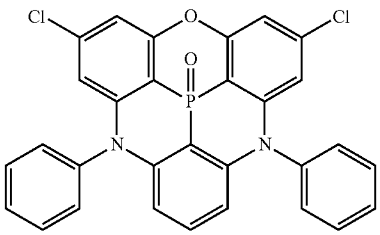
(1-506)
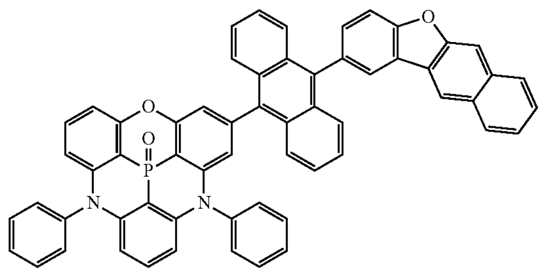
(1-507)
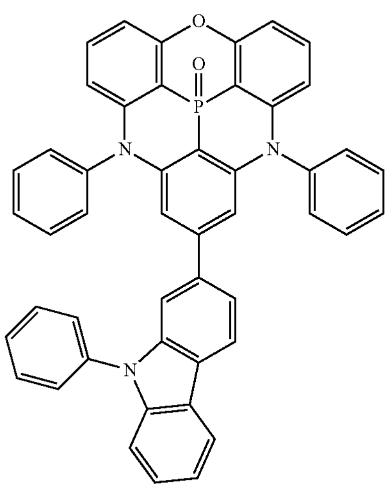
(1-508)
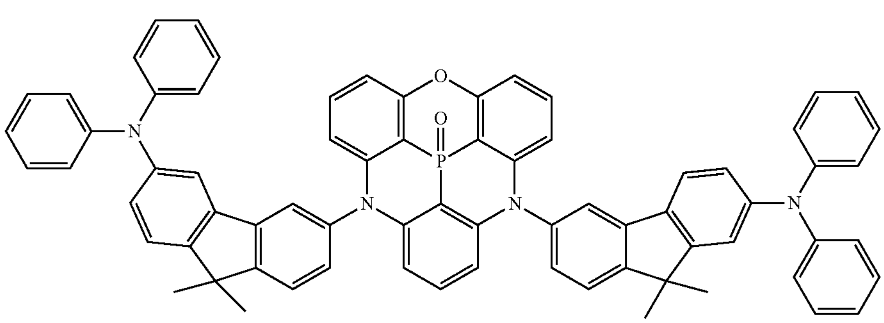

-continued
(1-509)
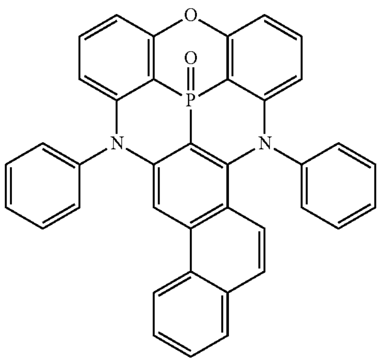
(1-511)
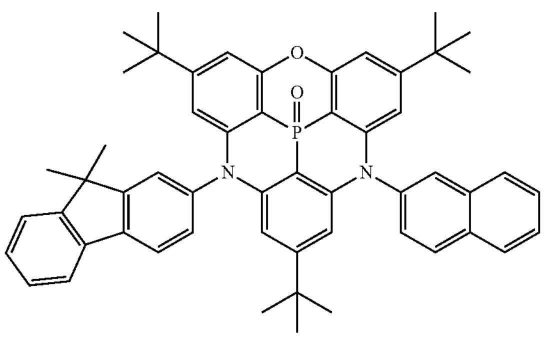
(1-513)
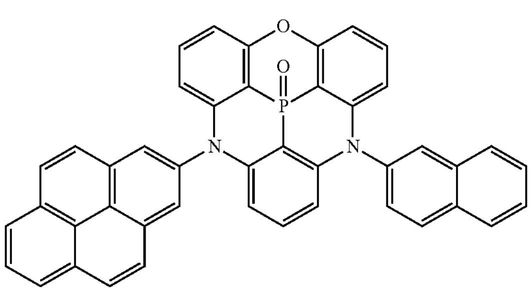
(1-515)
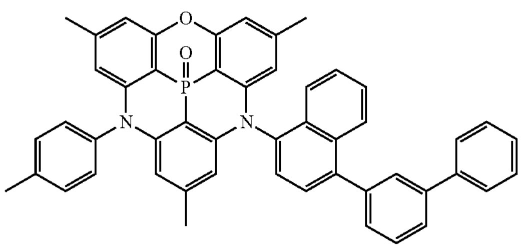
(1-510)
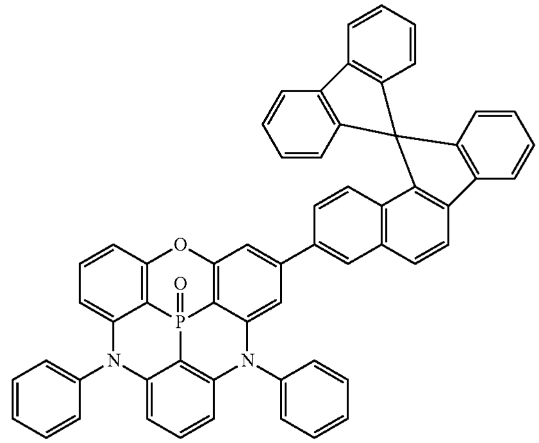
(1-512)
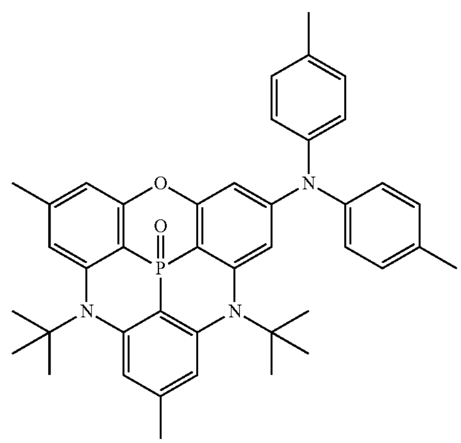
(1-514)
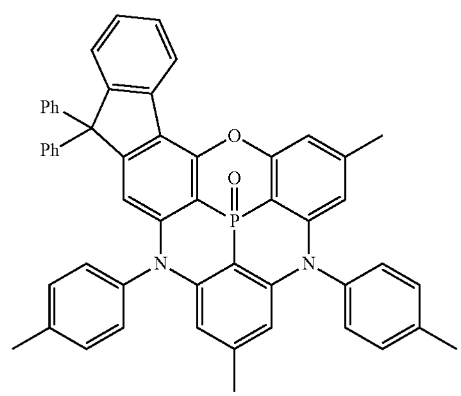
(1-521)
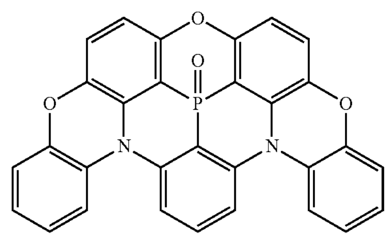

-continued
(1-522)
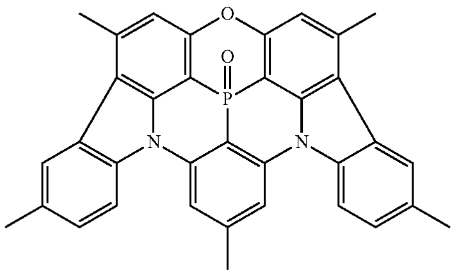
(1-523)
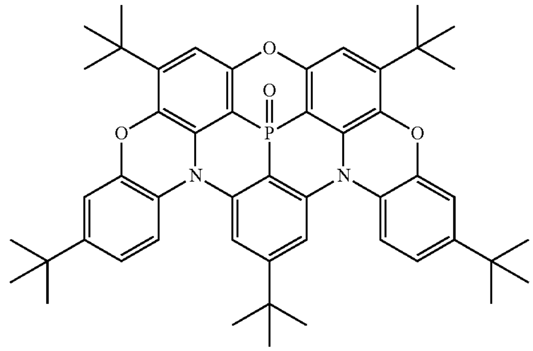
(1-524)
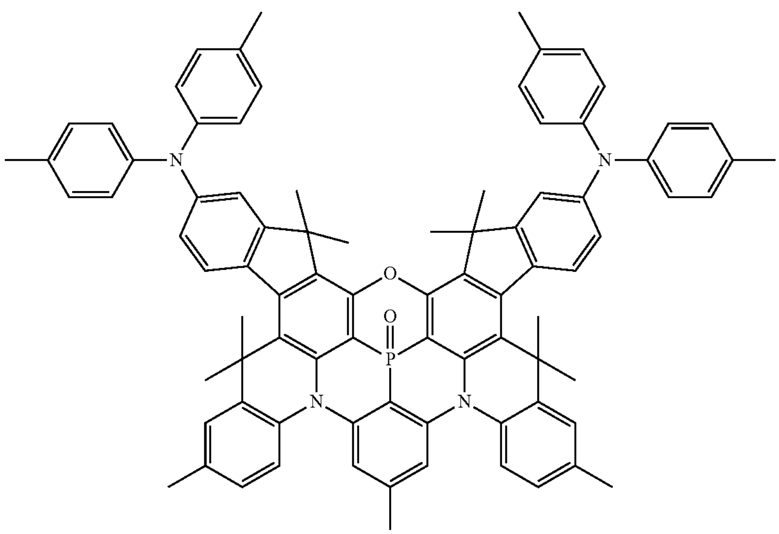
(1-525)
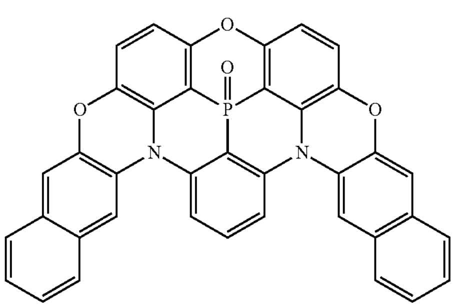
(1-526)
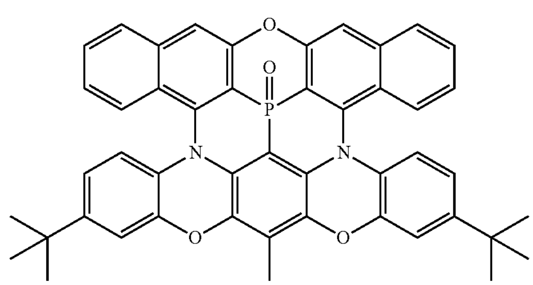

-continued
(1-527)
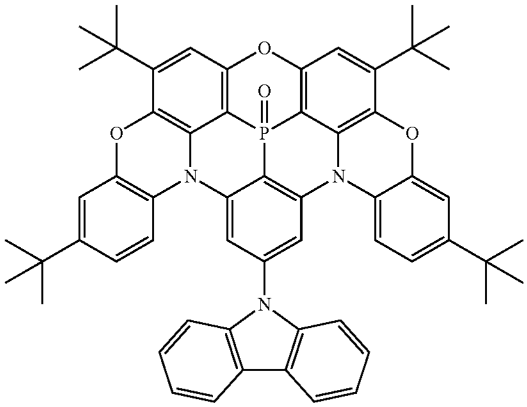
(1-528)
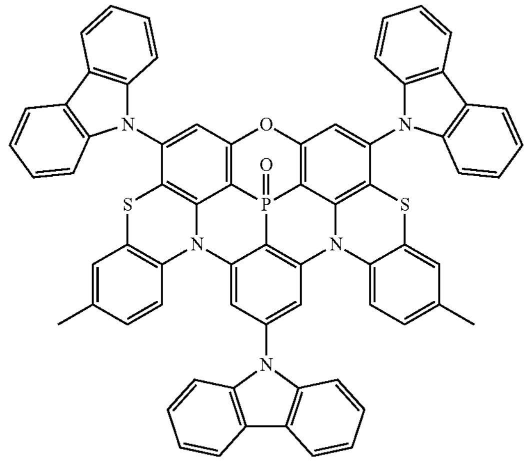
(1-529)
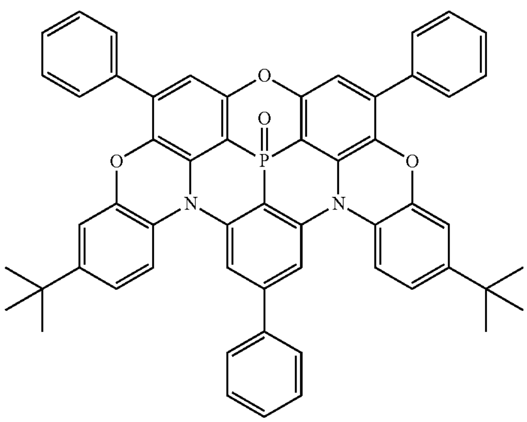
(1-530)
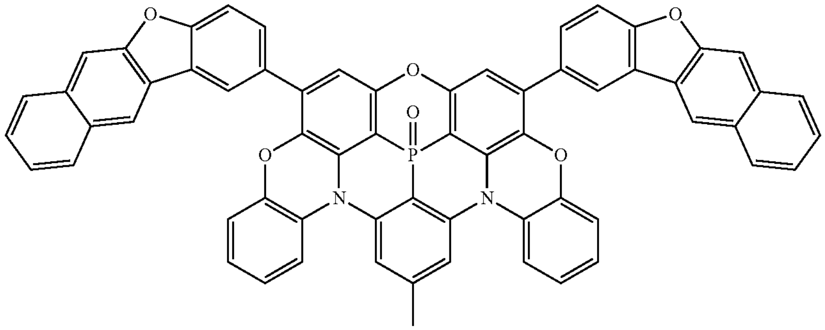

-continued
(1-531)
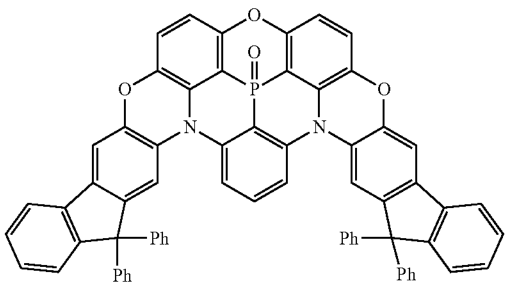
(1-532)
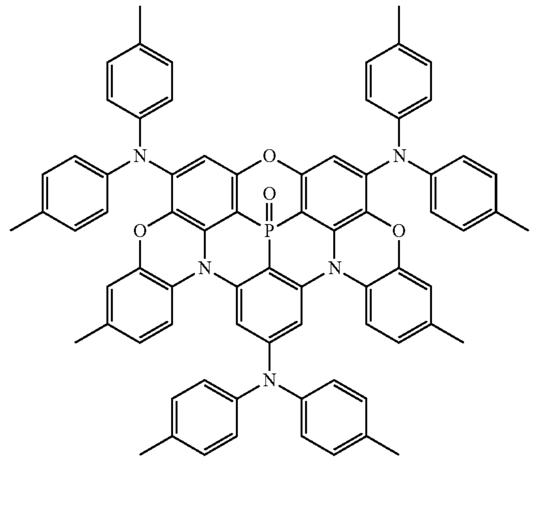
(1-533)
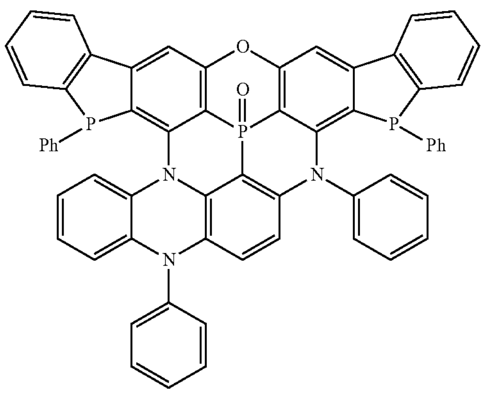
(1-534)
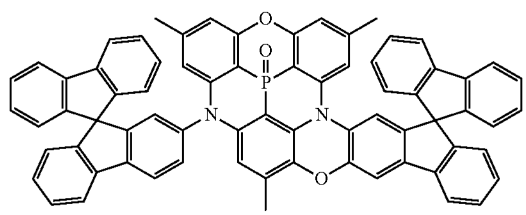
(1-535)
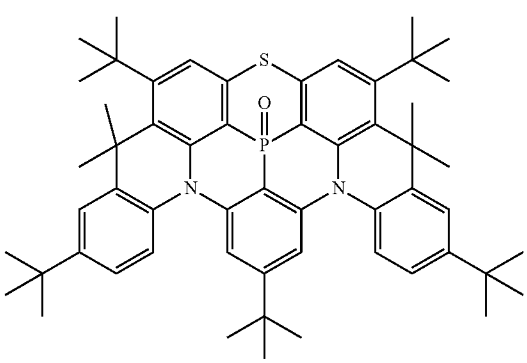
(1-541)
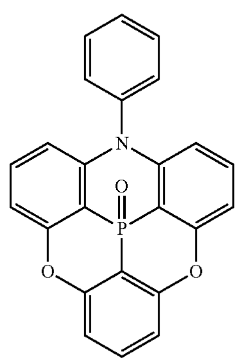

-continued
(1-542)
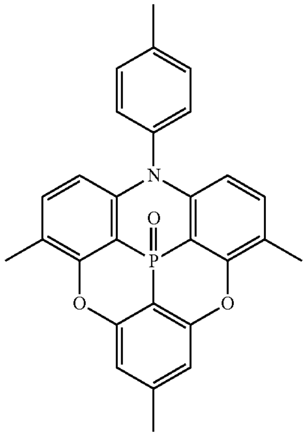
(1-543)
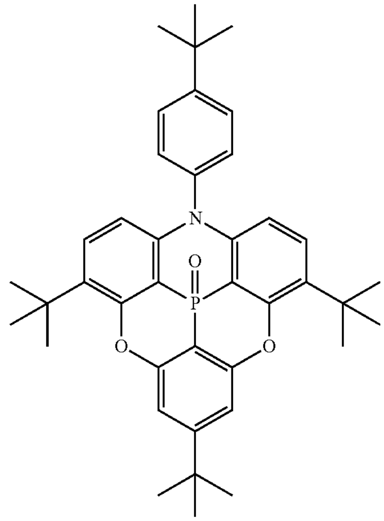
(1-544)
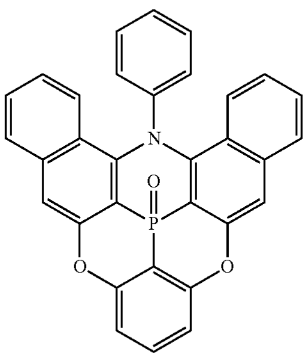
(1-545)
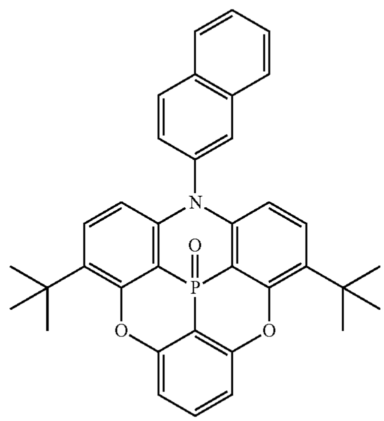
(1-546)
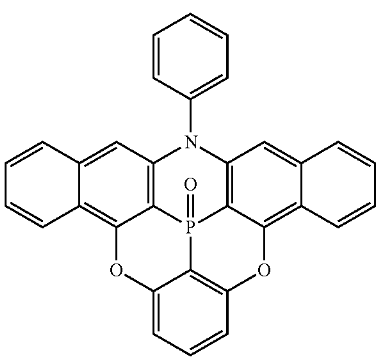
(1-647)
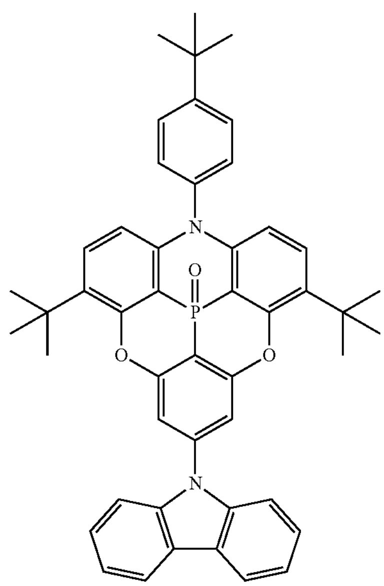

-continued
(1-548)
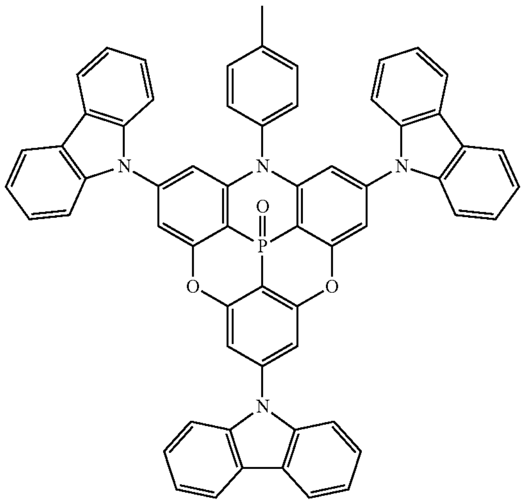
(1-549)
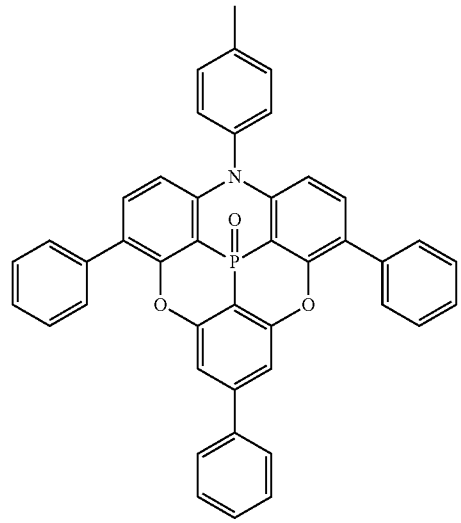
(1-550)
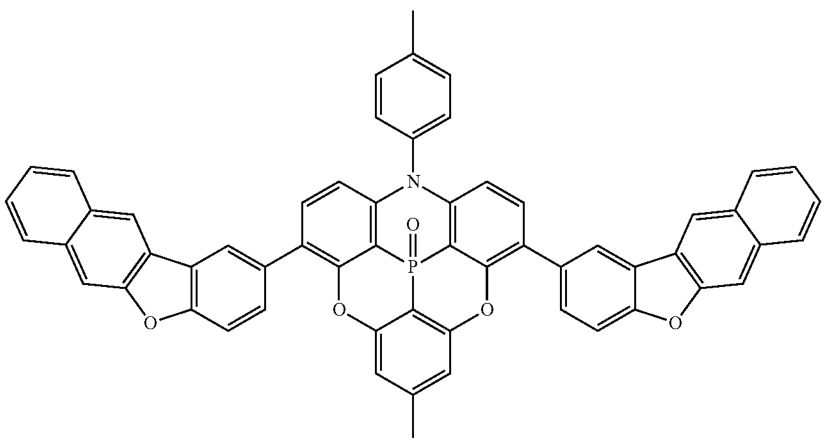
(1-551)
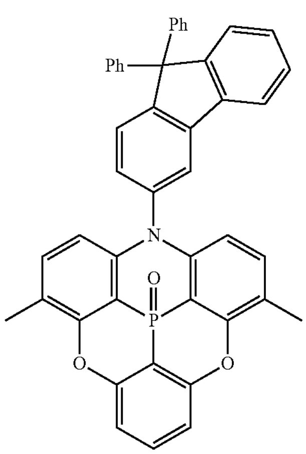
(1-552)
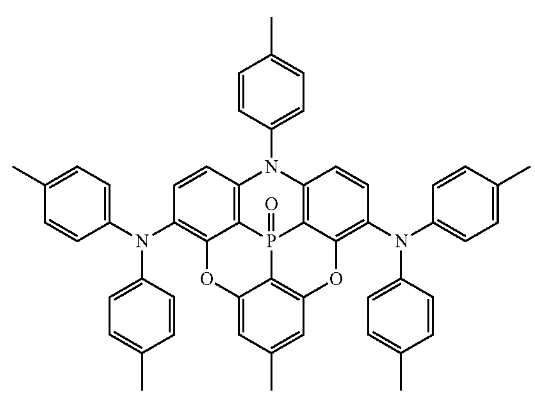

-continued
(1-553)
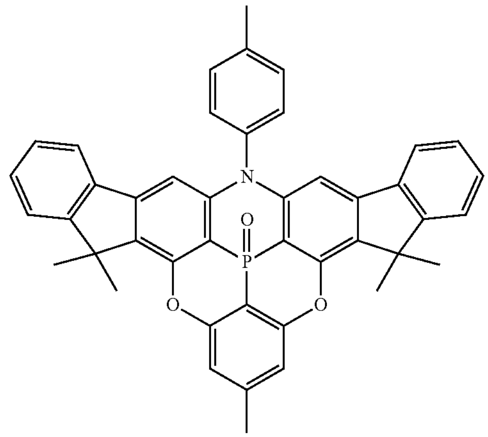
(1-554)
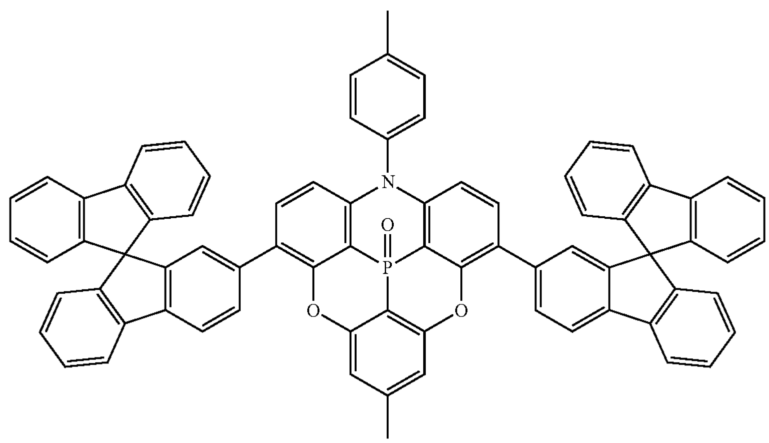
(1-555)
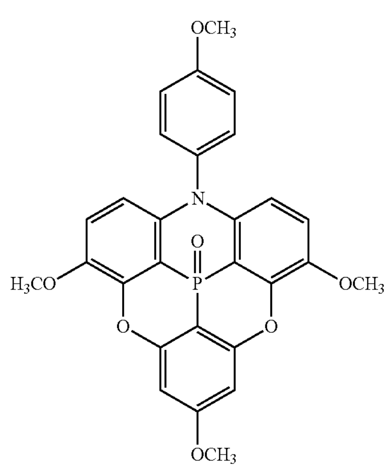
(1-561)
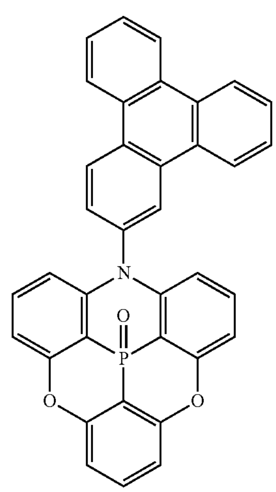

-continued
(1-562)
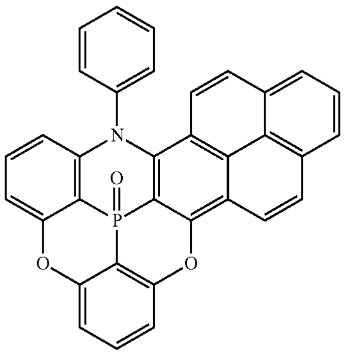
(1-563)
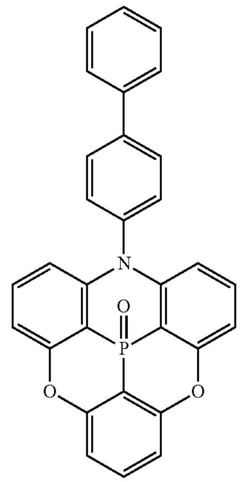
(1-564)
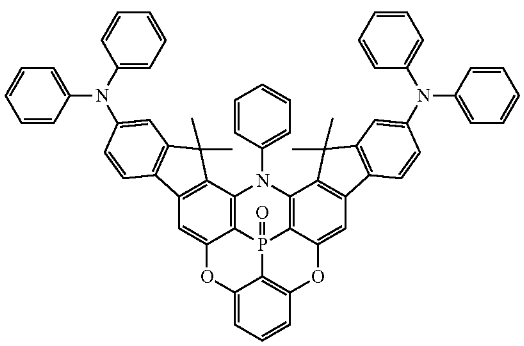
(1-565)
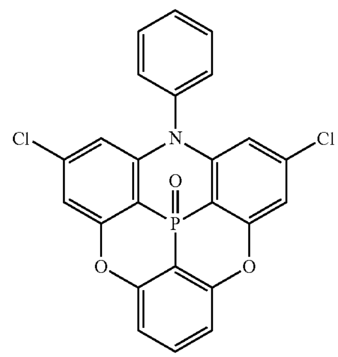
(1-566)
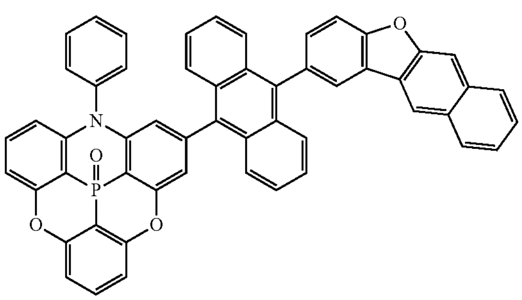
(1-567)
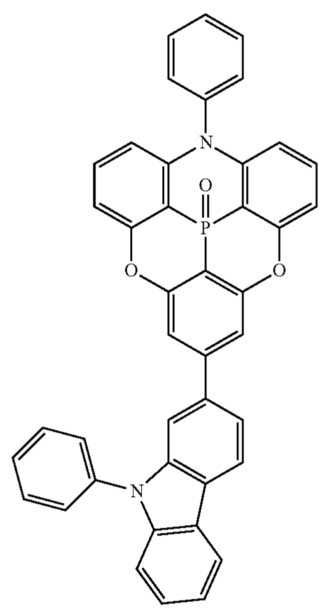

-continued
(1-568)
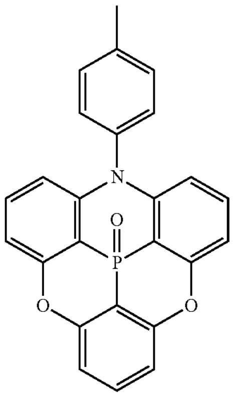
(1-569)
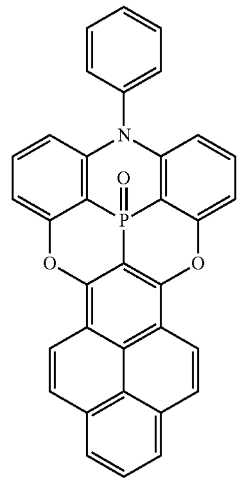
(1-570)
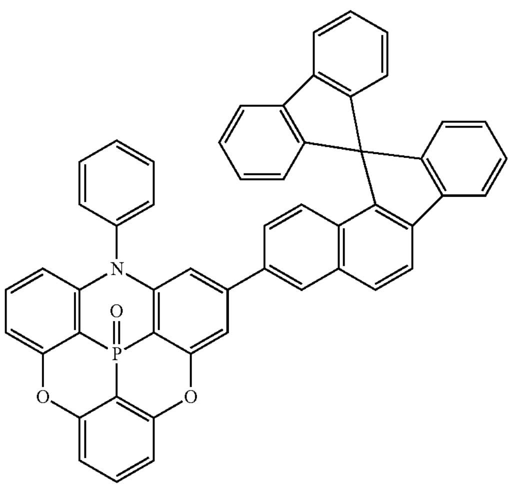
(1-571)
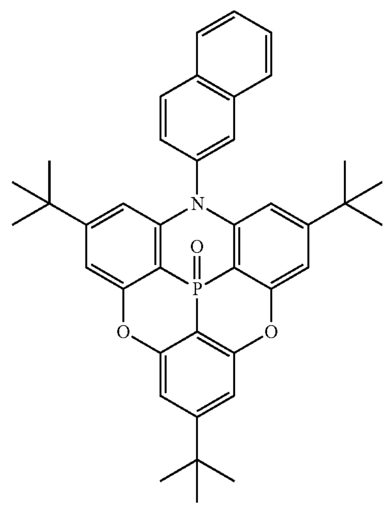
(1-572)
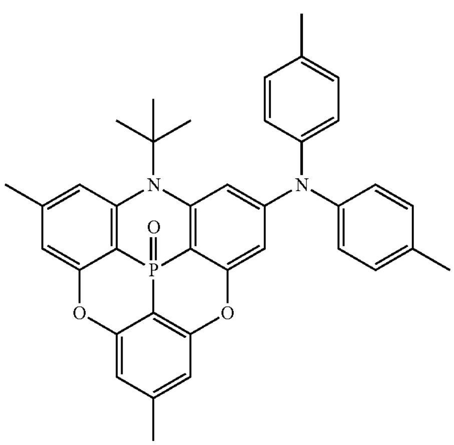
(1-573)
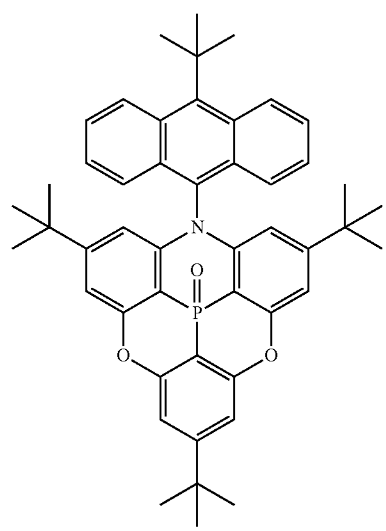

-continued
(1-574)
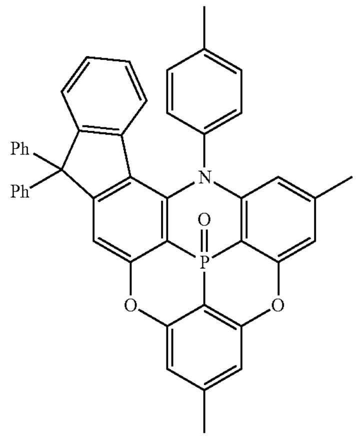
(1-575)
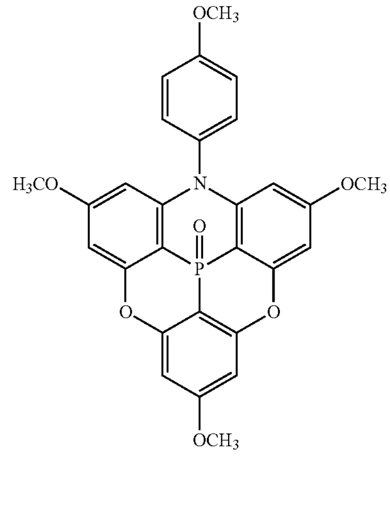
(1-581)
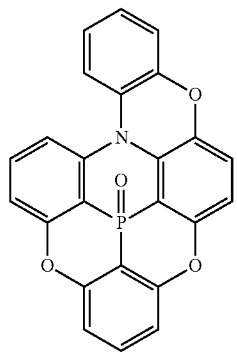
(1-582)
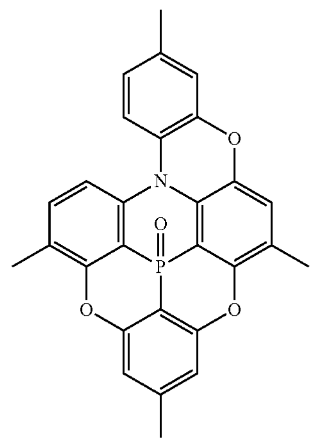
(1-583)
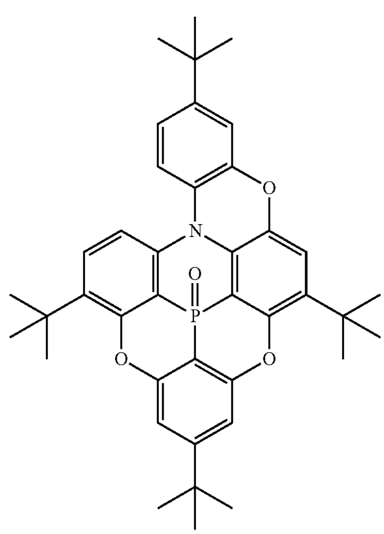
(1-534)
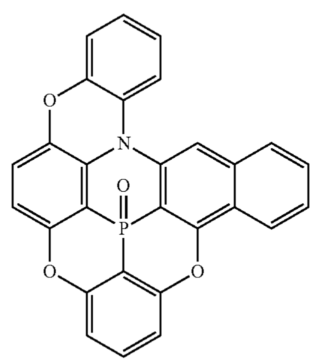

-continued
(1-585)
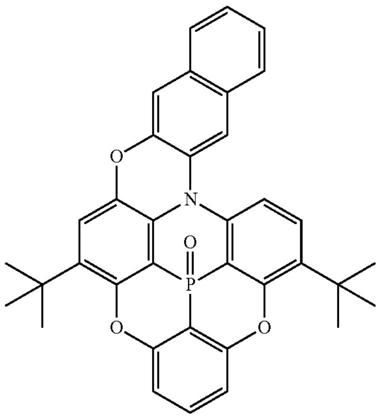
(1-586)
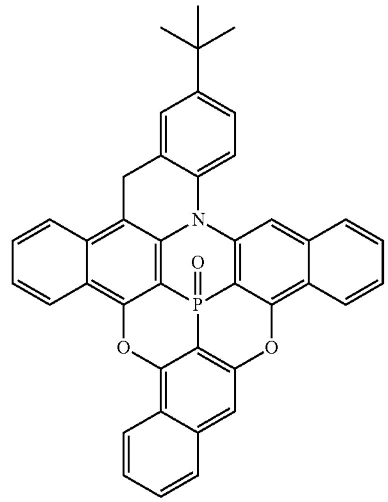
(1-587)
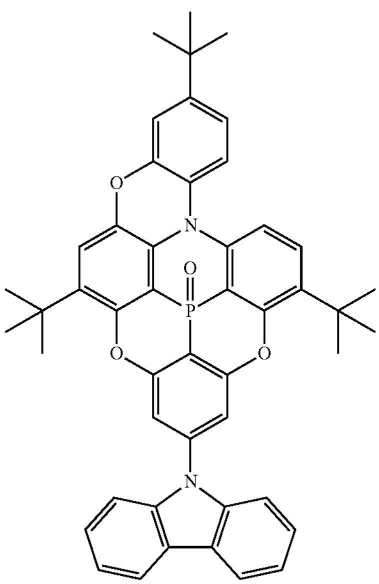
(1-588)
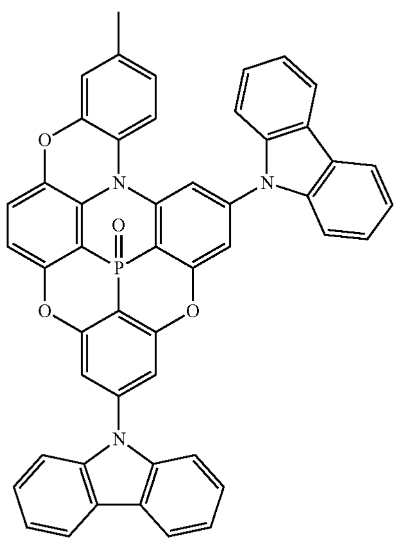
(1-589)
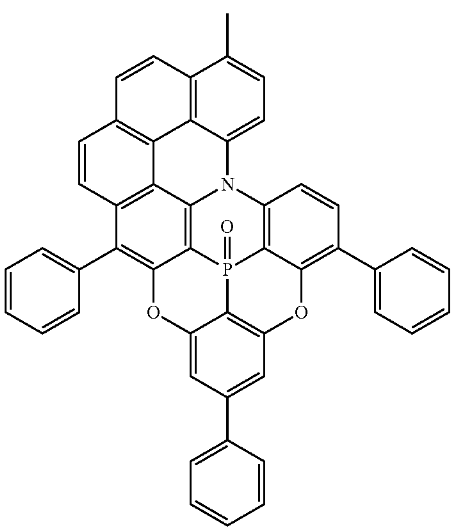

-continued
(1-590)
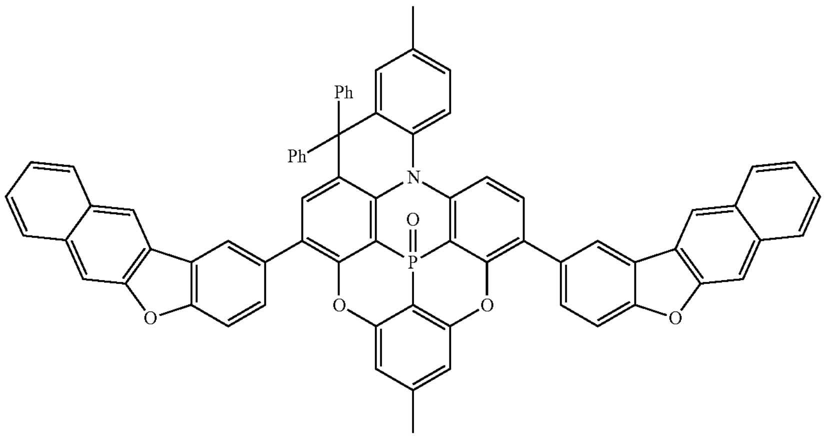
(1-591)
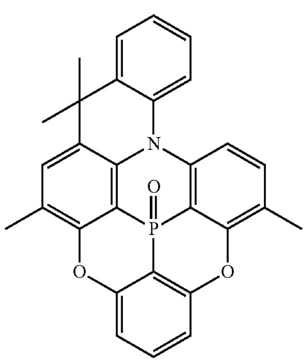
(1-592)
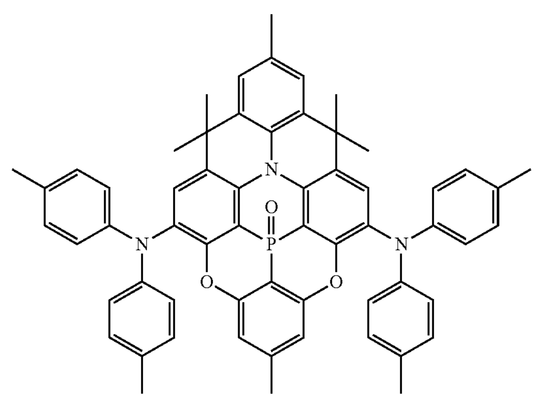
(1-593)
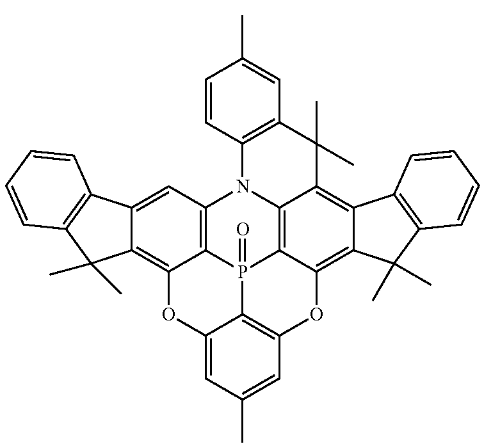

-continued
(1-594)
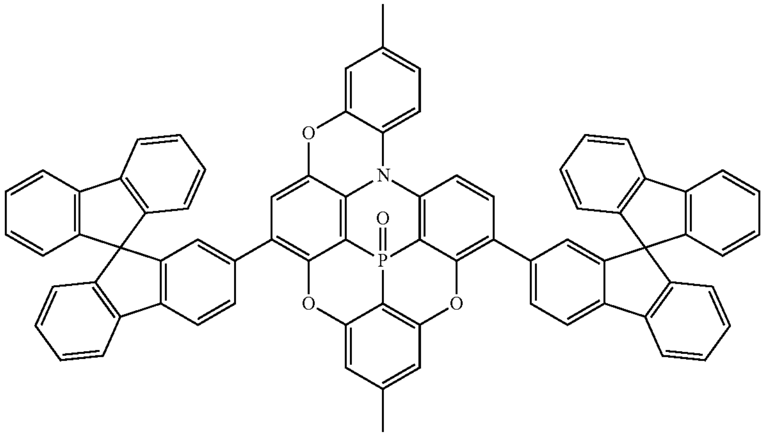
(1-595)
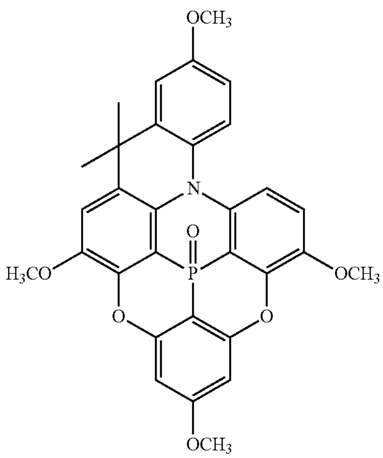
(1-601)
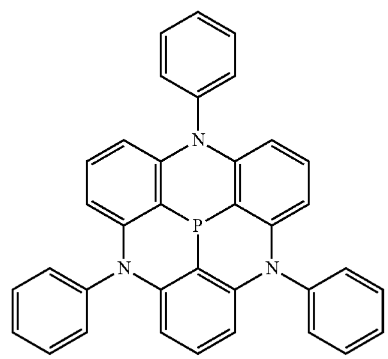
(1-602)
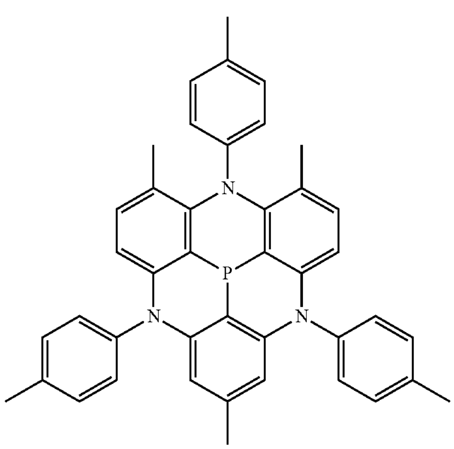
(1-603)
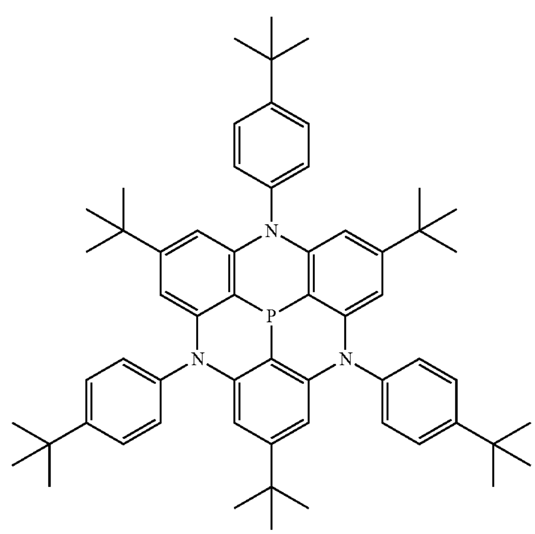

-continued
(1-604)
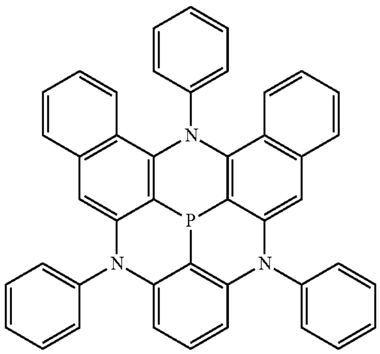
(1-605)
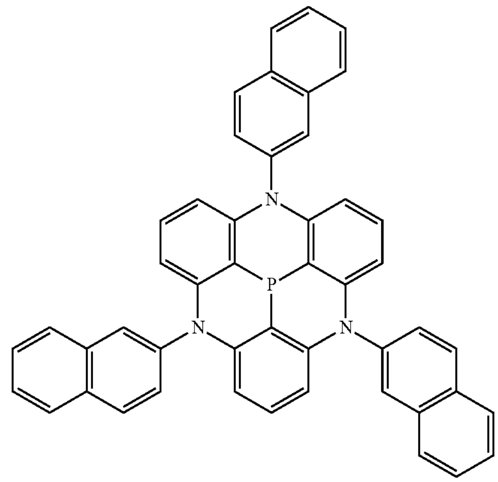
(1-606)
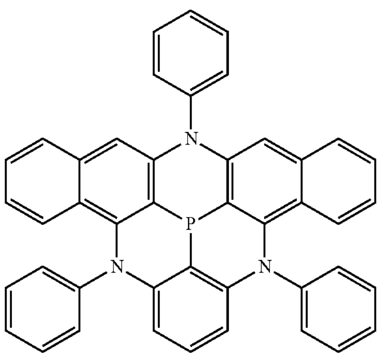
(1-607)
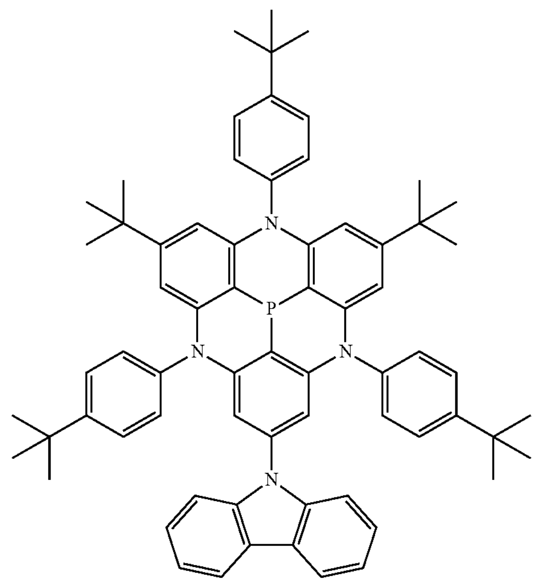
(1-608)
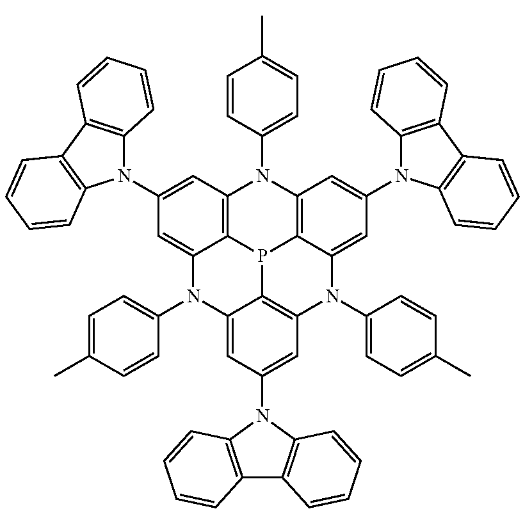
(1-609)
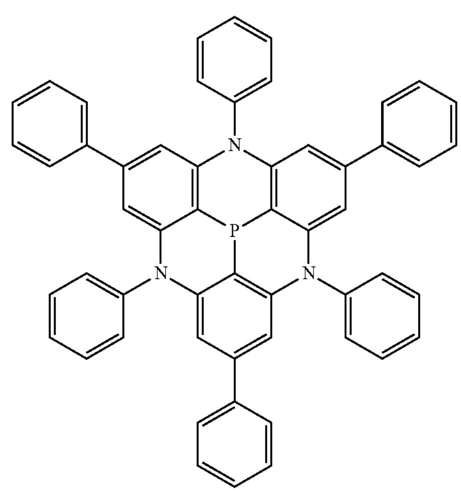

-continued
(1-610)
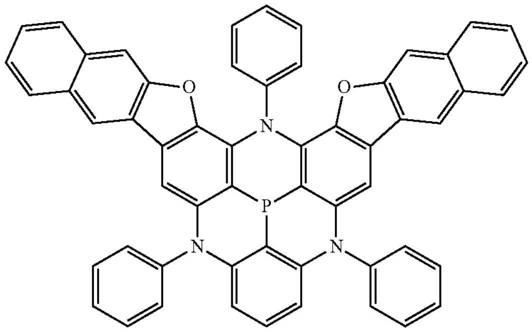
(1-611)
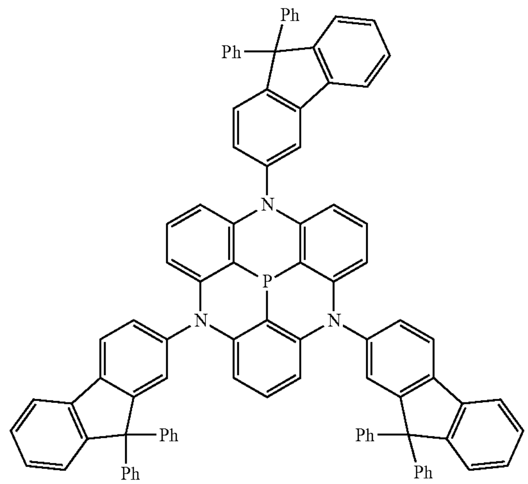
(1-612)
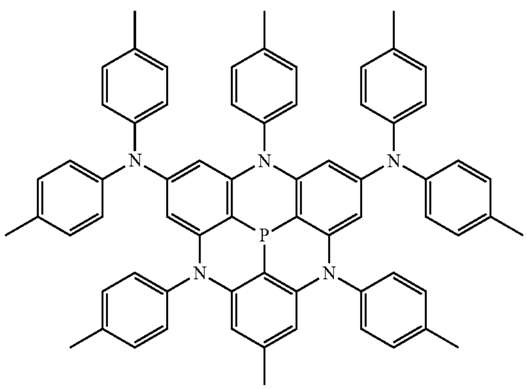
(1-613)
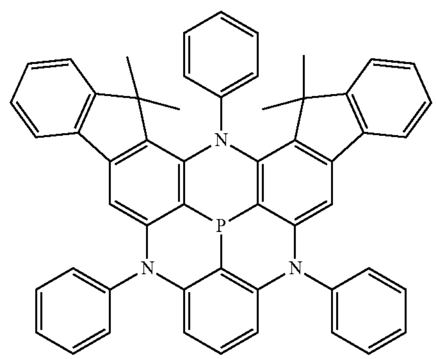
(1-614)
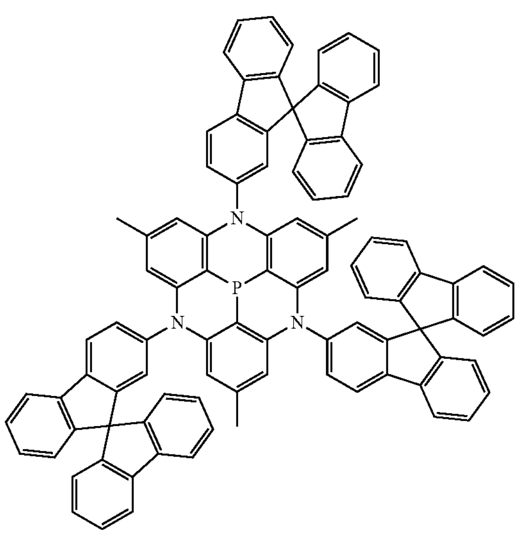
(1-615)
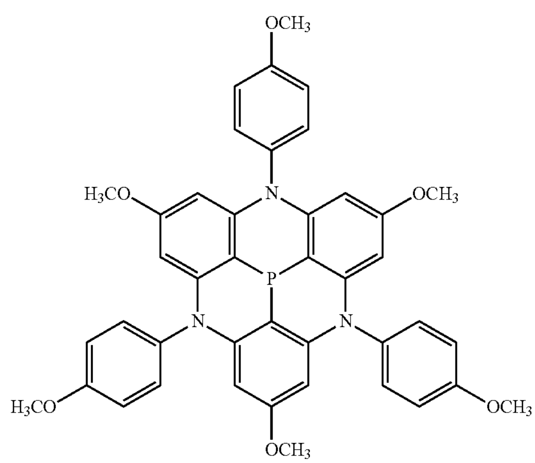

-continued
(1-621)
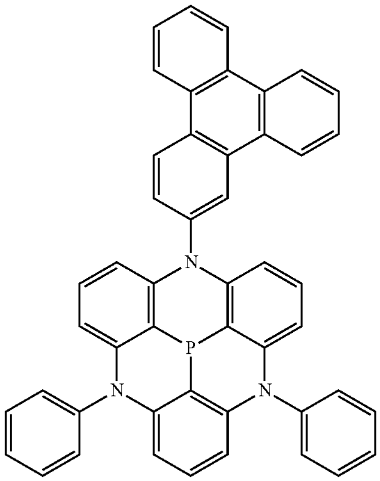
(1-622)
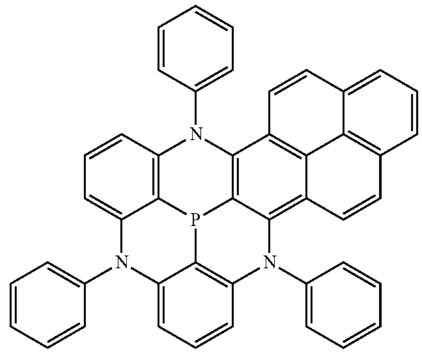
(1-623)
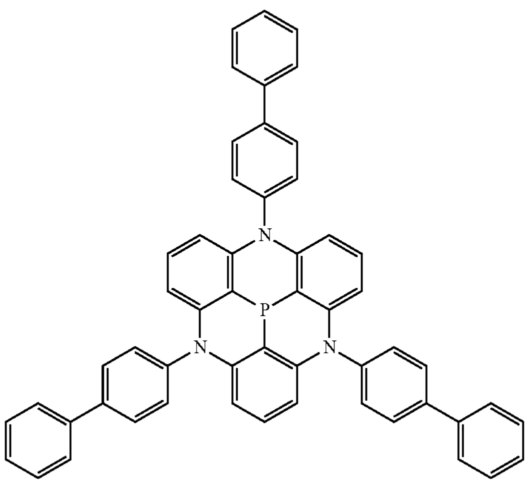
(1-624)
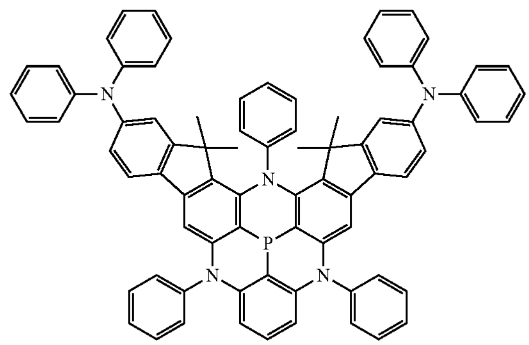
(1-625)
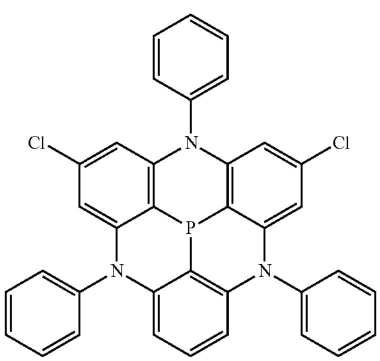
(1-626)
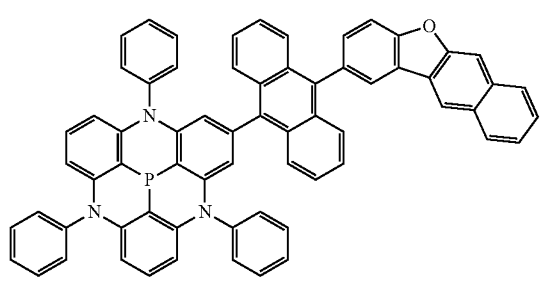

-continued
(1-627)
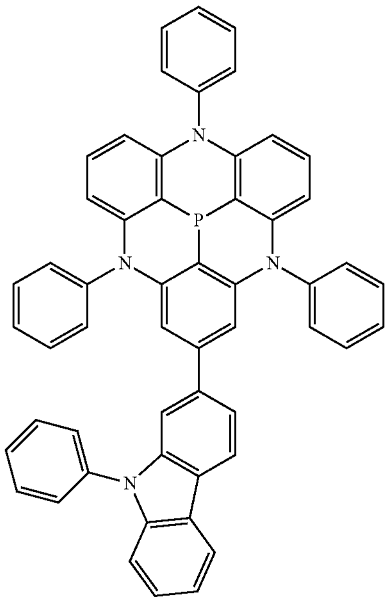
(1-628)
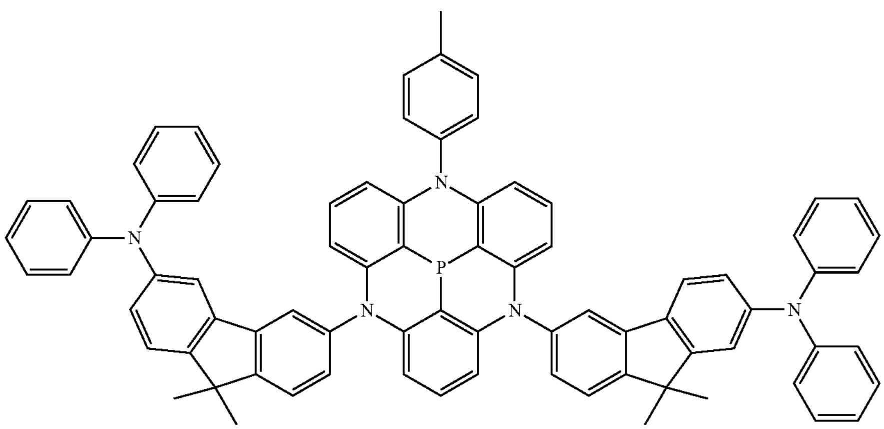
(1-629)
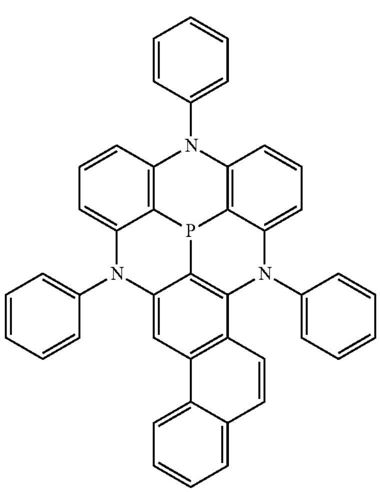
(1-630)
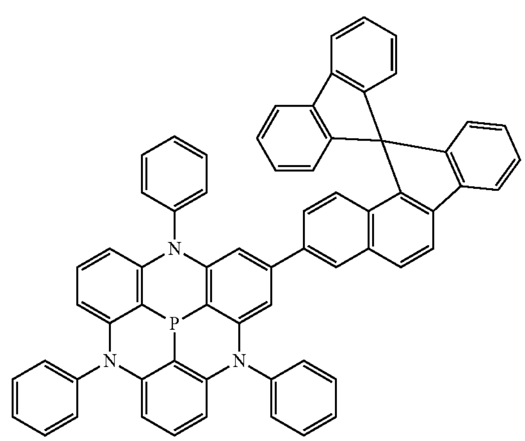

-continued
(1-631)
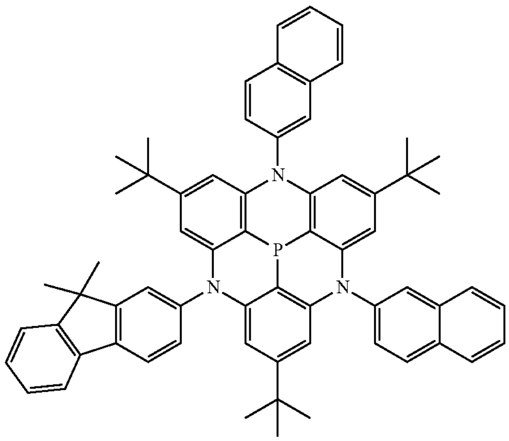
(1-632)
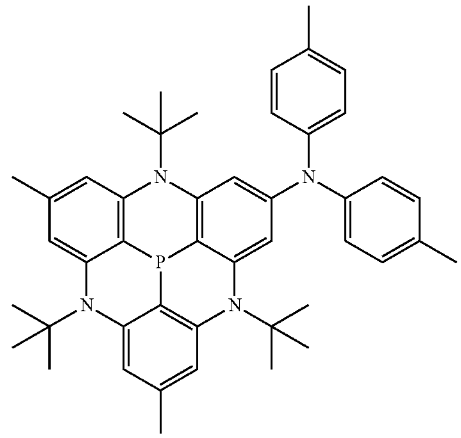
(1-633)
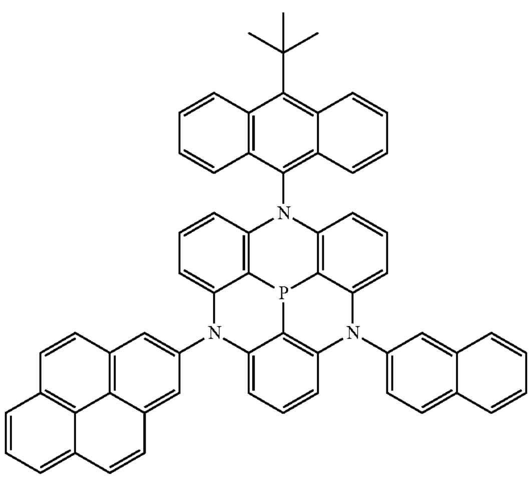
(1-634)
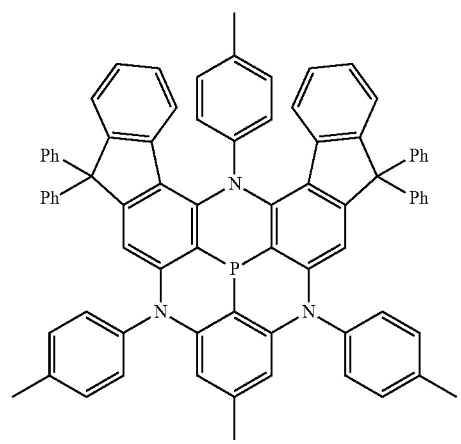
(1-635)
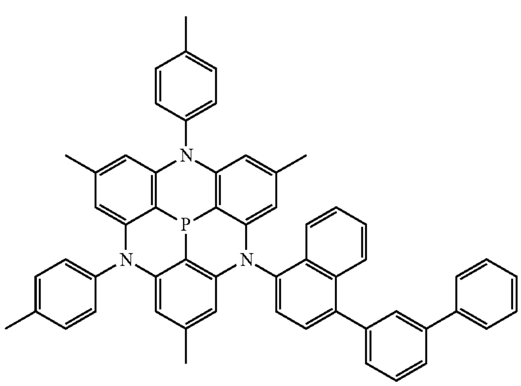
(1-641)
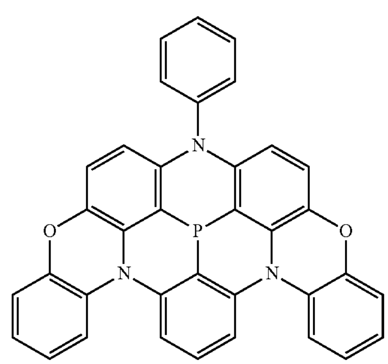

-continued
(1-642)
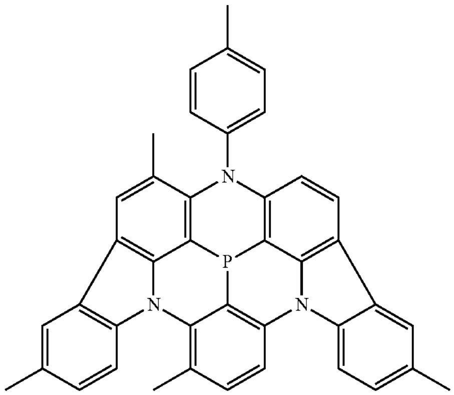
(1-643)
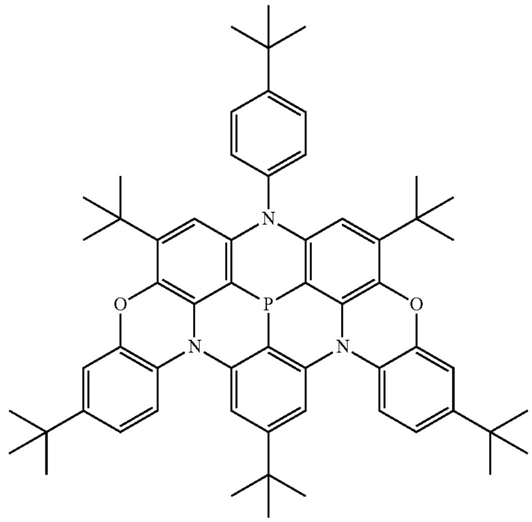
(1-644)
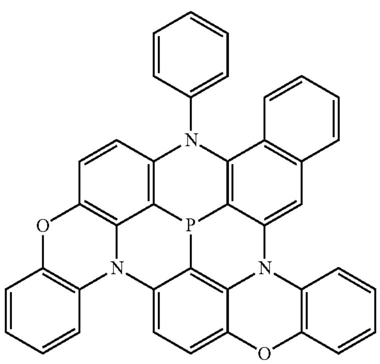
(1-645)
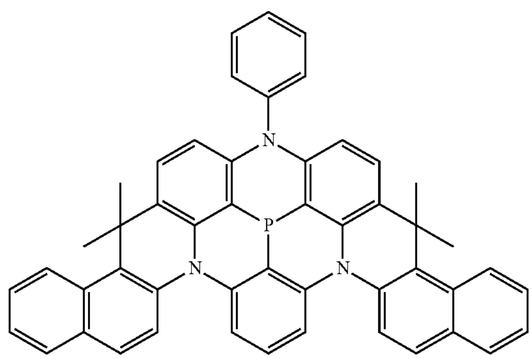
(1-646)
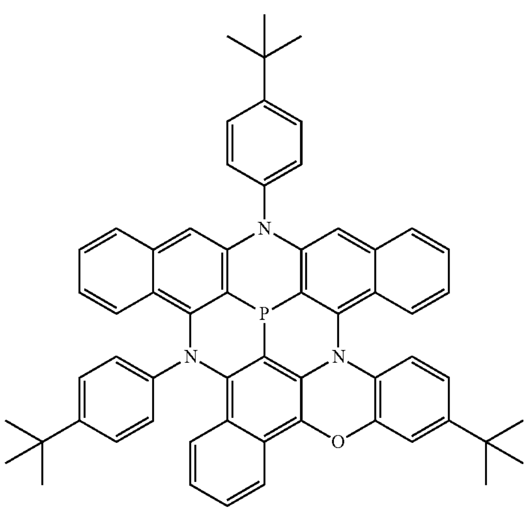
(1-647)
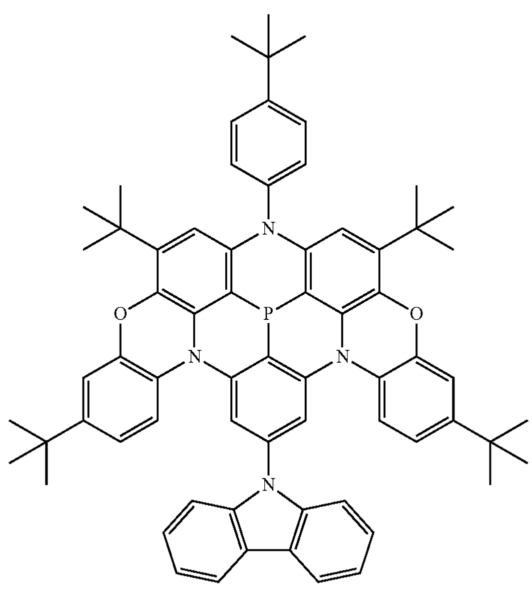

-continued
(1-648)
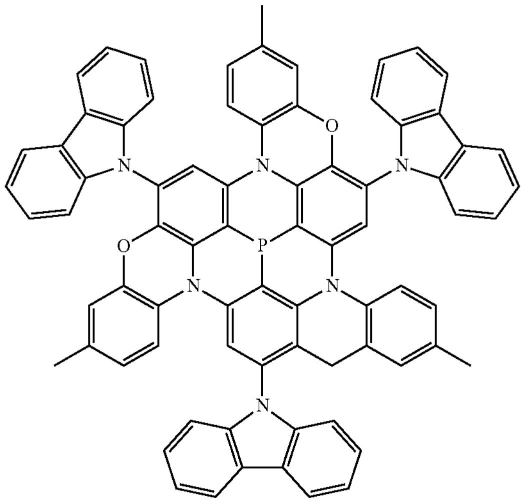
(1-649)
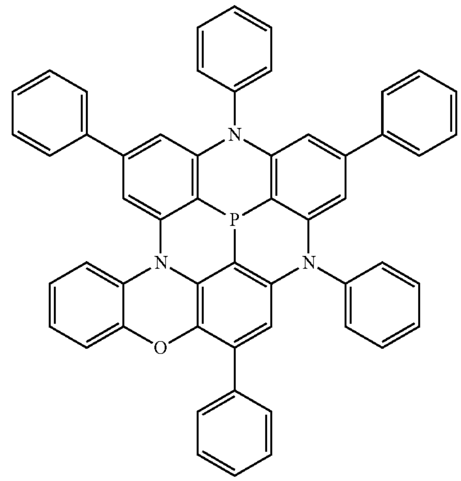
(1-650)
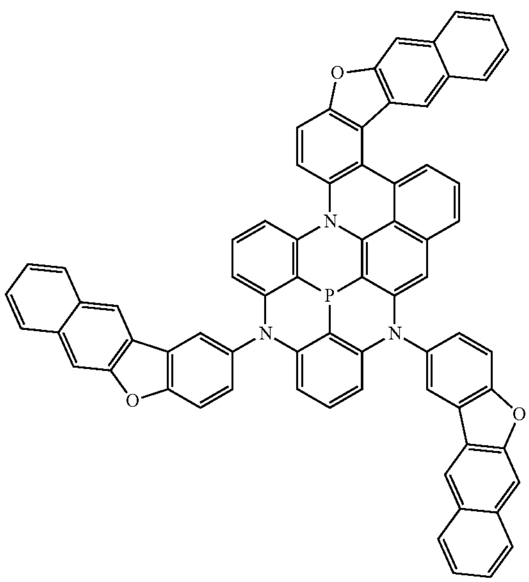
(1-651)
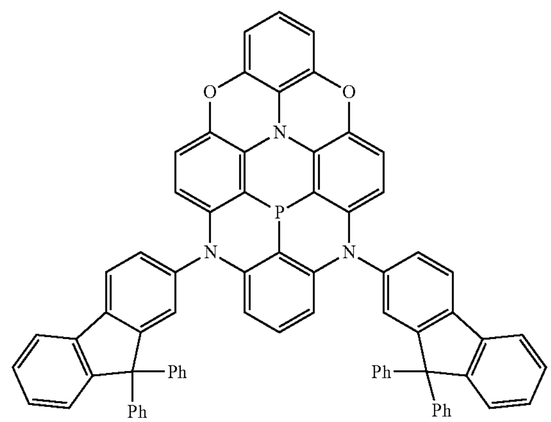
(1-652)
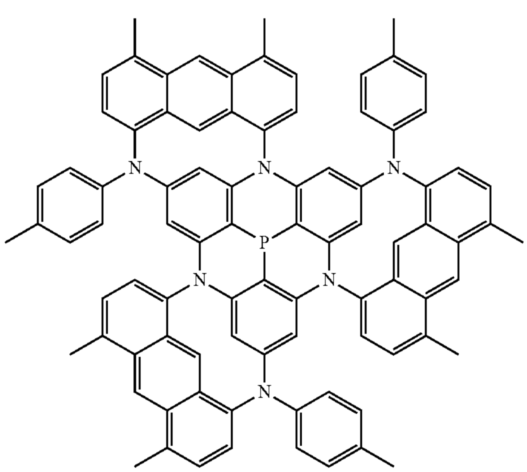
(1-653)
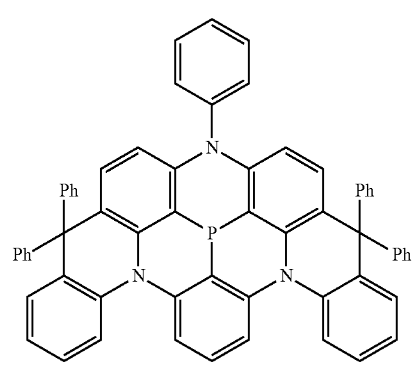

-continued
(1-654)
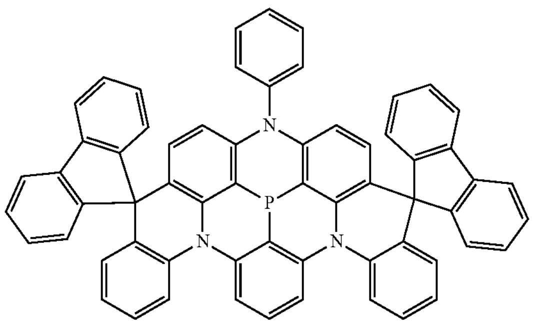
(1-655)
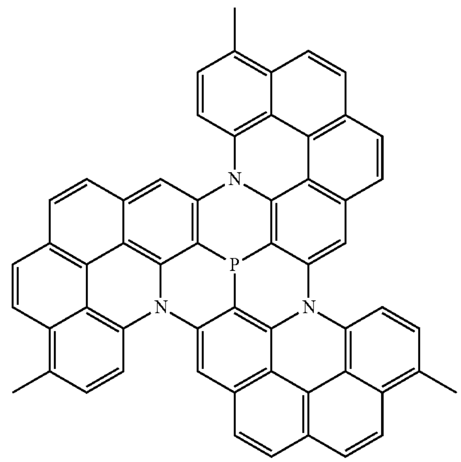
(1-661)
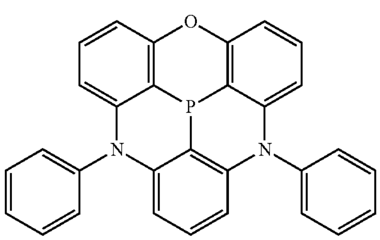
(1-662)
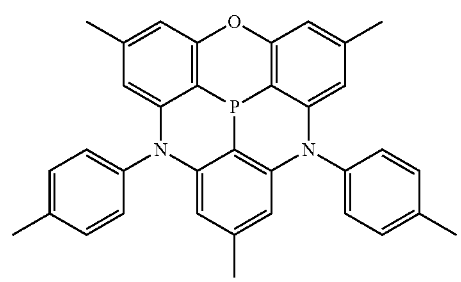
(1-663)
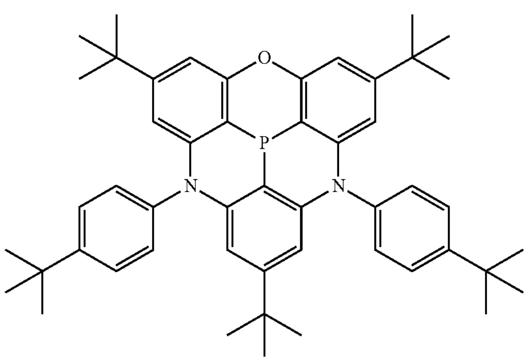
(1-664)
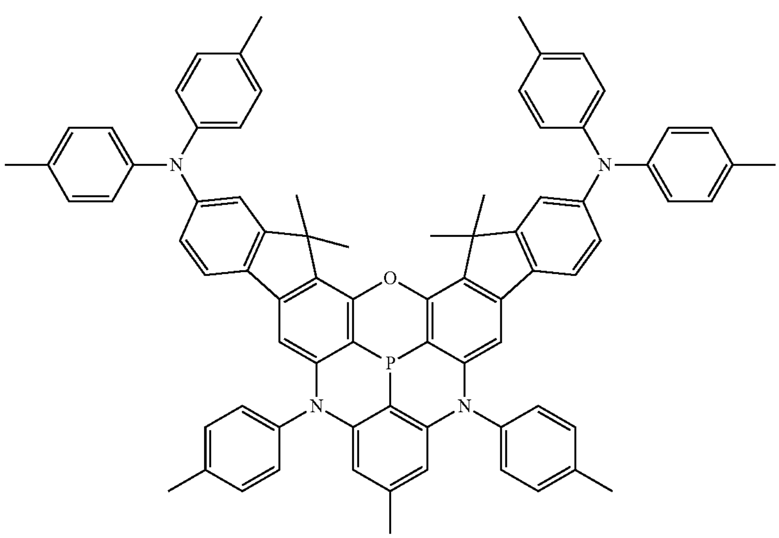

-continued
(1-665)
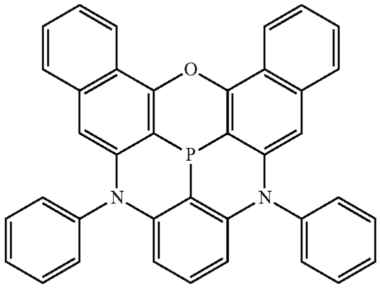
(1-666)
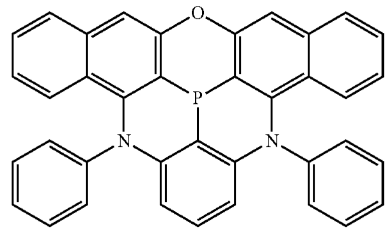
(1-667)
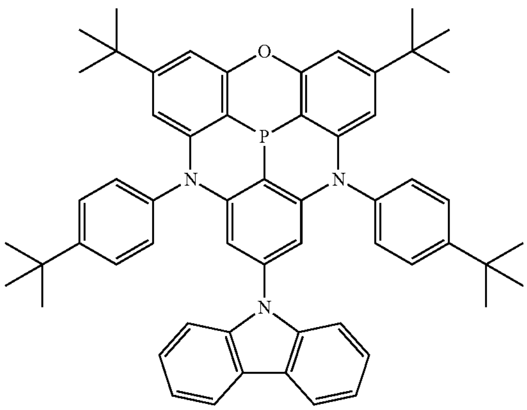
(1-668)
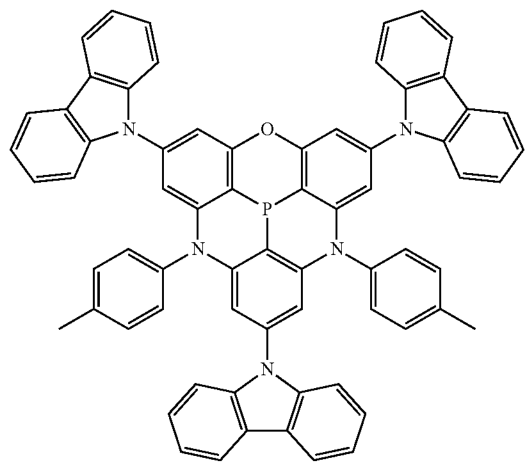
(1-669)
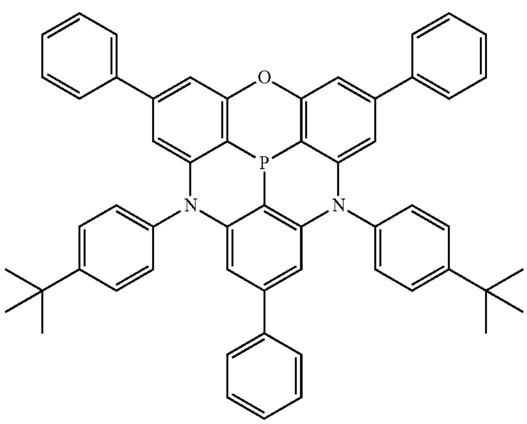
(1-670)
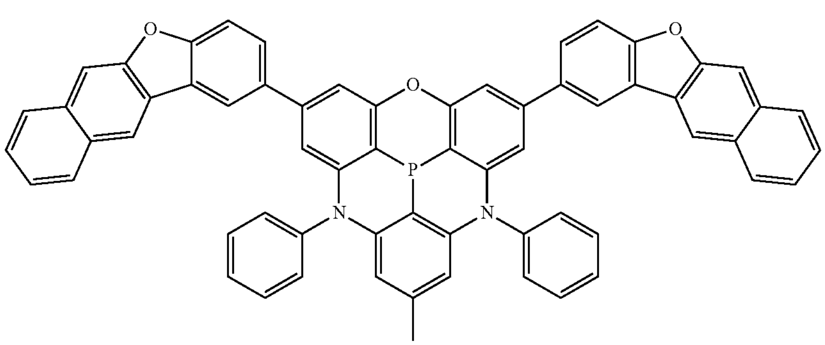

-continued
(1-671)
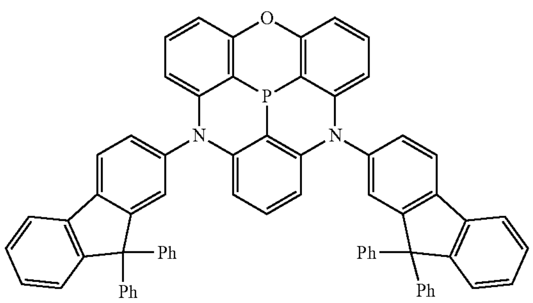
(1-672)
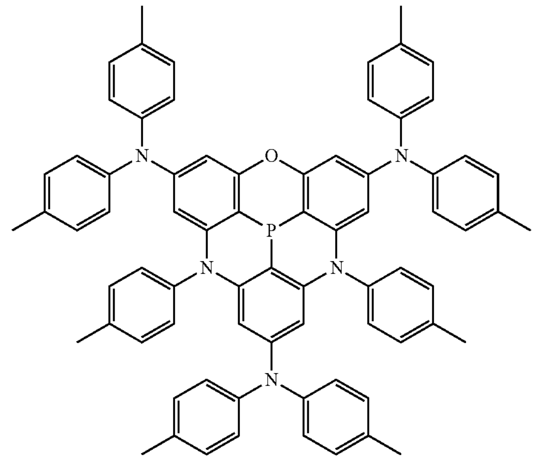
(1-673)
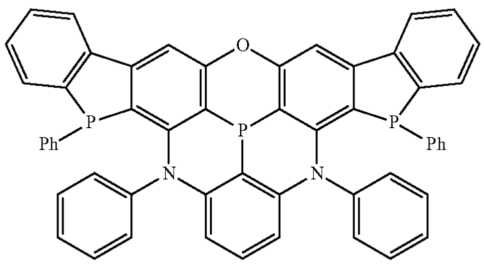
1-674)
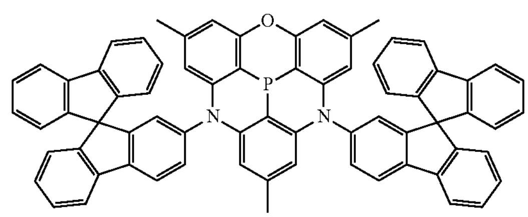
(1-675)
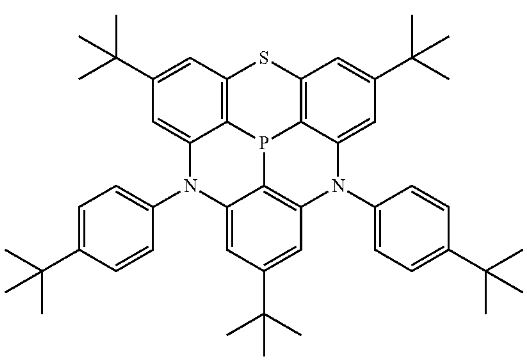
(1-681)
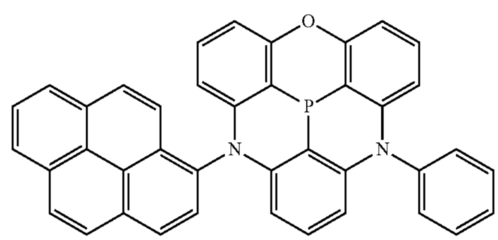
(1-682)
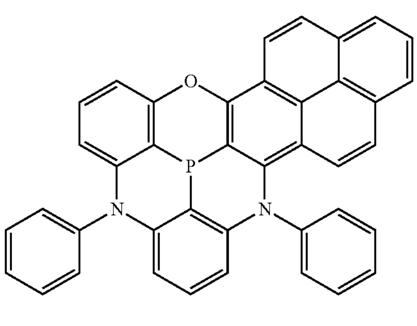
(1-683)
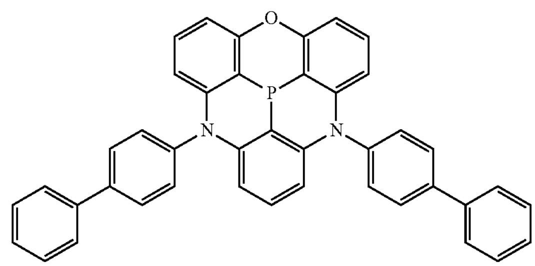

-continued
(1-684)
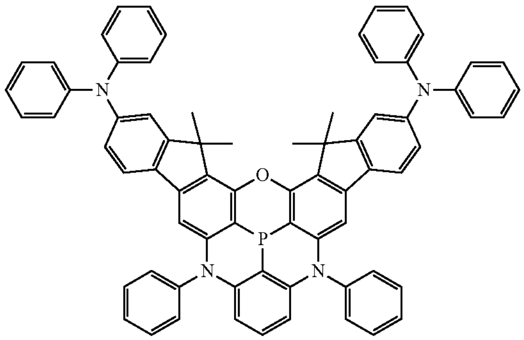
(1-685)
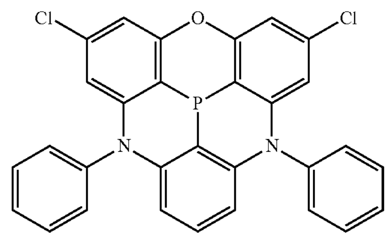
(1-686)
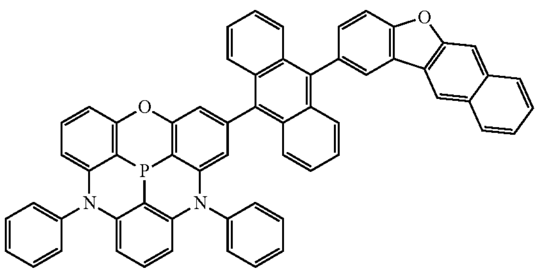
(1-687)
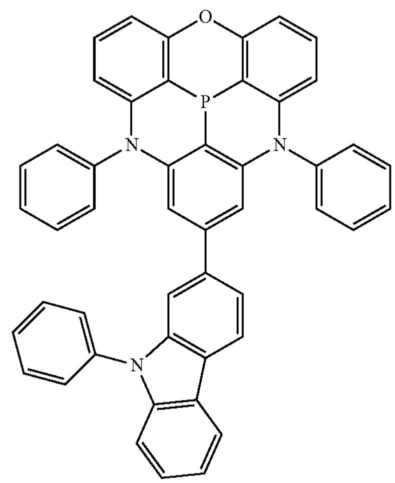
(1-688)
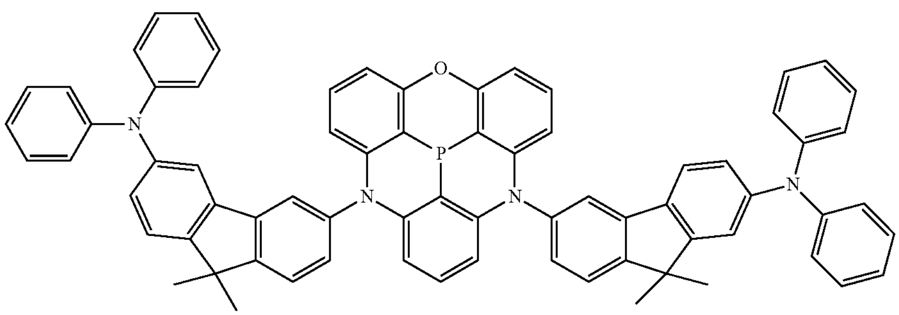
(1-689)
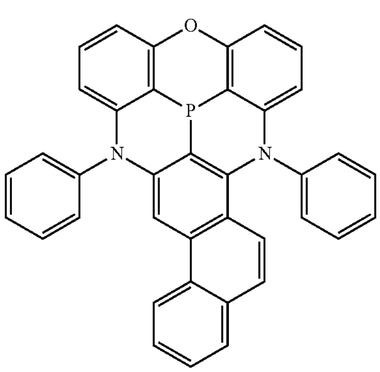
(1-690)
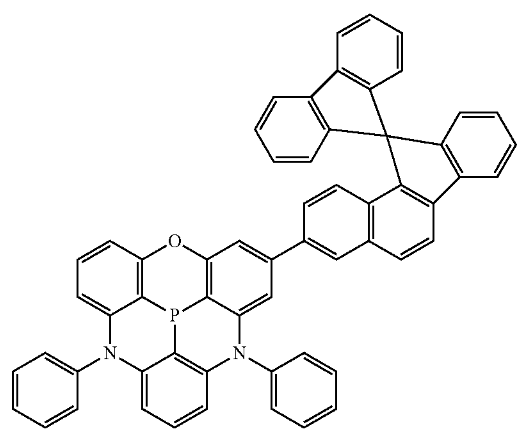

-continued
(1-691)
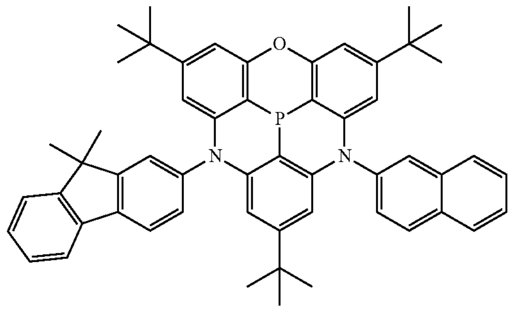
(1-692)
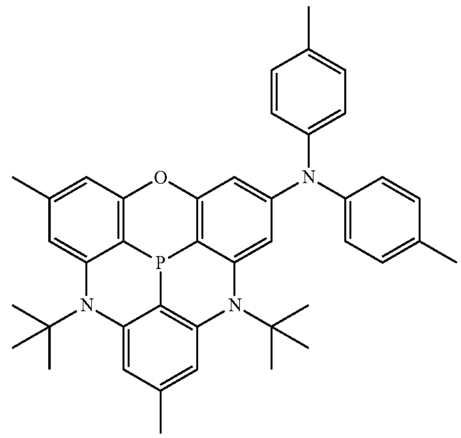
(1-693)
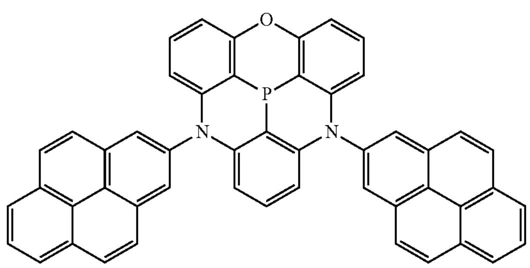
(1-694)
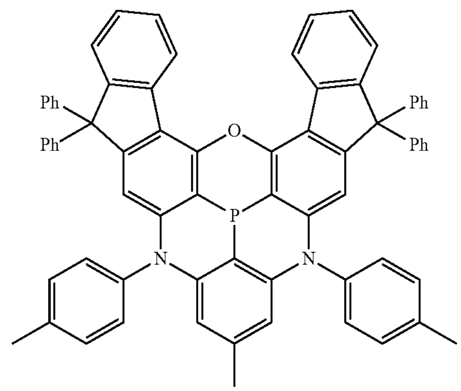
(1-695)
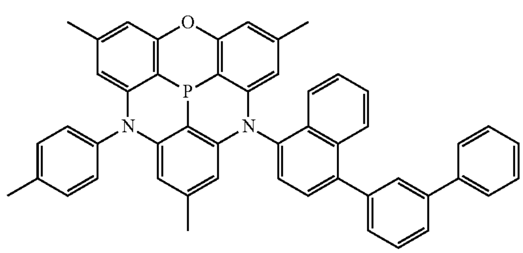
(1-701)
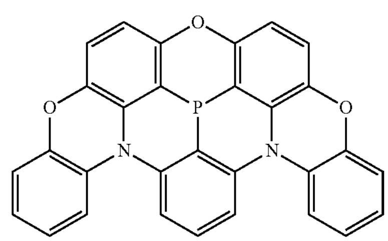
(1-702)
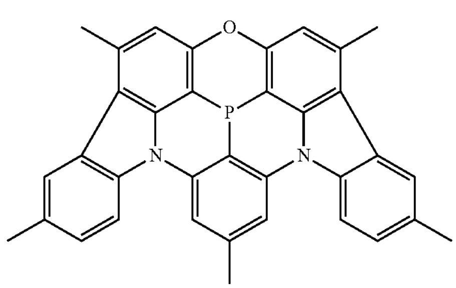
(1-703)
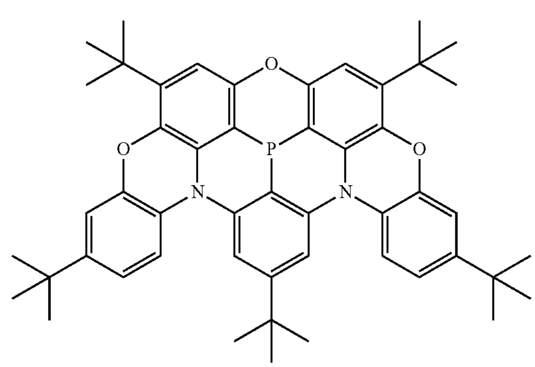

-continued
(1-704)
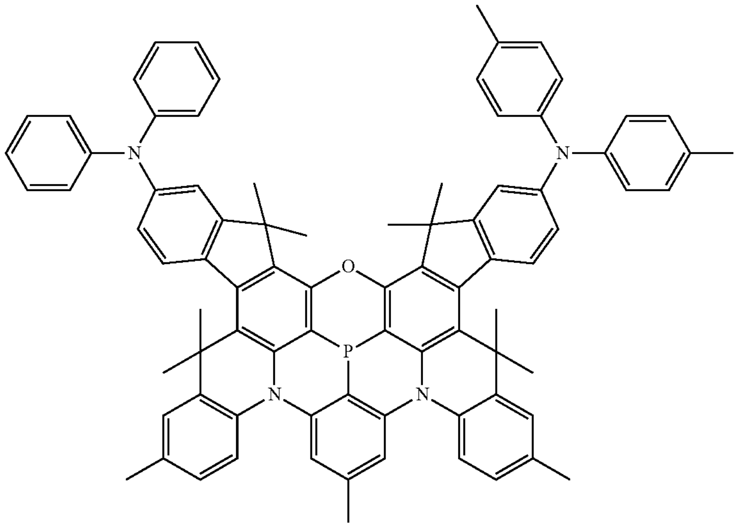
(1-705)
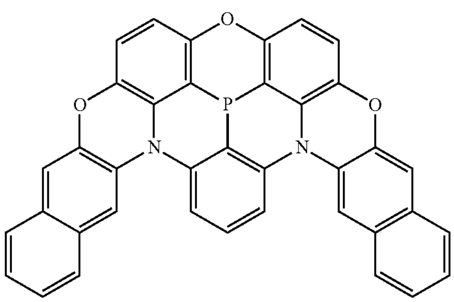
(1-706)
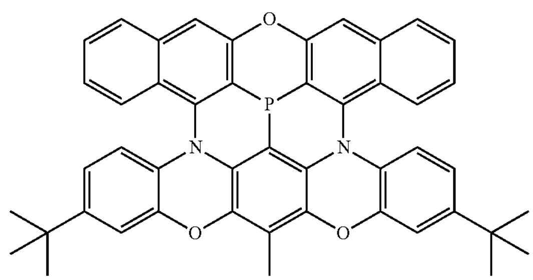
(1-707)
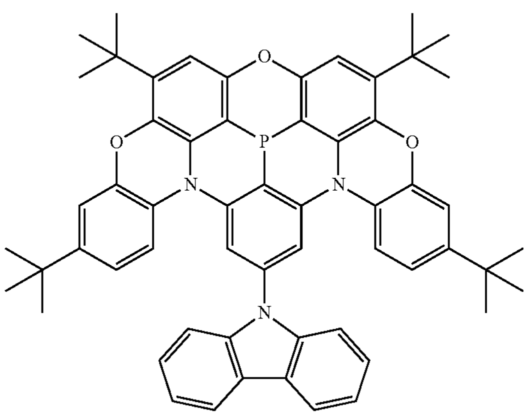
(1-708)
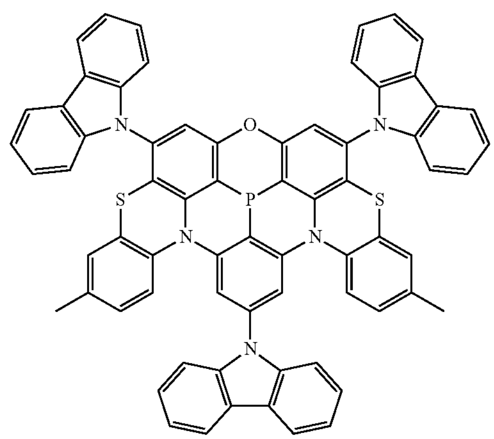

-continued
(1-709)
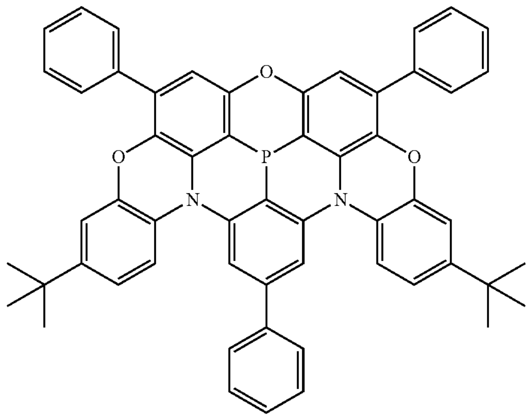
(1-710)
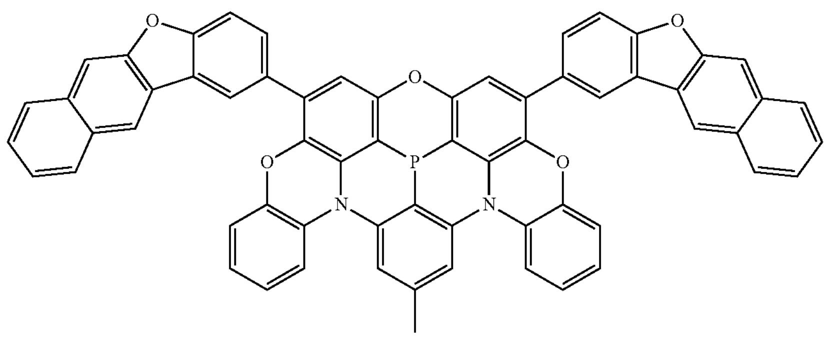
(1-711)
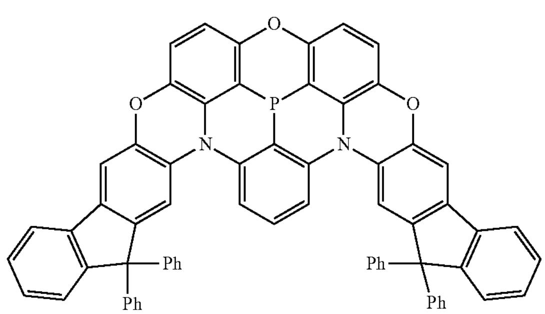
(1-712)
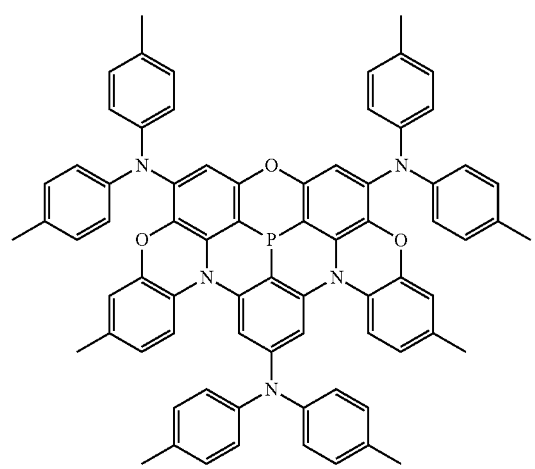
(1-713)
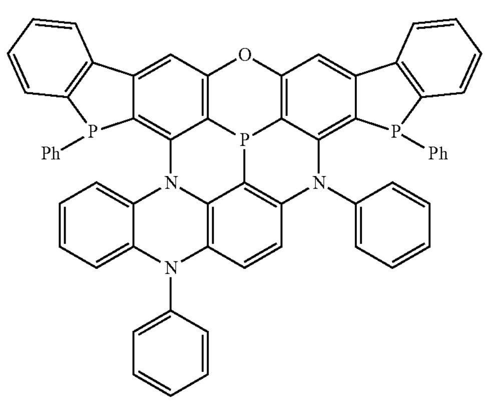
(1-714)
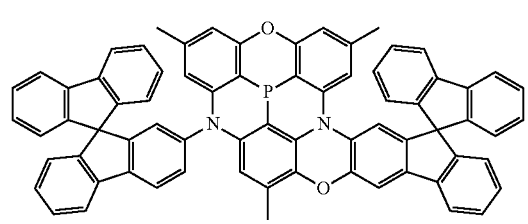

-continued
(1-715)
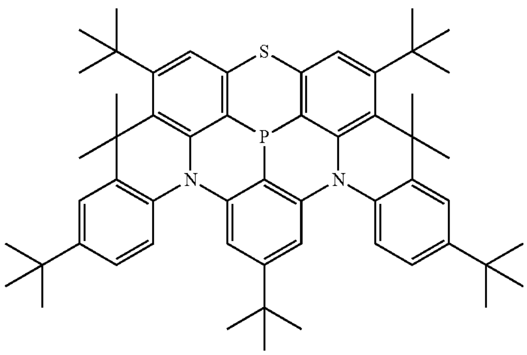
(1-721)
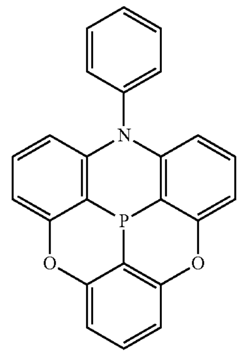
(1-722)
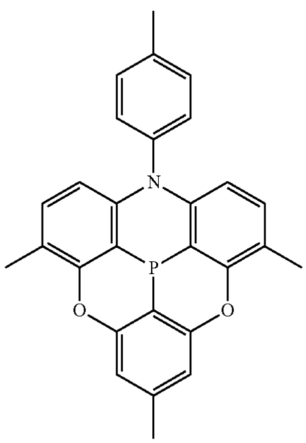
(1-723)
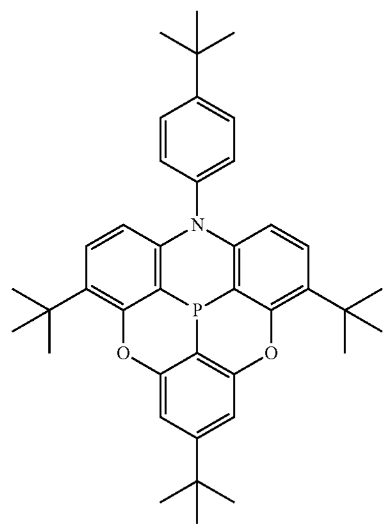
(1-724)
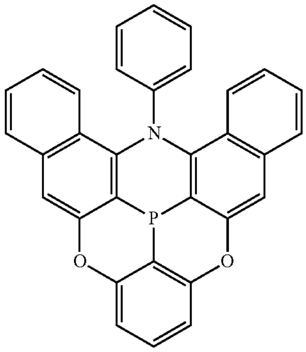
(1-725)
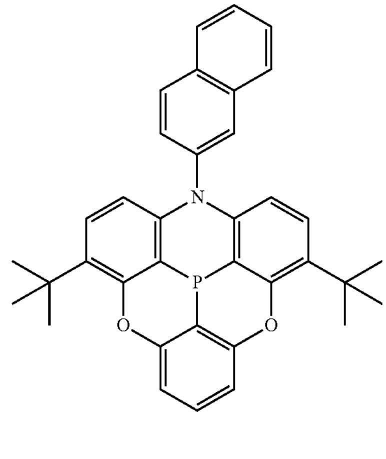

-continued
(1-726)
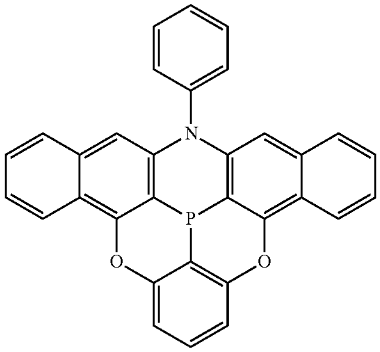
(1-727)
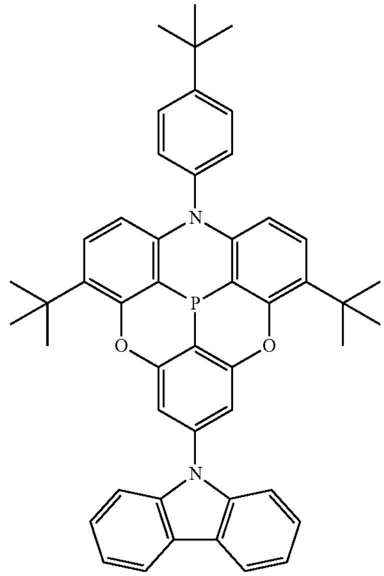
(1-728)
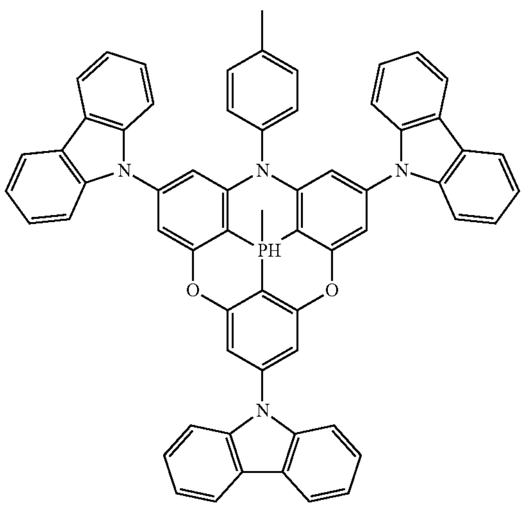
(1-729)
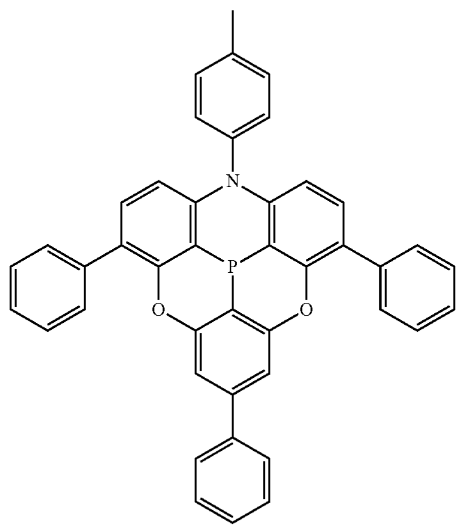
(1-730)
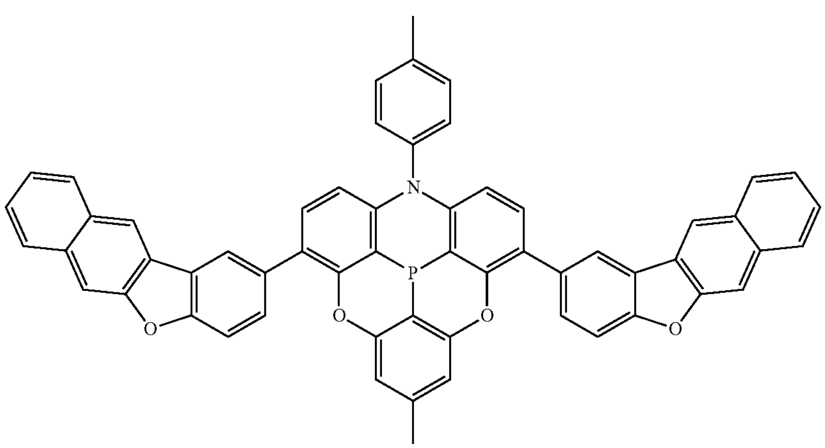

-continued
(1-731)
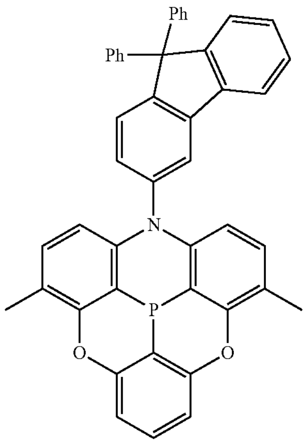
(1-732)
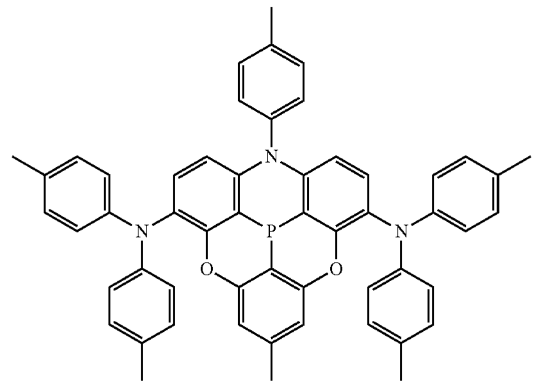
(1-733)
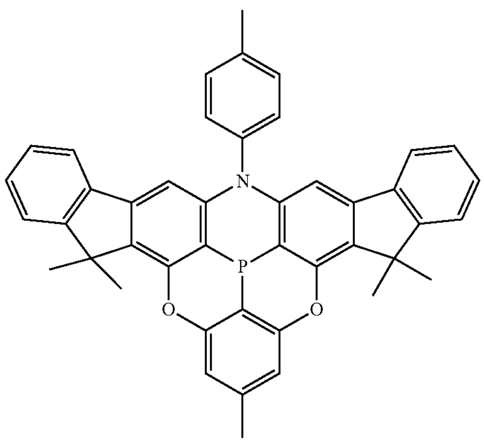
(1-734)
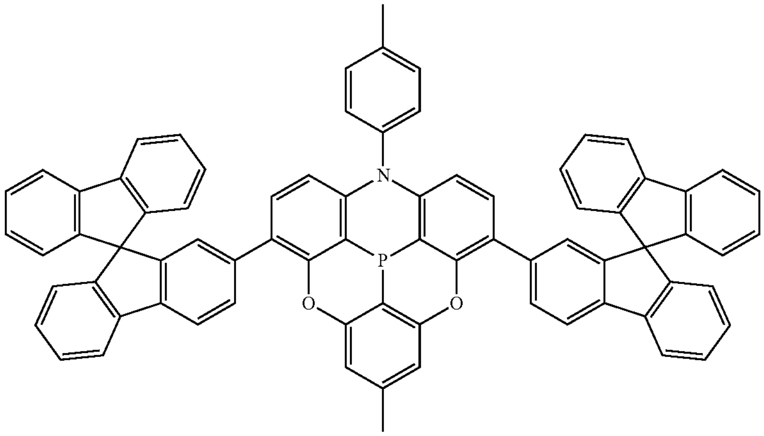

-continued
(1-735)
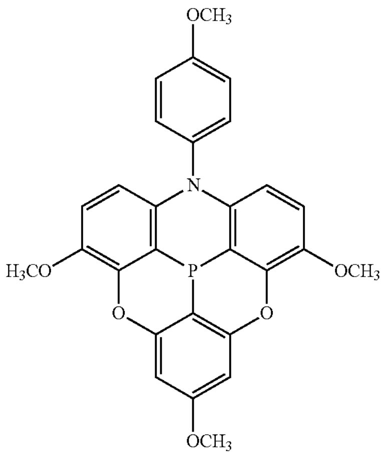
(1-741)
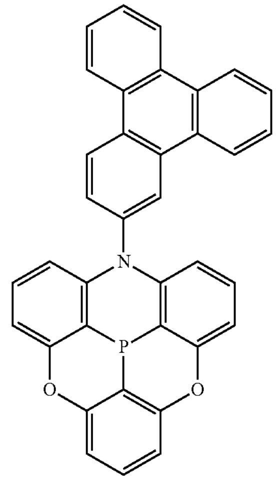
(1-742)
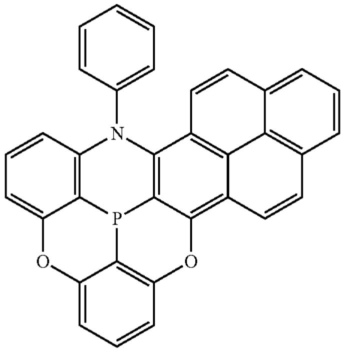
(1-743)
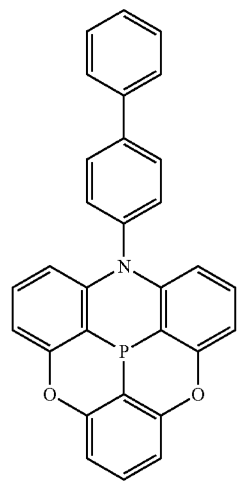
(1-744)
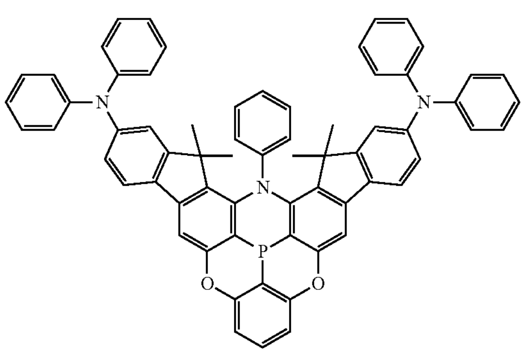
(1-745)
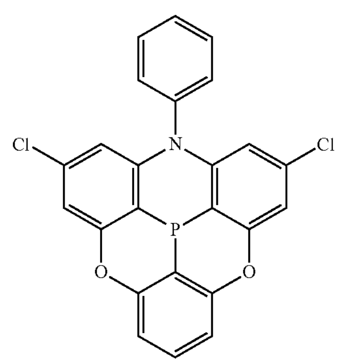

-continued
(1-746)
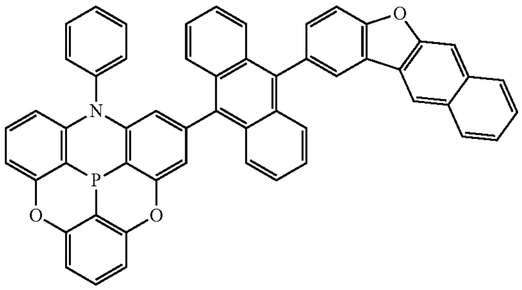
(1-747)
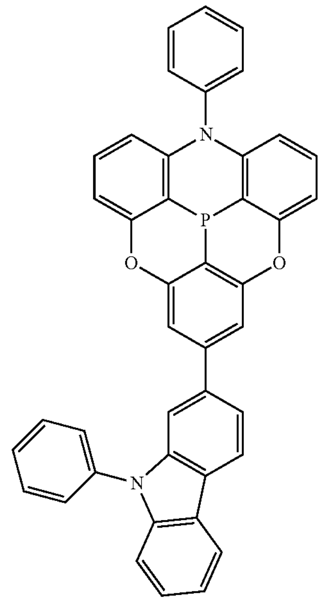
(1-748)
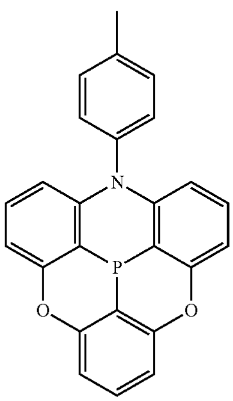
(1-749)
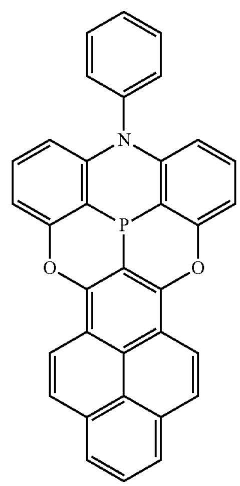
(1-750)
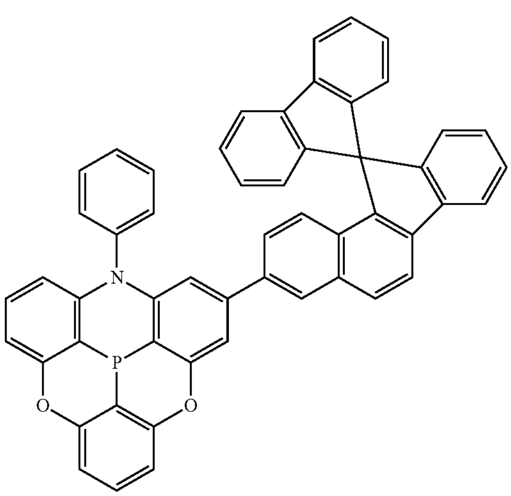
(1-751)
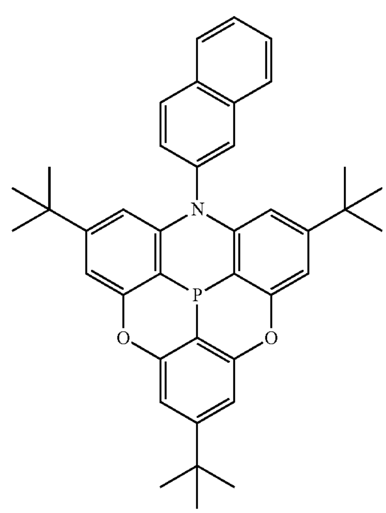

-continued
(1-752)
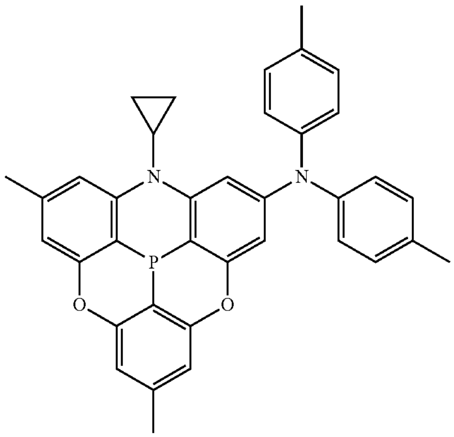
(1-753)
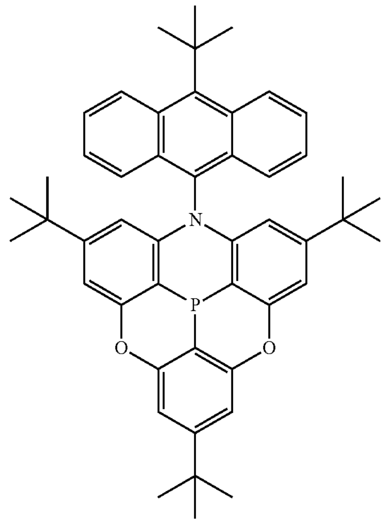
(1-754)
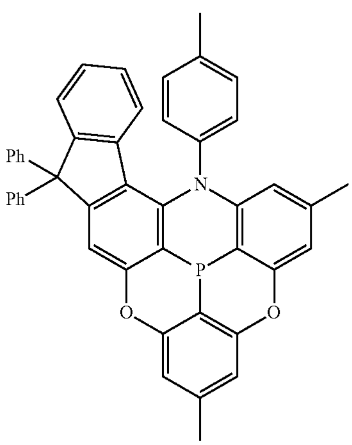
(1-755)
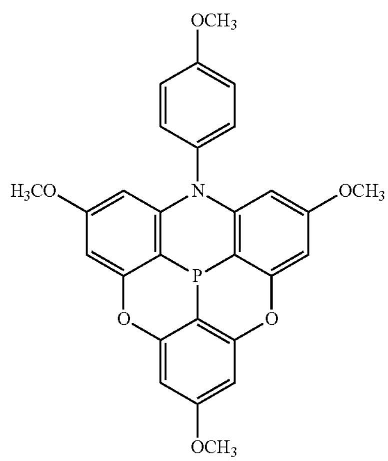
(1-761)
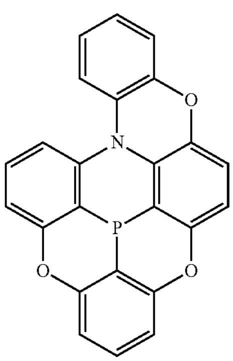
(1-762)
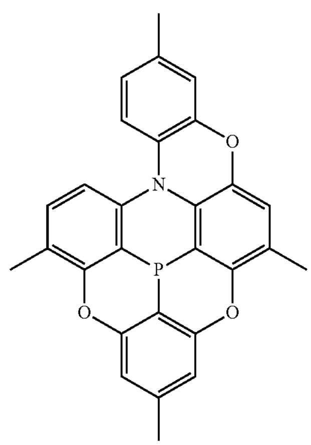

-continued
(1-763)
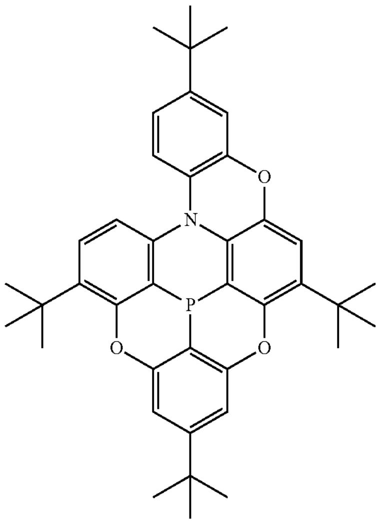
(1-764)
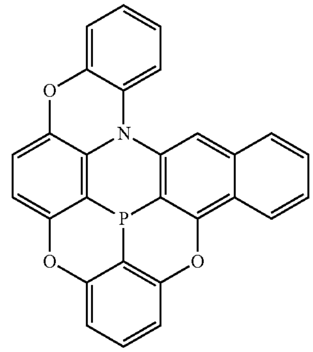
(1-765)
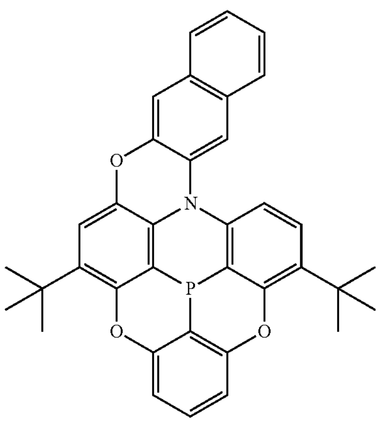
(1-766)
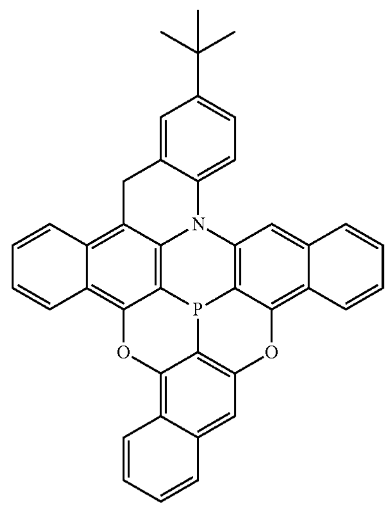
(1-767)
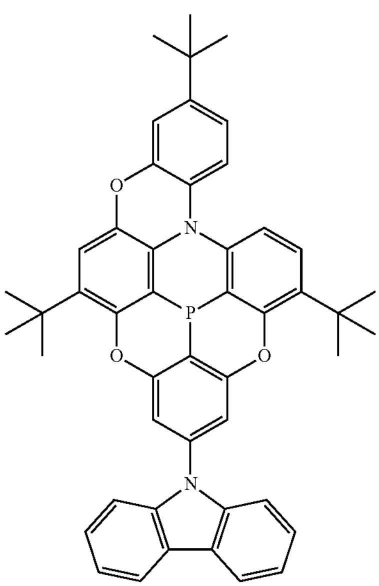
(1-768)
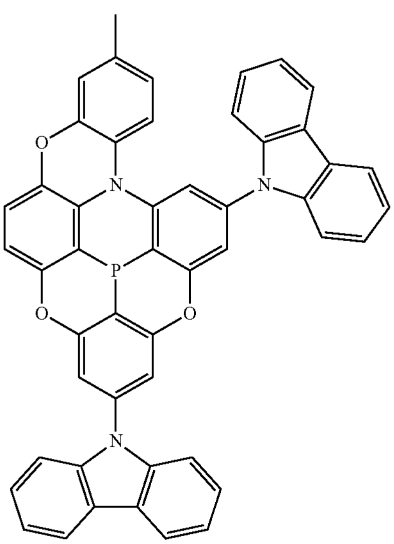

-continued
(1-769)
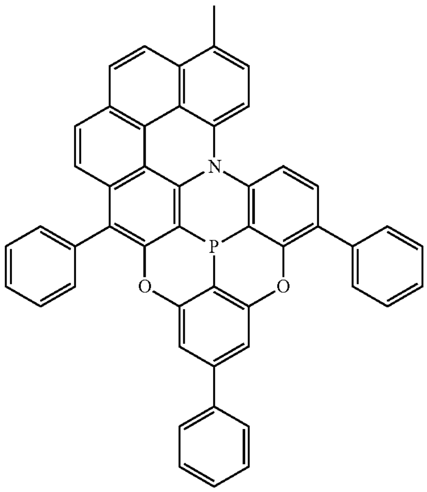
(1-770)
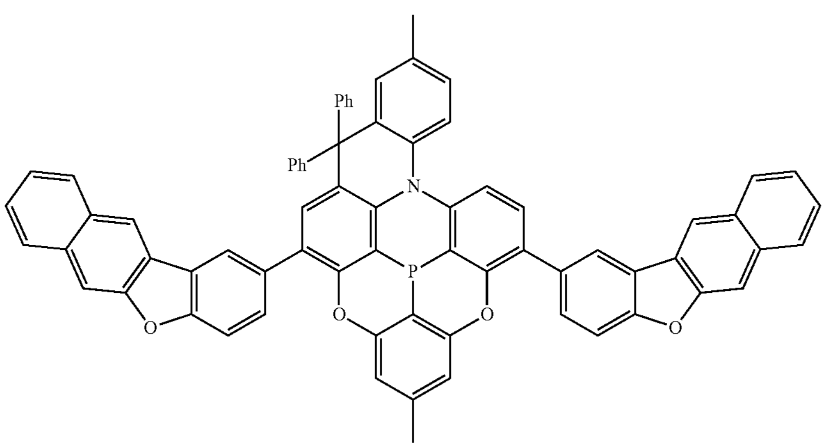
(1-771)
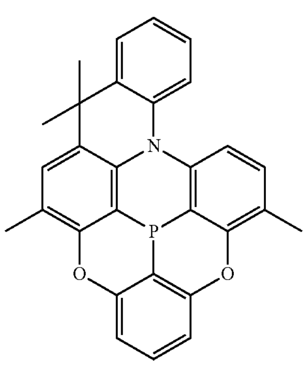
(1-772)
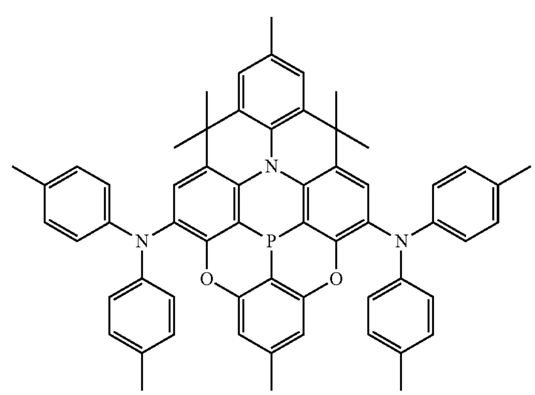

-continued
(1-773)
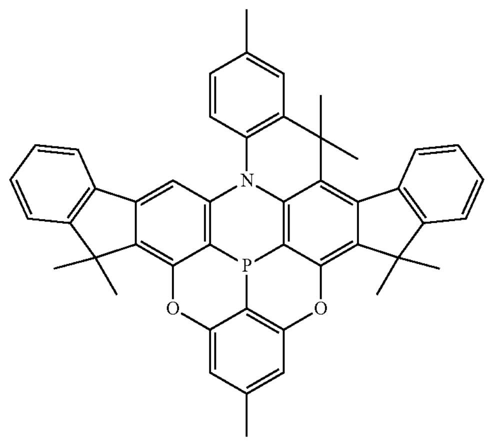
(1-774)
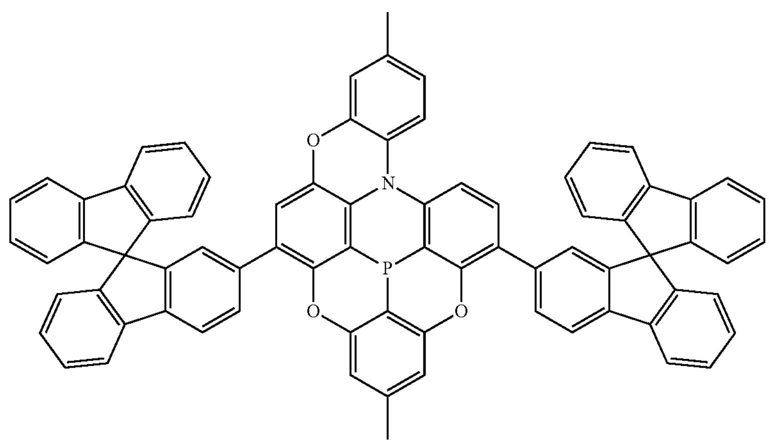
(1-775)
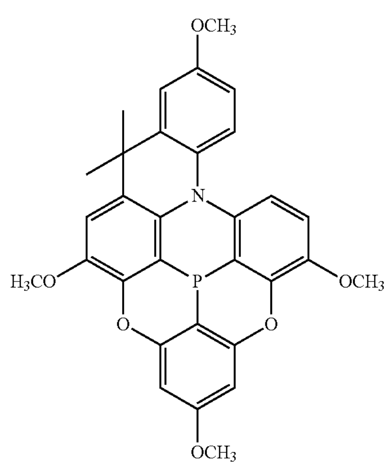
(1-781)
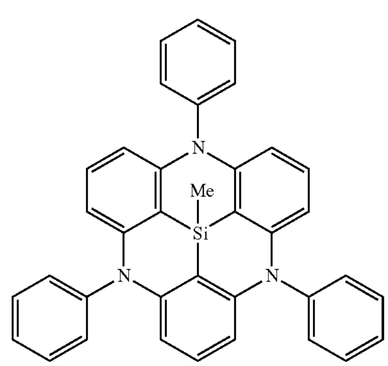

-continued
(1-782)
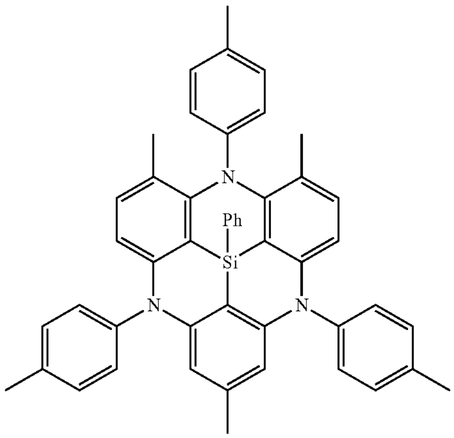
(1-783)
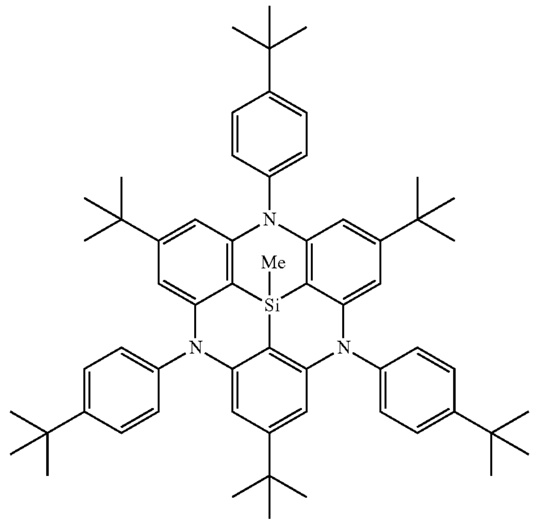
(1-784)
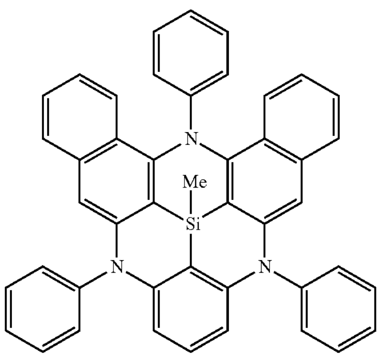
(1-785)
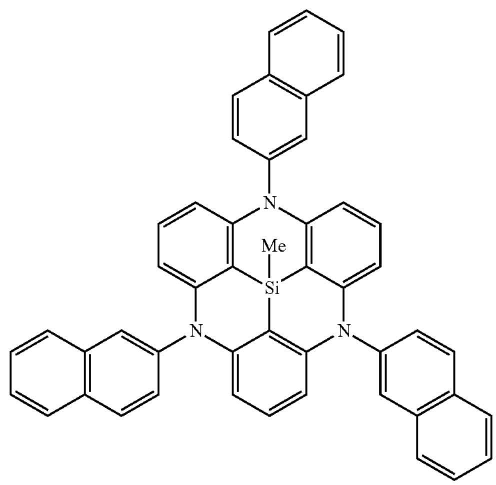
(1-786)
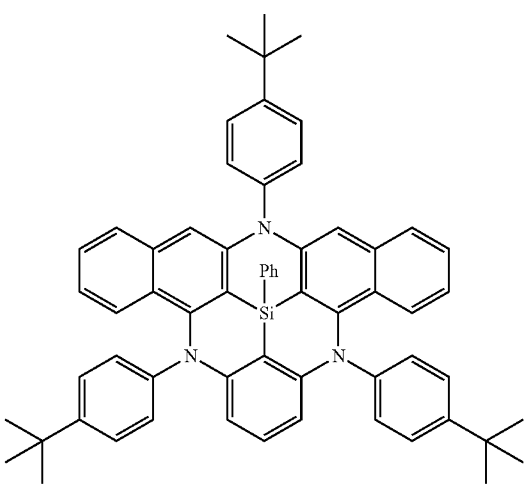
(1-787)
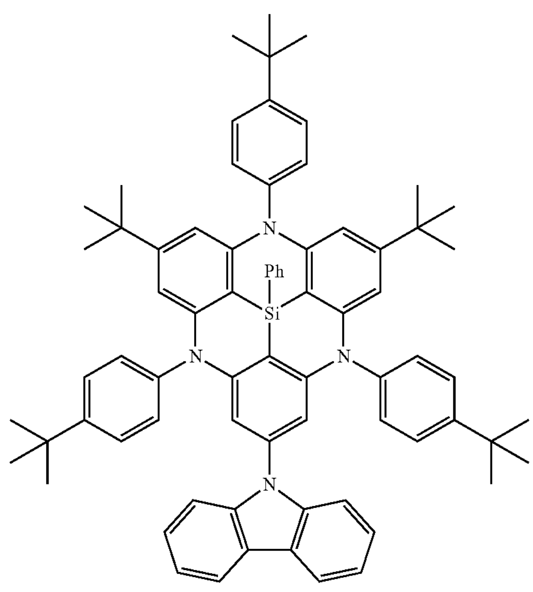

-continued
(1-788)
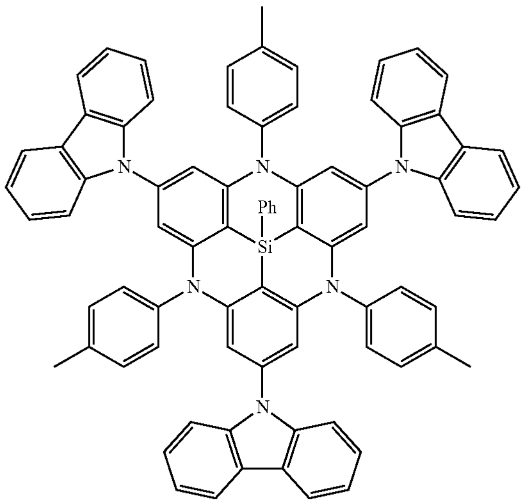
(1-789)
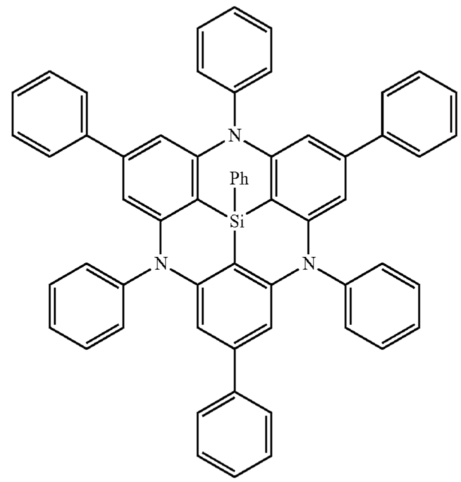
(1-790)
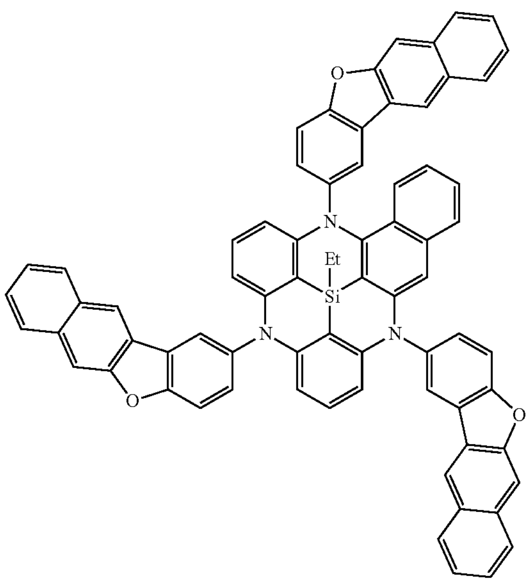
(1-791)
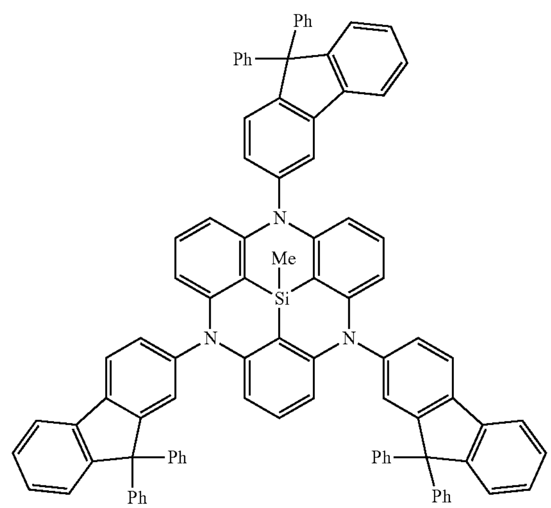
(1-792)
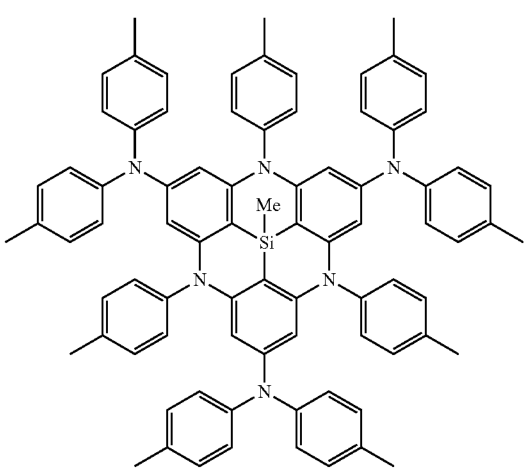
(1-793)
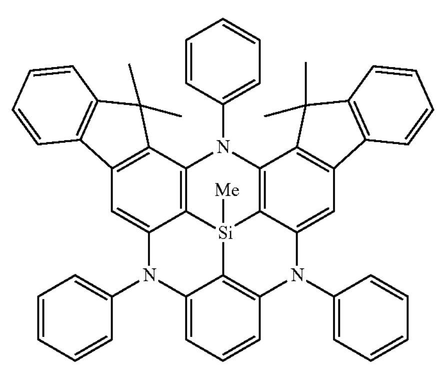

-continued
(1-794)
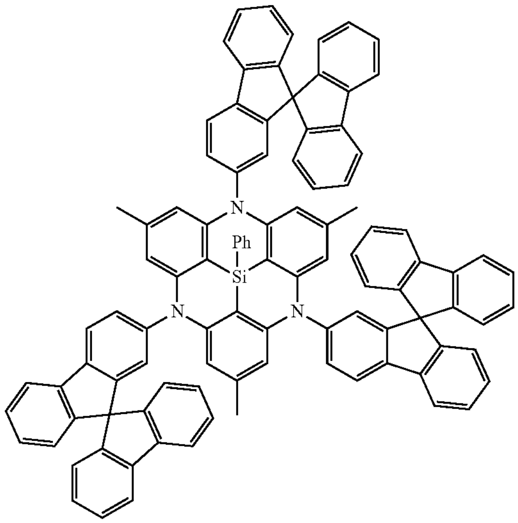
(1-795)
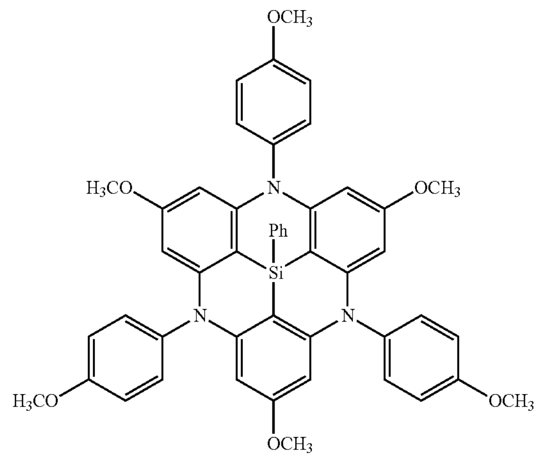
(1-801)
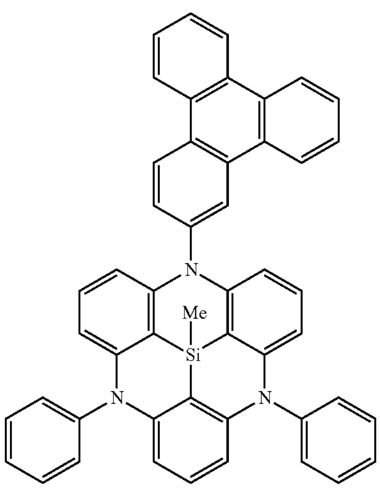
(1-802)
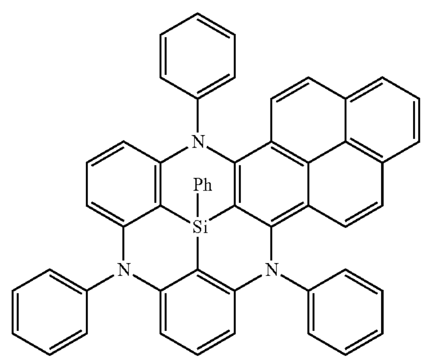
(1-803)
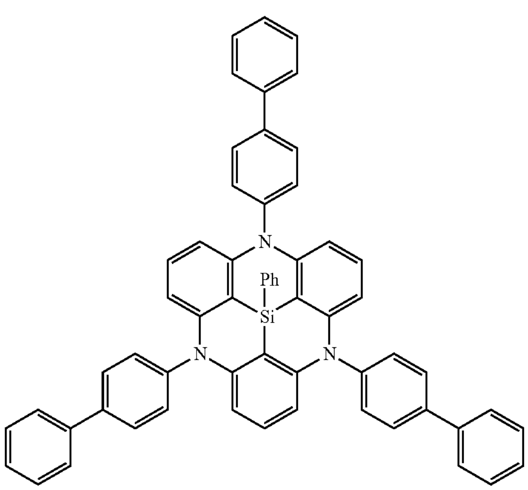
(1-804)
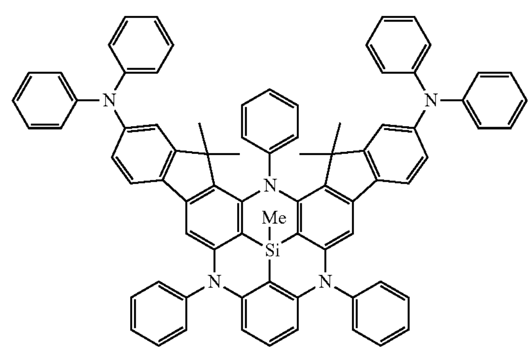

-continued
(1-805)
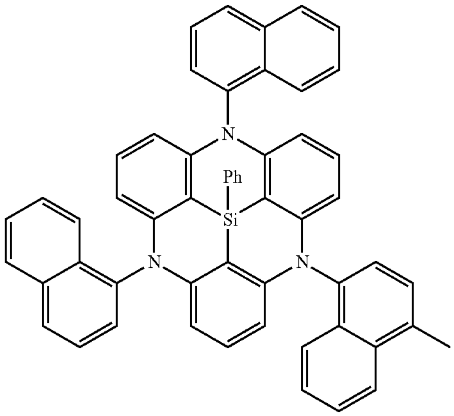
(1-806)
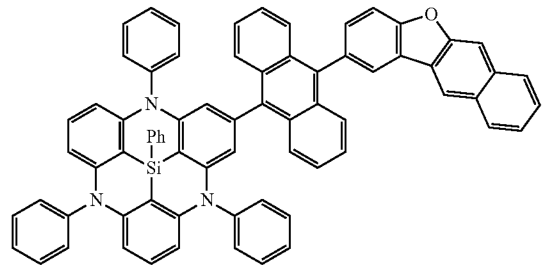
(1-807)
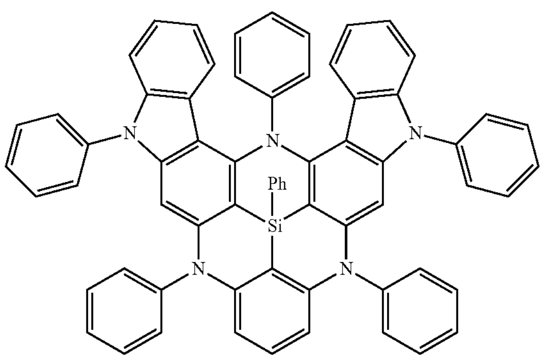
(1-808)
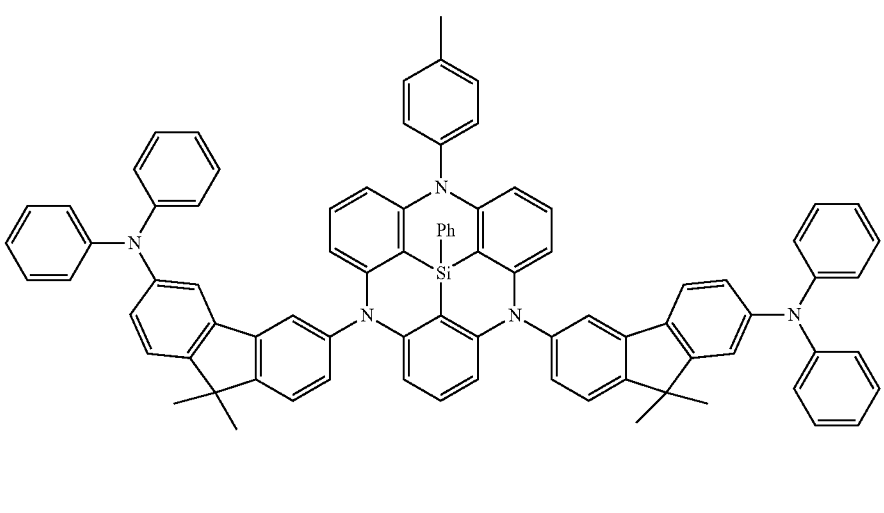

-continued
(1-809)
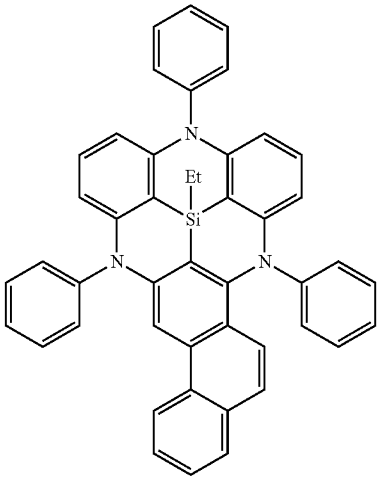
(1-810)
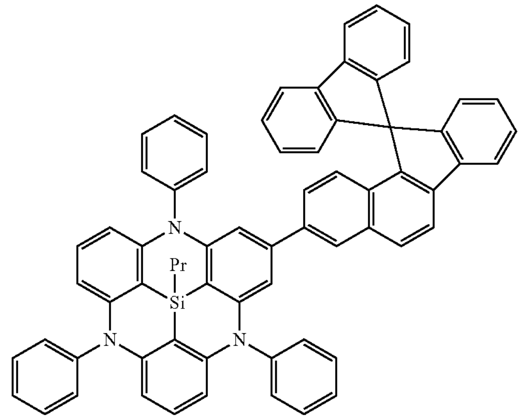
(1-811)
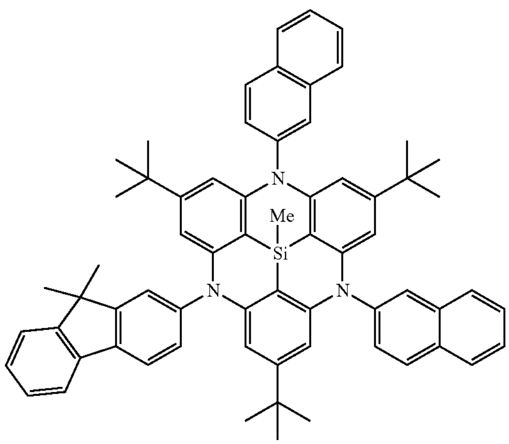
(1-812)
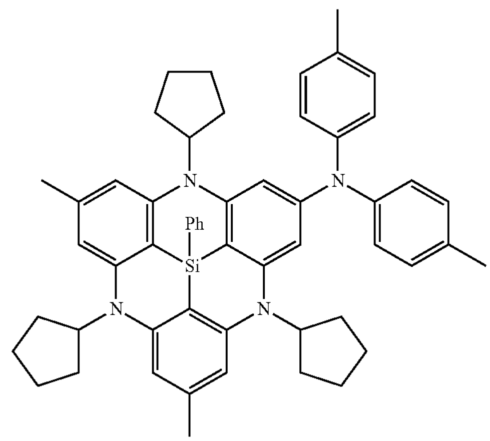
(1-813)
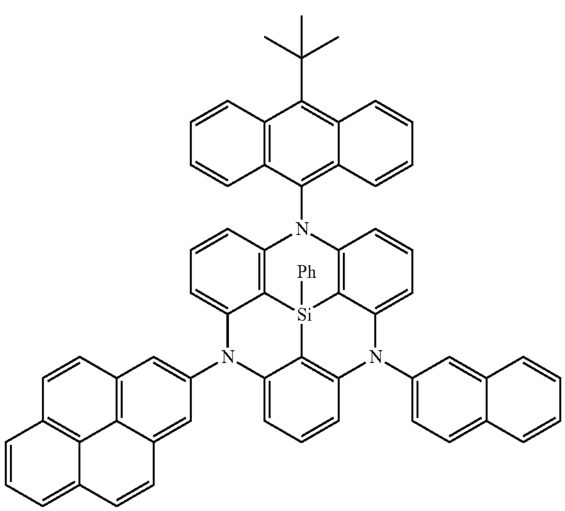
(1-814)
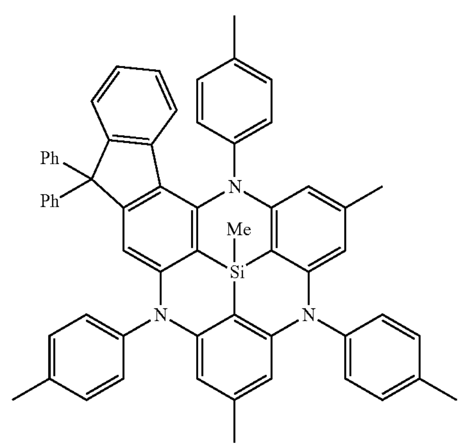

-continued
(1-815)
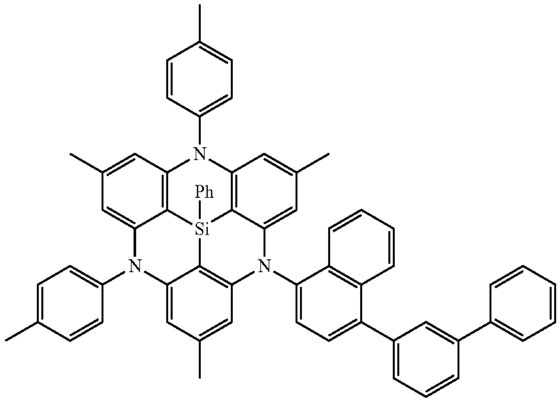
(1-821)
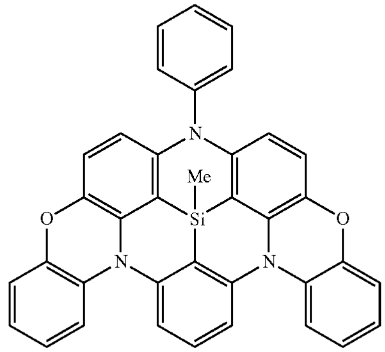
(1-822)
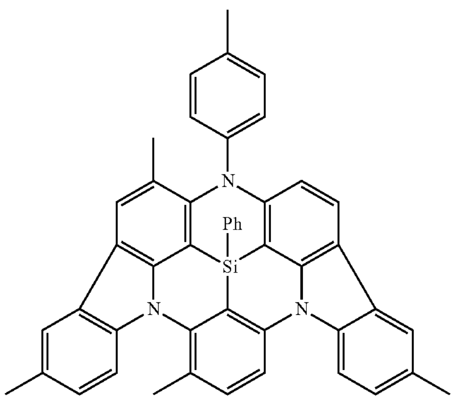
(1-823)
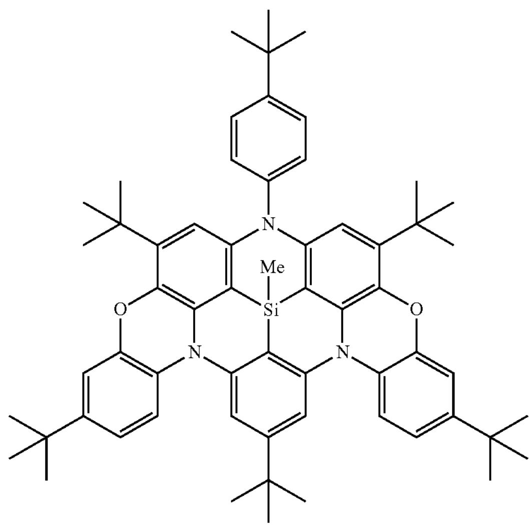
(1-824)
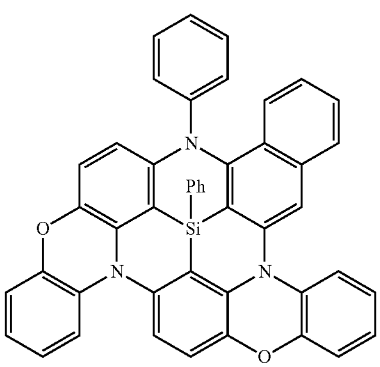
(1-825)
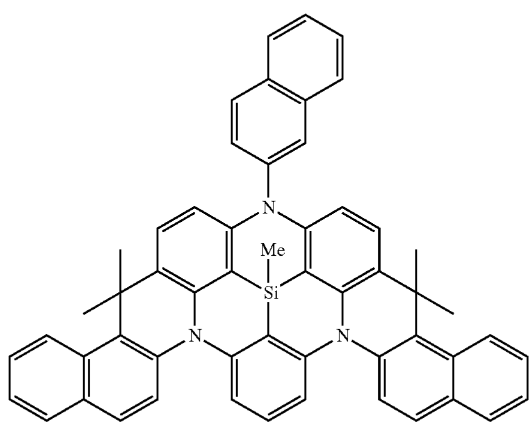

-continued
(1-826)
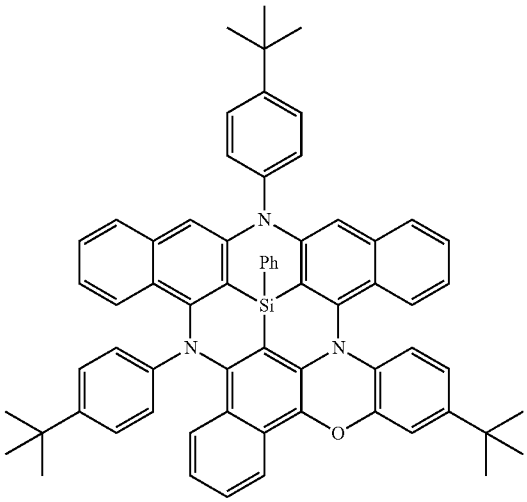
(1-827)
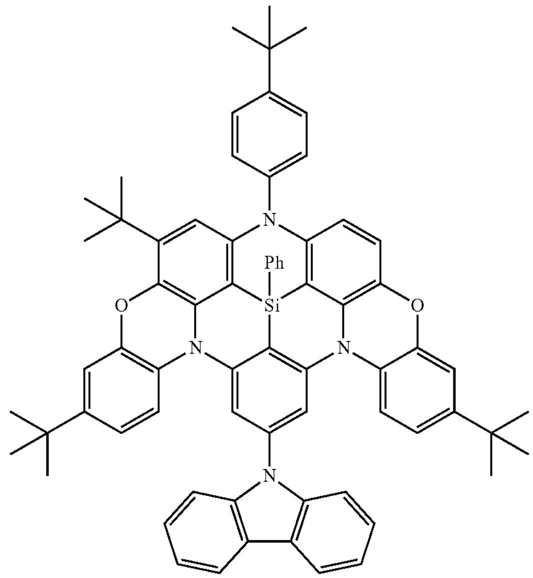
(1-828)
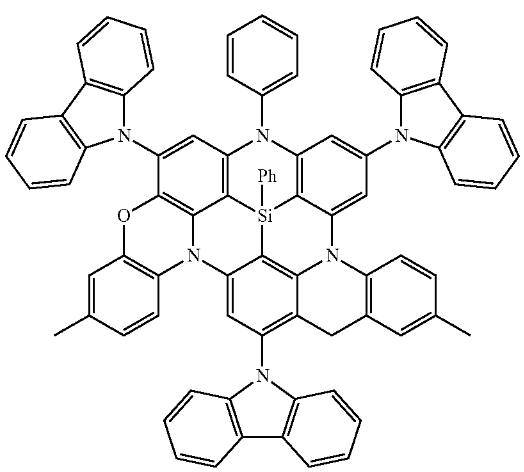
(1-829)
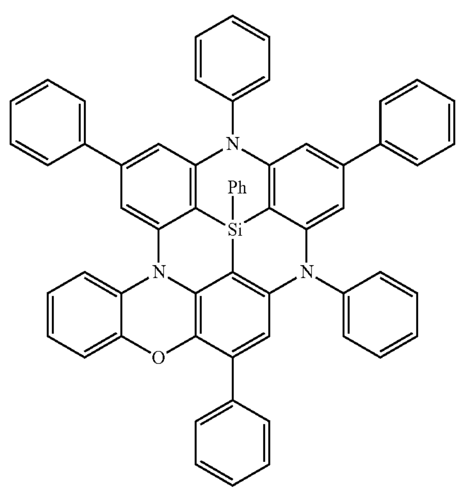

-continued
(1-830)
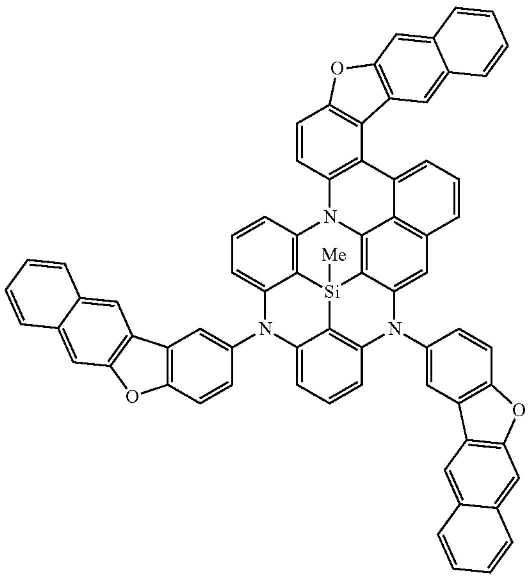
(1-831)
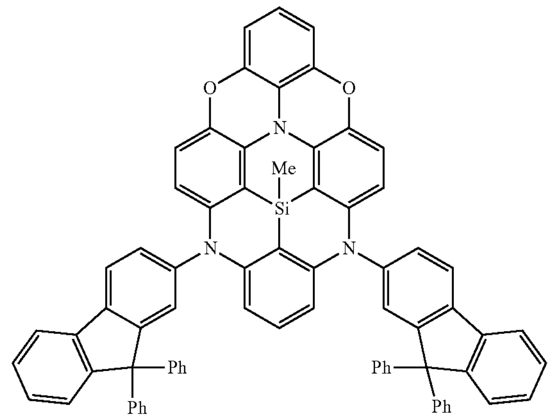
(1-832)
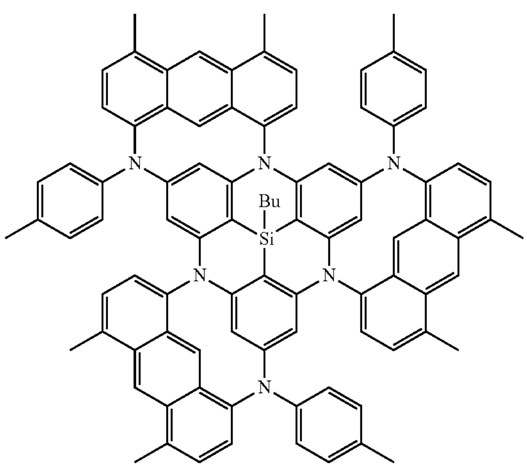
(1-833)
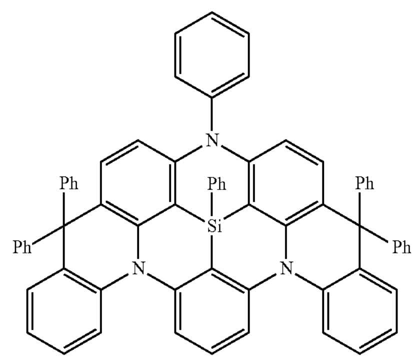
(1-834)
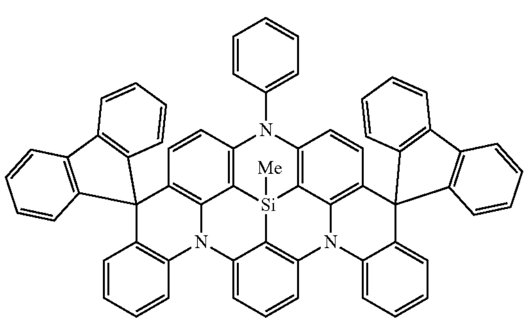
(1-835)
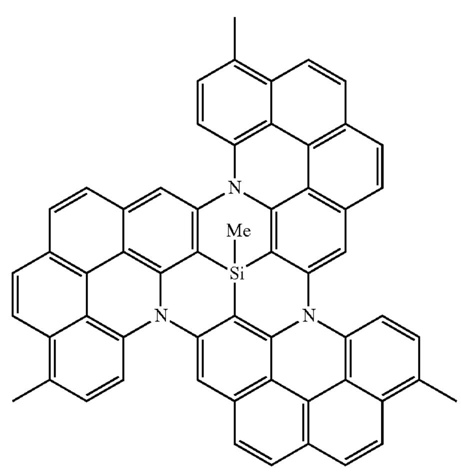

(1-841)
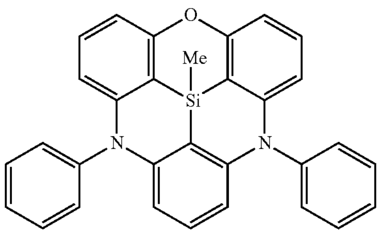
(1-842)
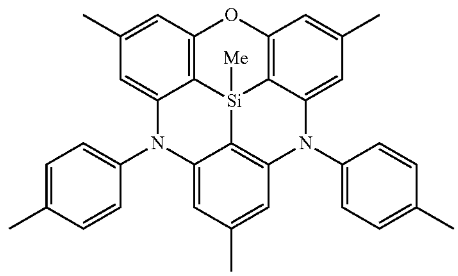
(1-843)
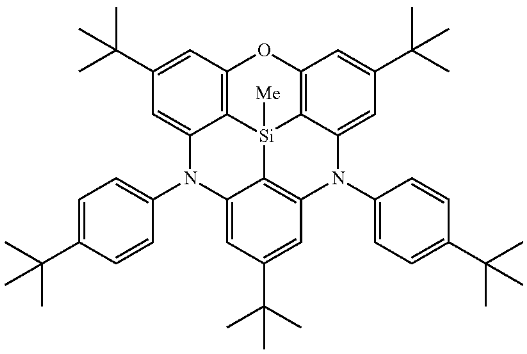
(1-844)
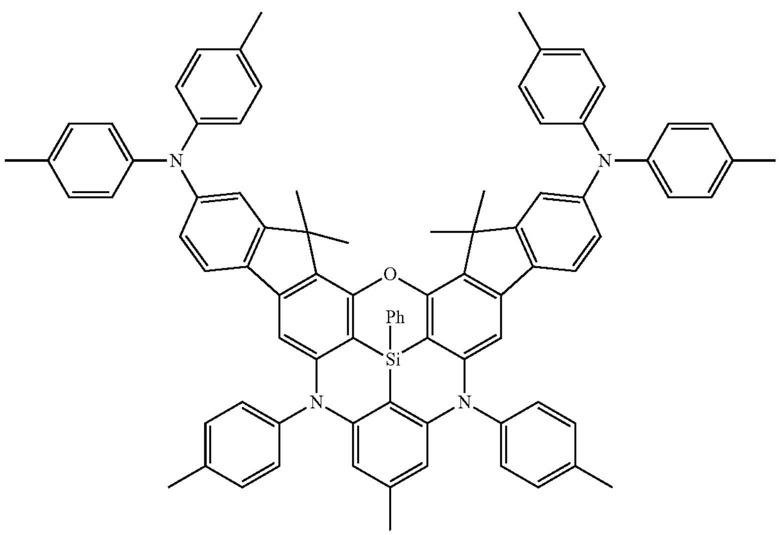
(1-845)
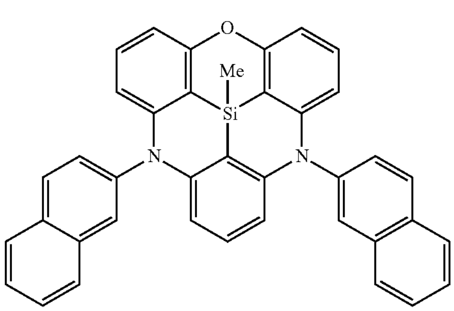
(1-846)
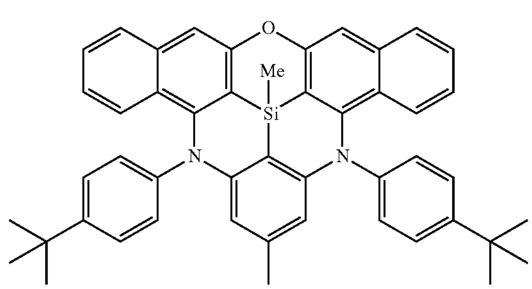

-continued
(1-847)
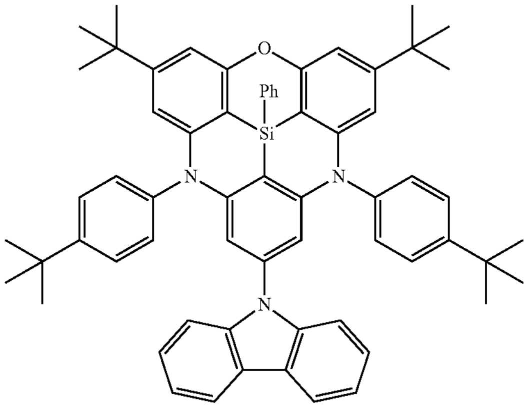
(1-848)
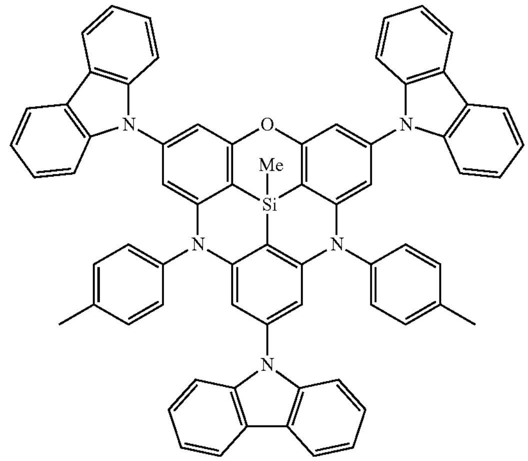
(1-849)
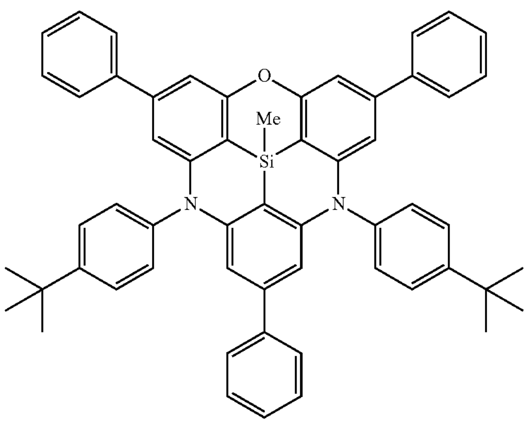
(1-850)
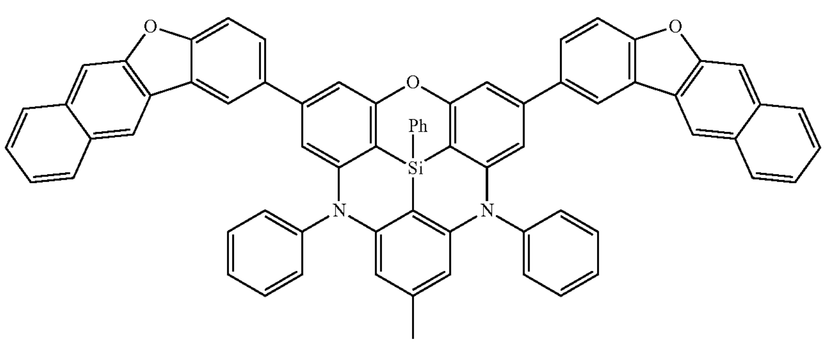

-continued
(1-851)
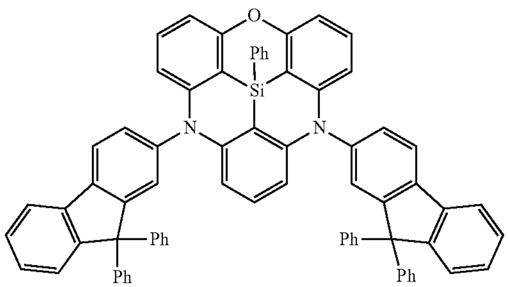
(1-852)
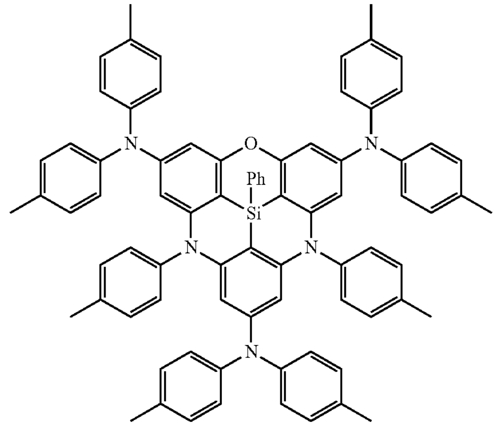
(1-853)
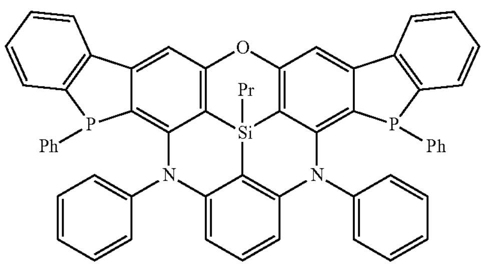
(1-854)
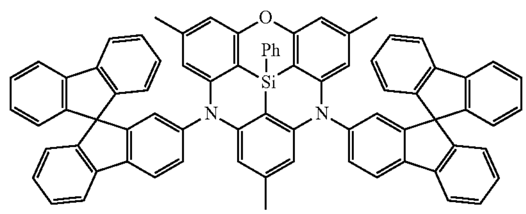
(1-855)
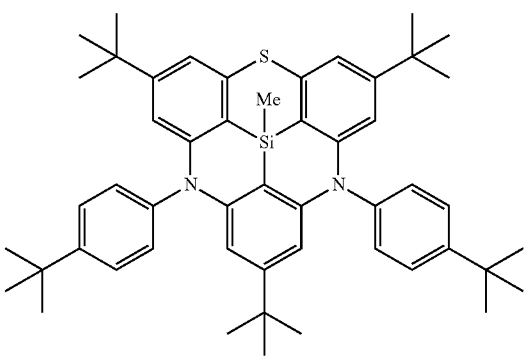
(1-861)
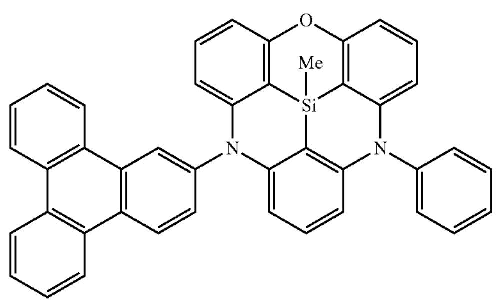
(1-862)
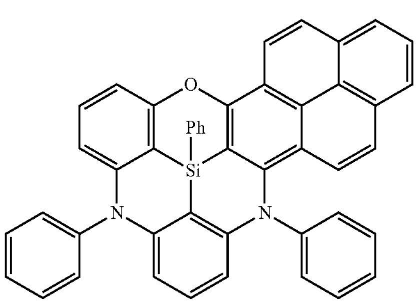
(1-863)
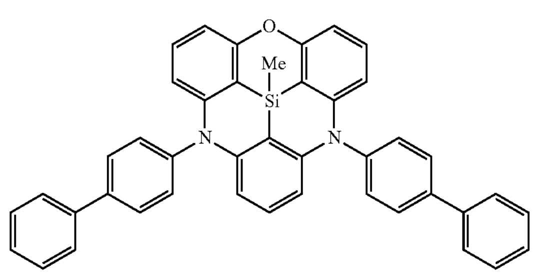

-continued
(1-864)
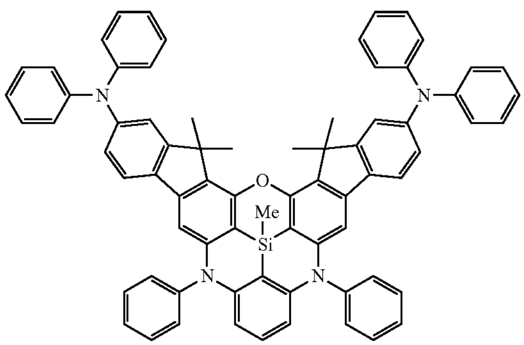
(1-865)
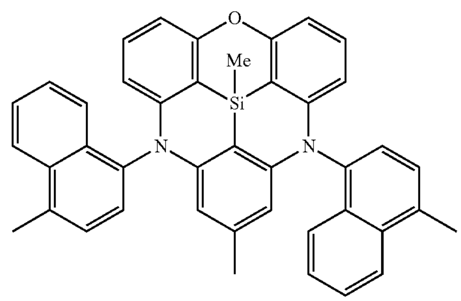
(1-866)
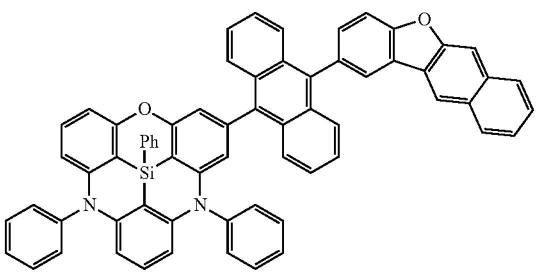
(1-867)
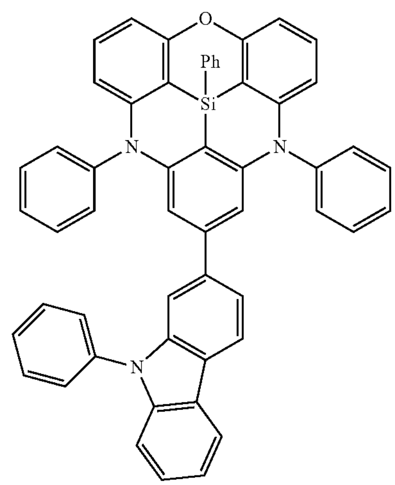
(1-868)
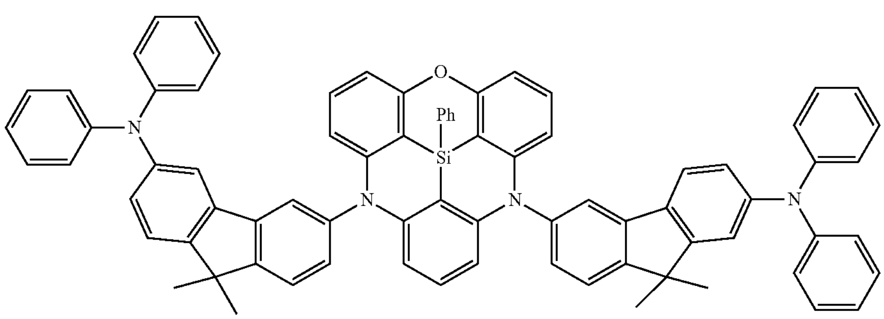
(1-869)
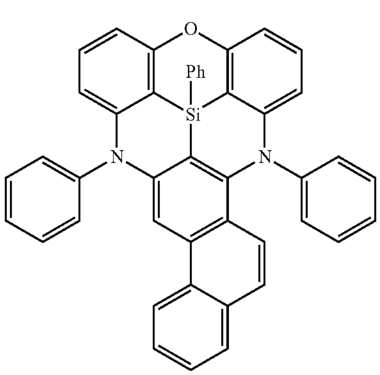
(1-870)
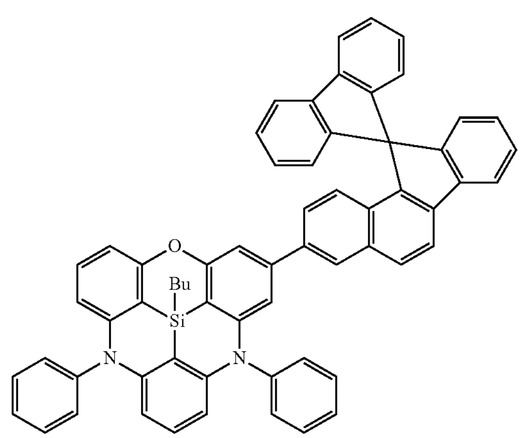

-continued
(1-871)
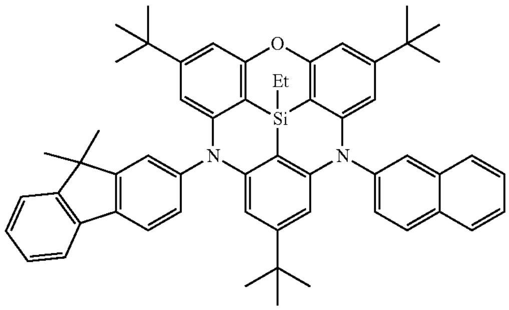
(1-872)
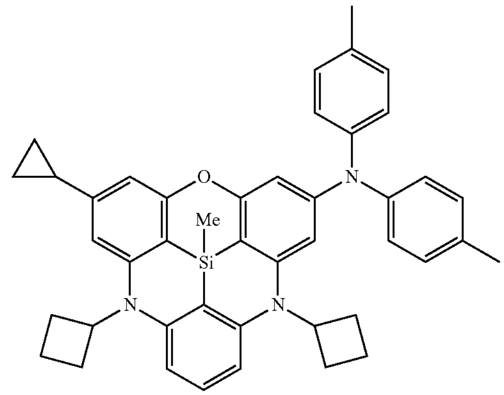
(1-873)
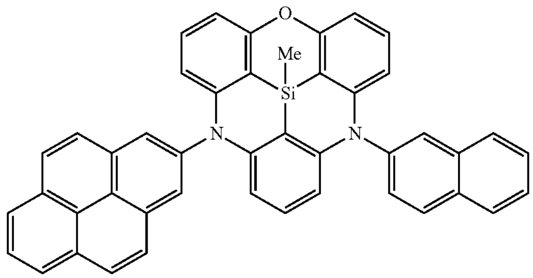
(1-874)
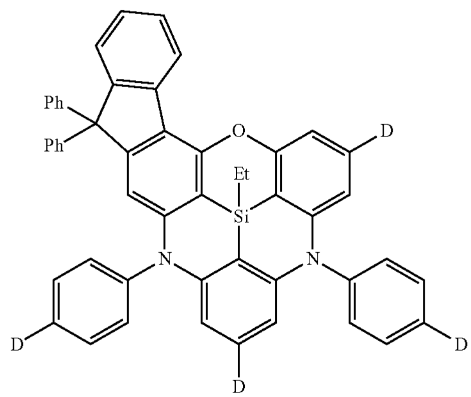
(1-875)
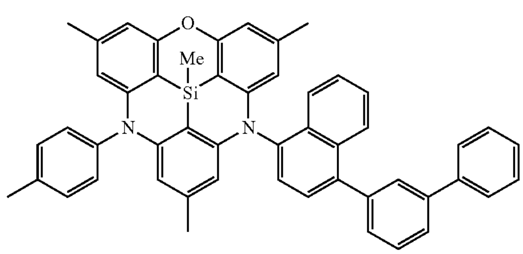
(1-881)
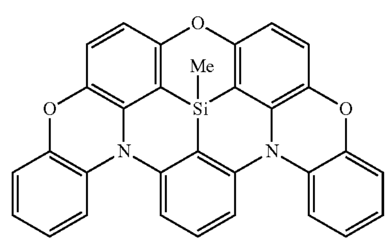
(1-882)
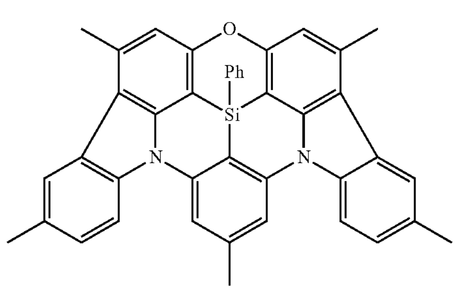
(1-883)
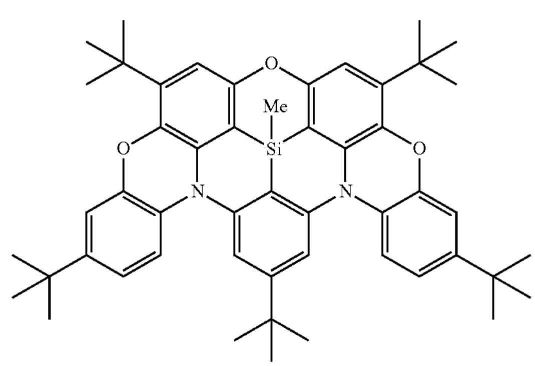

-continued
(1-884)
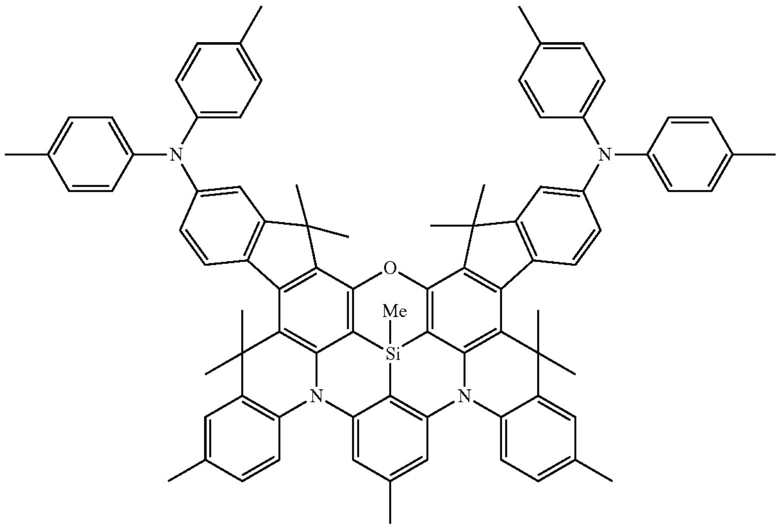
(1-885)
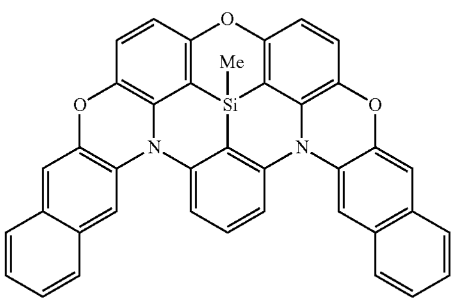
(1-886)
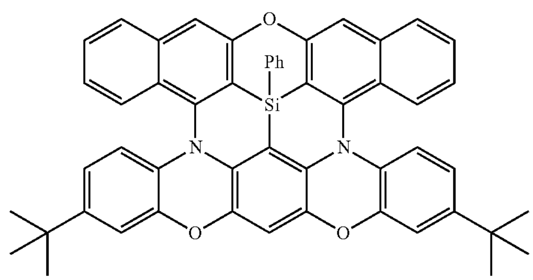
(1-887)
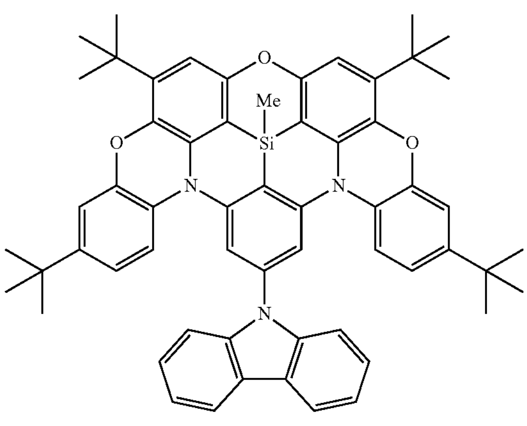
(1-888)
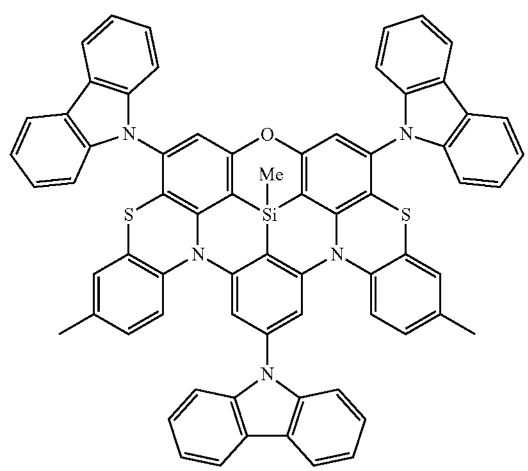

-continued
(1-889)
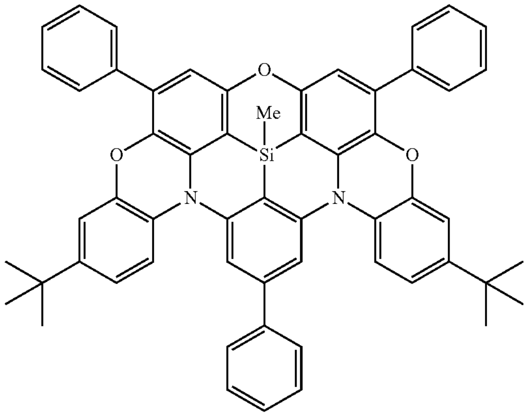
(1-890)
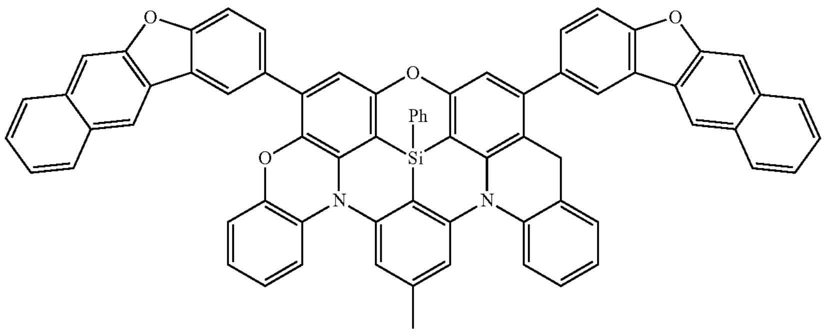
(1-891)
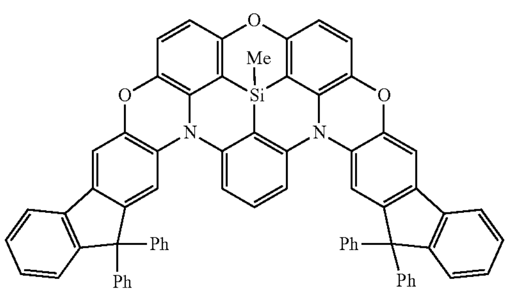
(1-892)
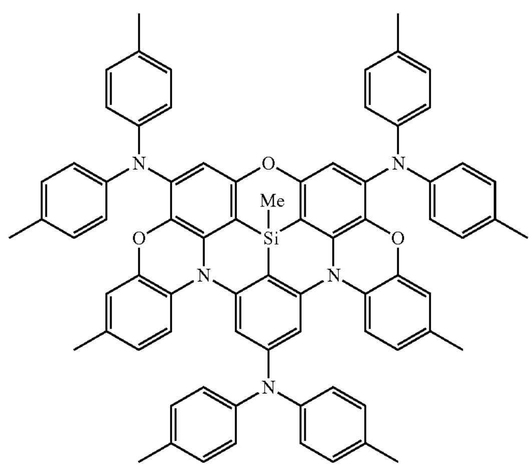
(1-893)
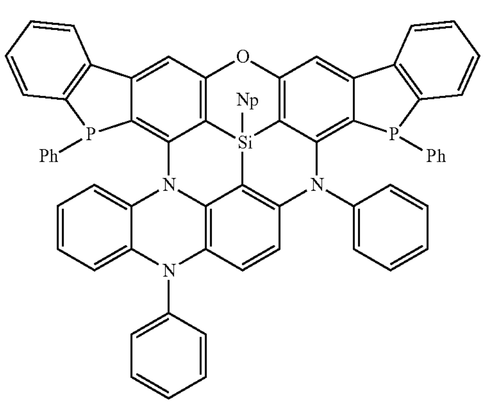
(1-894)
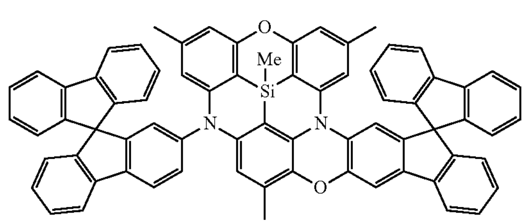

-continued
(1-895)
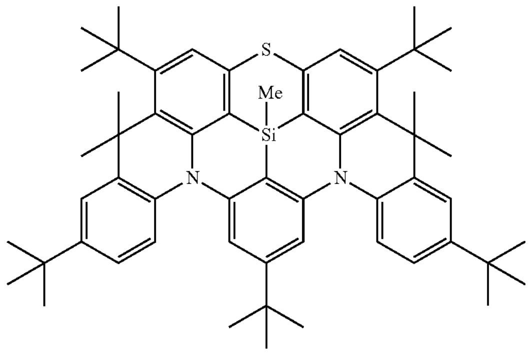
(1-901)
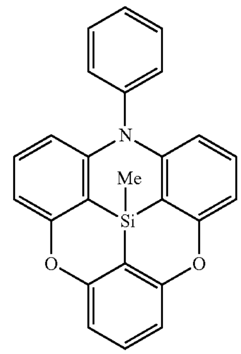
(1-902)
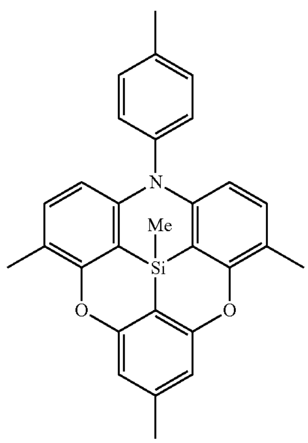
(1-903)
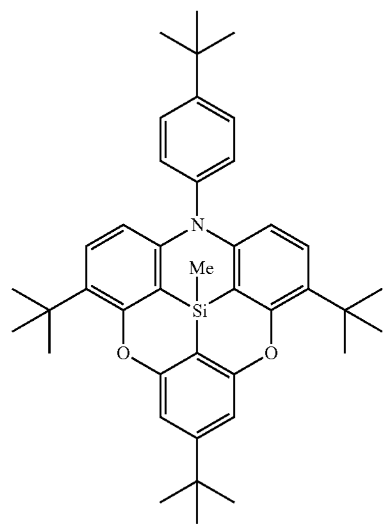
(1-904)
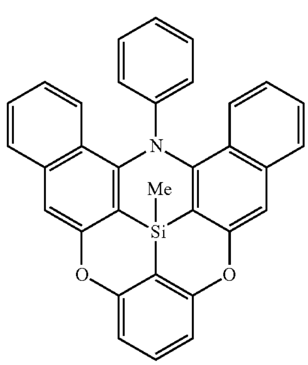
(1-905)
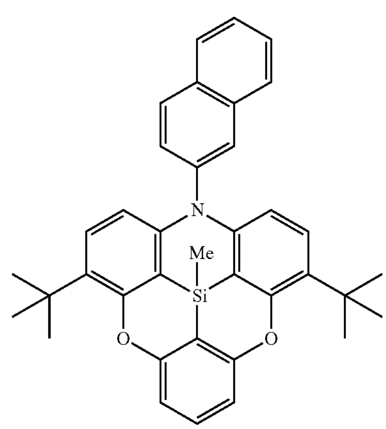

-continued
(1-906)
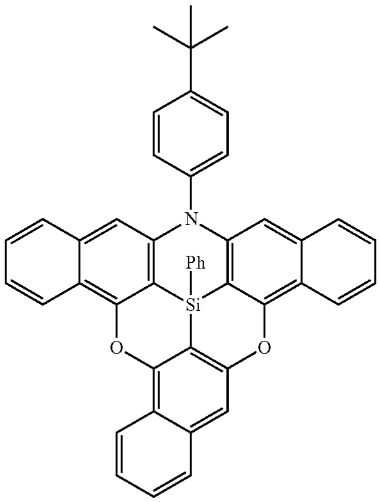
(1-907)
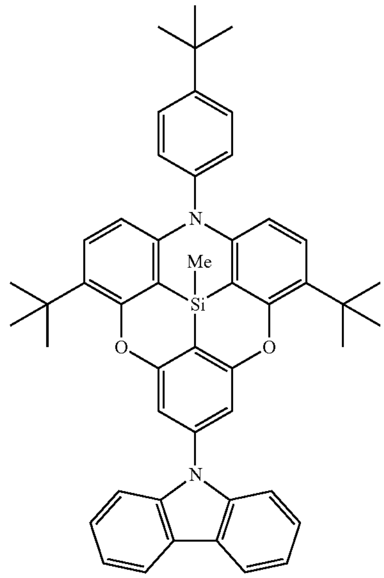
(1-908)
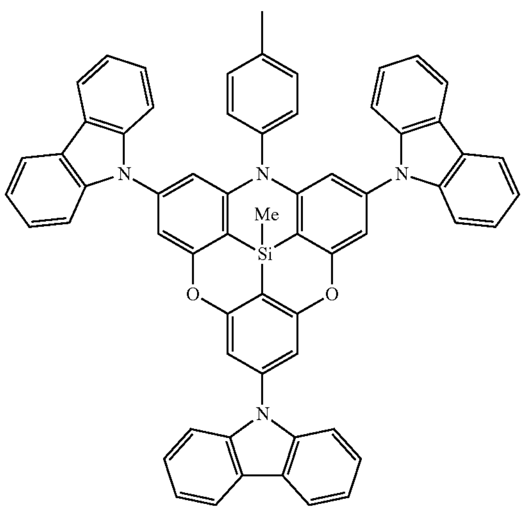
(1-909)
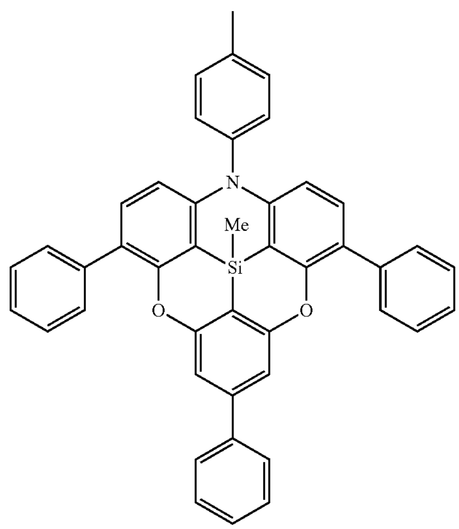
(1-910)
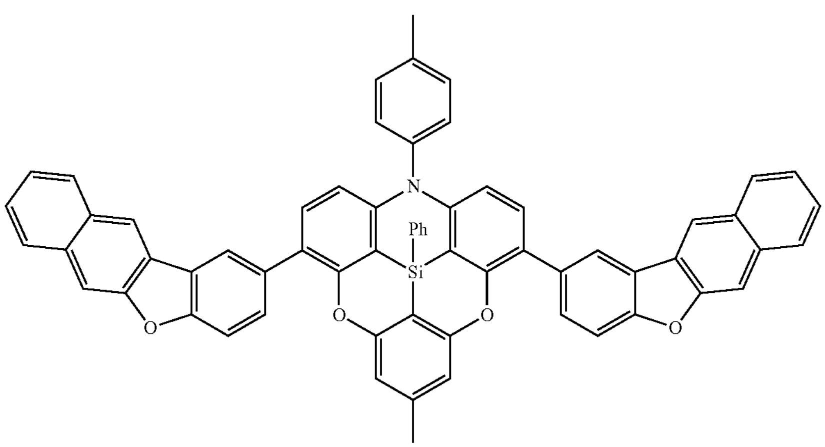

-continued
(1-911)
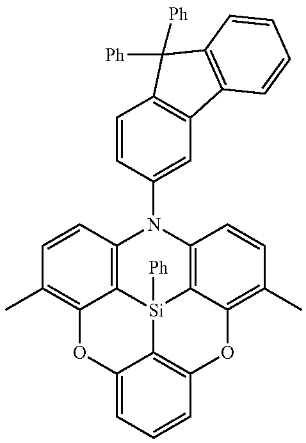
(1-912)
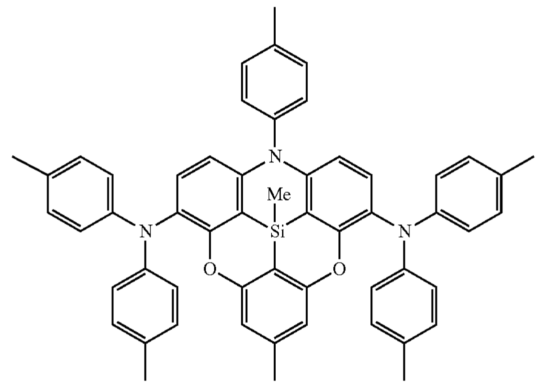
(1-913)
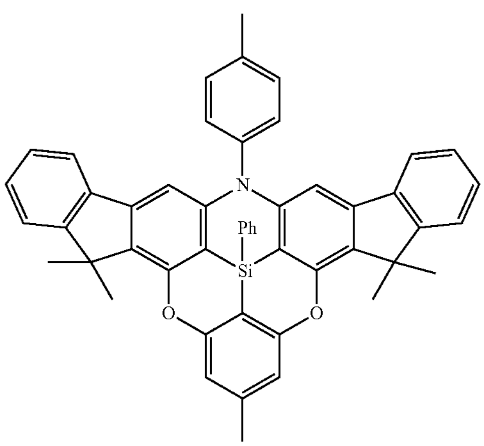
(1-914)
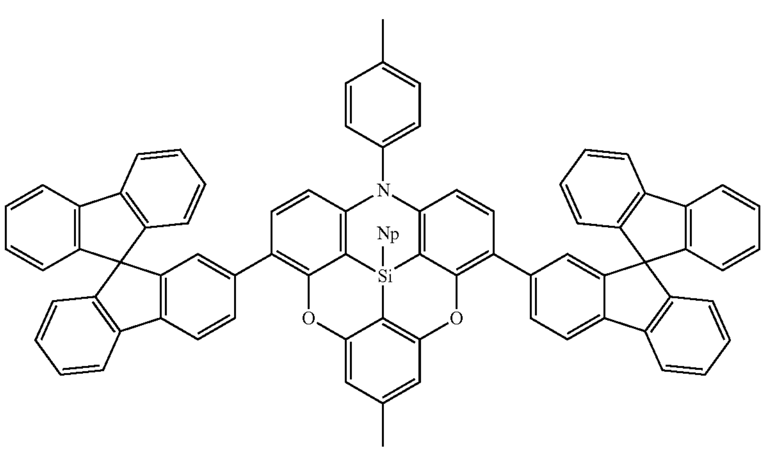

-continued
(1-915)
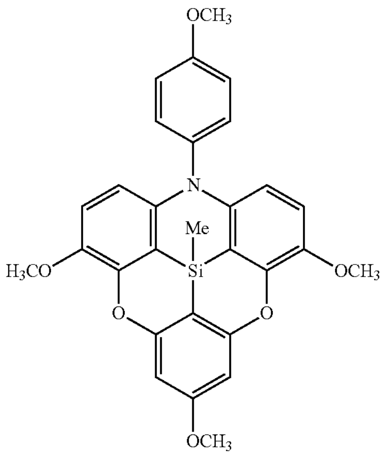
(1-921)
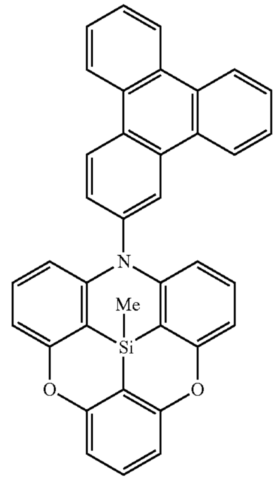
(1-922)
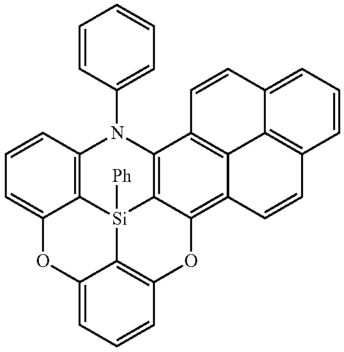
(1-923)
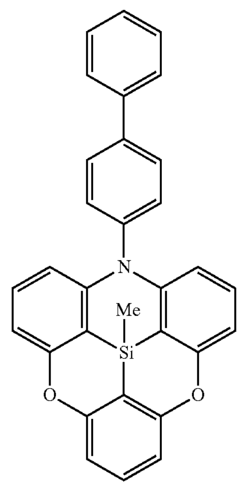
(1-924)
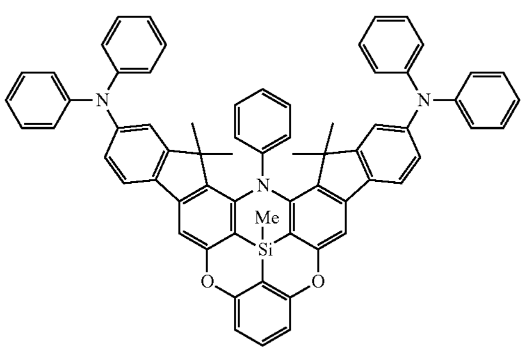
(1-925)
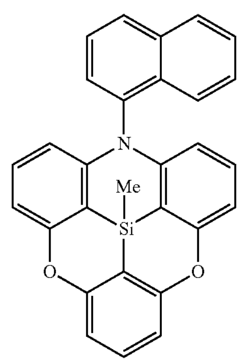

-continued
(1-926)
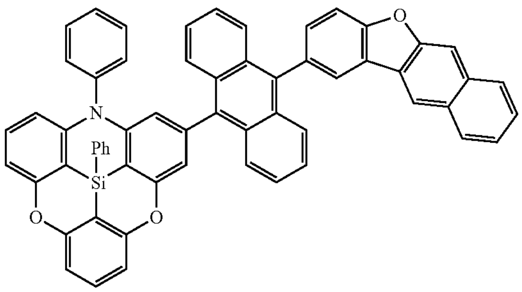
(1-927)
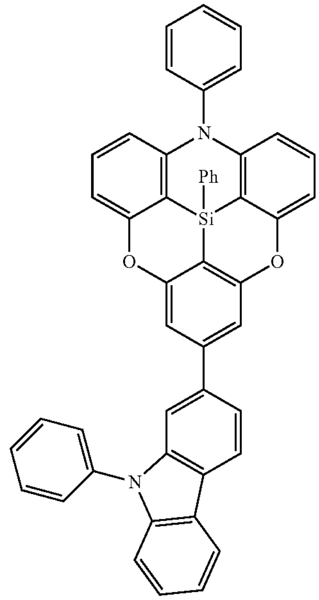
(1-928)
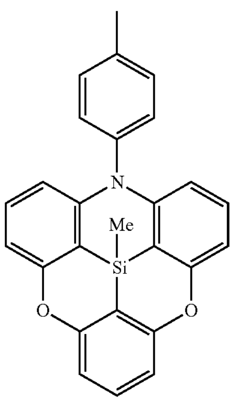
(1-929)
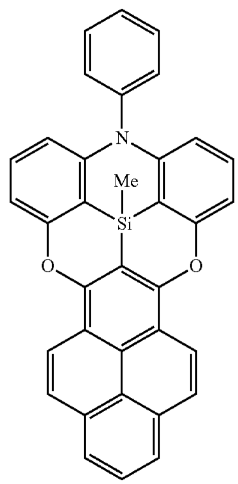
(1-930)
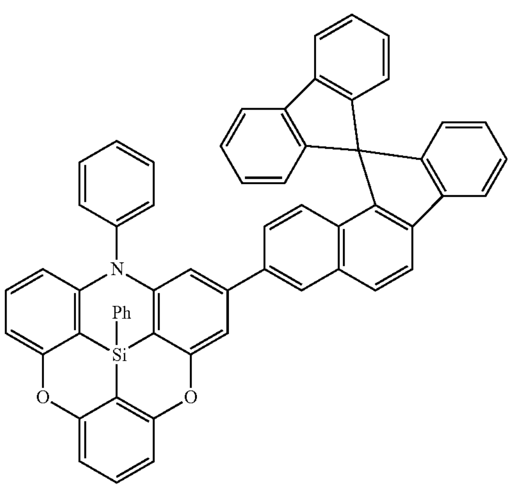
(1-931)
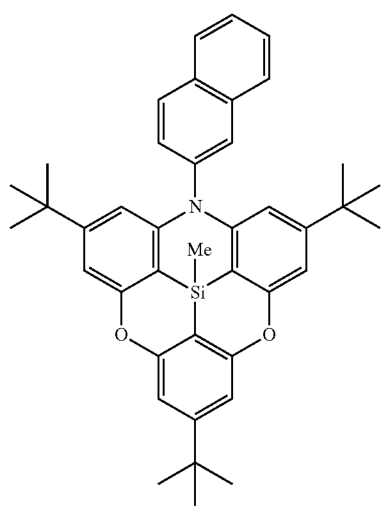

-continued
(1-932)
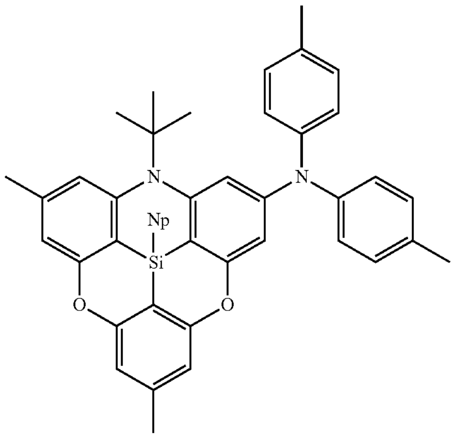
(1-933)
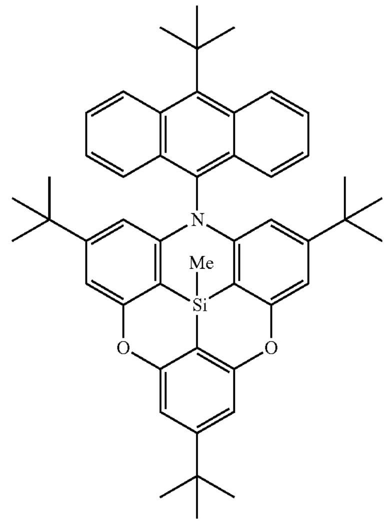
(1-934)
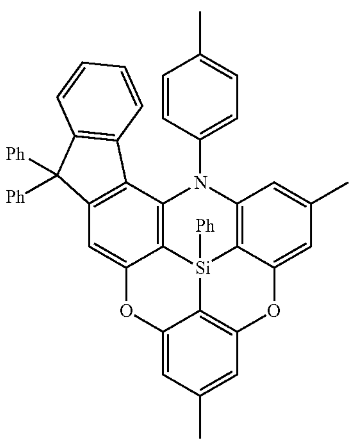
(1-935)
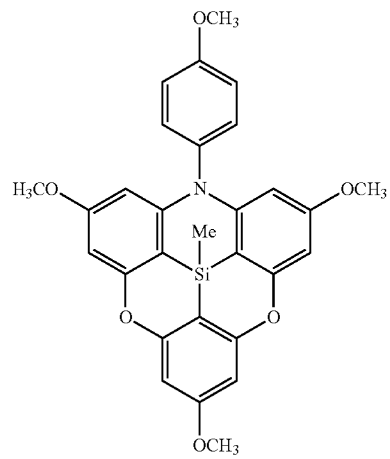
(1-941)
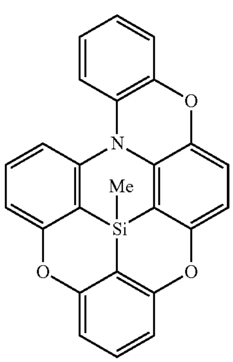
(1-942)
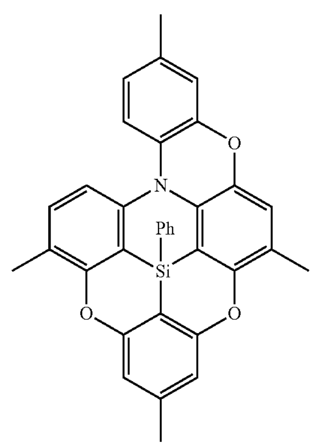

-continued
(1-943)
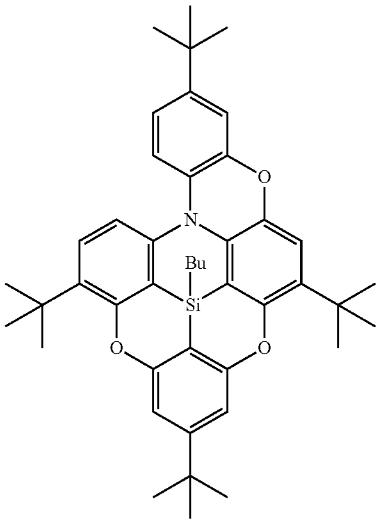
(1-944)
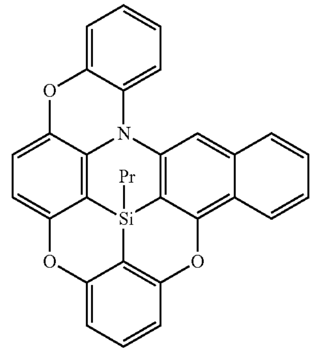
(1-945)
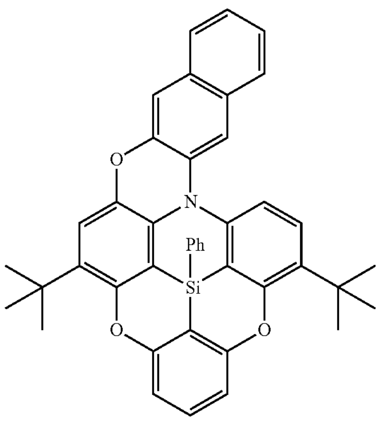
(1-946)
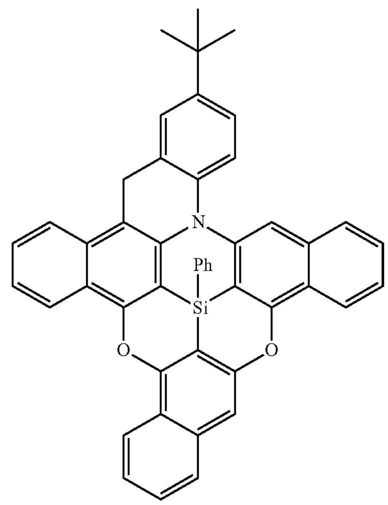
(1-947)
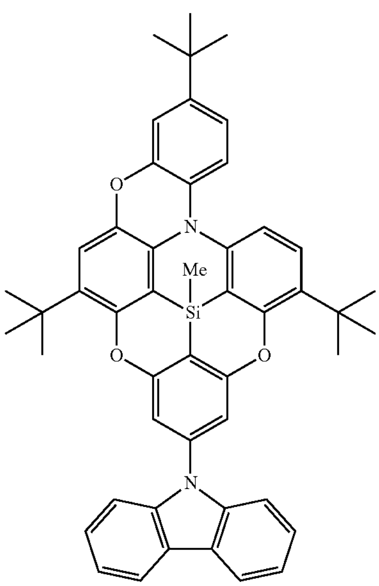
(1-948)
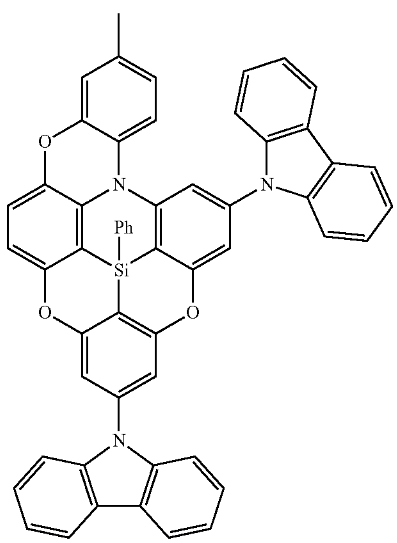

-continued
(1-949)
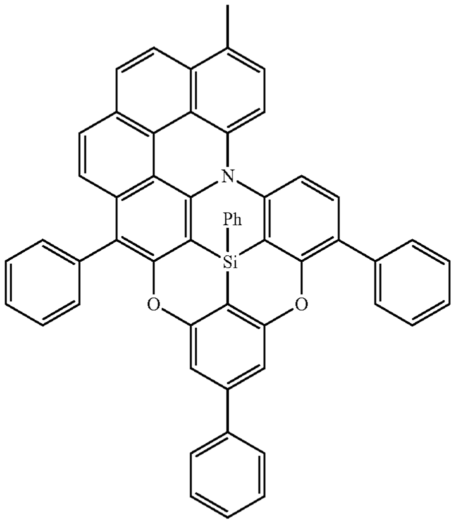
(1-950)
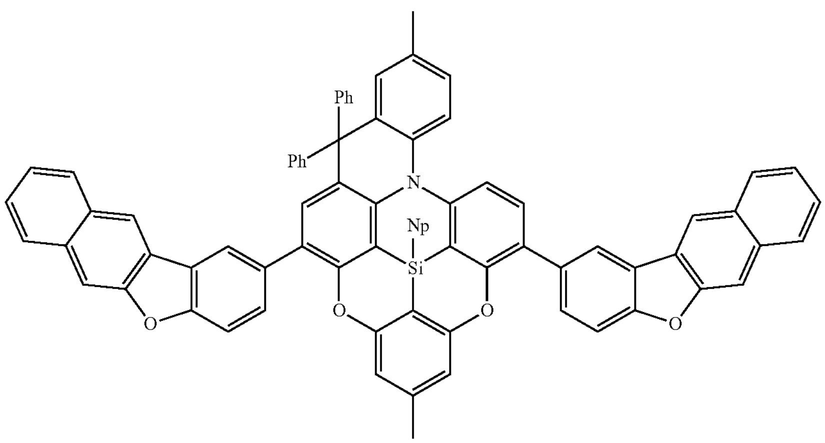
(1-951)
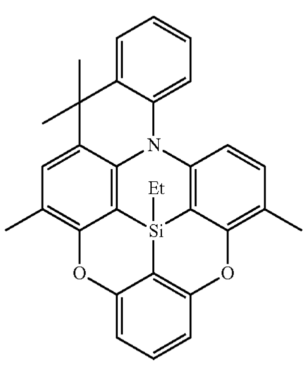
(1-952)
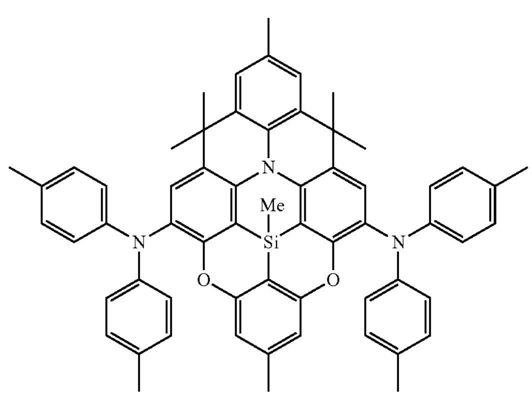

-continued
(1-953)
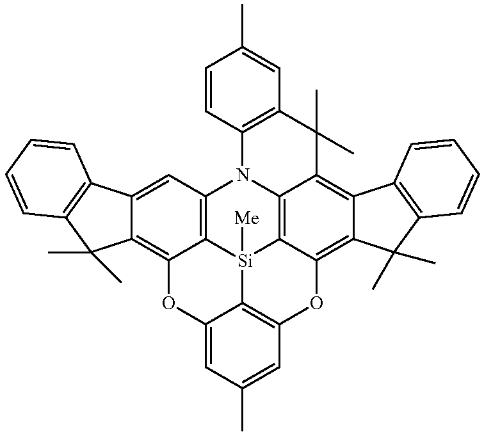
(1-954)
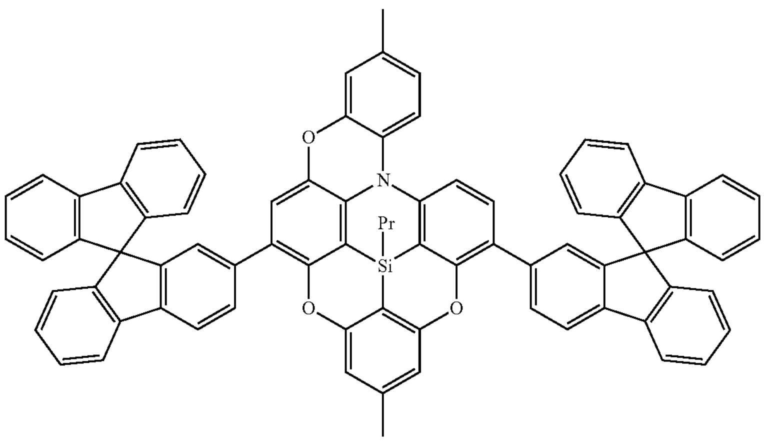
(1-955)
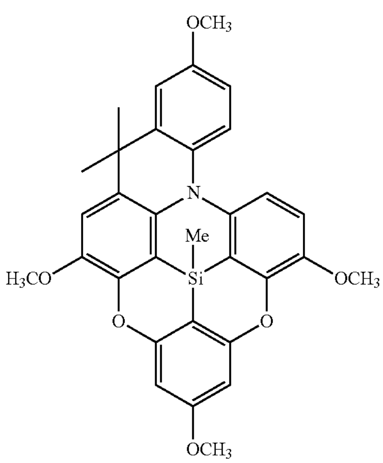
(1-961)
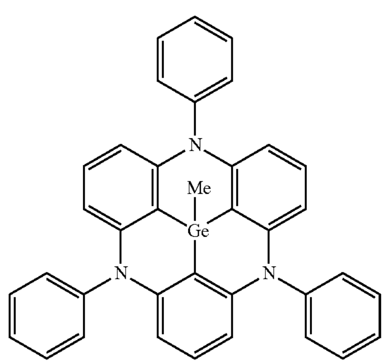

-continued
(1-962)
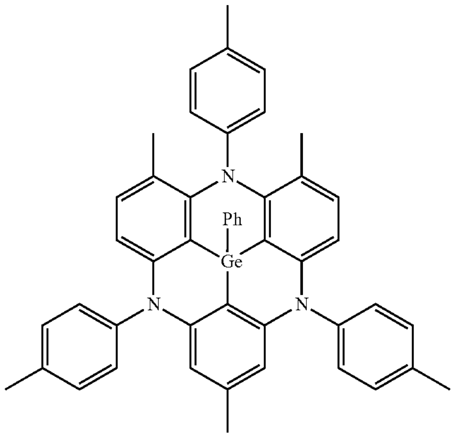
(1-963)
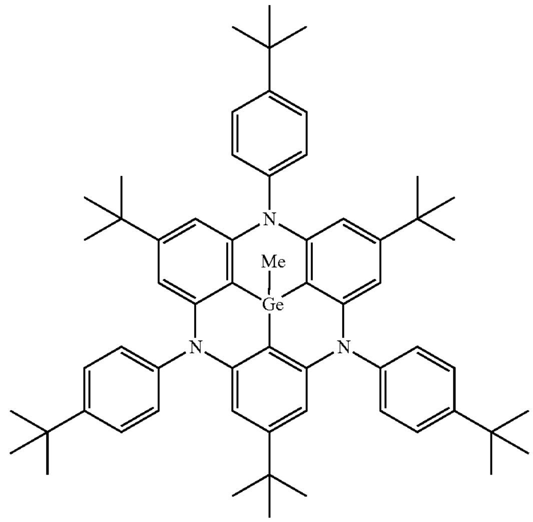
(1-964)
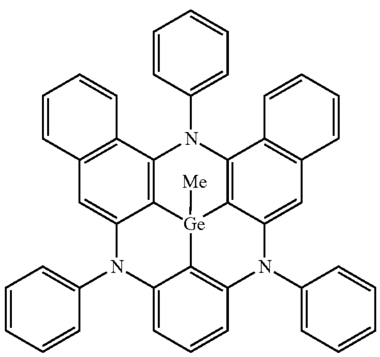
(1-965)
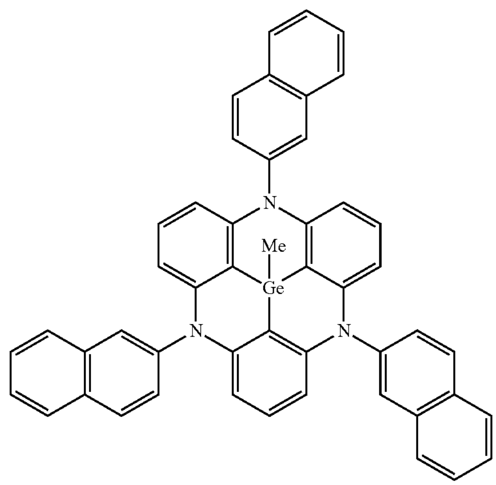
(1-966)
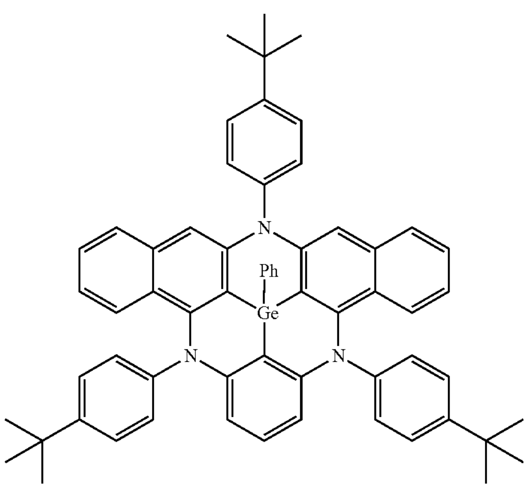
(1-967)
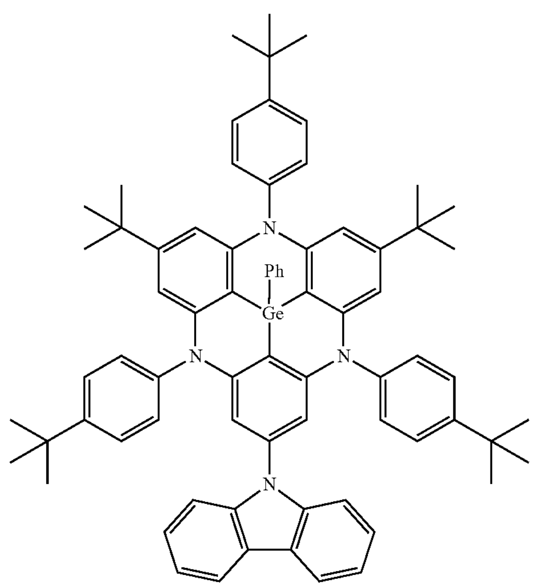

-continued
(1-968)
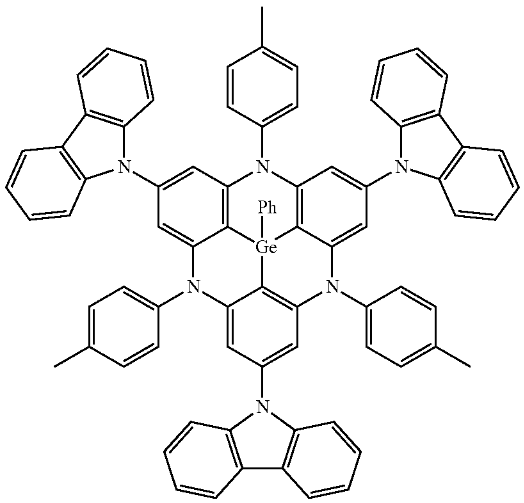
(1-969)
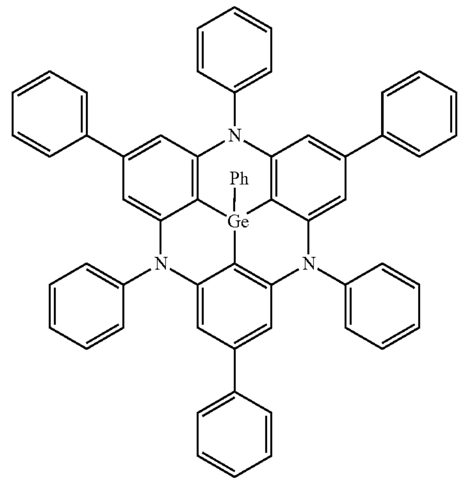
(1-970)
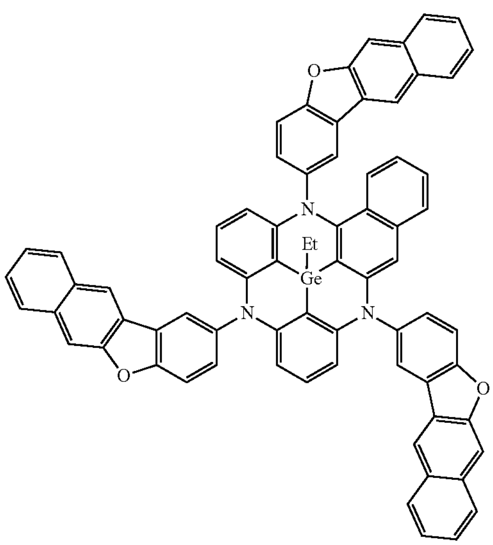
(1-971)
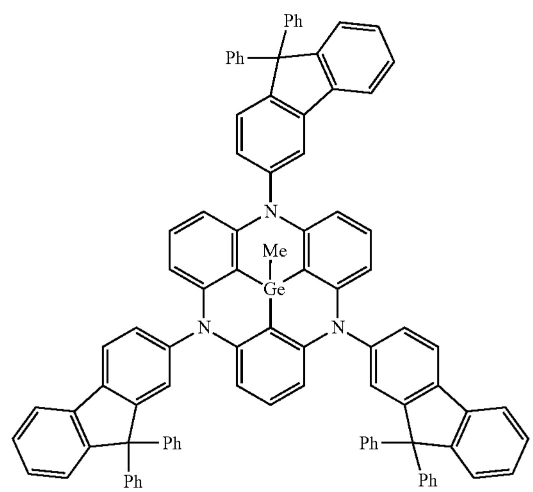
(1-972)
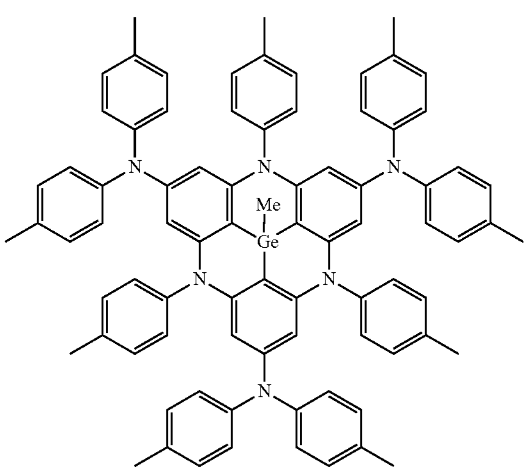
(1-973)
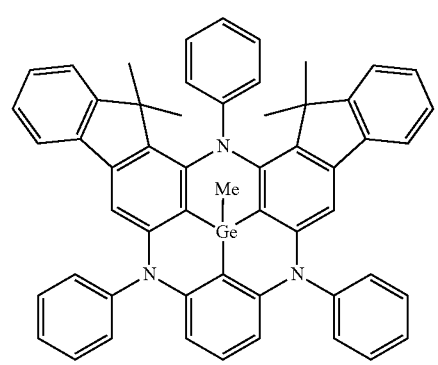

-continued
(1-974)
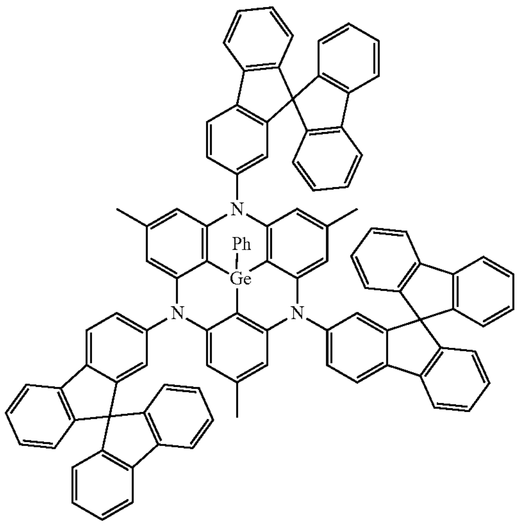
(1-975)
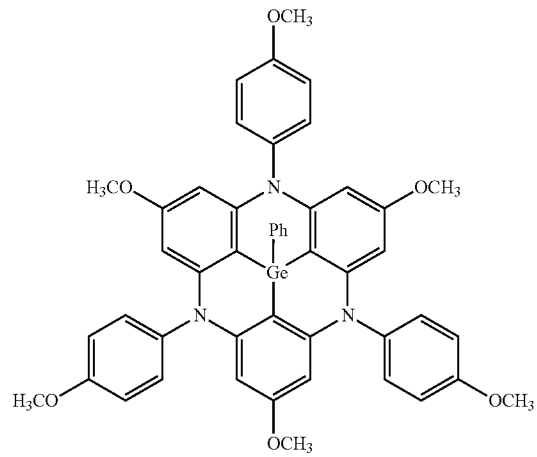
(1-981)
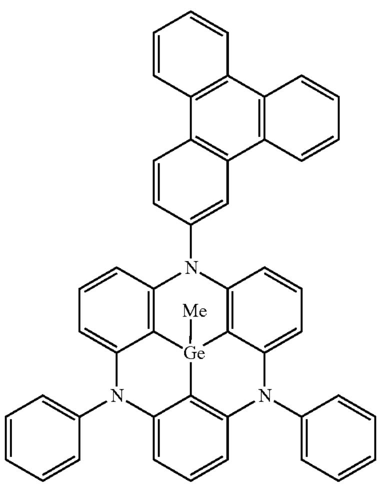
(1-982)
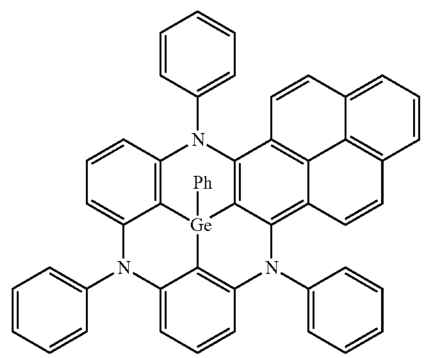
(1-983)
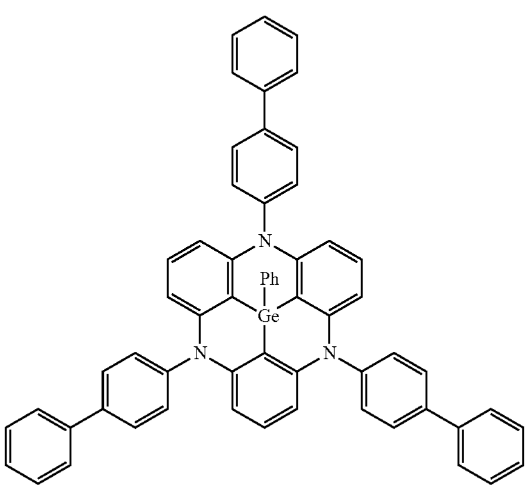
(1-984)
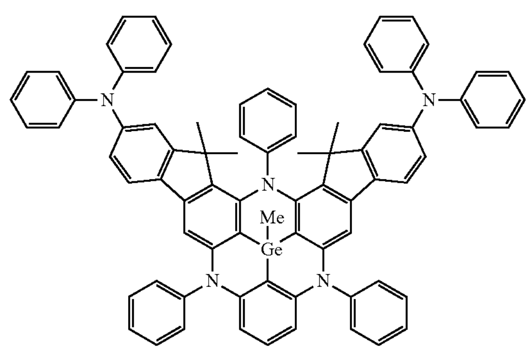

-continued
(1-985)
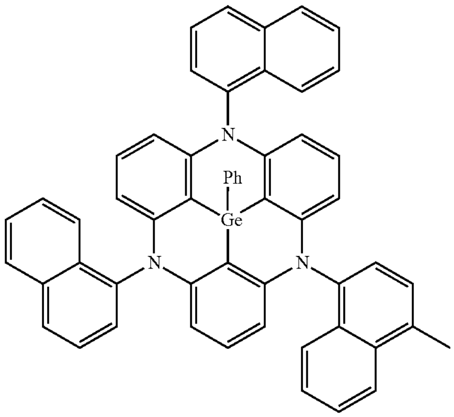
(1-986)
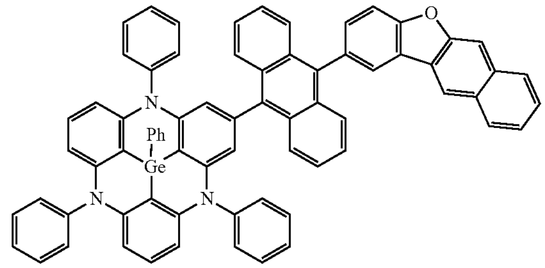
(1-987)
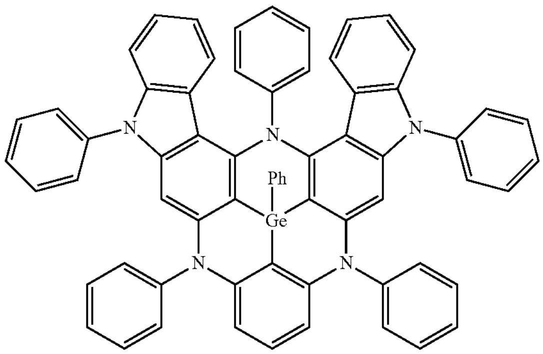
(1-988)
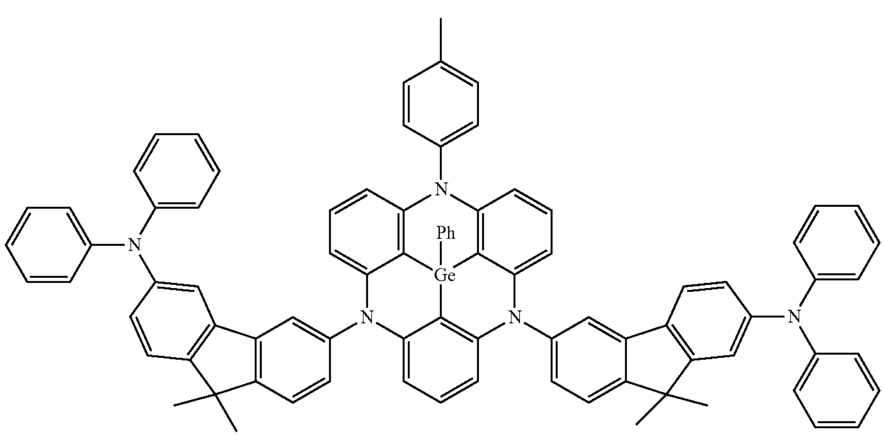

-continued
(1-989)
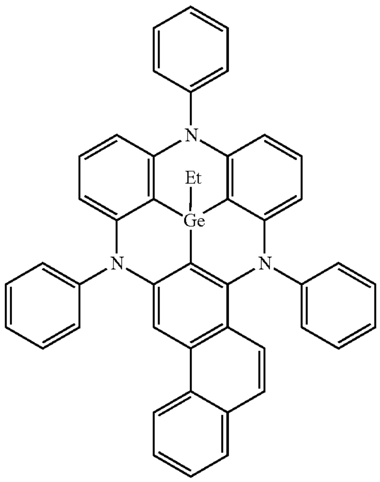
(1-990)
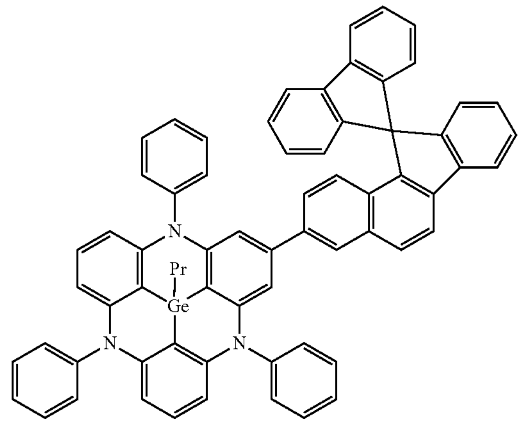
(1-991)
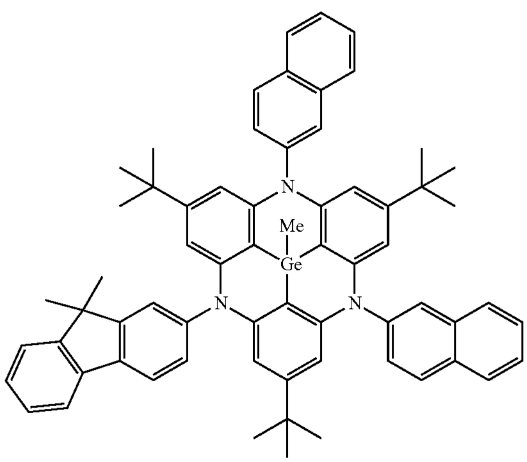
(1-992)
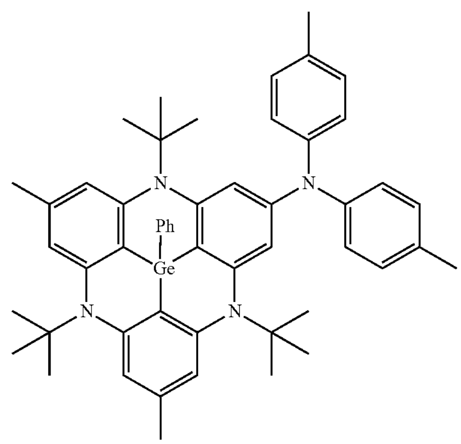
(1-993)
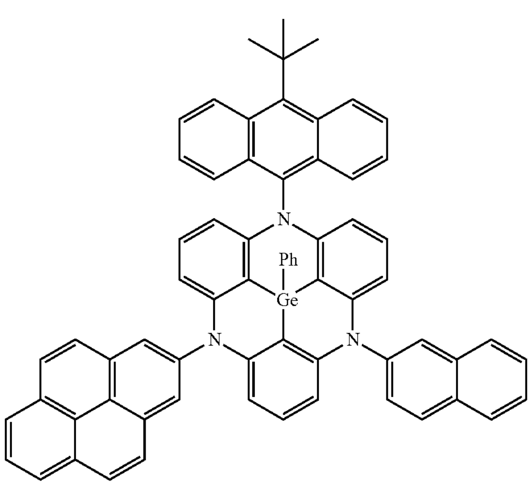
(1-994)
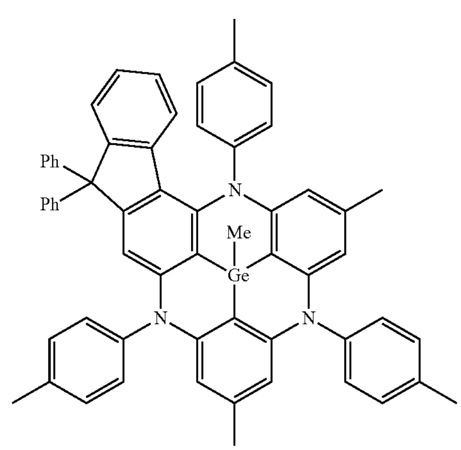

-continued
(1-995)
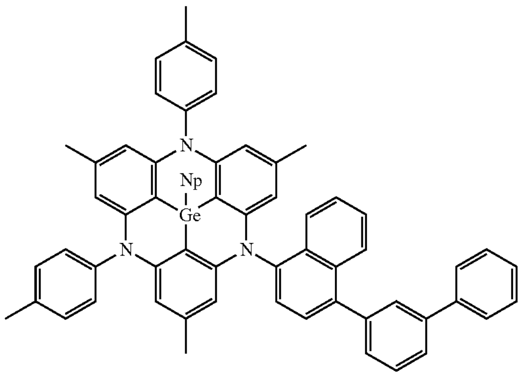
(1-1001)
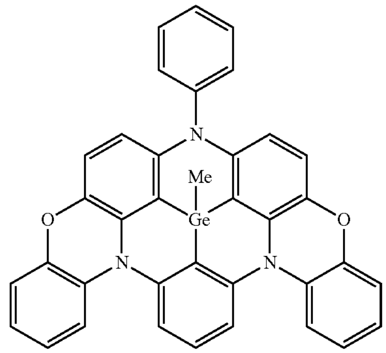
(1-1002)
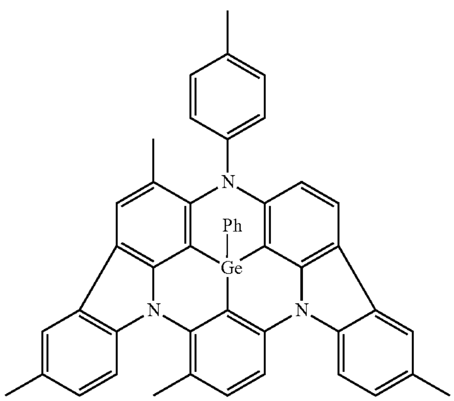
(1-1003)
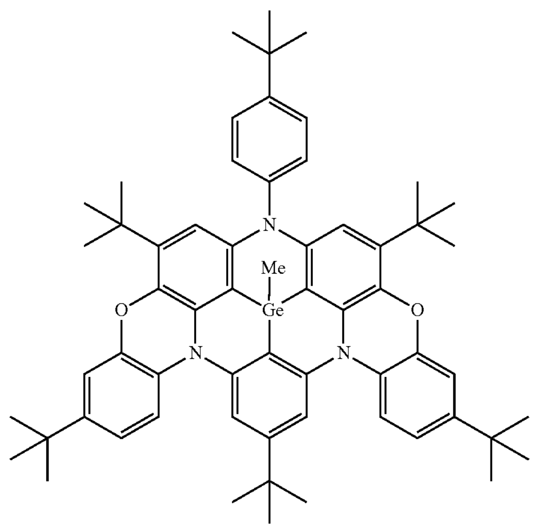
(1-1004)
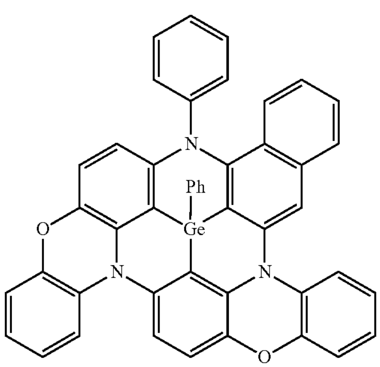
(1-1005)
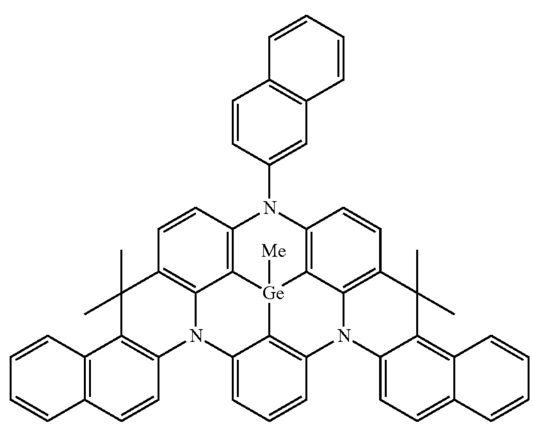

-continued
(1-1006)
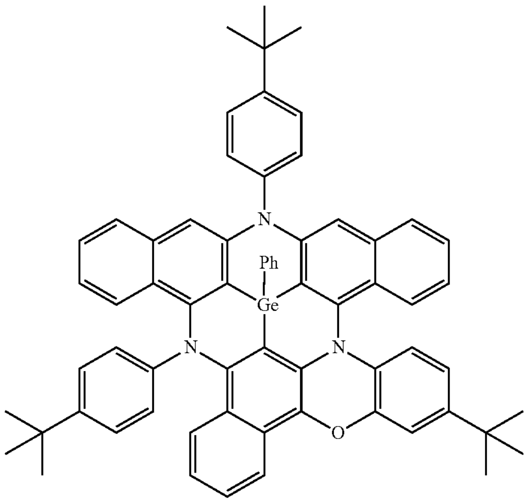
(1-1007)
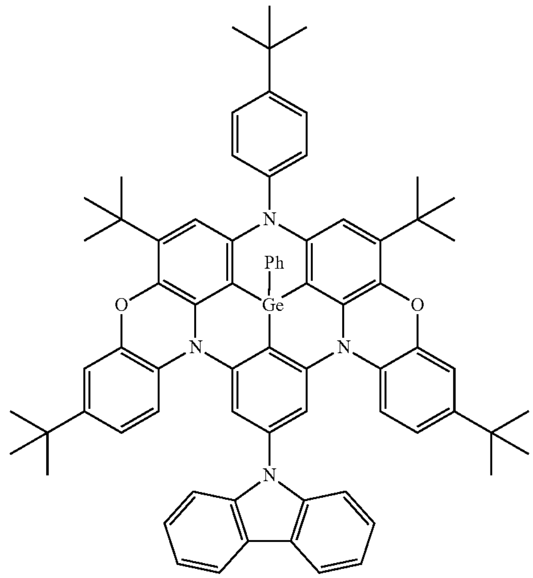
(1-1008)
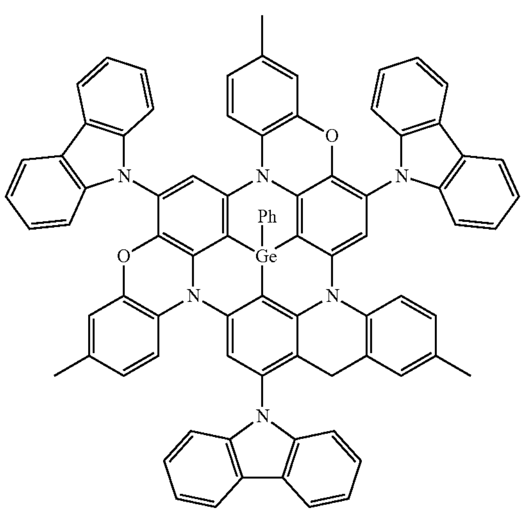
(1-1009)
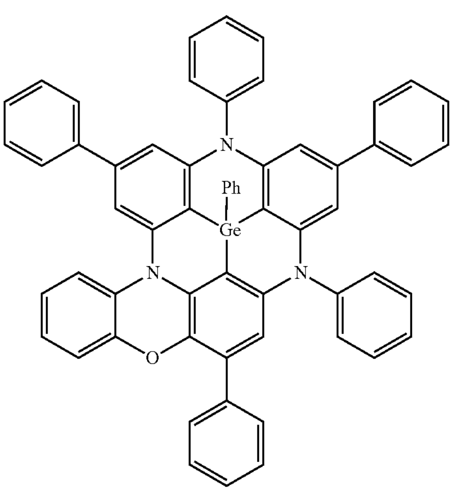

-continued
(1-1010)
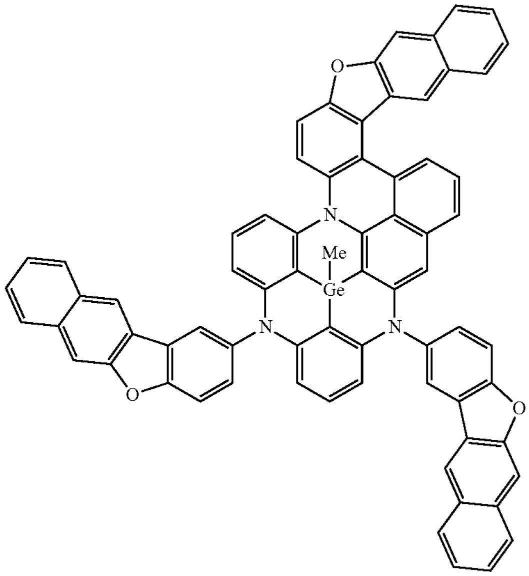
1-1011)
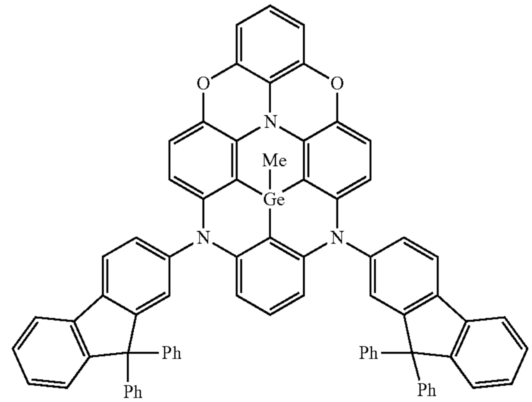
(1-1012)
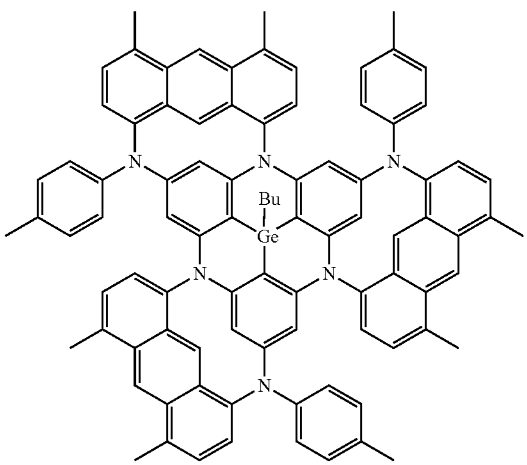
(1-1013)
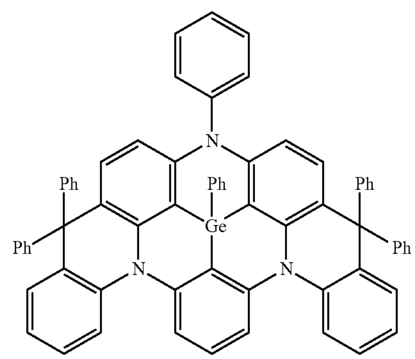
(1-1014)
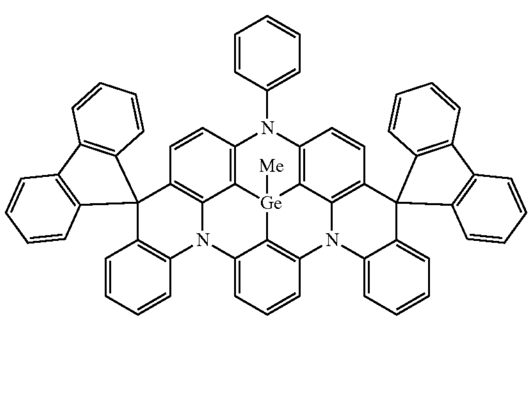
(1-1015)
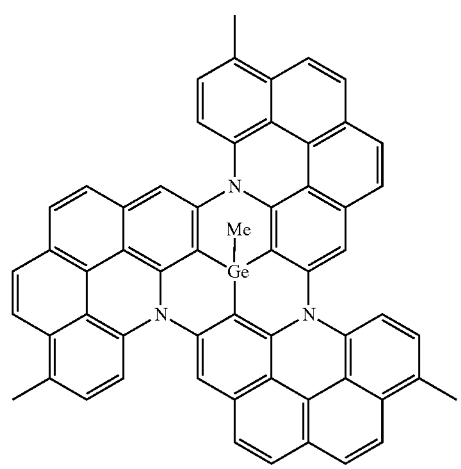

-continued
(1-1021)
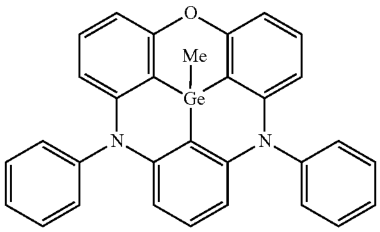
(1-1022)
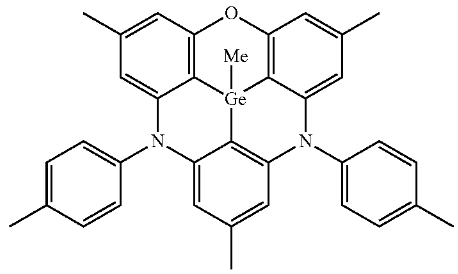
(1-1023)
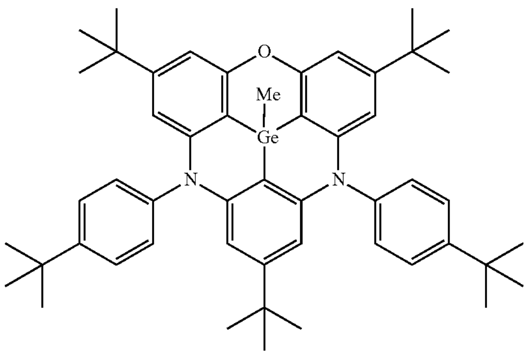
(1-1024)
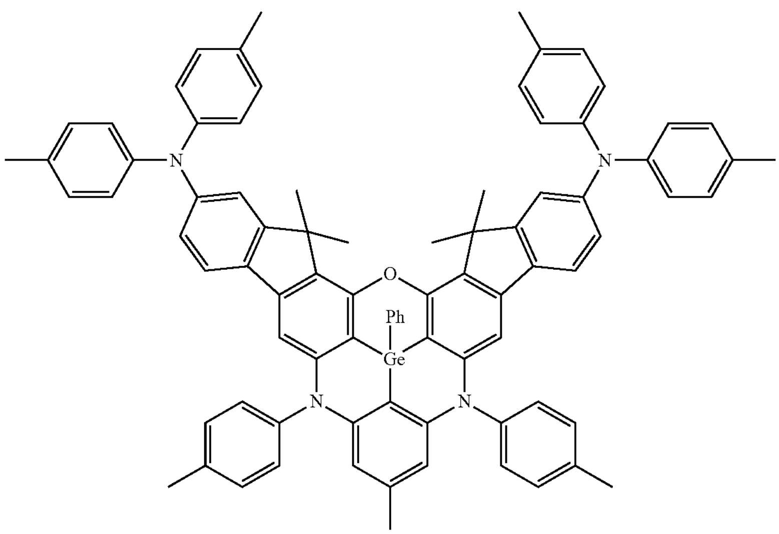
(1-1025)
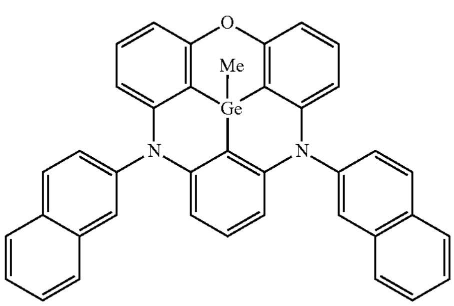
(1-1026)
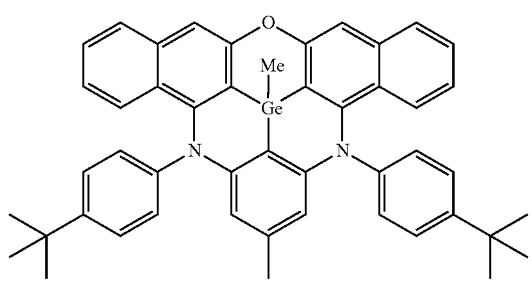

-continued
(1-1027)
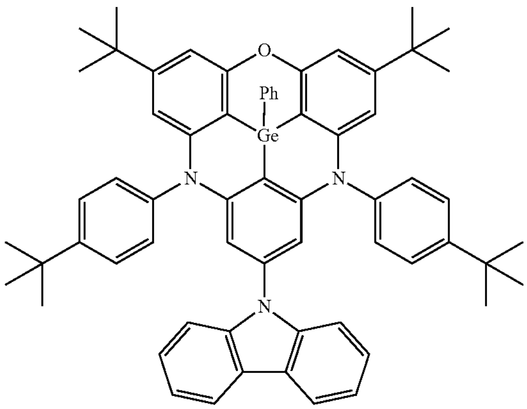
(1-1028)
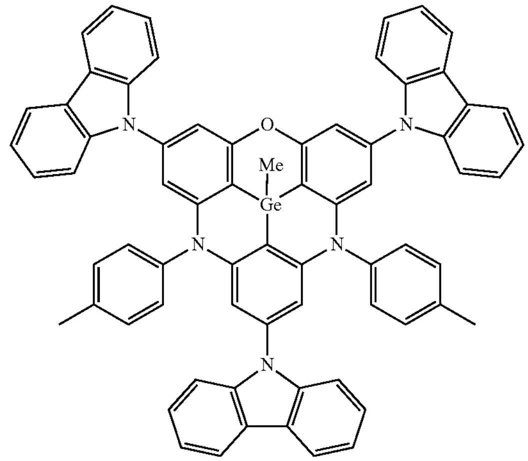
(1-1029)
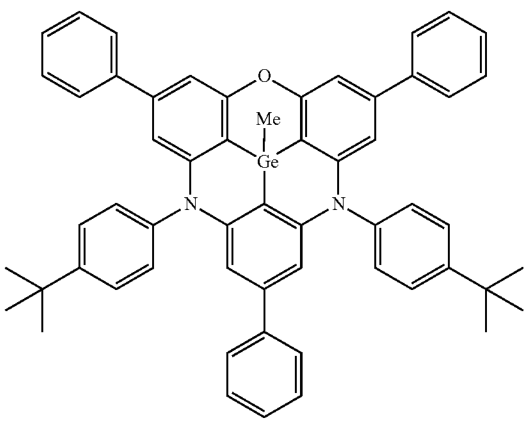
(1-1030)
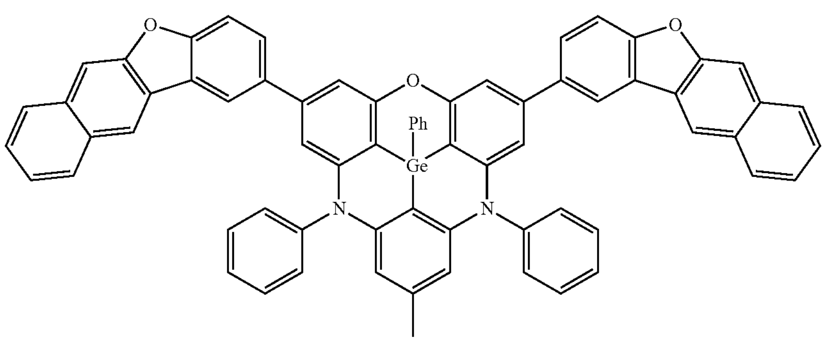

-continued
(1-1031)
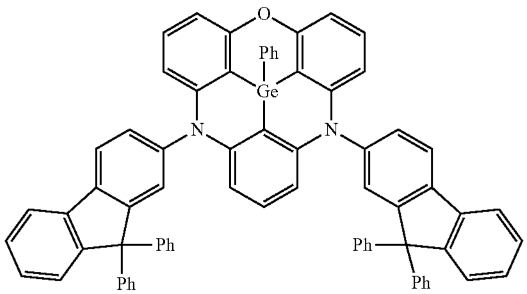
(1-1032)
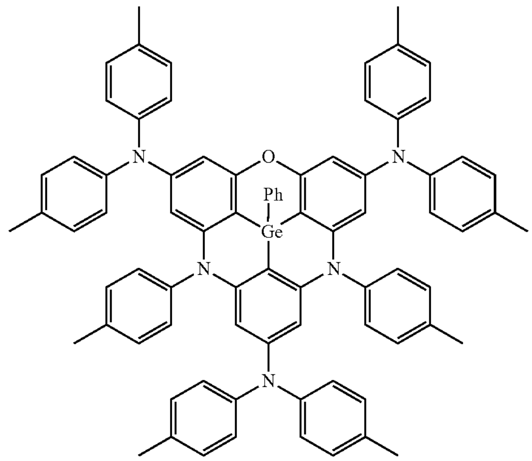
(1-1033)
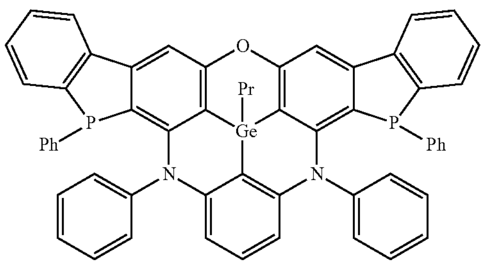
(1-1034)
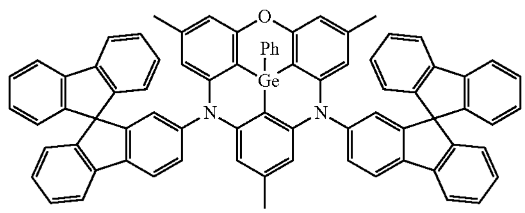
(1-1035)
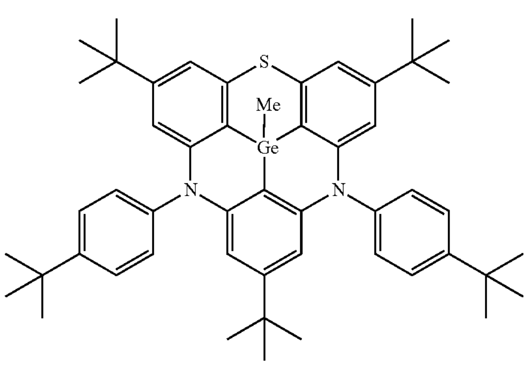
(1-1041)
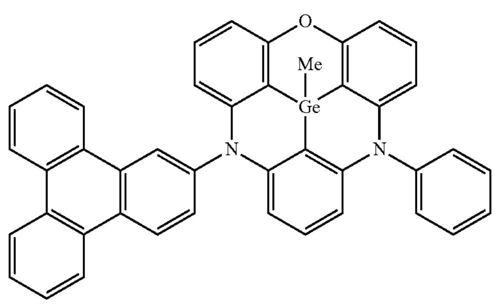
(1-1042)
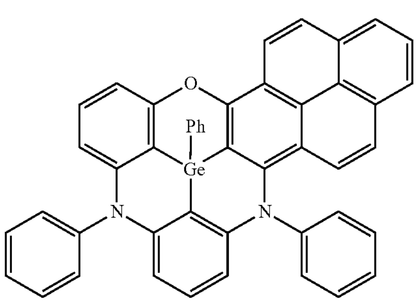
(1-1043)
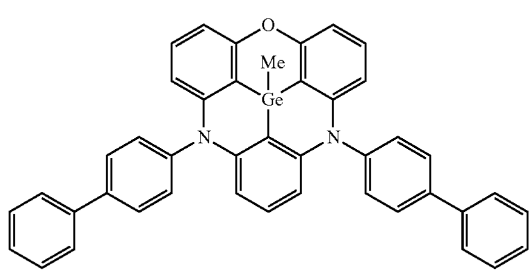

-continued
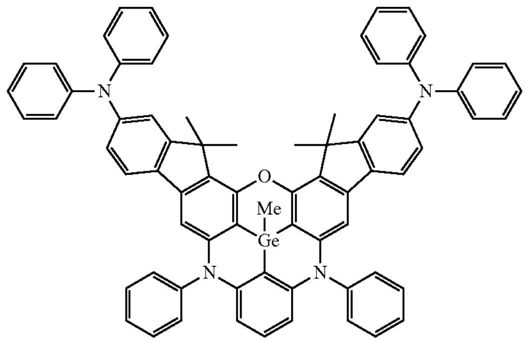
(1-1045)
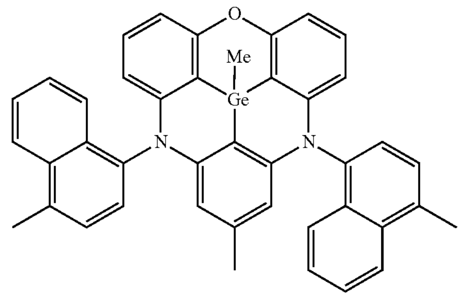
(1-1046)
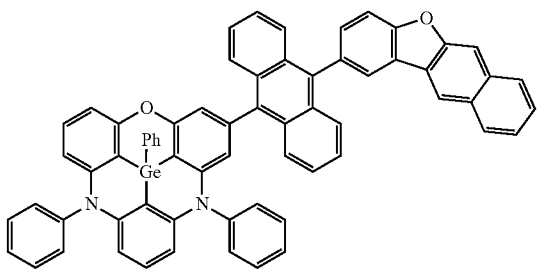
(1-1047)
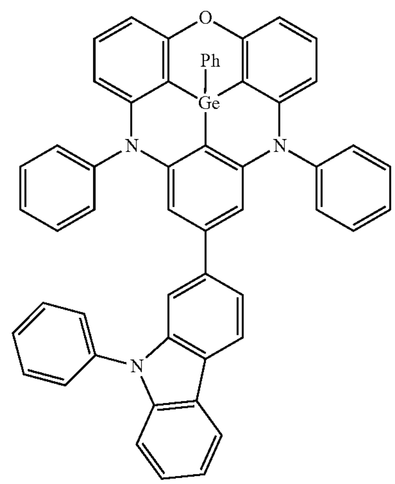
(1-1048)
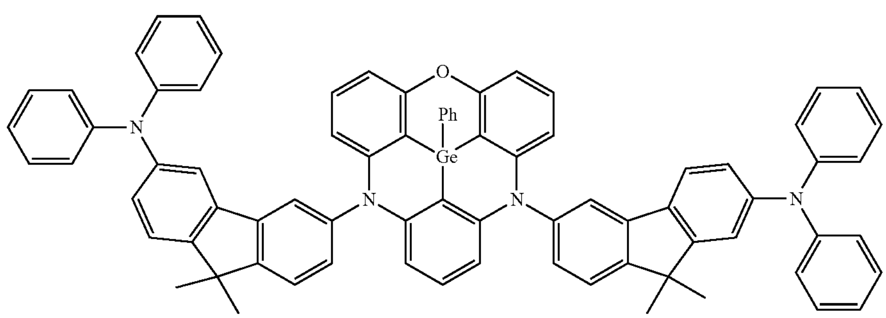
(1-1049)
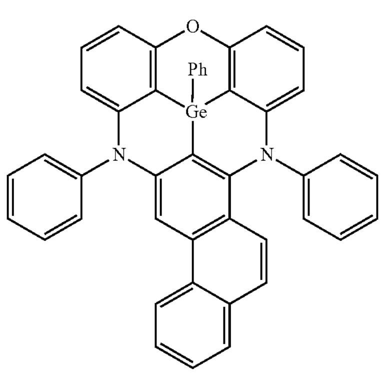
(1-1050)
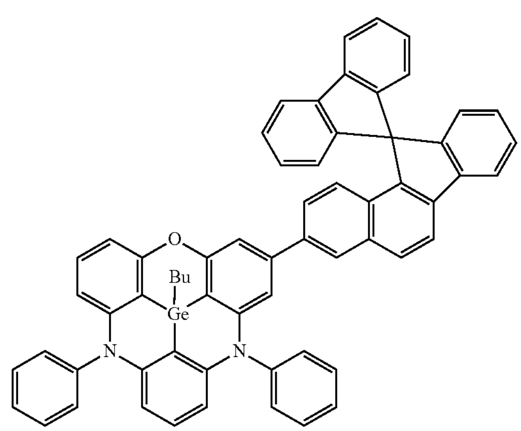

-continued
(1-1051)
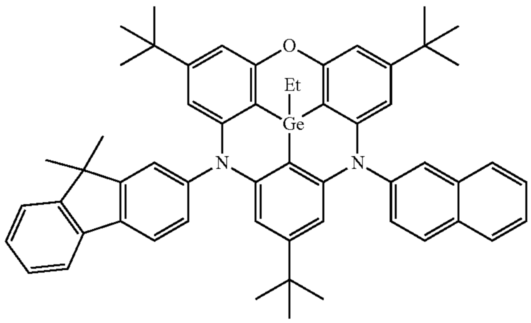
(1-1052)
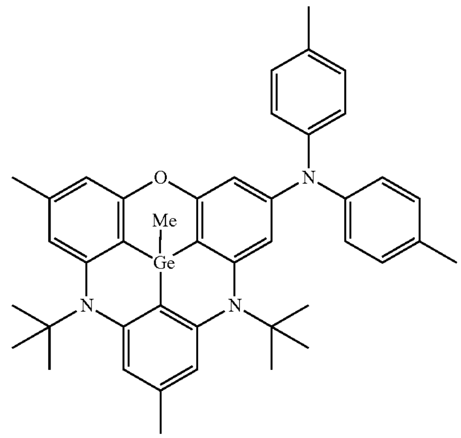
(1-1053)
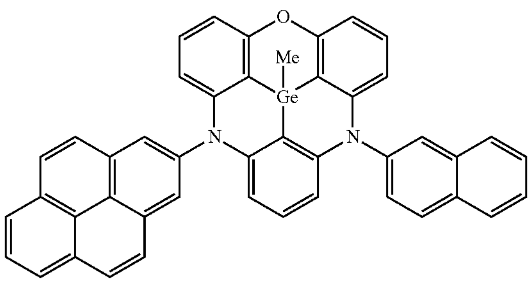
(1-1054)
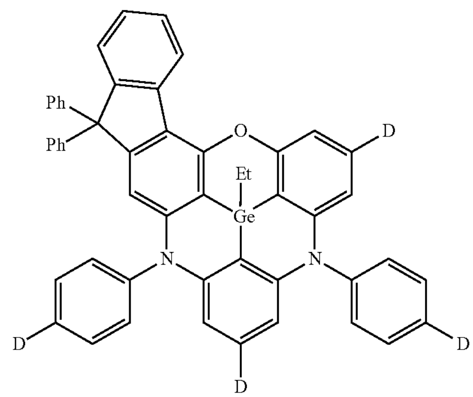
(1-1055)
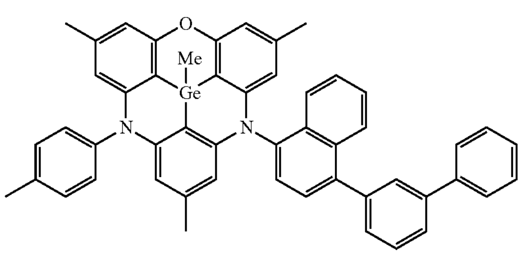
(1-1061)
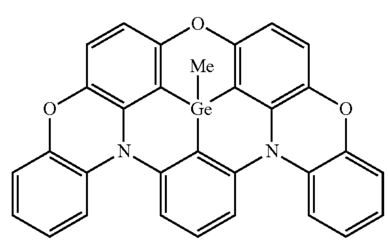
(1-1062)
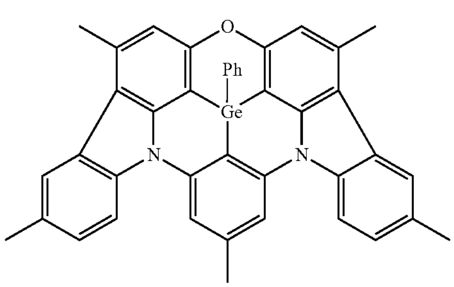
(1-1063)
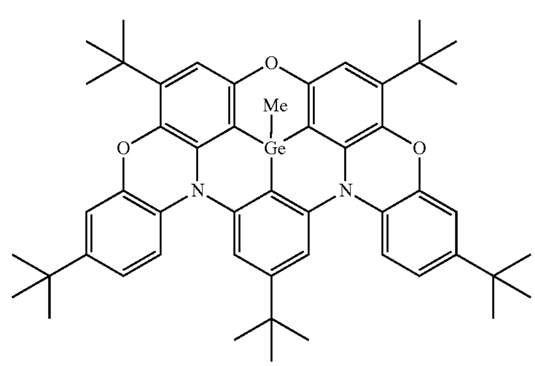

-continued
(1-1064)
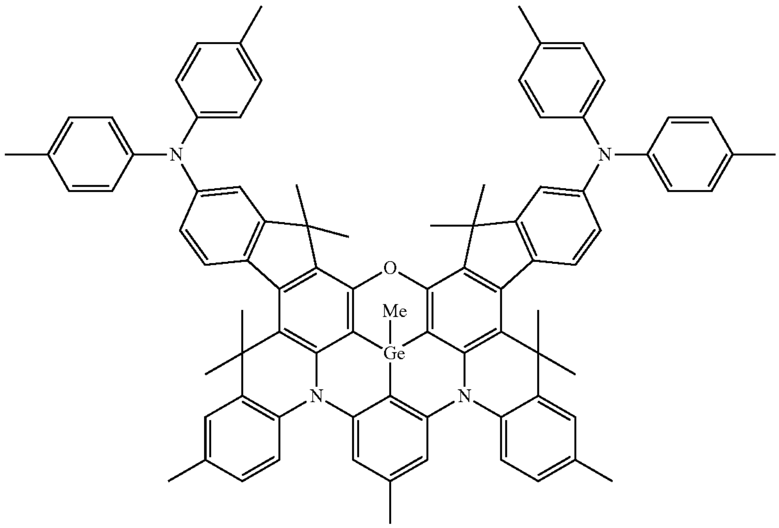
(1-1065)
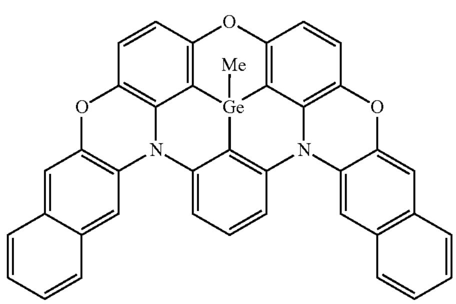
(1-1066)
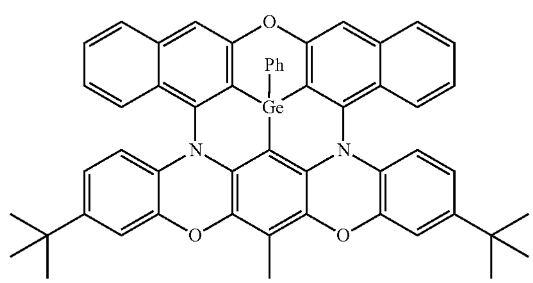
(1-1067)
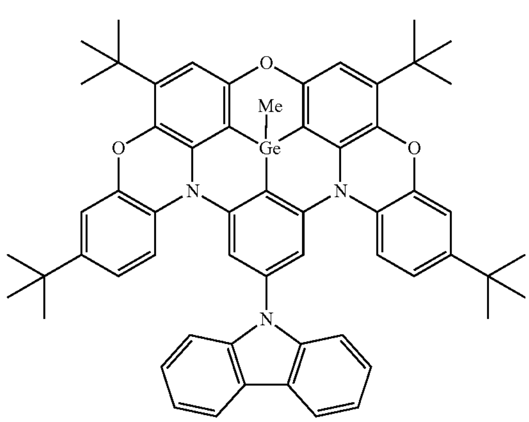
(1-1068)
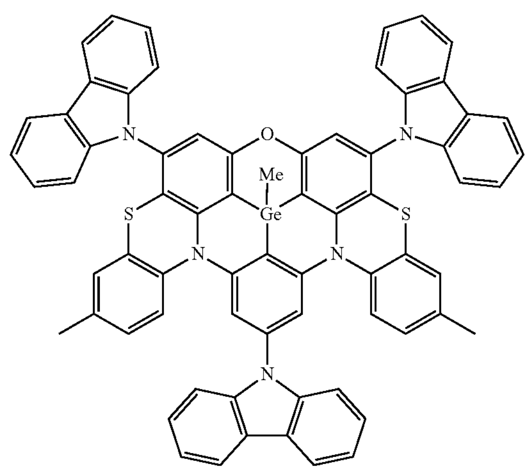

-continued
(1-1069)
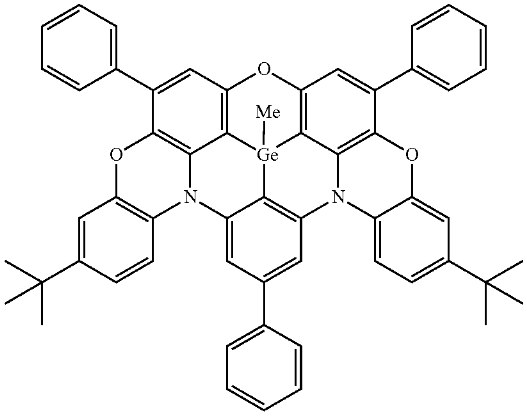
(1-1070)
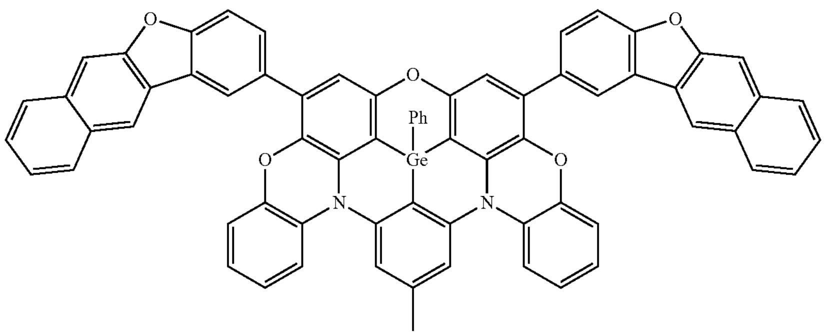
(1-1071)
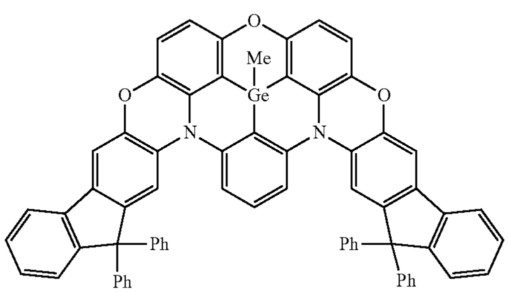
(1-1072)
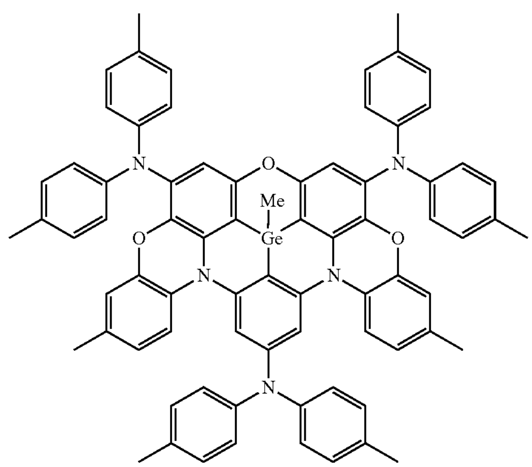
(1-1073)
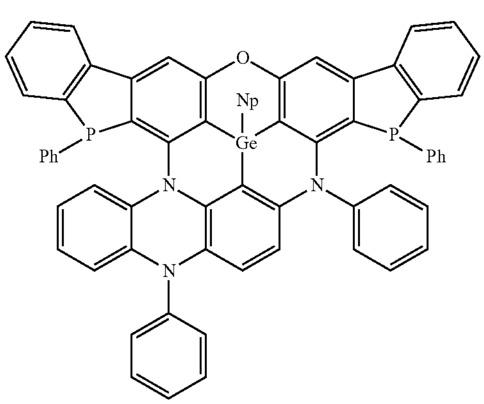
(1-1074)
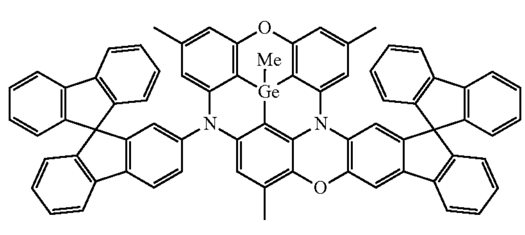

-continued
(1-1075)
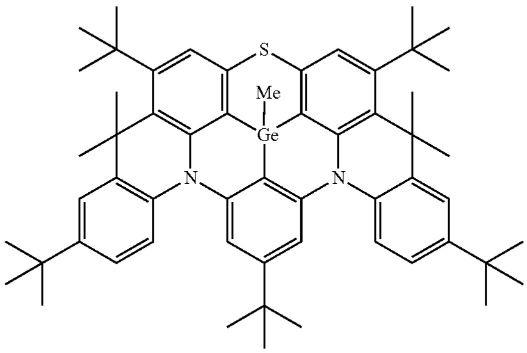
(1-1081)
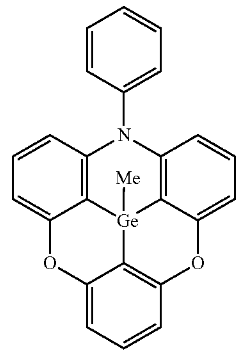
(1-1082)
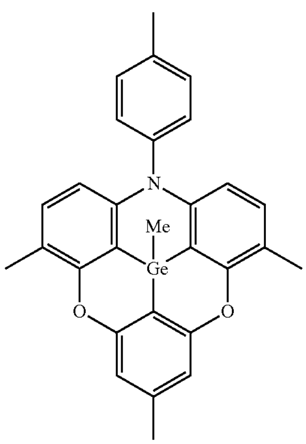
(1-1083)
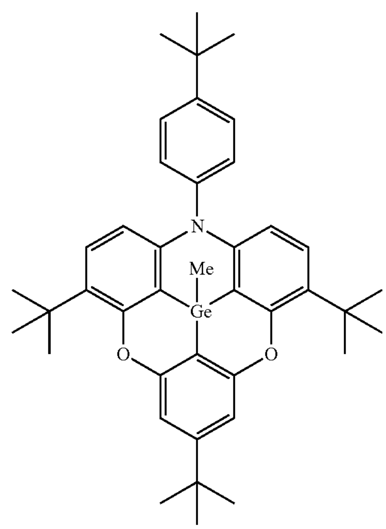
(1-1084)
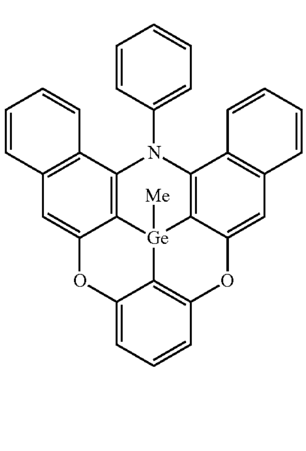
(1-1085)
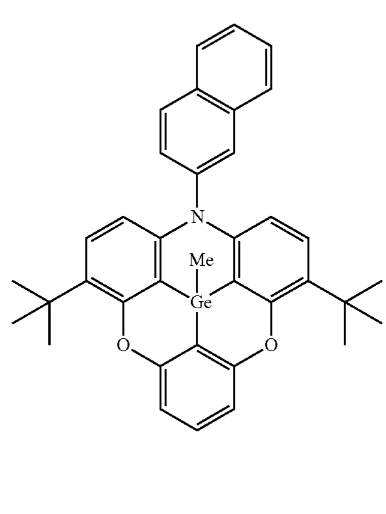

-continued
(1-1086)
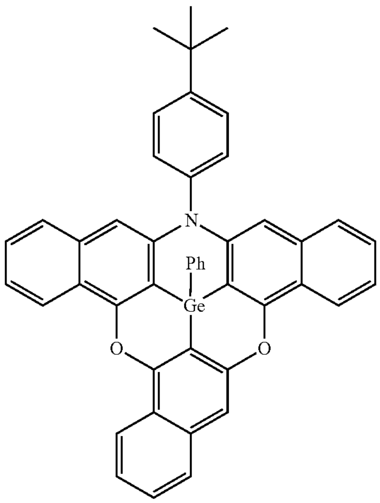
(1-1087)
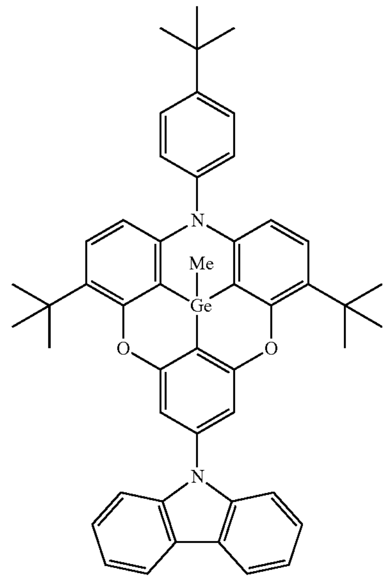
(1-1088)
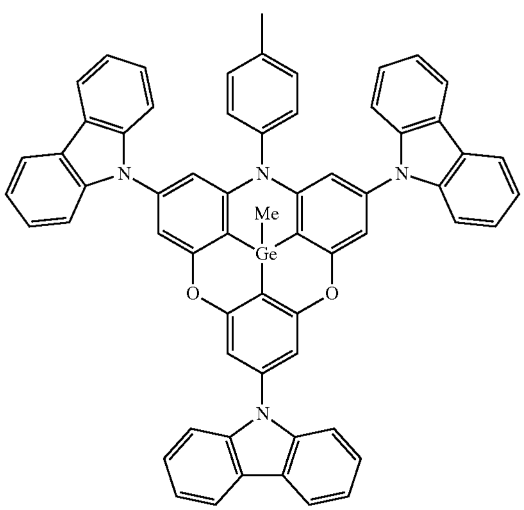
(1-1089)
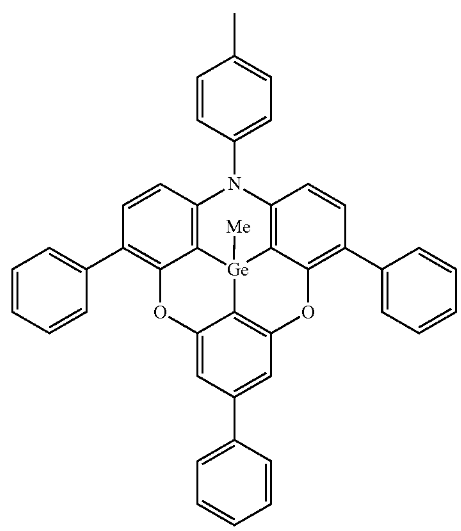
(1-1090)
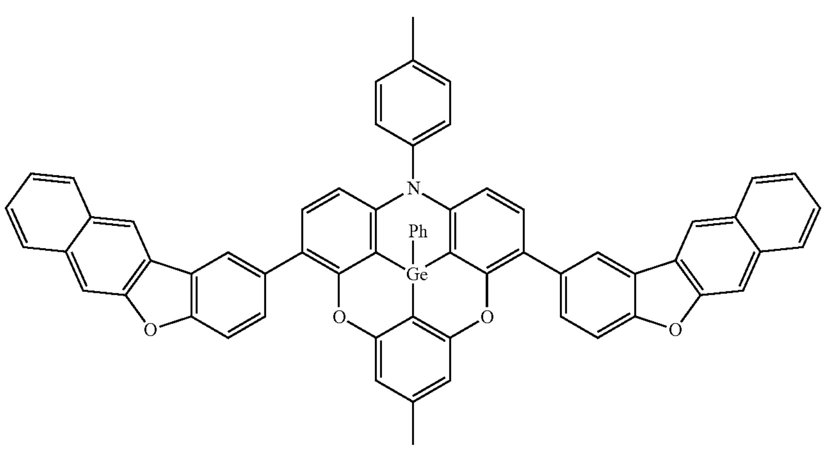

-continued
(1-1091)
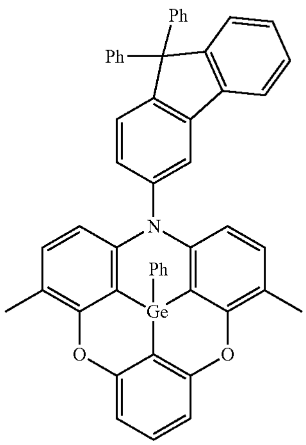
(1-1092)
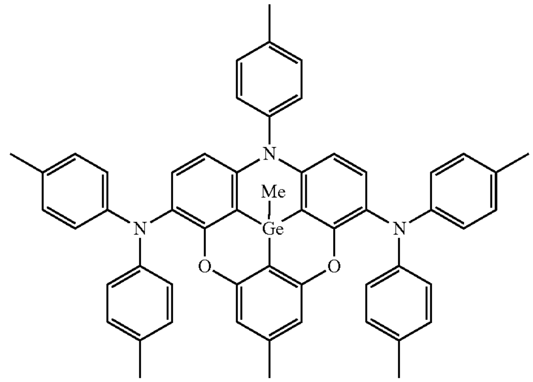
(1-1093)
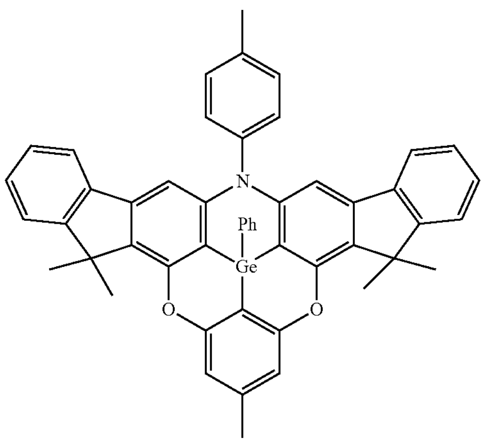
(1-1094)
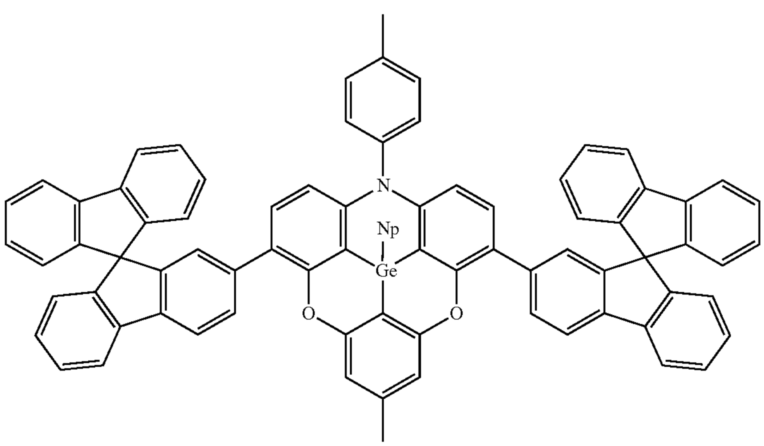

-continued
(1-1095)
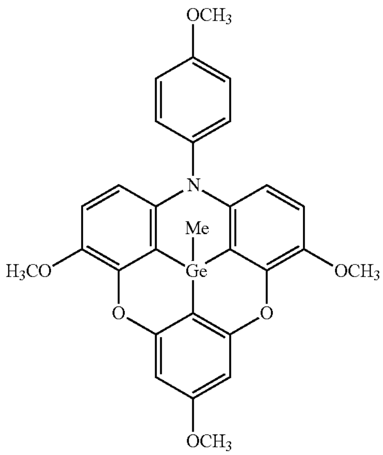
(1-1101)
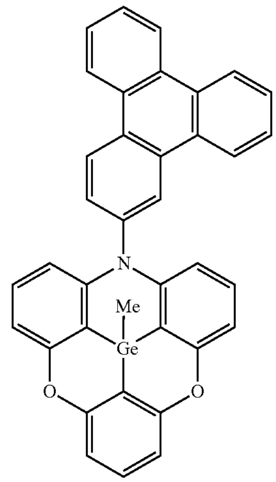
(1-1102)
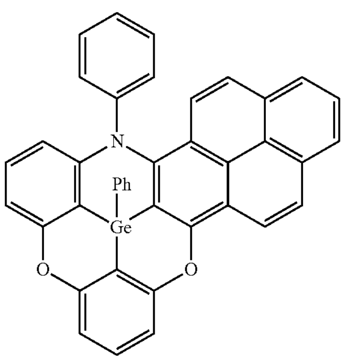
(1-1103)
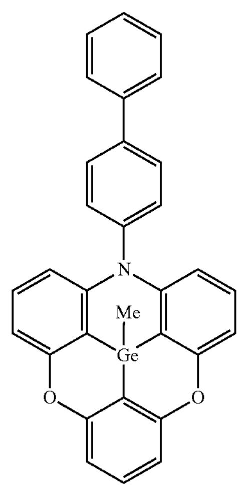
(1-1104)
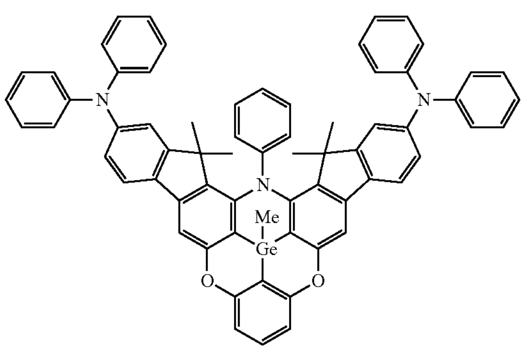
(1-1105)
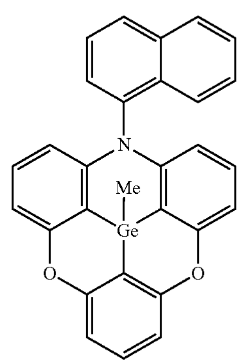

-continued
(1-1106)
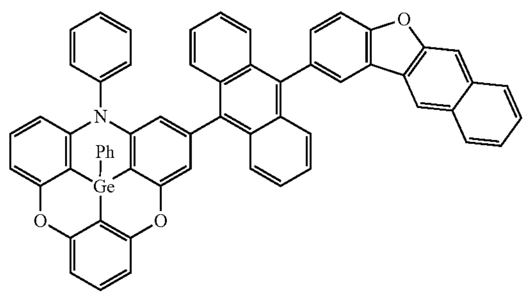
(1-1107)
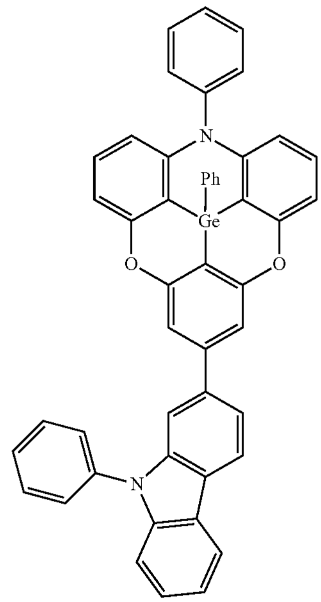
(1-1108)
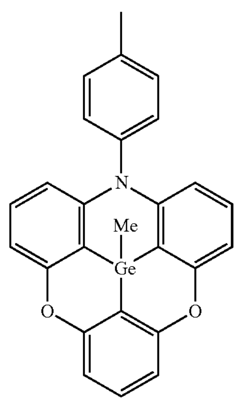
(1-1109)
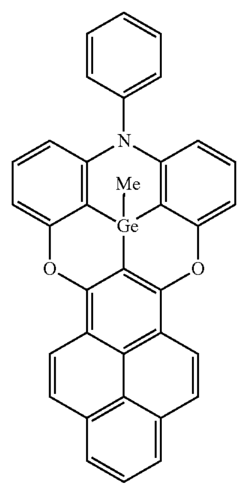
(1-1110)
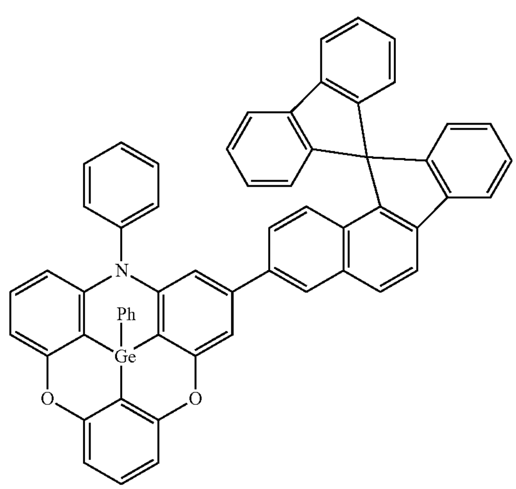
(1-1101)
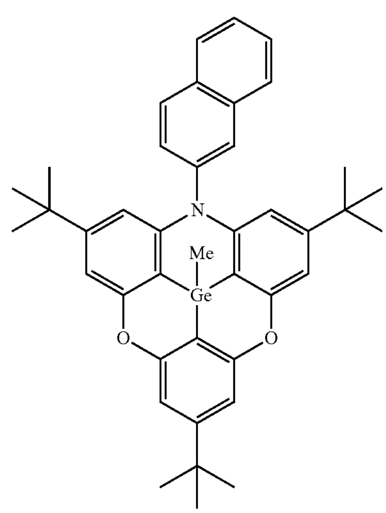

-continued
(1-1112)
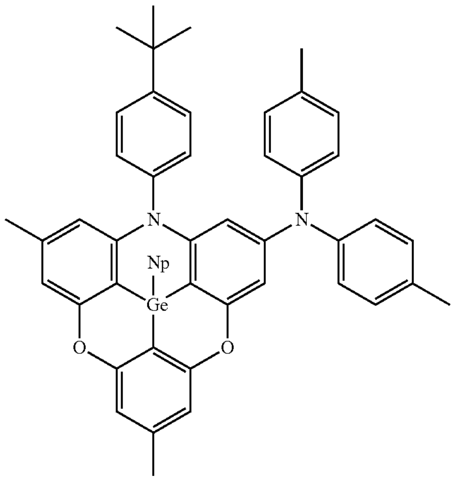
(1-1113)
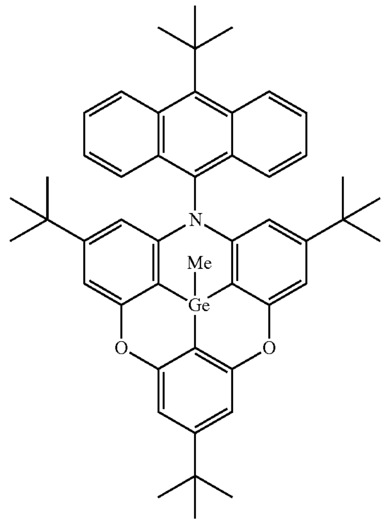
(1-1114)
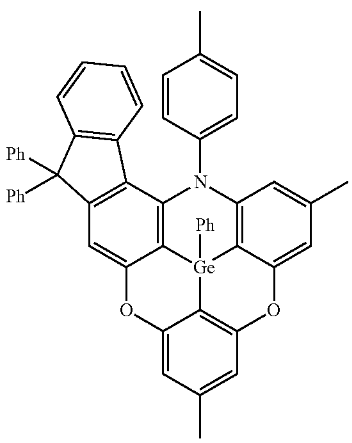
(1-1115)
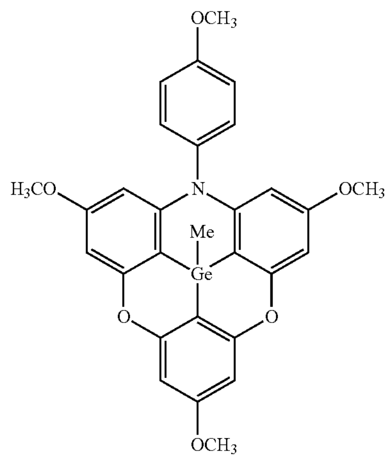
(1-1121)
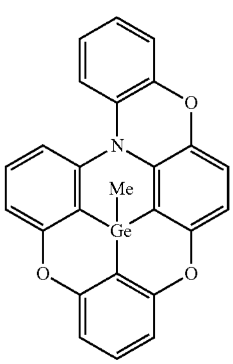
(1-1122)
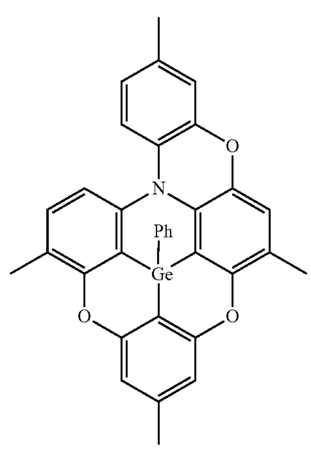

-continued
(1-1123)
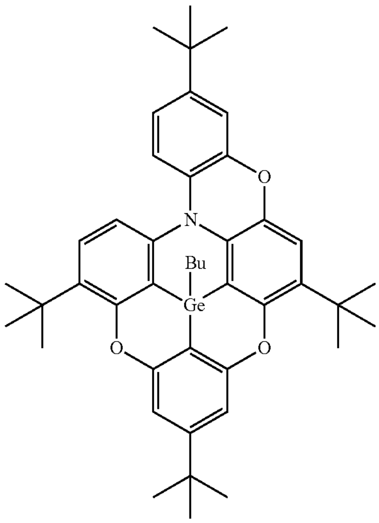
(1-1124)
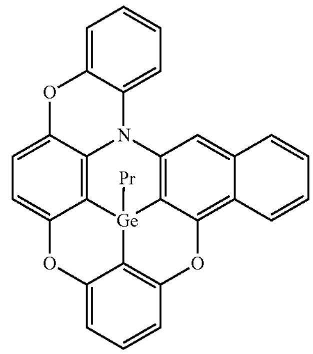
(1-1125)
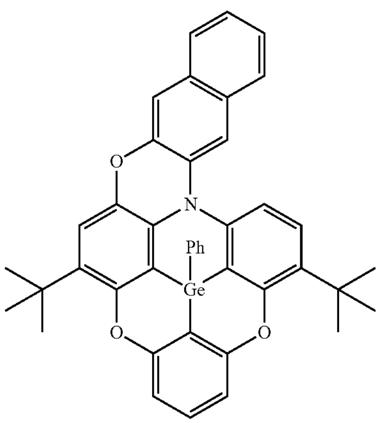
(1-1126)
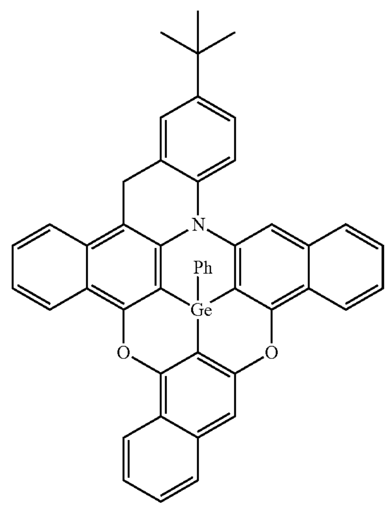
(1-1127)
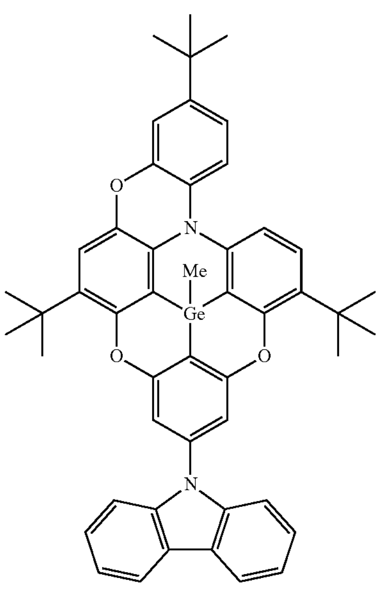
(1-1128)
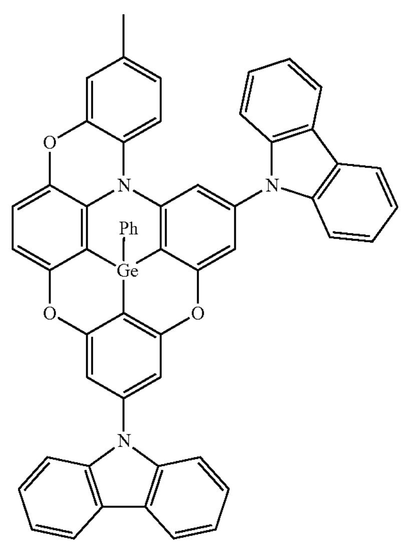

-continued
(1-1129)
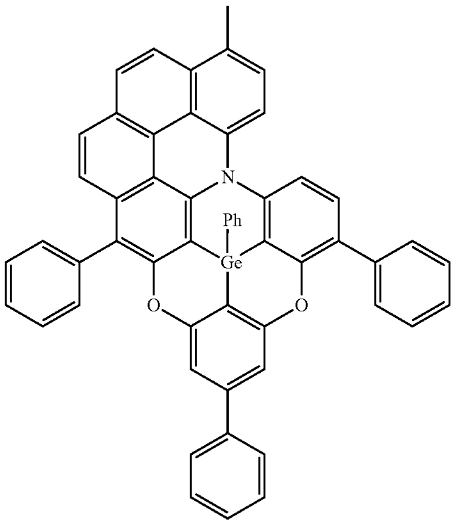
(1-1130)
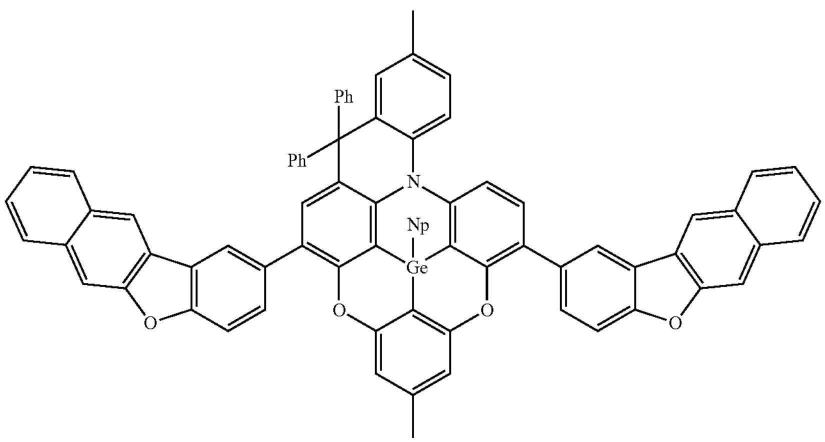
(1-1131)
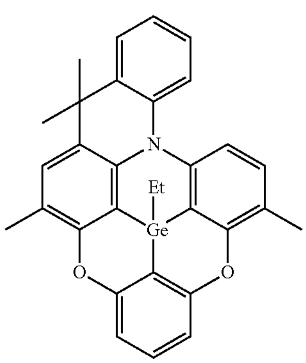
(1-1132)
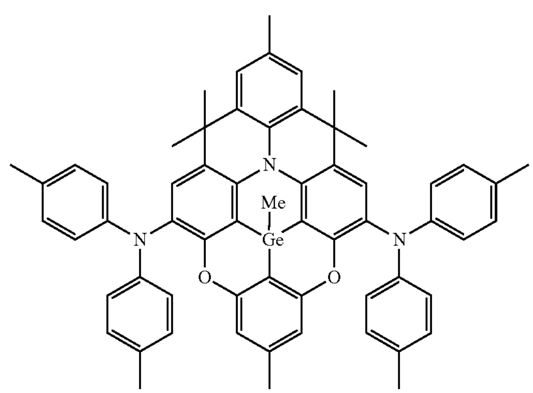

-continued
(1-1133)
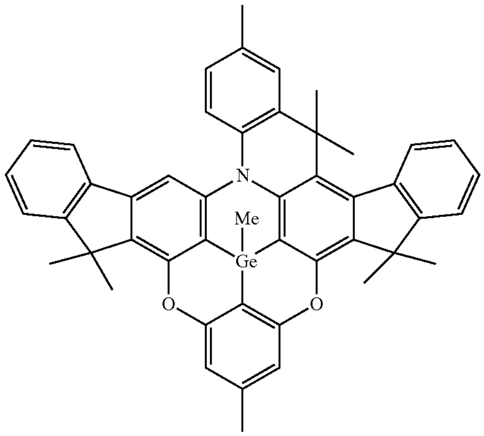
(1-1144)
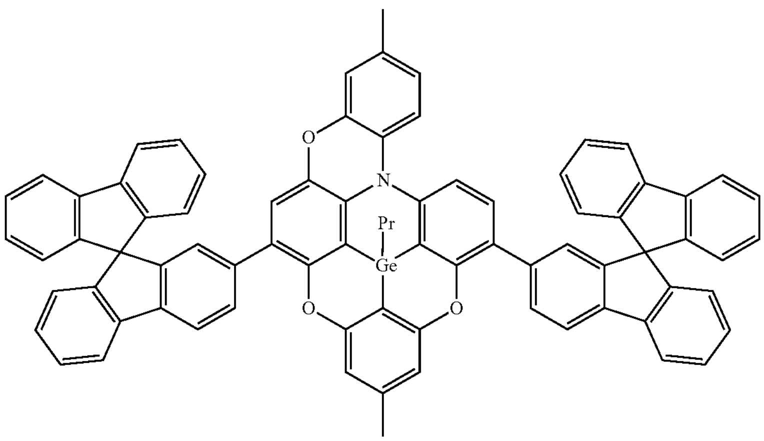
(1-1145)
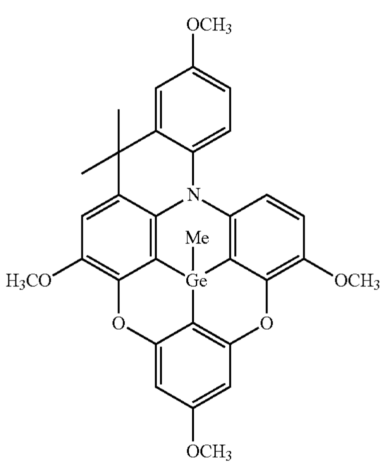
(1-1161)
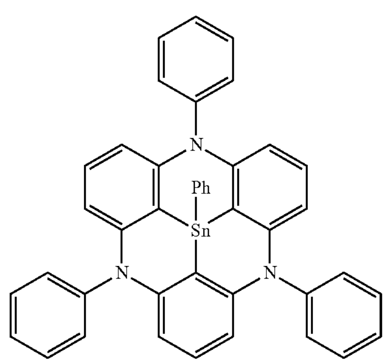

-continued
(1-1162)
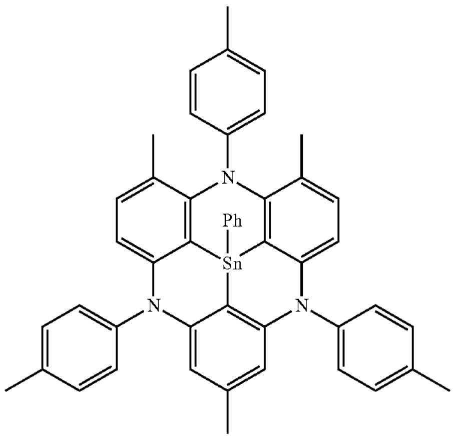
(1-1163)
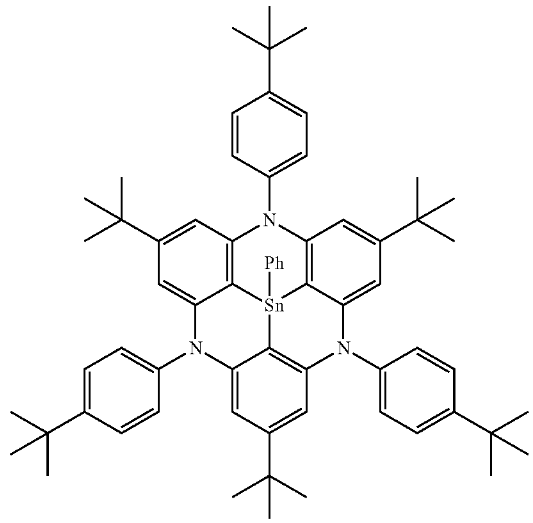
(1-1164)
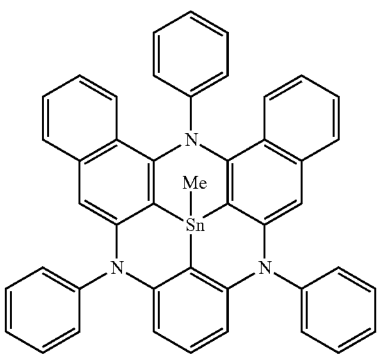
(1-1165)
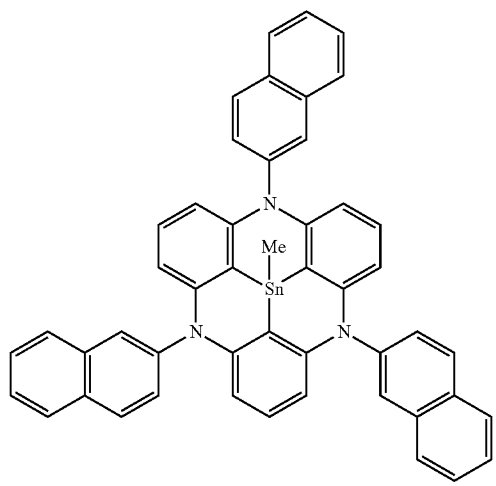
(1-1166)
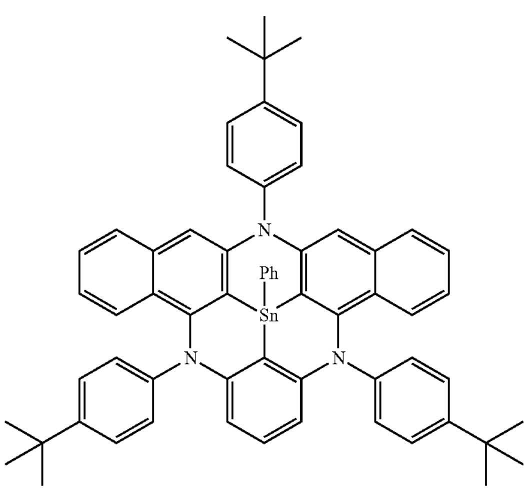
(1-1167)
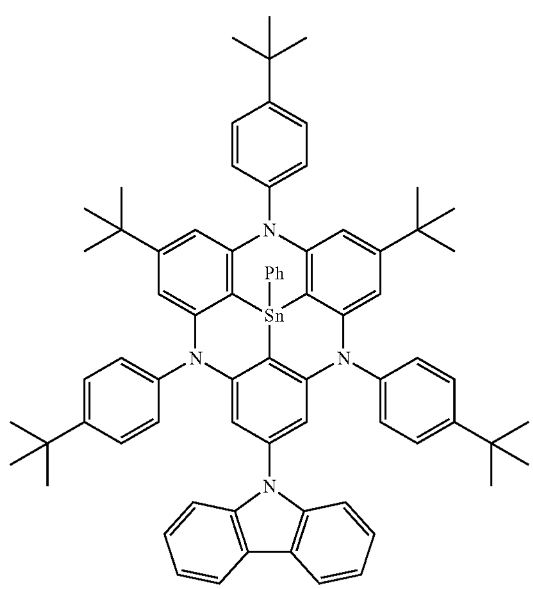

-continued
(1-1168)
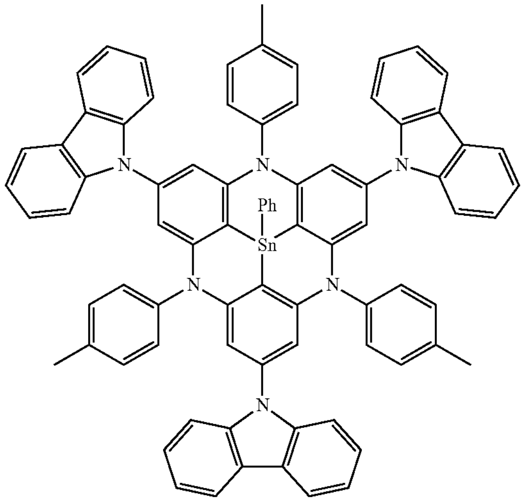
(1-1169)
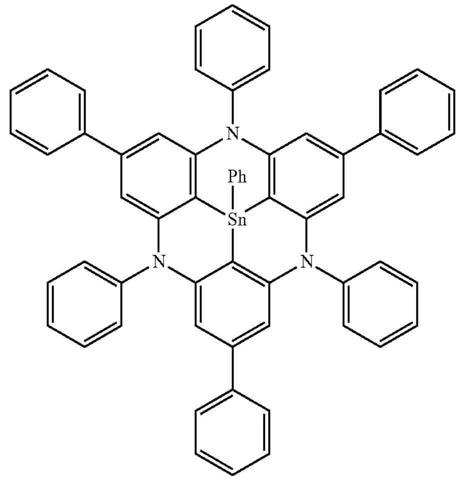
(1-1170)
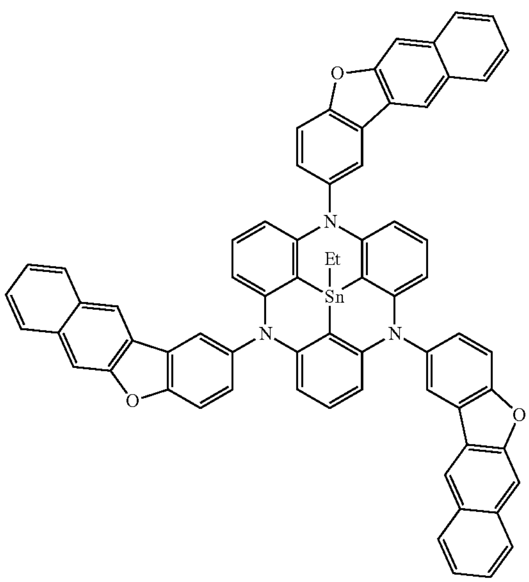
(1-1171)
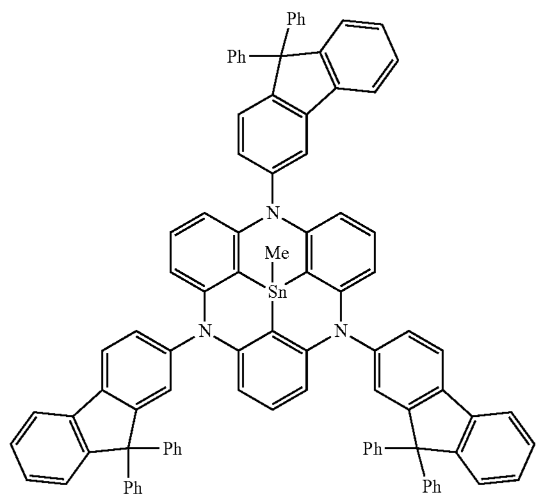
(1-1172)
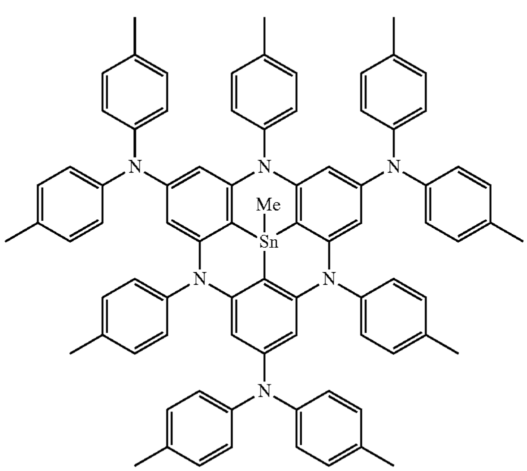
(1-1173)
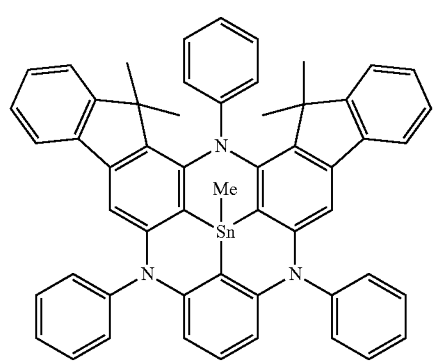

-continued
(1-1174)
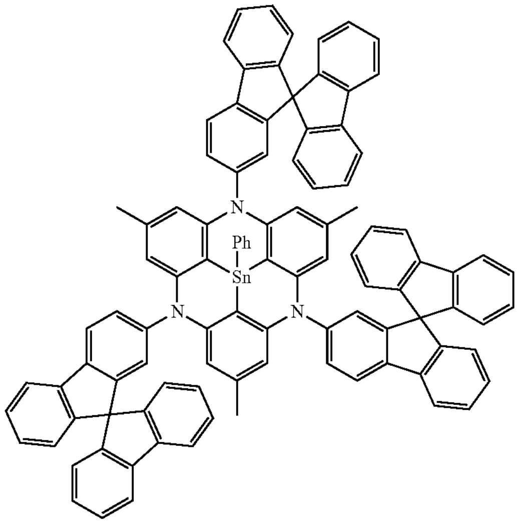
(1-1175)
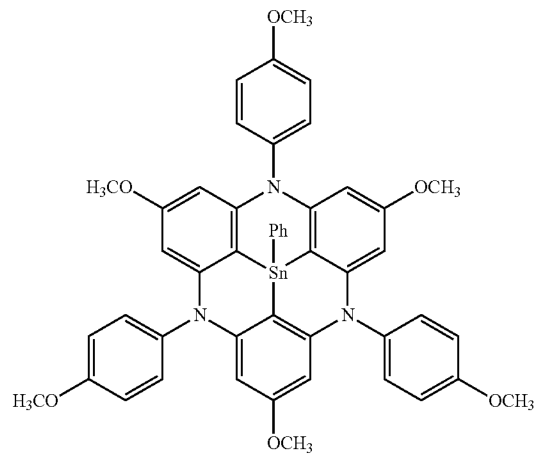
(1-1181)
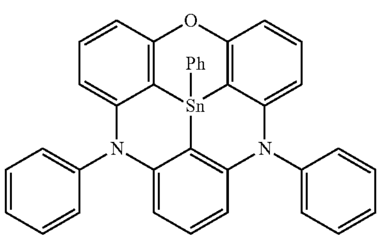
(1-1182)
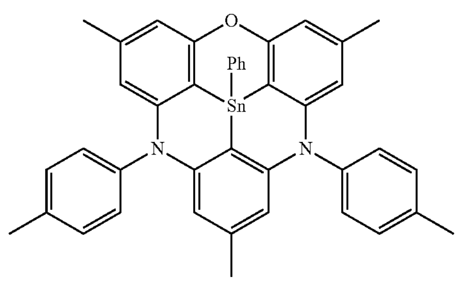
(1-1183)
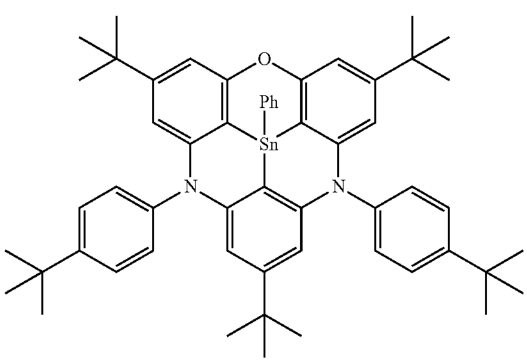

-continued
(1-1184)
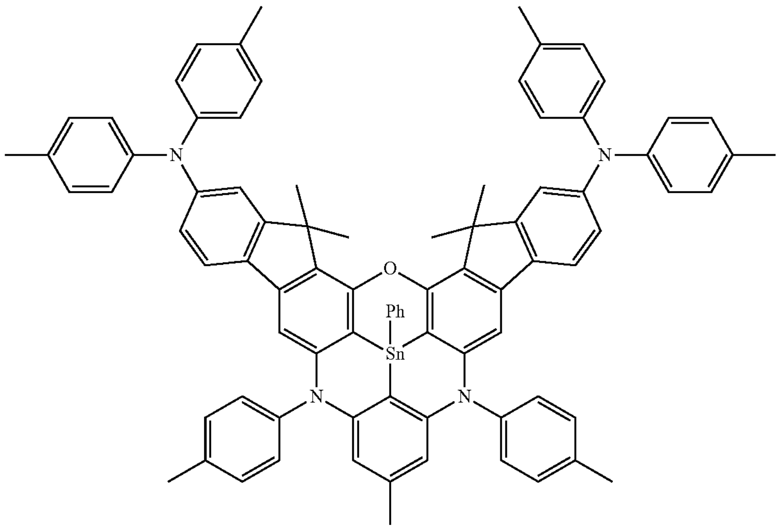
(1-1185)
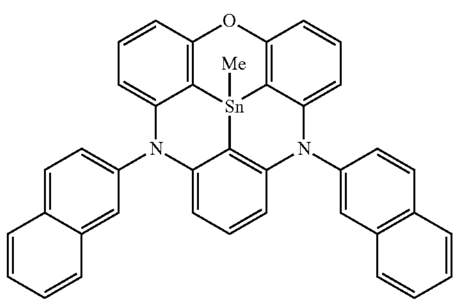
(1-1186)
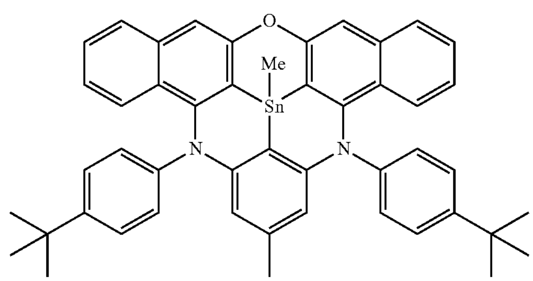
(1-1187)
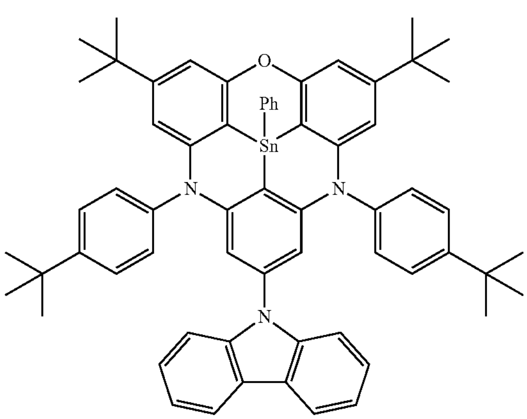
(1-1188)
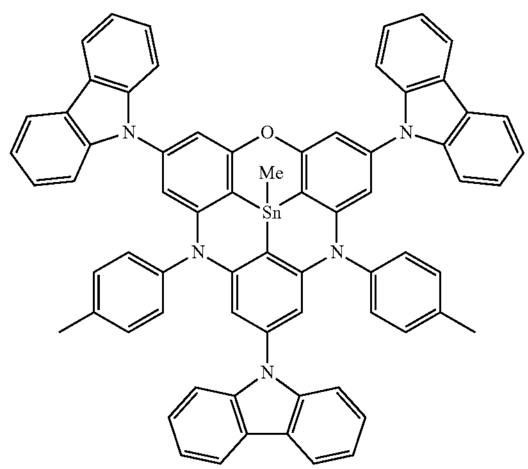

-continued
(1-1189)
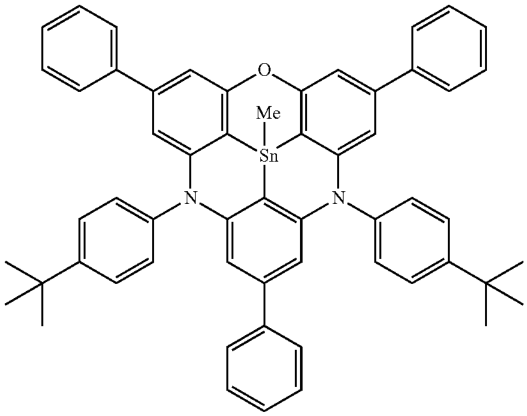
(1-1190)
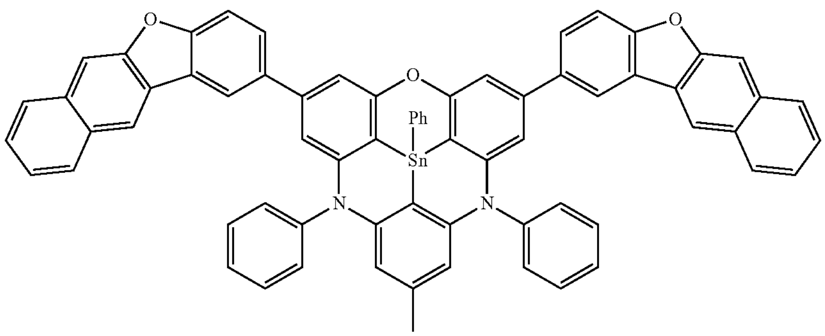
(1-1191)
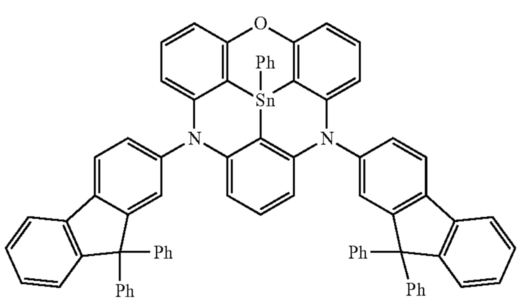
(1-1192)
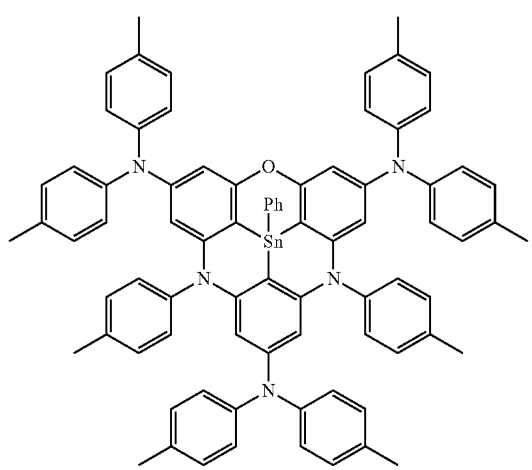
(1-1193)
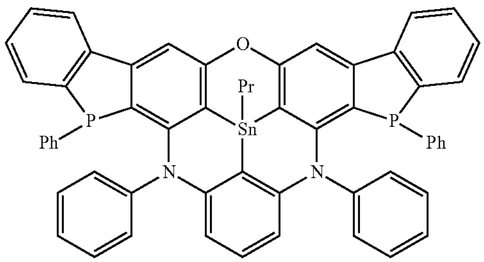
(1-1194)
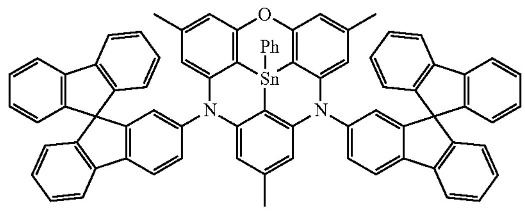

-continued
(1-1195)
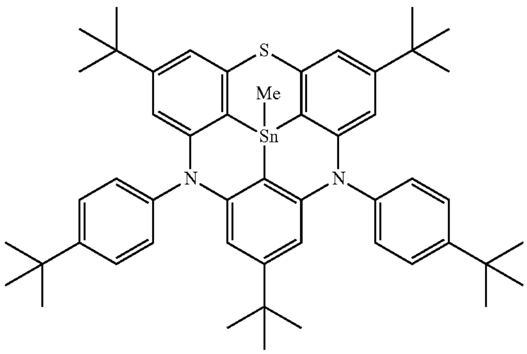
(1-1201)
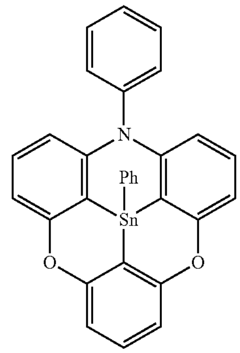
(1-1202)
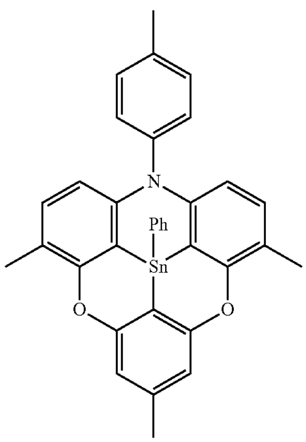
(1-1203)
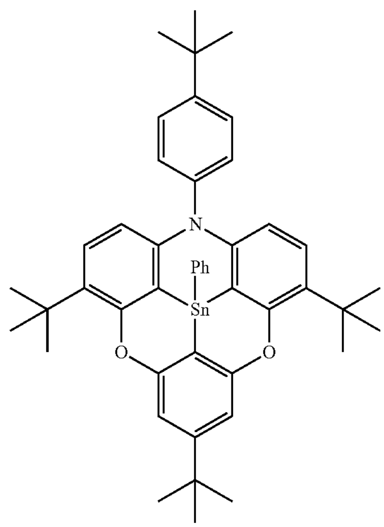
(1-1204)
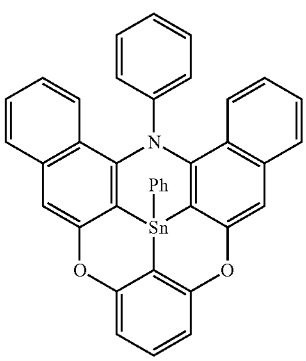
(1-1205)
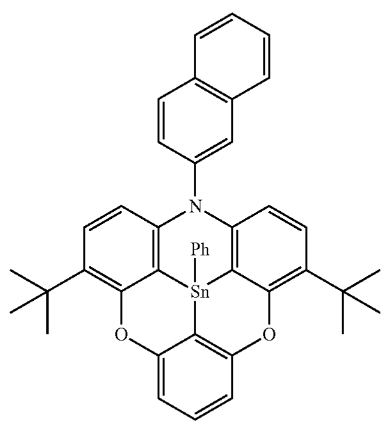

-continued
(1-1206)
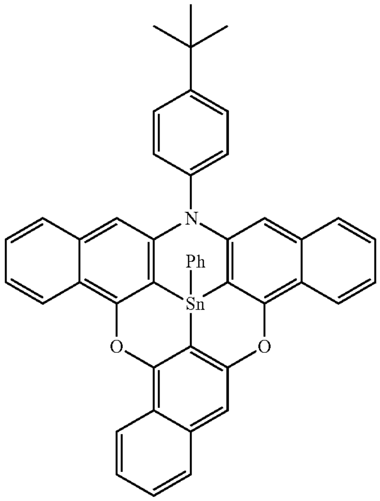
(1-1207)
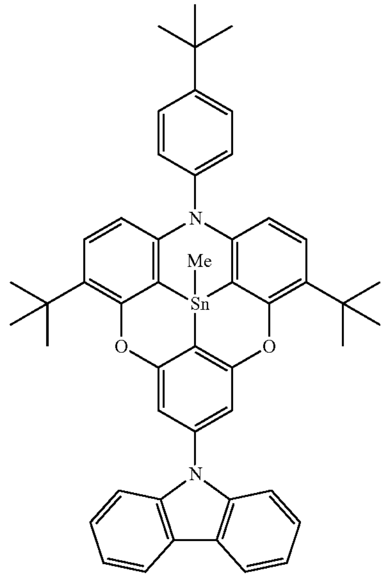
(1-1208)
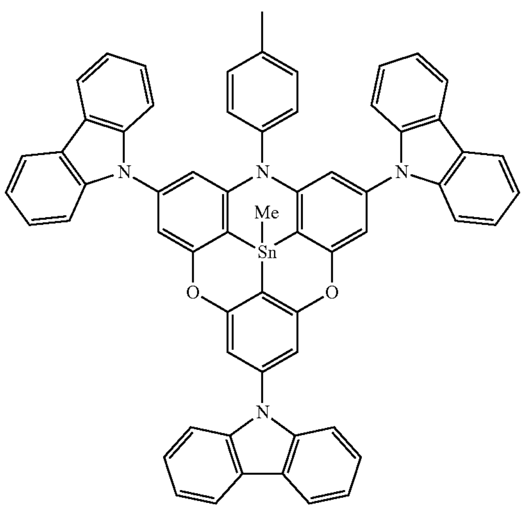
(1-1209)
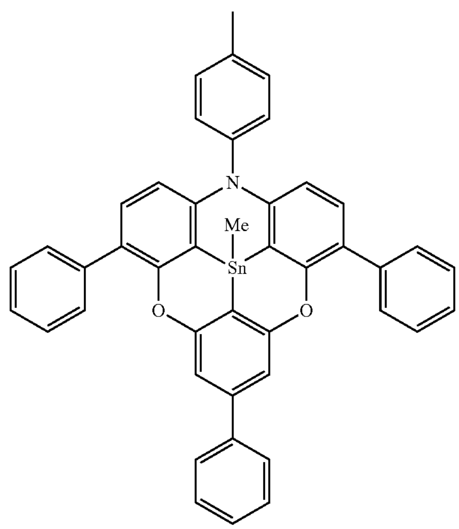
(1-1210)
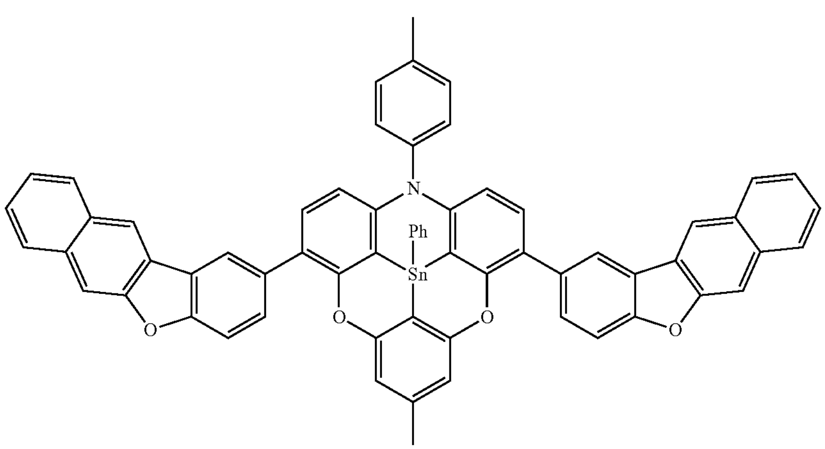

-continued
(1-1211)
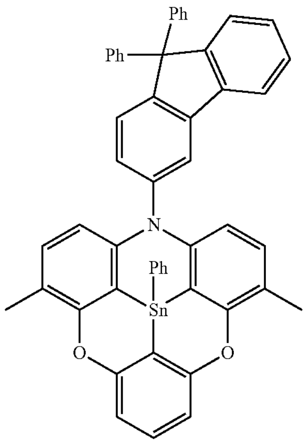
(1-1212)
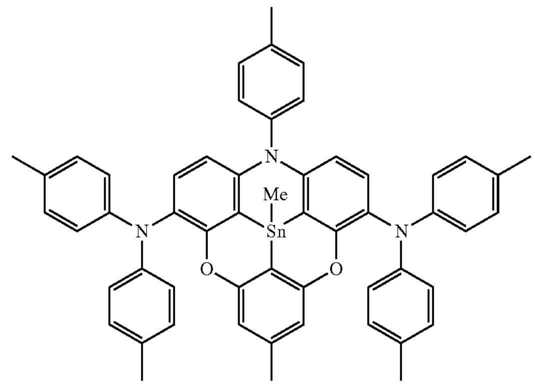
(1-1213)
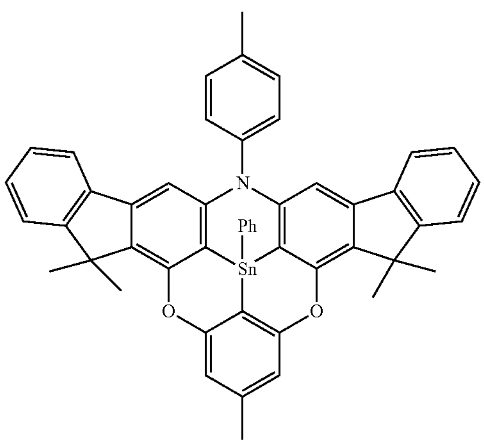
(1-1214)
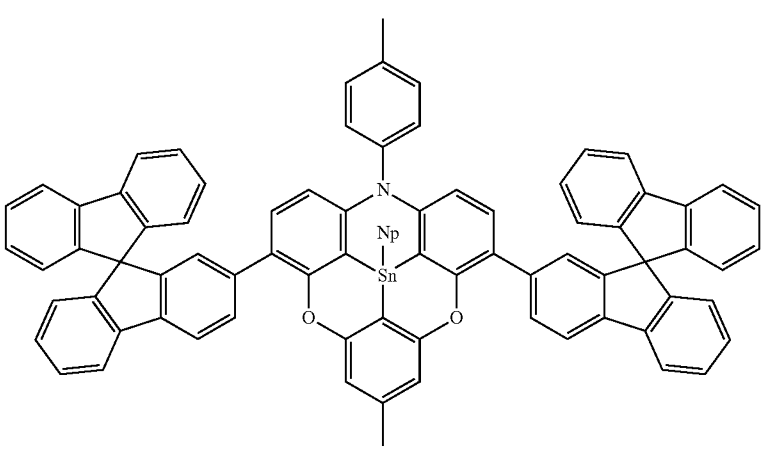

-continued
(1-1215)
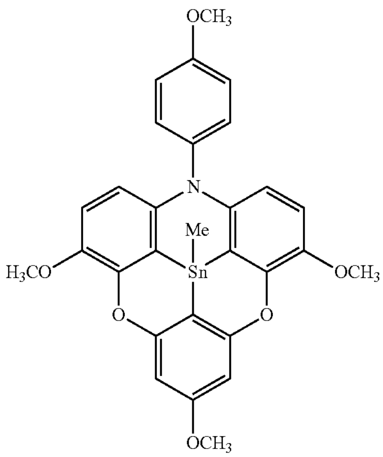
(1-1221)
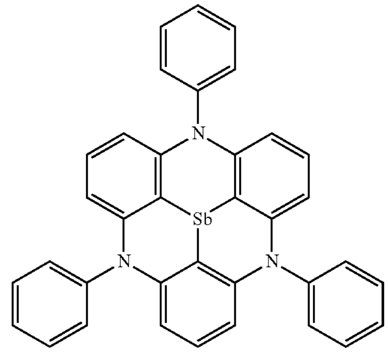
(1-1222)
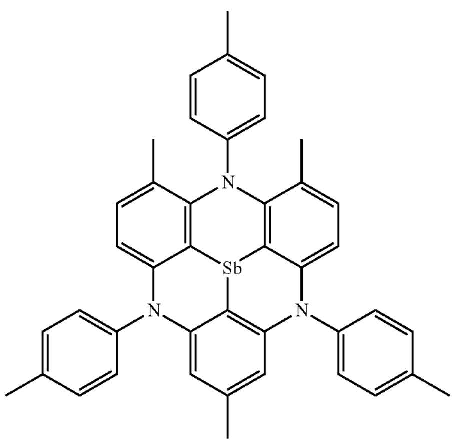
(1-1223)
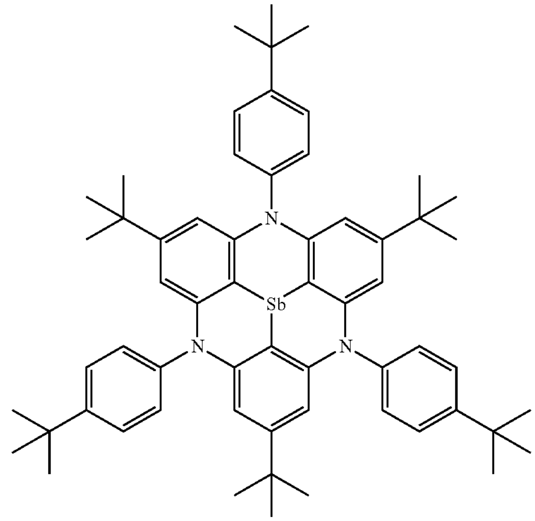
(1-1224)
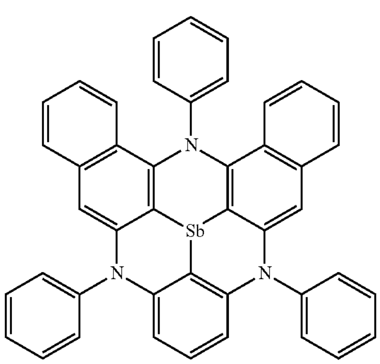
(1-1225)
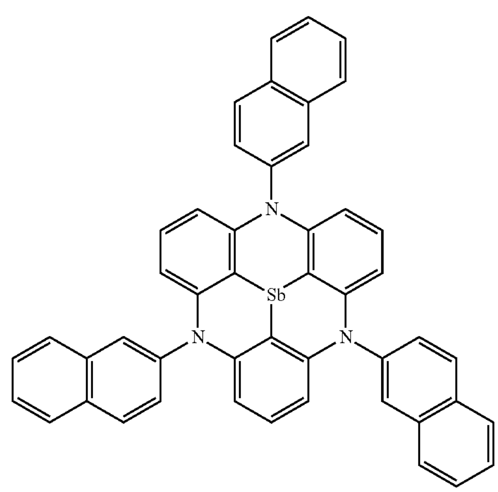

-continued
(1-1226)
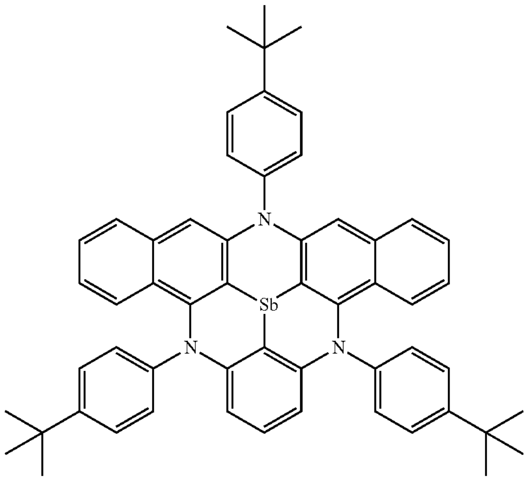
(1-1227)
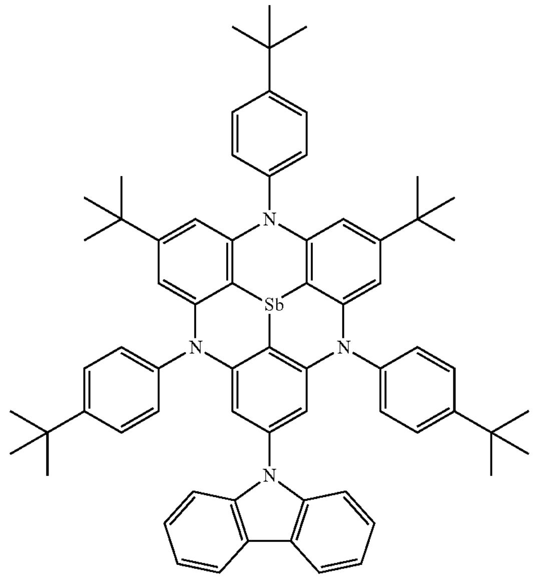
(1-1228)
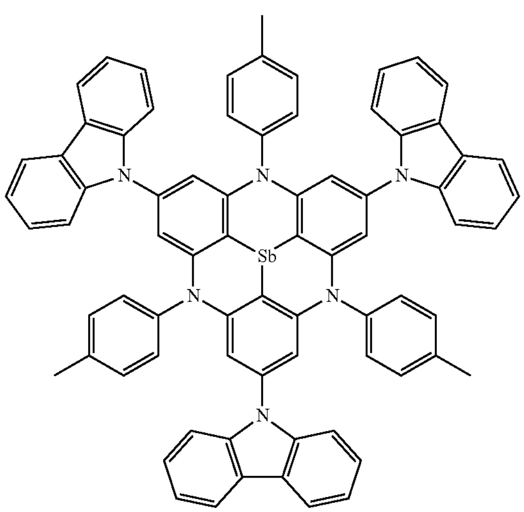
(1-1229)
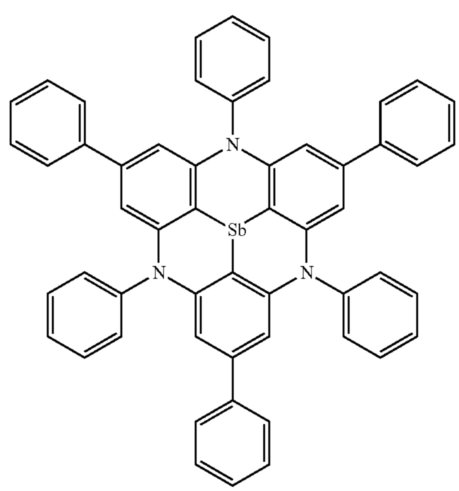

-continued
(1-1230)
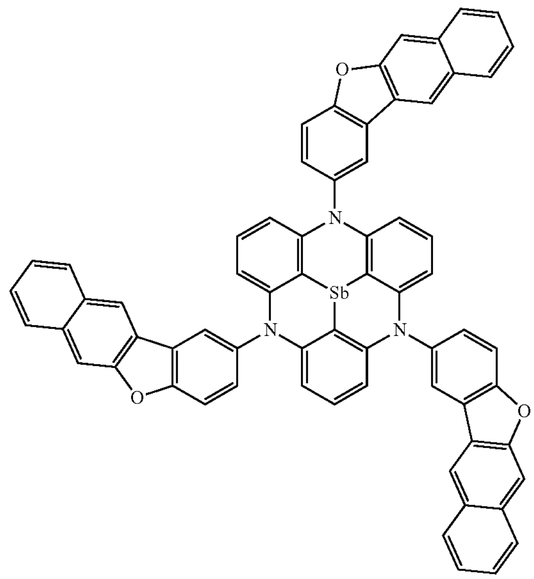
(1-1231)
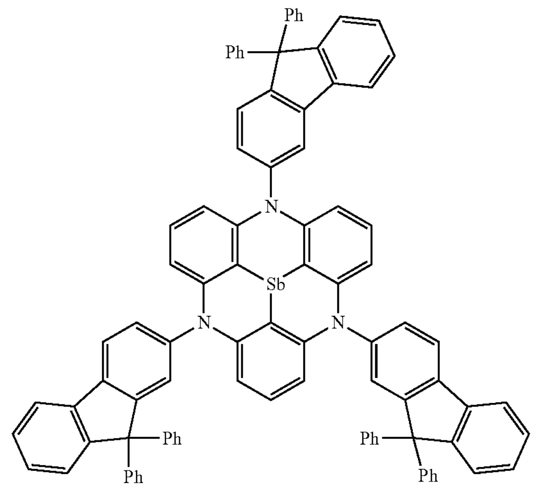
(1-1232)
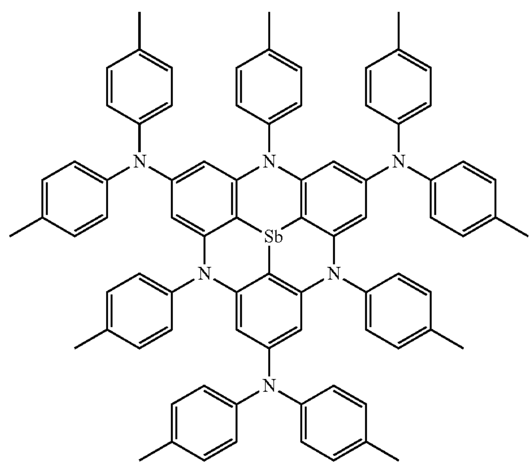
(1-1233)
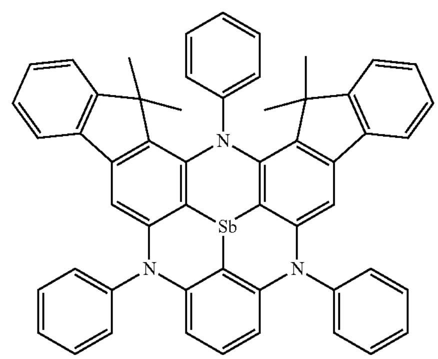
(1-1234)
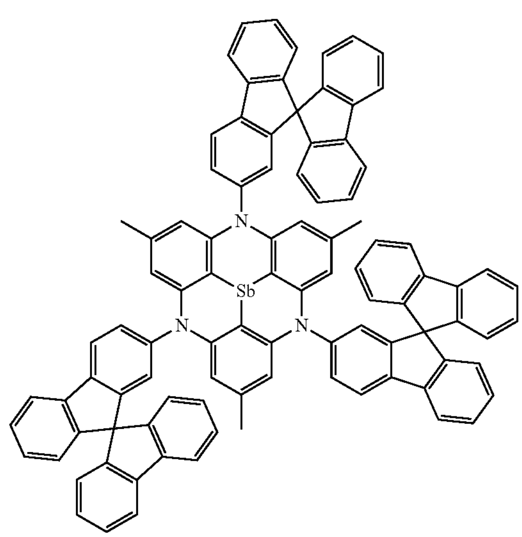
(1-1235)
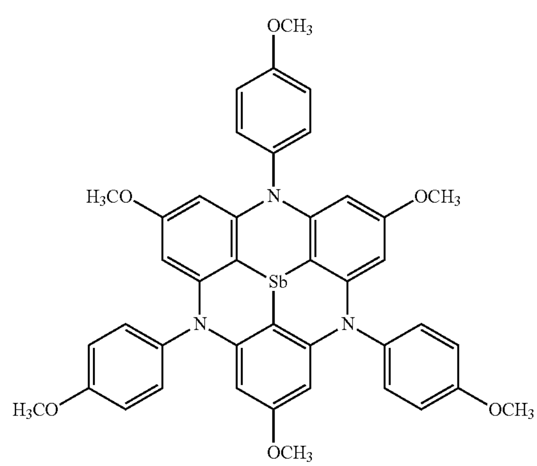

-continued
(1-1241)
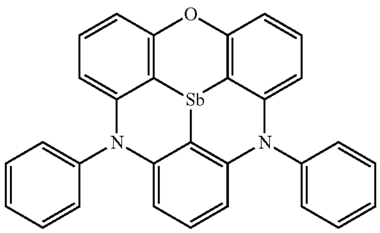
(1-1242)
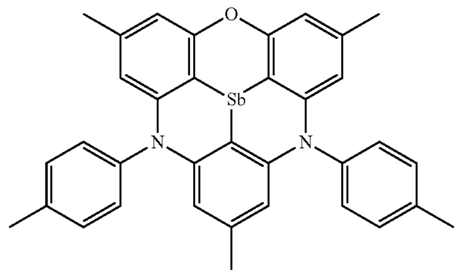
(1-1243)
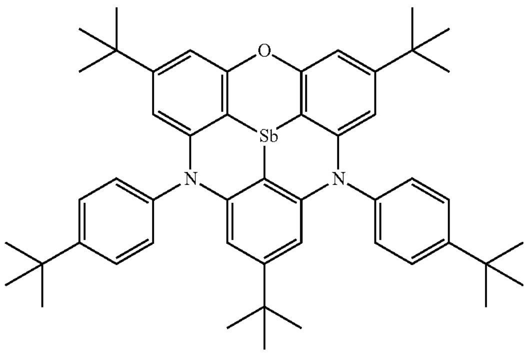
(1-1244)
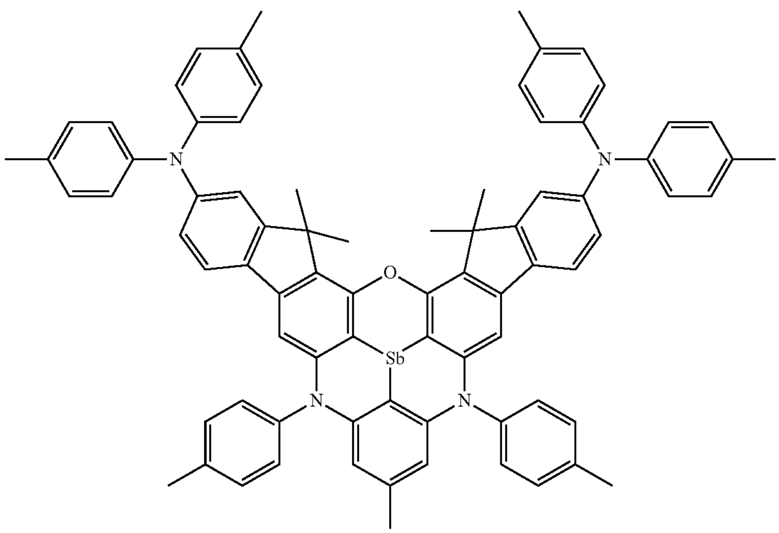
(1-1245)
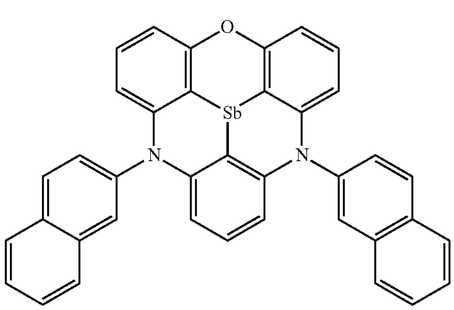
(1-1246)
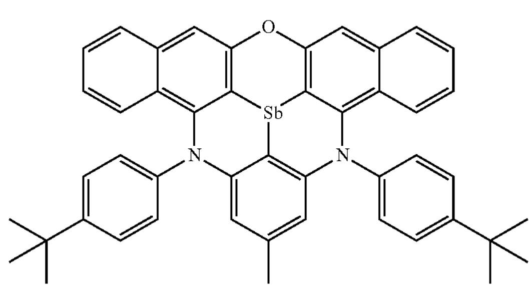

-continued
(1-1247)
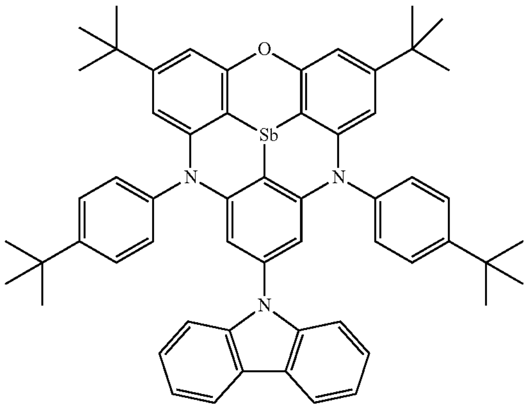
(1-1248)
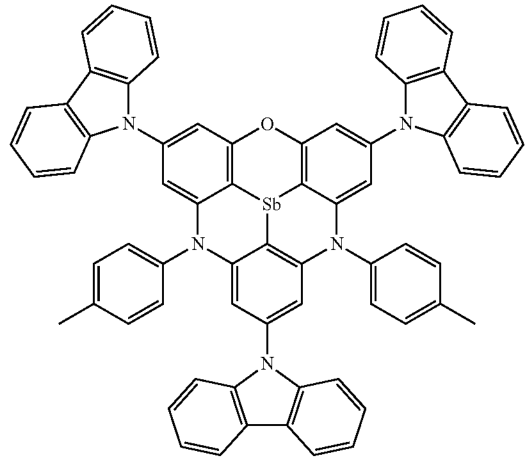
(1-1249)
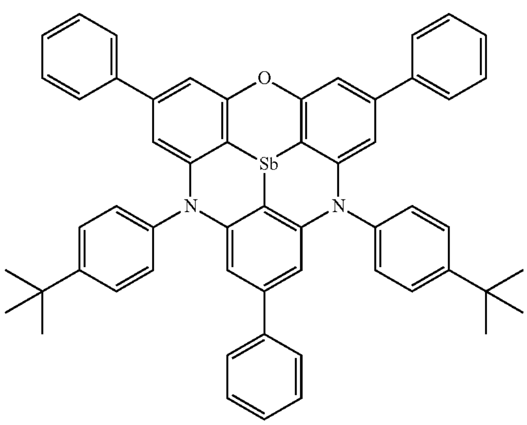
(1-1250)
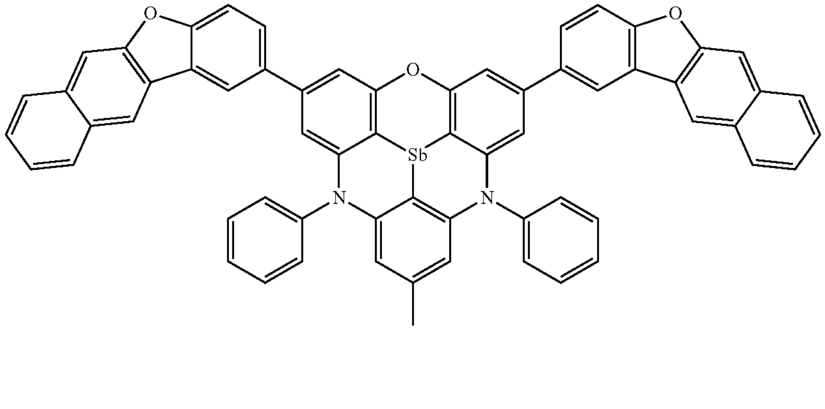

-continued
(1-1251)
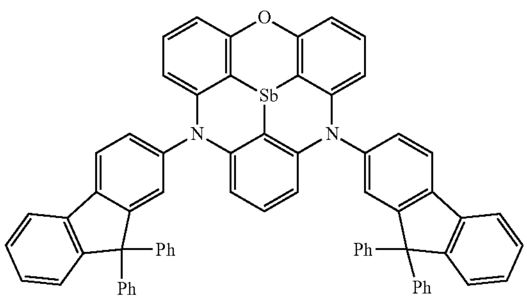
(1-1252)
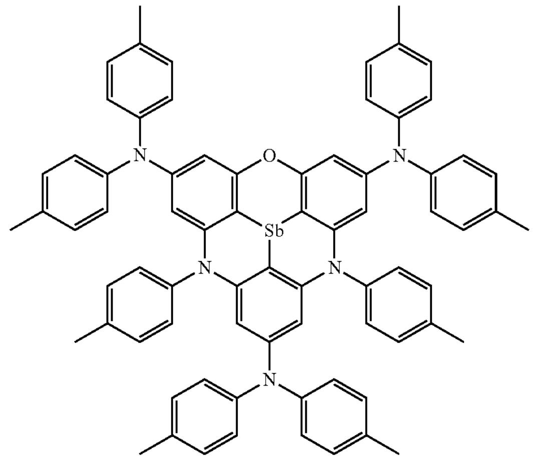
(1-1253)
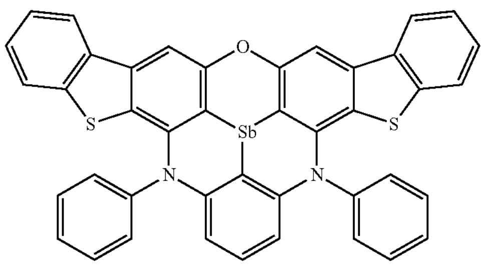
(1-1254)
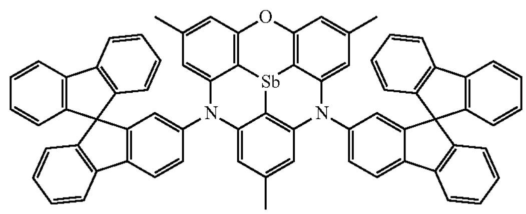
(1-1255)
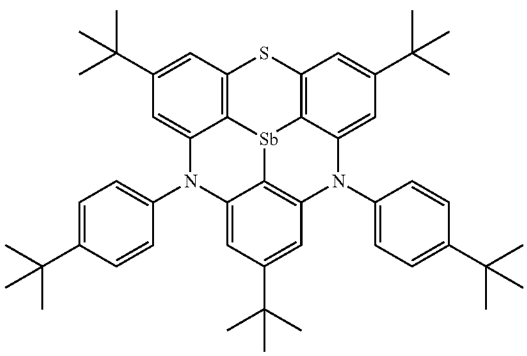
(1-1261)
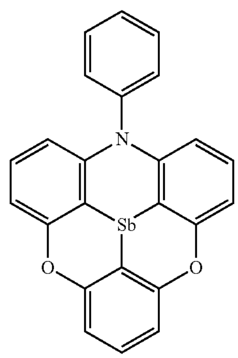
(1-1262)
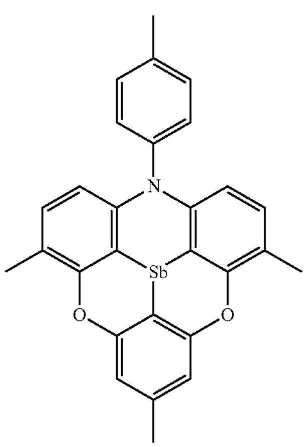
(1-1263)
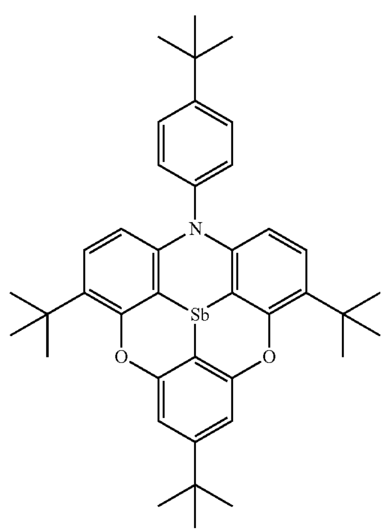

-continued
(1-1264)
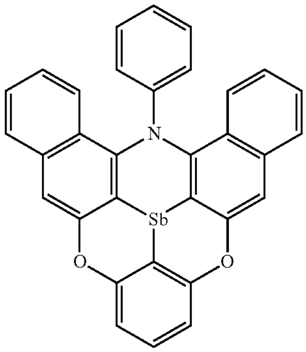
(1-1265)
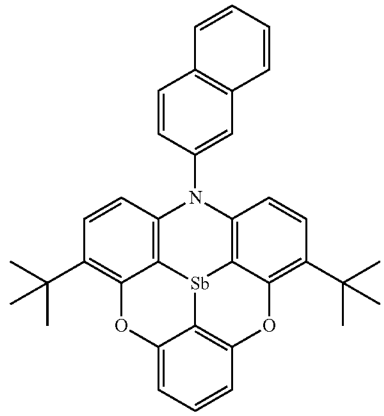
(1-1266)
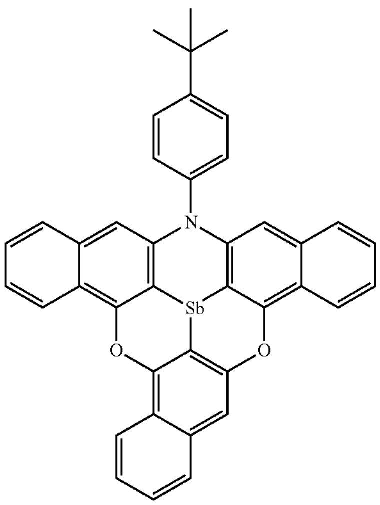
(1-1267)
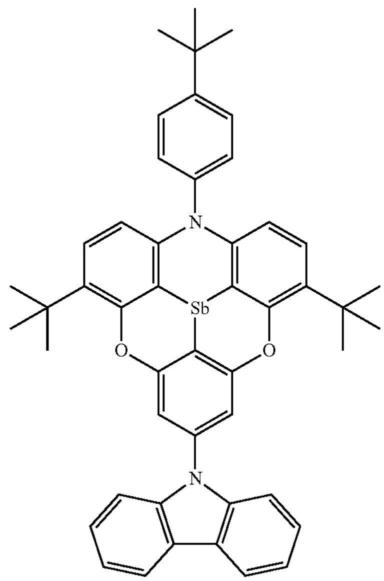
(1-1268)
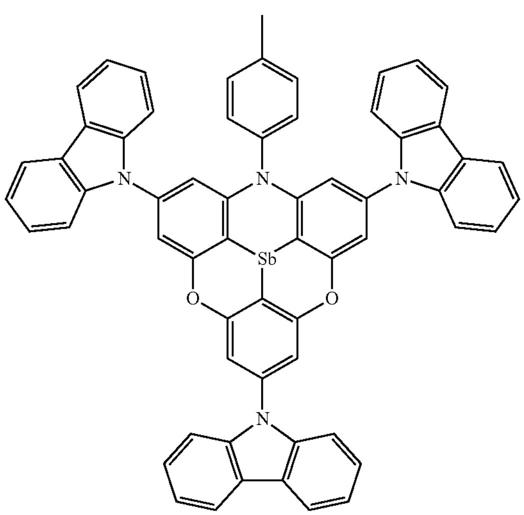
(1-1269)
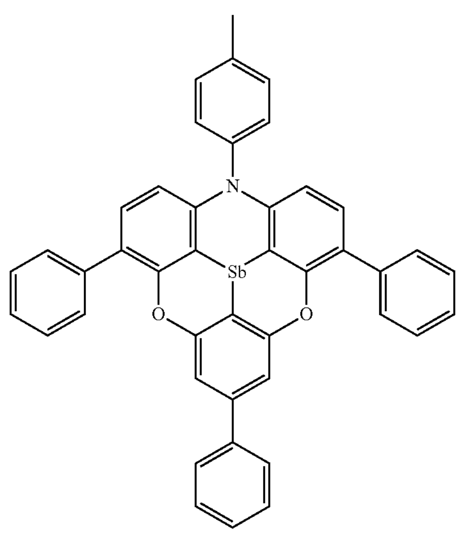

-continued
(1-1270)
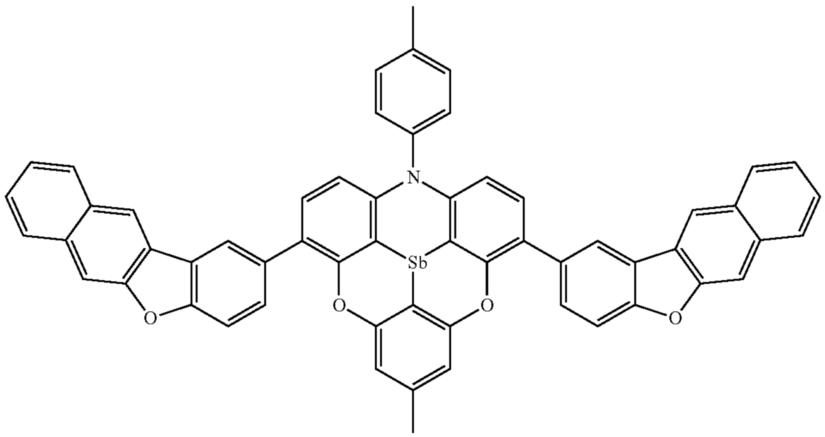
(1-1271)
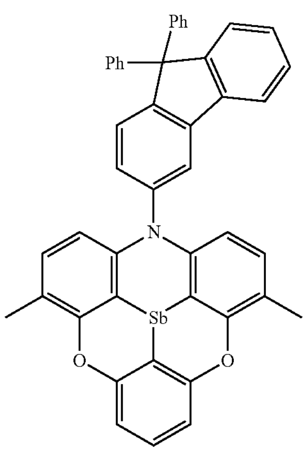
(1-1272)
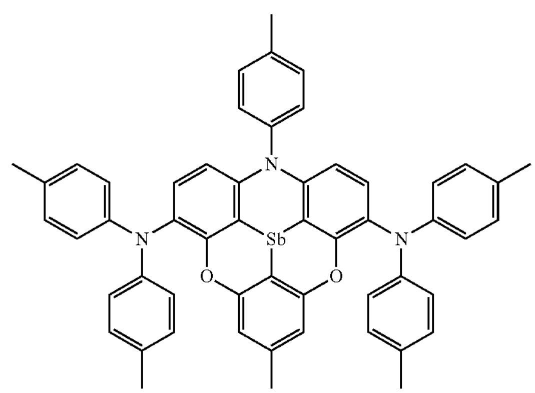
(1-1273)
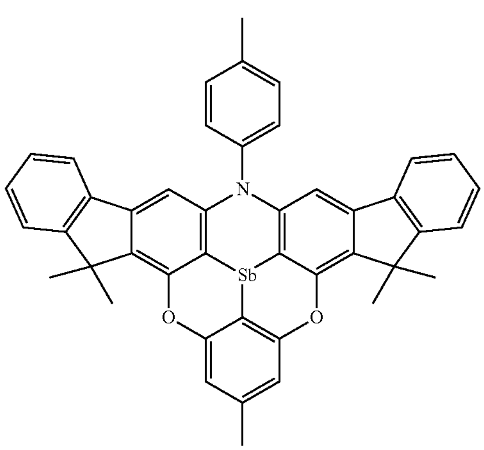

-continued
(1-1274)
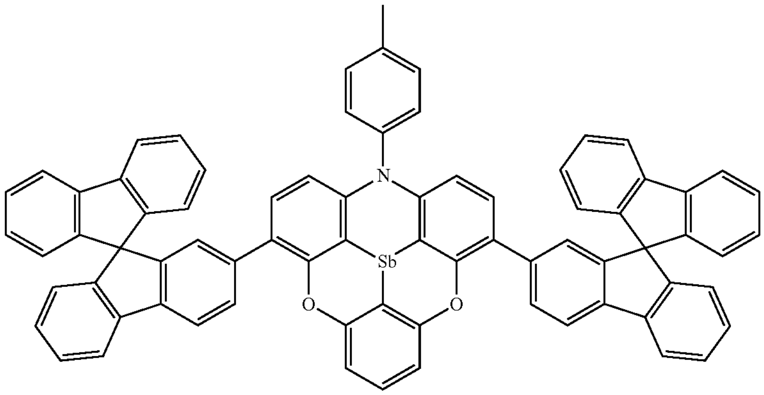
(1-1275)
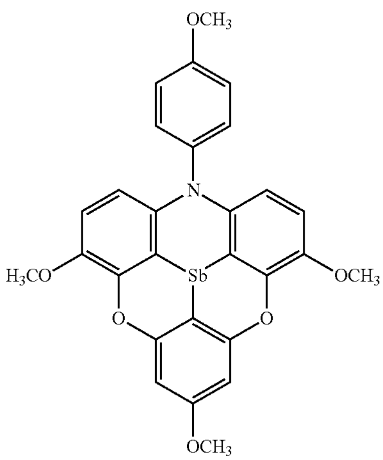
(1-1281)
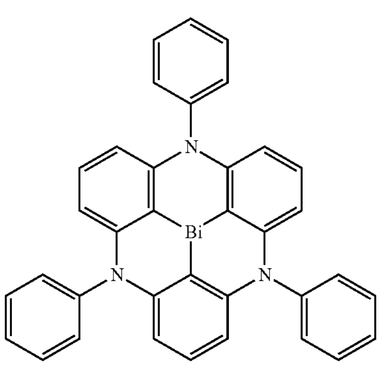
(1-1282)
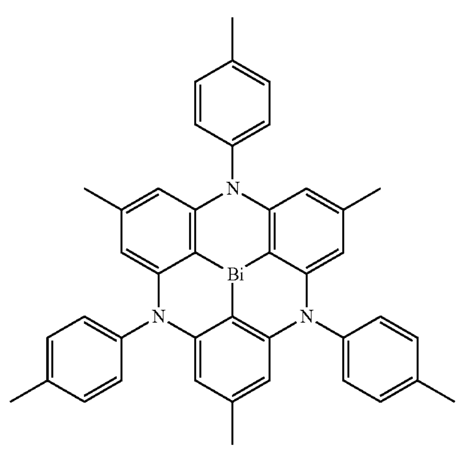

-continued
(1-1283)
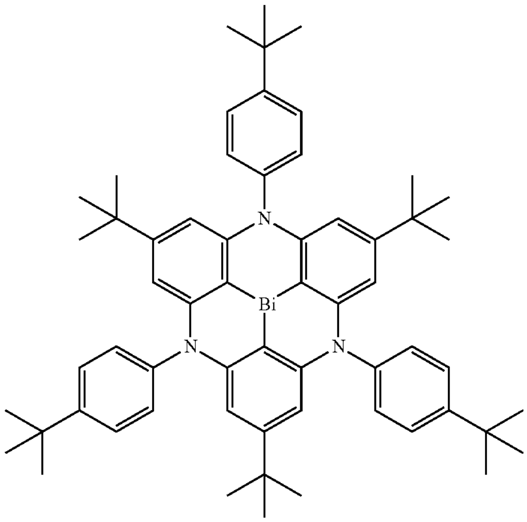
(1-1284)
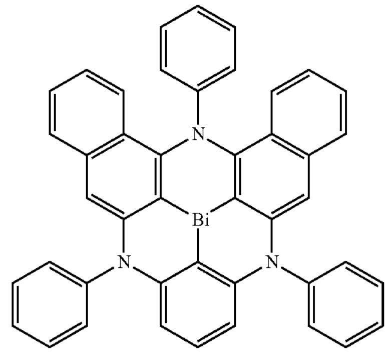
(1-1285)
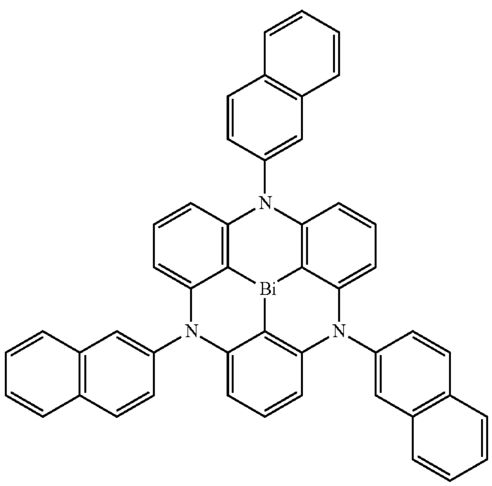
(1-1286)
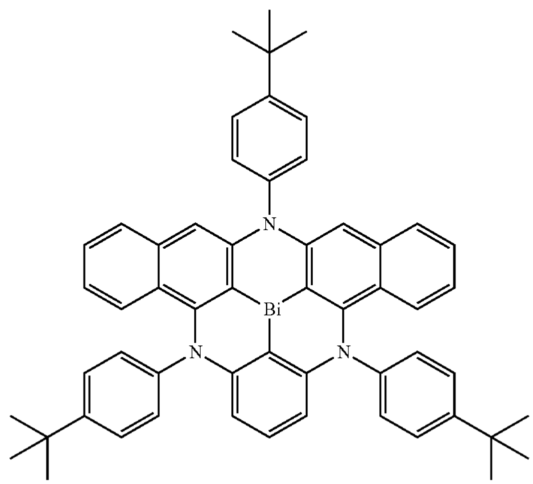
(1-1287)
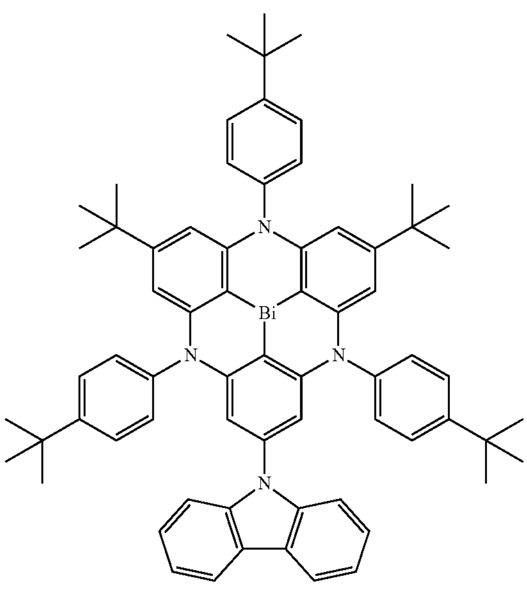
(1-1288)
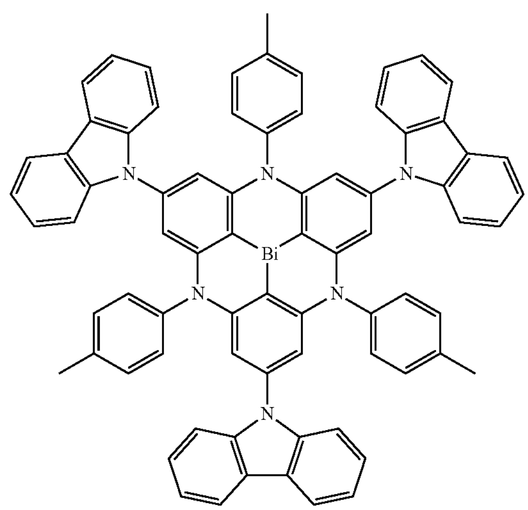

-continued
(1-1289)
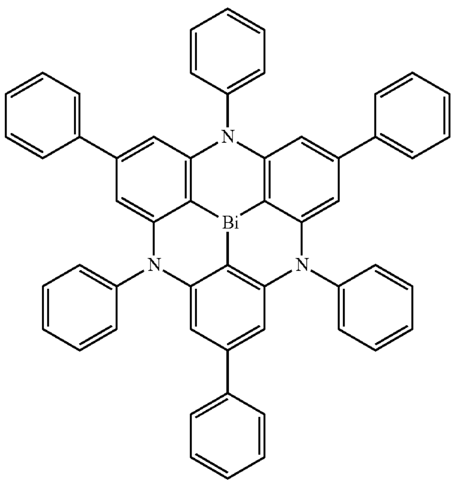
(1-1290)
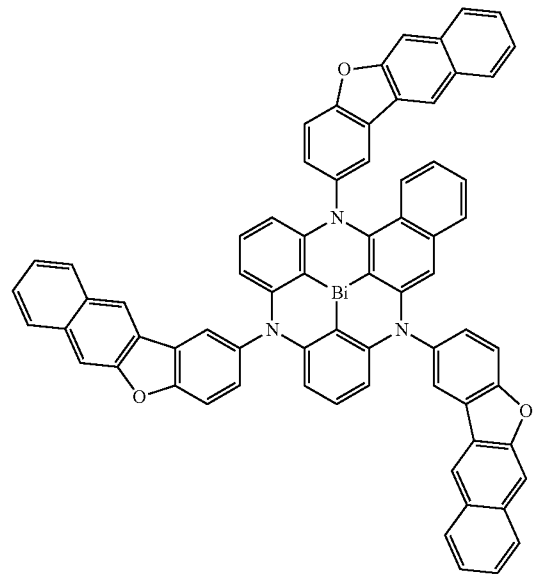
(1-1291)
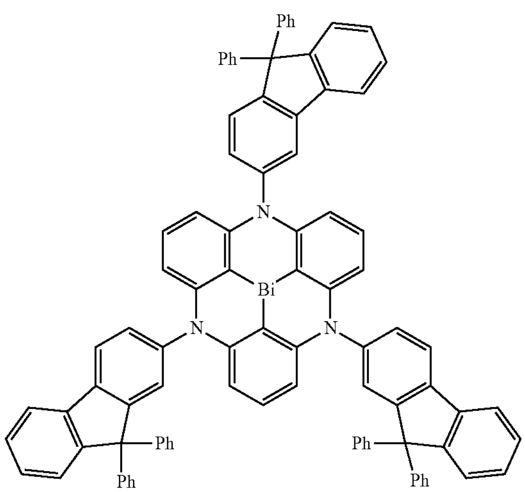
(1-1292)
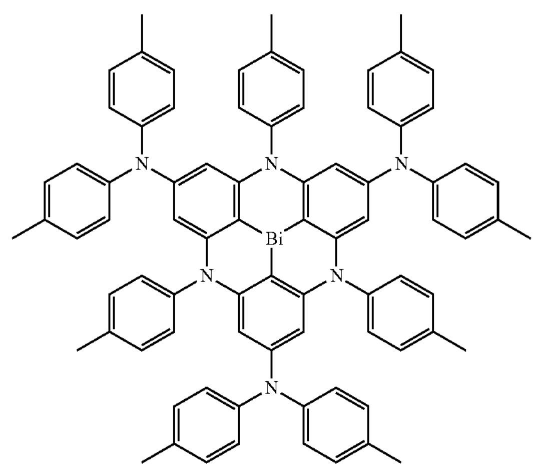
(1-1293)
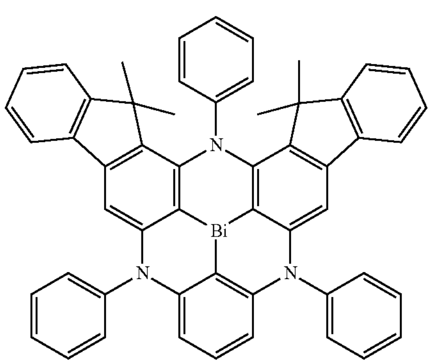
(1-1294)
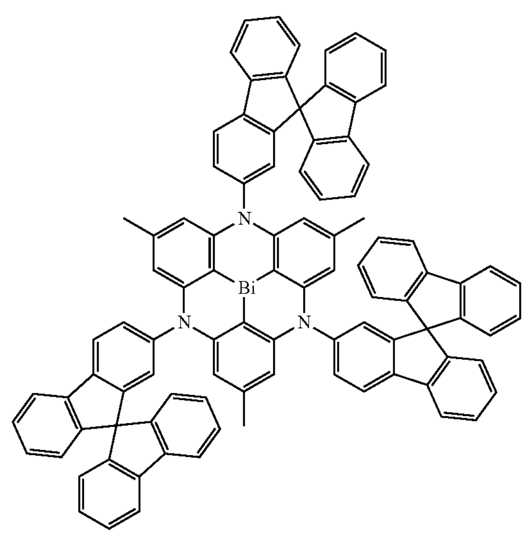

-continued
(1-1295)
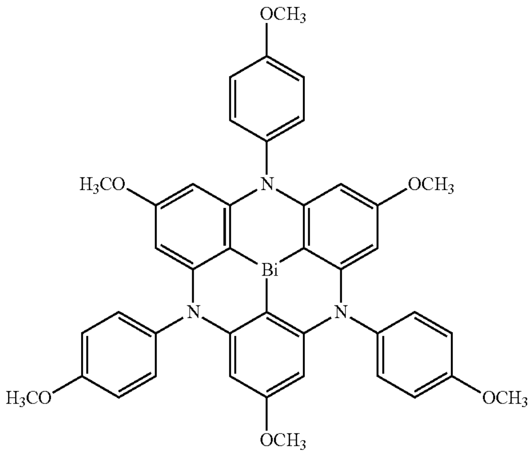
(1-1301)
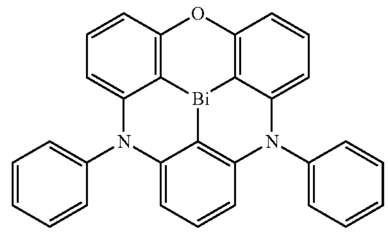
(1-1302)
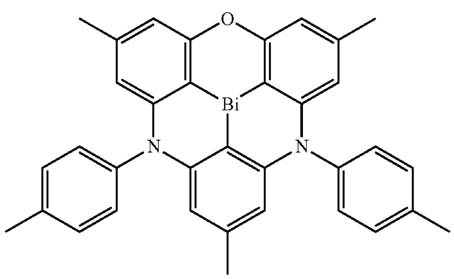
(1-1303)
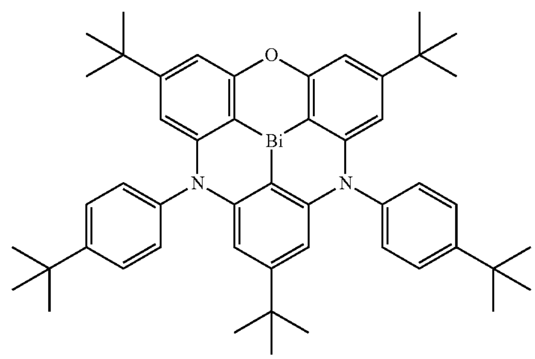
(1-1304)
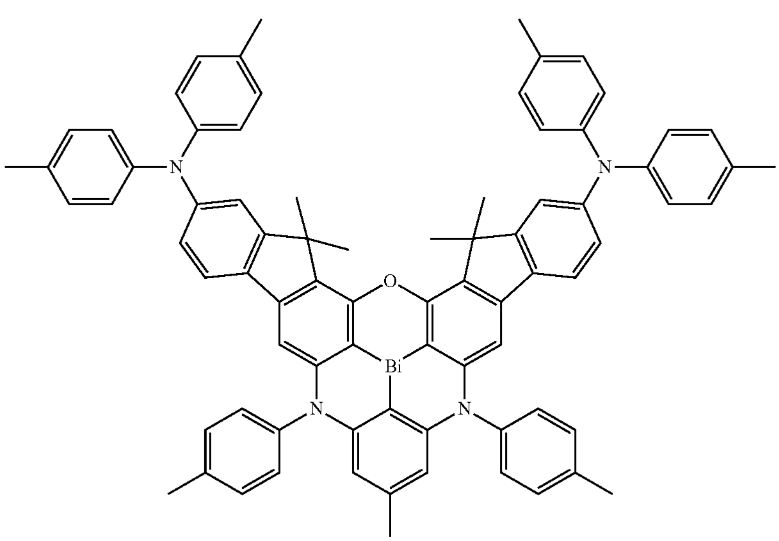

-continued
(1-1305)
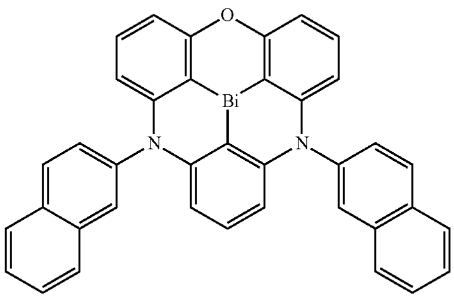
(1-1306)
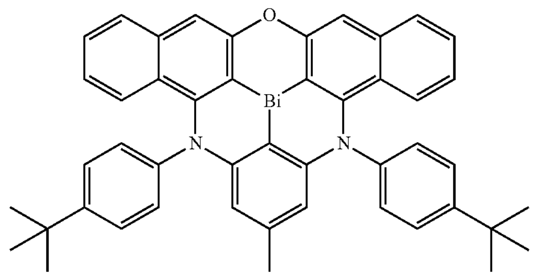
(1-1307)
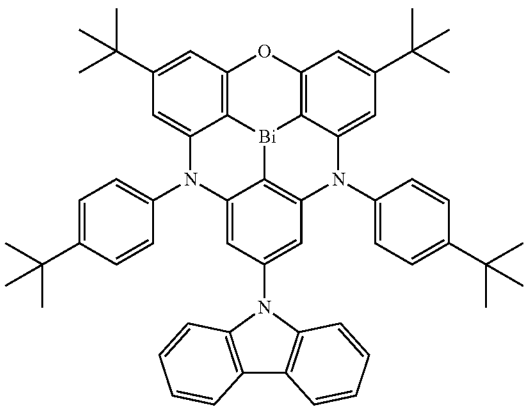
(1-1308)
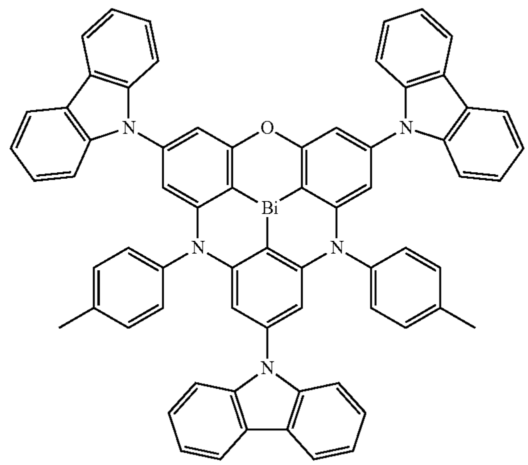
(1-1309)
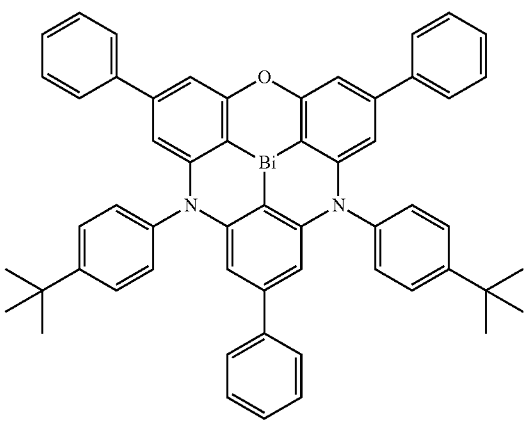
(1-1310)
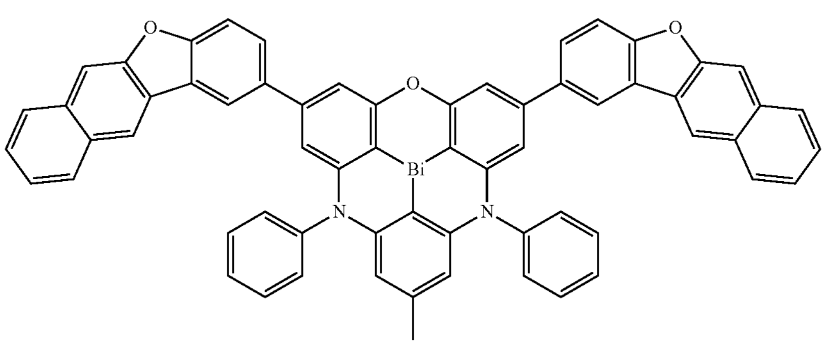

-continued
(1-1311)
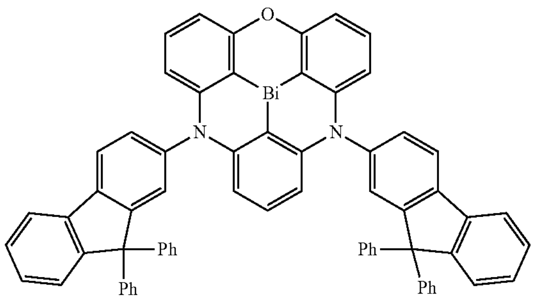
(1-1312)
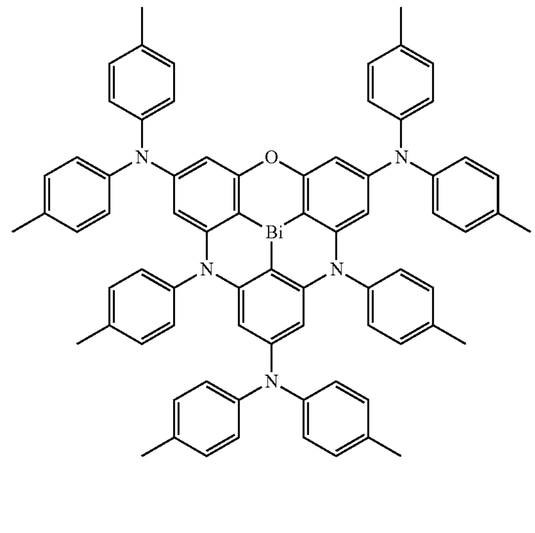
(1-1313)
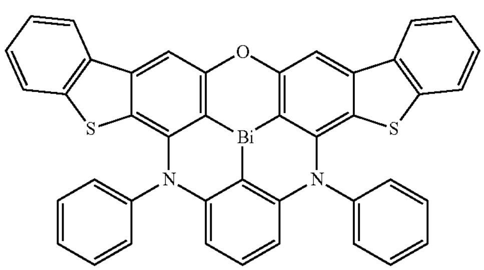
(1-1314)
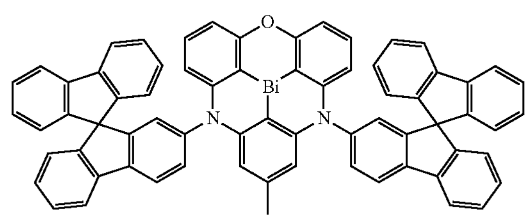
(1-1315)
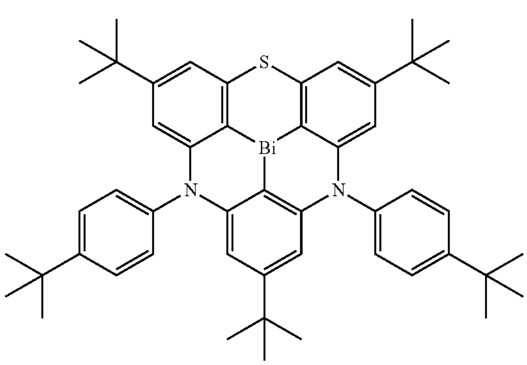
(1-1321)
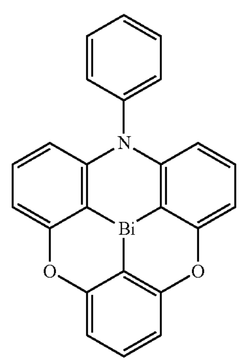

-continued
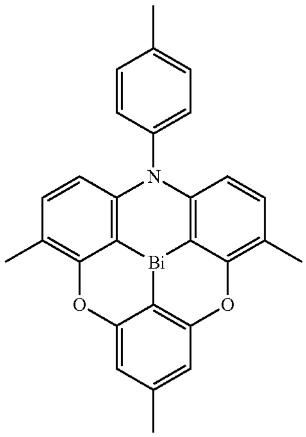
(1-1322)
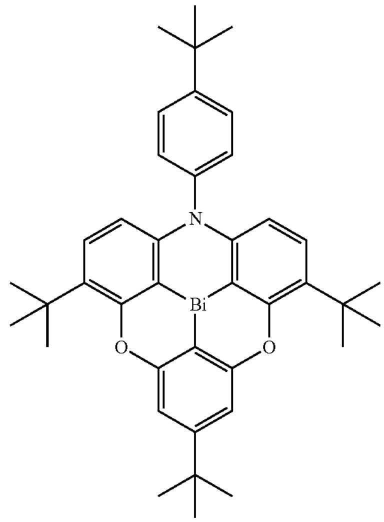
(1-1323)
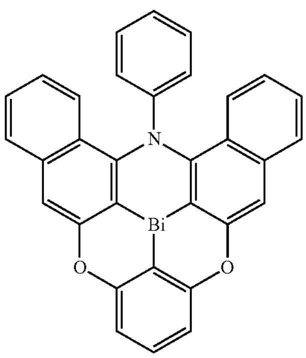
(1-1324)
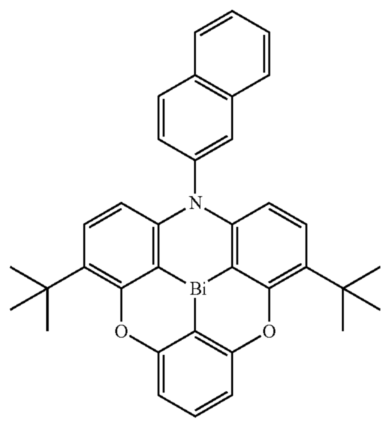
(1-1325)
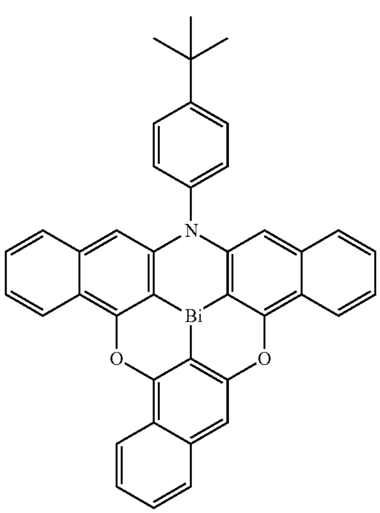
(1-1326)
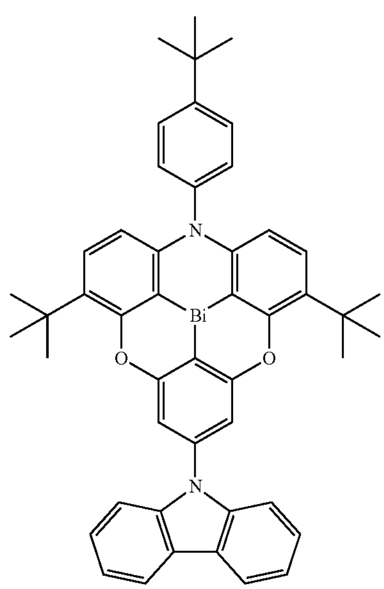
(1-1327)

-continued
(1-1328)
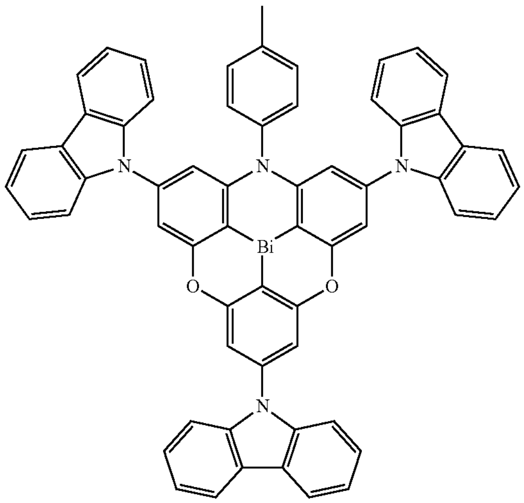
(1-1329)
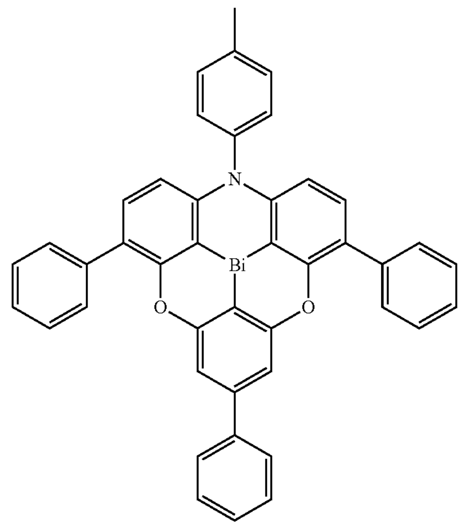
(1-1330)
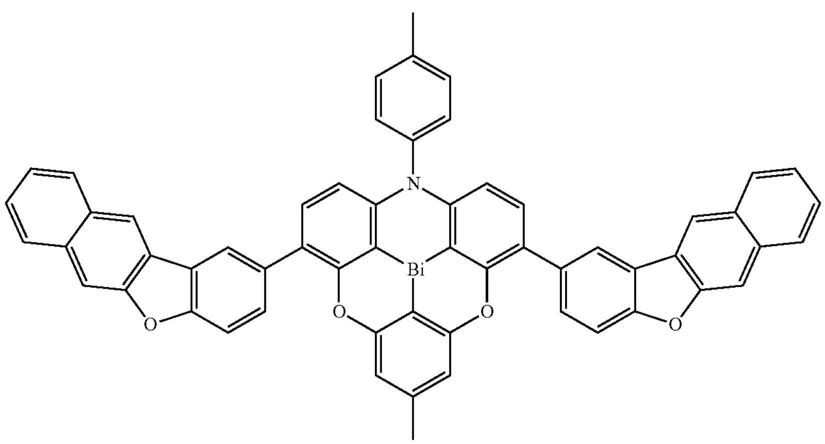
(1-1331)
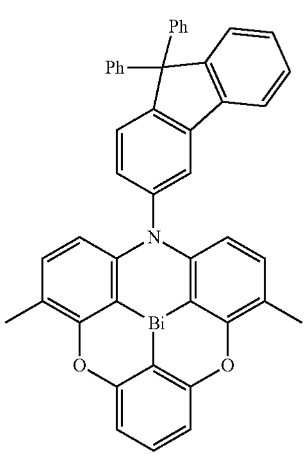
(1-1332)
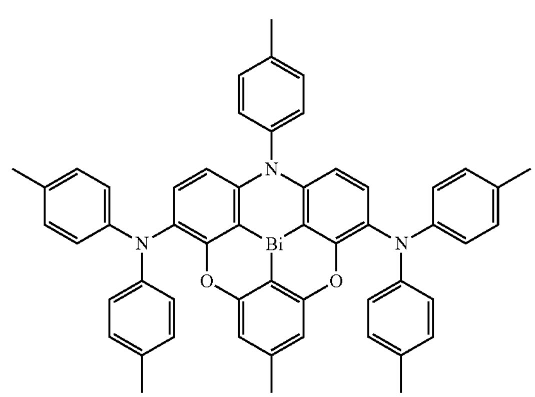

-continued
(1-1333)
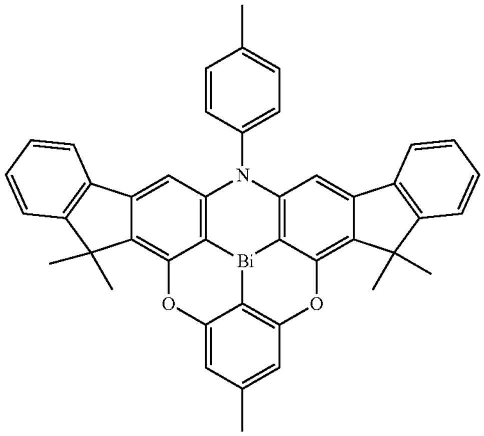
(1-1334)
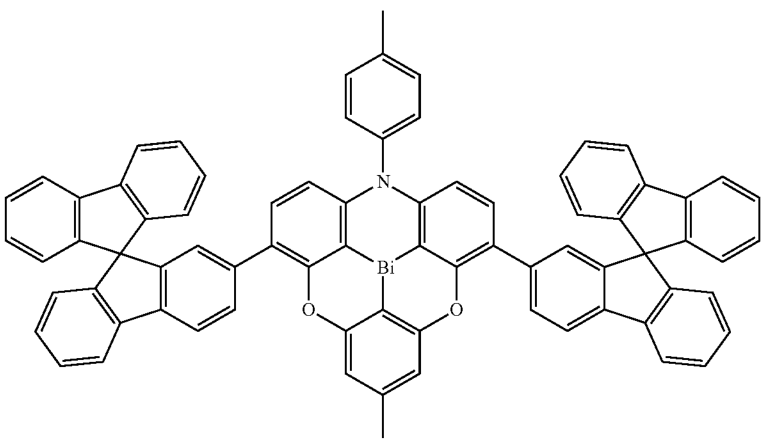
(1-1335)
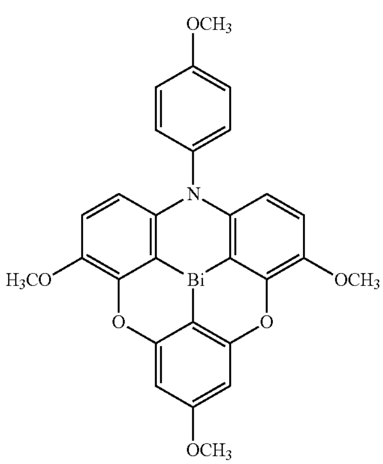
(1-1341)
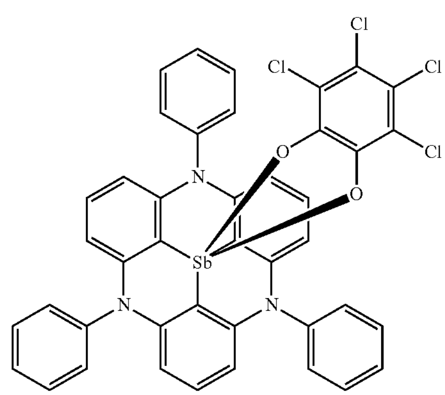

-continued
(1-1342)
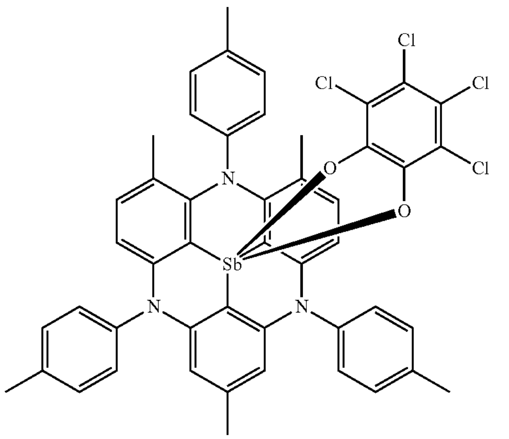
(1-1343)
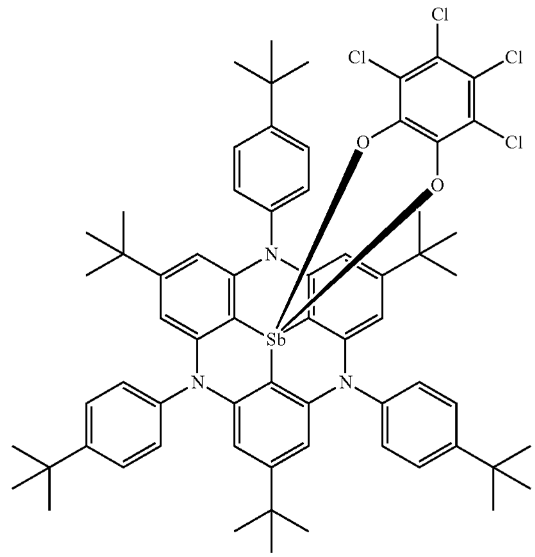
(1-1344)
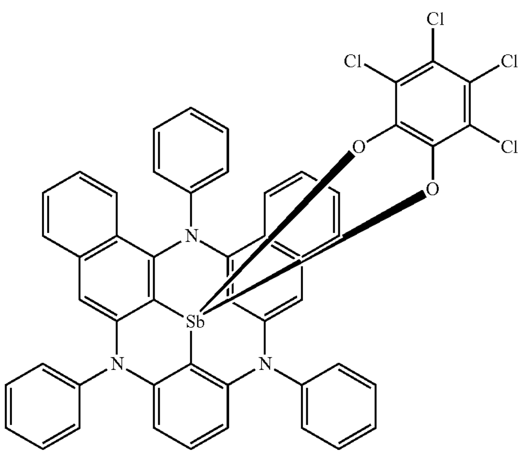
(1-1345)
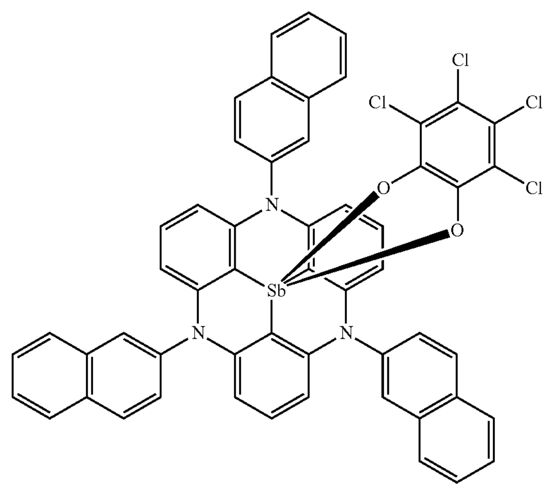
(1-1346)
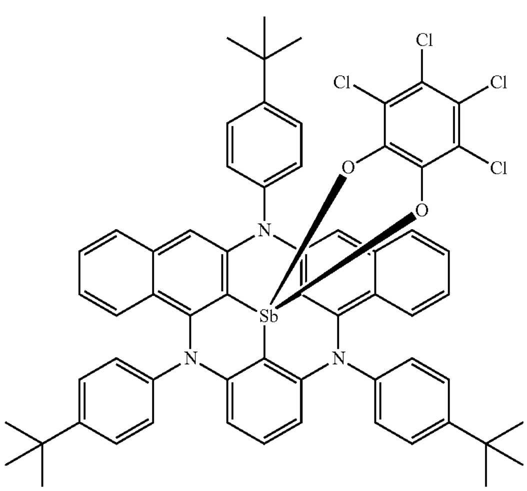
(1-1347)
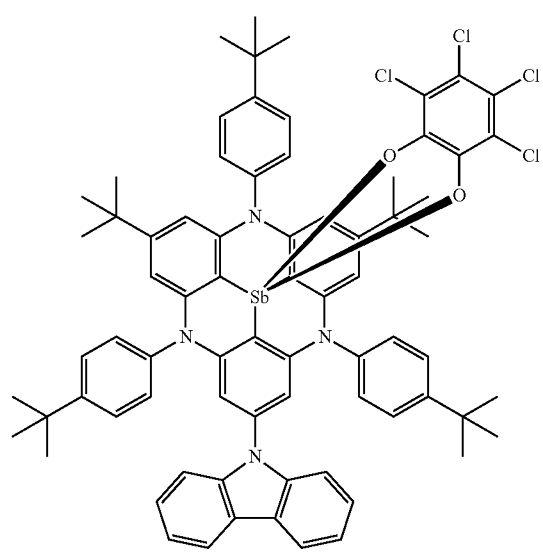

-continued
(1-1348)
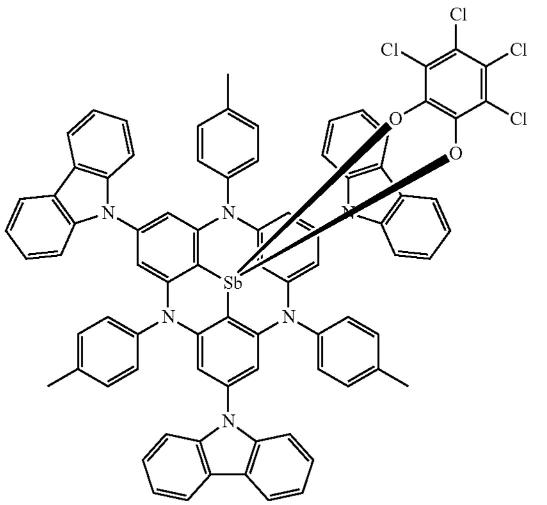
(1-1349)
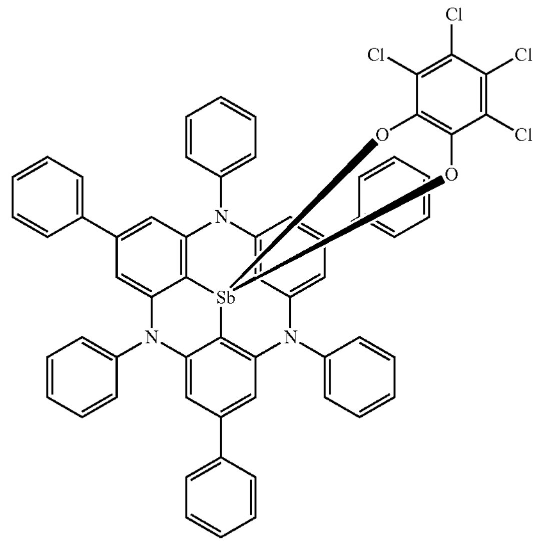
(1-1350)
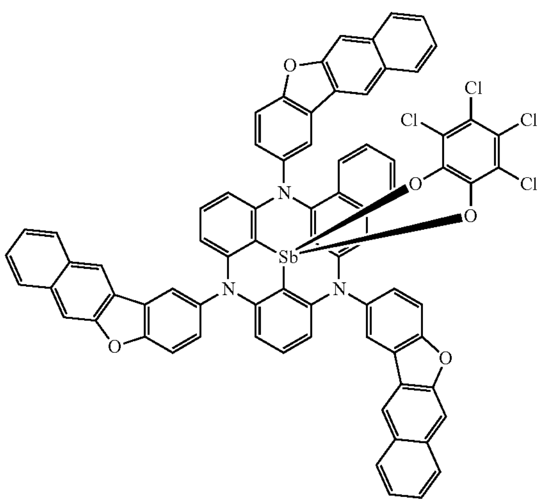
(1-1351)
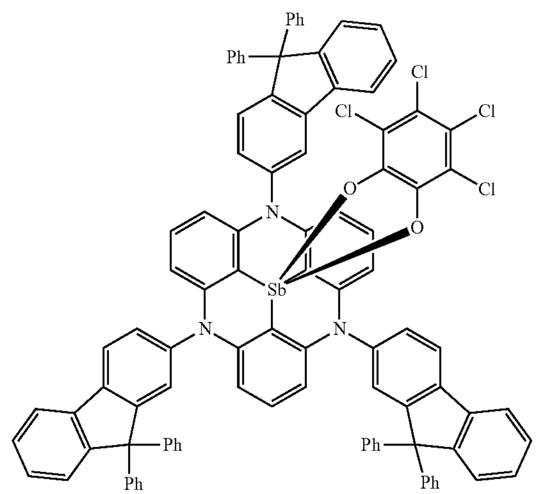
(1-1352)
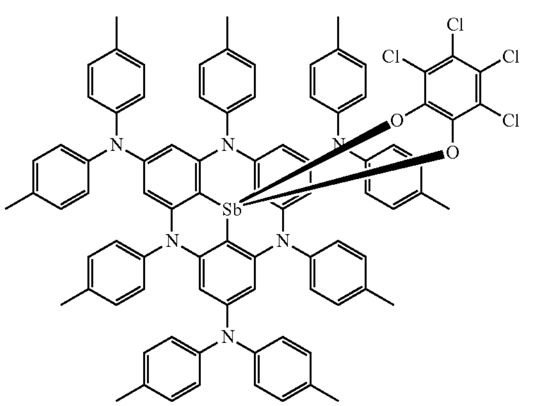
(1-1353)
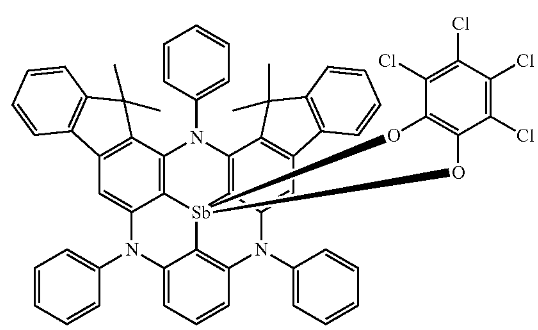

-continued
(1-1354)
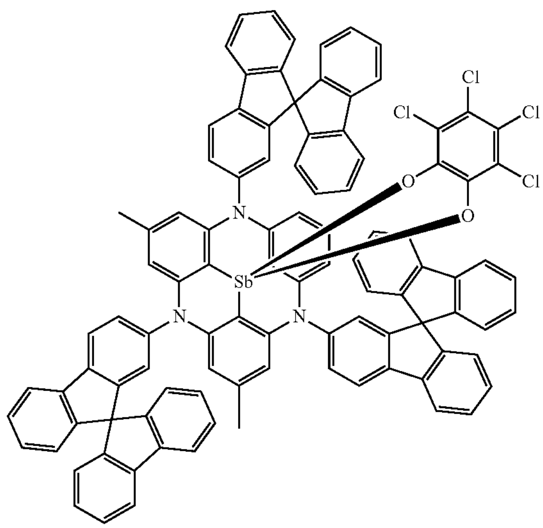
(1-1355)
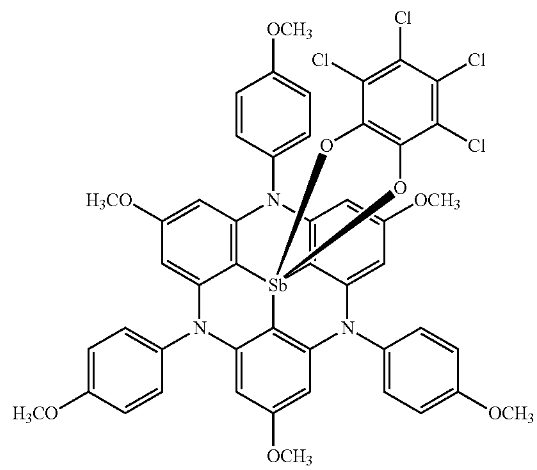
(1-1361)
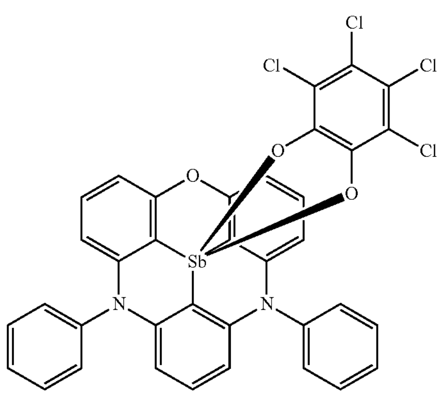
(1-1362)
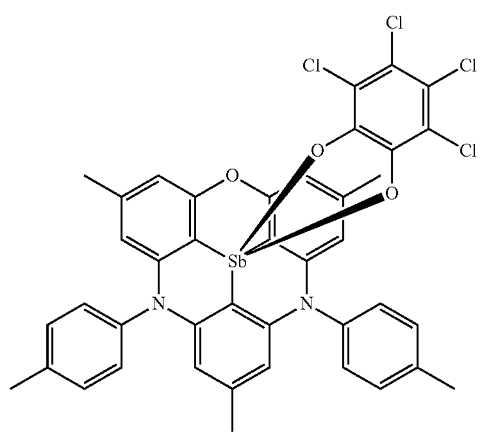
(1-1363)
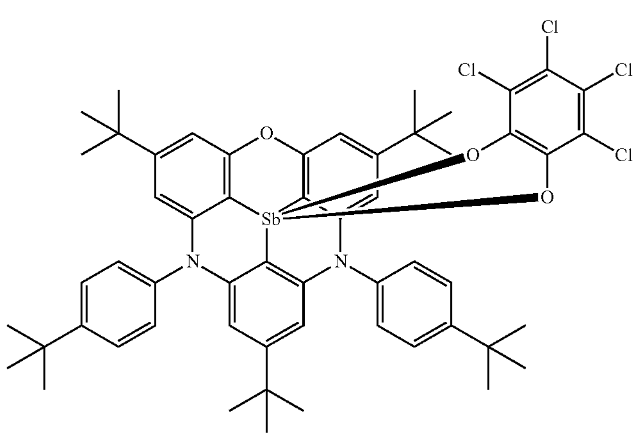

-continued
(1-1364)
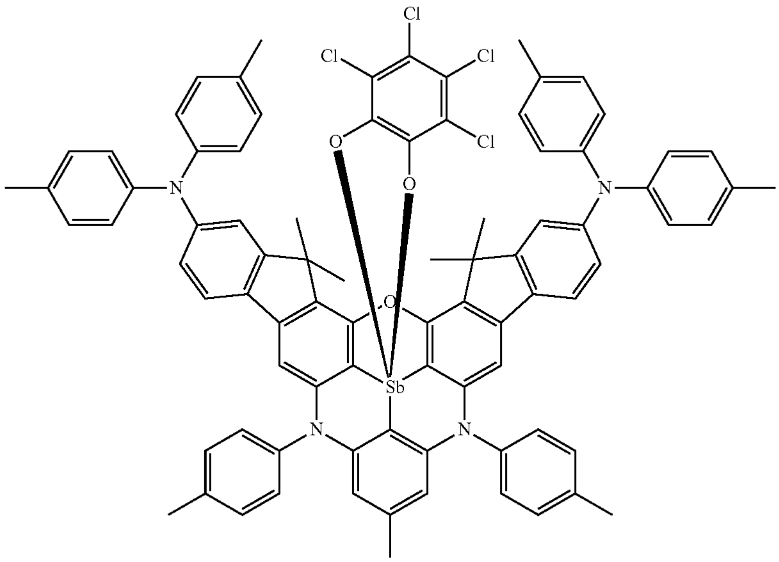
(1-1365)
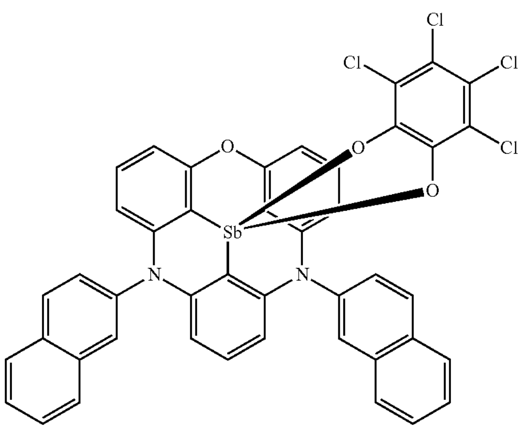
(1-1366)
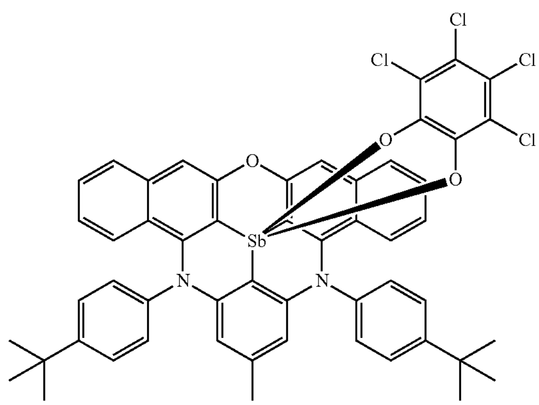
(1-1367)
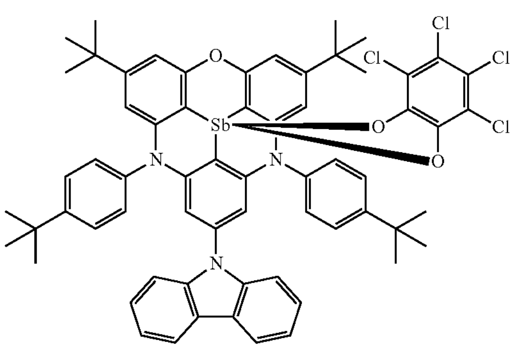
(1-1368)
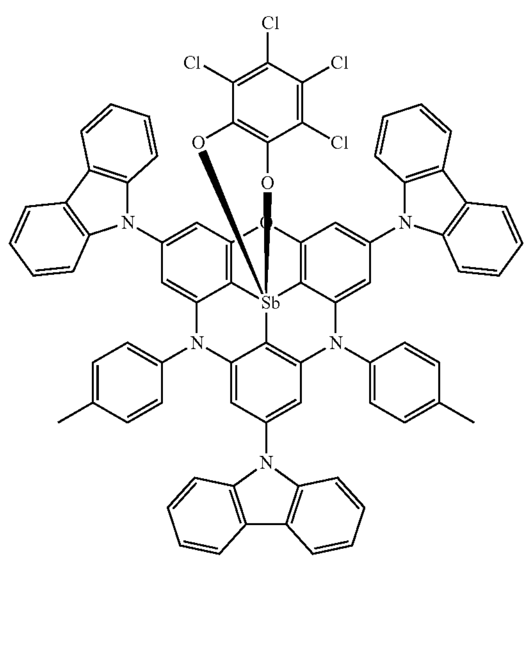

-continued
(1-1369)
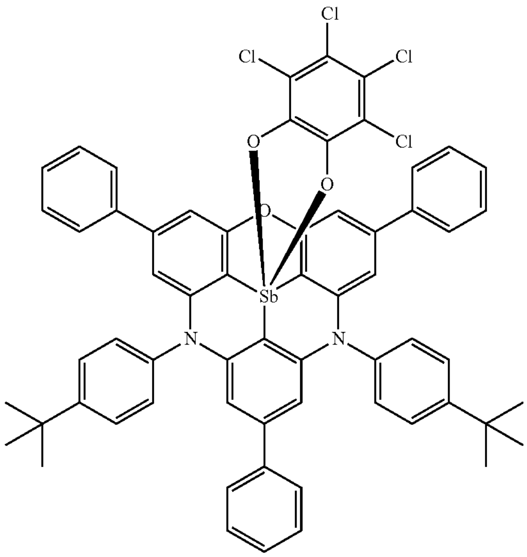
(1-1370)
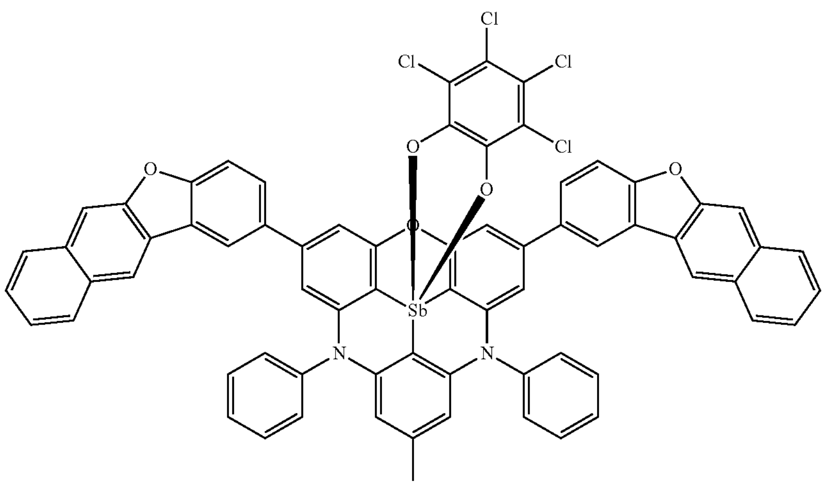
(1-1371)
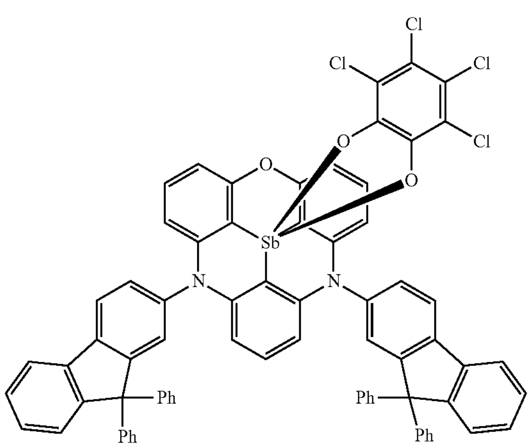
(1-1372)
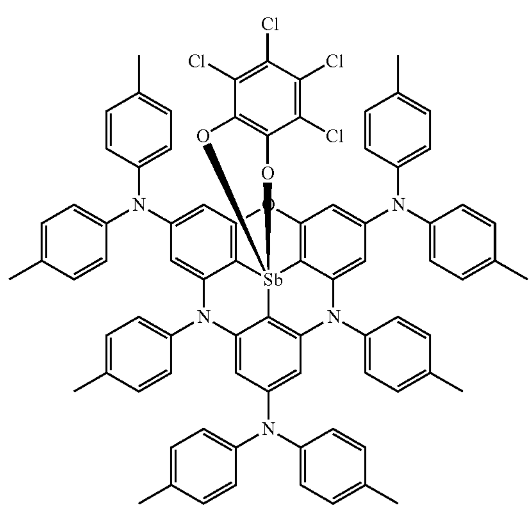

-continued
(1-1373)
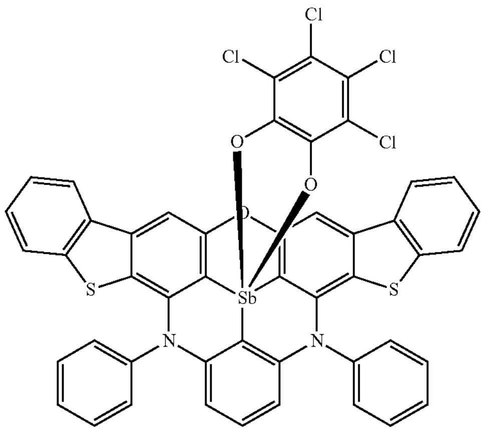
(1-1374)
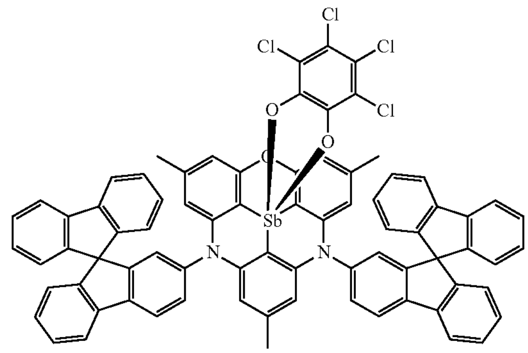
(1-1375)
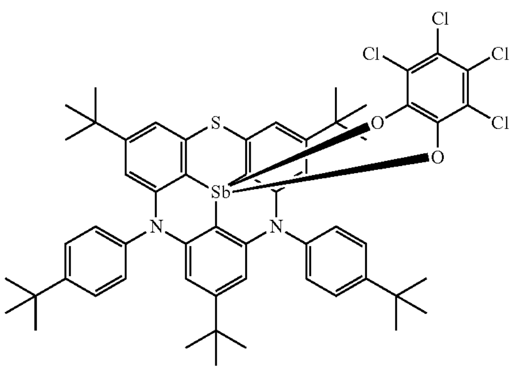
(1-1381)
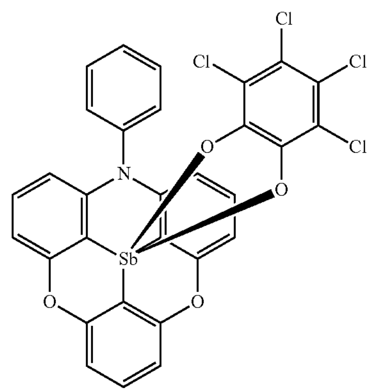
(1-1382)
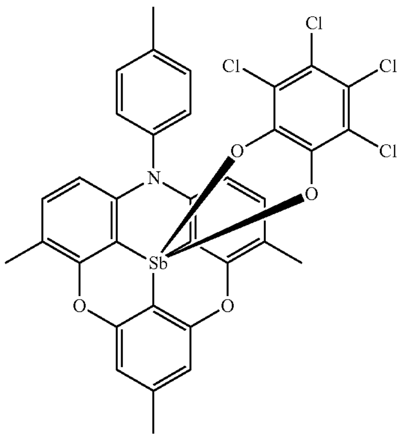
(1-1383)
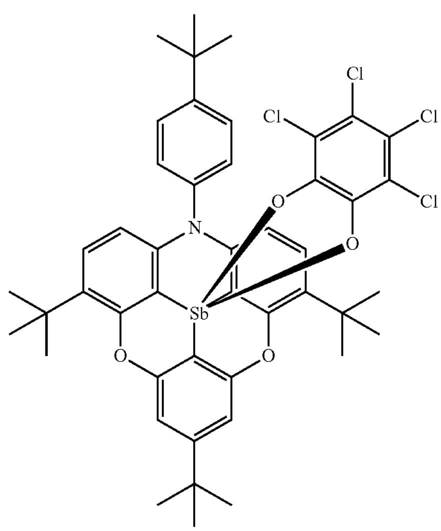

-continued
(1-1384)
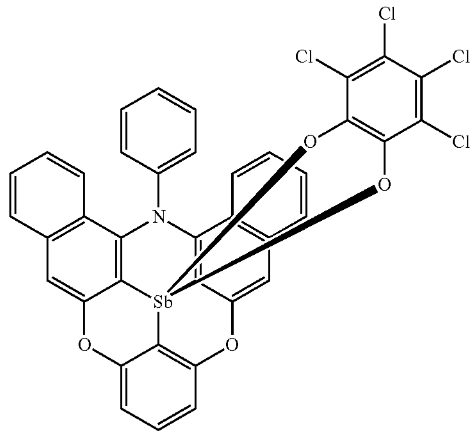
(1-1385)
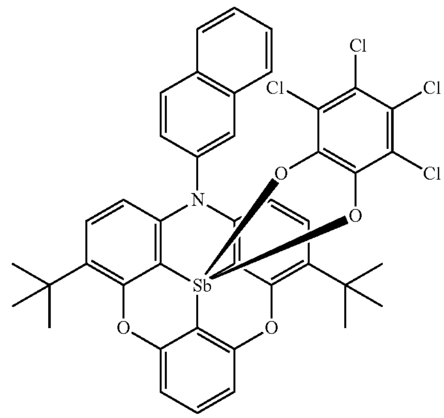
(1-1386)
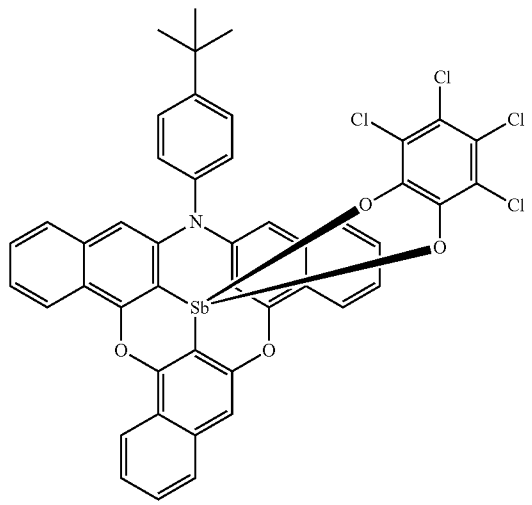
(1-1387)
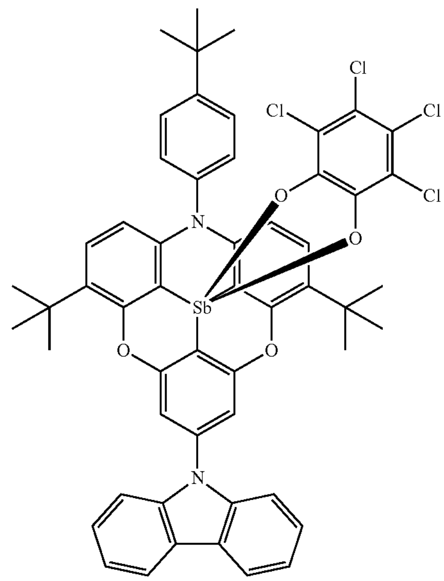
(1-1388)
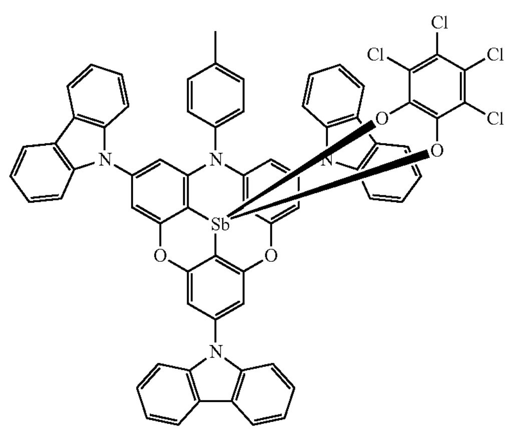
(1-1389)
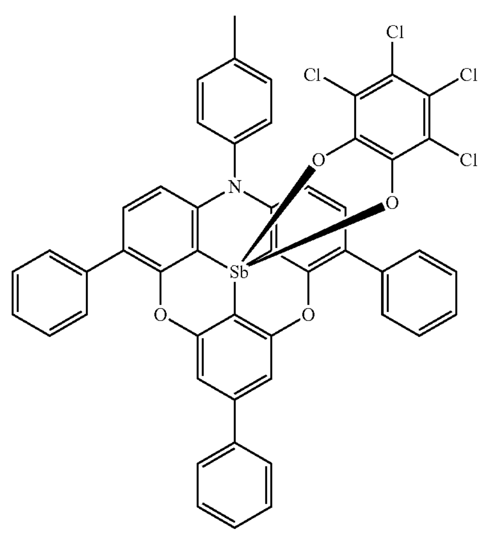

-continued
(1-1390)
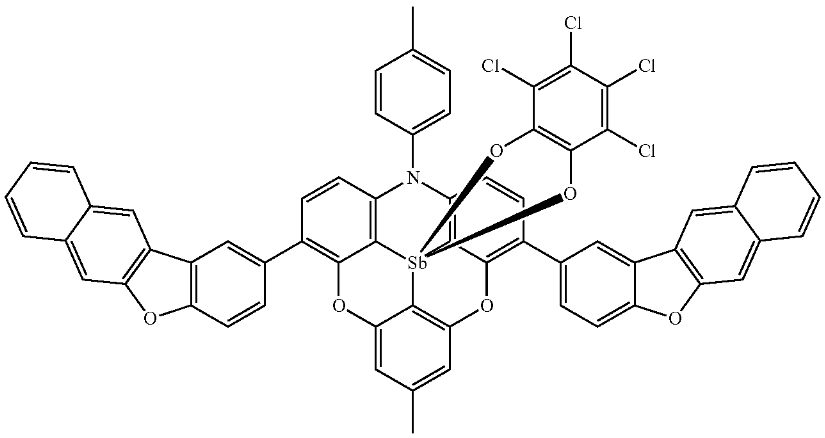
(1-1391)
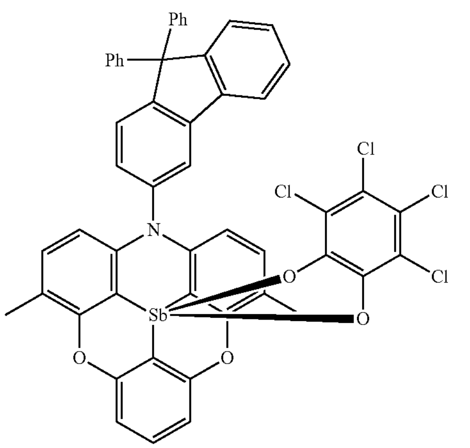
(1-1392)
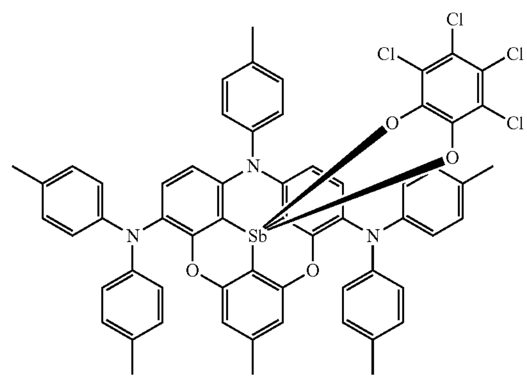
(1-1393)
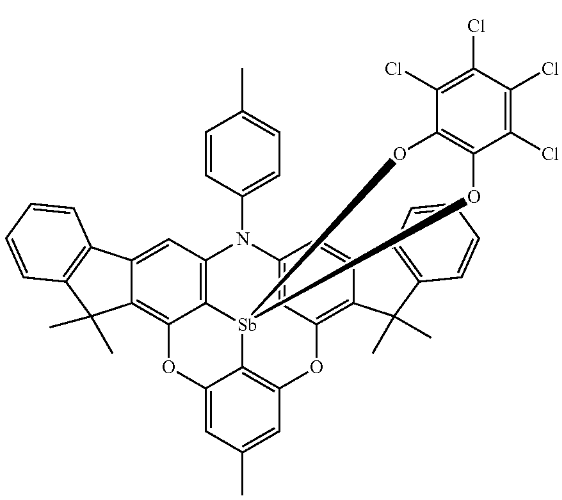

-continued
(1-1394)
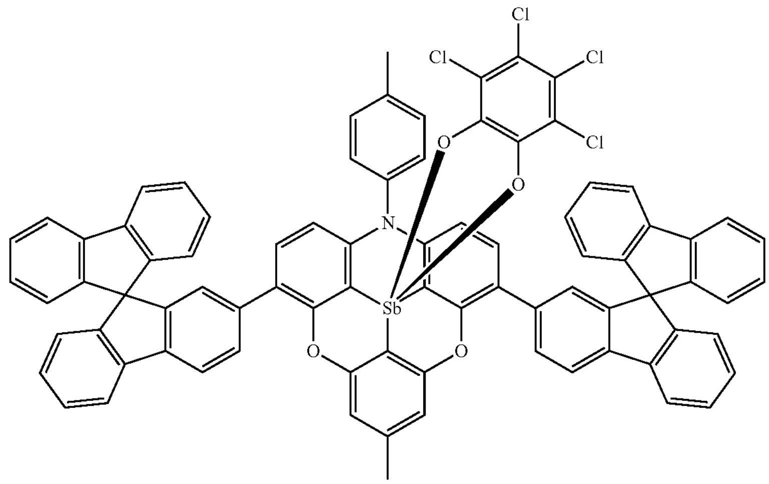
(1-1395)
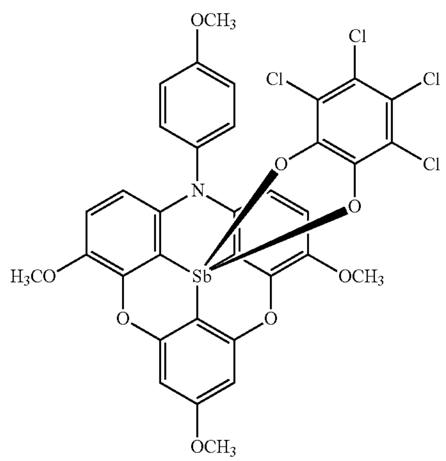
(1-1401)
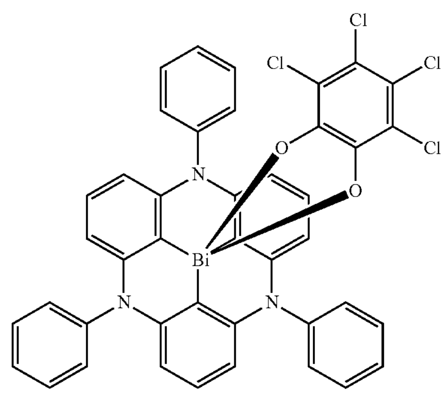
(1-1402)
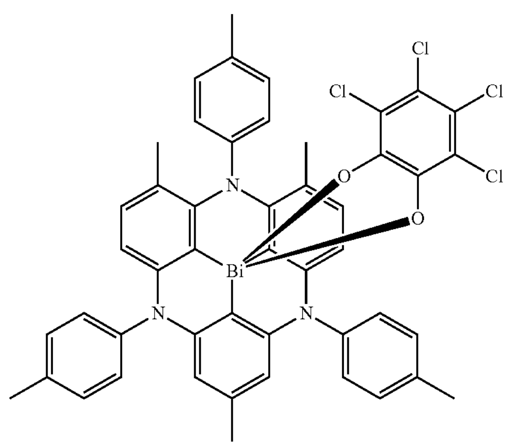
(1-1403)
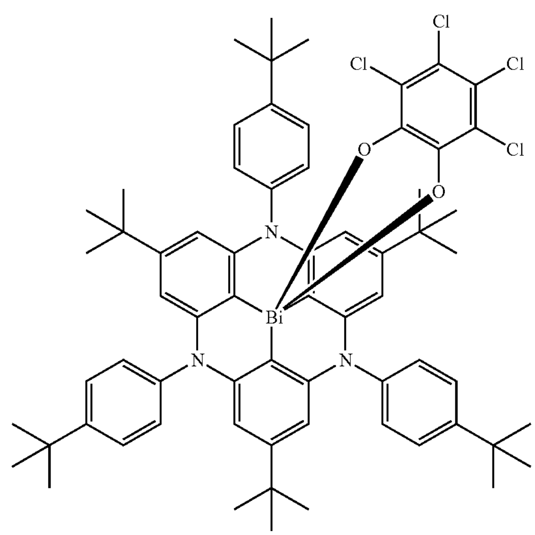

-continued
(1-1404)
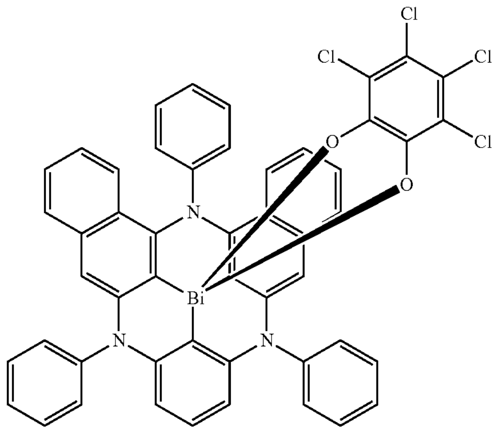
(1-1405)
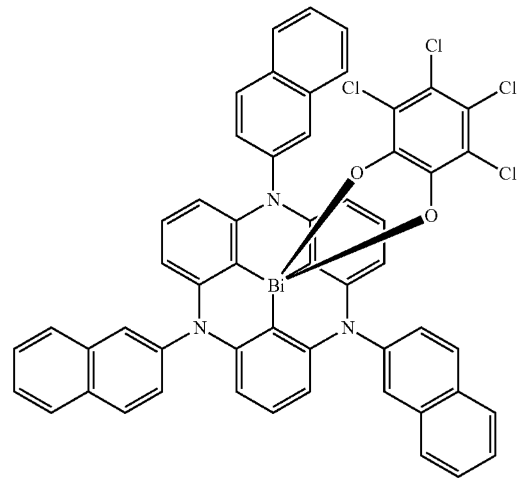
(1-1405)
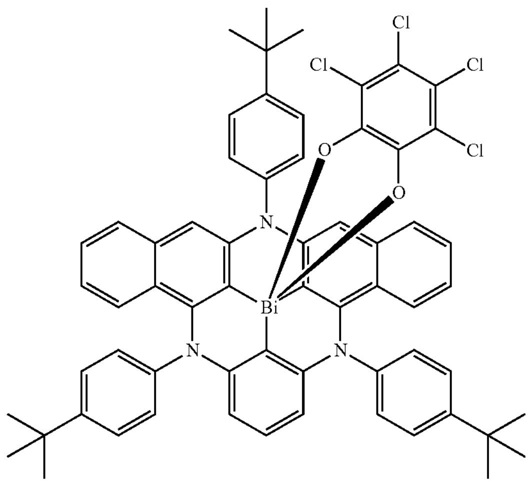
(1-1407)
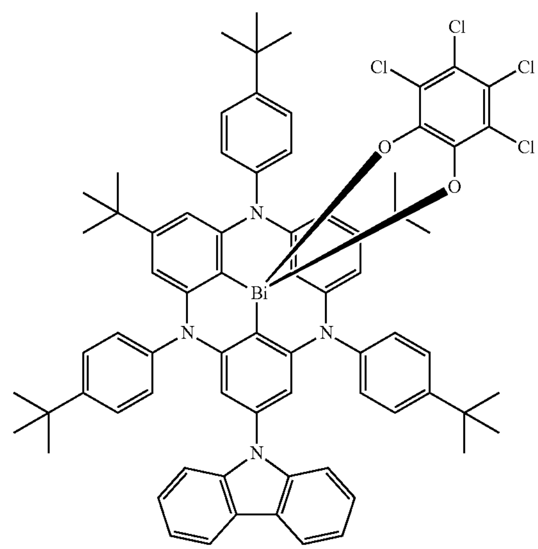
(1-1408)
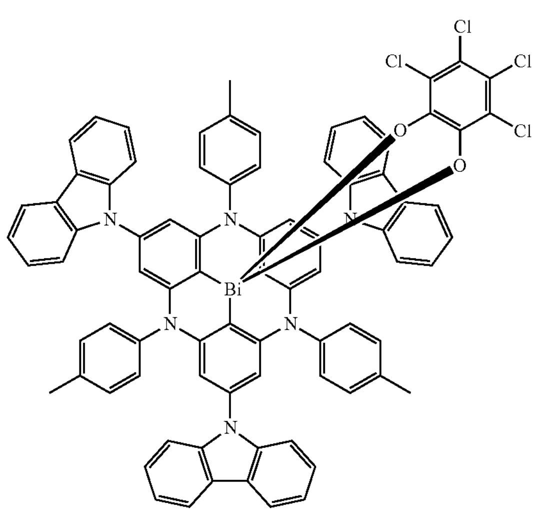
(1-1409)
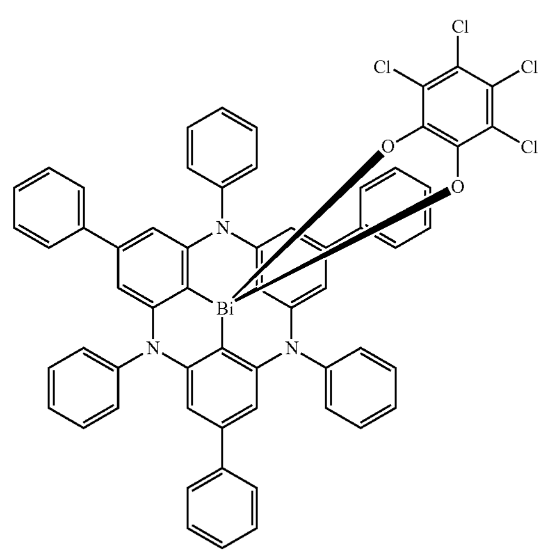

-continued
(1-1410)
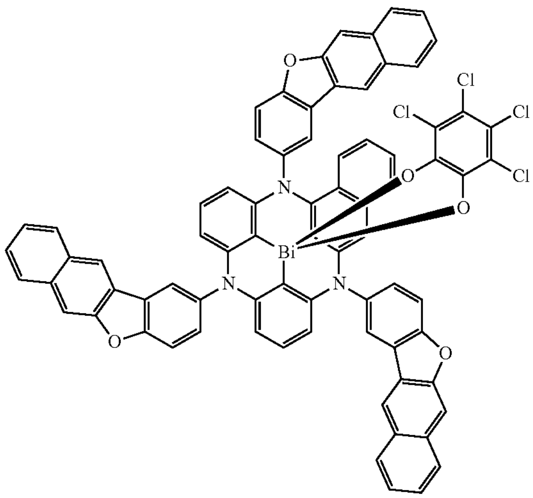
(1-1411)
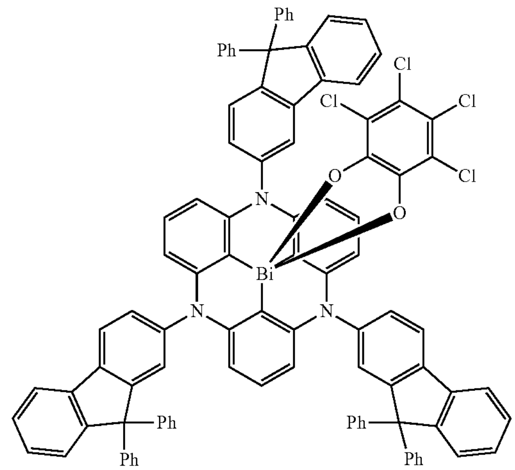
(1-1412)
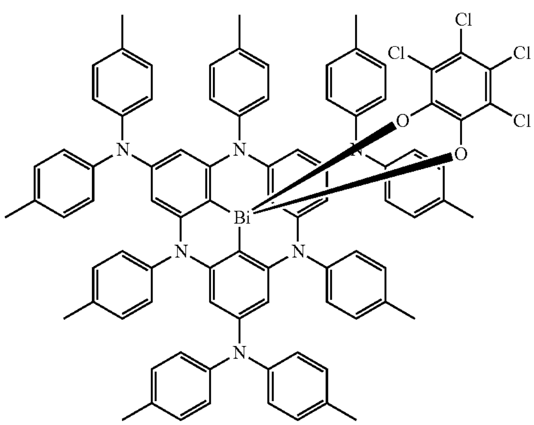
(1-1413)
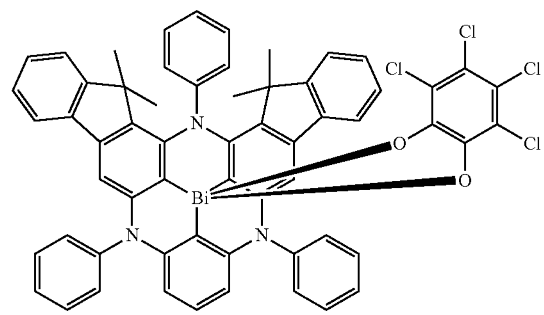
(1-1414)
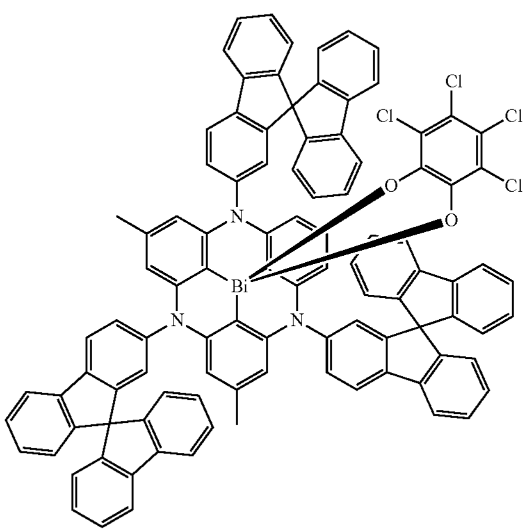
(1-1415)
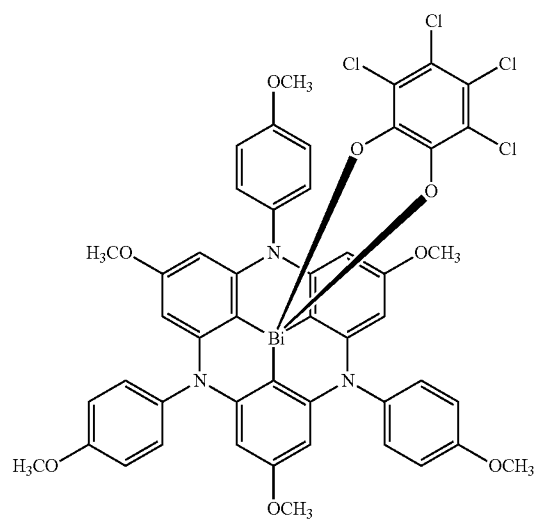

-continued
(1-1421)
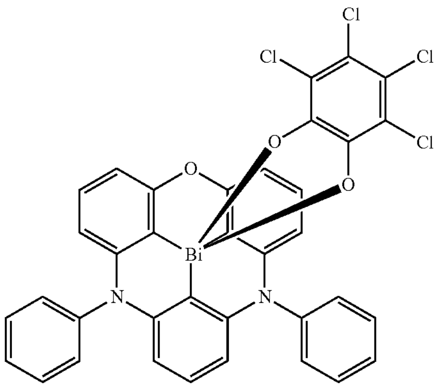
(1-1422)
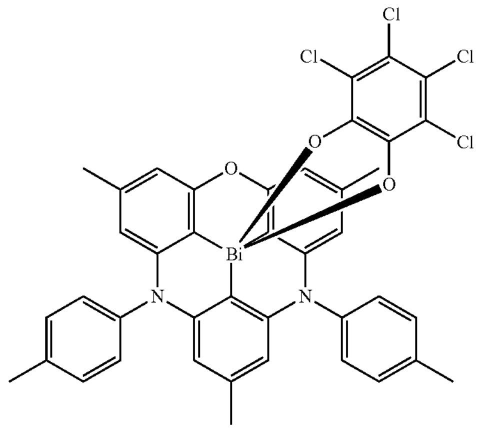
(1-1423)
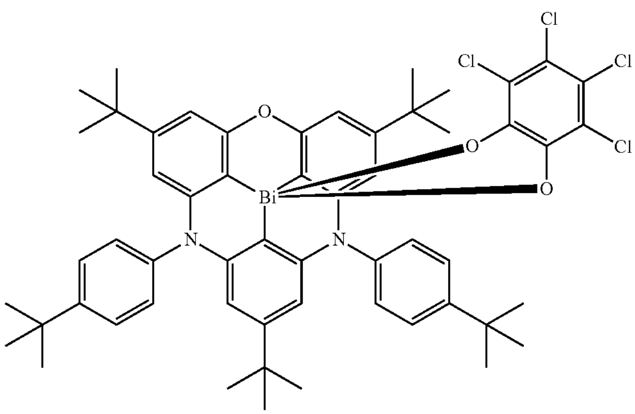
(1-1424)
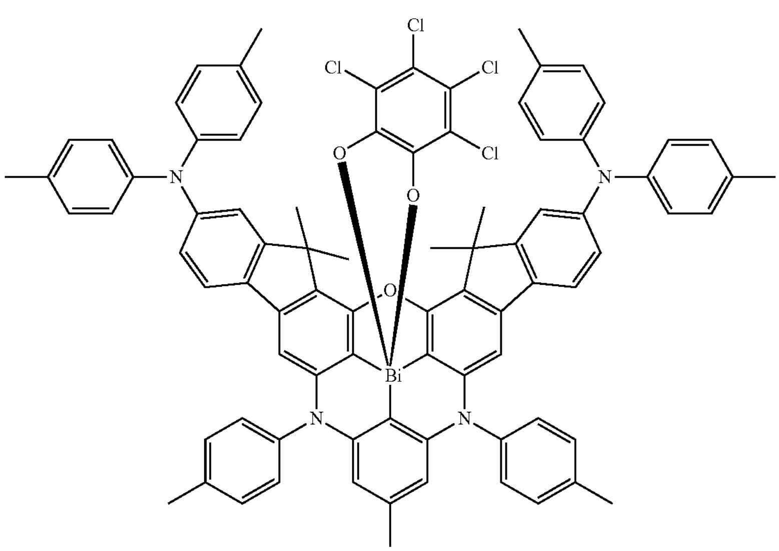

-continued
(1-1425)
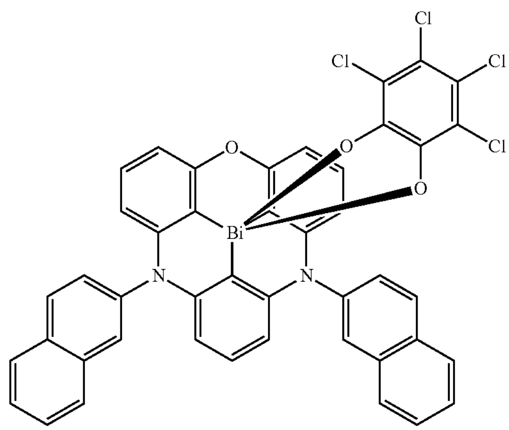
(1-1426)
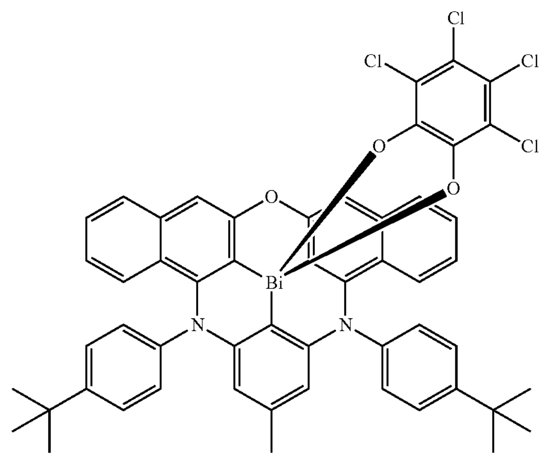
(1-1427)
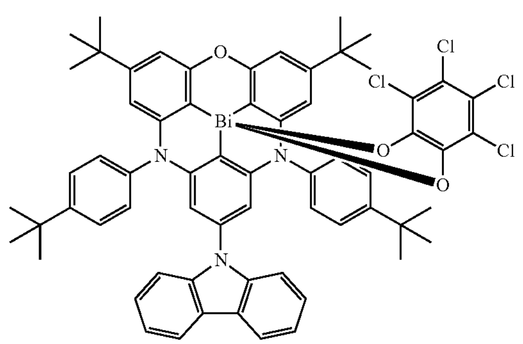
(1-1428)
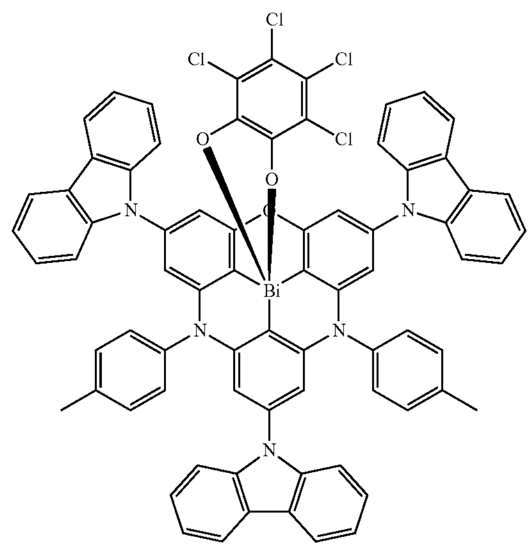
(1-1429)
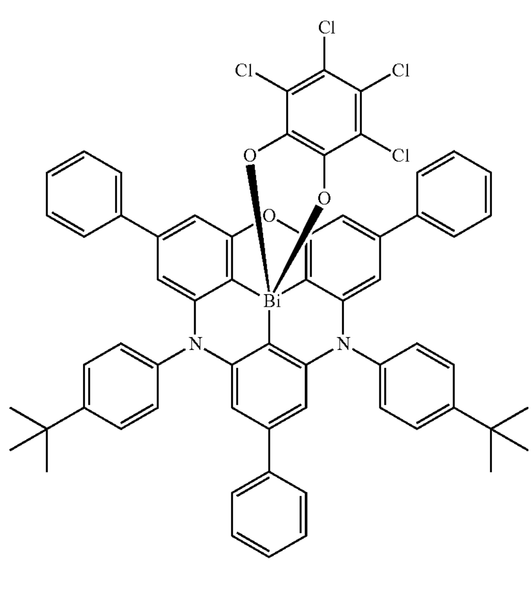

-continued
(1-1430)
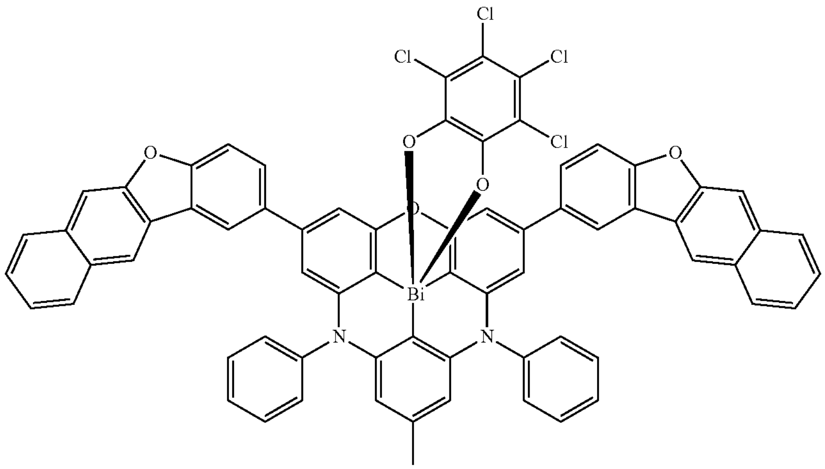
(1-1431)
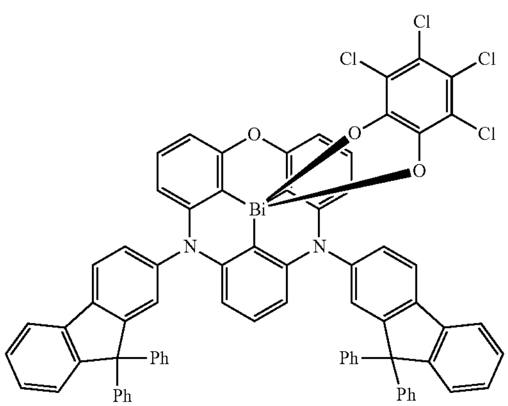
(1-1432)
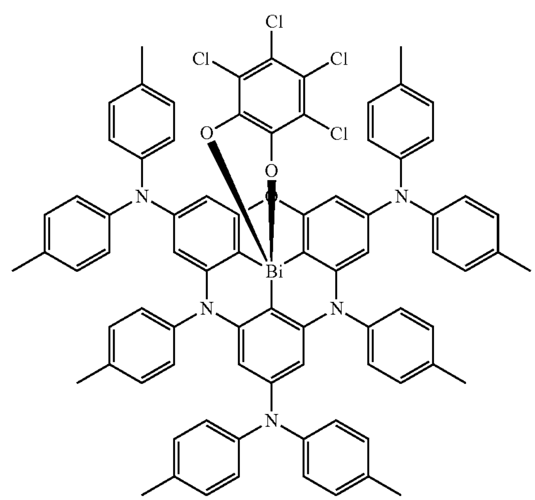
(1-1433)
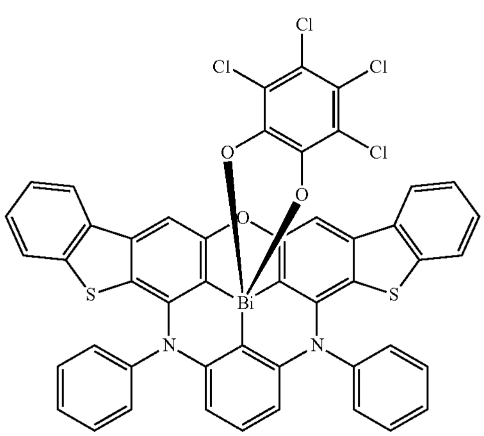
(1-1434)
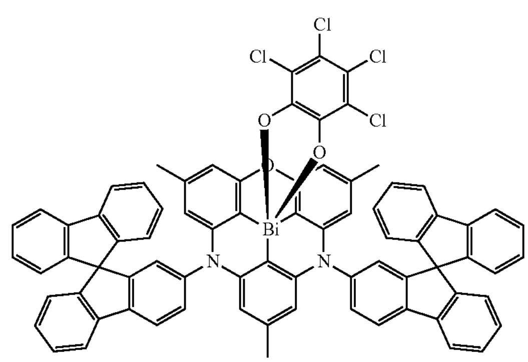

-continued
(1-1435)
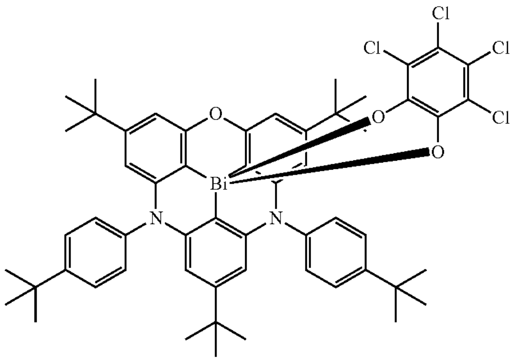
(1-1441)
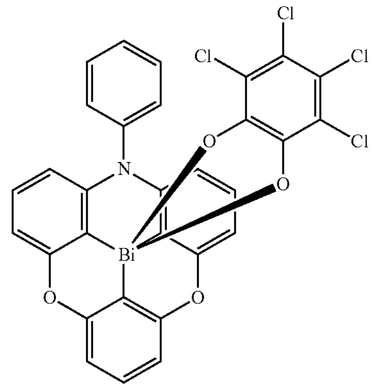
(1-1442)
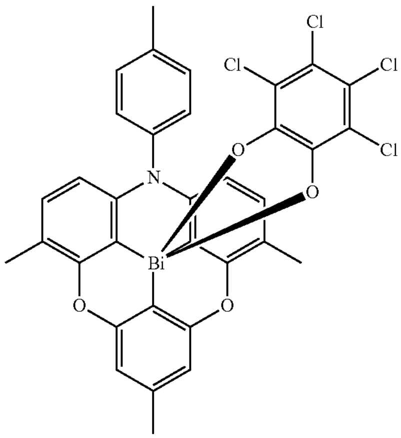
(1-1443)
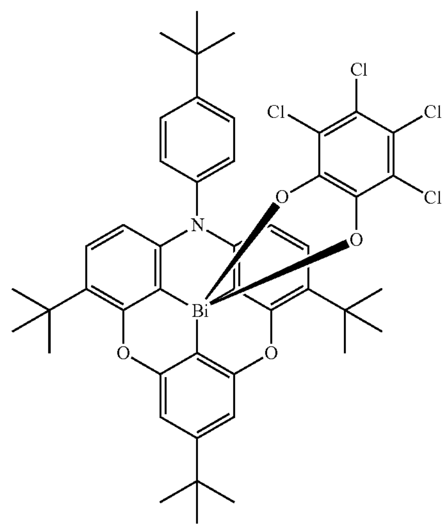
(1-1444)
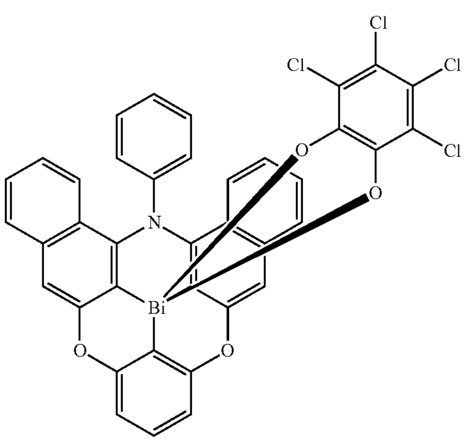
(1-1445)
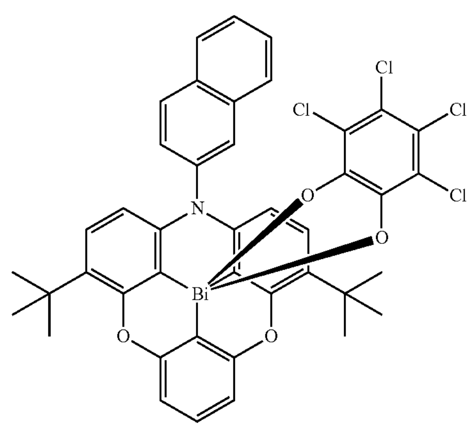

-continued
(1-1446)
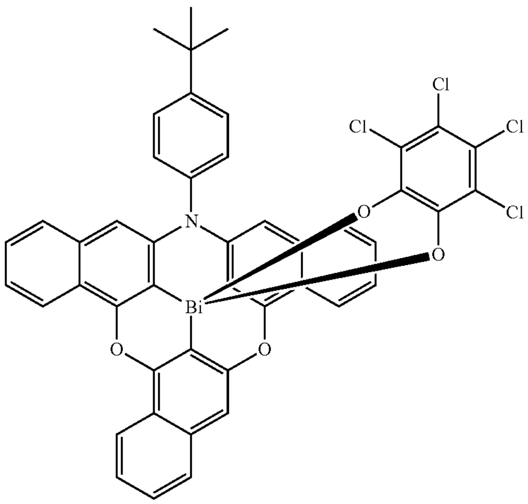
(1-1447)
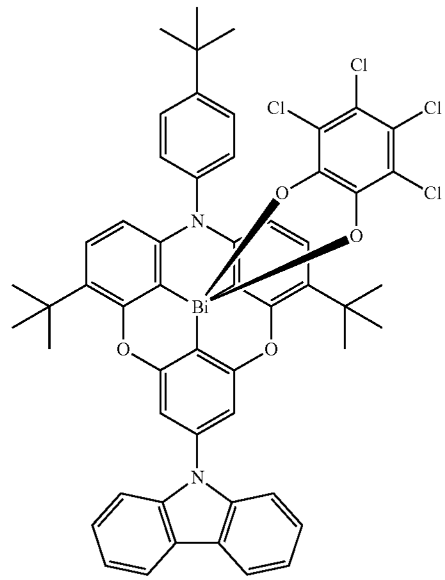
(1-1448)
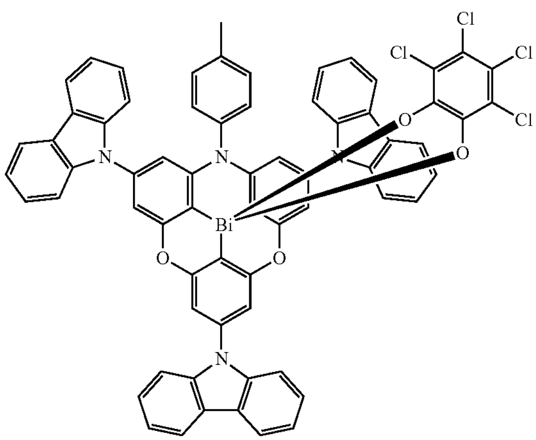
(1-1449)
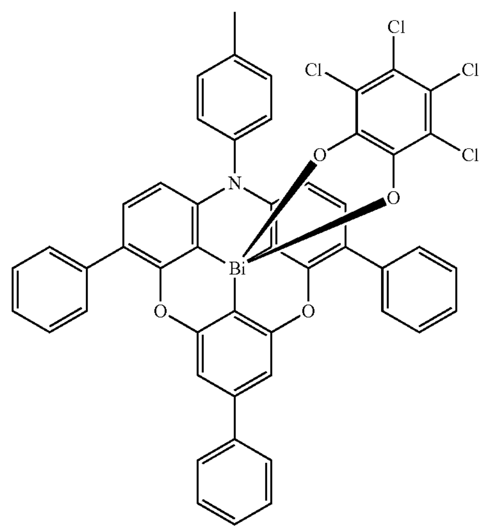
(1-1450)
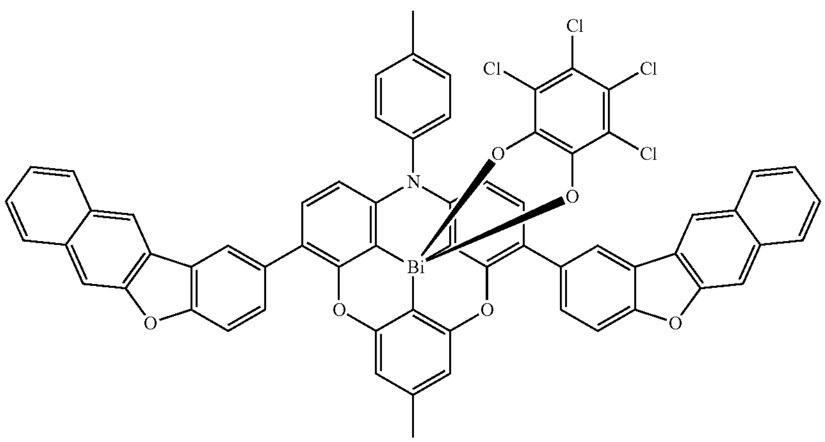

-continued
(1-1451)
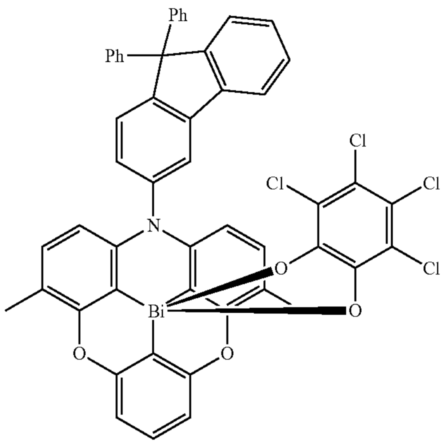
(1-1452)
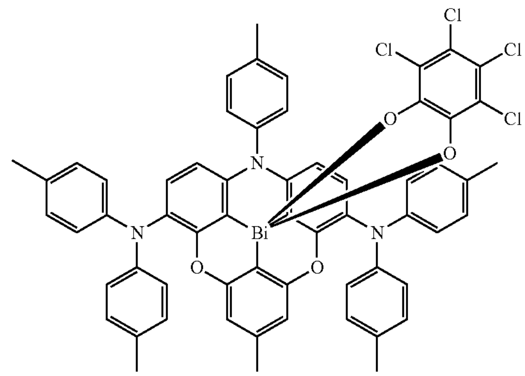
(1-1453)
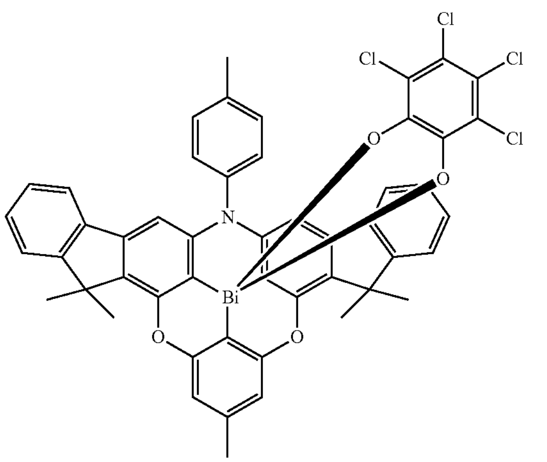
(1-1454)
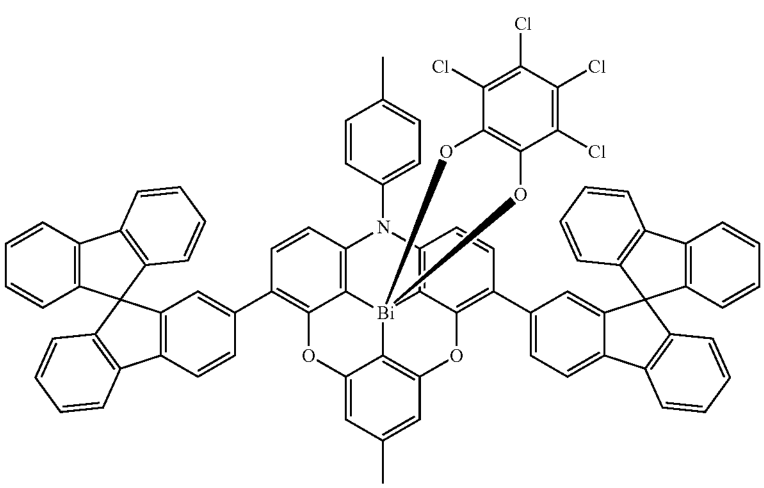

-continued
(1-1455)
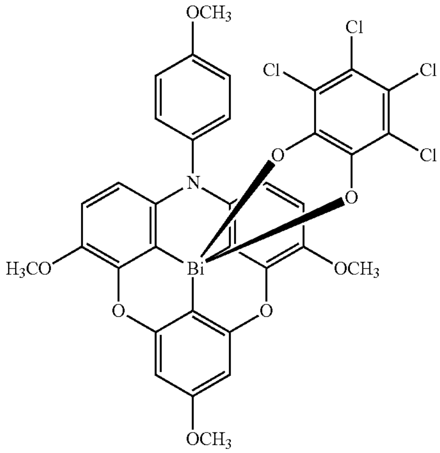
(1-1461)
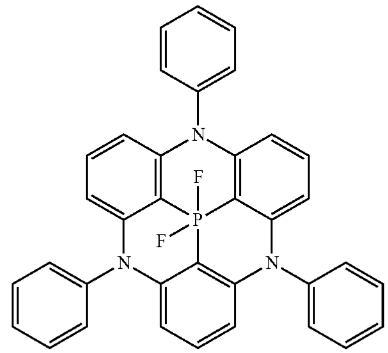
(1-1462)
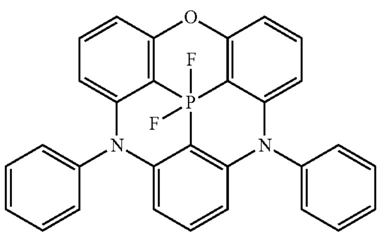
(1-1463)
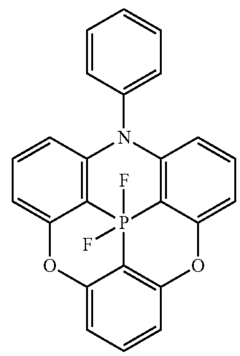
(1-1464)
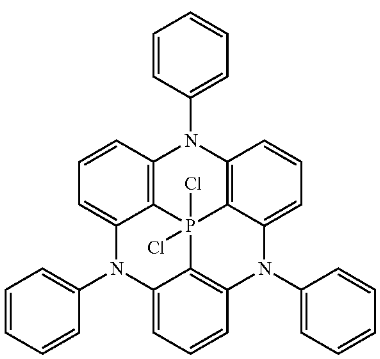
(1-1465)
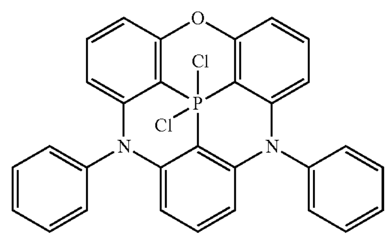
(1-1466)
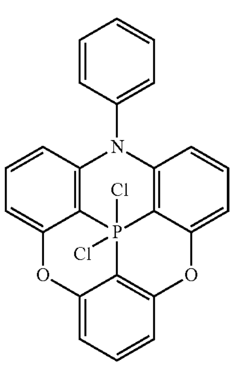
(1-1467)
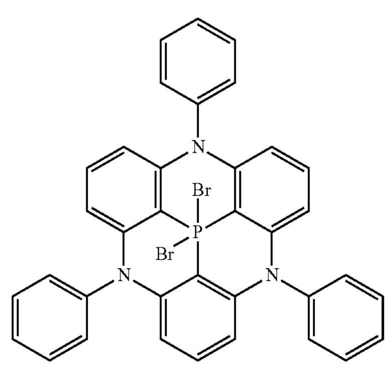

-continued
(1-1468)
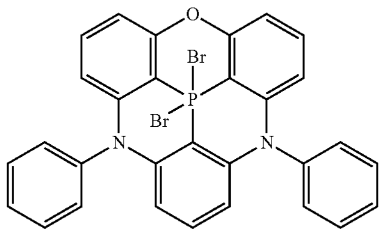
(1-1469)
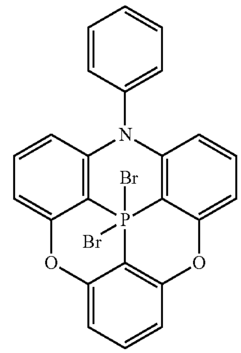
(1-1470)
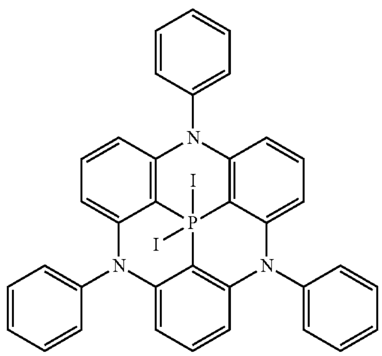
(1-1471)
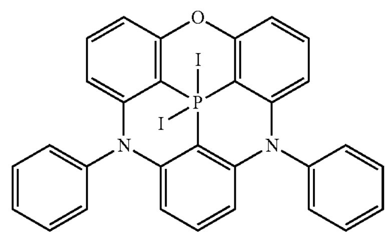
(1-1472)
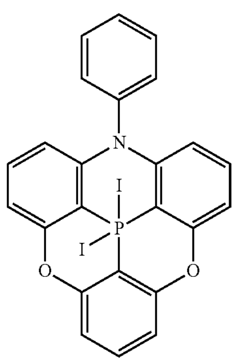
(1-1481)
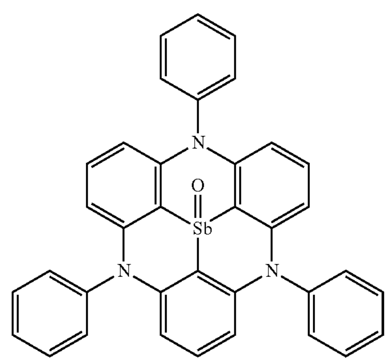
(1-1482)
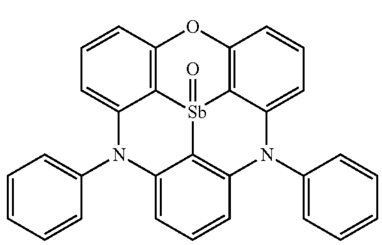
(1-1483)
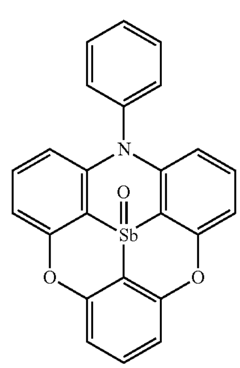

-continued
(1-1484)
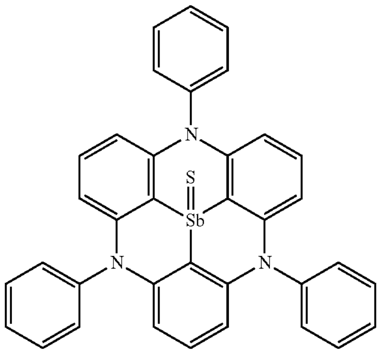
(1-1485)
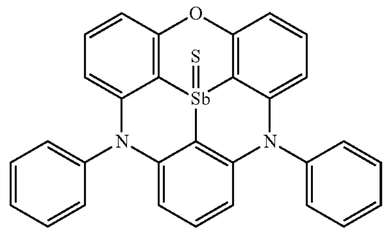
(1-1486)
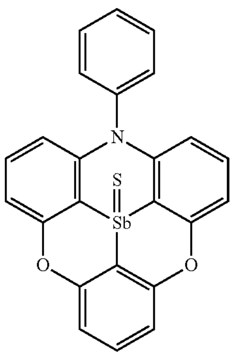
(1-1487)
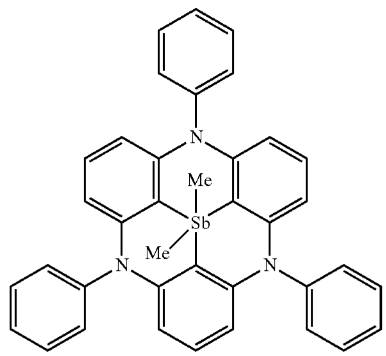
(1-1488)
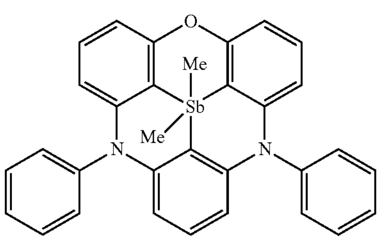
(1-1489)
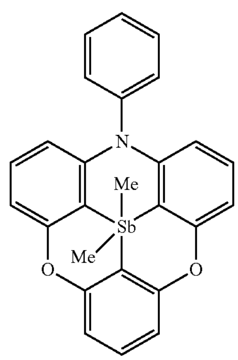
(1-1490)
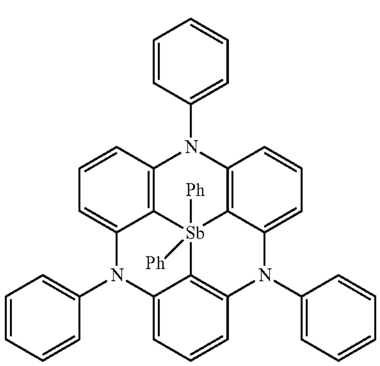
(1-1491)
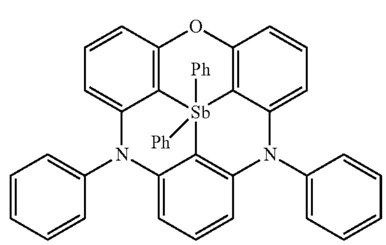

-continued
(1-1492)
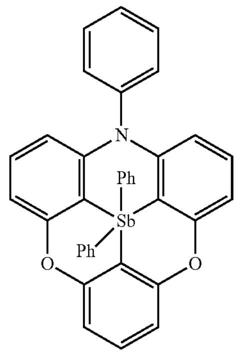
(1-1493)
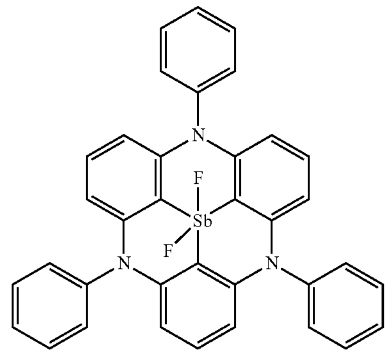
(1-1494)
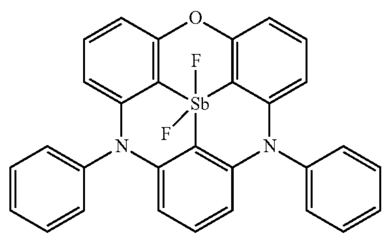
(1-1495)
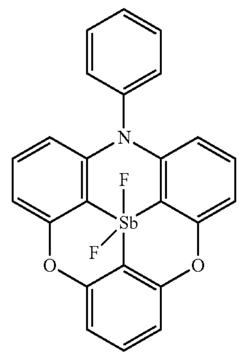
(1-1496)
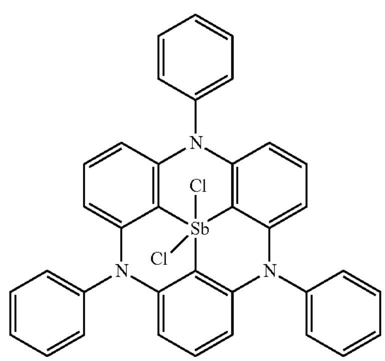
(1-1497)
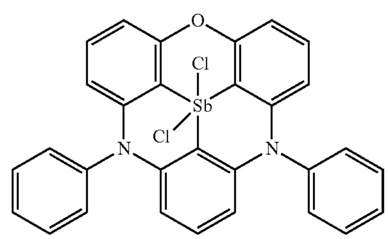
(1-1498)
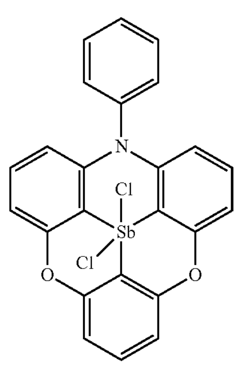
(1-1501)
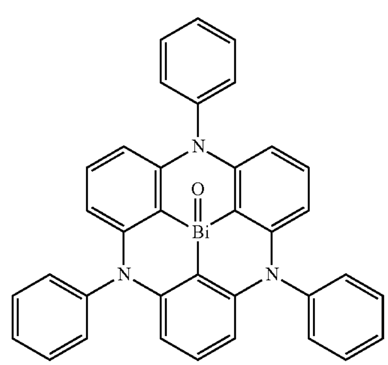

-continued
(1-1502)
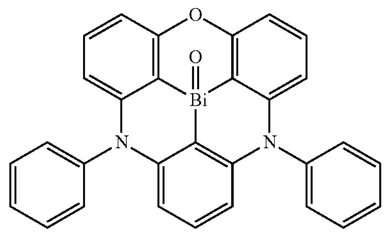
(1-1503)
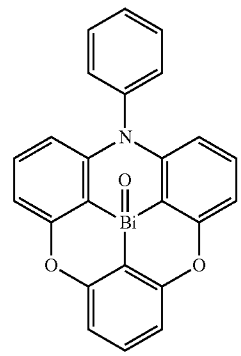
(1-1504)
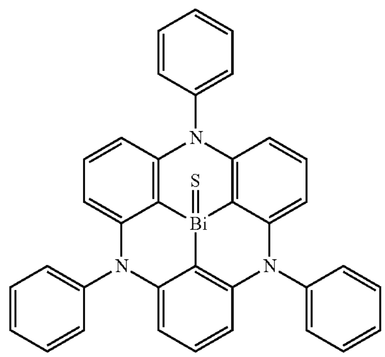
(1-1505)
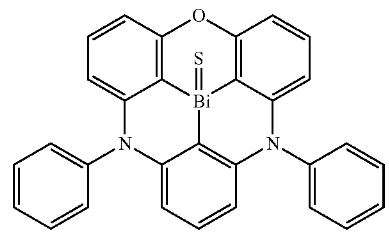
(1-1506)
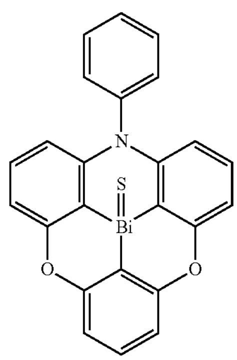
(1-1507)
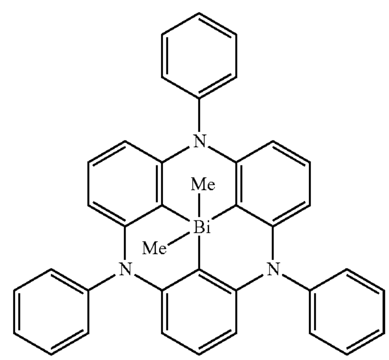
(1-1508)
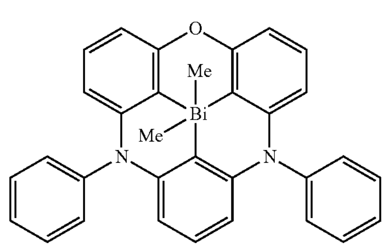
(1-1509)
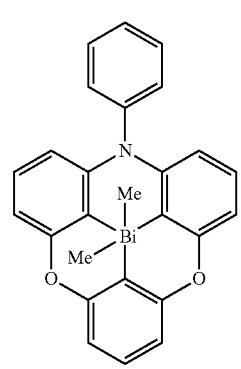

-continued
(1-1510)
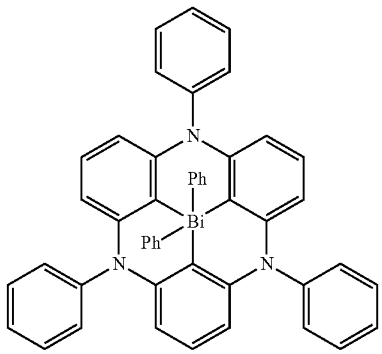
(1-1511)
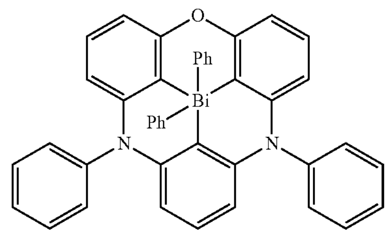
(1-1512)
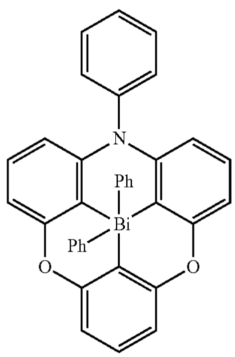
(1-1513)
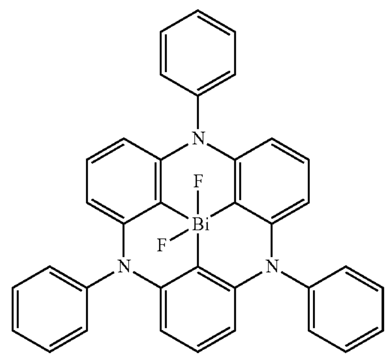
(1-1514)
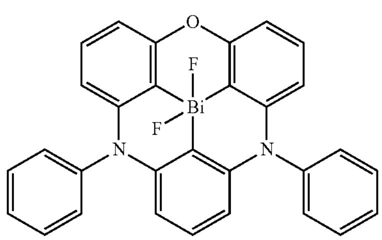
(1-1515)
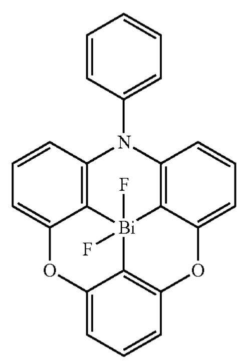
(1-1516)
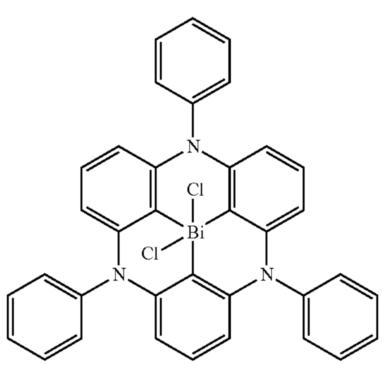
(1-1517)
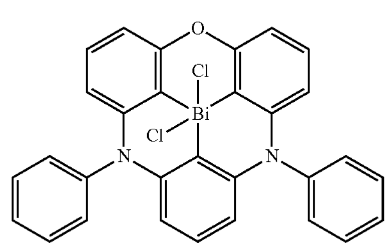

-continued
(1-1518)
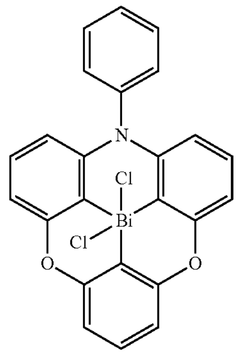
(1-2001)
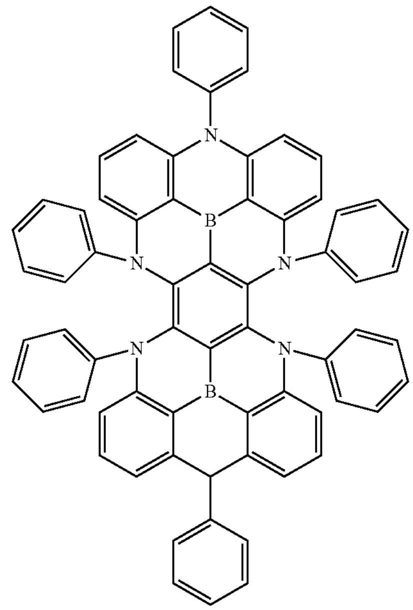
(1-2002)
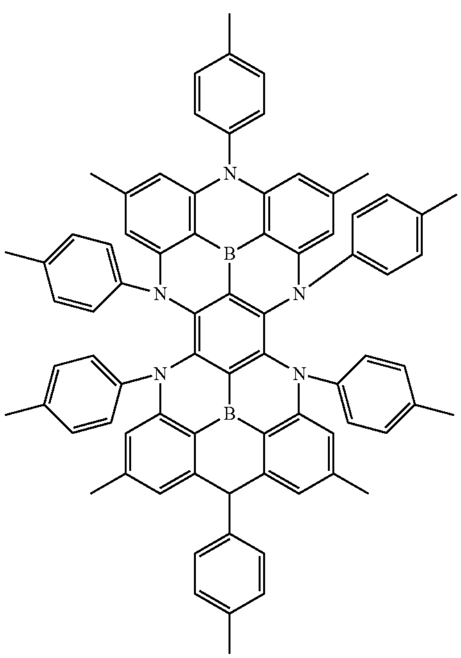
(1-2003)
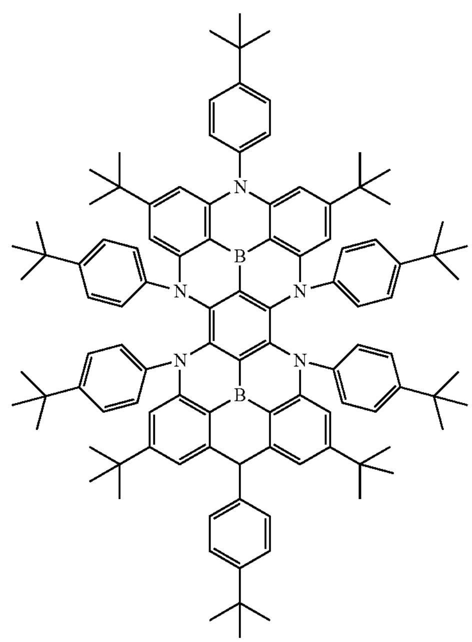

-continued
(1-2004)
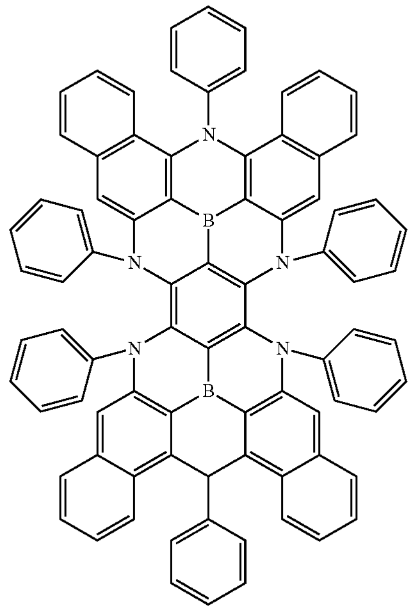
(1-2005)
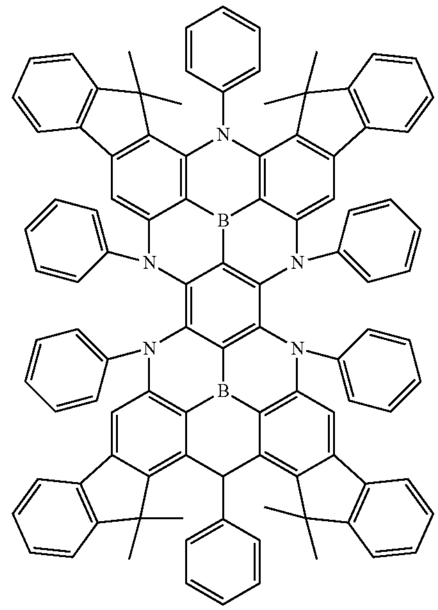
(1-2006)
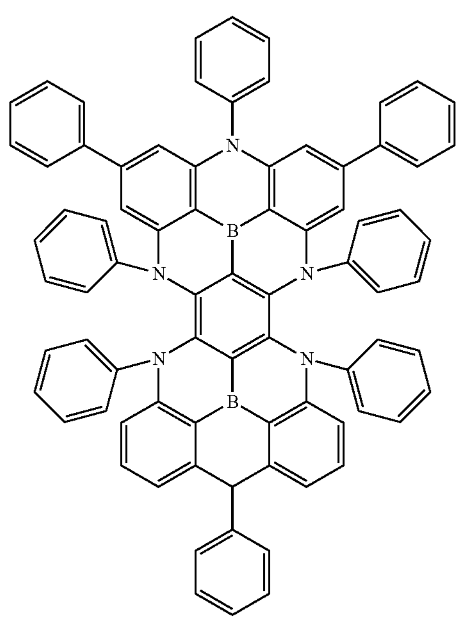
(1-2007)
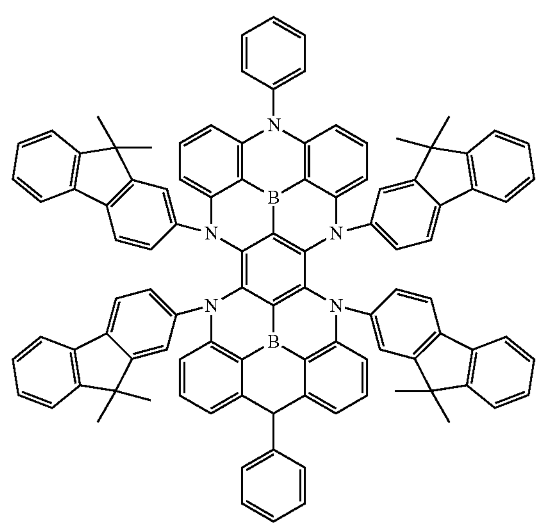

-continued
(1-2008)
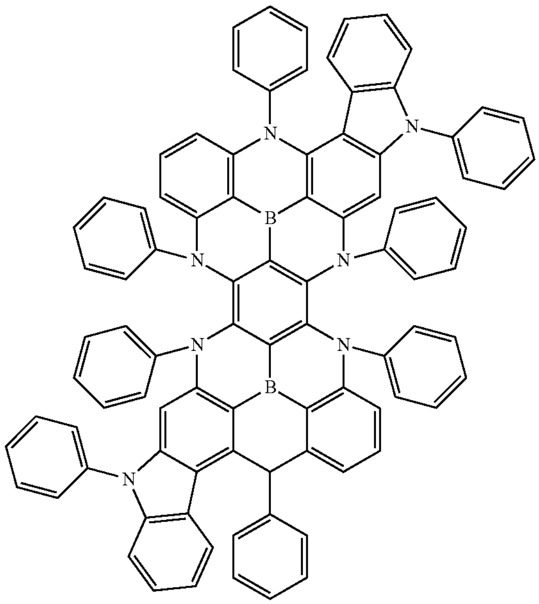
(1-2009)
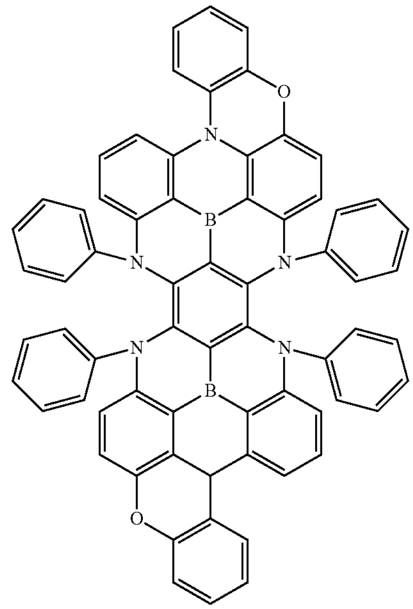
(1-2010)
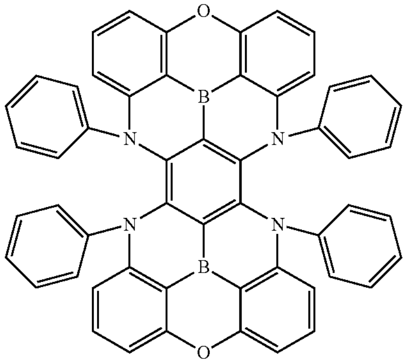
(1-2011)
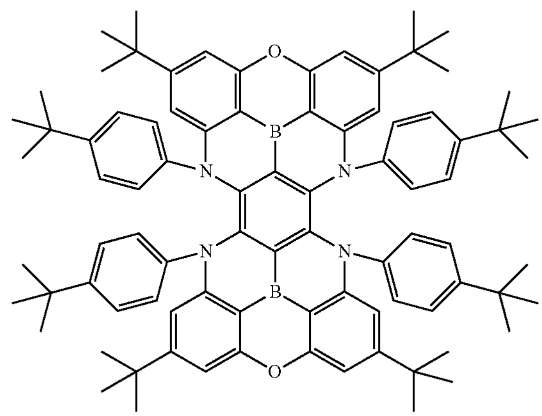
(1-2012)
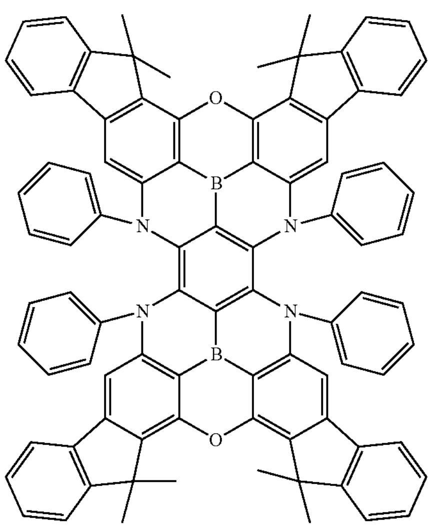
(1-2021)
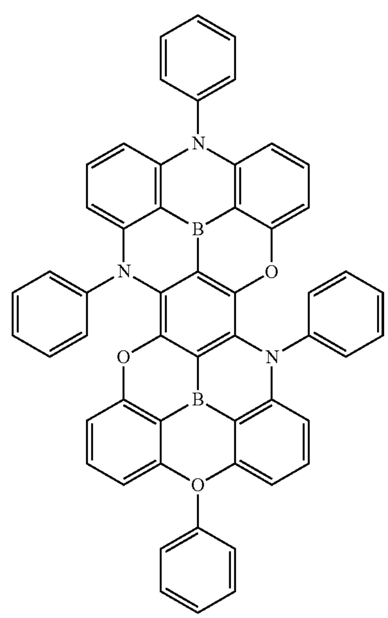

-continued
(1-2022)
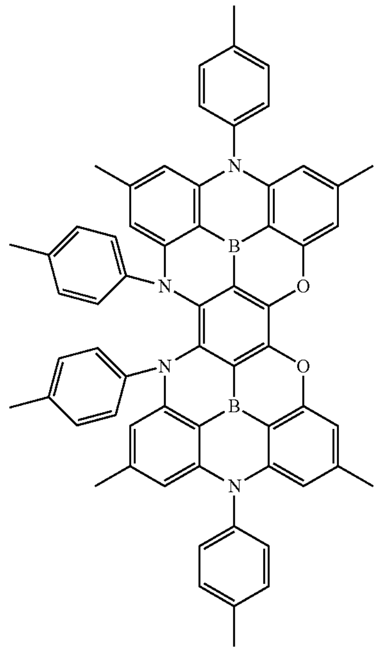
(1-2023)
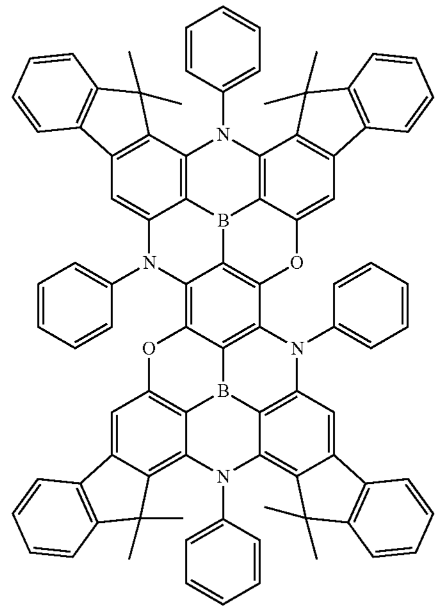
(1-2024)
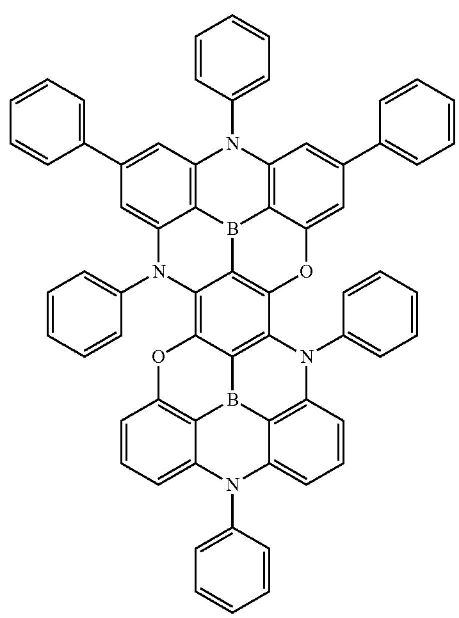
(1-2025)
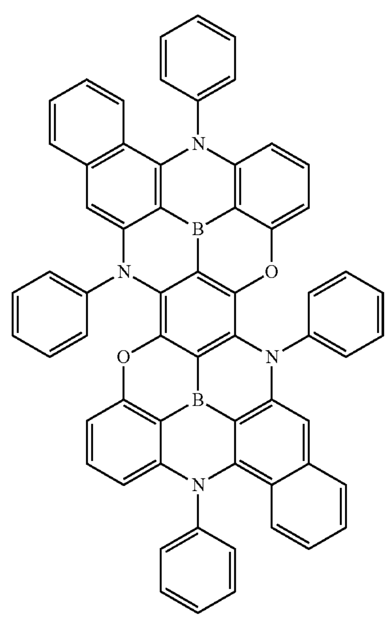

-continued
(1-2026)
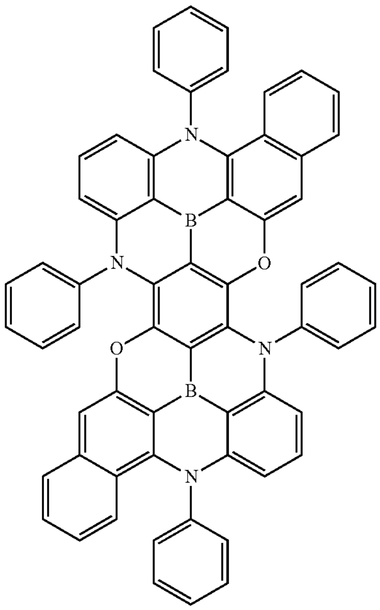
(1-2027)
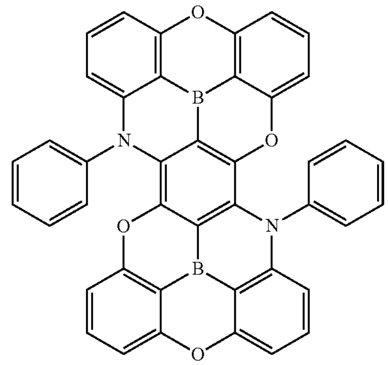
(1-2028)
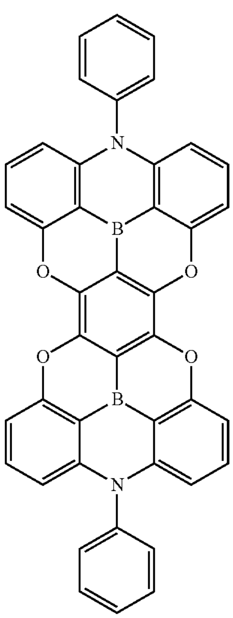
(1-2029)
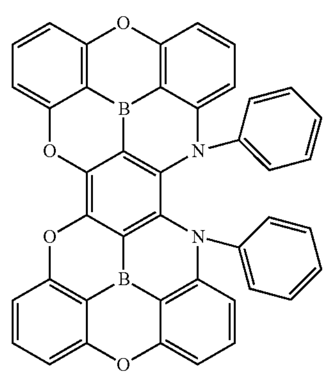

-continued
(1-2030)
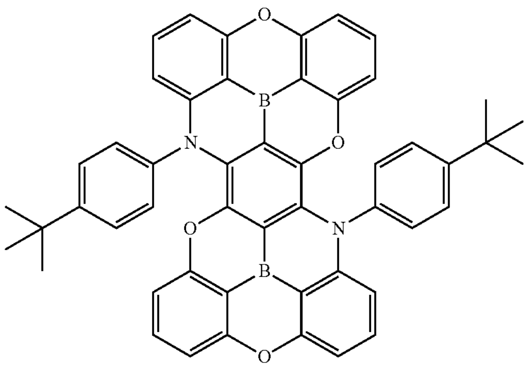
(1-2031)
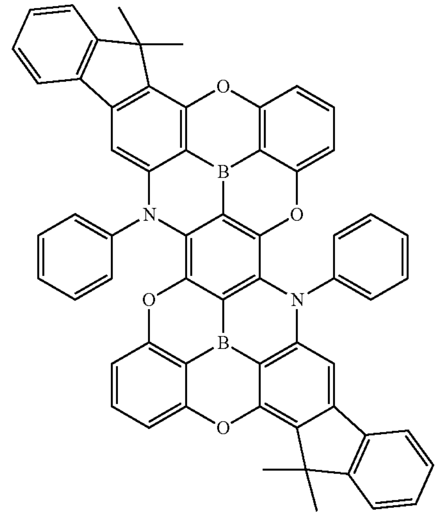
(1-2032)
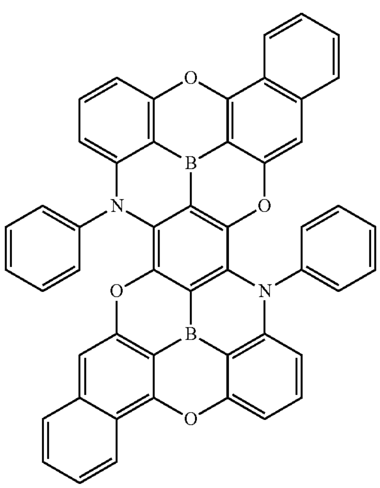
(1-2033)
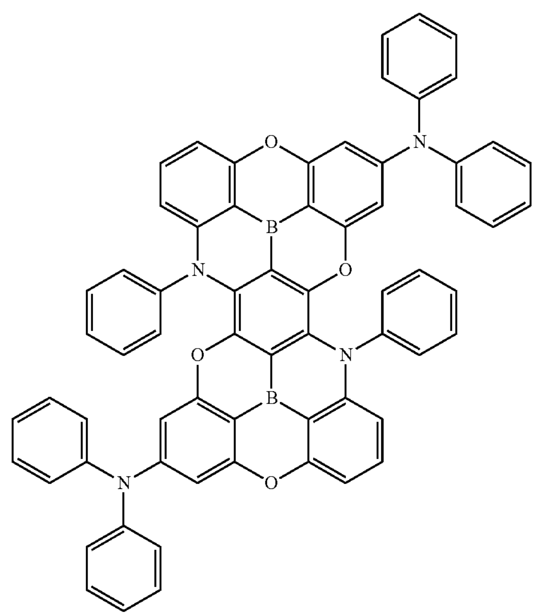

-continued
(1-12034)
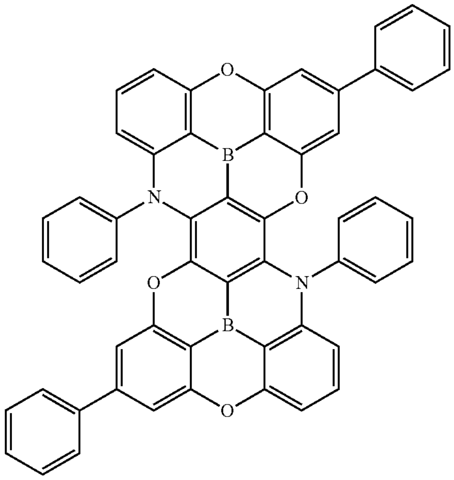
(1-2035)
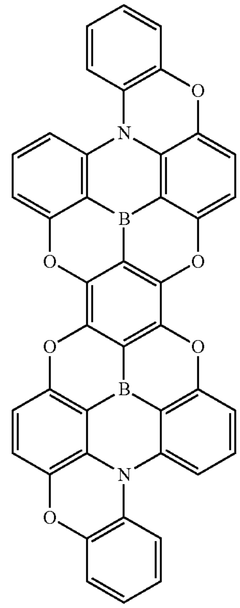
(1-2041)
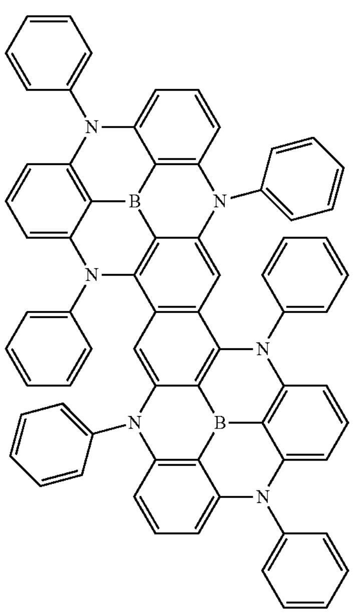
(1-2042)
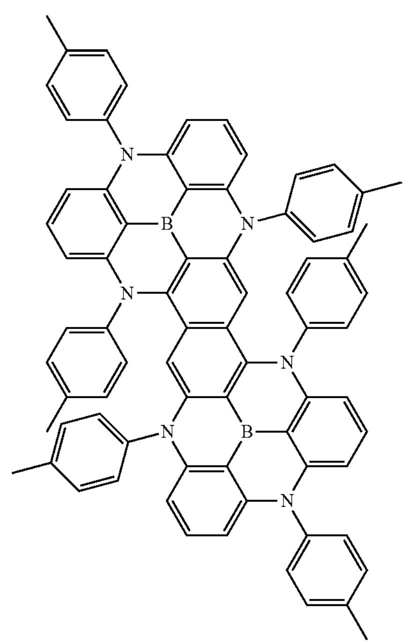

-continued
(1-2043)
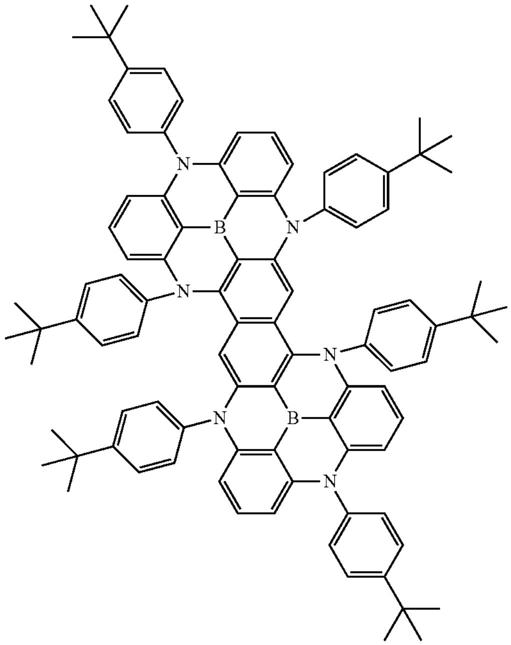
(1-2044)
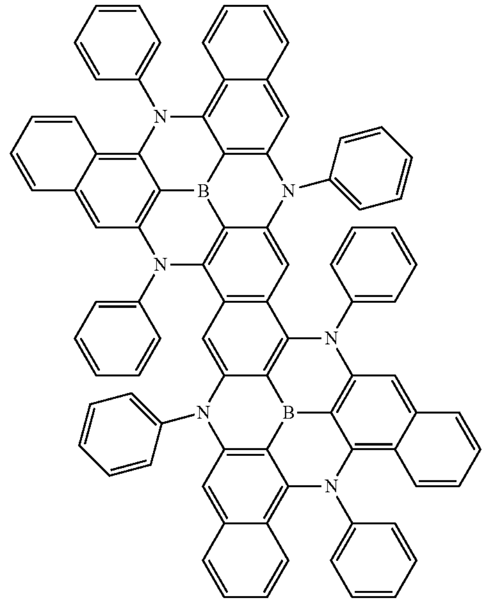
(1-2045)
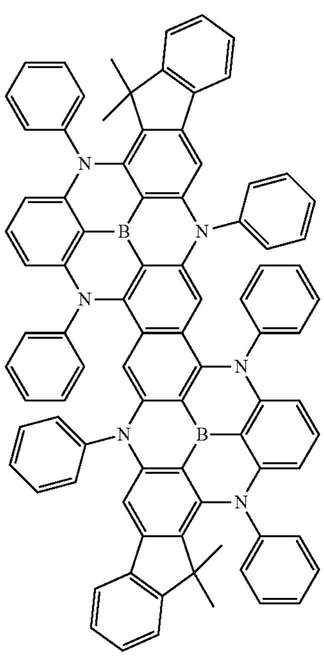
(1-2046)
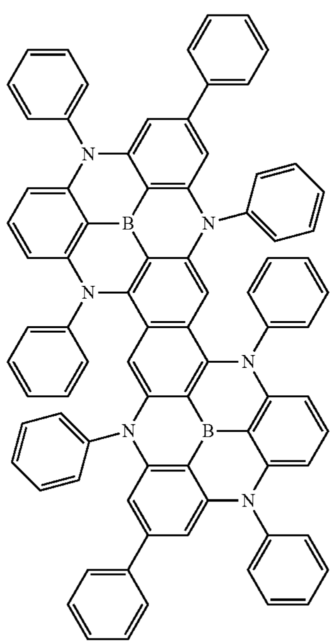

-continued
(1-2047)
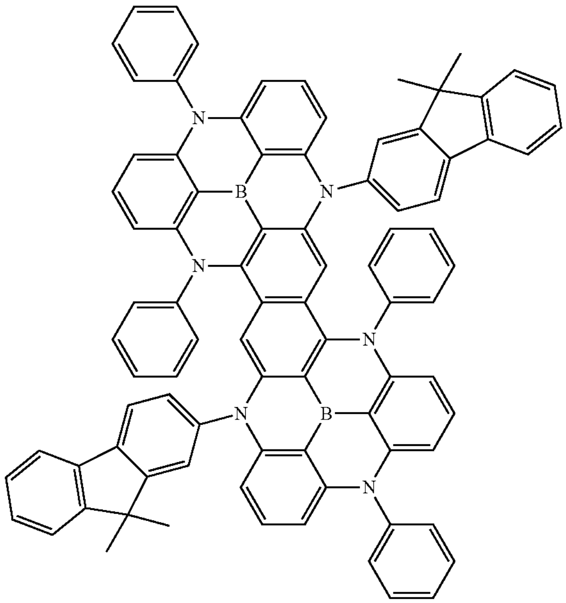
(1-2048)
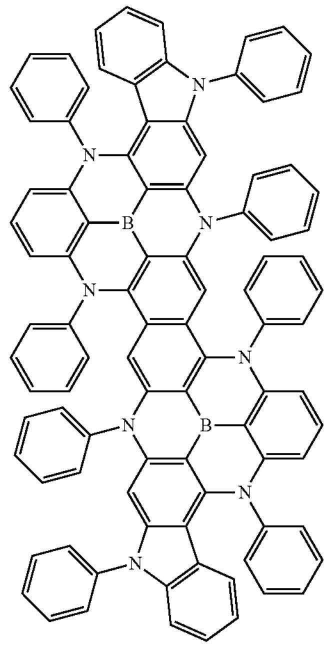
(1-2049)
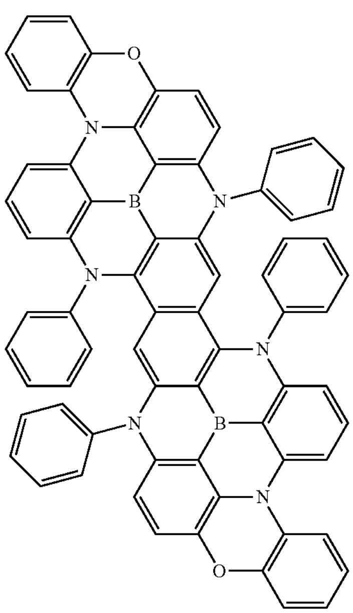
(1-2050)
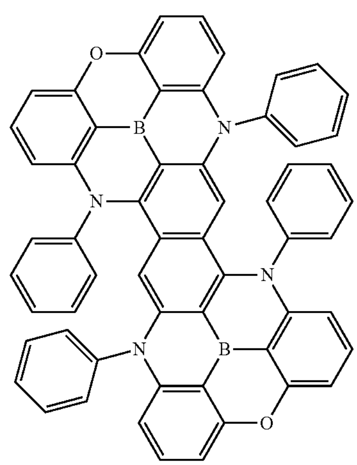

-continued
(1-2051)
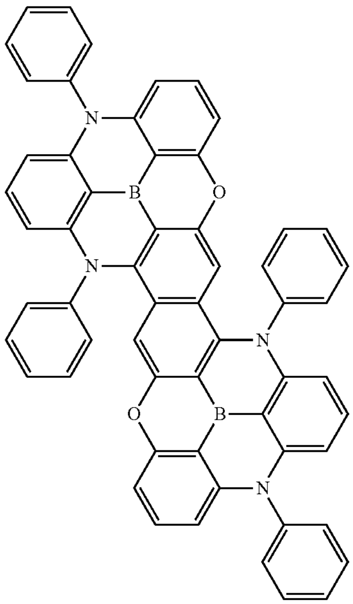
(1-2052)
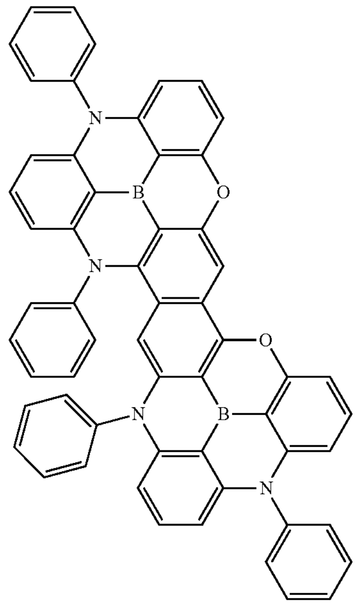
(1-2061)
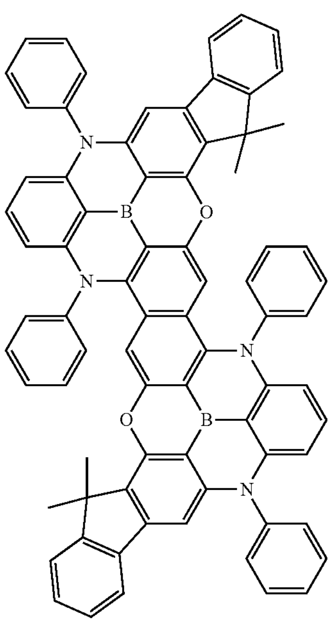
(1-2062)
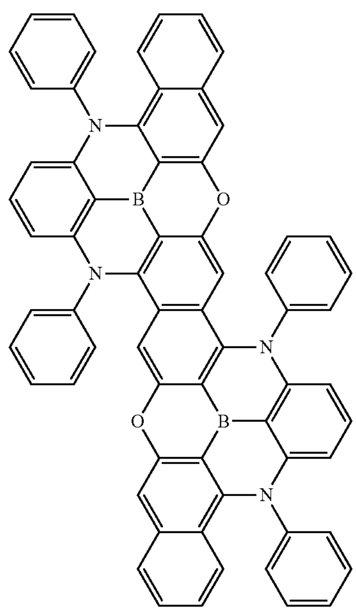

-continued
(1-2063)
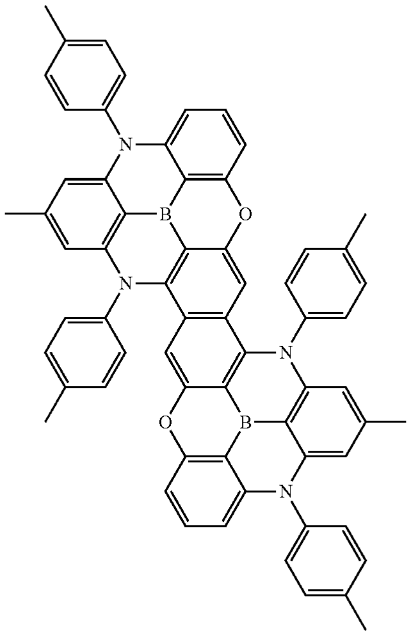
(1-2064)
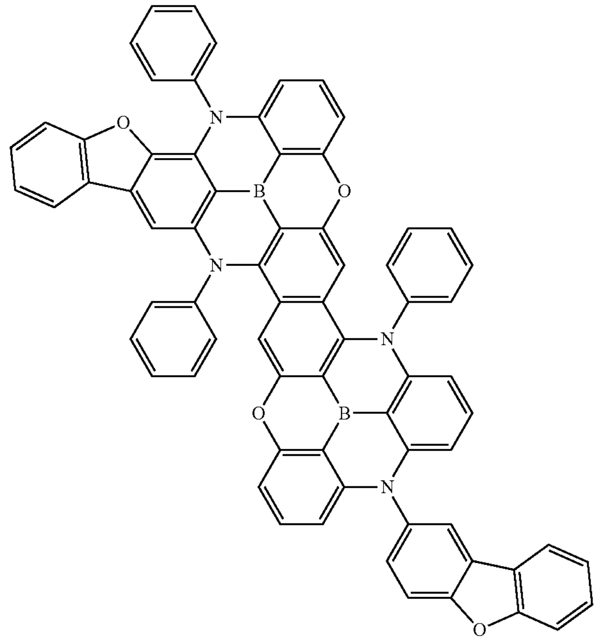
(1-2065)
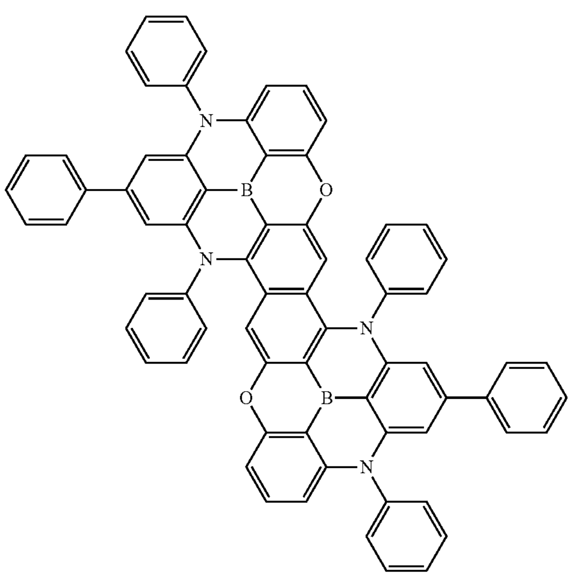
(1-2066)
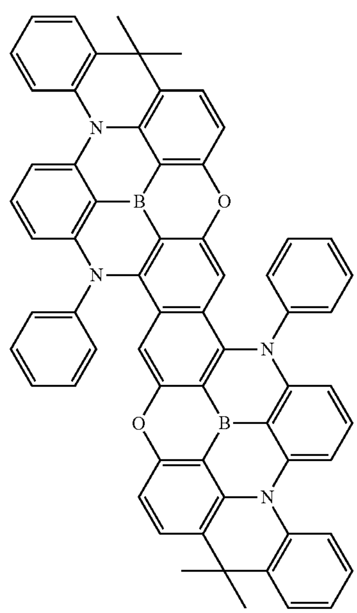

-continued
(1-2067)
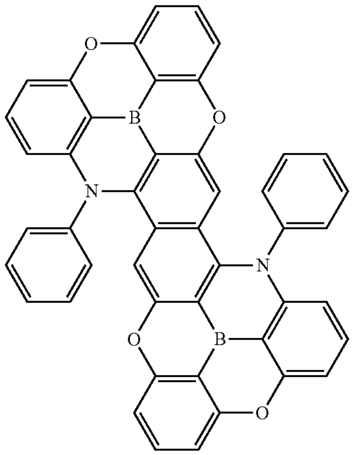
(1-2068)
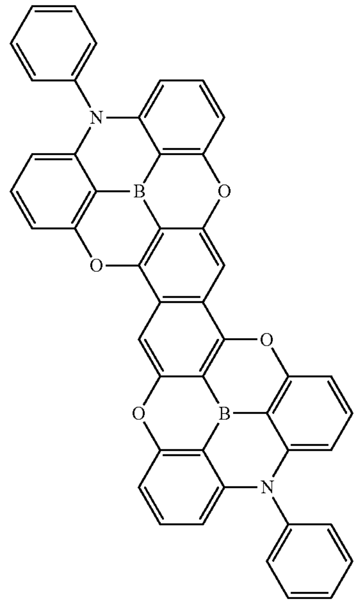
(1-2069)
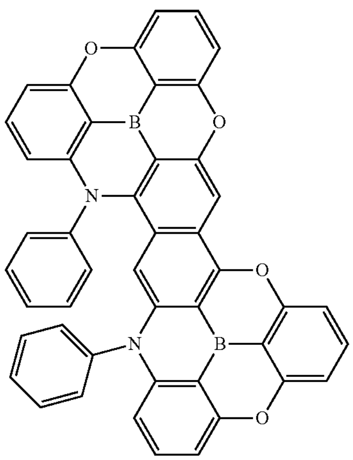
(1-2070)
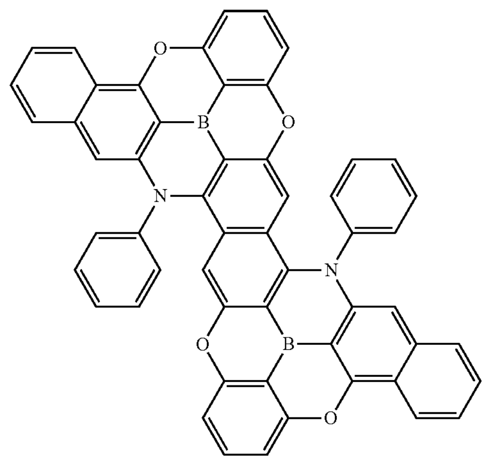
(1-2071)
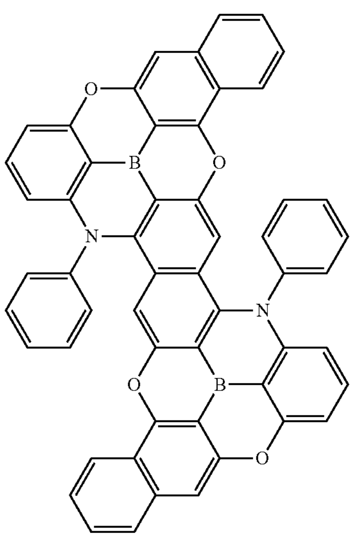
(1-2072)
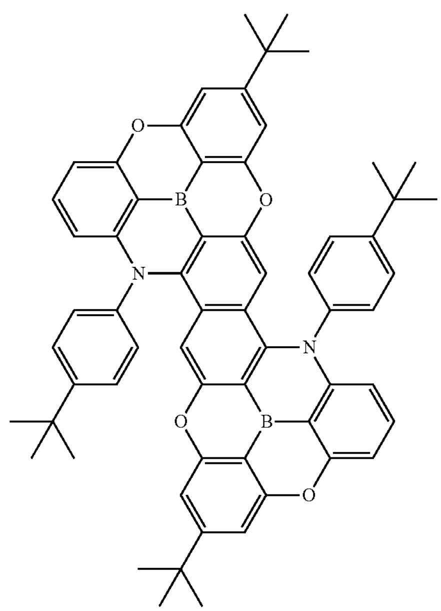

-continued
(1-2073)
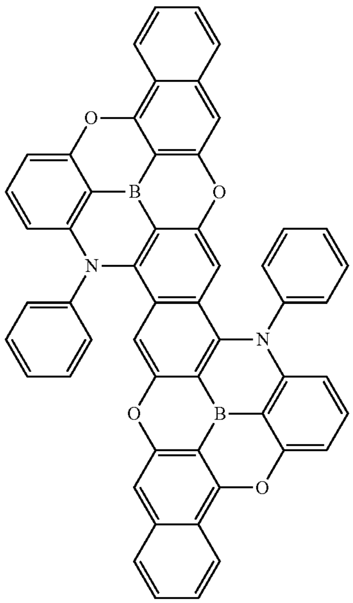
(1-2074)
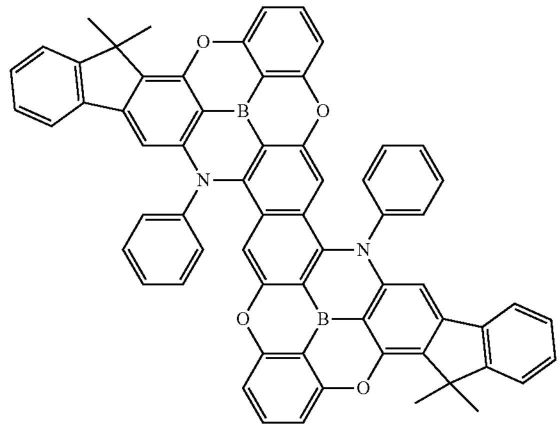
(1-2075)
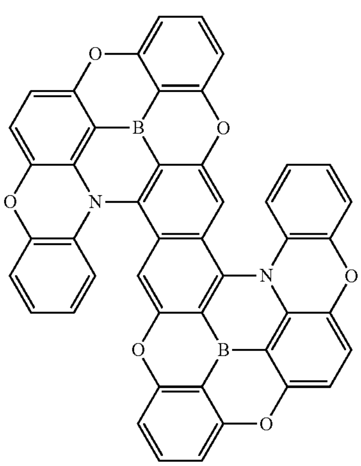
(1-2081)
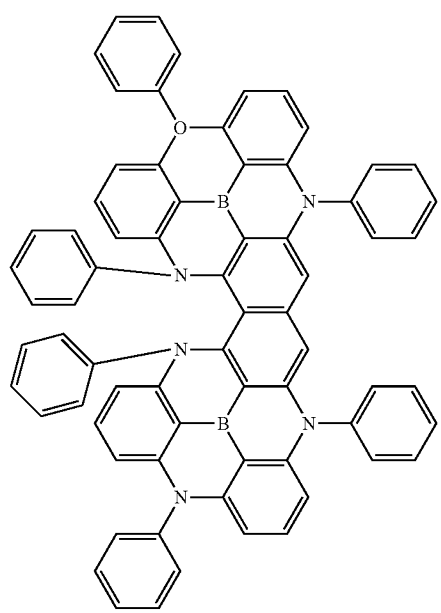

-continued
(1-2082)
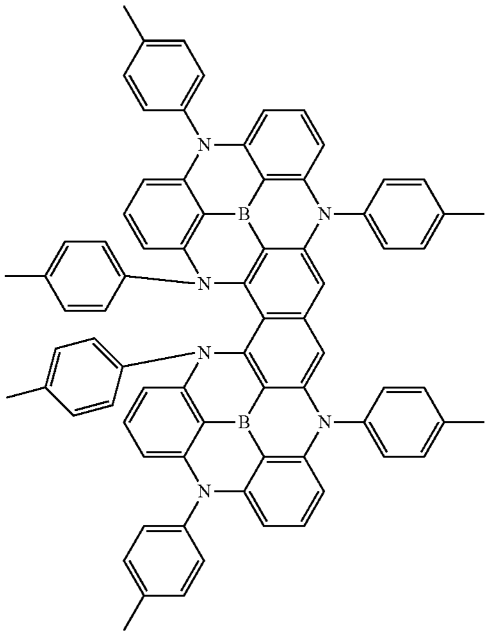
(1-2083)
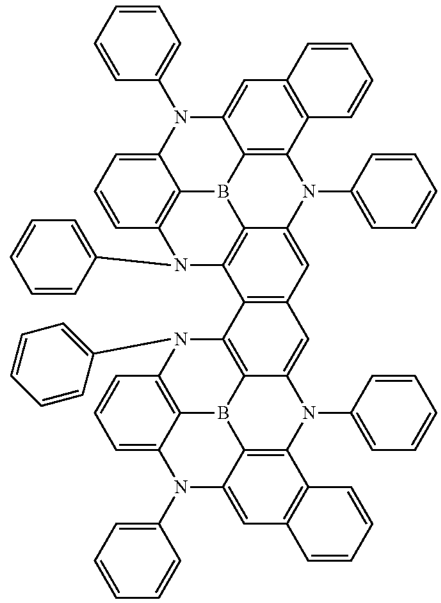
(1-2084)
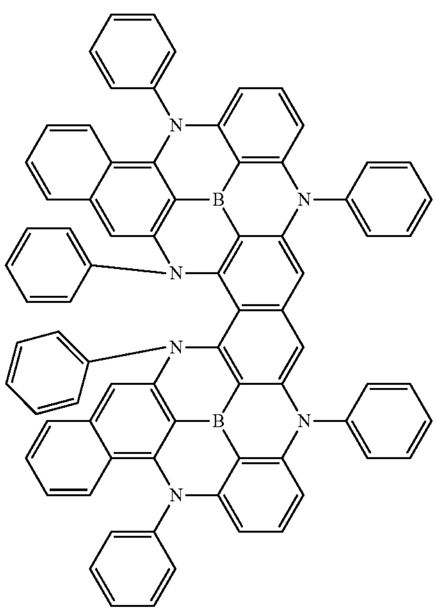
(1-2085)
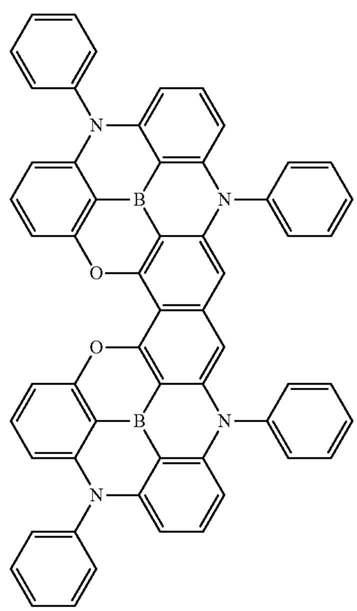

-continued
(1-2086)
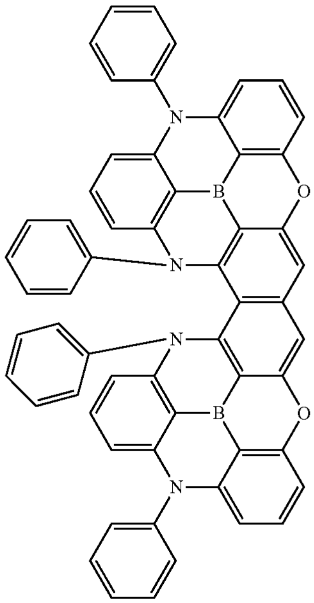
(1-2087)
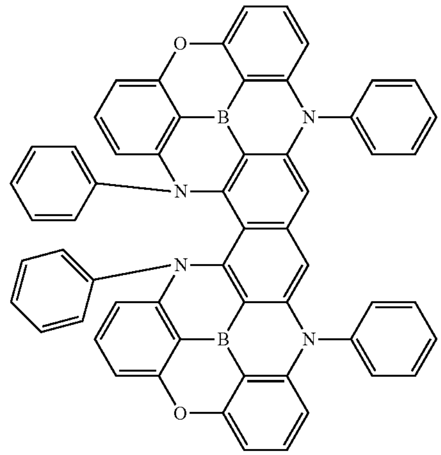
(1-2088)
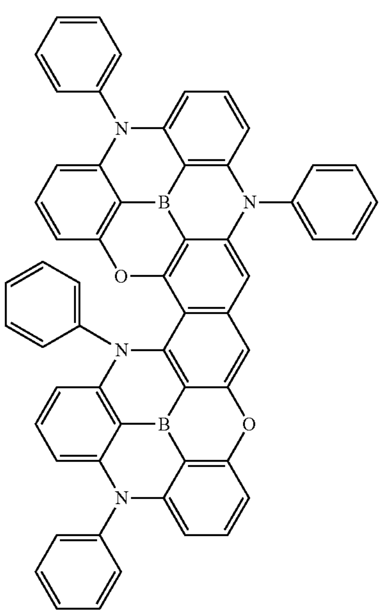
(1-2089)
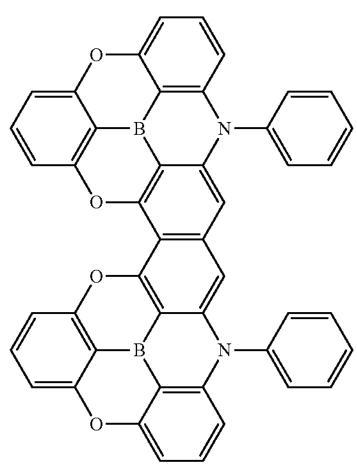

-continued
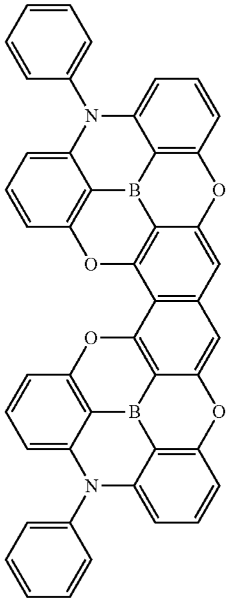
(1-2090)
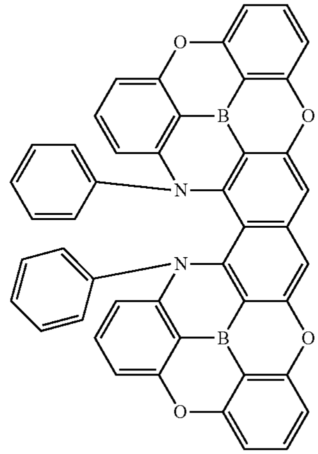
(1-2091)
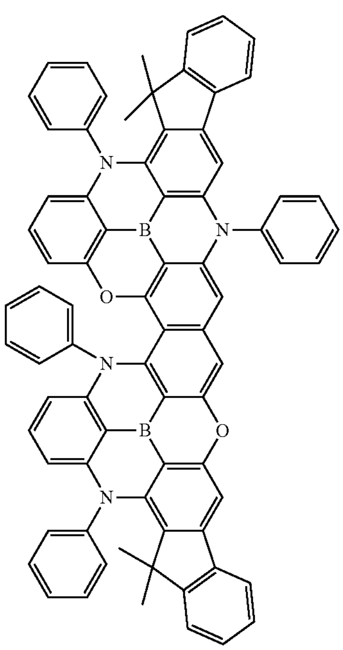
(1-2092)
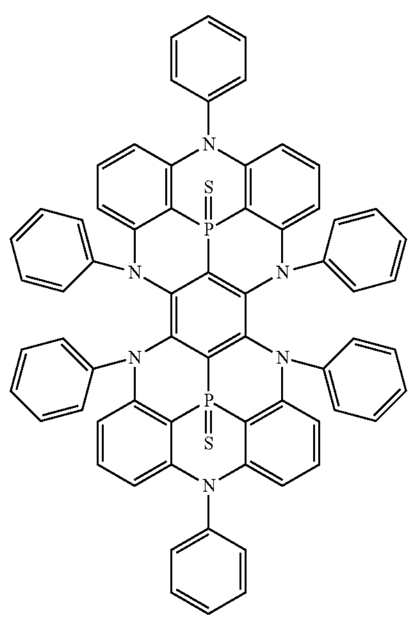
(1-2101)

-continued
(1-2102)
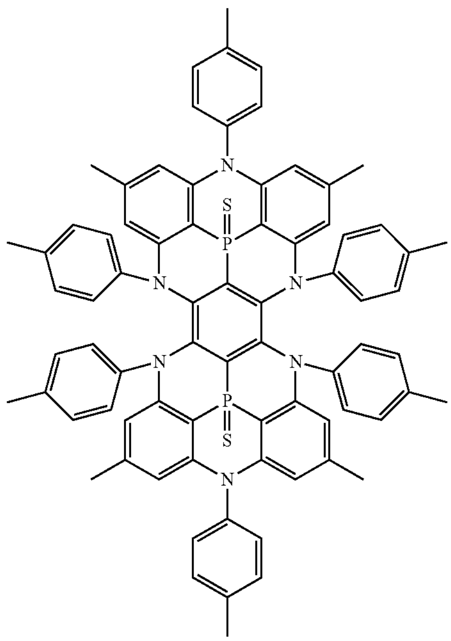
(1-2103)
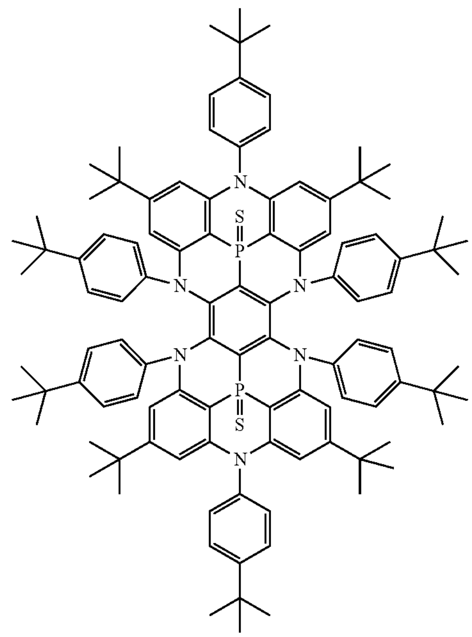
(1-2104)
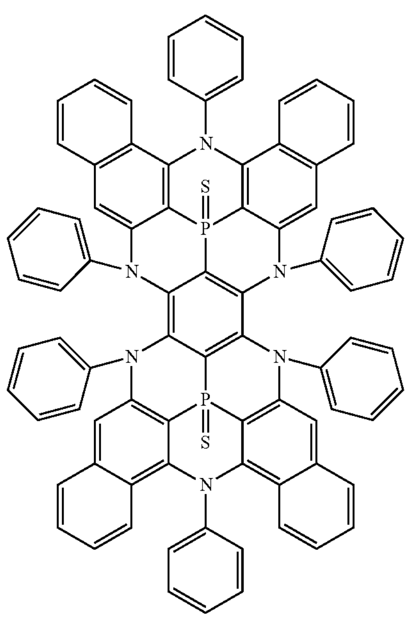
(1-2105)
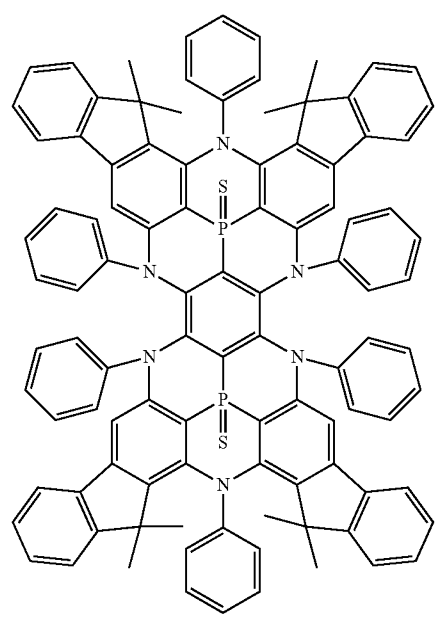

-continued
(1-2106)
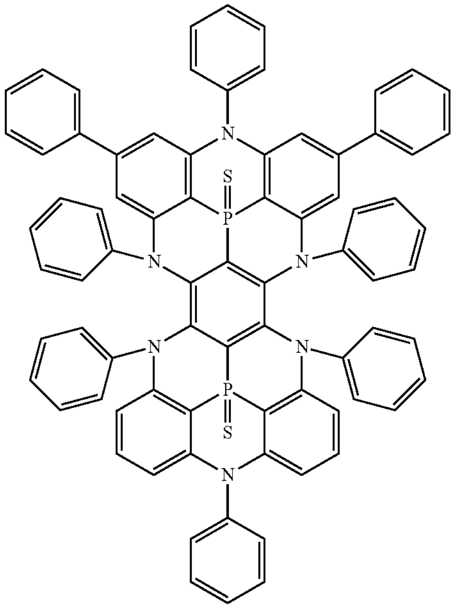
(1-2107)
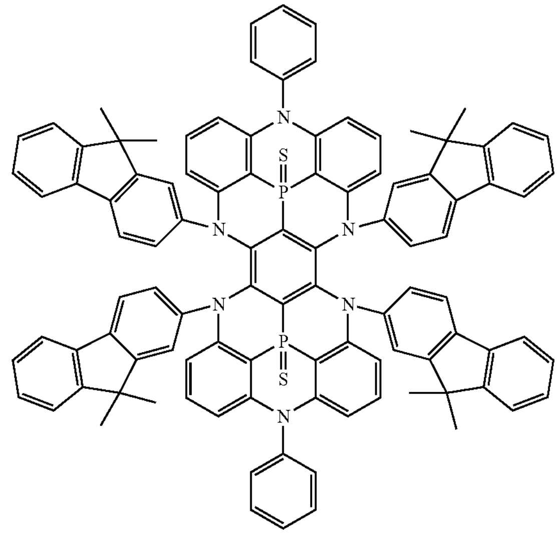
(1-2108)
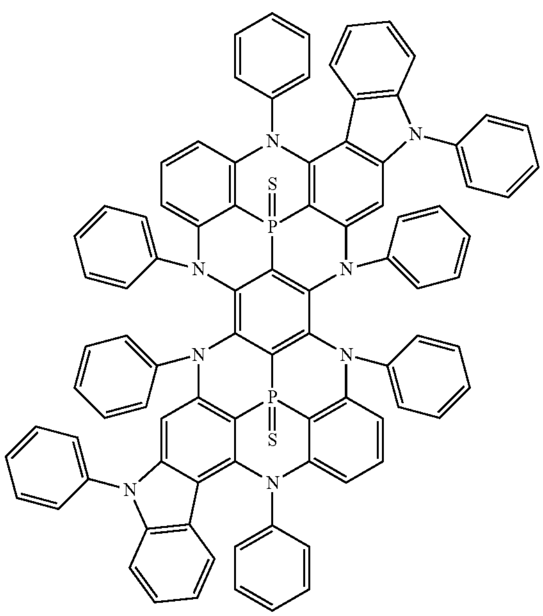
(1-2109)
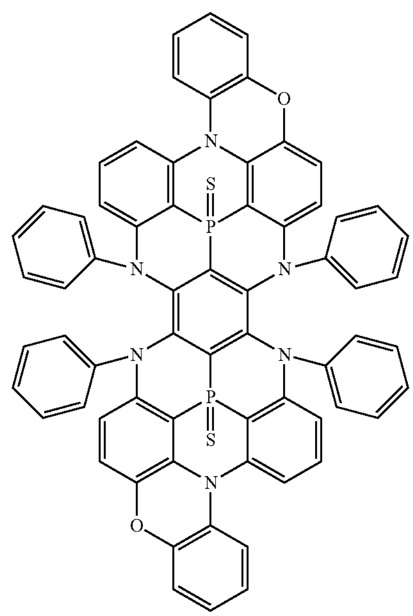

-continued
(1-2110)
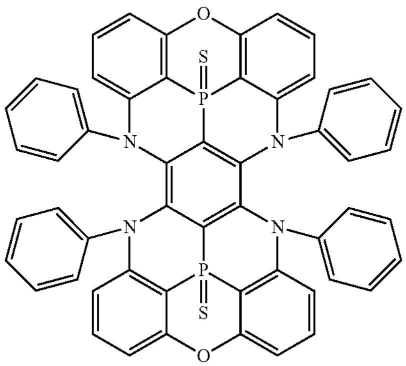
(1-2111)
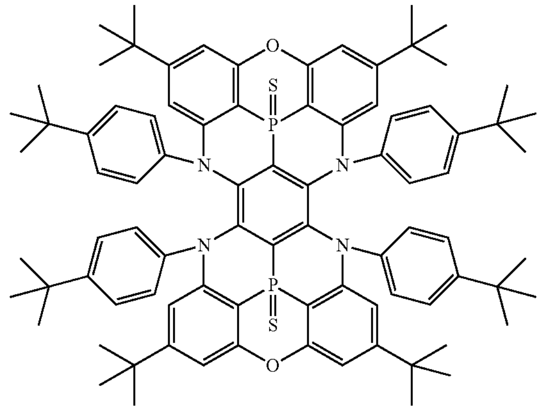
(1-2112)
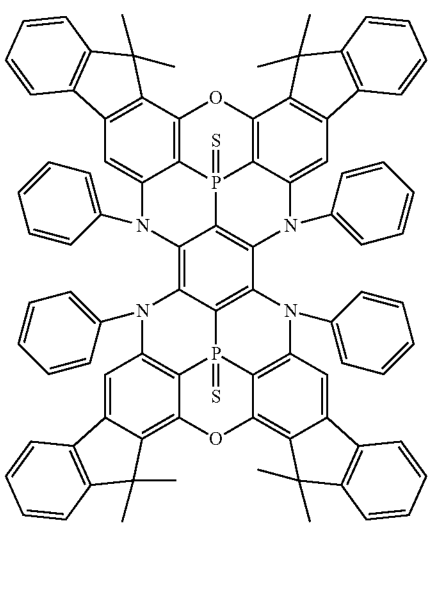
(1-2121)
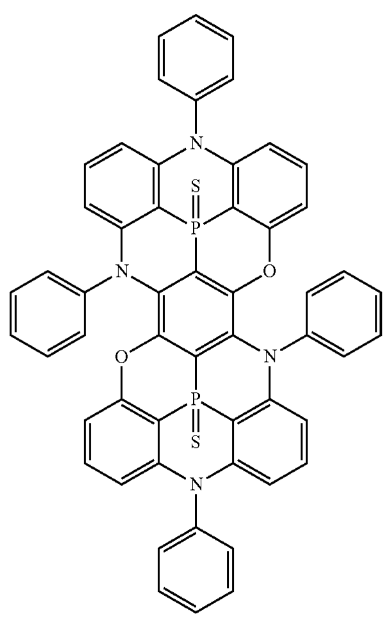

-continued
(1-2122)
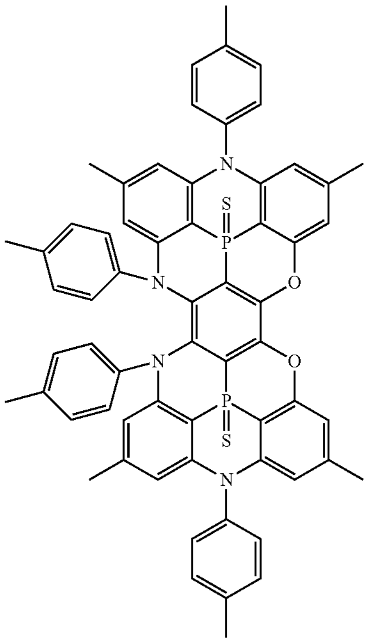
(1-2123)
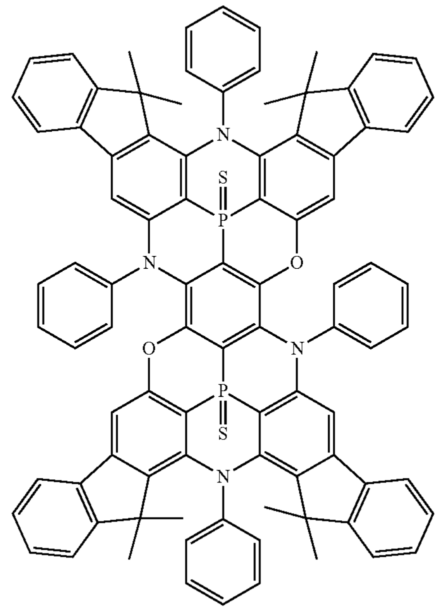
(1-2124)
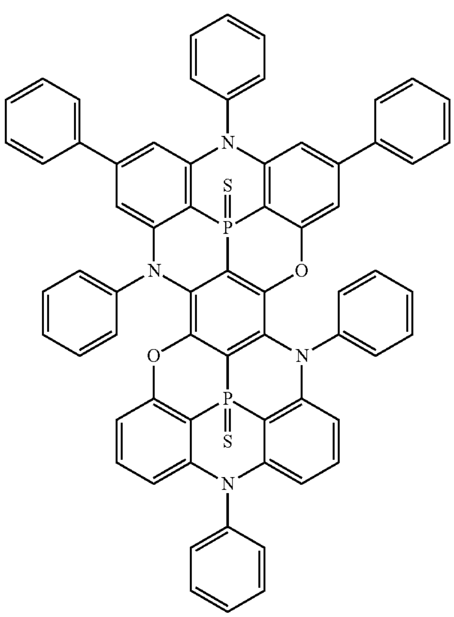
(1-2125)
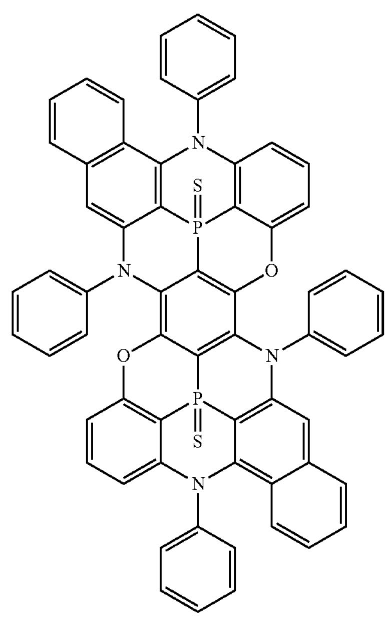

-continued
(1-2126)
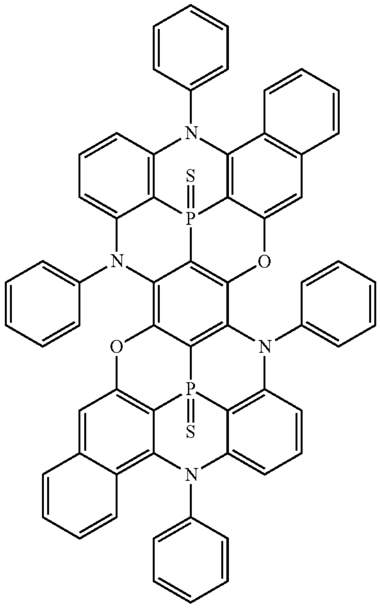
(1-2127)
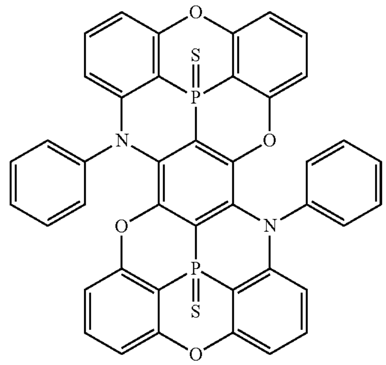
(1-2128)
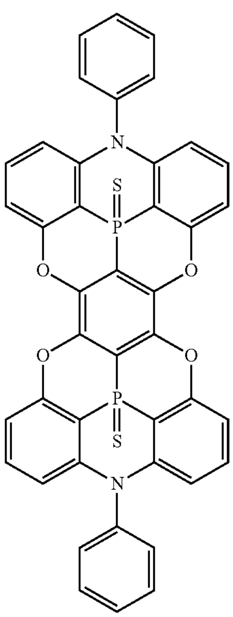
(1-212)
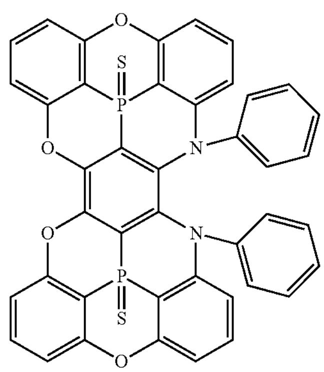

-continued
(1-2130)
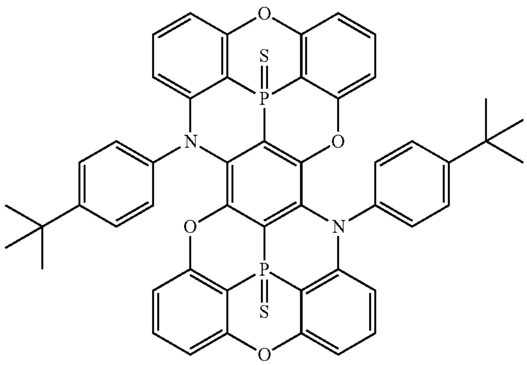
(1-2131)
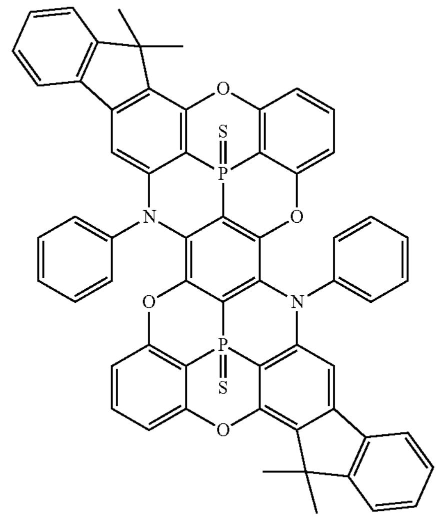
(1-2132)
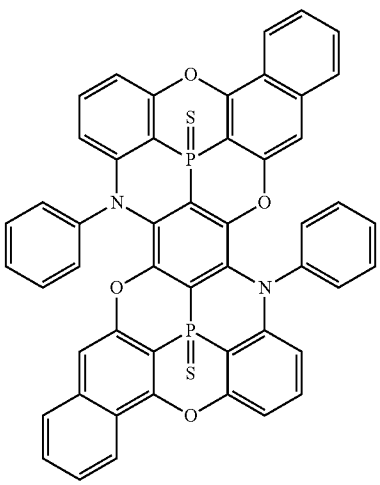
(1-2133)
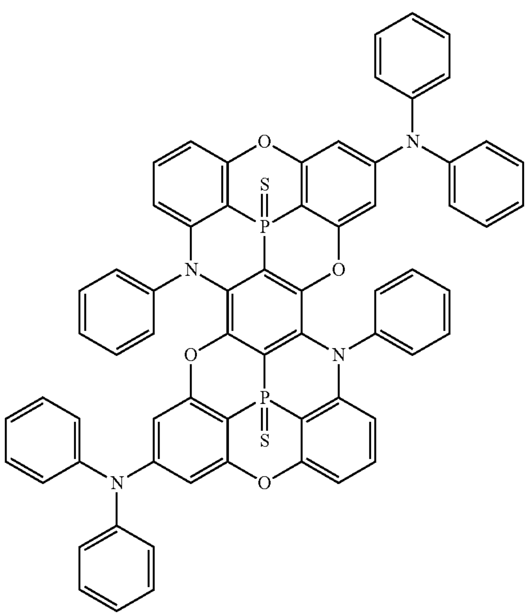
(1-2134)
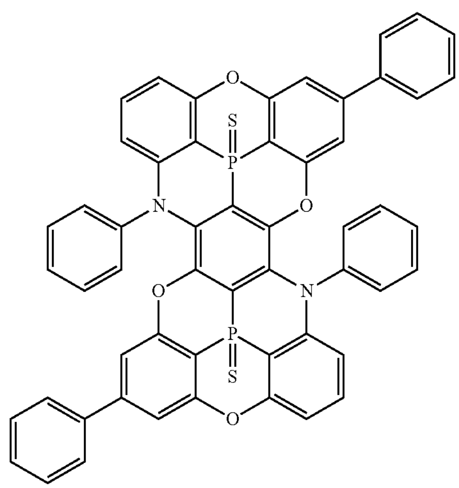

-continued
(1-2135)
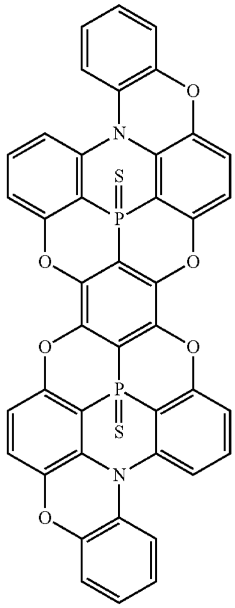
(1-2141)
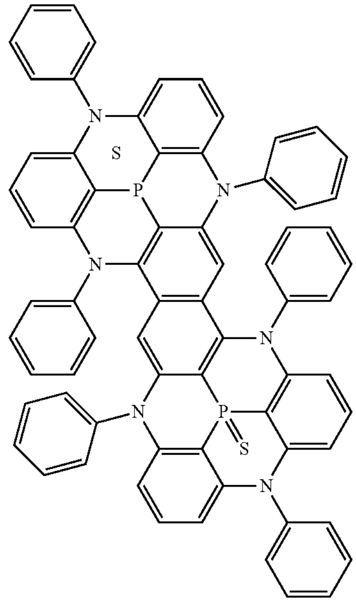
(1-2142)
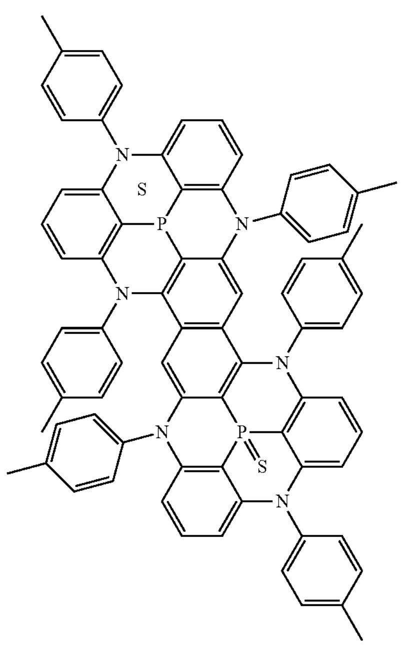
(1-2143)
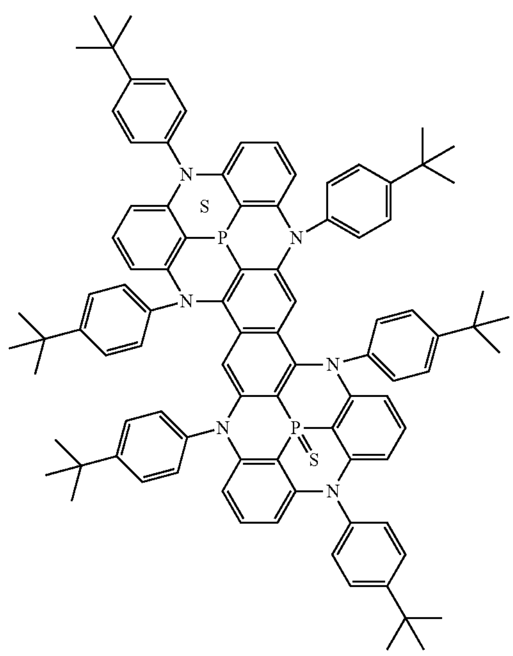

-continued
(1-2144)
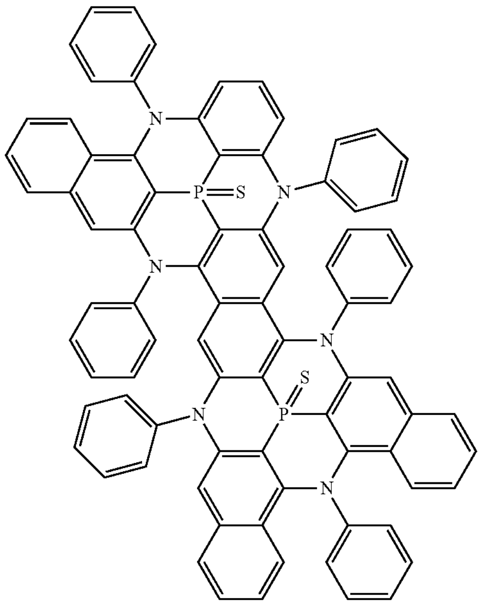
(1-2145)
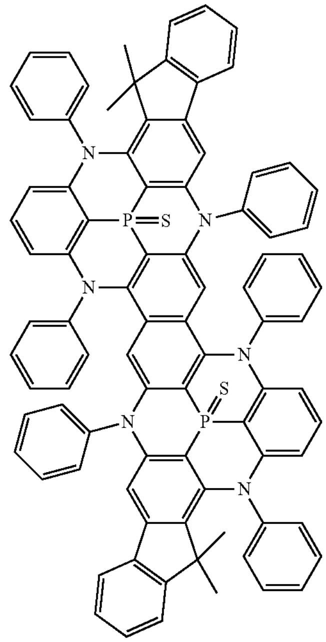
(1-2146)
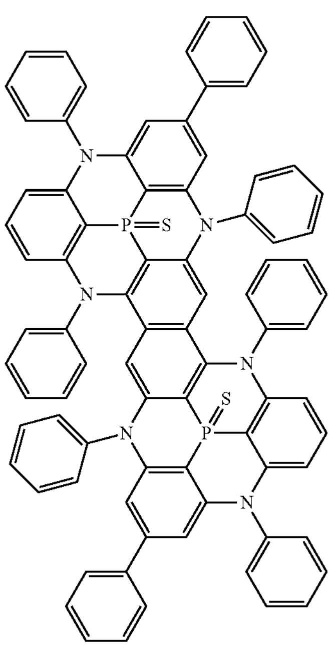
(1-2147)
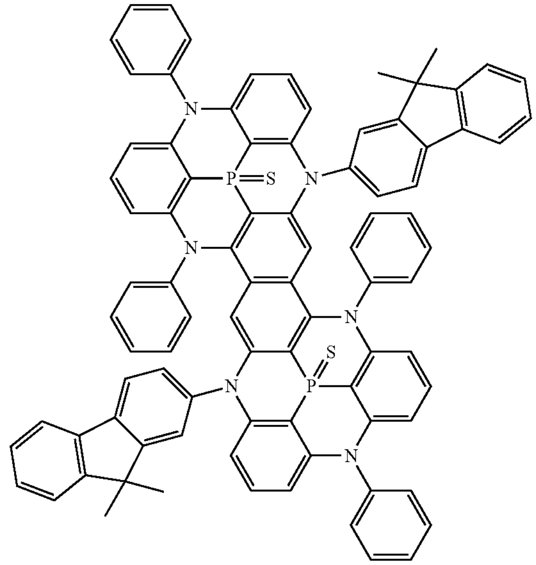

-continued
(1-2148)
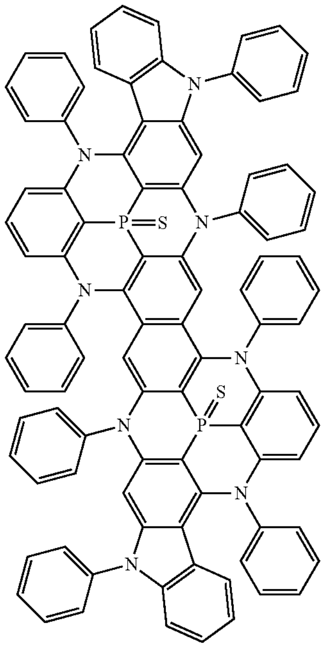
(1-2149)
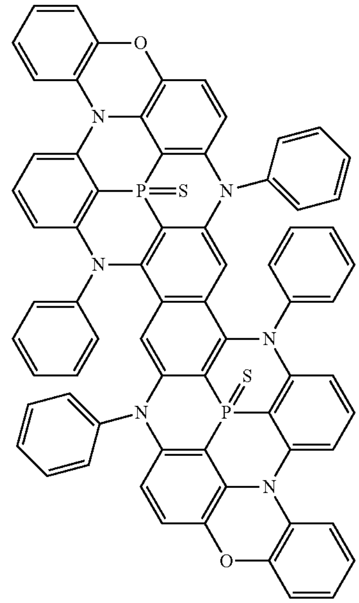
(1-2150)
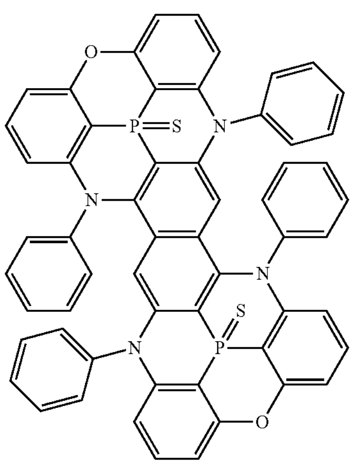
(1-2151)
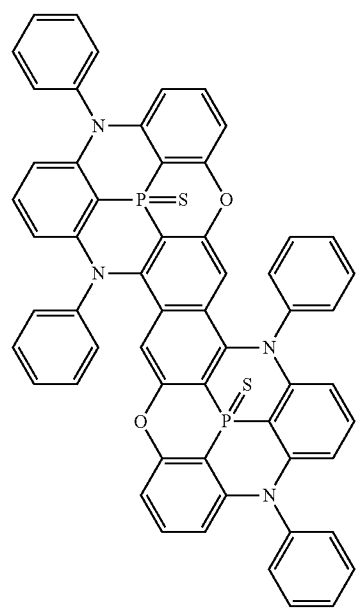

-continued
(1-2152)
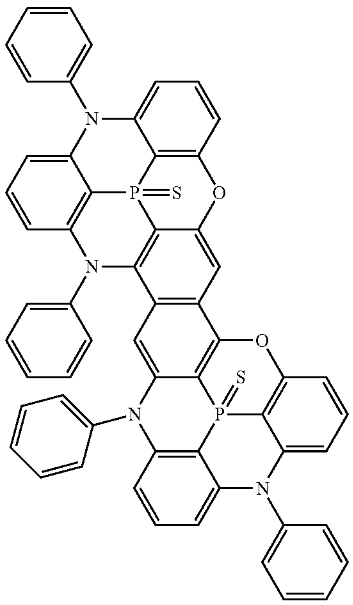
(1-2161)
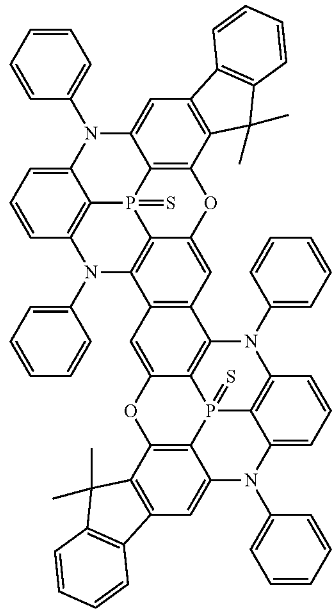
(1-2162)
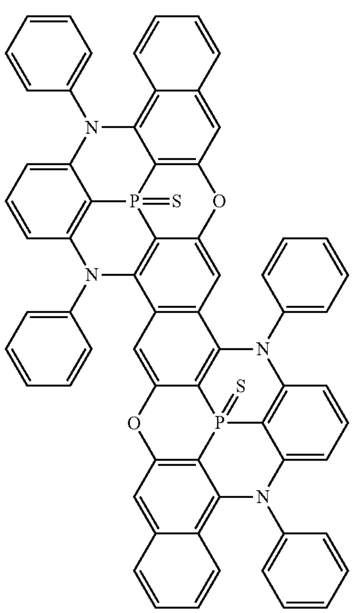
(1-2163)
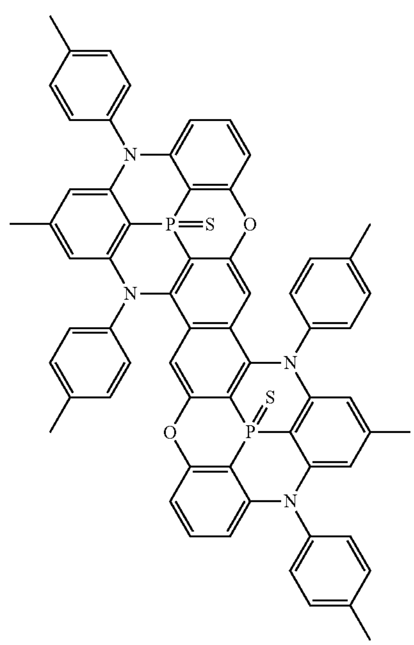

-continued
(1-2164)
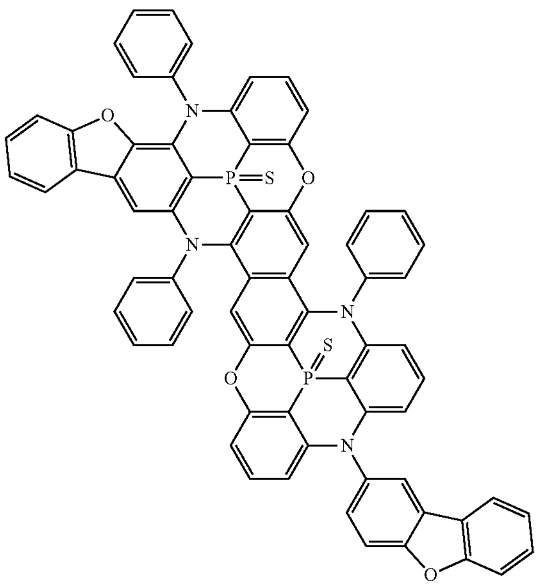
(1-2165)
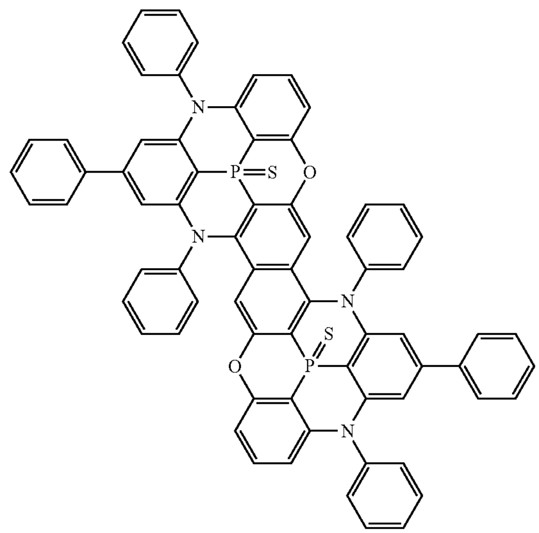
(1-2166)
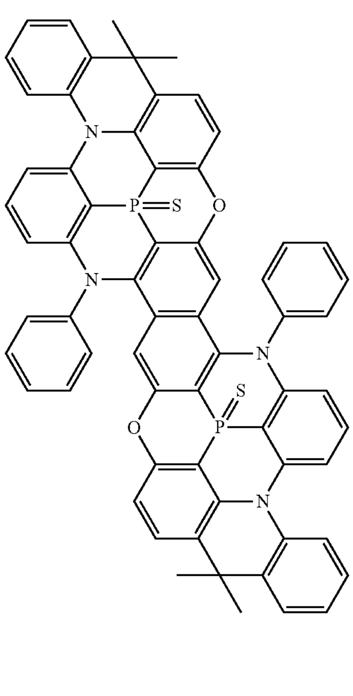
(1-2167)
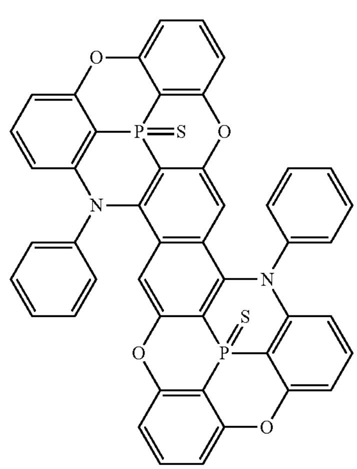

-continued
(1-2168)
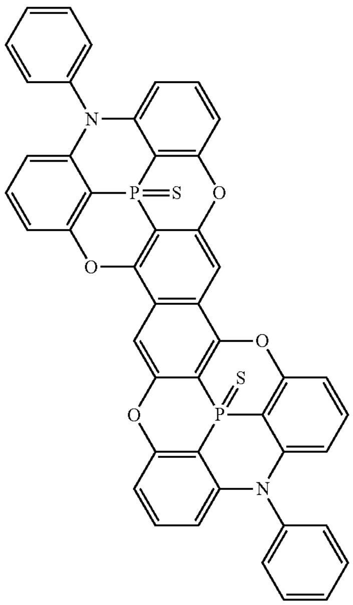
(1-2169)
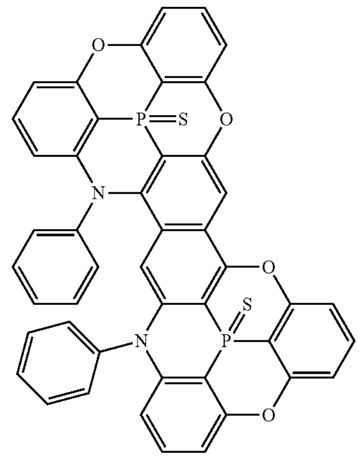
(1-2170)
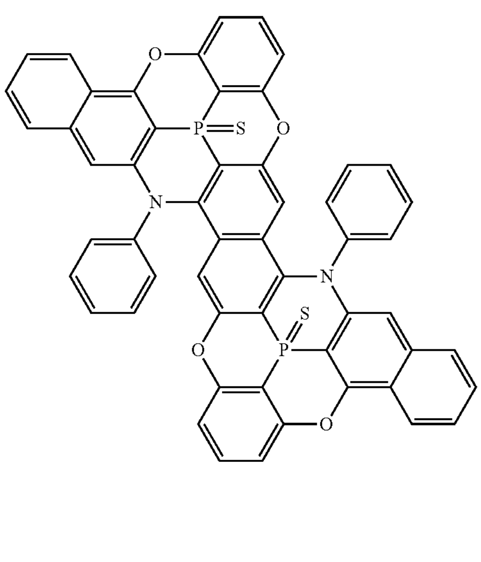
(1-2171)
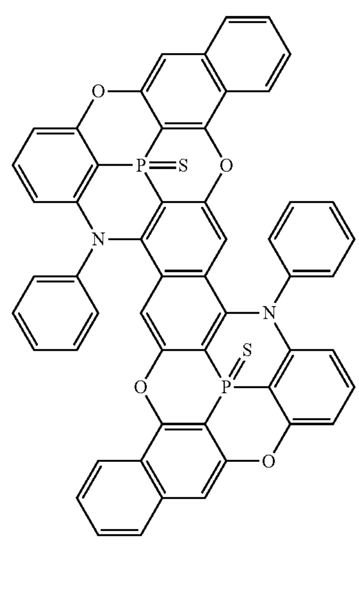

-continued
(1-2172)
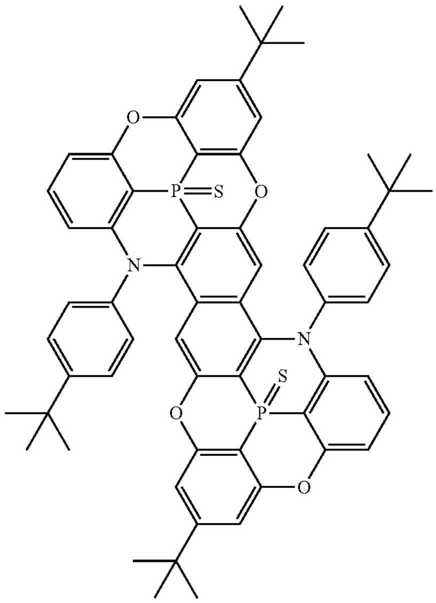
(1-2173)
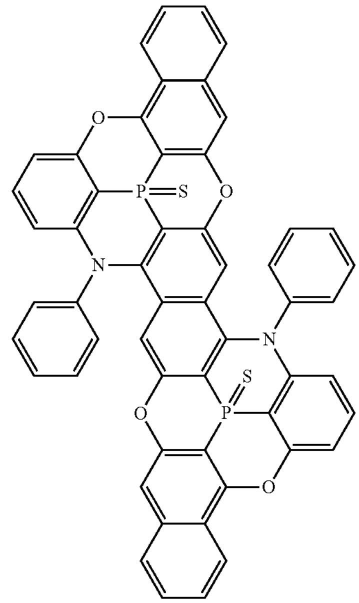
(1-2174)
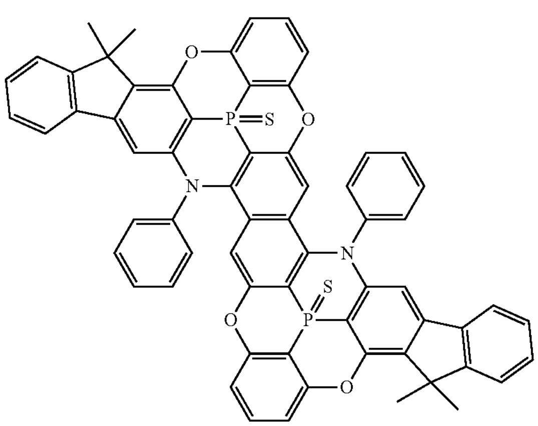
(1-2175)
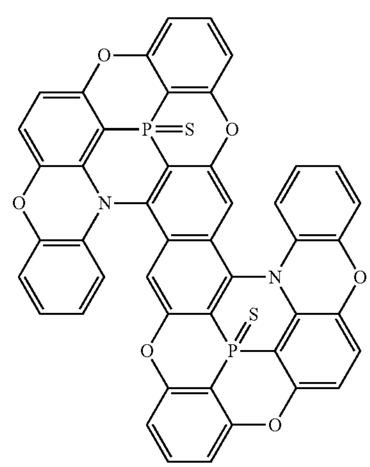

-continued
(1-2181)
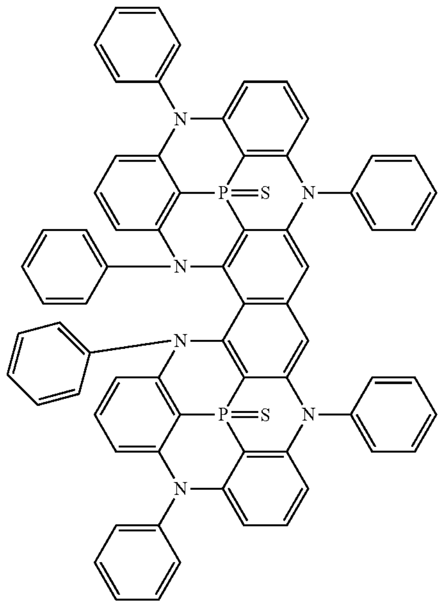
(1-2182)
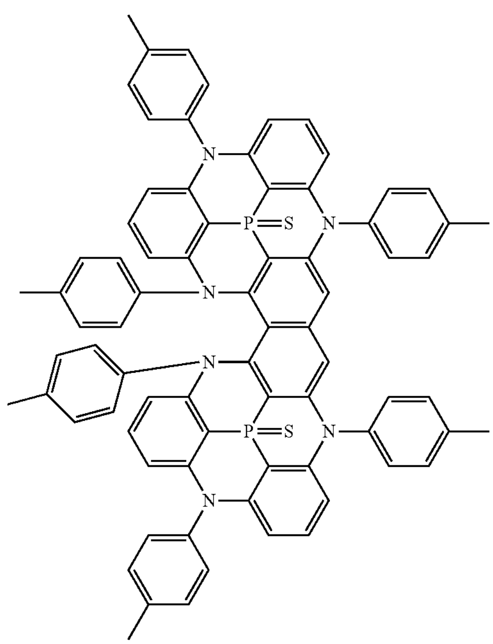
(1-2183)
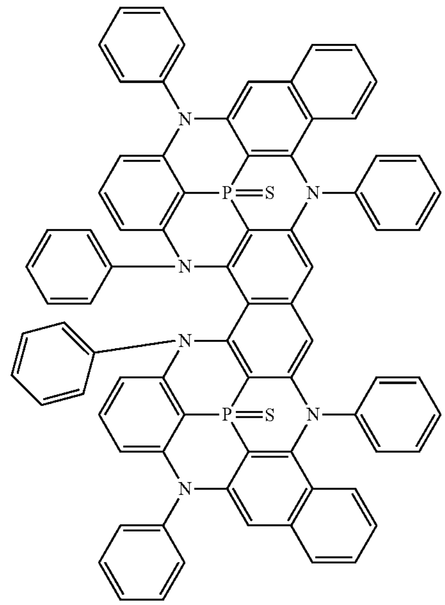
(1-2184)
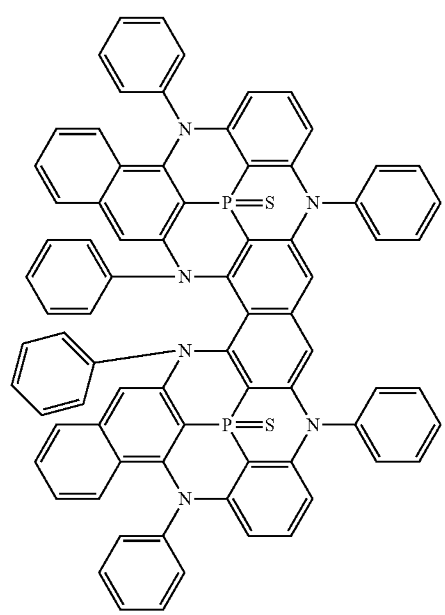

(1-2185)
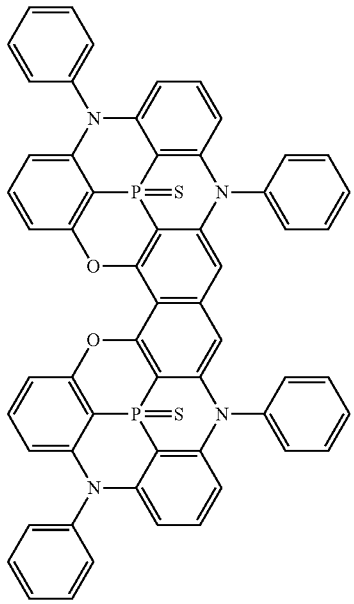
(1-2186)
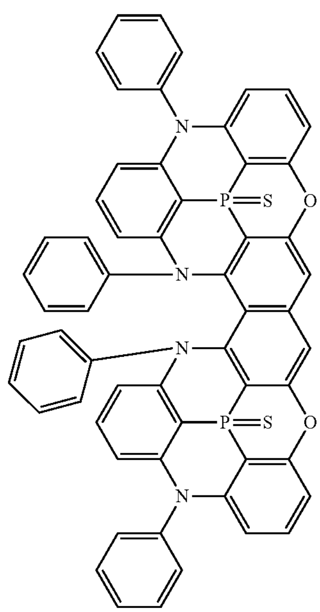
(1-2187)
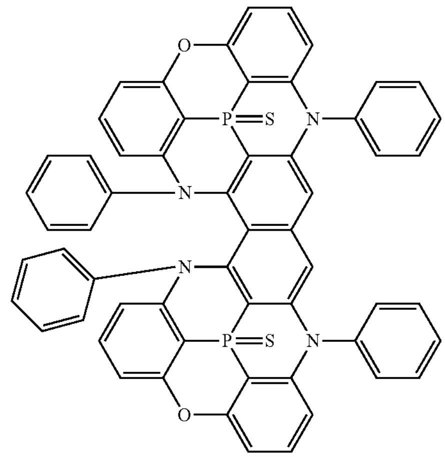
(1-2188)
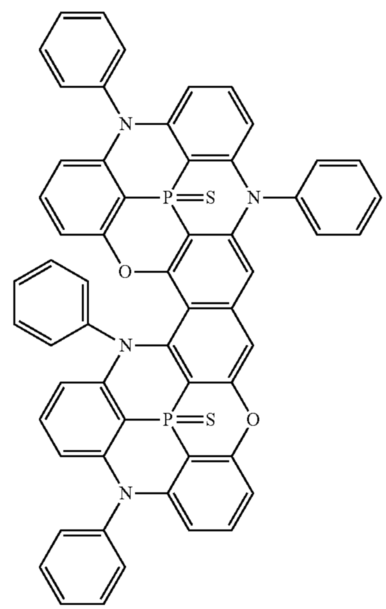
(1-2189)
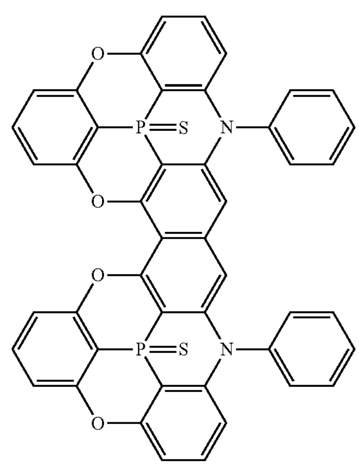

-continued
(1-2190)
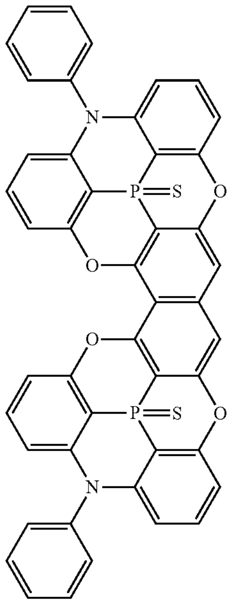
-continued
(1-2192)
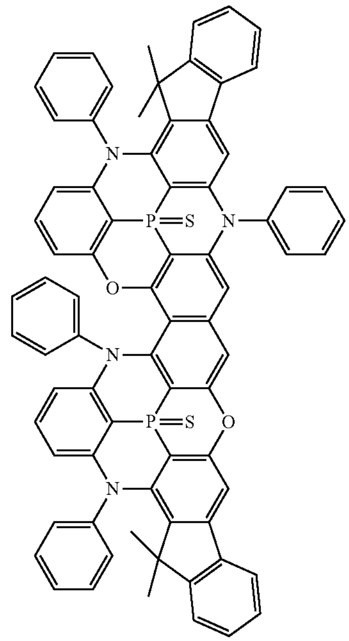
(1-2191)
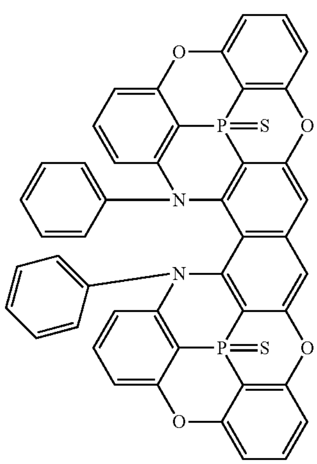
(1-2201)
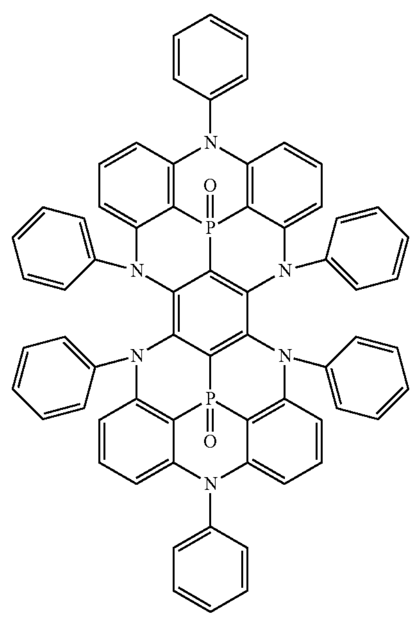

-continued
(1-2202)
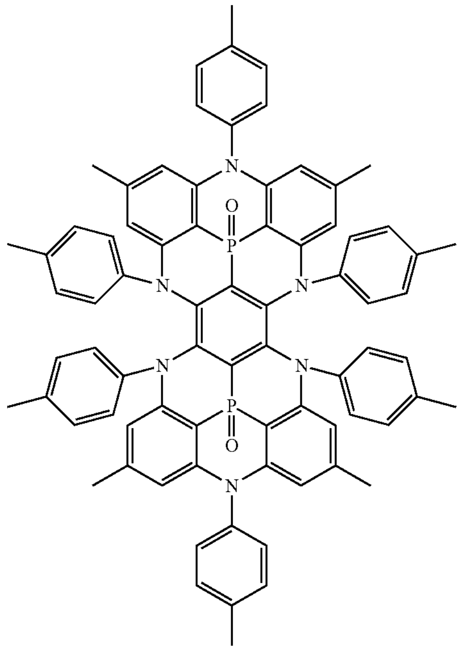
(1-2203)
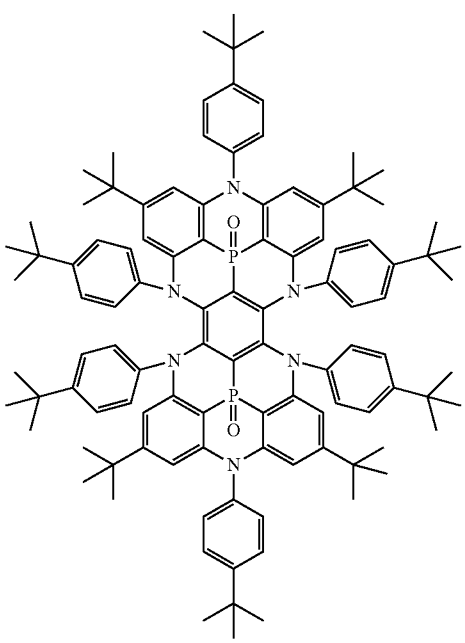
-continued
(1-2204)
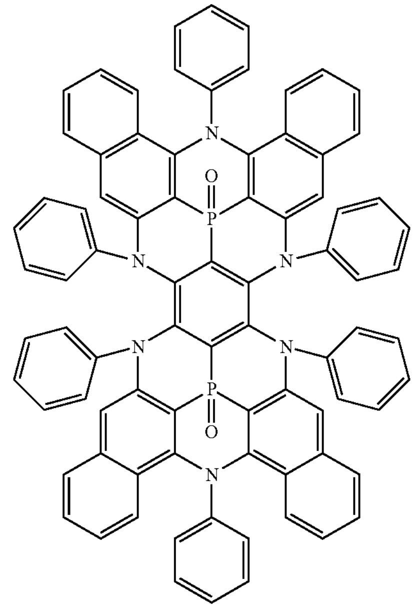
(1-2205)
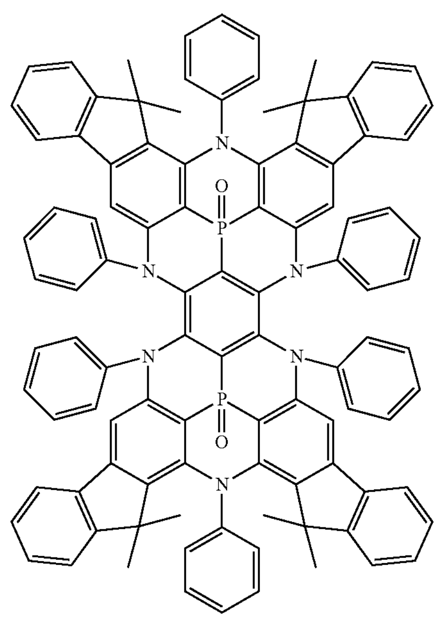

-continued
(1-2206)
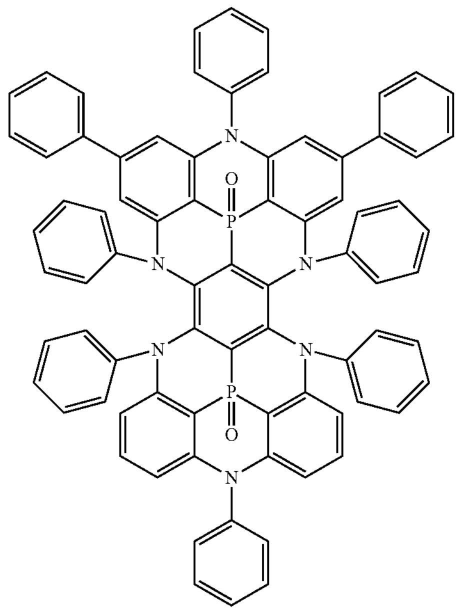
(1-2207)
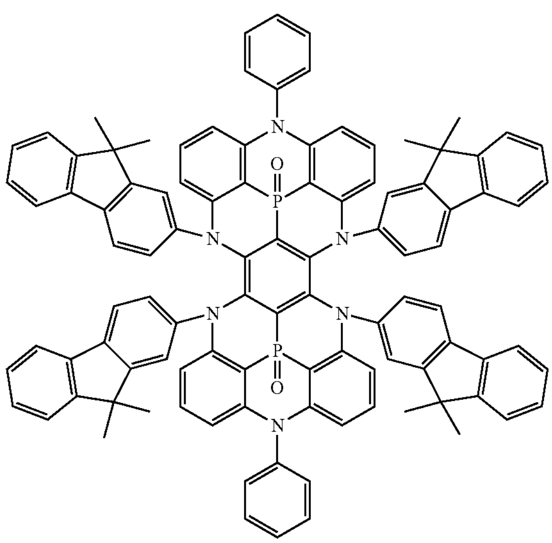
-continued
(1-2208)
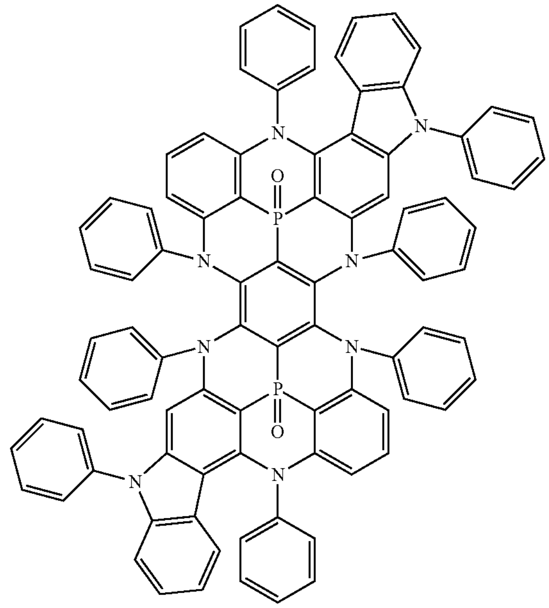
(1-2209)
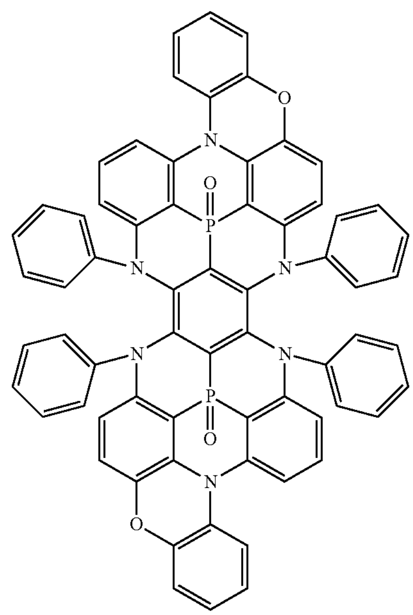
(1-2210)
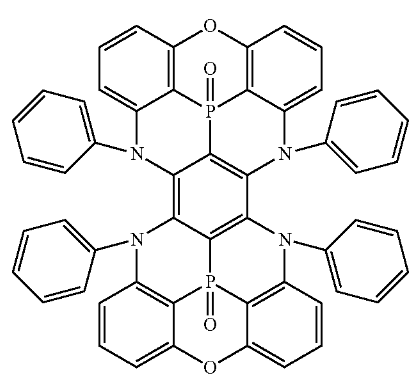

-continued
(1-2211)
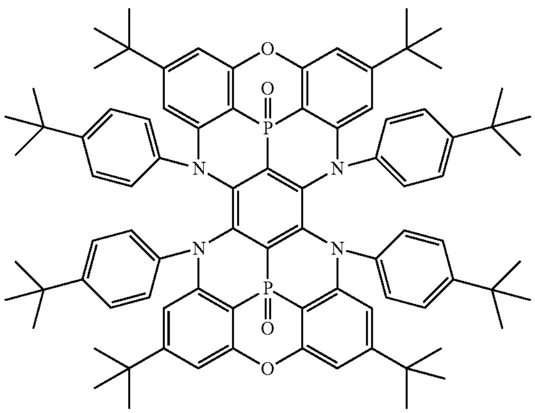
(1-2212)
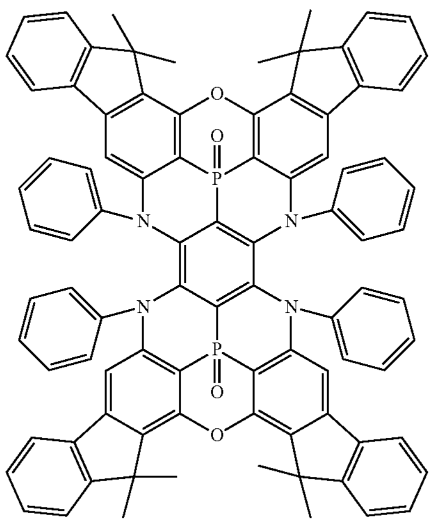
(1-2221)
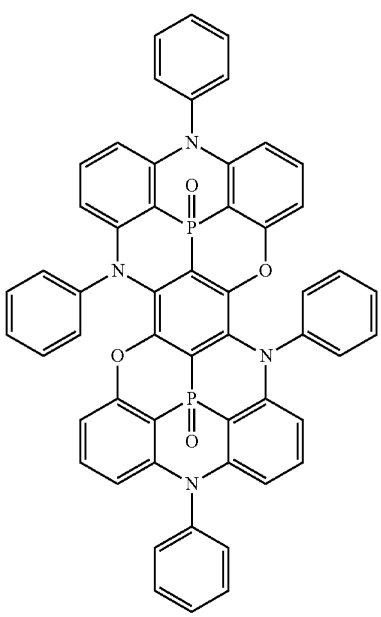
-continued
(1-2222)
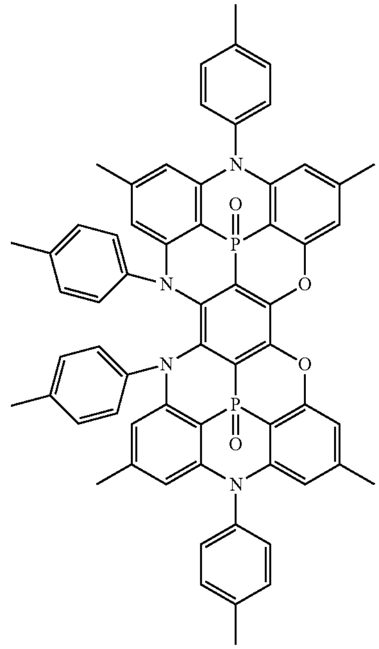
(1-2223)
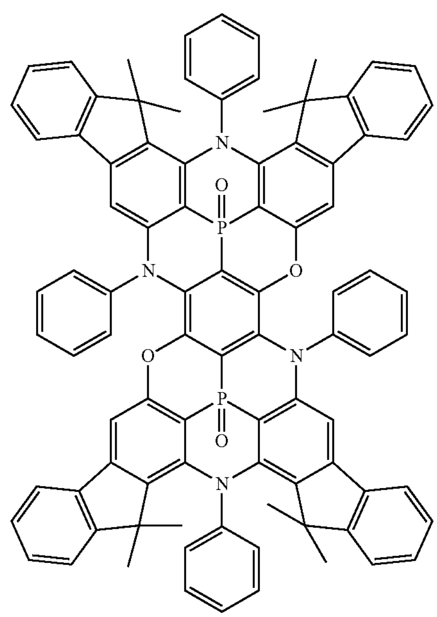

-continued
(1-2224)
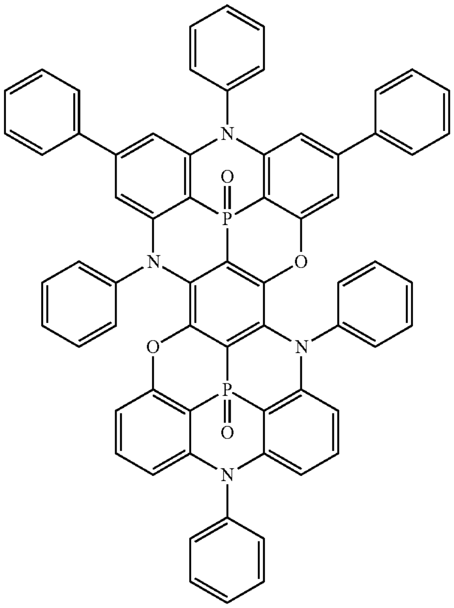
(1-2225)
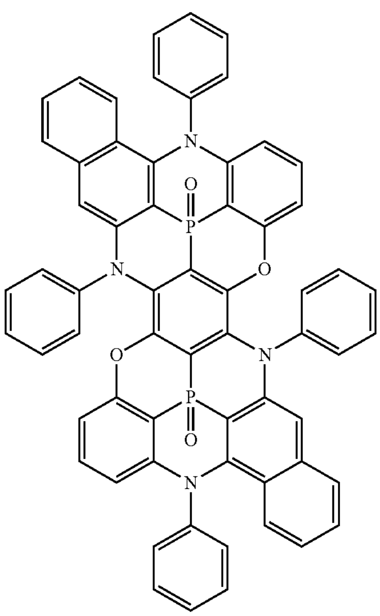
-continued
(1-2226)
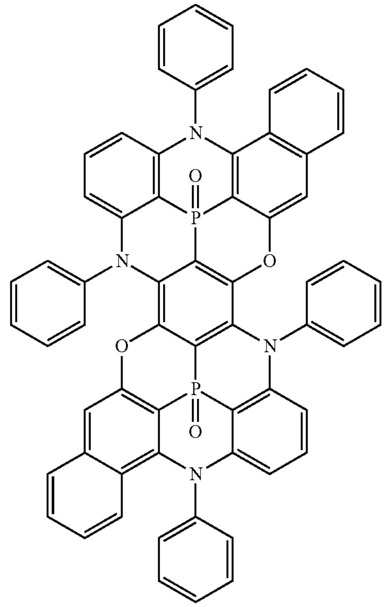
(1-2227)
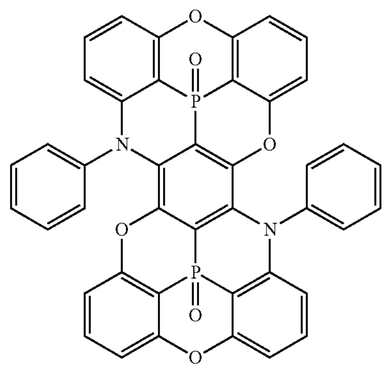
(1-2228)
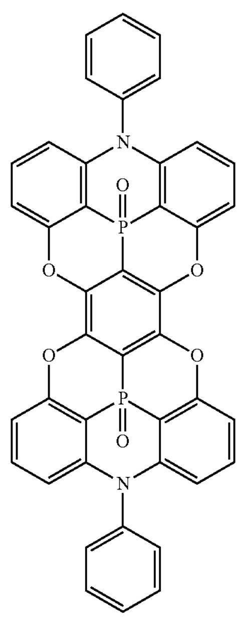

-continued
(1-2229)
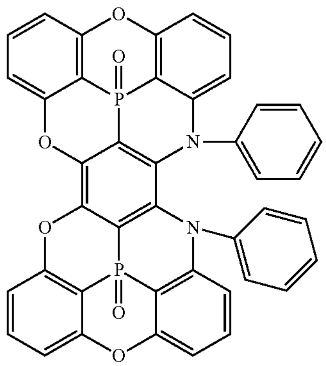
(1-2230)
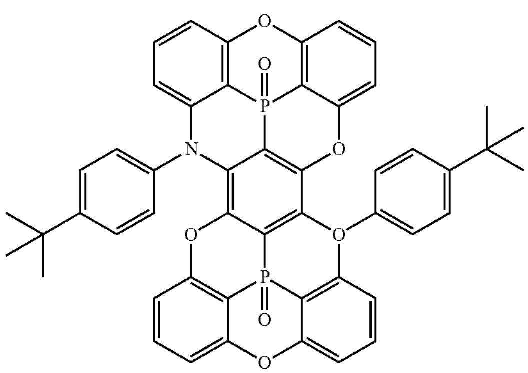
(1-2231)
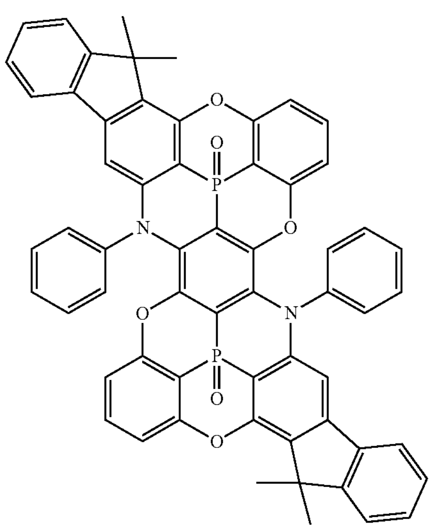
-continued
(1-2232)
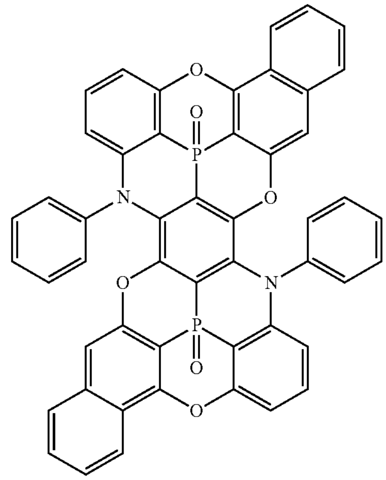
(1-2233)
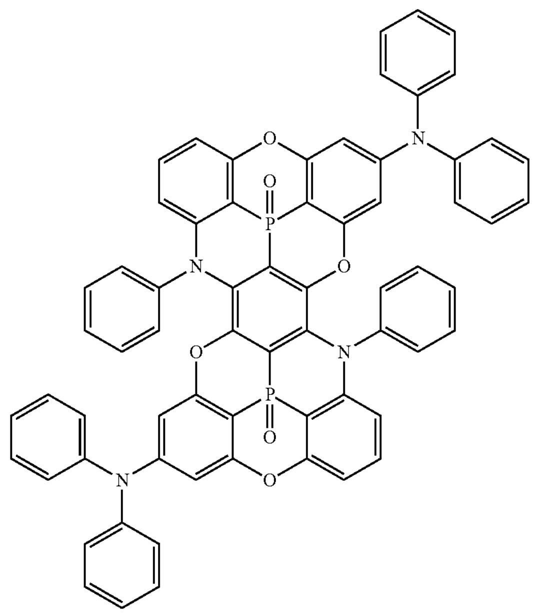
(1-2234)
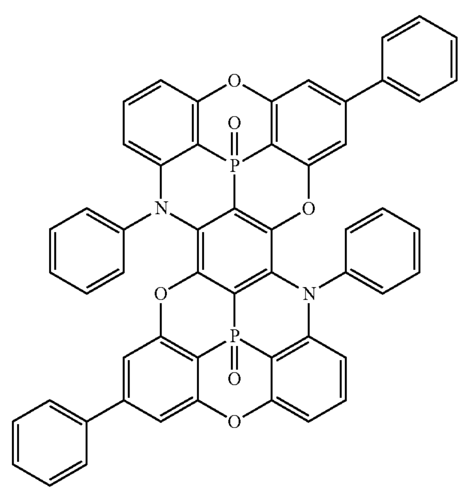

-continued
(1-2235)
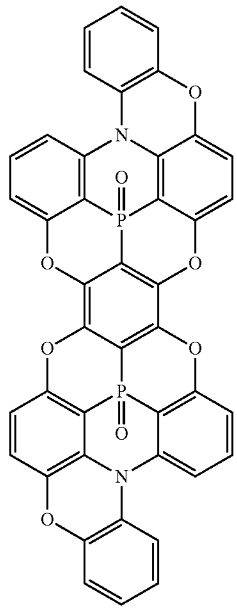
(1-2241)
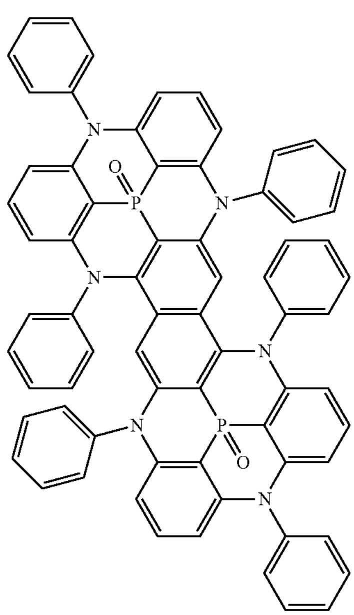
-continued
(1-2242)
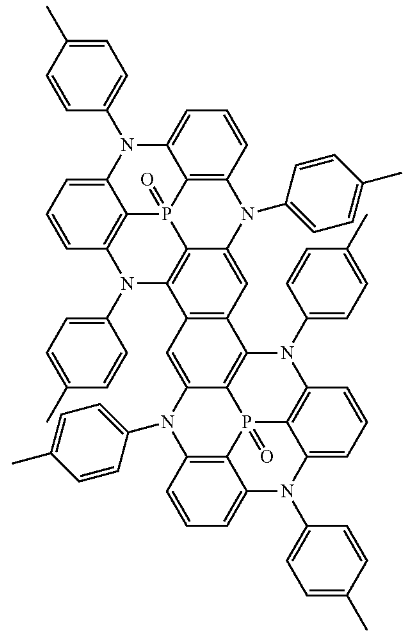
(1-2243)
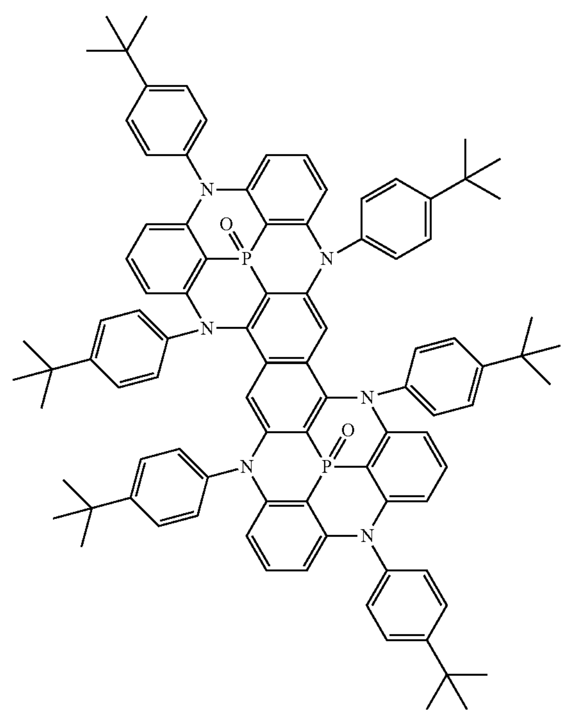

-continued
(1-2244)
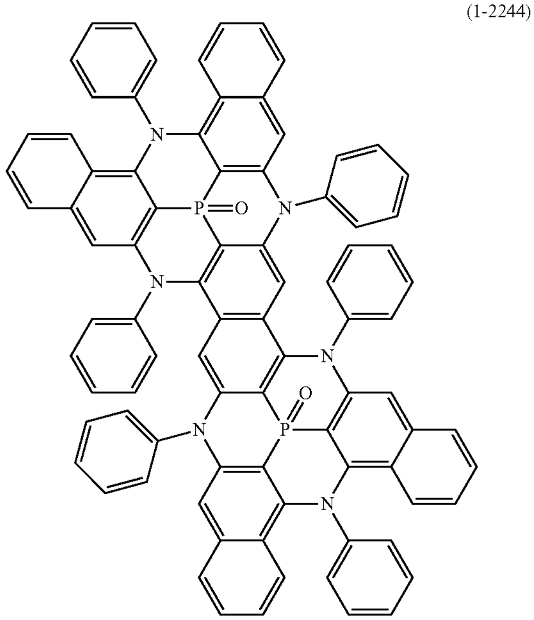
(1-2245)
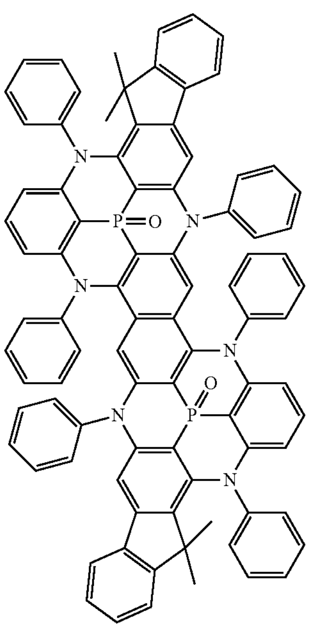
-continued
(1-2246)
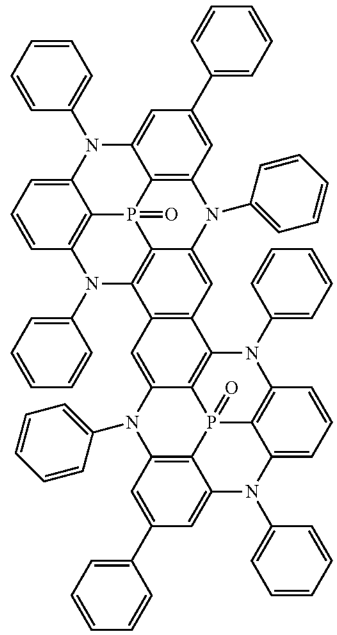
(1-2247)
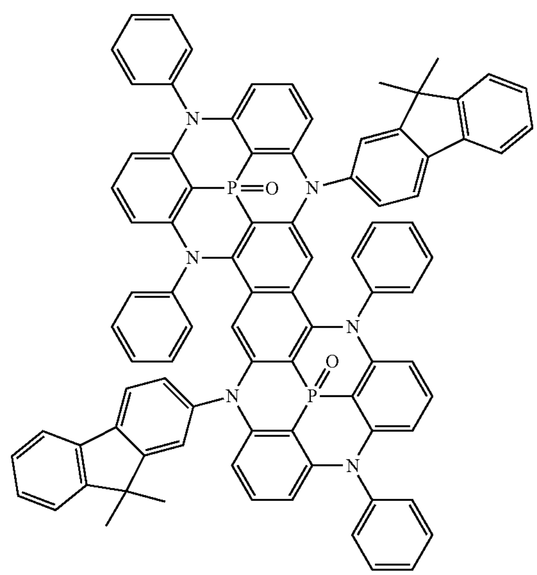

-continued
(1-2248)
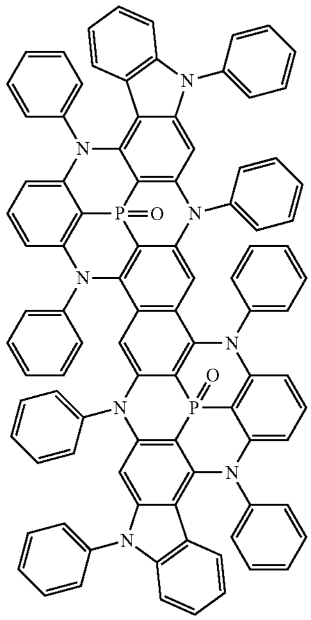
(1-2249)
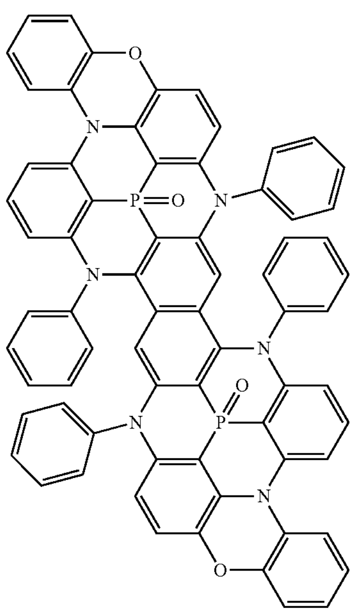
-continued
(1-2250)
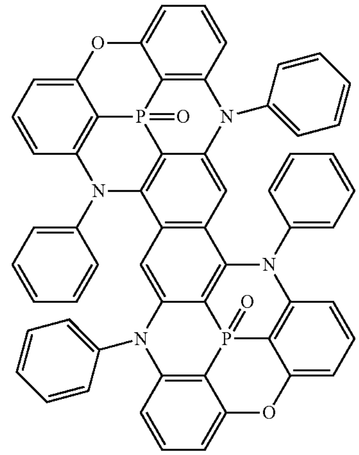
(1-2251)
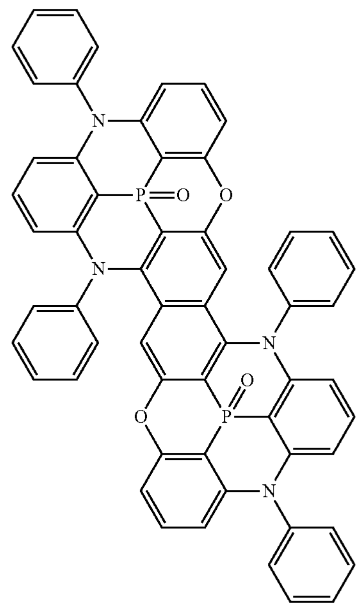
(1-2252)
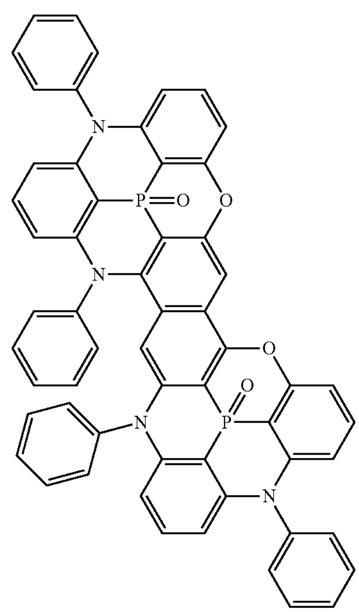

-continued
(1-2261)
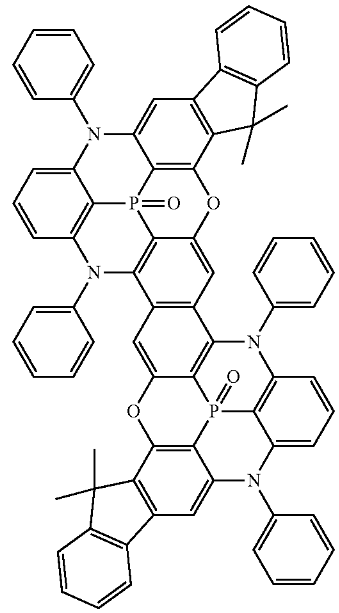
(1-2262)
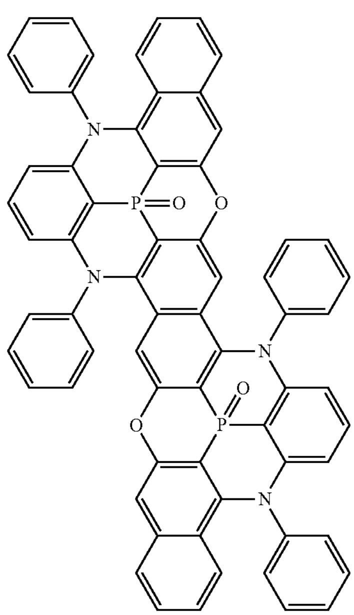
-continued
(1-2263)
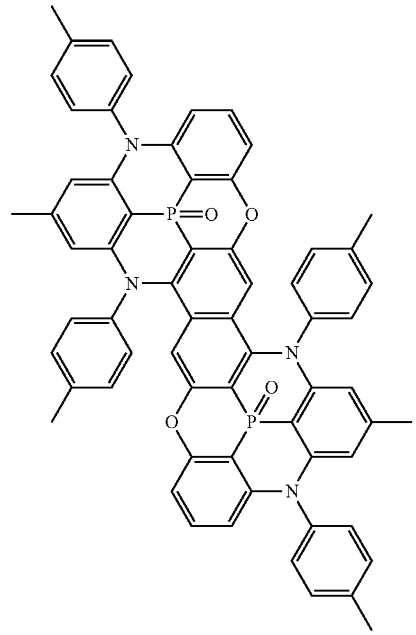
(1-2264)
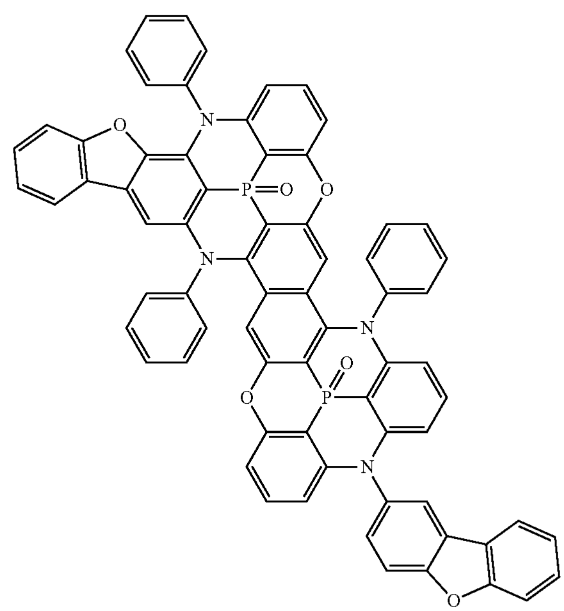

-continued
(1-2265)
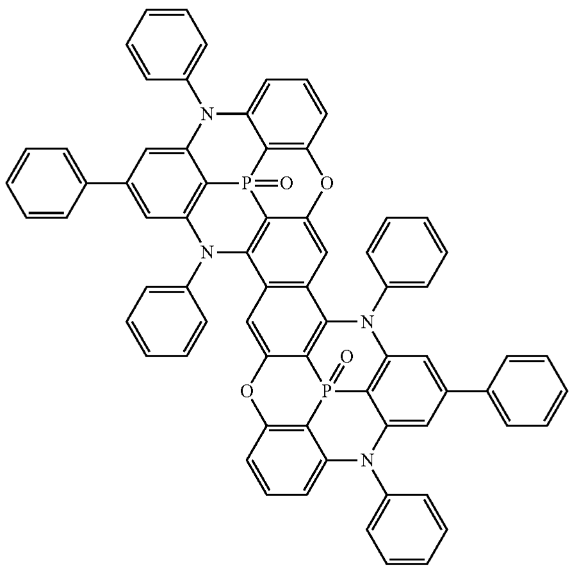
(1-2266)
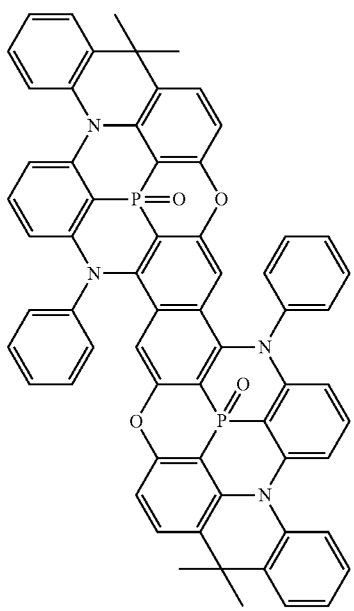
(1-2267)
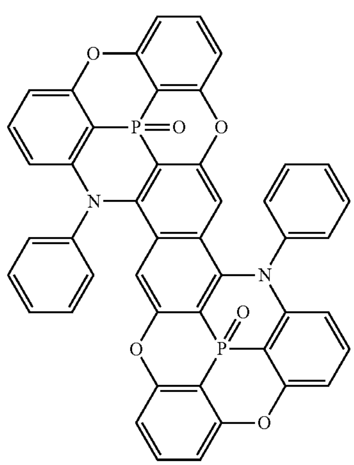
-continued
(1-2268)
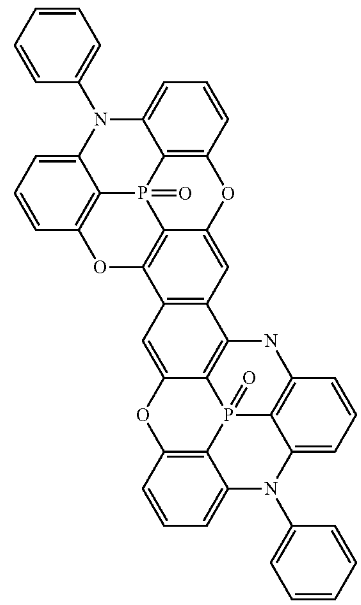
(1-2269)
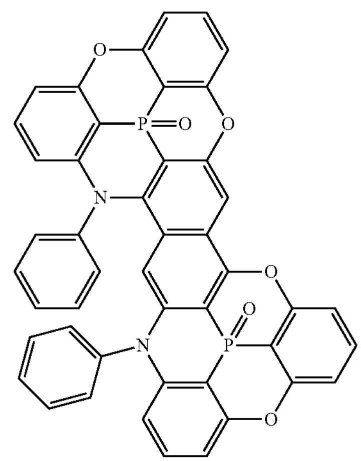
(1-2270)
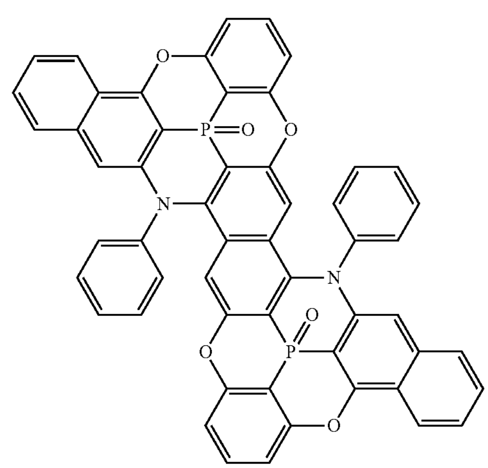

-continued
(1-2271)
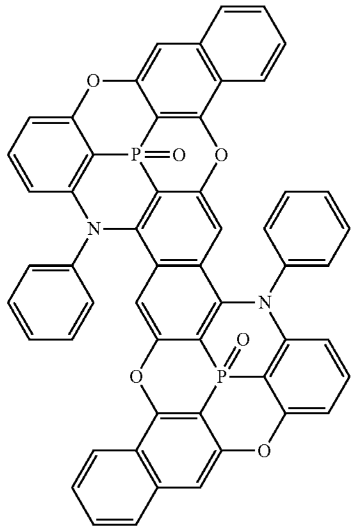
(1-2272)
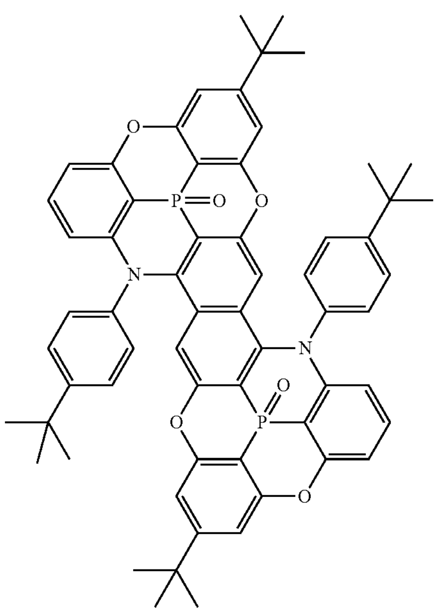
-continued
(1-2273)
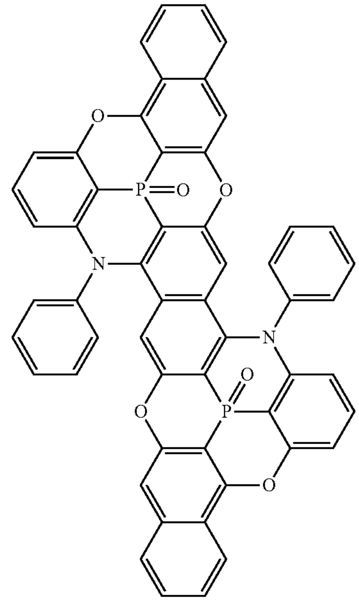
(1-2274)
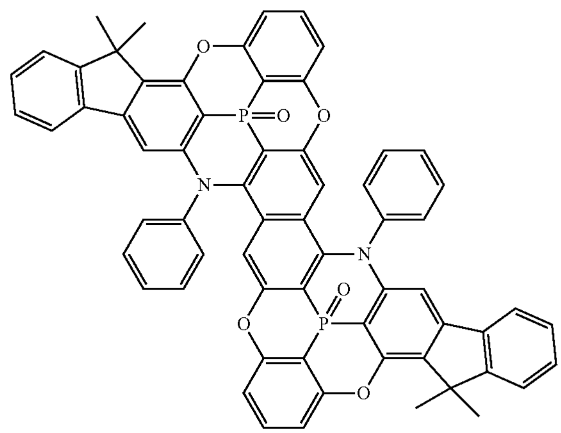
(1-2275)
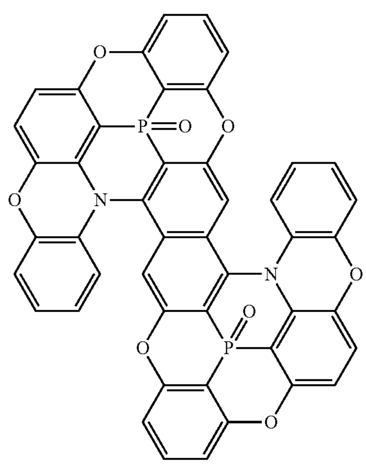

-continued
(1-2281)
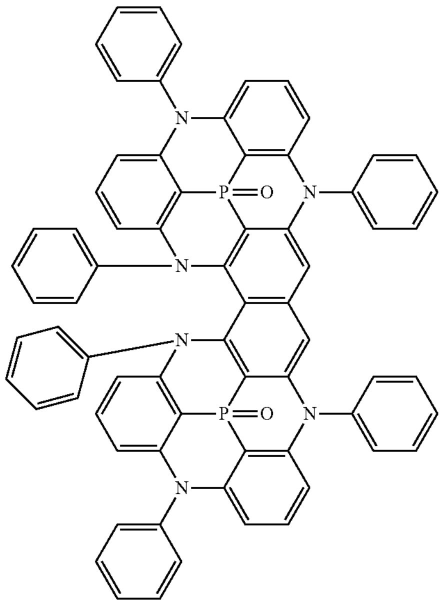
(1-2282)
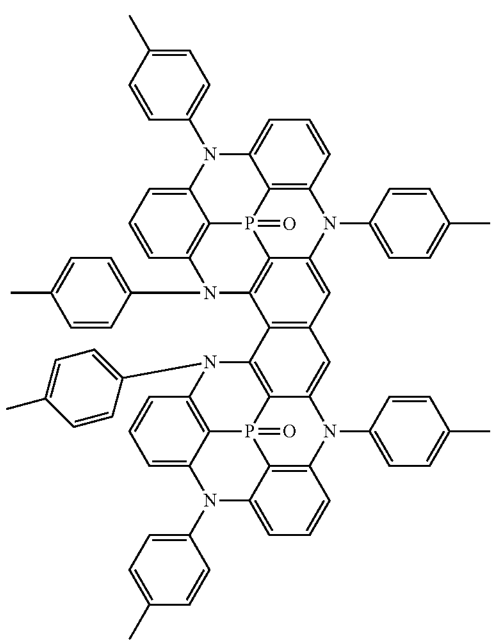
-continued
(1-2283)
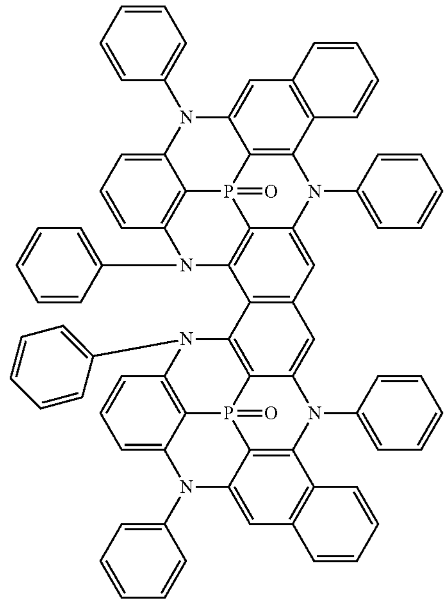
(1-2284)
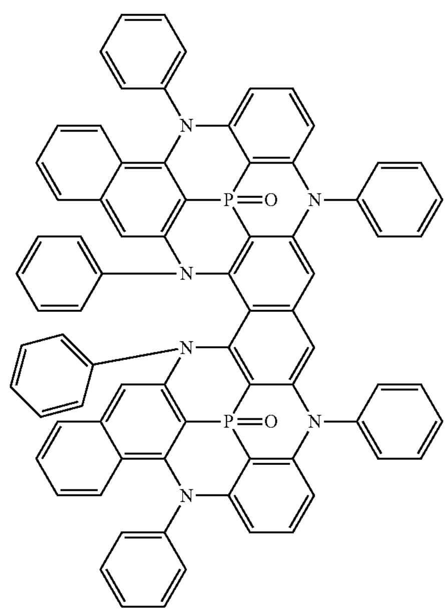

-continued
(1-2285)
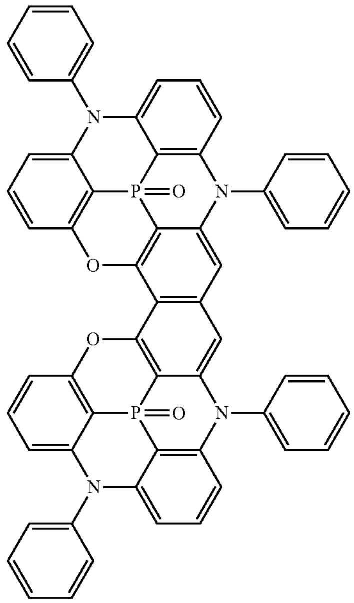
(1-2286)
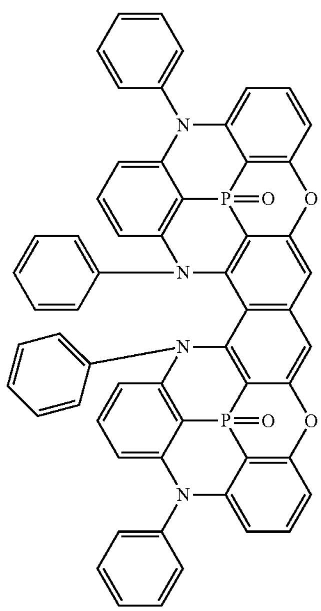
-continued
(1-2287)
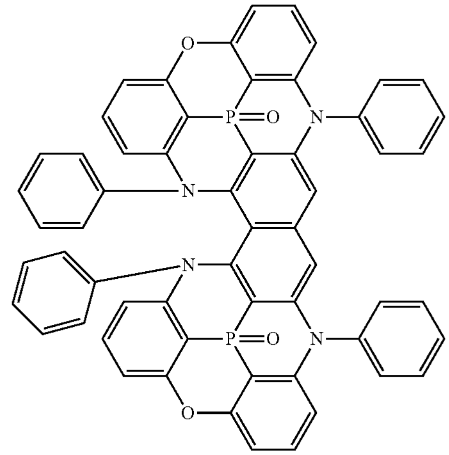
(1-2288)
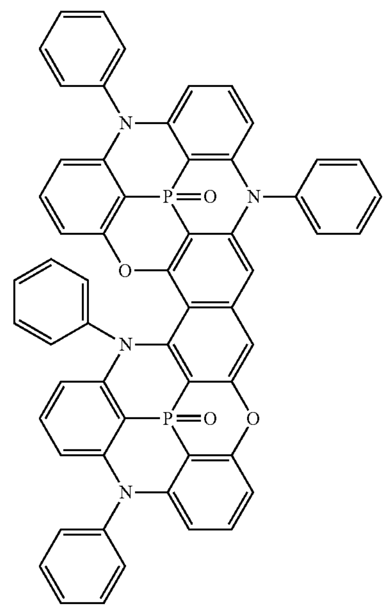
(1-2289)
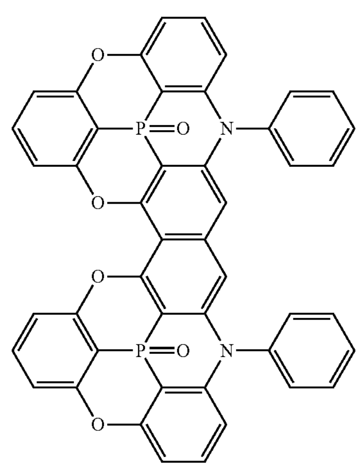

-continued
(1-2290)
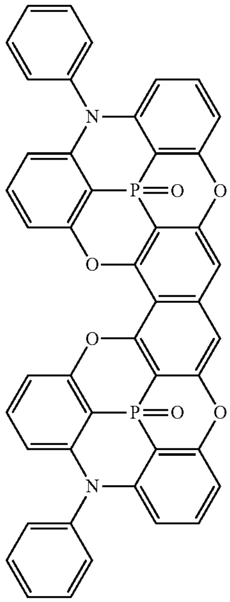
(1-2291)
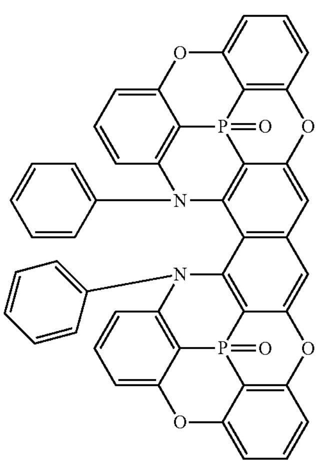
-continued
(1-2292)
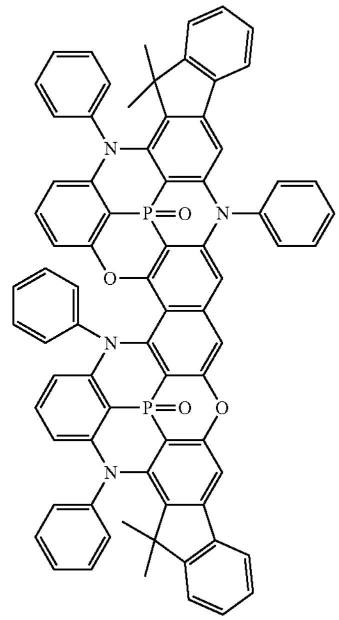
(1-2301)
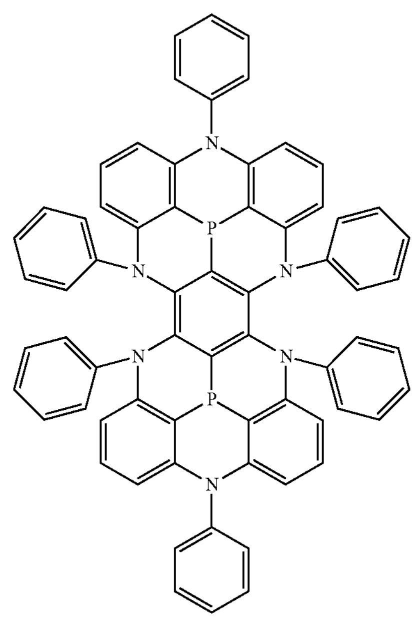

-continued
(1-2302)
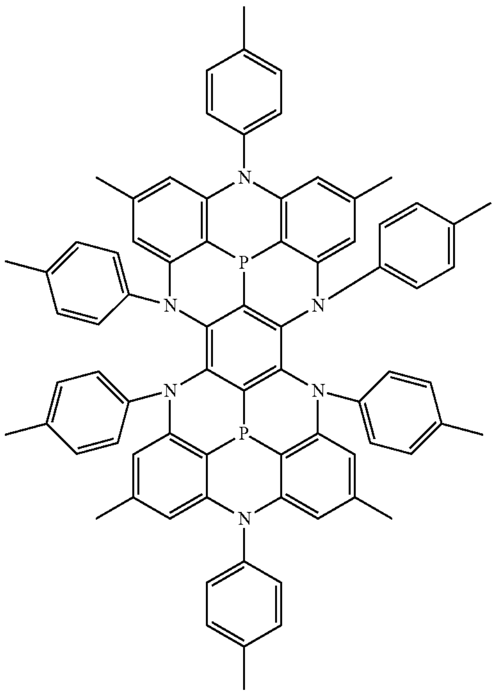
(1-2303)
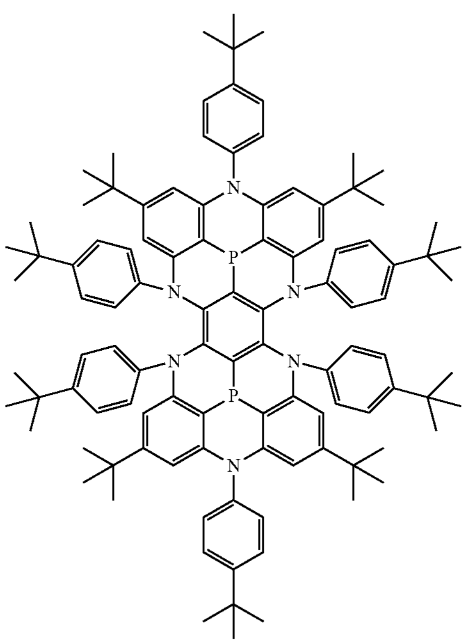
-continued
(1-2304)
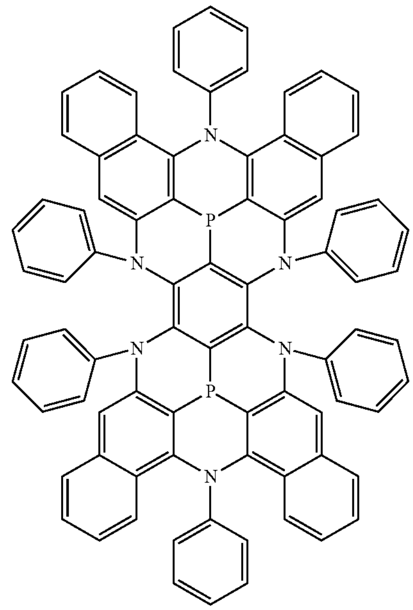
(1-2305)
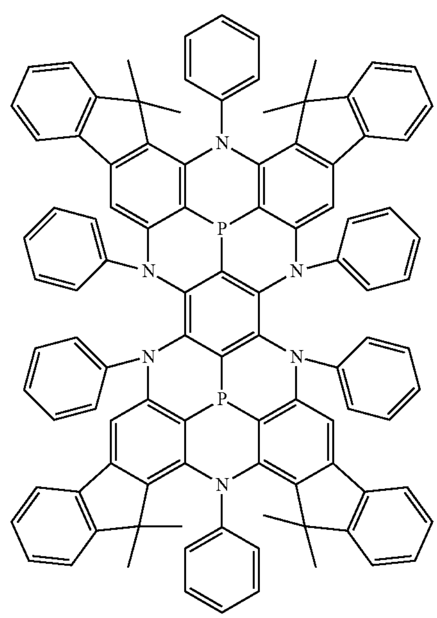

-continued
(1-2306)
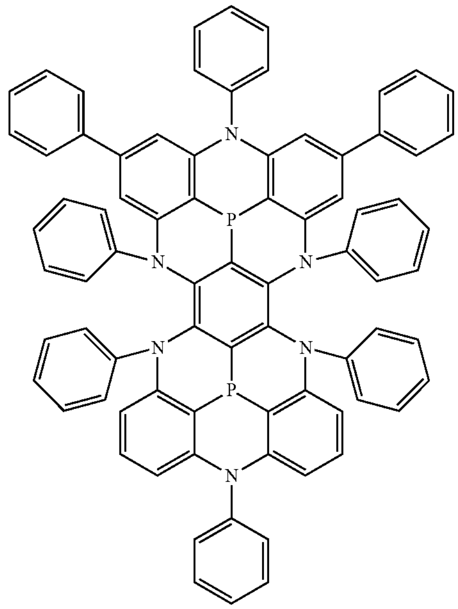
(1-2307)
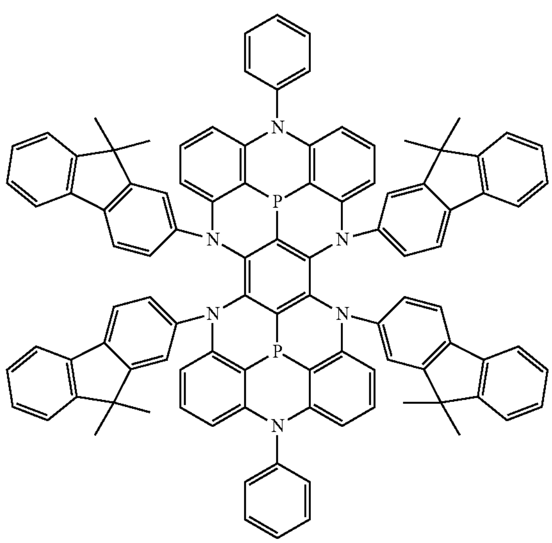
-continued
(1-2308)
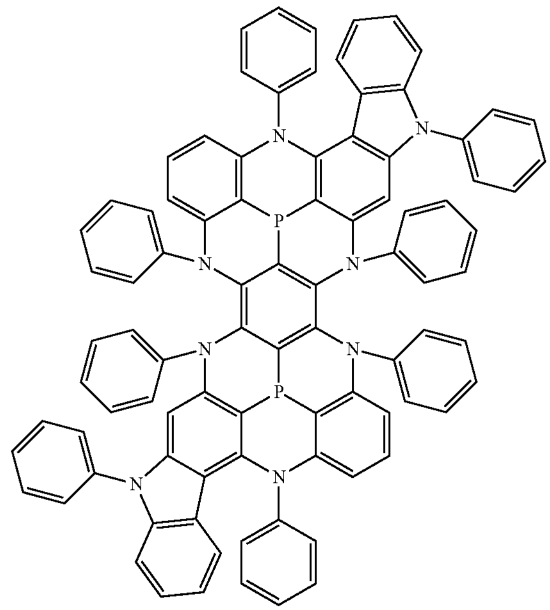
(1-2309)
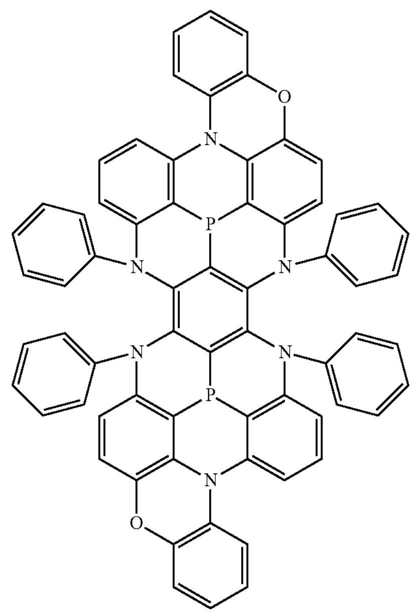
(1-2310)
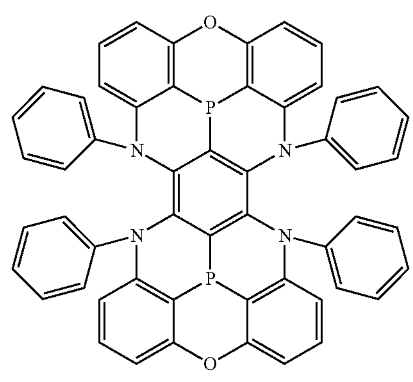

-continued
(1-2311)
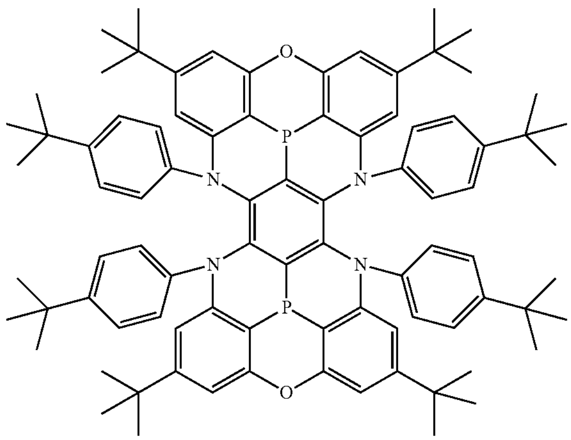
(1-2312)
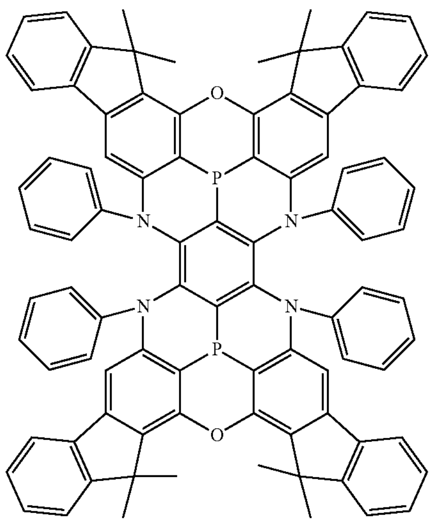
(1-2321)
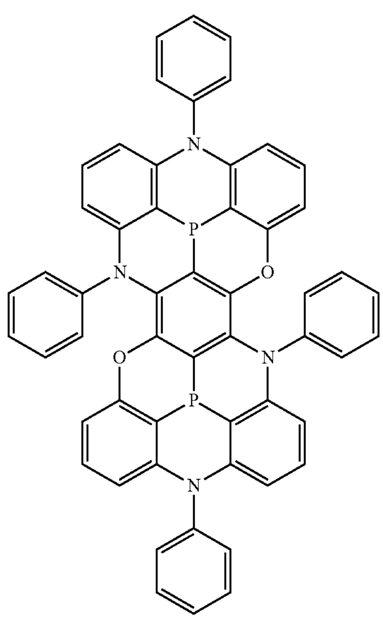
-continued
(1-2322)
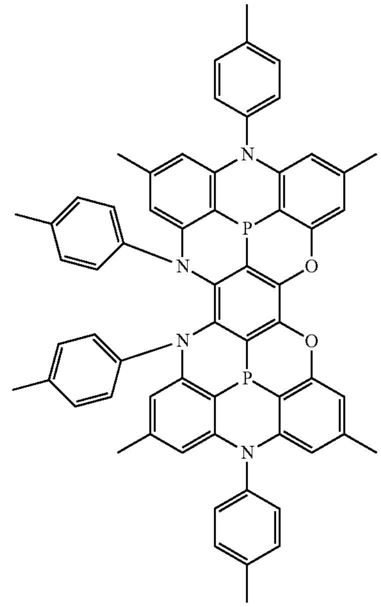
(1-2323)
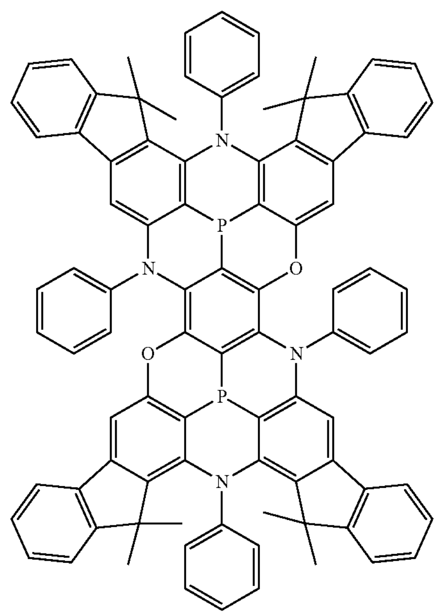

-continued
(1-2324)
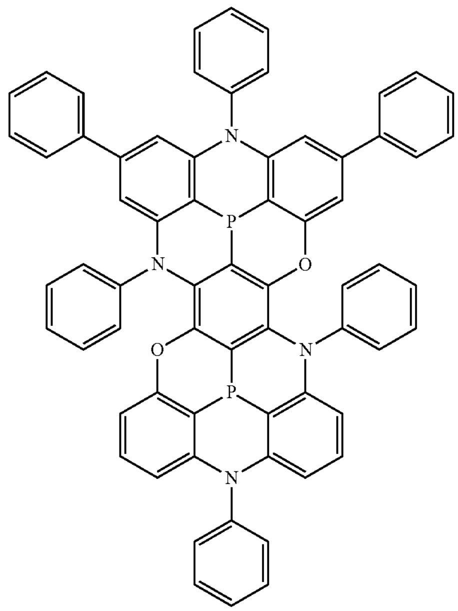
(1-2325)
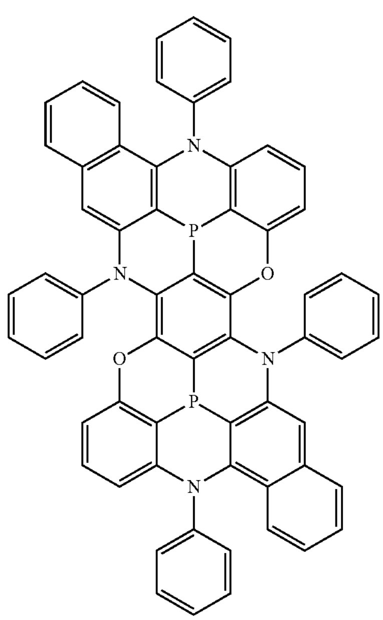
-continued
(1-2326)
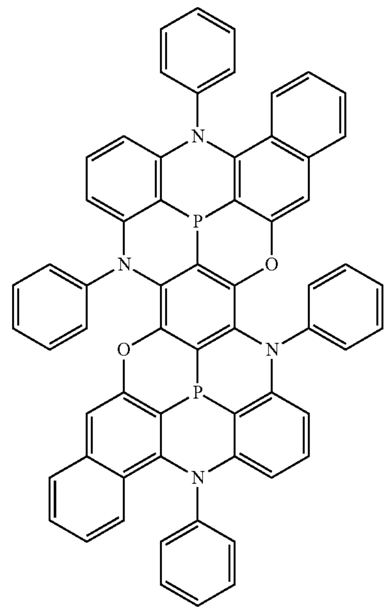
(1-2327)
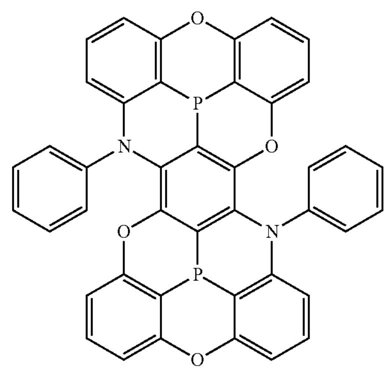
(1-2328)
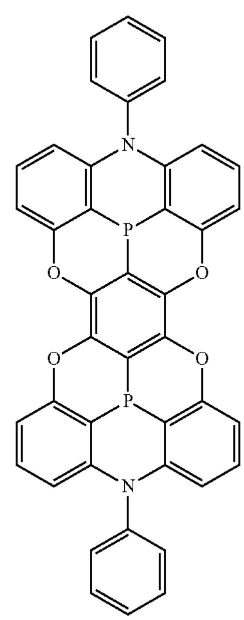

-continued
(1-2329)
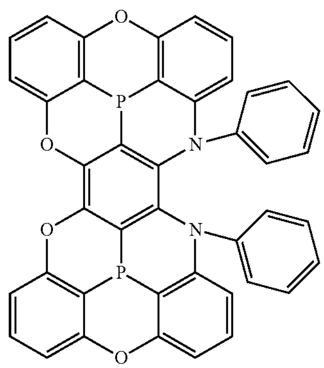
(1-2330)
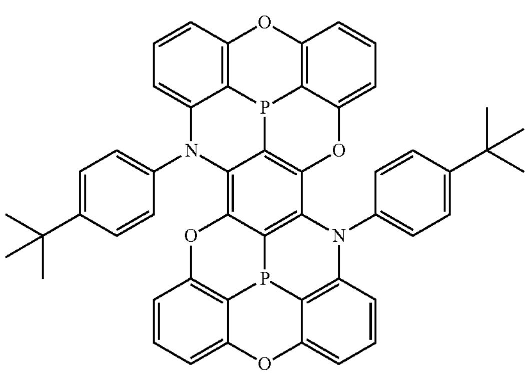
(1-2331)
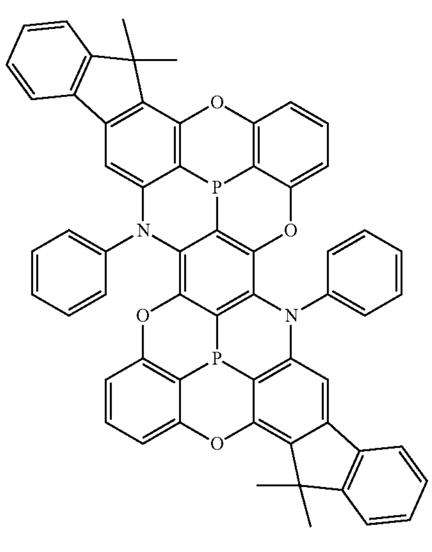
-continued
(1-2332)
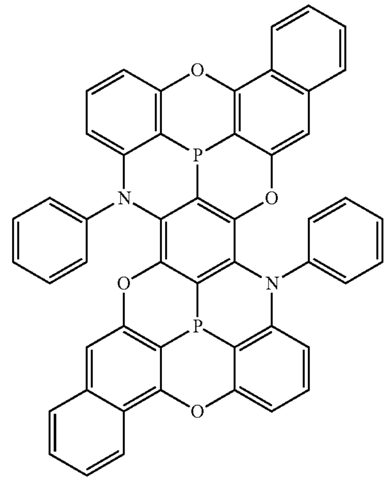
(1-2333)
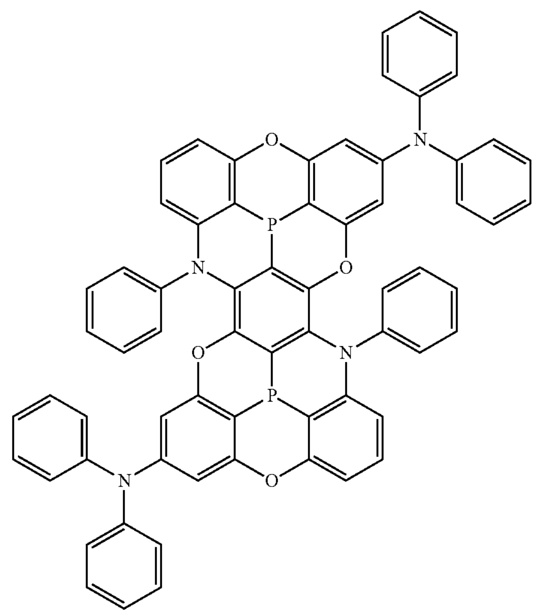
(1-2334)
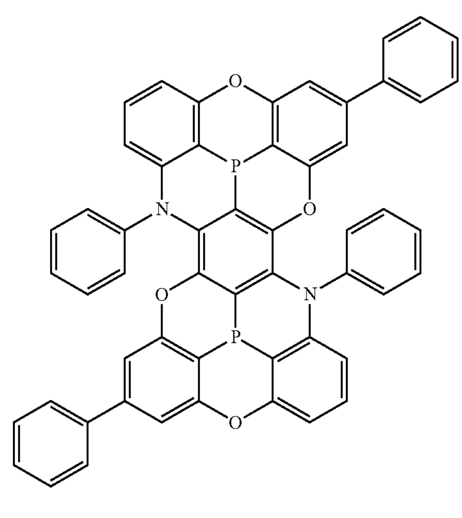

-continued
(1-2335)
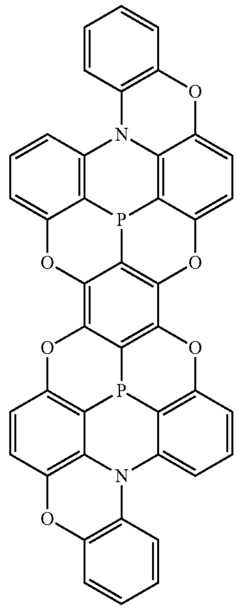
(1-2341)
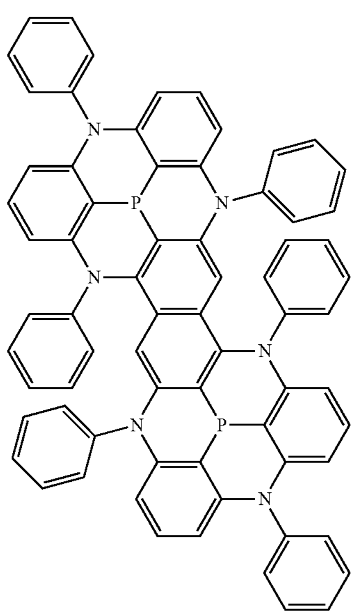
-continued
(1-2342)
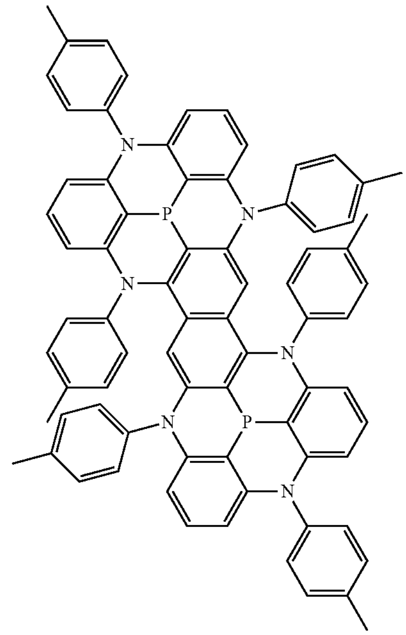
(1-2343)
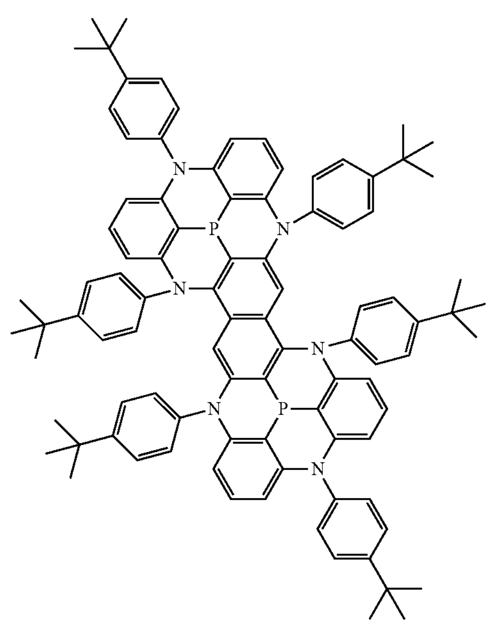

-continued
(1-2344)
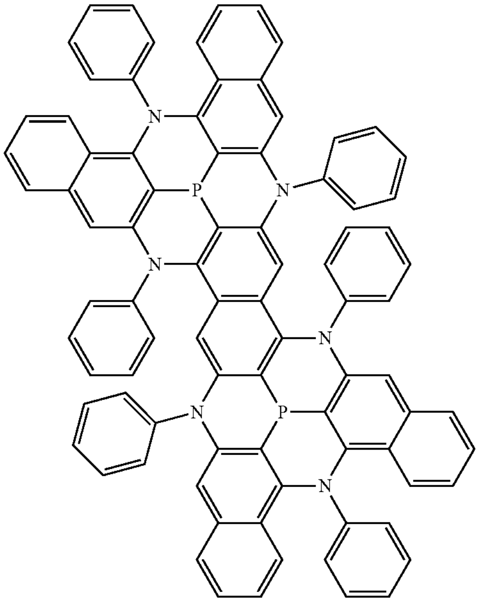
(1-2345)
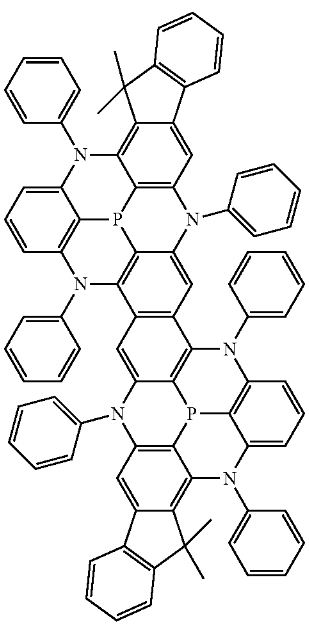
-continued
(1-2346)
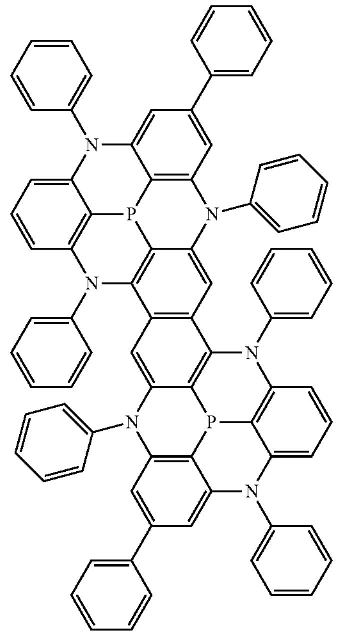
(1-2347)
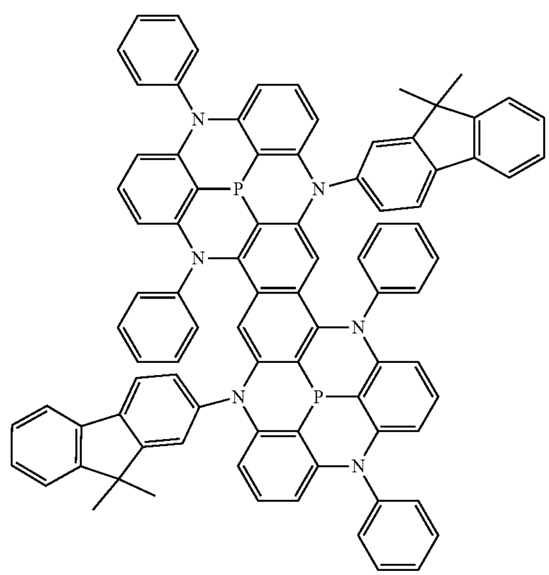

-continued
(1-2348)
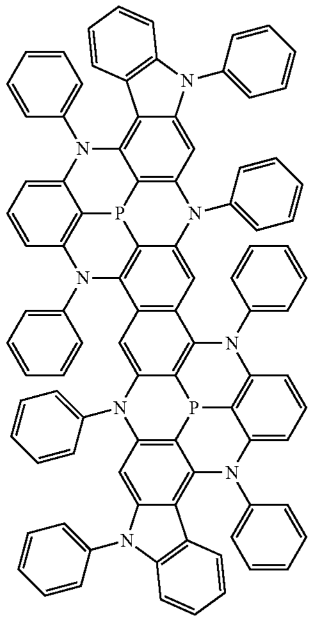
(1-2349)
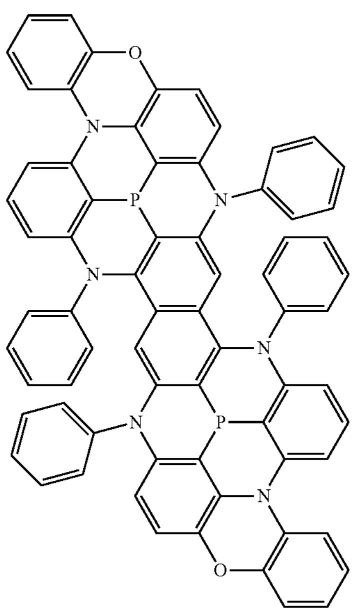
-continued
(1-2350)
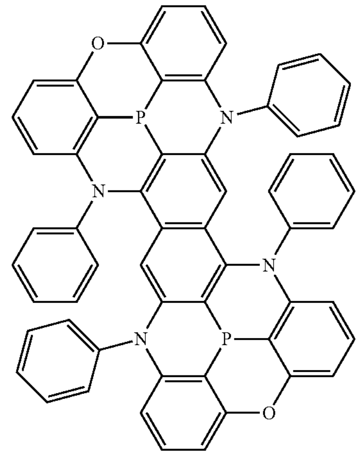
(1-2351)
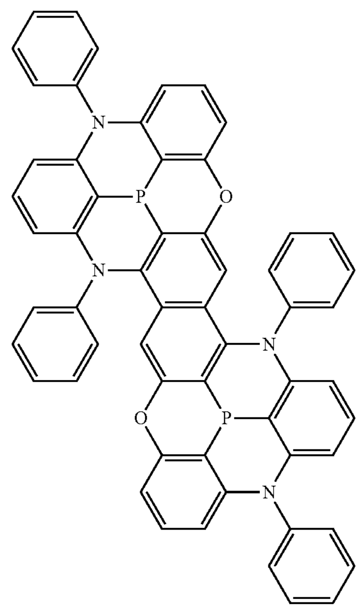
(1-2352)
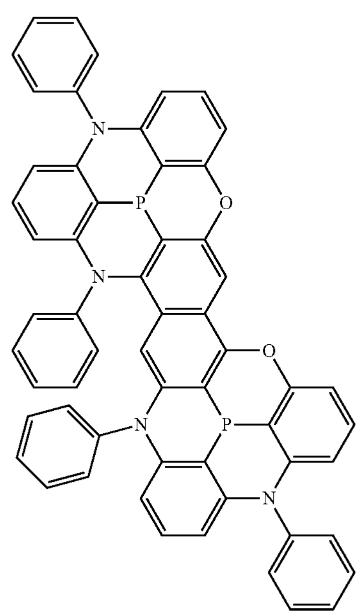

-continued
(1-2361)
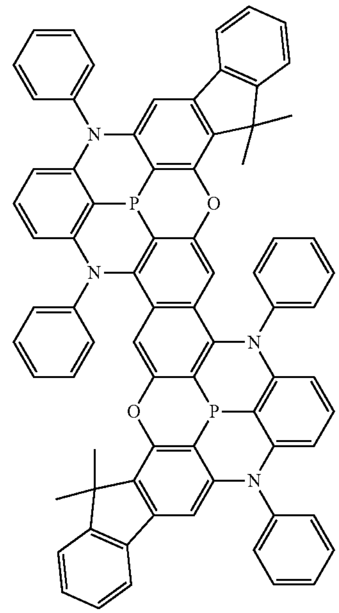
(1-2362)
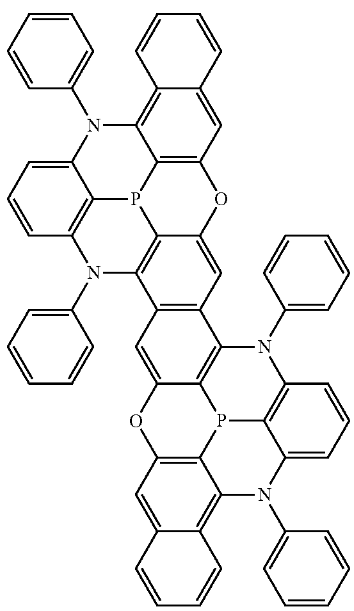
-continued
(1-2363)
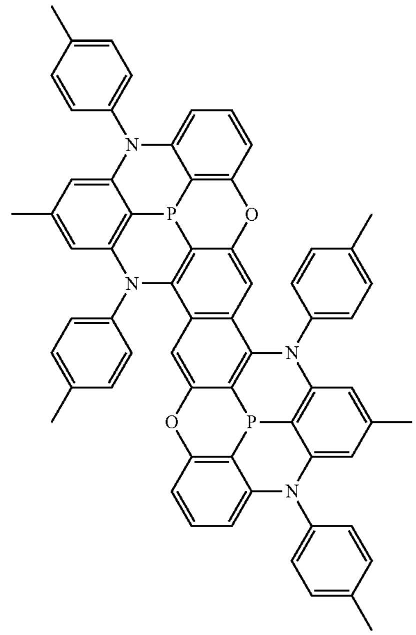
(1-2364)
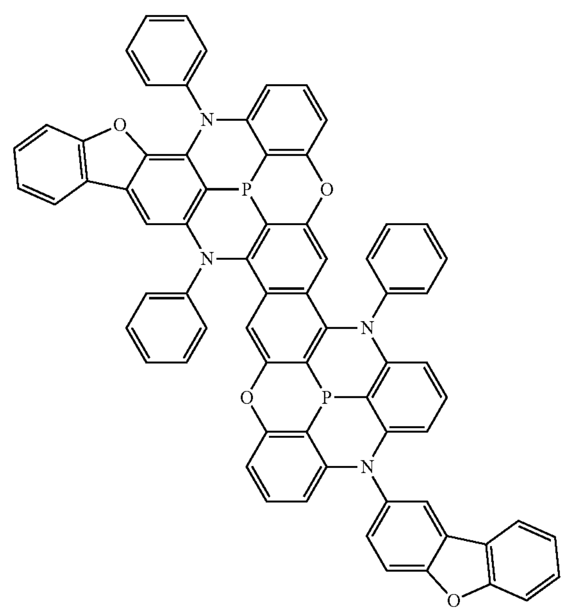

(1-2365)
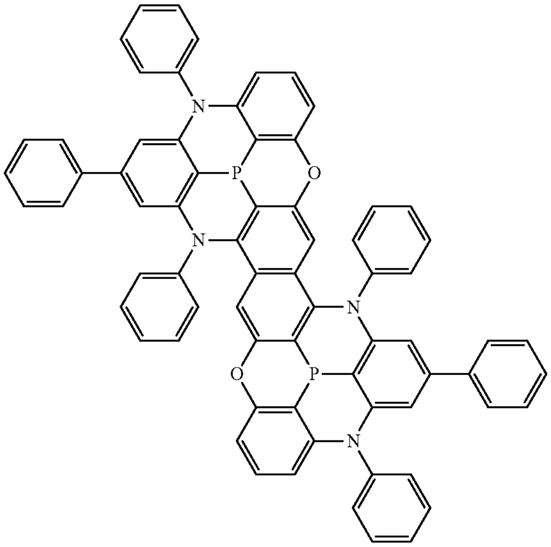
(1-2366)
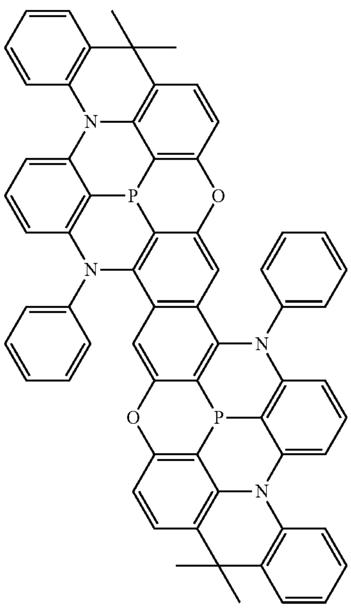
(1-2367)
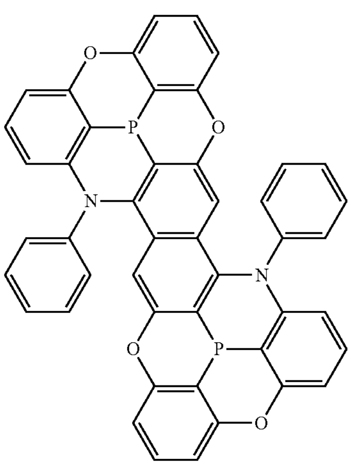
(1-2368)
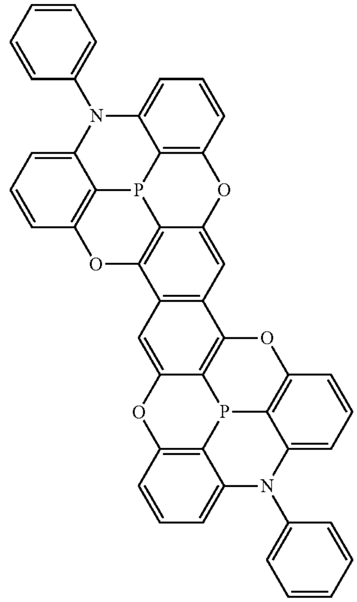
(1-2369)
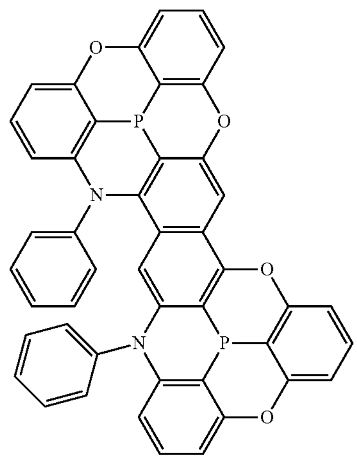
(1-2370)
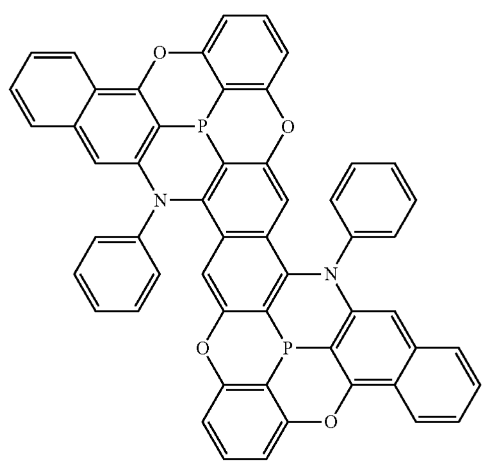

-continued
(1-2371)
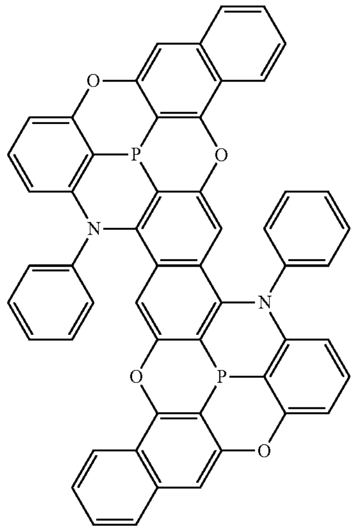
(1-2372)
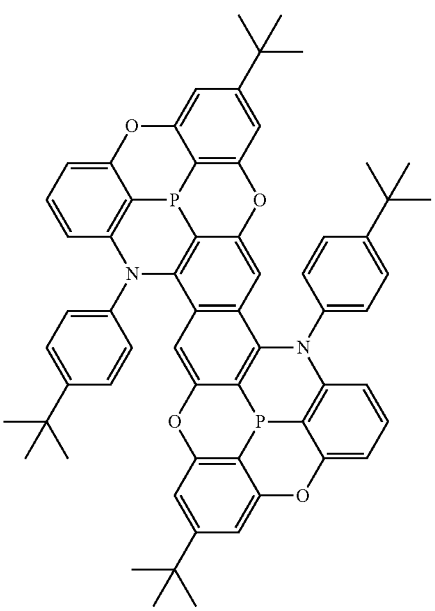
-continued
(1-2373)
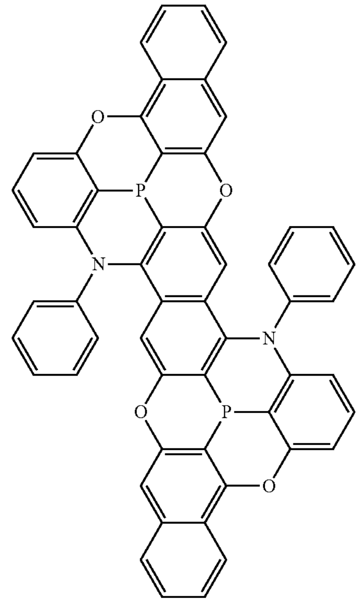
(1-2374)
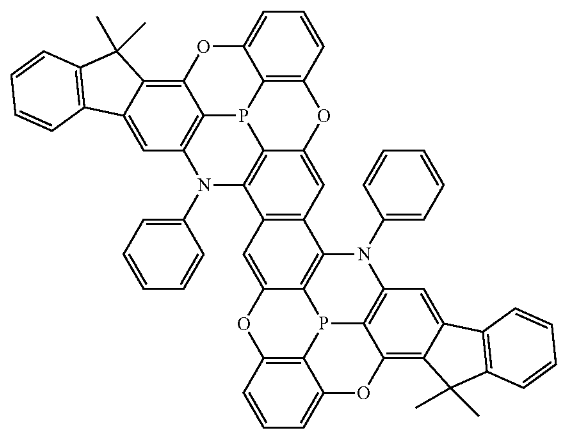
(1-2375)
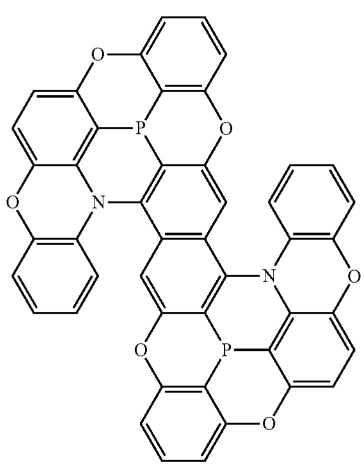

-continued
(1-2381)
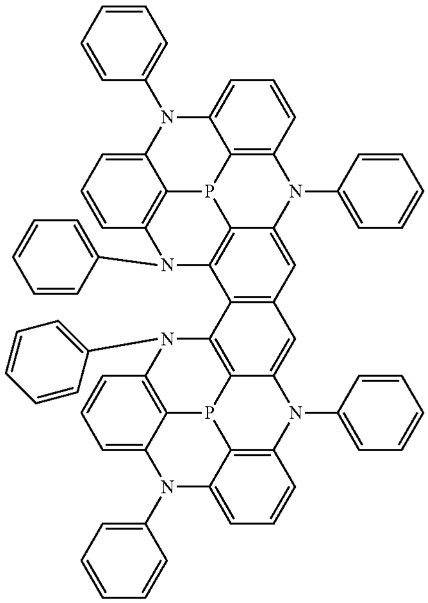
(1-2382)
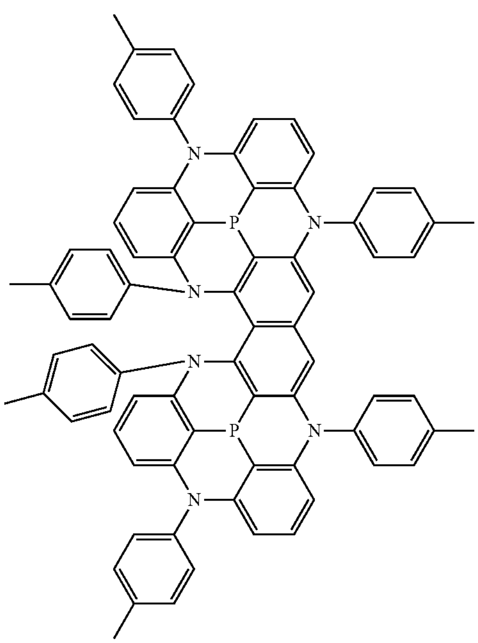
-continued
(1-2383)
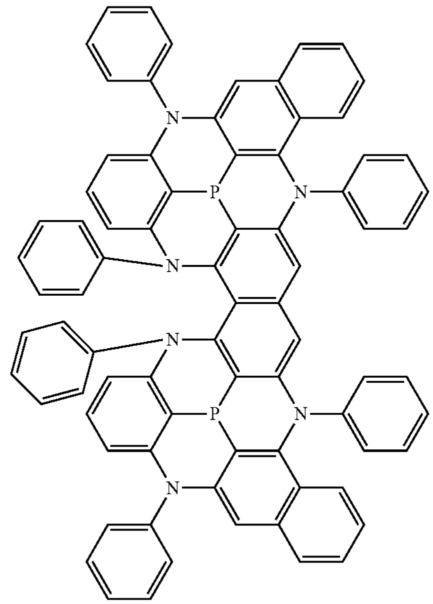
(1-2384)
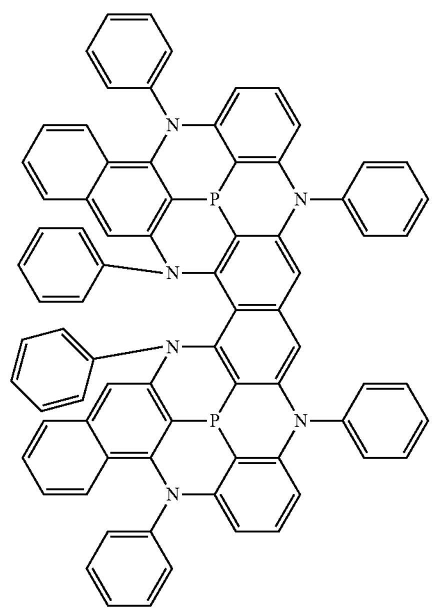

-continued
(1-2385)
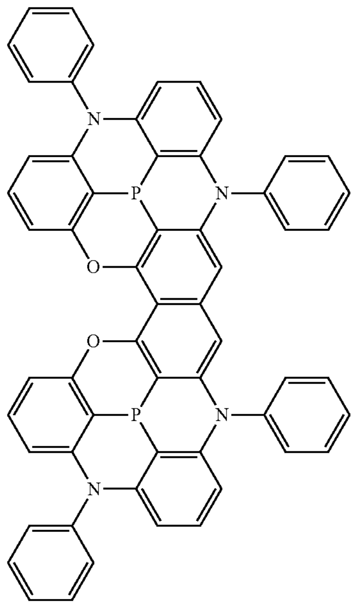
(1-2386)
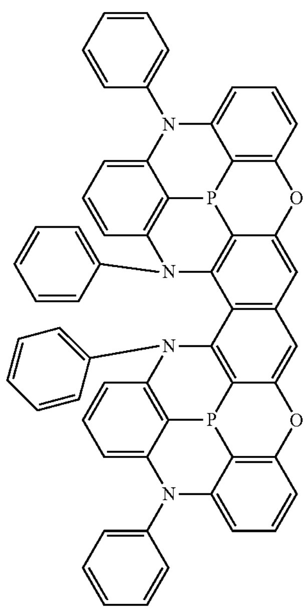
(1-2387)
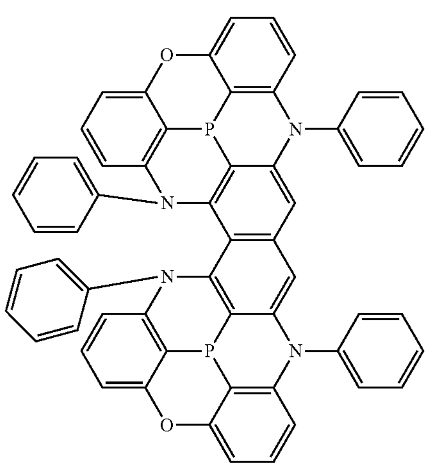
-continued
(1-2388)
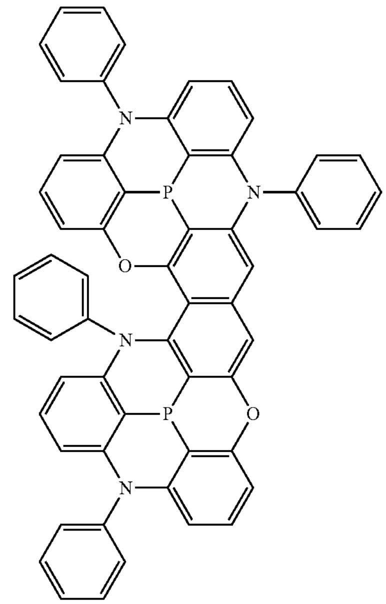
(1-2389)
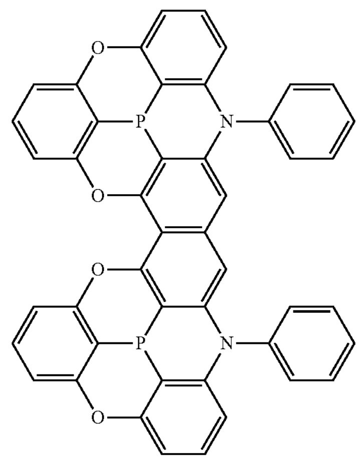
(1-2390)
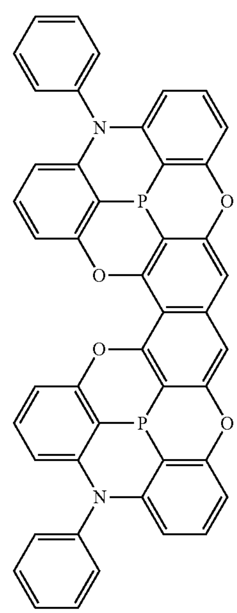

-continued
(1-2391)
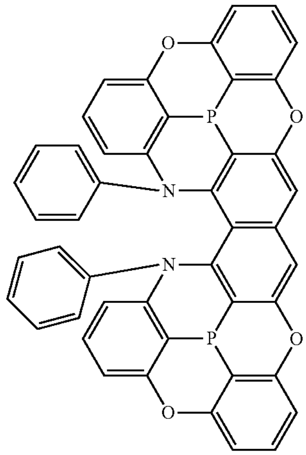
(1-2392)
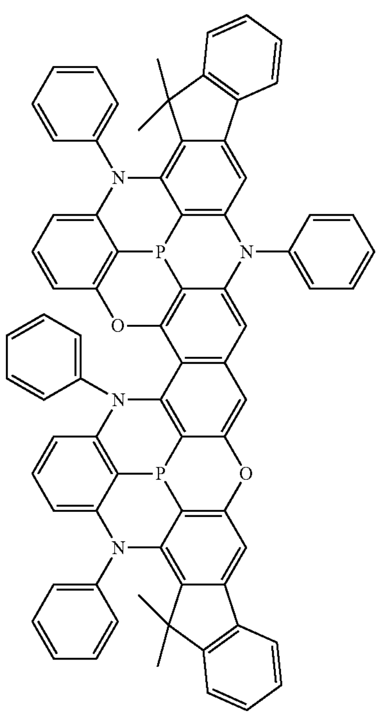
-continued
(1-2401)
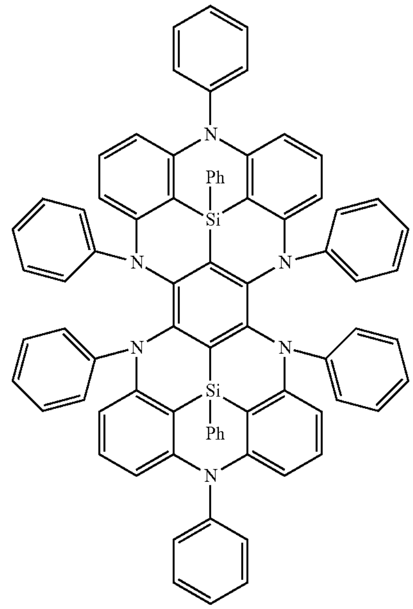
(1-2402)
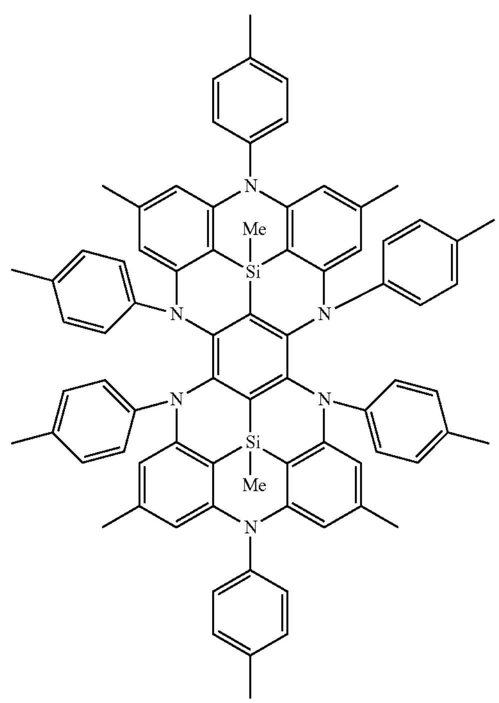

-continued
(1-2403)
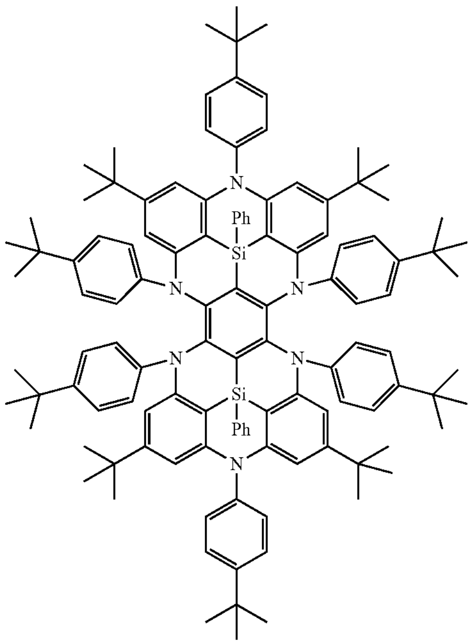
(1-2404)
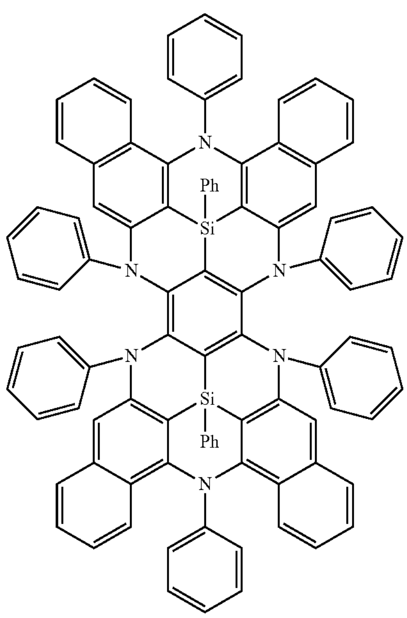
-continued
(1-2405)
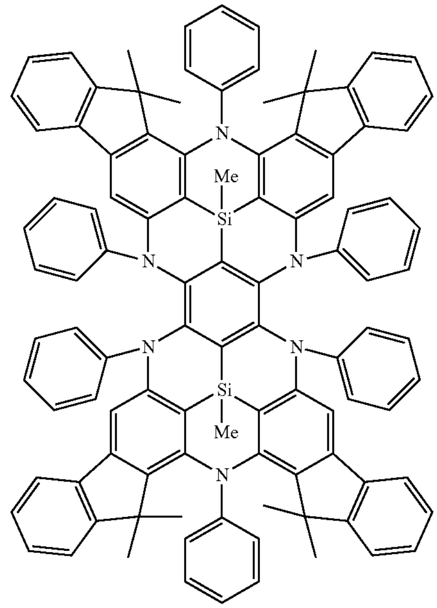
(1-2406)
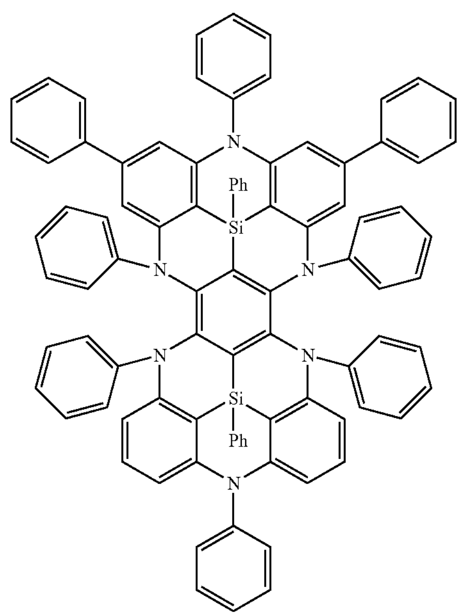

-continued
(1-2407)
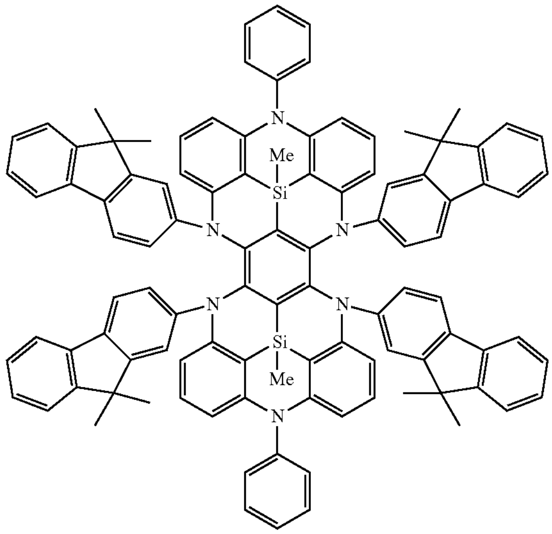
(1-2408)
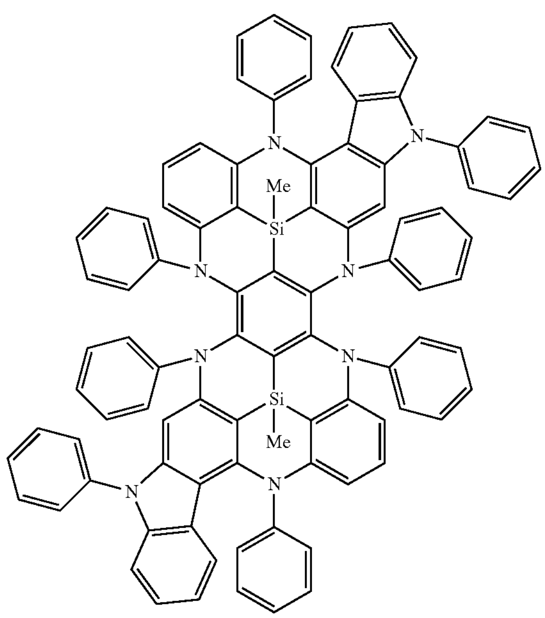
-continued
(1-2409)
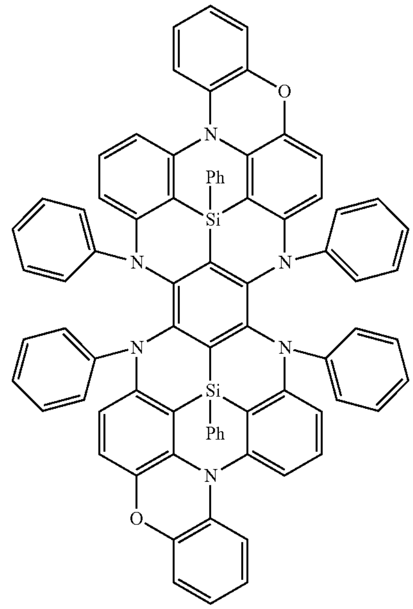
(1-2410)
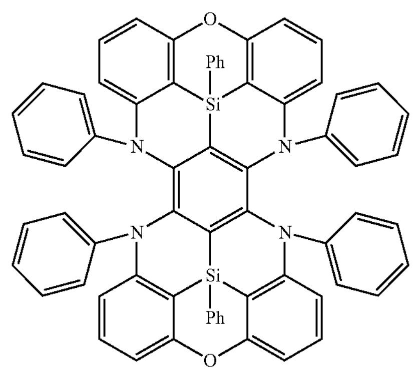
(1-2411)
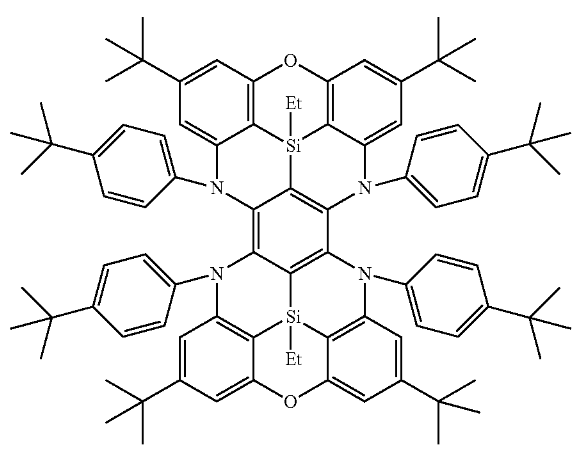

-continued
(1-2412)
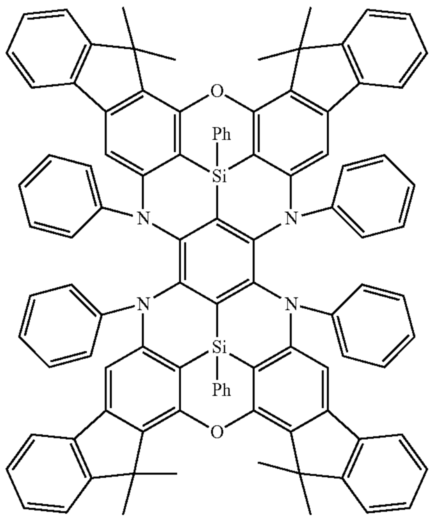
(1-2421)
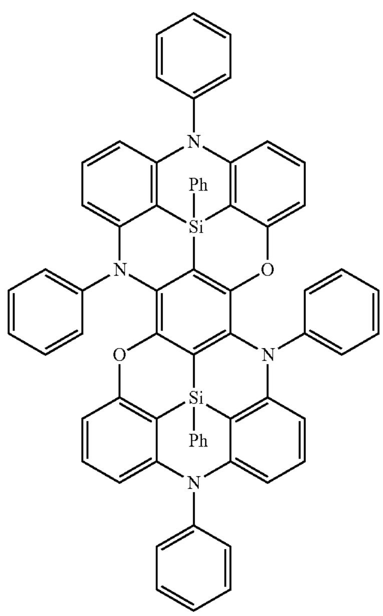
-continued
(1-2422)
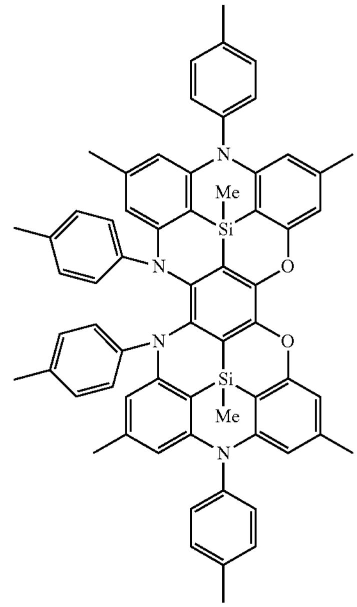
(1-2423)
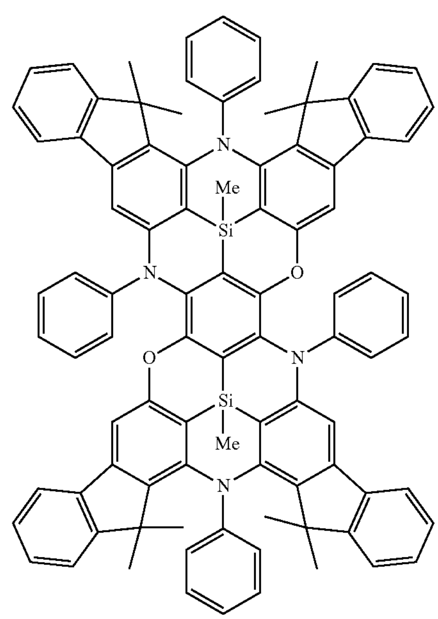

-continued
(1-2424)
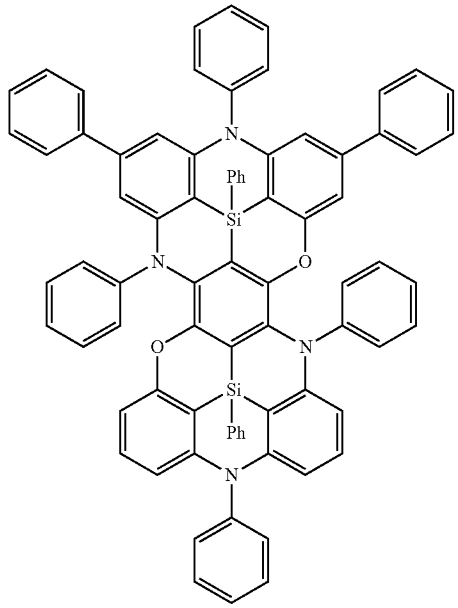
(1-2425)
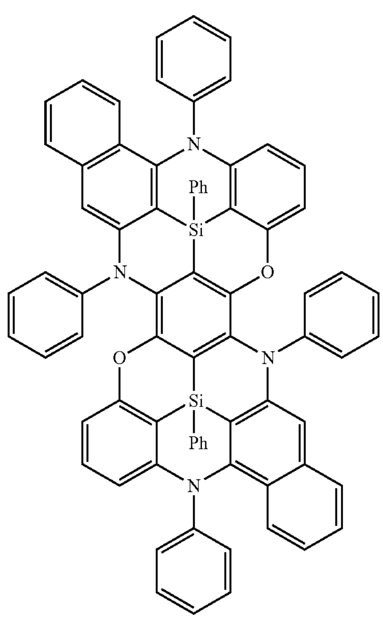
-continued
(1-2426)
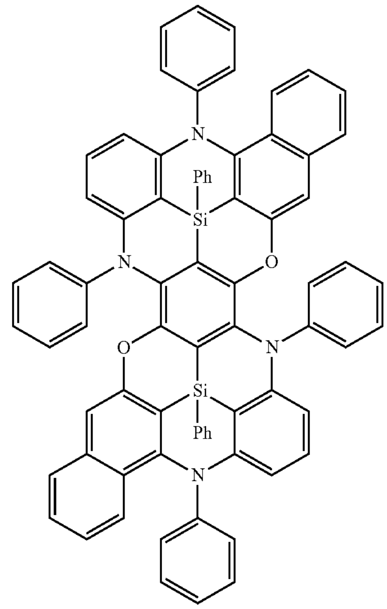
(1-2427)
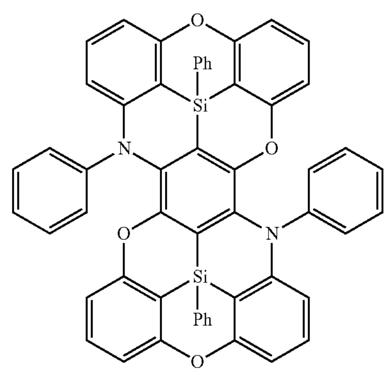
(1-2428)
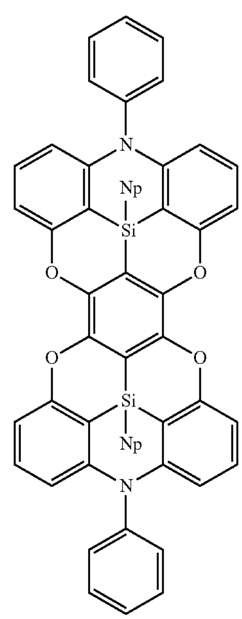

-continued
(1-2429)
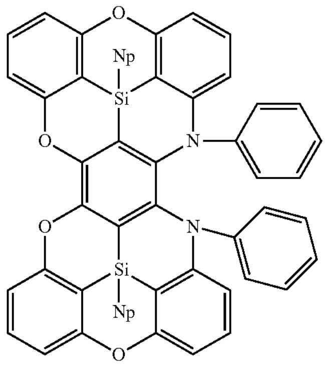
(1-2430)
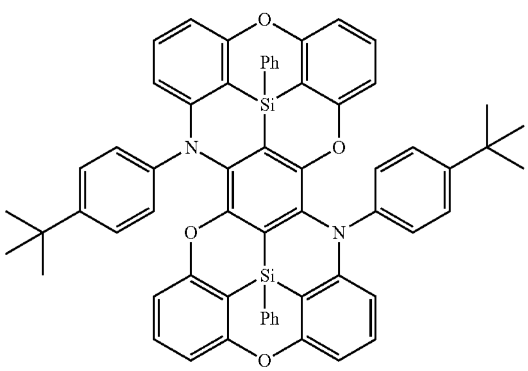
(1-2431)
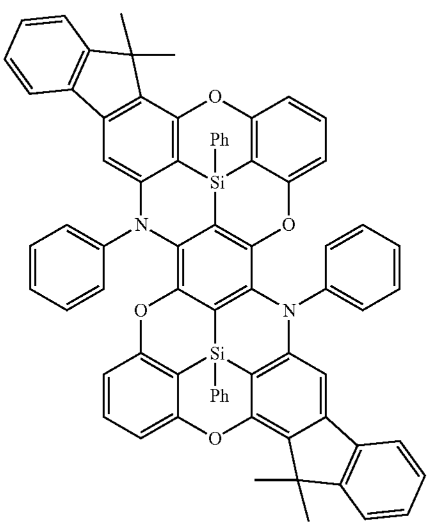
-continued
(1-2432)
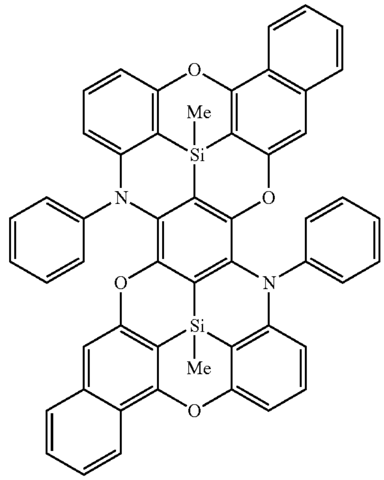
(1-2433)
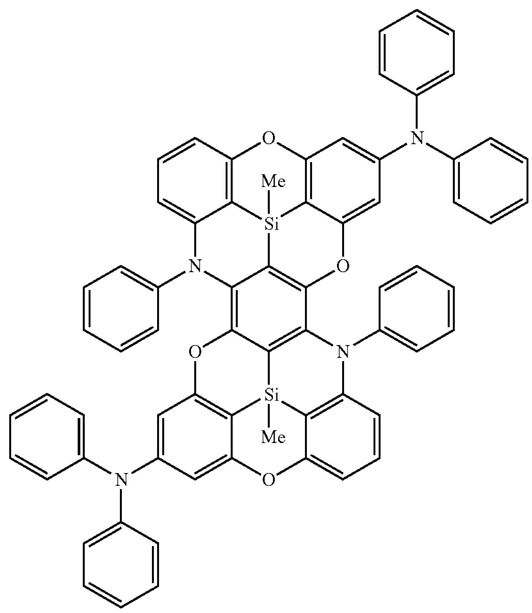
(1-2434)
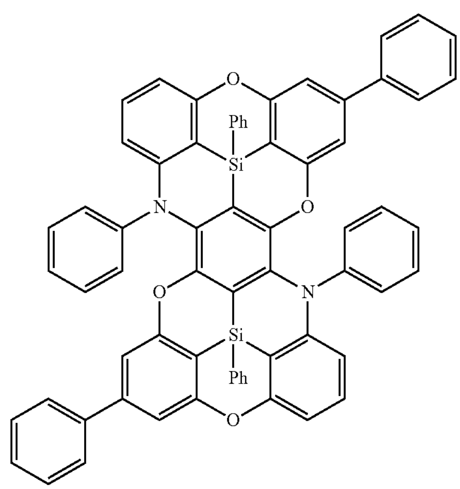

-continued
(1-2435)
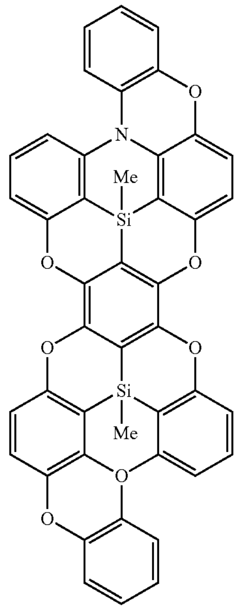
(1-2441)
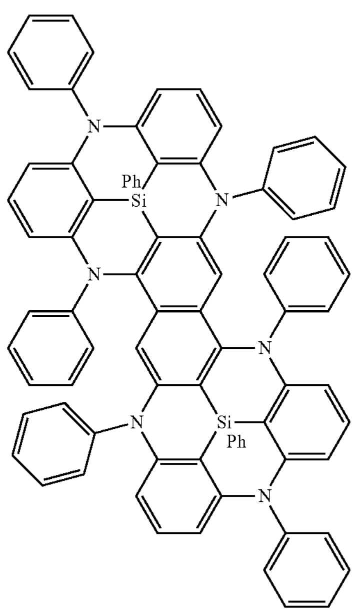
-continued
(1-2442)
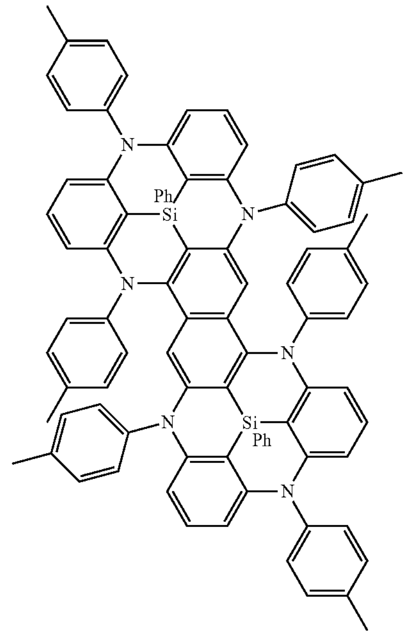
(1-2443)
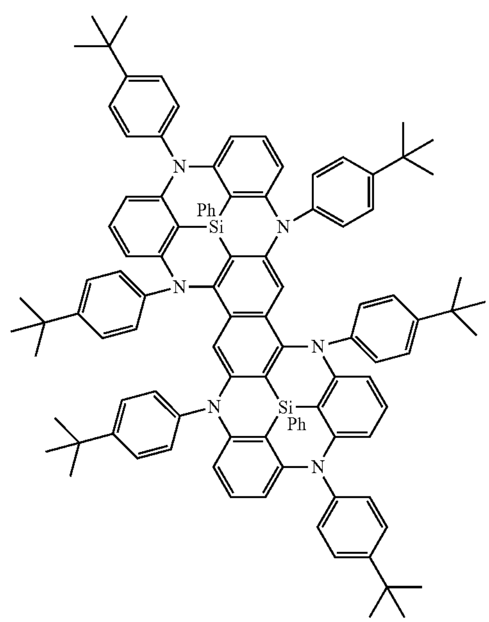

-continued
(1-2444)
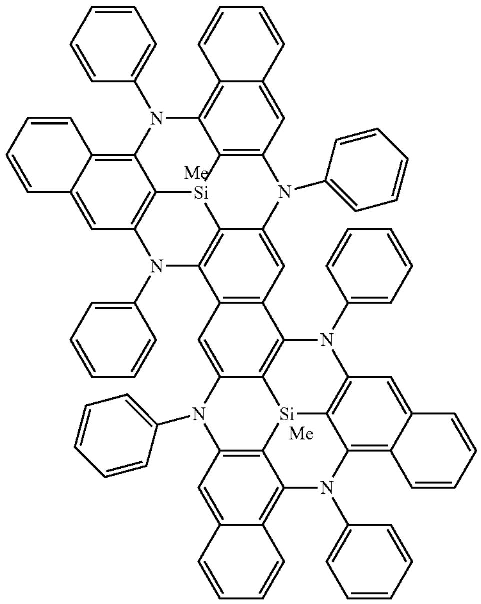
(1-2445)
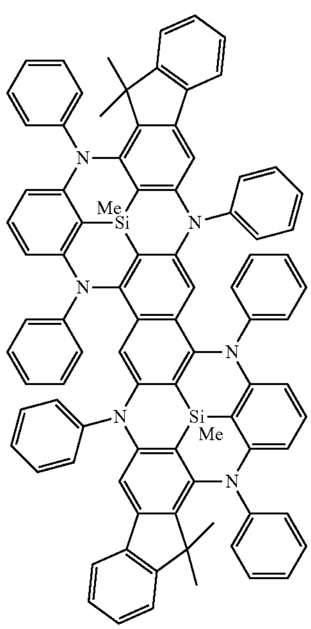
-continued
(1-2446)
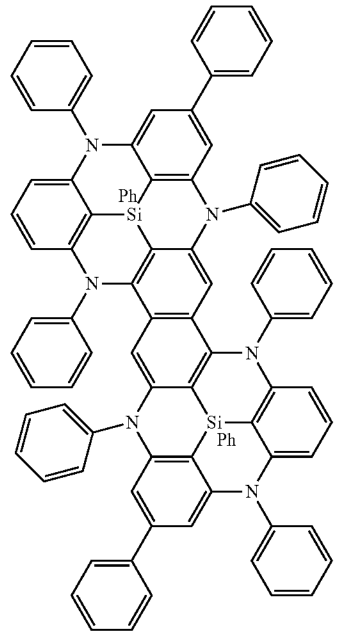
(1-2447)
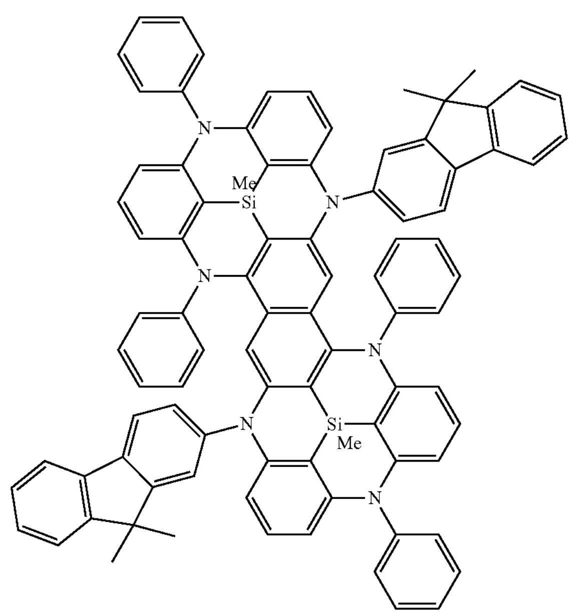

-continued
(1-2448)
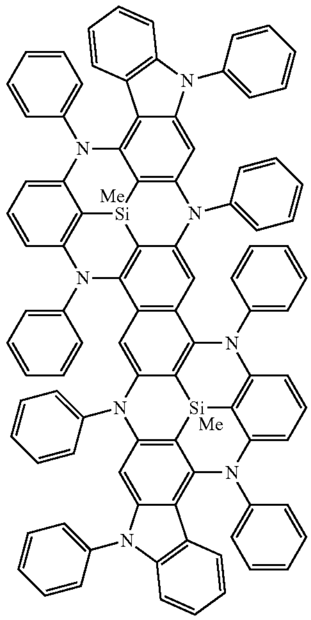
(1-2449)
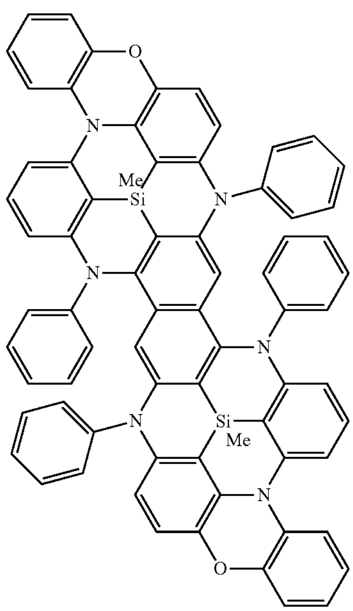
-continued
(1-2450)
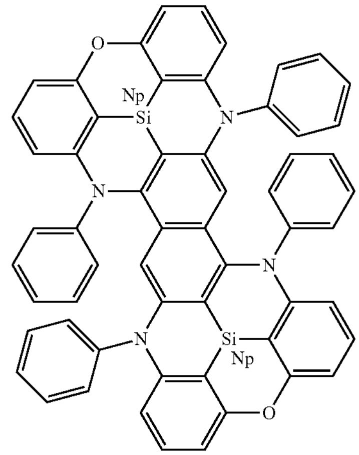
(1-2451)
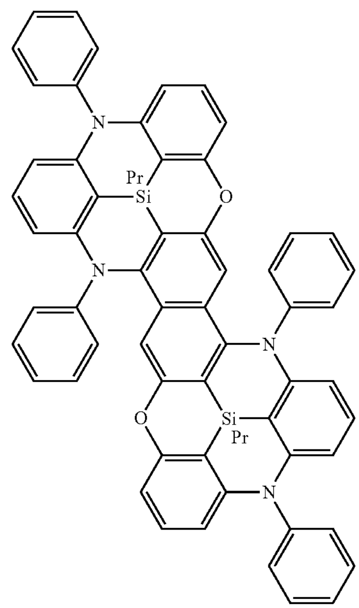
(1-2452)
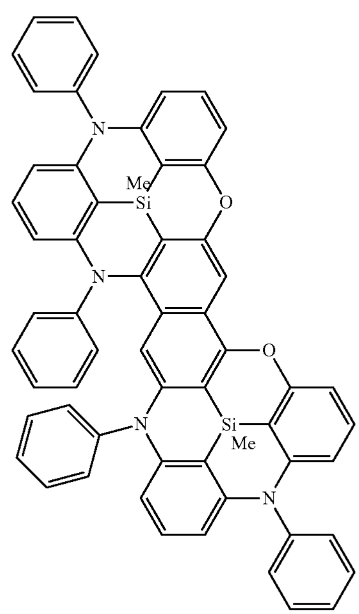

-continued
(1-2461)
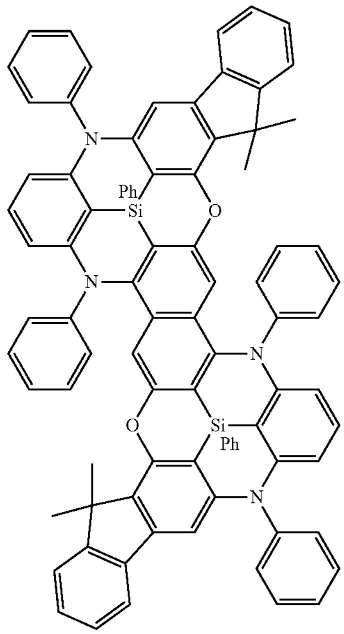
(1-2462)
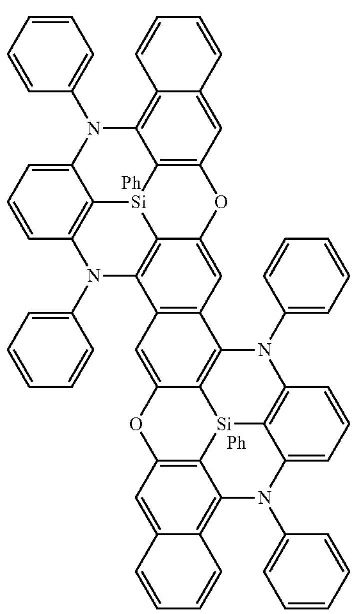
-continued
(1-2463)
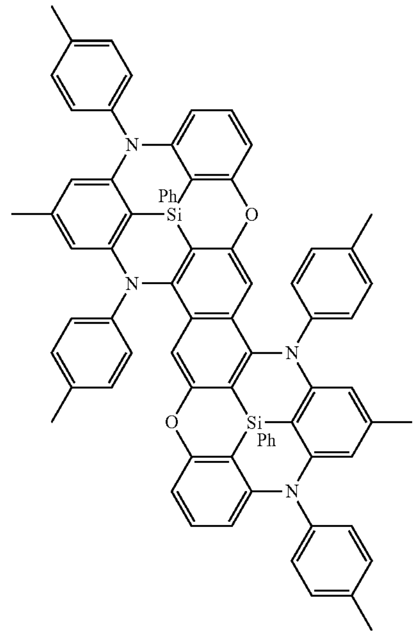
(1-2464)
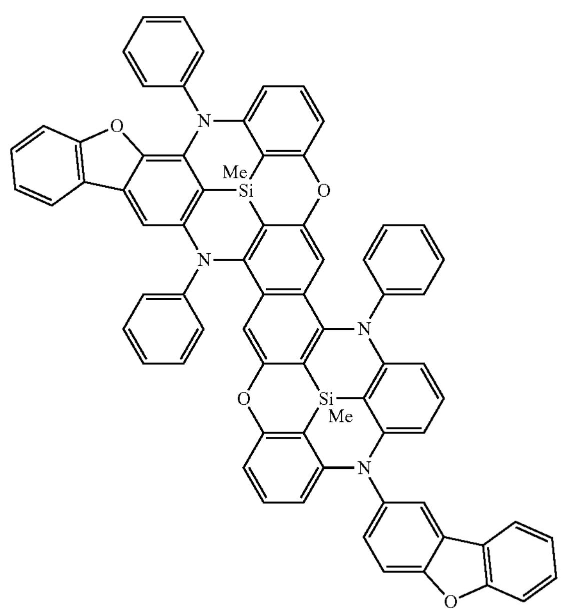

-continued
(1-2465)
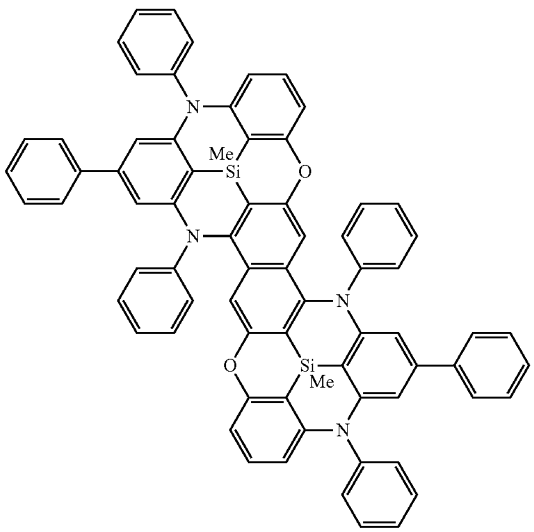
(1-2466)
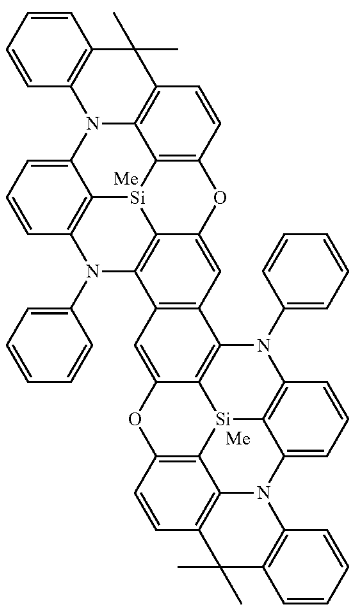
(1-2467)
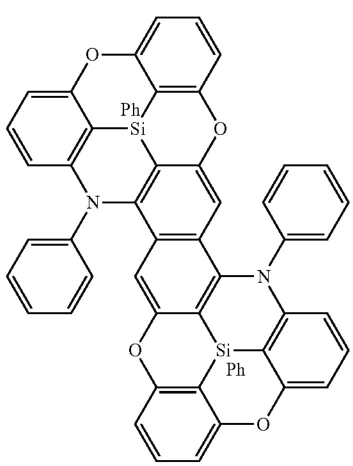
-continued
(1-2468)
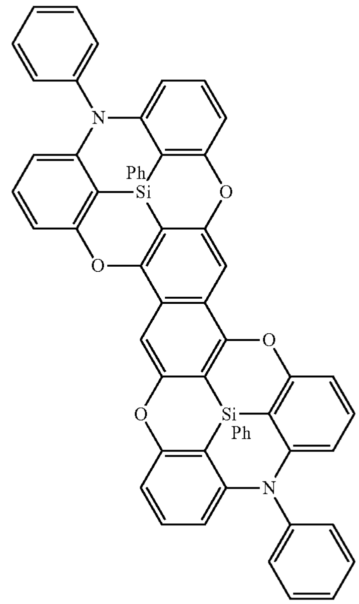
(1-2469)
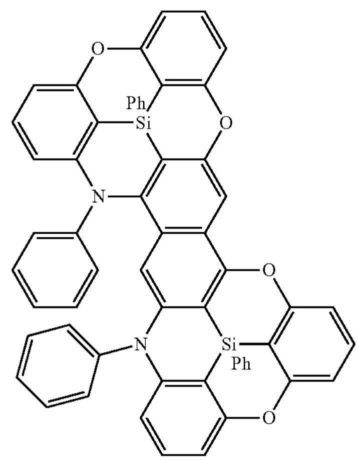
(1-2470)
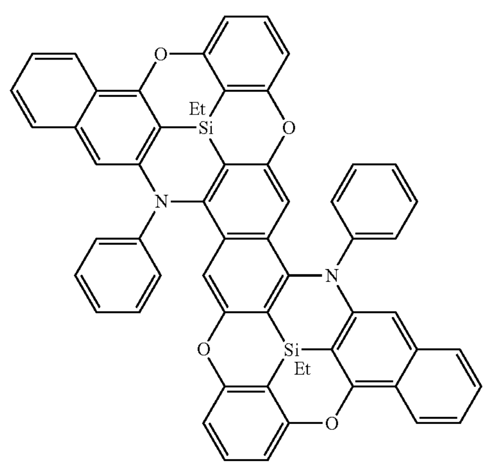

-continued
(1-2471)
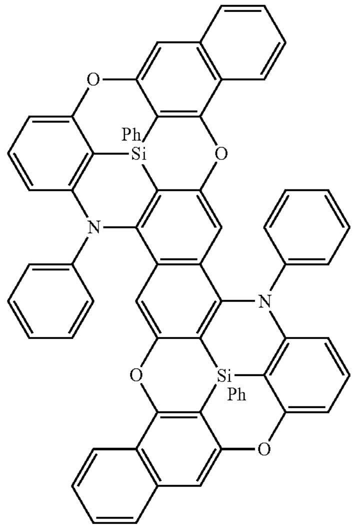
(1-2472)
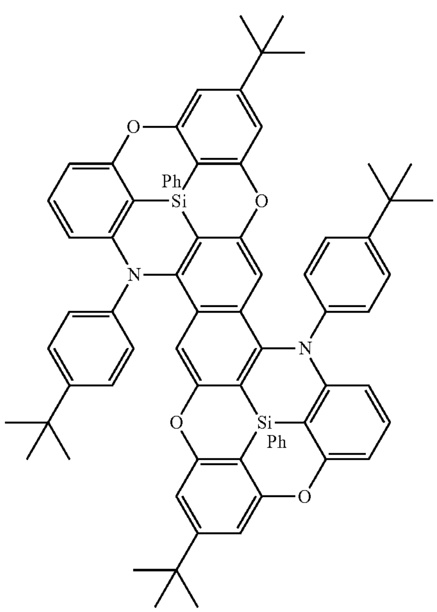
-continued
(1-2473)
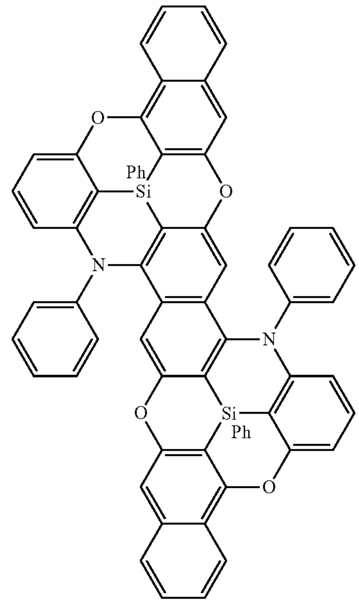
(1-2474)
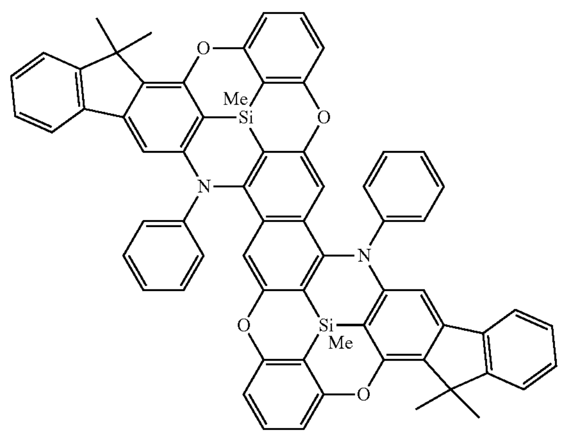
(1-2475)
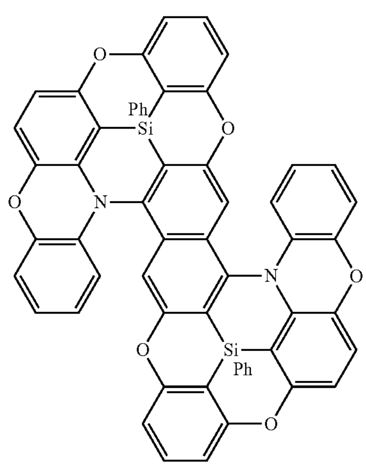

-continued
(1-2481)
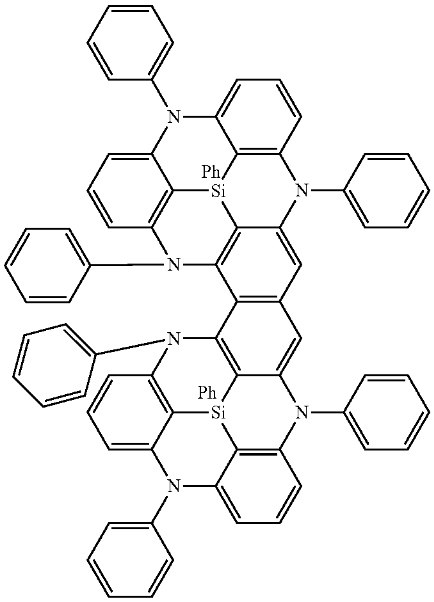
(1-2482)
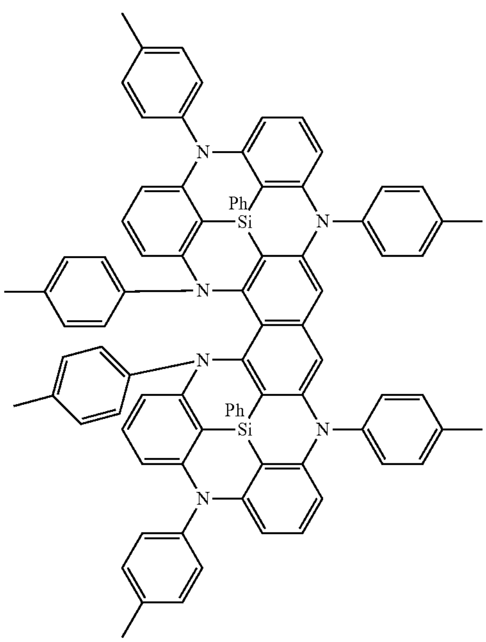
-continued
(1-2483)
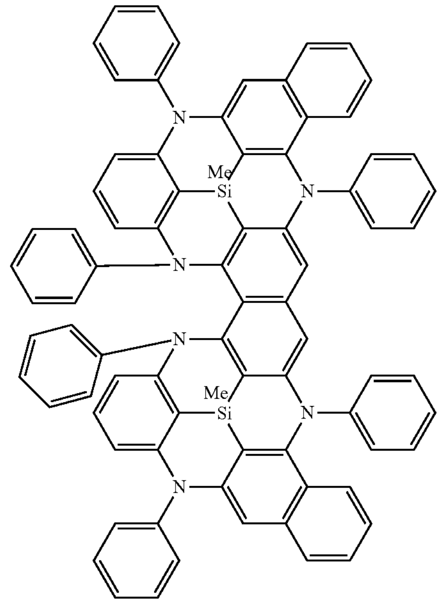
(1-2484)
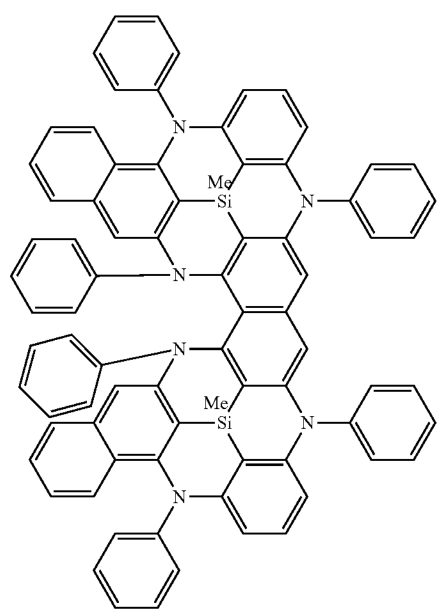

(1-2485)
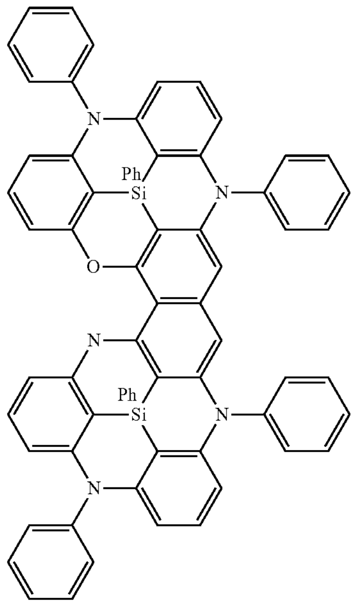
(1-2486)
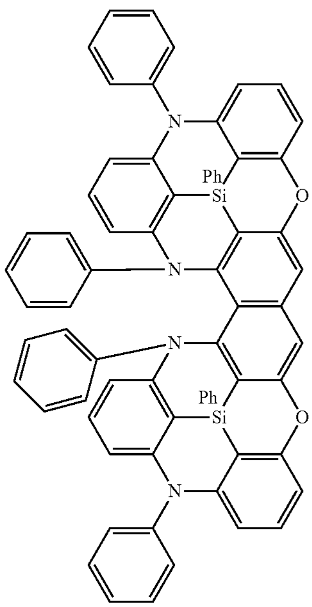
(1-2487)
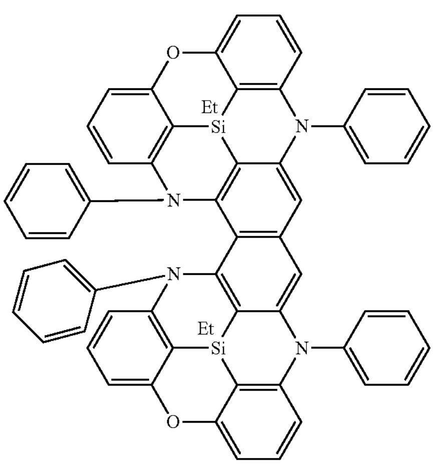
(1-2488)
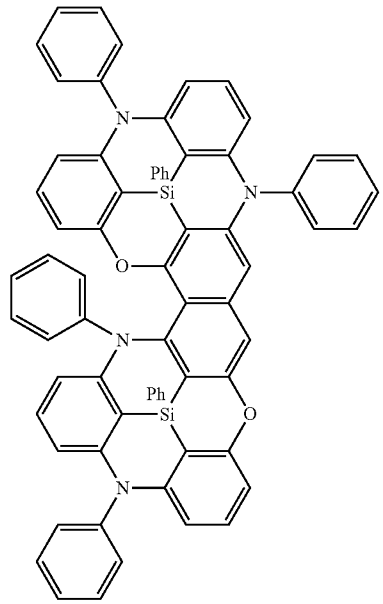
(1-2489)
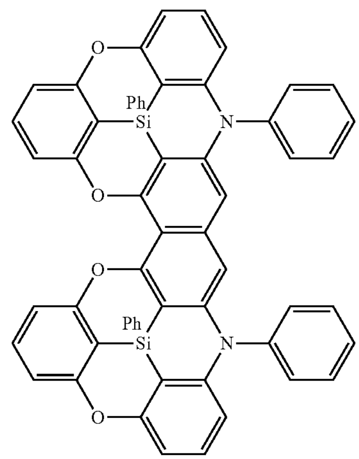
(1-2490)
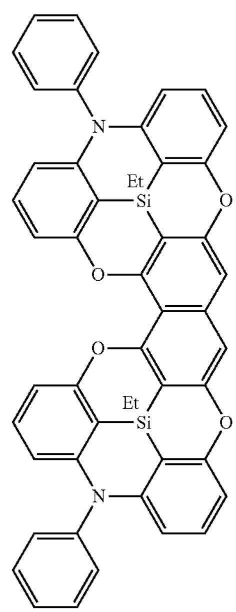

-continued
(1-2491)
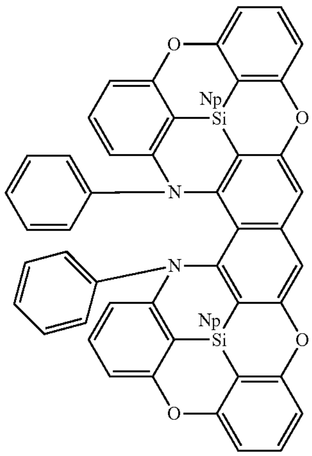
(1-2492)
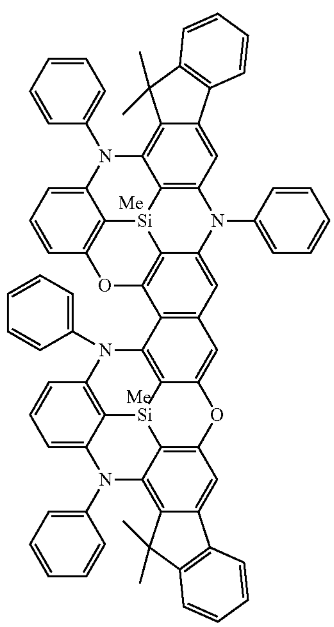
-continued
(1-2501)
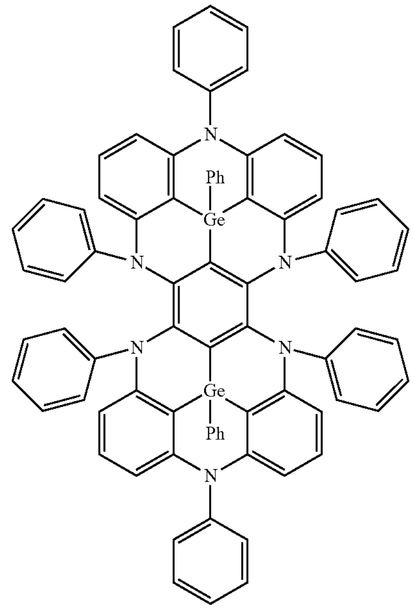
(1-2502)
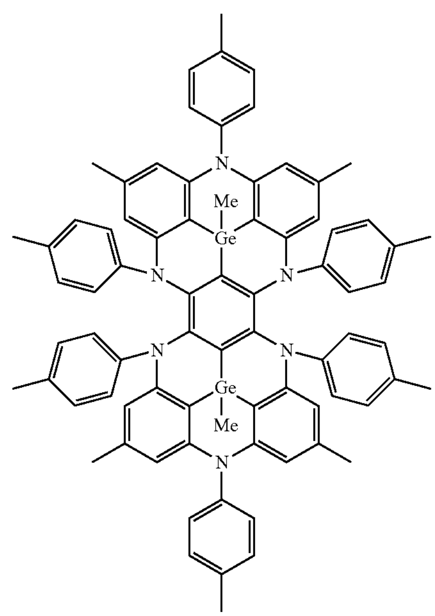

-continued
(1-2503)
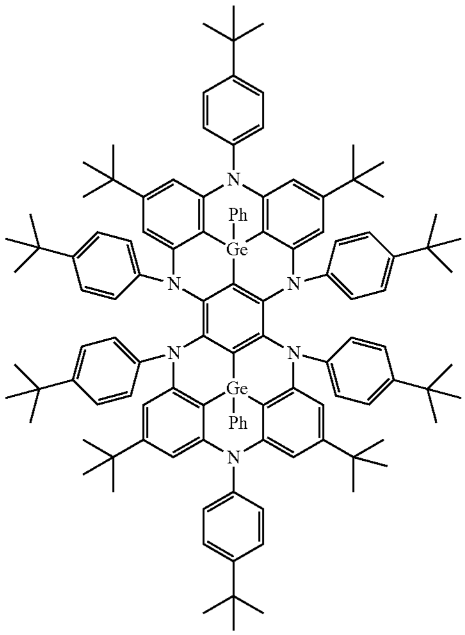
(1-2504)
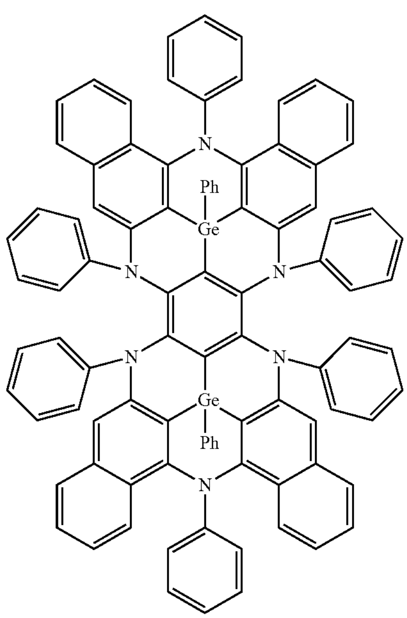
-continued
(1-2505)
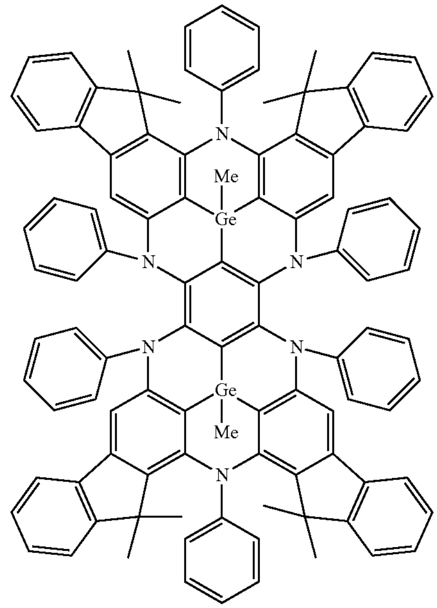
(1-2506)
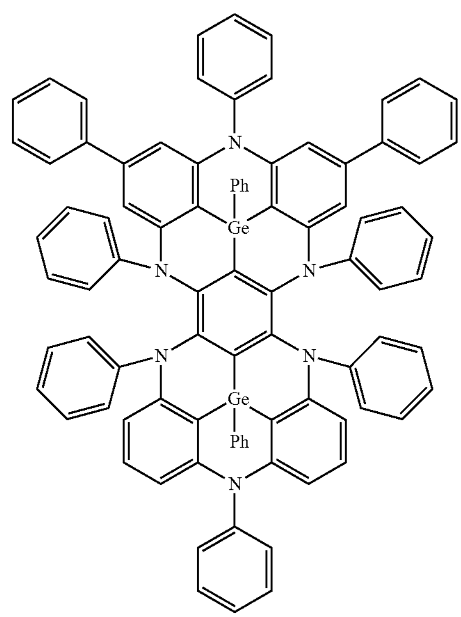

-continued
(1-2507)
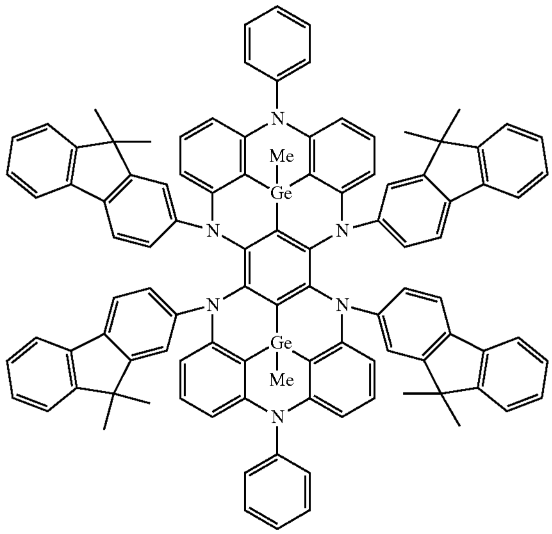
(1-2508)
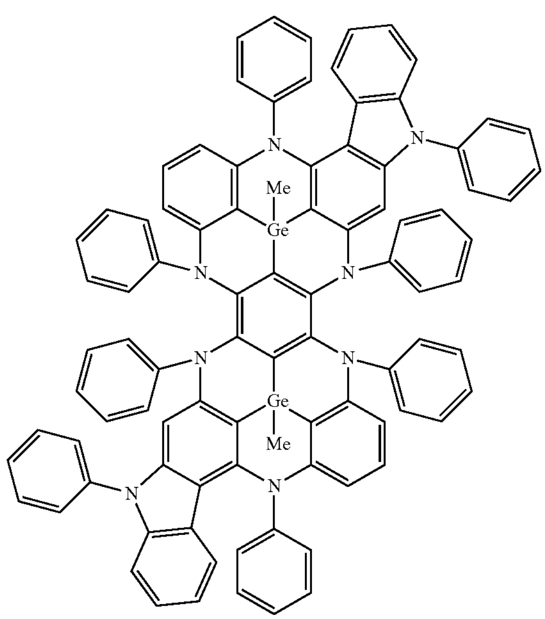
-continued
(1-2509)
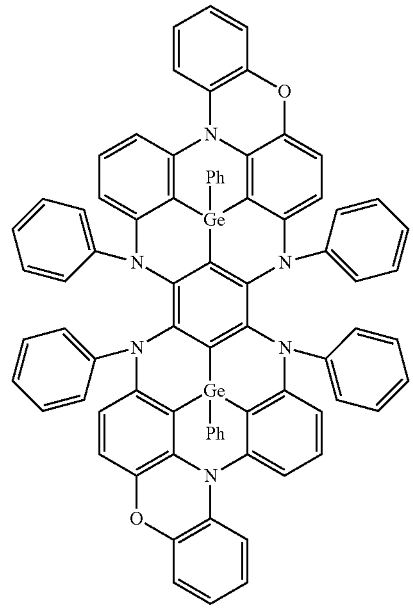
(1-2510)
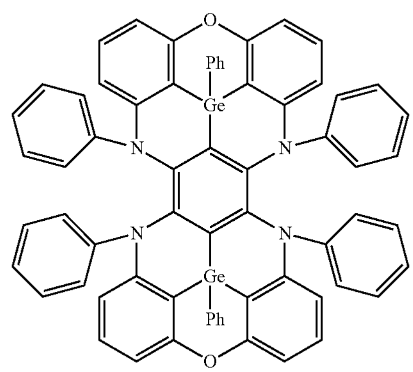
(1-2511)
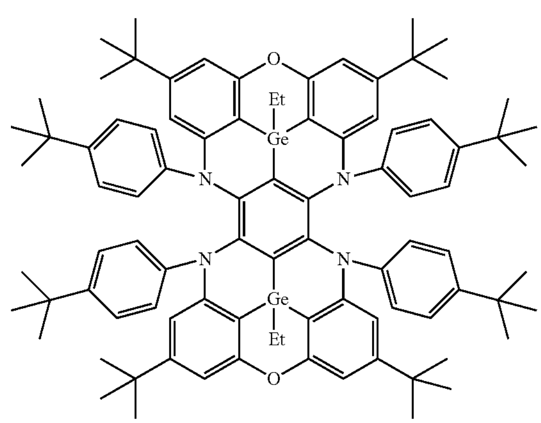

(1-2512)
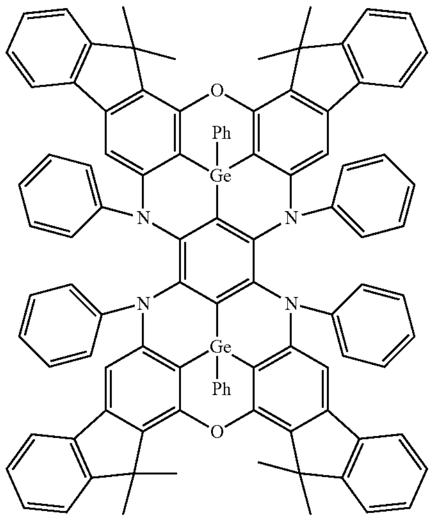
(1-2521)
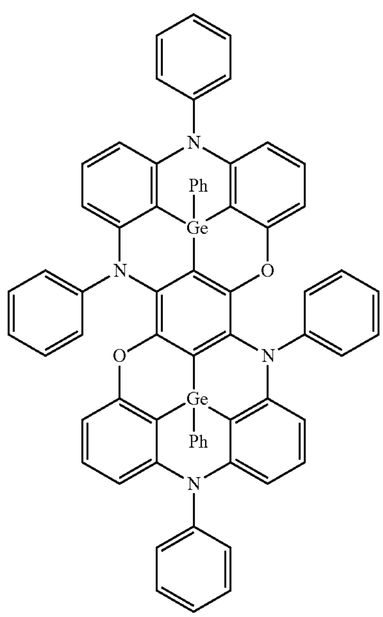
(1-2522)
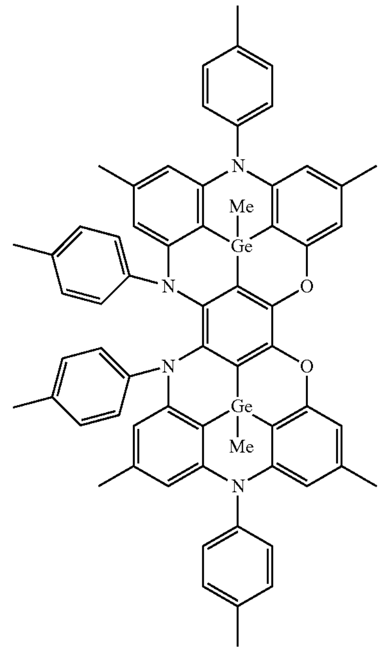
(1-2523)
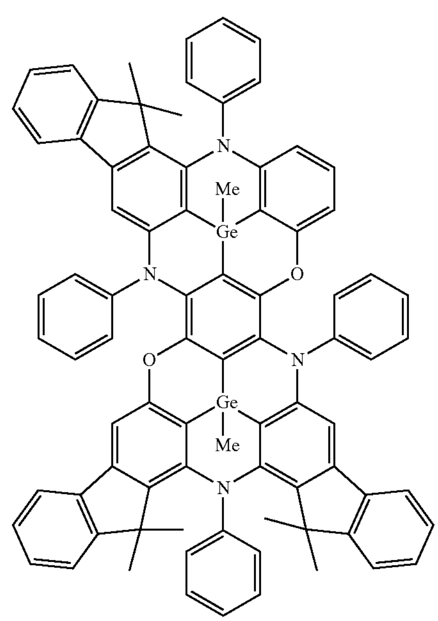

-continued
(1-2524)
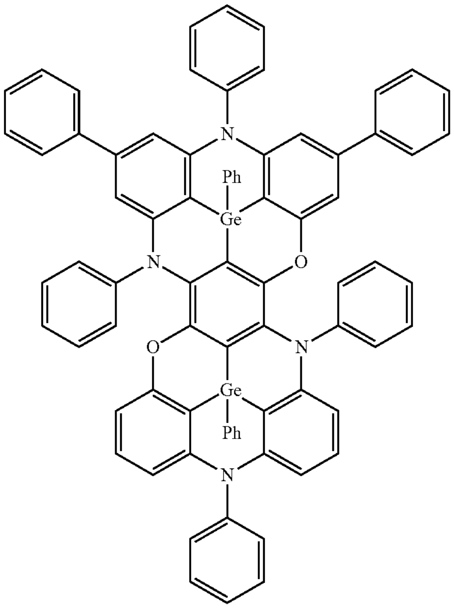
(1-2525)
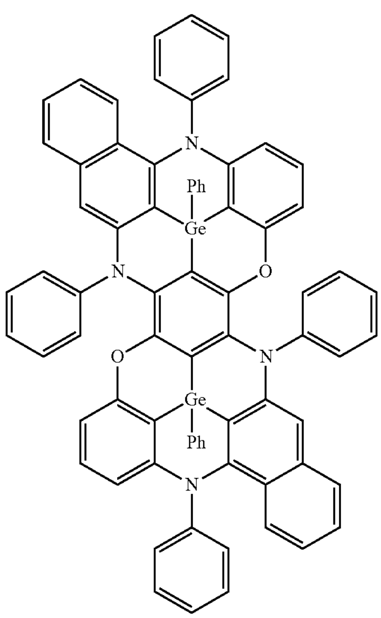
-continued
(1-2526)
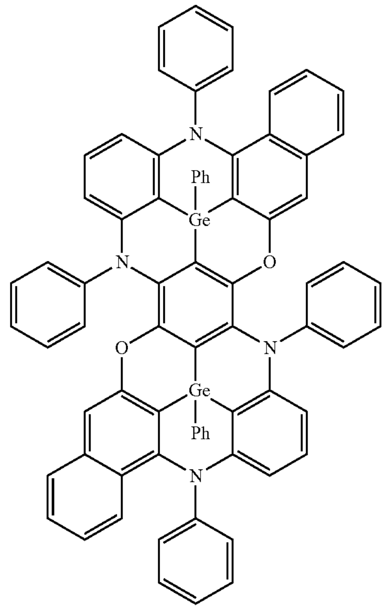
(1-2527)
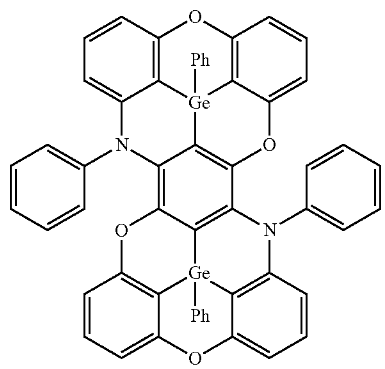
(1-2528)
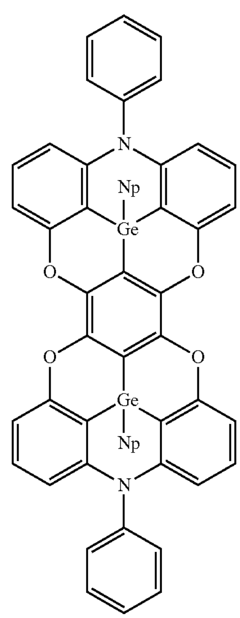

-continued
(1-2529)
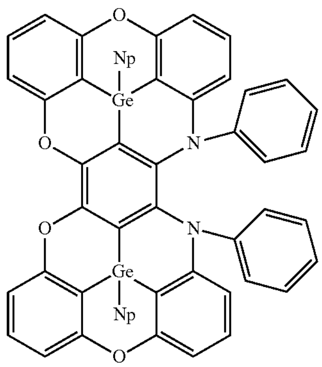
(1-2530)
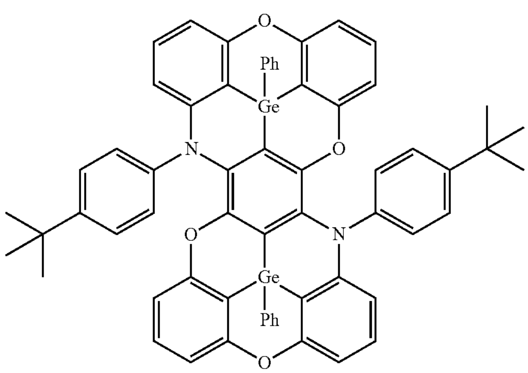
(1-2531)
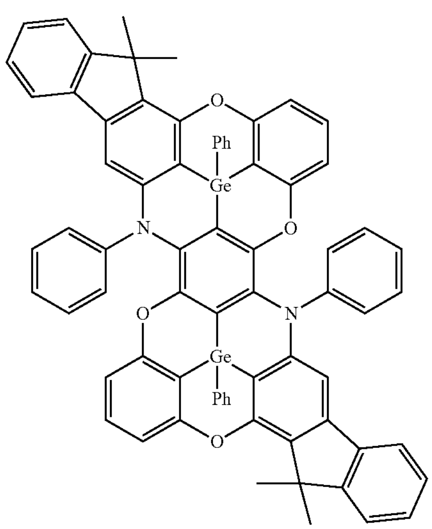
-continued
(1-2532)
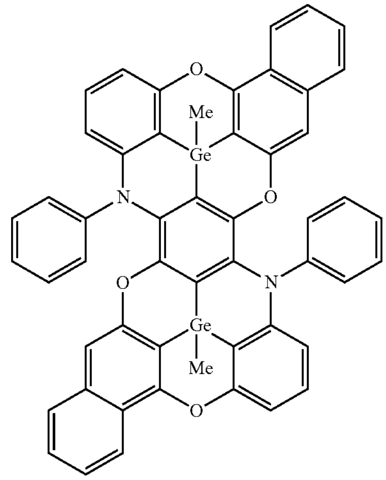
(1-2533)
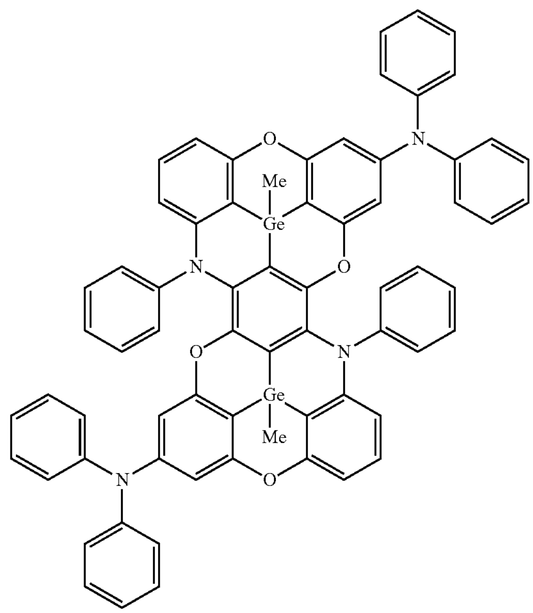
(1-2534)
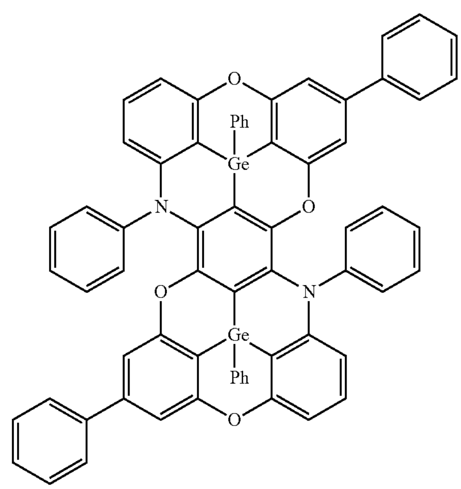

-continued
(1-2535)
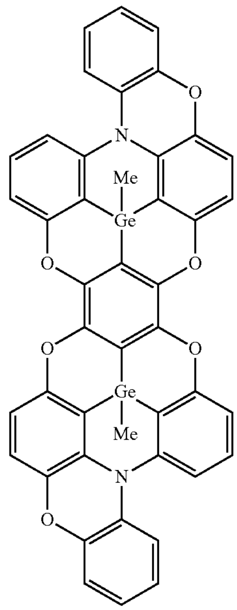
(1-2541)
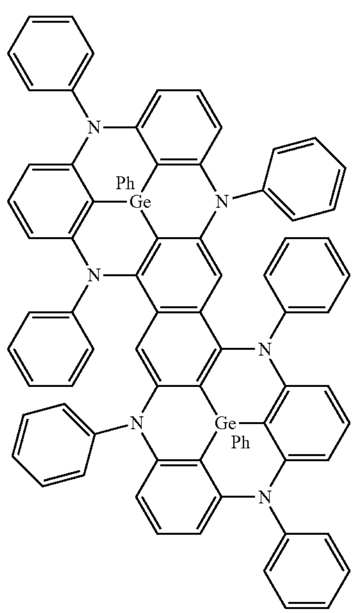
-continued
(1-2542)
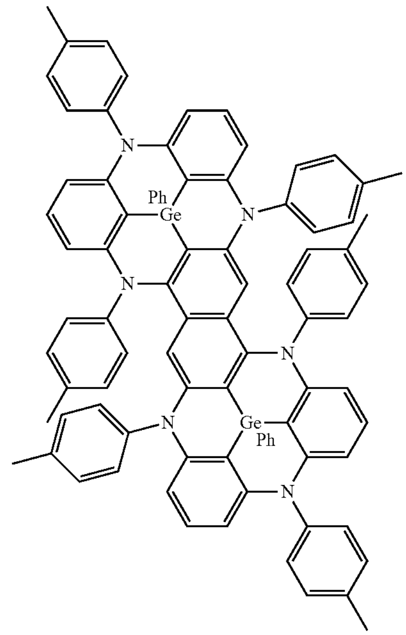
(1-2543)
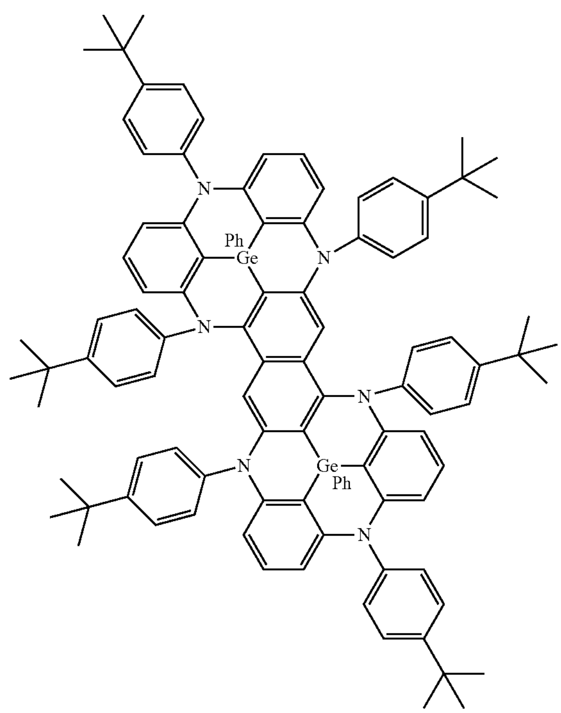

-continued
(1-2544)
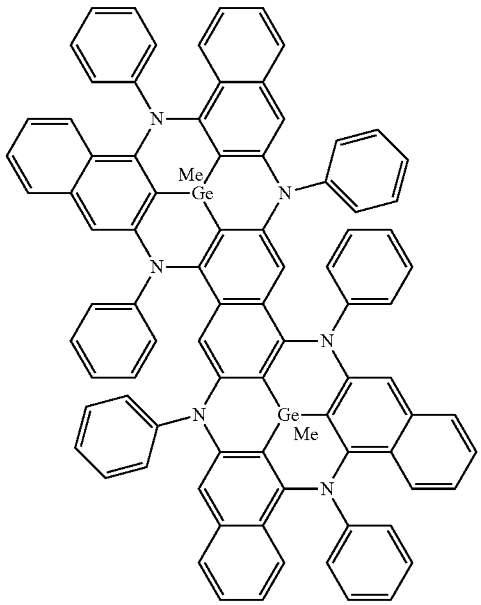
(1-2545)
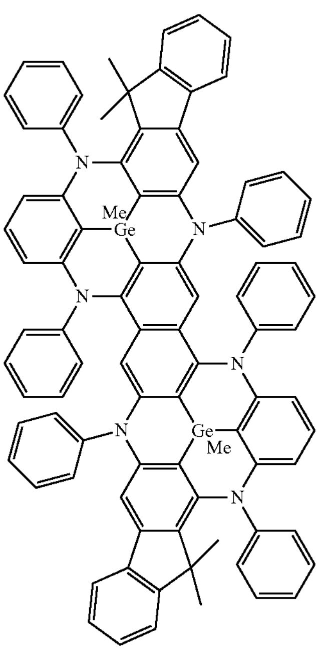
-continued
(1-2546)
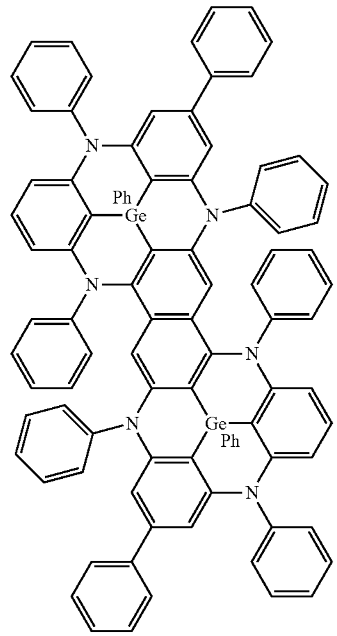
(1-2547)
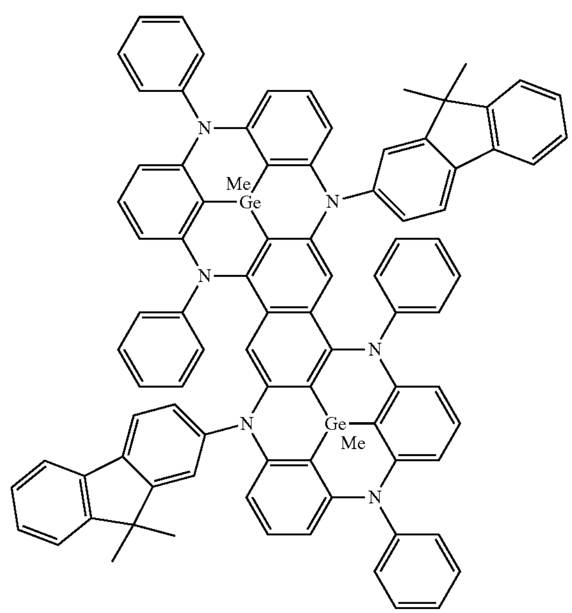

-continued
(1-2548)
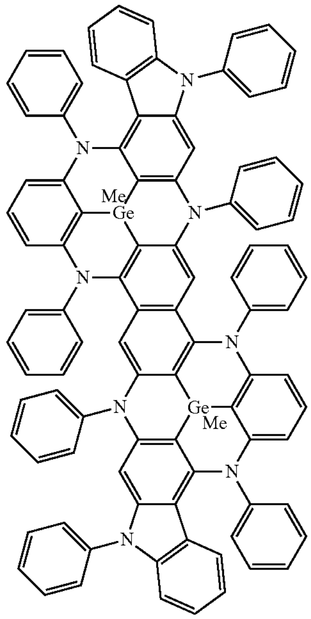
(1-2549)
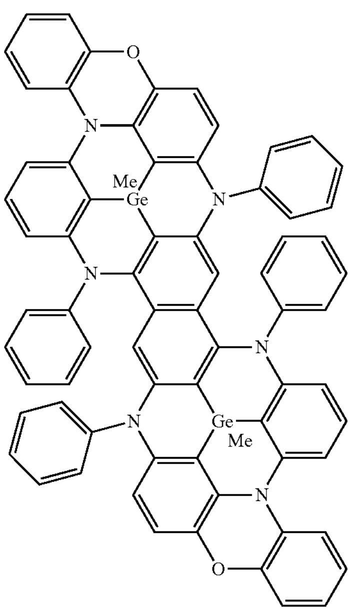
-continued
(1-2550)
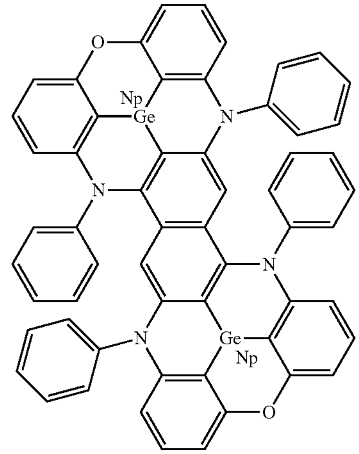
(1-2551)
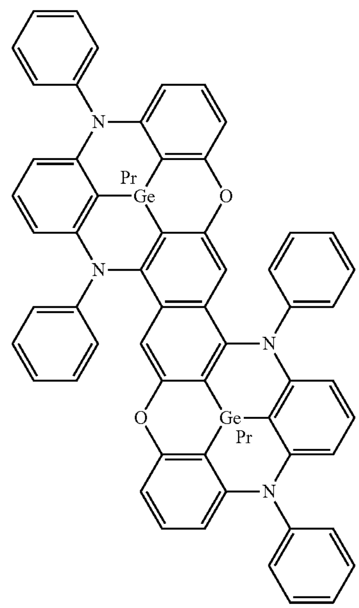
(1-2552)
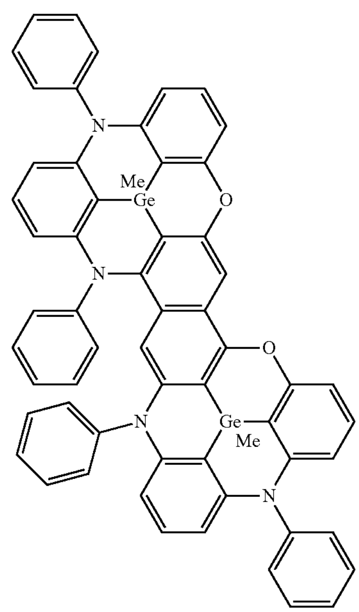

-continued
(1-2561)
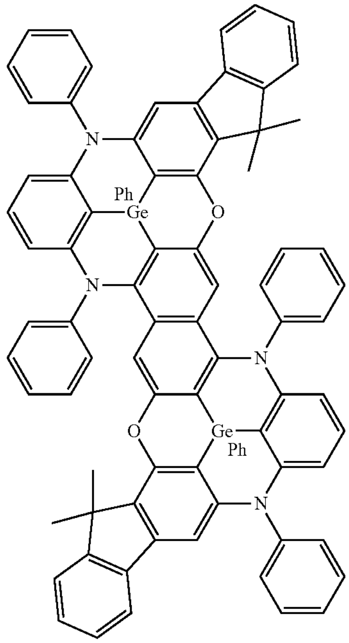
(1-2562)
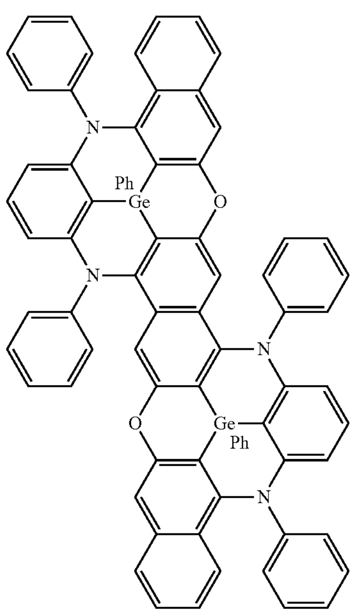
-continued
(1-2563)
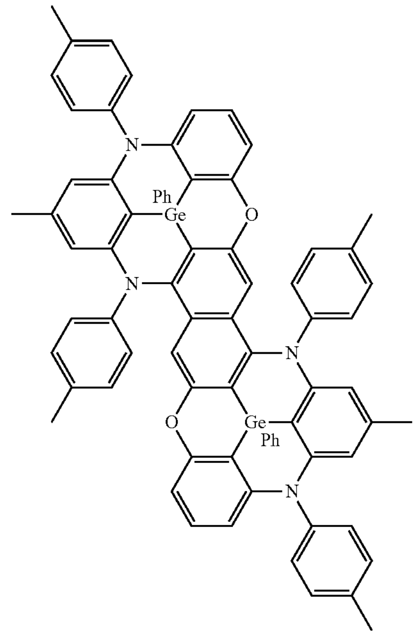
(1-2564)
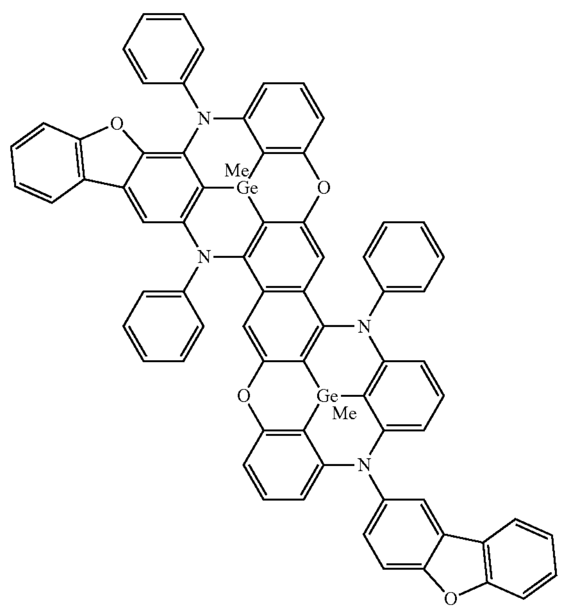

-continued
(1-2565)
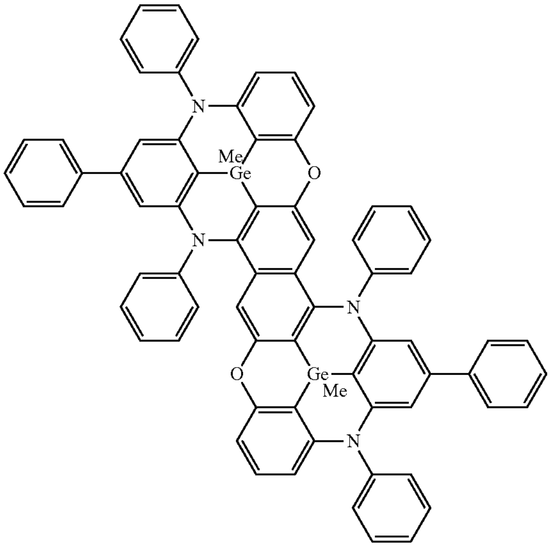
(1-2566)
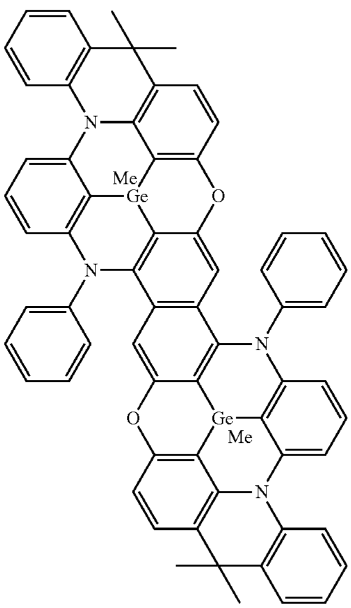
(1-2567)
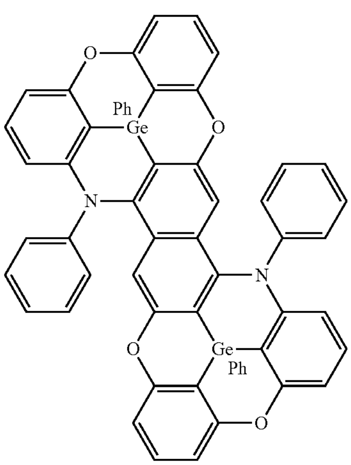
-continued
(1-2568)
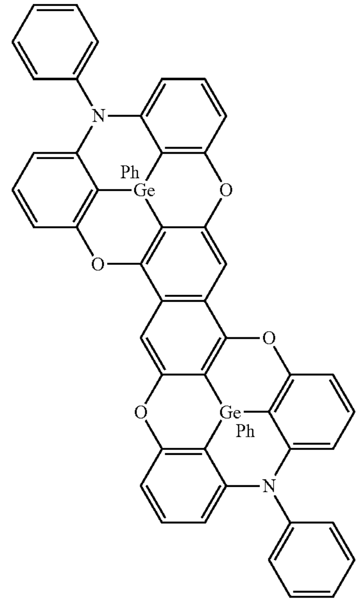
(1-2569)
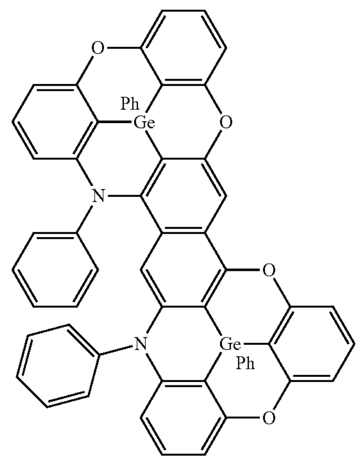
(1-2570)
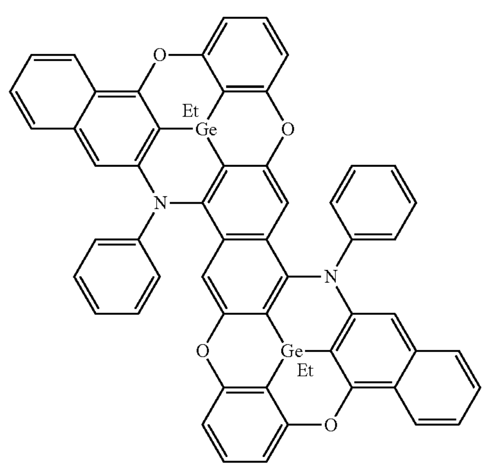

-continued
(1-2571)
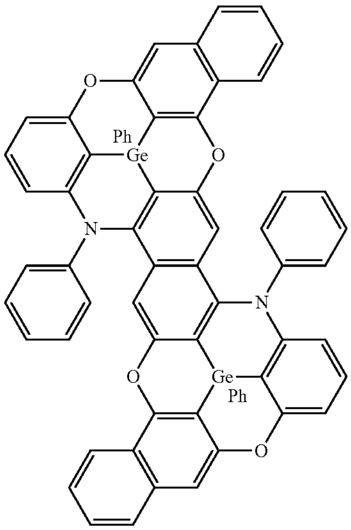
(1-2572)
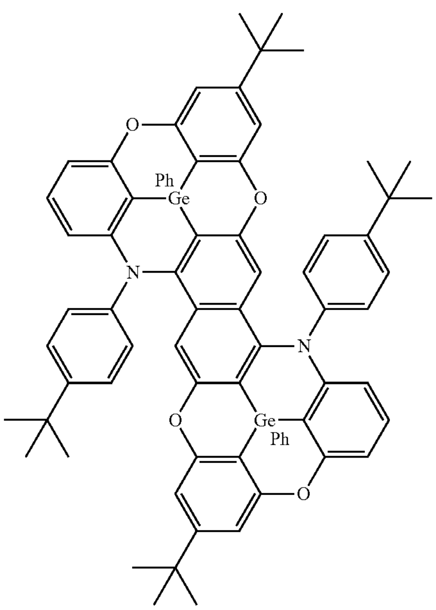
-continued
(1-2573)
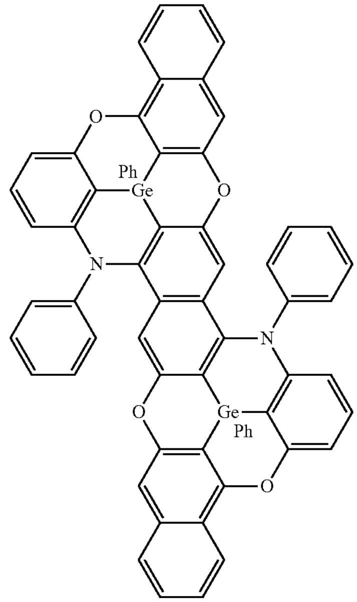
(1-2574)
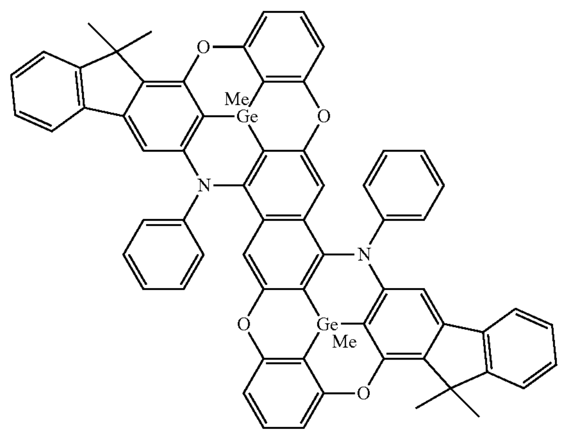
(1-2575)
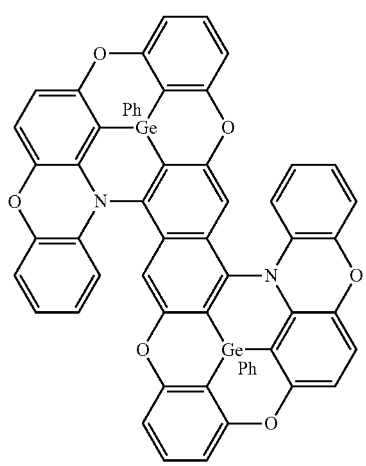

-continued
(1-2581)
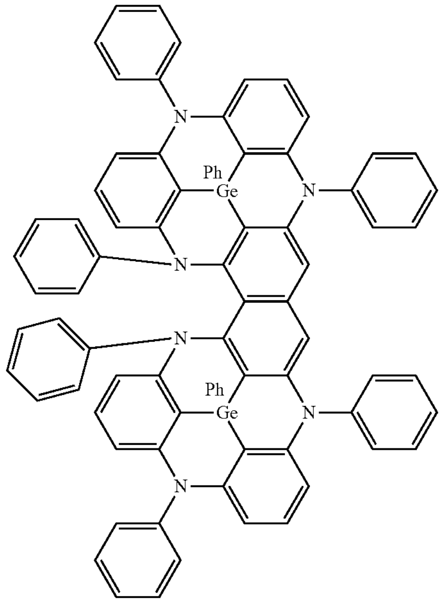
(1-2582)
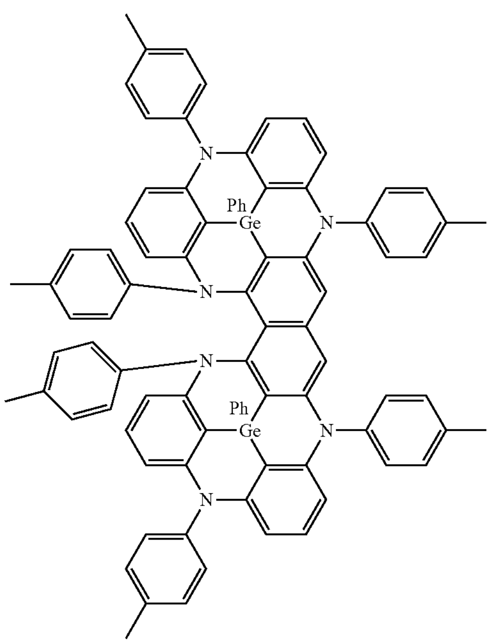
-continued
(1-2583)
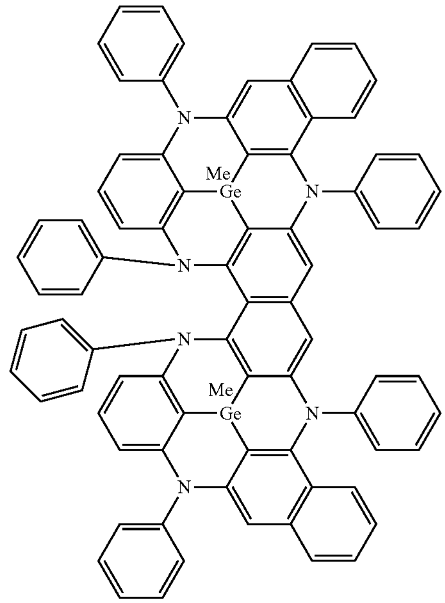
(1-2584)
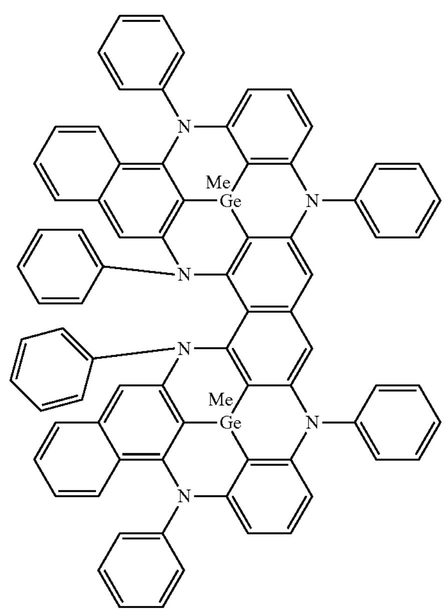

-continued
(1-2585)
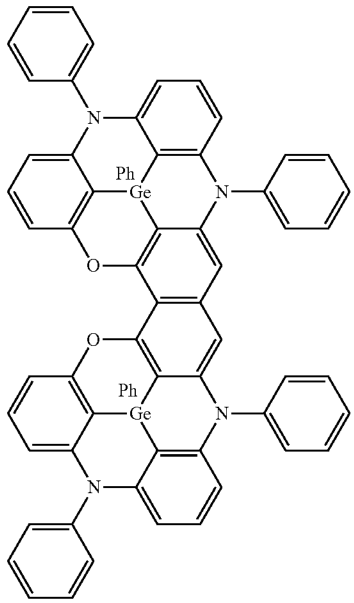
(1-2586)
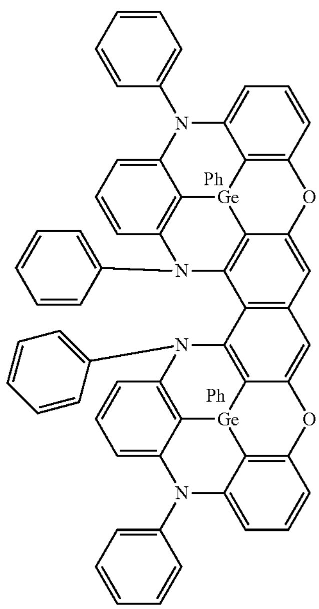
(1-2587)
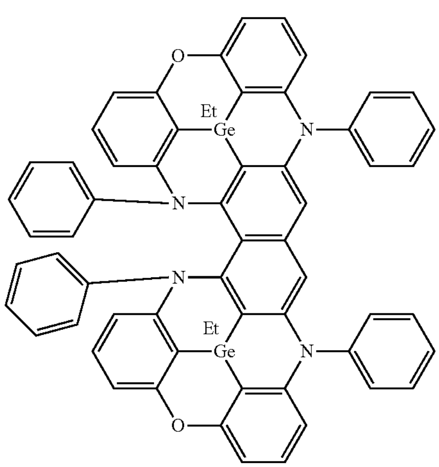
-continued
(1-2588)
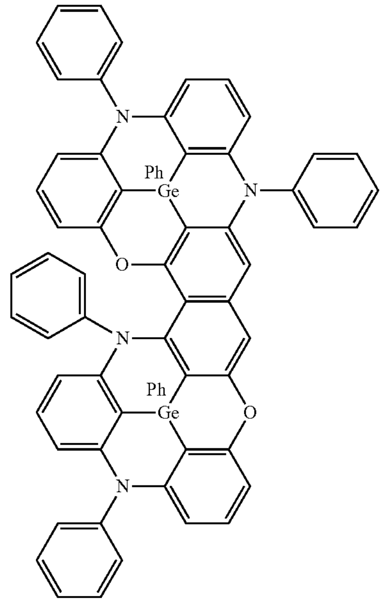
(1-2589)
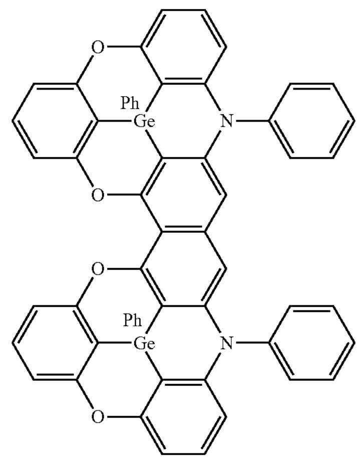
(1-2590)
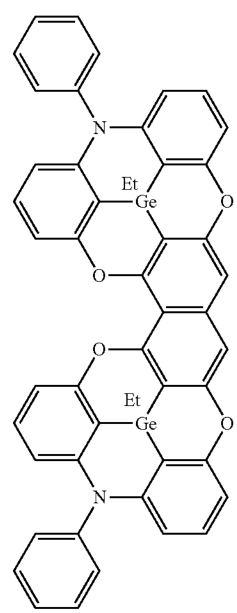

-continued (1-2591)

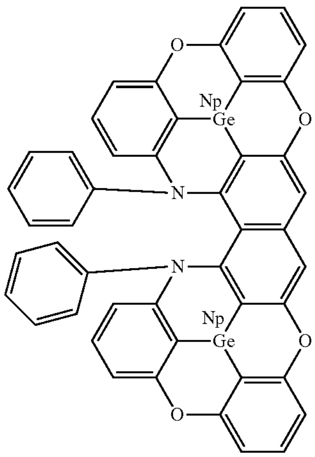

(1-2592)

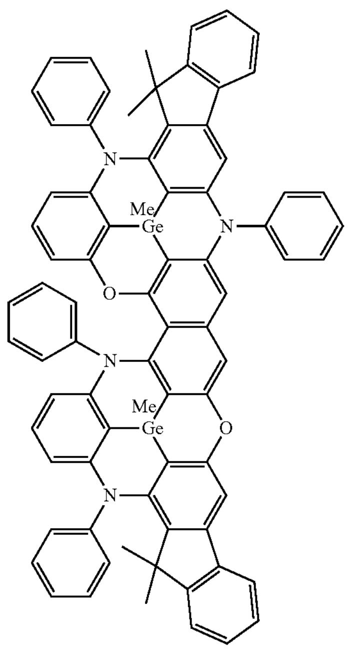

2. Method for Manufacturing Polycyclic Aromatic Compound and Dimer Thereof

In regard to the polycyclic aromatic compound represented by general formula (1) or (2) and a dimer thereof, basically, first, an intermediate is manufactured by bonding the ring A (ring a), ring B (ring b), and ring C (ring c) via a bonding group (group containing $X^1$, $X^2$, or $X^3$) (first reaction), and then a final product can be manufactured by bonding the ring A (ring a), ring B (ring b), and ring C (ring c) via a bonding group (group containing $Y^1$) (second reaction). In the first reaction, for example, in an etherification reaction, a general reaction such as a nucleophilic substitution reaction or an Ullmann reaction can be utilized, and in an amination reaction, a general reaction such as a Buchwald-Hartwig reaction can be utilized. In the second reaction, a Tandem Hetero-Friedel-Crafts reaction (continuous aromatic electrophilic substitution reaction, the same hereinafter) can be utilized. Note that the definitions of $Y^1$, $X^1$, $X^2$, $X^3$, $R^1$ to $R^9$, and R in the following schemes are the same as those in formula (1) or (2).

The second reaction is a reaction for introducing $Y^1$ that bonds the ring A (ring a), ring B (ring b), and ring C (ring c) as illustrated in the following scheme (1) or (2), and as an example, a case in which $Y^1$ represents a boron atom, and $X^1$, $X^2$, and $X^3$ represent nitrogen atoms is indicated below. First, a hydrogen atom among $X^1$, $X^2$, and $X^3$ is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. In the second reaction, a Lewis acid such as aluminum trichloride may be added in order to accelerate the reaction.

scheme (1)

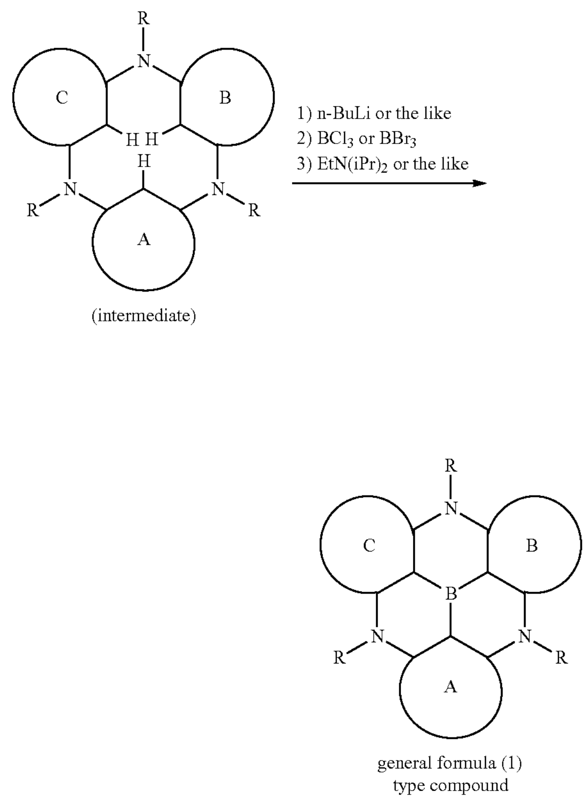

scheme (2)

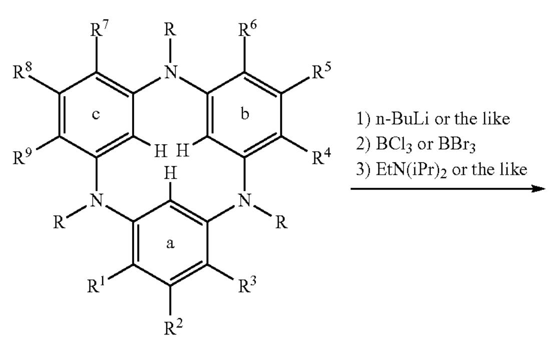

(intermediate)

-continued

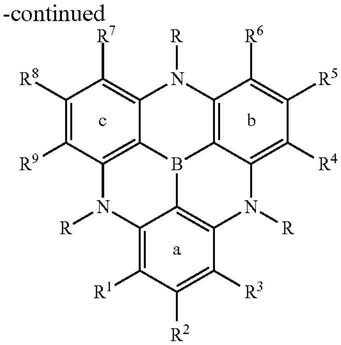

general formula (2) type compound

Incidentally, the above scheme (1) or (2) mainly illustrates a method for manufacturing a polycyclic aromatic compound represented by general formula (1) or (2). However, a dimer thereof can be manufactured using an intermediate having a plurality of ring A's (ring a's), ring B's (ring b's), and ring C's (ring c's). Specifically, the manufacturing method will be described with the following schemes (3) and (4). In this case, a desired product can be obtained by increasing the amount of a reagent used therein, such as butyllithium to a double amount.

scheme (3)

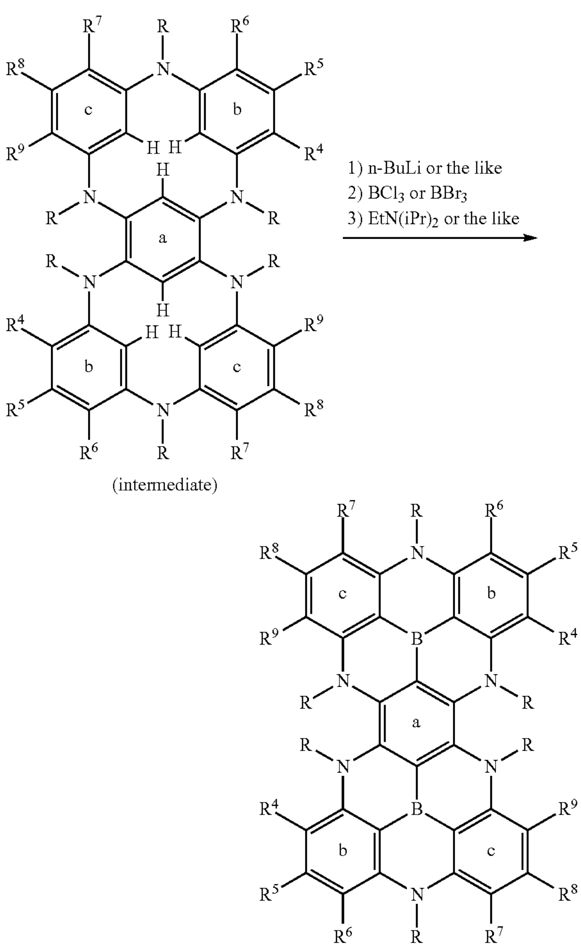

scheme (4)

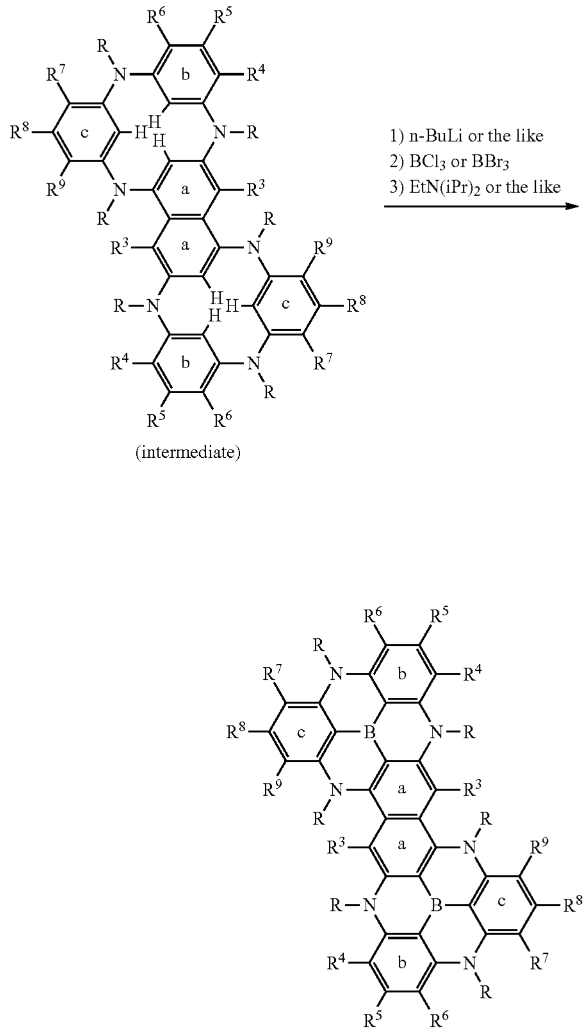

In the above schemes, a lithium atom is introduced to a desired position by ortho-metalation. However, as in the following schemes (5) and (6), a lithium atom can also be introduced to a desired position by introducing a halogen atom (Hal) to a position where a lithium atom is desired to be introduced and performing halogen-metal exchange.

scheme (5)

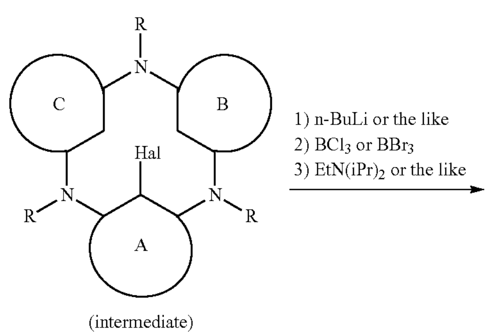

-continued

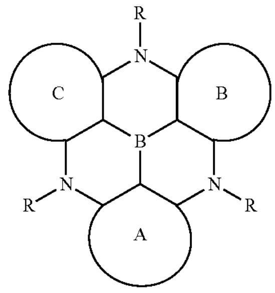

general formula (1) type compound scheme (6)

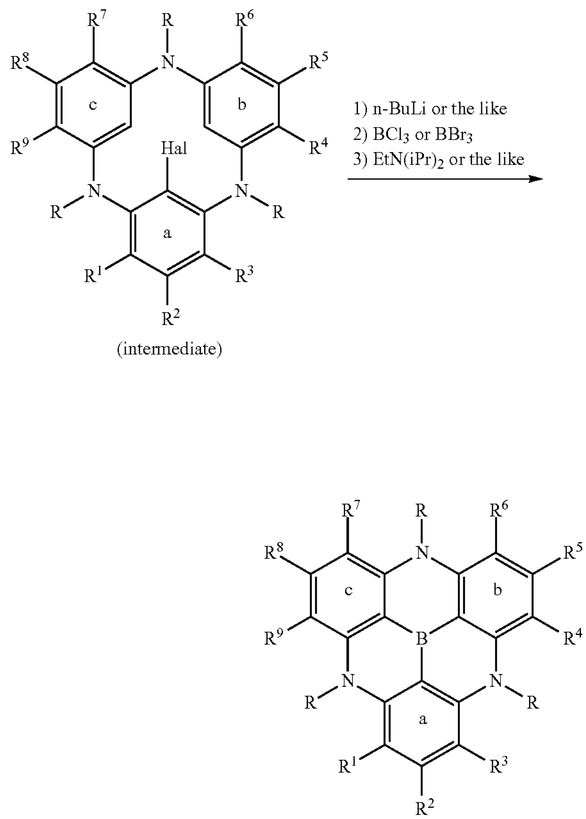

(intermediate)

general formula (2) type compound

Furthermore, also for the method for manufacturing a dimer described in schemes (3) and (4), as in the above schemes (5) and (6), a lithium atom can be introduced to a desired position also by introducing a halogen atom such as a bromine atom or a chlorine atom to a position where a lithium atom is desired to be introduced and performing halogen-metal exchange (the following schemes (7) and (8)).

scheme (7)

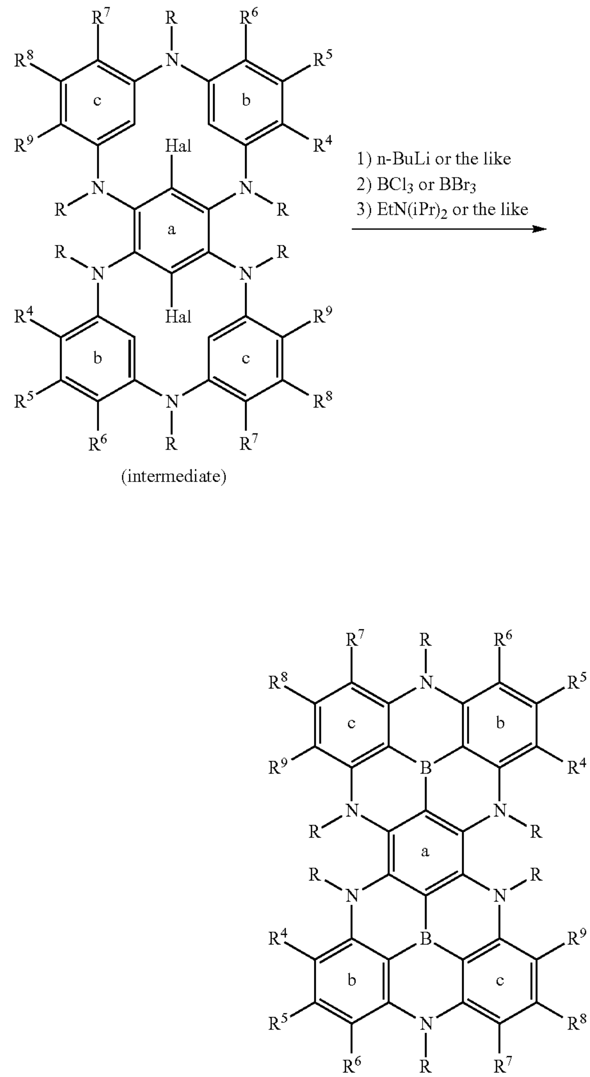

(intermediate)

scheme (8)

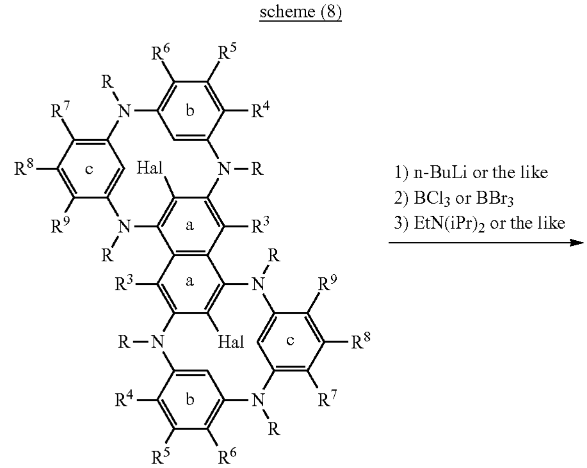

(intermediate)

-continued

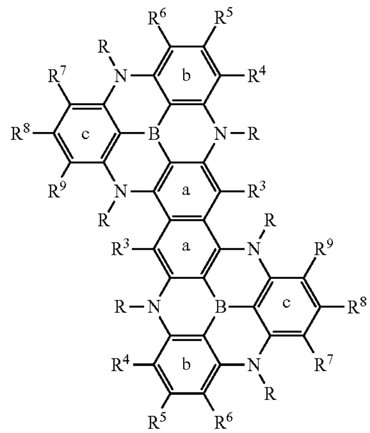

According to this method, a desired product can also be synthesized even in a case where ortho-metalation cannot be performed due to an influence of substituents, and therefore the method is useful.

By appropriately selecting the synthesis method described above and appropriately selecting raw materials to be used, a polycyclic aromatic compound having a substituent at a desired position, with $Y^1$ being a boron atom and $X^1$, $X^2$, and $X^3$ being nitrogen atoms, and a dimer thereof can be synthesized.

Next, as an example, a case where $Y^1$ represents a boron atom, $X^1$ and $X^2$ represent nitrogen atoms, and $X^3$ represents an oxygen atom is illustrated in the following schemes (9) and (10). As in the case where all of $X^1$, $X^2$, and $X^3$ are nitrogen atoms, a halogen atom such as a bromine atom or a chlorine atom is introduced to a position where a lithium atom is desired to be introduced, n-butyllithium or the like is caused to act thereon, and metallation is performed by halogen-metal exchange. Subsequently, boron tribromide or the like is added thereto to induce lithium-boron metal exchange, and then a Brønsted base such as N,N-diisopropylethylamine is added thereto to induce a Tandem Bora-Friedel-Crafts reaction. Thus, a desired product can be obtained. In this reaction, a Lewis acid such as aluminum trichloride may also be added in order to accelerate the reaction.

scheme (9)

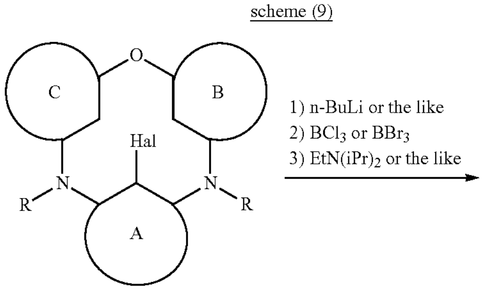

(intermediate)

-continued

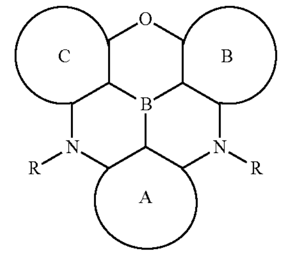

general formula (1) type compound scheme (10)

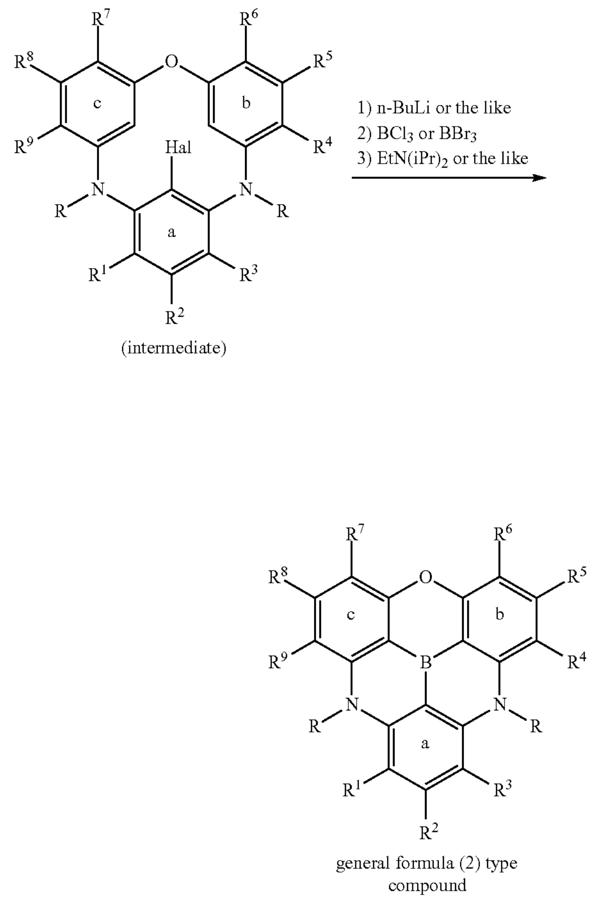

Furthermore, also for a dimer in which $Y^1$ represents a boron atom, $X^1$ and $X^2$ represent nitrogen atoms, and $X^3$ represents an oxygen atom, as in the above schemes (7) and (8), a lithium atom can be introduced to a desired position also by introducing a halogen atom such as a bromine atom or a chlorine atom to a position where a lithium atom is desired to be introduced and performing halogen-metal exchange (the following schemes (11) and (12)).

scheme (11)

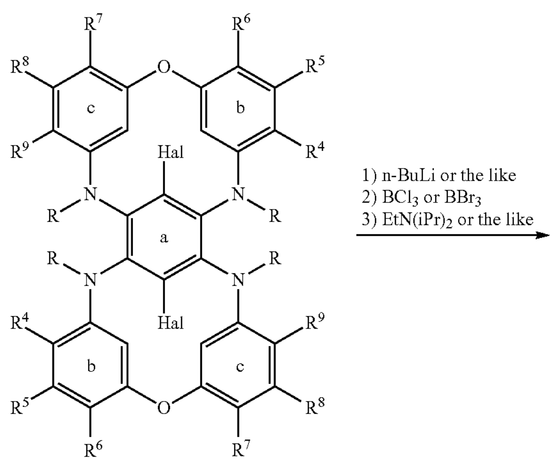

(intermediate)

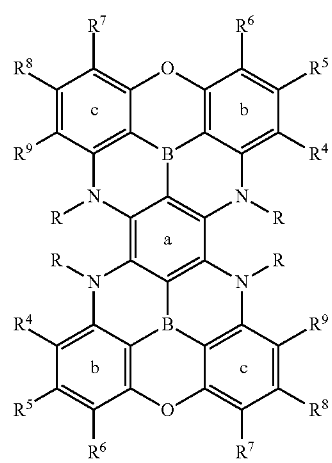

scheme (12)

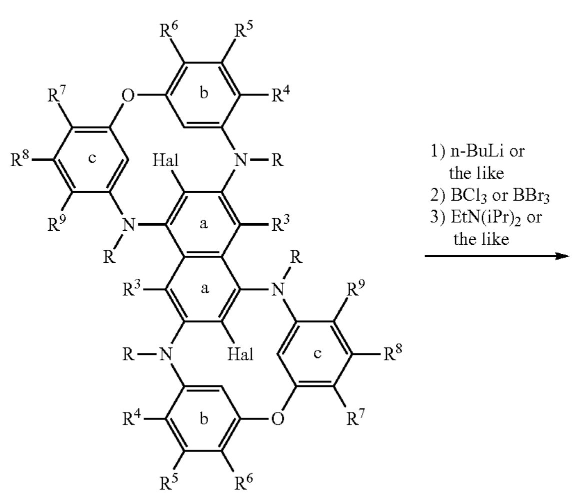

(intermediate)

-continued

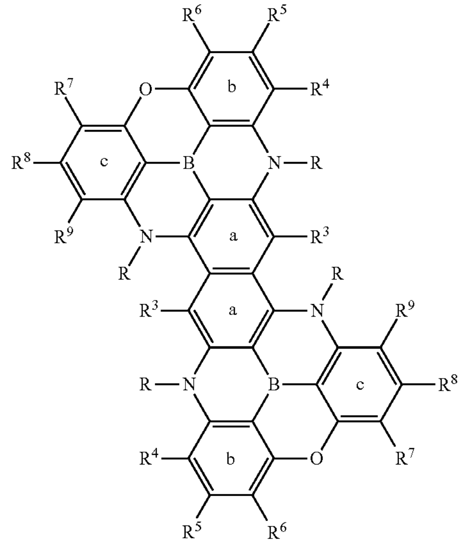

Next, as an example, a case where $Y^1$ is phosphorus sulfide, phosphorus oxide, or a phosphorus atom and all of $X^1$, $X^2$, and $X^3$ are nitrogen atoms is illustrated in the following schemes (13) to (16). As in the above cases, a halogen atom such as a bromine atom or a chlorine atom is introduced to a position where a lithium atom is desired to be introduced, and metallation is performed by halogen-metal exchange. Subsequently, phosphorus trichloride and sulfur are added thereto in this order, and finally a Lewis acid such as aluminum trichloride and a Brønsted base such as N,N-diisopropylethylamine are added thereto to induce a Tandem Phospha-Friedel-Crafts reaction. Thus, a compound in which $Y^1$ is phosphorus sulfide can be obtained. Furthermore, by treating the phosphorus sulfide compound thus obtained with m-chloroperbenzoic acid (m-CPBA), a compound in which $Y^1$ is phosphorus oxide can be obtained, and by treating the resulting phosphorus oxide compound with triethylphosphine, a compound in which $Y^1$ is a phosphorus atom can be obtained.

scheme (13)

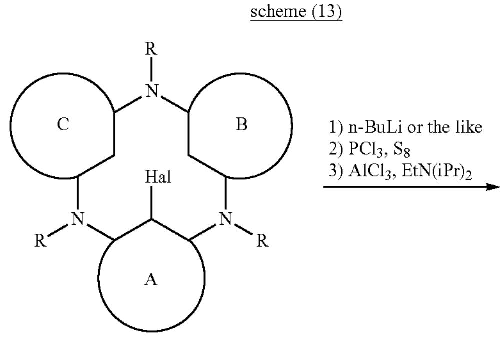

(intermediate)

-continued

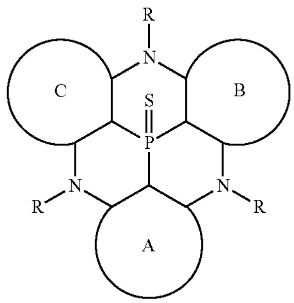

general formula (1) type compound scheme (14)

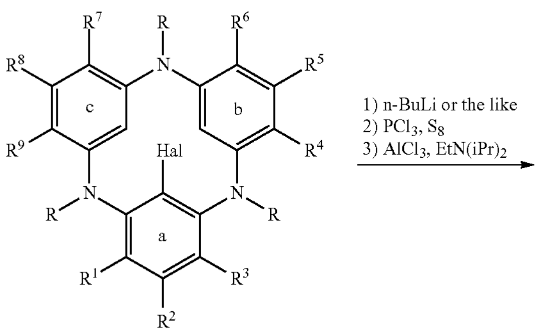

(intermediate)

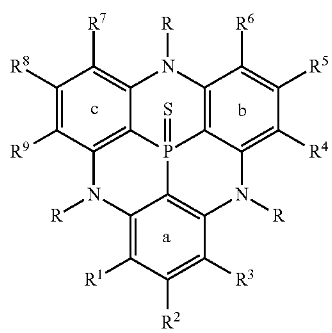

general formula (2) type compound scheme (15)

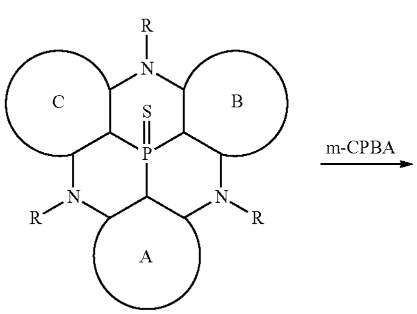

-continued

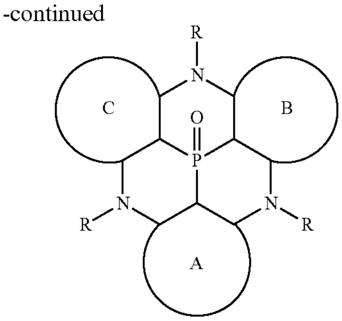

scheme (16)

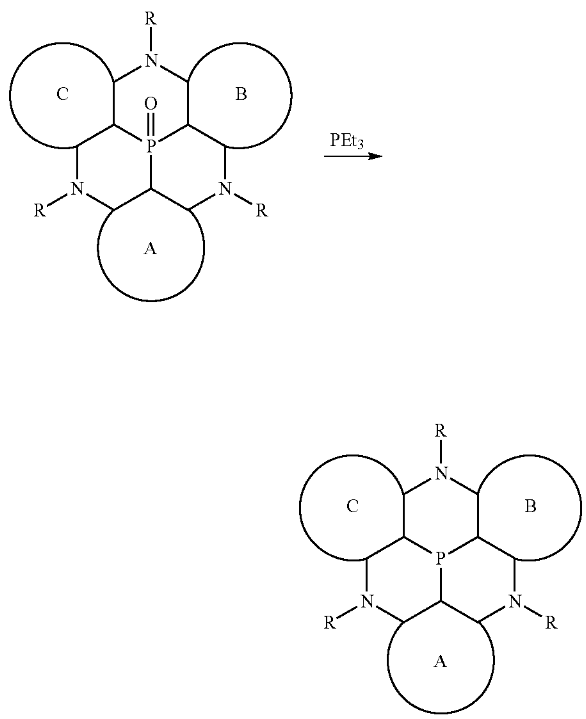

Furthermore, also for a dimer in the case where $Y^1$ is phosphorus sulfide, and all of $X^1$, $X^2$, and $X^3$ are nitrogen atoms, as in the above schemes (7) and (8), a lithium atom can be introduced to a desired position also by introducing a halogen atom such as a bromine atom or a chlorine atom to a position where a lithium atom is desired to be introduced and performing halogen-metal exchange (the following schemes (17) and (18)). Furthermore, in this way, also for a dimer in which $Y^1$ represents phosphorus sulfide, and all of $X^1$, $X^2$, and $X^3$ are nitrogen atoms, as in the above schemes (15) and (16), by treating a phosphorus sulfide compound with m-chloroperbenzoic acid (m-CPBA), a compound in which $Y^1$ is phosphorus oxide can be obtained, and by treating the resulting phosphorus oxide compound with triethylphosphine, a compound in which $Y^1$ is a phosphorus atom can be obtained.

-continued scheme (17)

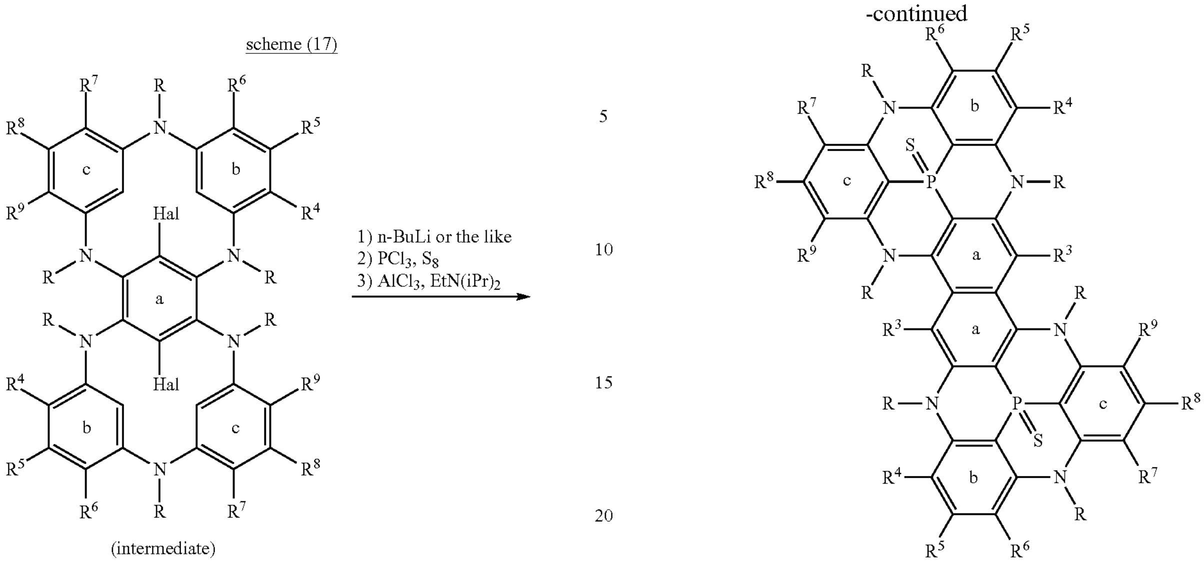

(intermediate)

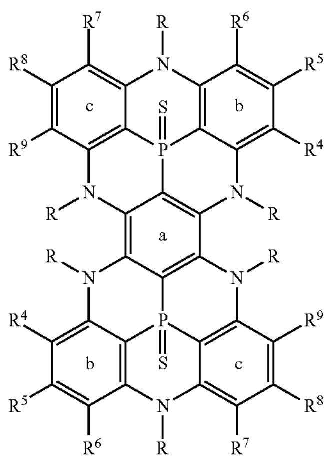

Here, an example in which $Y^1$ represents B, P, P=O, or P=S, and each of $X^1$, $X^2$, and $X^3$ represents N—R or O has been described. However, by changing a raw material appropriately, a compound in which $Y^1$ is P(—R)$_2$, Al, Ga, As, Si—R, Ge—R, Sn—R, Sb, Sb=O, Sb=S, Sb(—R)$_2$, Sb to which orthochloranil is bonded, Bi, Bi=O, Bi=S, Bi(—R)$_2$, or Bi to which orthochloranil is bonded, and each of $X^1$, $X^2$, and $X^3$ is S can also be synthesized. In addition, a compound in which $Y^1$ is Sn—R can be converted into a compound in which Sn is another transition metal.

Specific examples of a solvent used in the above reactions include t-butylbenzene and xylene.

Furthermore, in general formula (2), adjacent groups among the substituents $R^1$ to $R^9$ of the ring a, ring b, and ring c may be bonded to each other to form an aryl ring or a heteroaryl ring together with the ring a, ring b, or ring c, and at least one hydrogen atom in the ring thus formed may be substituted by an aryl or a heteroaryl. Therefore, in a polycyclic aromatic compound represented by general formula (2), a ring structure constituting the compound changes according to a mutual bonding form of substituents in the ring a, ring b, and ring c as represented by formulas (2-1) and (2-2) of the following schemes (19) and (20). These compounds can be synthesized by applying the synthesis methods illustrated in the above schemes (1) to (18) to intermediates illustrated in the following schemes (19) and (20).

scheme (18)

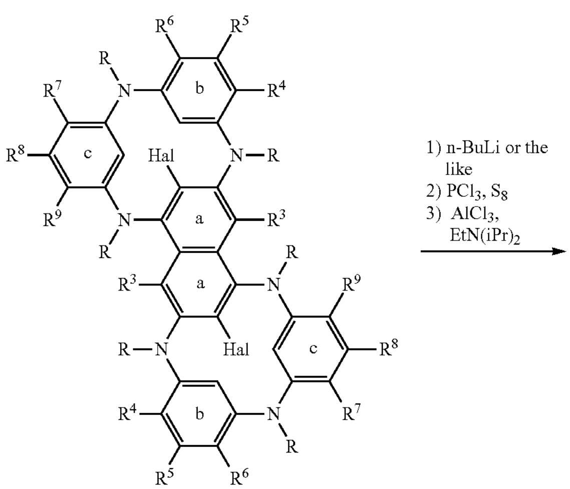

(intermediate)

scheme (19)

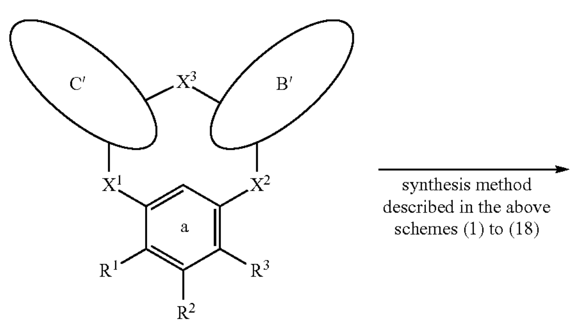

-continued

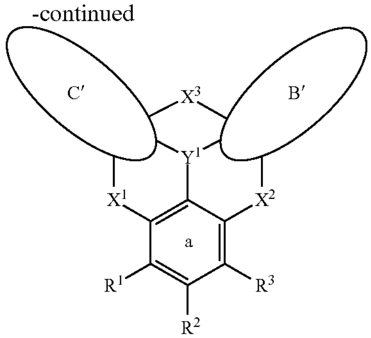

(2-1)

scheme (20)

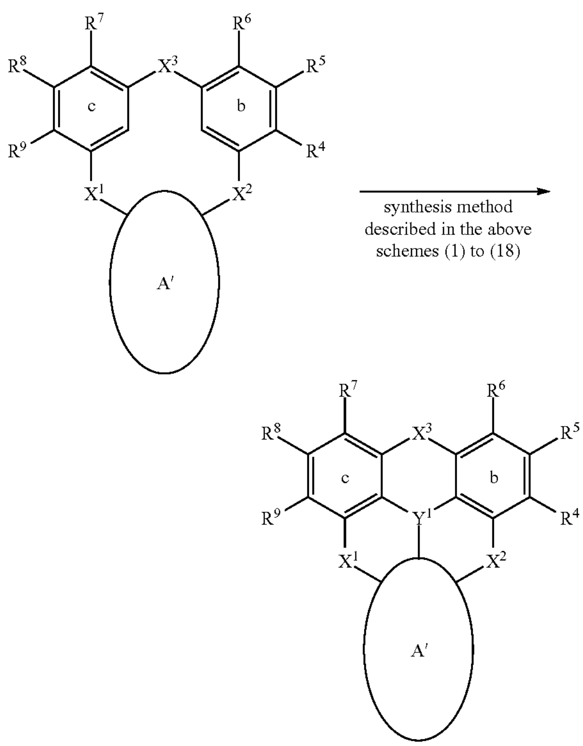

(2-2)

Ring A', ring B', and ring C' in the above formulas (2-1) and (2-2) each represent an aryl ring or a heteroaryl ring formed together with the ring a, ring b, and ring c by bonding adjacent groups among the substituents $R^1$ to $R^9$, respectively (may also be referred to as a fused ring obtained by fusing another ring structure to the ring a, ring b, or ring c). Incidentally, although not indicated in the formulas, there is also a compound in which all of the ring a, ring b, and ring c have been changed to the ring A', ring B', and ring C', respectively.

Furthermore, the provision that "R of the moiety N—R is bonded to the ring a, ring b, and/or ring c via —O—, —S—, —C(—R)$_2$—, >N—R, an arylene, or a single bond, or by fusing" in general formulas (2) can be expressed by a compound having a ring structure in which $X^1$ or $X^2$ is incorporated into the fused ring B' or fused ring C', represented by formula (2-3-1) of the following scheme (21), or a compound having a ring structure in which $X^1$ or $X^2$ is incorporated into the fused ring A', represented by formula (2-3-2) or (2-3-3). These compounds can be synthesized by applying the synthesis methods illustrated in the above schemes (1) to (18) to an intermediate illustrated in the following scheme (21).

scheme (21)

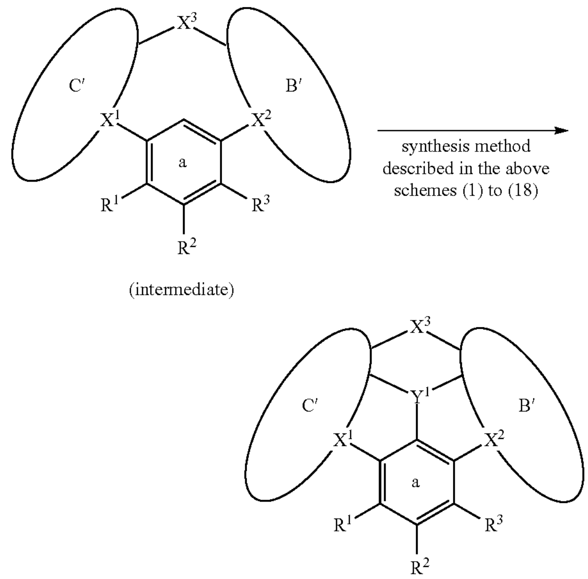

(2-3-1)

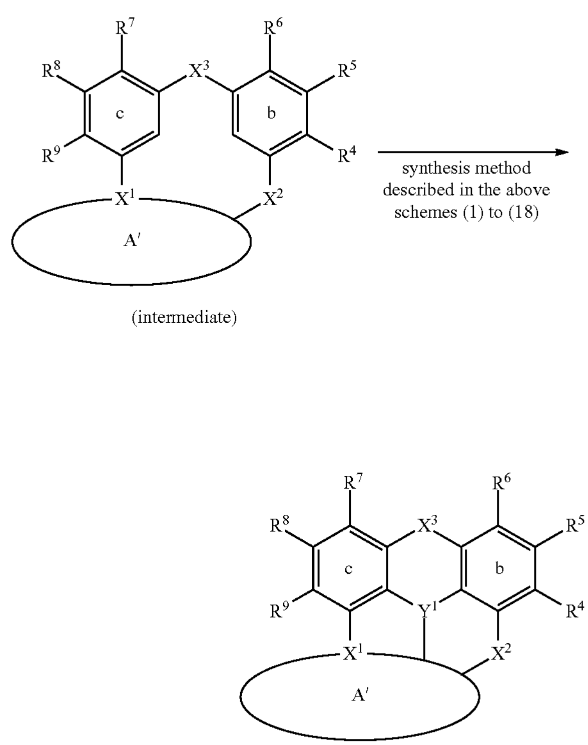

(2-3-2)

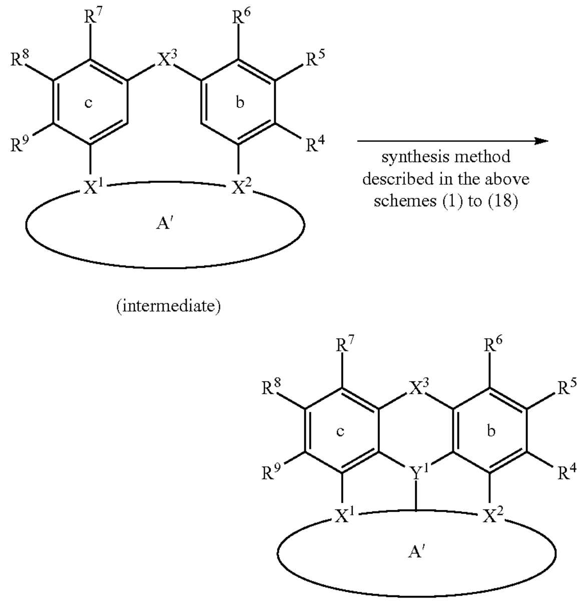

(intermediate)

(2-3-3)

Furthermore, the synthesis methods of the above schemes (1) to (14) and (17) to (21) illustrate an example of performing a Tandem Hetero-Friedel-Crafts reaction by ortho-metalating a hydrogen atom (or a halogen atom) among $X^1$, $X^2$, and $X^3$ with butyllithium or the like, before boron trichloride, boron tribromide, or the like is added. However, the reaction can also be advanced by adding boron trichloride, boron tribromide, or the like without performing ortho-metalation using butyllithium or the like.

Furthermore, in a case where $Y^1$ represents a phosphorus-based group, as illustrated in the following scheme (22) or (23), a desired product can be obtained by ortho-metalating a hydrogen atom (or a halogen atom) among $X^2$, and $X^3$ (>NR in the following formula) with n-butyllithium, sec-butyllithium, t-butyllithium, or the like, subsequently adding bisdiethylaminochlorophosphine thereto to perform lithium-phosphorus metal exchange, and then adding a Lewis acid such as aluminum trichloride thereto to induce a Tandem Phospha-Friedel-Crafts reaction. This reaction method is also described in WO 2010/104047 A (for example, page 27).

scheme (22)

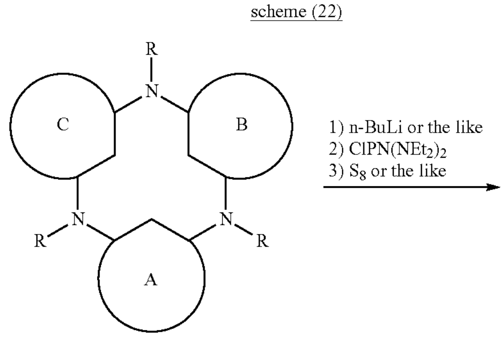

(intermediate 1)

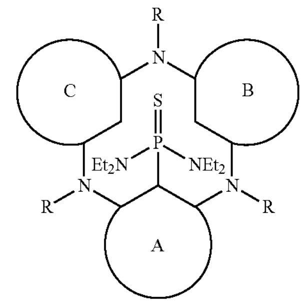

(intermediate 2)

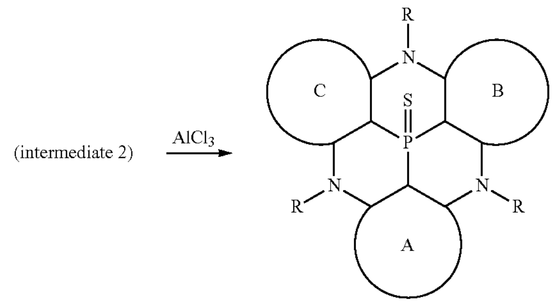

general formula (1) type compound scheme (23)

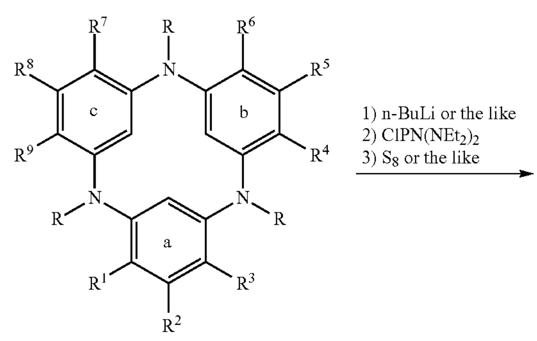

(intermediate 1)

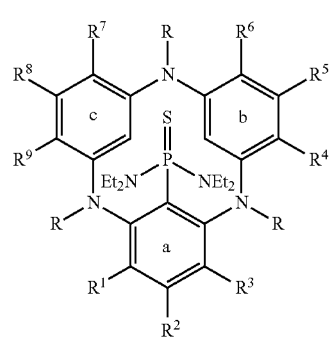

(intermediate 2)

-continued

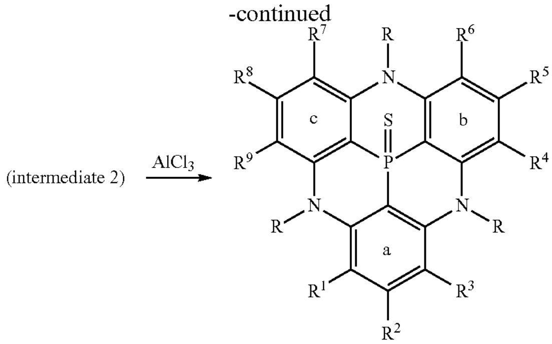

general formula (1) type compound

Incidentally, also in the above scheme (22) or (23), a dimer can be synthesized using an ortho-metalation reagent such as butyllithium in a molar amount twice the molar amount of an intermediate 1. Furthermore, a metal atom can be introduced to a desired position by introducing a halogen atom such as a bromine atom or a chlorine atom in advance to a position where a metal atom such as a lithium atom is desired to be introduced, and performing halogen-metal exchange.

Note that examples of an ortho-metalation reagent used in the above schemes (1) to (23) include an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Incidentally, examples of a metal exchanging reagent for metal-$Y^1$ used in the above schemes (1) to (23) include a halide of $Y^1$ such as trifluoride of $Y^1$, trichloride of $Y^1$, tribromide of $Y^1$, or triiodide of $Y^1$; an aminated halide of $Y^1$ such as $CIPN(NEt_2)_2$; an alkoxylated product of $Y^1$; and an aryloxylated product of $Y^1$.

Incidentally, examples of a Brønsted base used in the above schemes (1) to (23) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$ (Ar represents an aryl such as phenyl).

Examples of a Lewis acid used in the above schemes (1) to (23) include $AlCl_3$, $AlBr_3$, $AlF_3$, $BE_3$□$OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In the above schemes (1) to (23), a Brønsted base or a Lewis acid may be used in order to accelerate a Tandem Hetero Friedel-Crafts reaction. However, in a case where a halide of $Y^1$ such as trifluoride of $Y^1$, trichloride of $Y^1$, tribromide of $Y^1$, triiodide of $Y^1$ is used, an acid such as hydrogen fluoride, hydrogen chloride, hydrogen bromide, or hydrogen iodide is generated along with progress of an aromatic electrophilic substitution reaction. Therefore, it is effective to use a Brønsted base that captures an acid. On the other hand, in a case where an aminated halide of $Y^1$ or an alkoxylated product of $Y^1$ is used, an amine or an alcohol is generated along with progress of an aromatic electrophilic substitution reaction. Therefore, in many cases, it is not necessary to use a Brønsted base. However, leaving ability of an amino group or an alkoxy group is low, and therefore it is effective to use a Lewis acid that promotes leaving of these groups.

In addition, the polycyclic aromatic compound of the present invention and a dimer thereof include a compound in which at least apart of hydrogen atoms are substituted by cyano groups, a compound in which at least a part of hydrogen atoms are substituted by deuterium atoms, and a compound in which at least apart of hydrogen atoms are substituted by halogen atoms such as fluorine atoms or chlorine atoms. Such a compound or the like can be synthesized in a similar manner to the above using a raw material having a desired site cyanated, deuterated, fluorinated, or chlorinated.

The polycyclic aromatic compound according to the present invention and a dimer thereof can be used as a material for an organic device. Examples of the organic device include an organic electroluminescent element, an organic field effect transistor, and an organic thin film solar cell.

3. Organic Electroluminescent Element

The polycyclic aromatic compound according to the present invention and a dimer thereof can be used as, for example, a material for an organic electroluminescent element. Hereinafter, an organic EL element according to the present embodiment will be described in detail based on the drawings. FIG. 1 is a schematic cross-sectional view illustrating the organic EL element according to the present embodiment.

<Structure of Organic Electroluminescent Element>

An organic electroluminescent element 100 illustrated in FIG. 1 includes a substrate 101, a positive electrode 102 provided on the substrate 101, a hole injection layer 103 provided on the positive electrode 102, a hole transport layer 104 provided on the hole injection layer 103, a light emitting layer 105 provided on the hole transport layer 104, an electron transport layer 106 provided on the light emitting layer 105, an electron injection layer 107 provided on the electron transport layer 106, and a negative electrode 108 provided on the electron injection layer 107.

Incidentally, the organic electroluminescent element 100 may be configured, by reversing the manufacturing order, to include, for example, the substrate 101, the negative electrode 108 provided on the substrate 101, the electron injection layer 107 provided on the negative electrode 108, the electron transport layer 106 provided on the electron injection layer 107, the light emitting layer 105 provided on the electron transport layer 106, the hole transport layer 104 provided on the light emitting layer 105, the hole injection layer 103 provided on the hole transport layer 104, and the positive electrode 102 provided on the hole injection layer 103.

Not all of the above layers are essential. The configuration includes a configuration composed of the positive electrode 102, the light emitting layer 105, and the negative electrode 108 as a minimum constituent unit, and the hole injection layer 103, the hole transport layer 104, the electron transport layer 106, and the electron injection layer 107 are optionally provided. Each of the above layers may be formed of a single layer or a plurality of layers.

A form of layers constituting the organic electroluminescent element may be, in addition to the above structure form of "substrate/positive electrode/hole injection layer/hole transport layer/light emitting layer/electron transport layer/electron injection layer/negative electrode", a structure form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic Electroluminescent Element>

The substrate 101 serves as a support of the organic electroluminescent element 100, and usually, quartz, glass, metals, plastics, and the like are used therefor. The substrate 101 is formed into a plate shape, a film shape, or a sheet shape according to a purpose, and for example, a glass plate, a metal plate, a metal foil, a plastic film, and a plastic sheet are used therefor. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. The upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode Inorganic Electroluminescent Element>

The positive electrode 102 plays a role of injecting a hole into the light emitting layer 105. Incidentally, in a case where the hole injection layer 103 and/or the hole transport layer 104 are/is provided between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer including polythiophene such as poly(3-methylthiophene), polypyrrole, and polyaniline. In addition to these compounds, a material can be appropriately selected for use from materials used as a positive electrode of an organic electroluminescent element.

A resistance of a transparent electrode is not limited as long as a sufficient current can be supplied to light emission of a luminescent element. However, a low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of ITO can be arbitrarily selected according to a resistance value, but an ITO having a thickness of 50 to 300 nm is often used.

<Hole Injection Layer and Hole Transport Layer in Organic Electroluminescent Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 to the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron(III) chloride to the hole injection/transport material.

A hole injection/transport substance needs to efficiently inject/transport a hole from a positive electrode between electrodes to which an electric field is applied, and desirably has a high hole injection efficiency and transports an injected hole efficiently. For this purpose, a substance which has low ionization potential, large hole mobility, and further has excellent stability, and in which impurities that serve as traps are not easily generated at the time of manufacturing and at the time of use, is preferable.

As a material to form the hole injection layer 103 and the hole transport layer 104, a polycyclic aromatic compound represented by the above general formula (1) or a dimer thereof can be used. Furthermore, any compound can be selected for use from compounds that have been conventionally used as charge transport materials for holes in a photoconductive material, p-type semiconductors, and known compounds that are used in a hole injection layer and a hole transport layer of an organic electroluminescent element. Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-di amine, N,N'-dinaphthyl-N,N'-diphenyl-4,4'-diphenyl-1,1'-diamine, $N^4$,$N^{4'}$-diphenyl-$N^4$,$N^{4'}$-bis(9-phenyl-9H-carbazol-3-yl)-[1,1'-biphenyl]-4,4'-diamine, $N^4$,$N^4$,$N^{4'}$,$N^{4'}$-tetra [1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film required for manufacturing a luminescent element, can inject a hole from a positive electrode, and can further transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998" and "J. Blochwitz, M. Pheiffer, T. Fritz, K. Leo, Appl. Phys. Lett., 73(6), 729-731 (1998)"). These compounds generate a so-called hole by an electron migrating process in an electron-donating type base substance (hole transporting substance). Electroconductivity of the base substance depends on the number and mobility of the holes fairly significantly. Known examples of a matrix substance having a hole transporting characteristic include a benzidine derivative (TPD and the like), a starburst amine derivative (TDATA and the like), and a specific metal phthalocyanine (particularly, zinc phthalocyanine (ZnPc) and the like) (JP 2005-167175 A).

<Light Emitting Layer in Organic Electroluminescent Element>

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape, and exhibits a strong light emission (fluorescence) efficiency in a solid state. In the present invention, as the material for the light emitting layer, the polycyclic aromatic compound represented by the above general formula (1) or a dimer thereof can be used.

The light emitting layer may be formed of a single layer or a plurality of layers, and each layer is formed of a material for a light emitting layer (a host material and a dopant material). Each of the host material and the dopant material may be formed of a single kind, or a combination of a plurality of kinds. The dopant material may be included in the host material wholly or partially. Regarding a doping method, doping can be performed by a co-deposition method with a host material, or alternatively, a dopant material may be mixed in advance with a host material, and then vapor deposition may be performed simultaneously.

The amount of use of a host material depends on the kind of the host material, and is only required to be determined according to a characteristic of the host material. The reference of the amount of use of a host material is preferably from 50 to 99.999% by weight, more preferably from 80 to 99.95% by weight, and still more preferably from 90 to 99.9% by weight with respect to the total amount of a material for a light emitting layer. The polycyclic aromatic compound represented by the above general formula (1) or a dimer thereof can also be used as a host material.

The amount of use of a dopant material depends on the kind of the dopant material, and is only required to be determined according to a characteristic of the dopant material. The reference of the amount of use of a dopant is preferably from 0.001 to 50% by weight, more preferably from 0.05 to 20% by weight, and still more preferably from 0.1 to 10% by weight with respect to the total amount of a material for a light emitting layer. The amount of use within the above range is preferable, for example, from a viewpoint of being able to prevent a concentration quenching phenomenon. The polycyclic aromatic compound represented by the above general formula (1) or a dimer thereof can also be used as a dopant material.

Examples of a host material that can be used in combination with the polycyclic aromatic compound represented by the above general formula (1) or a dimer thereof include a fused ring derivative of anthracene, pyrene, or the like that has been traditionally known as a luminous body, a bisstyryl derivative such as a bisstyrylanthracene derivative or a distyrylbenzene derivative, a tetraphenylbutadiene derivative, a cyclopentadiene derivative, a fluorene derivative, and a benzofluorene derivative.

Furthermore, a dopant material that can be used in combination with the polycyclic aromatic compound represented by the above general formula (1) or a dimer thereof is not particularly limited, and existing compounds can be used. The dopant material can be selected from various materials depending on a desired color of emitted light. Specific examples of the dopant material include a fused ring derivative of phenanthrene, anthracene, pyrene, tetracene, pentacene, perylene, naphthopyrene, dibenzopyrene, rubrene, chrysene, or the like, a benzoxazole derivative, a benzothiazole derivative, a benzimidazole derivative, a benzotriazole derivative, an oxazole derivative, an oxadiazole derivative, a triazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JP 1-245087 A), a bisstyrylarylene derivative (JP 2-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

If the examples are listed for each of light colors, examples of a blue to bluish green dopant material include an aromatic hydrocarbon compound such as naphthalene, anthracene, phenanthrene, pyrene, triphenylene, perylene, fluorene, indene, or chrysene, and a derivative thereof, an aromatic heterocyclic compound such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, and a derivative thereof, a distyrylbenzene derivative, a tetraphenylbutadiene derivative, a stilbene derivative, an aldazine derivative, a coumarin derivative, an azole derivative such as imidazole, triazole, thiadiazole, carbazole, oxazole, oxadiazole, or triazole, and a metal complex thereof, and an aromatic amine derivative represented by N,N'-diphenyl-N,N'-di(3-methylphenyl)-4,4'-diphenyl-1,1'-di amine.

Furthermore, examples of a green to yellow dopant material include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples of the green-yellow dopant material include compounds obtained by introducing a substituent capable of shifting a wavelength to a longer wavelength, such as an aryl, a heteroaryl, an arylvinyl, an amino, or cyano to the above compounds listed as examples of the blue to bluish green dopant material.

Furthermore, examples of an orange to red dopant material include a naphthalimide derivative such as bis(diisopropylphenyl)perylene tetracarboxylic acid imide, a perinone derivative, a rare earth complex such as a Eu complex containing acetylacetone, benzoylacetone, phenanthroline, or the like as a ligand, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples of the orange to red dopant material include compounds obtained by introducing a substituent capable of shifting a wavelength to a longer wavelength, such as an aryl, a heteroaryl, an arylvinyl, an amino, or cyano to the above compounds listed as examples of the blue to bluish green and green to yellow dopant materials.

In addition to the above compounds, a dopant can be appropriately selected for use from compounds and the like described in "Kagaku Kogyo (Chemical Industry)", June 2004, p. 13, and reference documents and the like described therein.

Among the dopant materials described above, an amine having a stilbene structure, a perylene derivative, a borane derivative, an aromatic amine derivative, a coumarin derivative, a pyran derivative, and a pyrene derivative are particularly preferable.

An amine having a stilbene structure is represented by the following formula, for example.

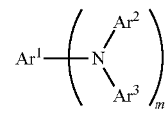

In the formula, $Ar^1$ represents an m-valent group derived from an aryl having 6 to 30 carbon atoms, $Ar^2$ and $Ar^3$ each independently represent an aryl having 6 to 30 carbon atoms, at least one of $Ar^1$ to $Ar^3$ has a stilbene structure, $Ar^1$ to $Ar^3$ may be substituted, and m represents an integer of 1 to 4.

The amine having a stilbene structure is more preferably a diaminostilbene represented by the following formula.

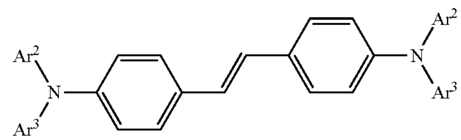

In the formula, $Ar^2$ and $Ar^3$ each independently represent an aryl having 6 to 30 carbon atoms, and $Ar^2$ and $Ar^3$ may be substituted.

Specific examples of the aryl having 6 to 30 carbon atoms include benzene, naphthalene, acenaphthylene, fluorene, phenalene, phenanthrene, anthracene, fluoranthene, triphenylene, pyrene, chrysene, naphthacene, perylene, stilbene, distyrylbenzene, distyrylbiphenyl, and distyrylfluorene.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis[4"-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Furthermore, amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl)perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Furthermore, perylene derivatives described in JP 11-97178 A, JP 2000-133457 A, JP 2000-26324 A, JP 2001-267079 A, JP 2001-267078A, JP2001-267076A, JP 2000-34234 A, JP2001-267075 A, JP 2001-217077 A, and the like may also be used.

Examples of the borane derivative include 1,8-diphenyl-10-(dimesitylboryl)anthracene, 9-phenyl-10-(dimesitylboryl)anthracene, 4-(9'-anthryl)dimesitylborylnaphthalene, 4-(10'-phenyl-9'-anthryl)dimesitylborylnaphthalene, 9-(dimesitylboryl)anthracene, 9-(4'-biphenylyl)-10-(dimesitylboryl)anthracene, and 9-(4'-(N-carbazolyl)phenyl)-10-(dimesitylboryl)anthracene.

Furthermore, borane derivatives described in WO 2000/40586 A and the like may also be used.

An aromatic amine derivative is represented by the following formula, for example.

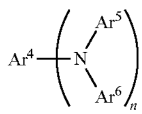

In the formula, $Ar^4$ represents an n-valent group derived from an aryl having 6 to 30 carbon atoms, $Ar^5$ and $Ar^6$ each independently represent an aryl having 6 to 30 carbon atoms, $Ar^4$ to $Ar^6$ may be substituted, and n represents an integer of 1 to 4.

Particularly, an aromatic amine derivative in which $Ar^4$ represents a divalent group derived from anthracene, chrysene, fluorene, benzofluorene, or pyrene, $Ar^5$ and $Ar^6$ each independently represent an aryl having 6 to 30 carbon atoms, $Ar^4$ to $Ar^6$ may be substituted, and n represents 2, is more preferable.

Specific examples of the aryl having 6 to 30 carbon atoms include benzene, naphthalene, acenaphthylene, fluorene phenalene, phenanthrene, anthracene, fluoranthene, triphenylene, pyrene, chrysene, naphthacene, perylene, and pentacene.

Examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra(m-tolyl)chrysene-6,12-diamine, N,N,N',N'-tetrakis(4-isopropylphenyl)chrysene-6,12-diamine, N,N,N',N'-tetra(naphthalen-2-yl)chrysene-6,12-dimine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Furthermore, examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1$,$N^6$-diphenyl-$N^1$,$N^6$-bis(4-trimethylsilanyl-phenyl)-1H,8H-pyrene-1,6-diamine.

Furthermore, examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl) anthracene-9,10-diamine, N,N'-diphenyl-N,N'-bis(4-isopropylphenyl)anthracene-9,10-di amine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl)anthracene-9,10-diamine, 2,6-di-t-butyl-N,N'-bis(4-isopropylphenyl)-N,N'-di(p-tolyl) anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl) anthracene-9,10-diamine, 9,10-bis(4-diphenylamino-phenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl) anthracene, 10-diphenylamino-9-(4-diphenylamino-1-naphthyl)anthracene, and 10-diphenylamino-9-(6-diphenylamino-2-naphthyl)anthracene.

Furthermore, other examples include [4-(4-diphenylamino-phenyl)naphthalen-1-yl]-diphenylamine, [6-(4-diphenylamino-phenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, and 4,4"-bis[6-diphenylaminonaphthalen-2-yl]-p-terphenyl.

Furthermore, an aromatic amine derivative described in JP 2006-156888 A or the like may also be used.

Examples of the coumarin derivative include coumarin-6 and coumarin-334.

Furthermore, a coumarin derivative described in JP 2004-43646 A, JP 2001-76876 A, JP 6-298758 A, or the like may also be used.

Examples of the pyran derivative include DCM and DCJTB described below.

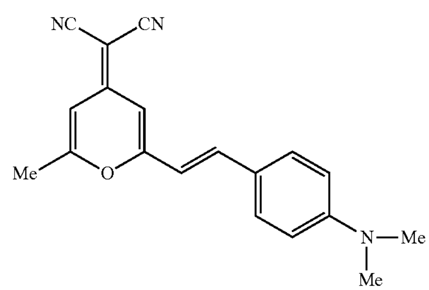

DCM

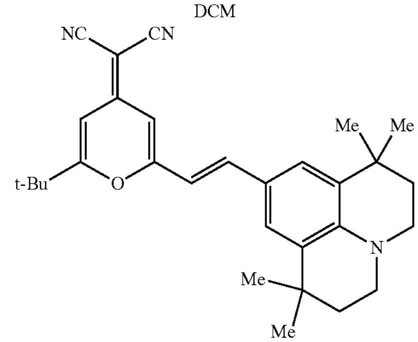

DCJTB

Furthermore, a pyran derivative described in JP 2005-126399 A, JP 2005-097283 A, JP 2002-234892 A, JP 2001-220577 A, JP 2001-081090 A, JP 2001-052869 A, or the like may also be used.

<Electron Injection Layer and Electron Transport Layer in Organic Electroluminescent Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymer binder.

An electron injection/transport layer is a layer which manages injection of an electron from a negative electrode and further manages transport of an electron, and is desirably a layer which has a high electron injection efficiency and can efficiently transport an injected electron. For this purpose, a substance which has high electron affinity and large electron mobility, and further has excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, the electron injection/transport layer has an effect of enhancing a light emission efficiency equally to a material having high electron transporting ability. Therefore, the electron injection/transport layer according to the present embodiment may also include a function of a layer that can efficiently prevent migration of a hole.

As the material to form the electron transport layer 106 or the electron injection layer 107 (electron transport material), the polycyclic aromatic compound represented by the above general formula (1) or a dimer thereof can be used. Furthermore, a material can be arbitrarily selected for use from compounds that have been conventionally used as electron transfer compounds in a photoconductive material, and known compounds that are used in an electron injection layer and an electron transport layer of an organic electroluminescent element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2': 6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone metal complex, a flavonol metal complex, and a benzoquinoline metal complex.

The materials described above are used singly, but may also be used in a mixture with other materials.

Among the materials described above, a quinolinol-based metal complex, a bipyridine derivative, a phenanthroline derivative, and a borane derivative are preferable.

The quinolinol-based metal complex is a compound represented by the following general formula (E-1).

(E-1)

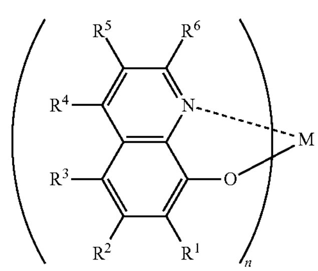

In the formula, $R^1$ to $R^6$ each represent a hydrogen atom or a substituent, M represents Li, Al, Ga, Be, or Zn, and n represents an integer of 1 to 3.

Specific examples of the quinolinol-based metal complex include 8-quinolinollithium, tris(8-quinolinolato)aluminum, tris(4-methyl-8-quinolinolato)aluminum, tris(5-methyl-8-quinolinolato)aluminum, tris(3,4-dimethyl-8-quiolinolato) aluminum, tris(4,5-dimethyl-8-quinolinolato)aluminum, tris (4,6-dimethyl-8-quinolinolato)aluminum, bis(2-methyl-8-quinolinolato) (phenolato)aluminum, bis(2-methyl-8-quinolinolato) (2-methylphenolato)aluminum, bis(2-methyl-8-quinolinolato) (3-methylphenolato)aluminum, bis (2-methyl-8-quinolinolato) (4-methylphenolato)aluminum, bis(2-methyl-8-quinolinolato) (2-phenylphenolato)aluminum, bis(2-methyl-8-quinolinolato) (3-phenylphenolato) aluminum, bis(2-methyl-8-quinolinolato) (4-phenylphenolato)aluminum, bis(2-methyl-8-quinolinolato) (2,3-dimethylphenolato)aluminum, bis(2-methyl-8-quinolinolato) (2,6-dimethylphenolato)aluminum, bis(2- methyl-8-quinolinolato) (3,4-dimethylphenolato)aluminum, bis(2-methyl-8-quinolinolato) (3,5-dimethylphenolato)aluminum, bis(2-methyl-8-quinolinolato) (3,5-di-t-butylphenolato)aluminum, bis(2-methyl-8-quinolinolato) (2,6-diphenylphenolato)aluminum, bis(2-methyl-8-quinolinolato) (2,4,6-triphenylphenolato)aluminum, bis(2-methyl-8-quinolinolato) (2,4,6-trimethylphenolato)aluminum, bis(2-methyl-8-quinolinolato) (2,4,5,6-tetramethylphenolato) aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato)aluminum, bis(2,4-dimethyl-8-quinolinolato) (3-phenylphenolato)aluminum, bis(2,4-dimethyl-8-quinolinolato) (4-phenylphenolato)aluminum, bis(2,4-dimethyl-8-quinolinolato) (3,5-dimethylphenolato)aluminum, bis(2,4-dimethyl-8-quinolinolato) (3,5-di-t-butylphenolato) aluminum, bis(2-methyl-8-quinolinolato)aluminum-μ-oxo-bis(2-methyl-8-quinolinolato)aluminum, bis(2,4-dimethyl-8-quinolinolato)aluminum-μ-oxo-bis(2,4-dim ethyl-8-quinolinolato)aluminum, bis(2-methyl-4-ethyl-8-quinolinolato)aluminum-μ-oxo-bis(2-m ethyl-4-ethyl-8-quinolinolato)aluminum, bis(2-methyl-4-methoxy-8-quinolinolato)aluminum-μ-oxo-bis(2-methyl-4-methoxy-8-quinolinolato)aluminum, bis(2-methyl-5-cyano-8-quinolinolato)aluminum-μ-oxo-bis(2-m ethyl-5-cyano-8-quinolinolato)aluminum, bis(2-methyl-5-trifluoromethyl-8-quinolinolato)aluminum-μ-oxo-bis(2-methyl-5-trifluoromethyl-8-quiolinolato)aluminum, and bis(10-hydroxybenzo[h]quinoline)beryllium.

The bipyridine derivative is a compound represented by the following general formula (E-2).

(E-2)

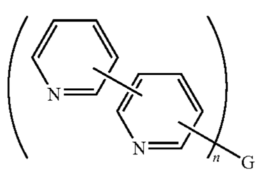

In the formula, G represents a simple bond or an n-valent linking group, and n represents an integer of 2 to 8. A carbon atom not used for a pyridine-pyridine bond or a pyridine-G bond may be substituted.

Examples of G in general formula (E-2) include groups represented by the following structural formulas. Note that R's in the following structural formulas each independently represent a hydrogen atom, methyl, ethyl, isopropyl, cyclohexyl, phenyl, 1-naphthyl, 2-naphthyl, biphenylyl, or terphenylyl.

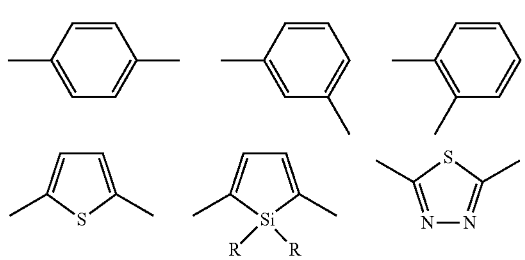

-continued

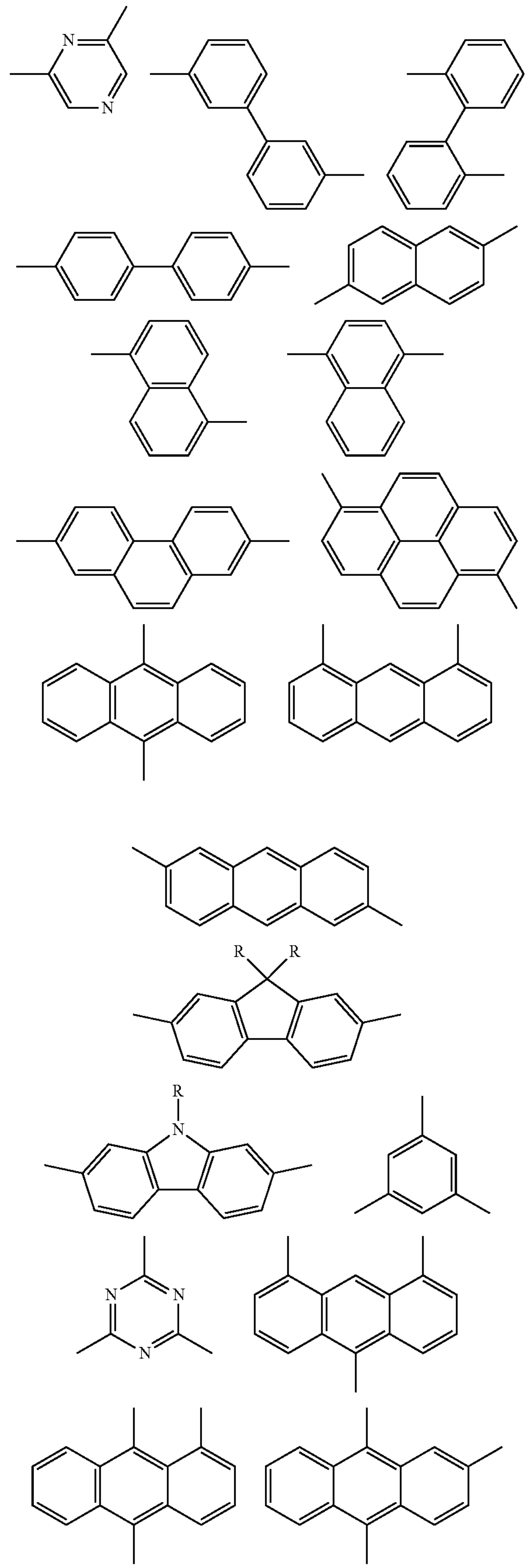

-continued

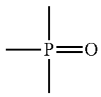

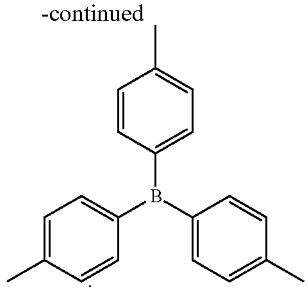

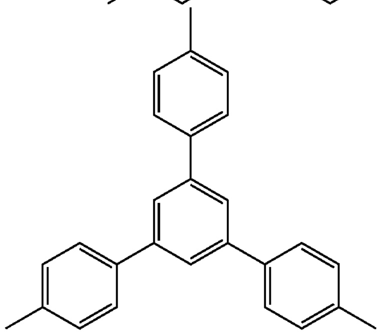

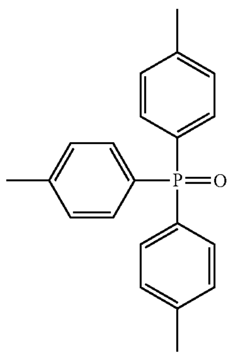

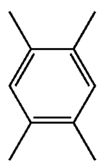

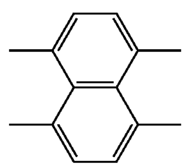

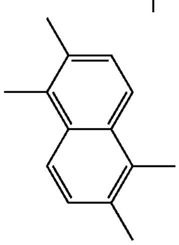

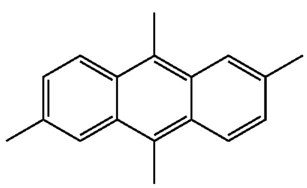

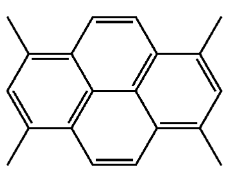

Specific examples of the pyridine derivative include 2,5-bis(2,2'-pyridin-6-yl)-1,1-dimethyl-3,4-diphenylsilole, 2,5-bis(2,2'-pyridin-6-yl)-1,1-dimethyl-3,4-dimesitylsilole, 2,5-bis(2,2'-pyridin-5-yl)-1,1-dimethyl-3,4-diphenylsilole, 2,5-bis(2,2'-pyridin-5-yl)-1,1-dimethyl-3,4-dimesitylsilole, 9,10-di(2,2'-pyridin-6-yl)anthracene, 9,10-di(2,2'-pyridin-5-yl)anthracene, 9,10-di(2,3'-pyridin-6-yl)anthracene, 9,10-di (2,3'-pyridin-5-yl)anthracene, 9,10-di(2,3'-pyridin-6-yl)-2-phenylanthracene, 9,10-di(2,3'-pyridin-5-yl)-2-phenylanthracene, 9,10-di(2,2'-pyridin-6-yl)-2-phenylanthracene, 9,10-di(2,2'-pyridin-5-yl)-2-phenylanthracene, 9,10-di(2,4'-pyridin-6-yl)-2-phenylanthracene, 9,10-di(2,4'-pyridin-5-yl)-2-phenylanthracene, 9,10-di(3,4'-pyridin-6-yl)-2-phenylanthracene, 9,10-di(3,4'-pyridin-5-yl)-2-phenylanthracene, 3,4-diphenyl-2,5-di(2,2'-pyridin-6-yl)thiophene, 3,4-diphenyl-2,5-di(2,3'-pyridin-5-yl)thiophene, and 6',6''-di(2-pyridyl)-2,2':4',4'':2'',2'''-quaterpyridine.

The phenanthroline derivative is a compound represented by the following general formula (E-3-1) or (E-3-2).

(E-3-1)

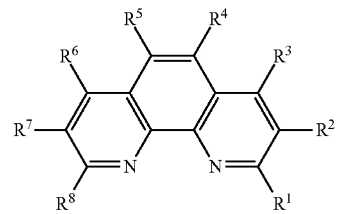

(E-3-2)

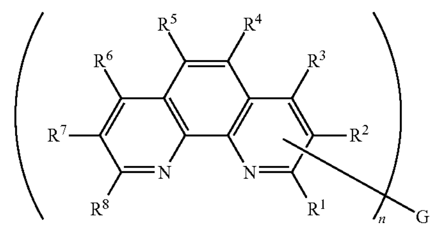

In the formula, $R^1$ to $R^8$ each represent a hydrogen atom or a substituent, adjacent groups may be bonded to each other to form a fused ring, G represents a simple bond or an n-valent linking group, and n represents an integer of 2 to 8. Examples of G of general formula (E-3-2) include groups represented by the structural formulas described as G in the section of the bipyridine derivative.

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bi(1,10-phenanthrolin-5-yl), bathocuproine, and 1,3-bis(2-phenyl-1,10-phenanthrolin-9-yl)benzene.

Particularly, a case of using a phenanthroline derivative in an electron transport layer or an electron injection layer will be described. In order to obtain stable light emission over a long time, a material having excellent thermal stability or thin film formability is desired. Among phenanthroline derivatives, a phenanthroline derivative in which a substituent itself has a three-dimensional steric structure, a phenanthroline derivative having a three-dimensional steric structure as a result of steric repulsion between a substituent and a phenanthroline skeleton or between a substituent and an adjacent substituent, or a phenanthroline derivative having a plurality of phenanthroline skeletons linked together, is preferable. Furthermore, in a case of linking a plurality of phenanthroline skeletons, a compound containing a conjugated bond, a substituted or unsubstituted aromatic hydrocarbon, or a substituted or unsubstituted heterocyclic aromatic ring in a linked unit, is more preferable.

The borane derivative is a compound represented by the following general formula (E-4), specific examples of which are disclosed in JP 2007-27587 A.

(E-4)

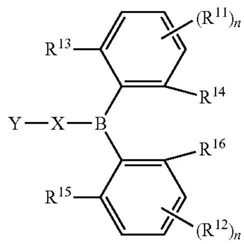

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3.

Among compounds represented by the above general formula (E-4), a compound represented by the following general formula (E-4-1) is preferable, and compounds represented by the following general formulas (E-4-1-1) to (E-4-1-4) are more preferable. Specific examples of the compounds include 9-[4-(4-dimesitylborylnaphthalen-1-yl)phenyl]carbazole and 9-[4-(4-dimesitylborylnaphthalen-1-yl)naphthalen-1-yl]carbazole.

(E-4-1)

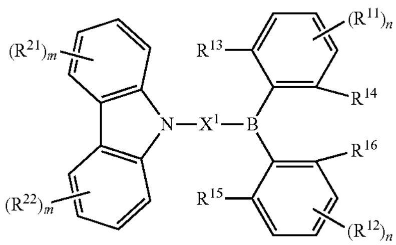

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and cyano, $X^1$ represents an optionally substituted arylene having 20 or fewer carbon atoms, n's each independently represent an integer of 0 to 3, and m's each independently represent an integer of 0 to 4.

(E-4-1-1)

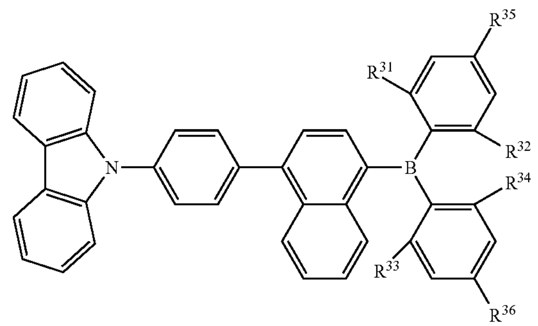

(E-4-1-2)

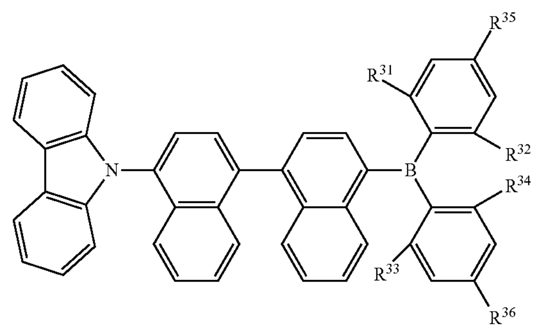

(E-4-1-3)

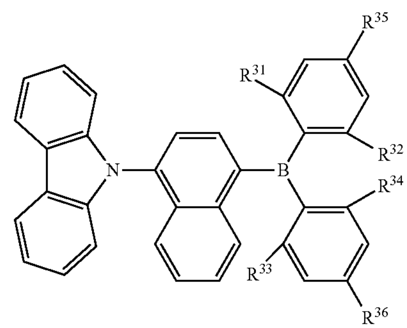

(E-4-1-4)

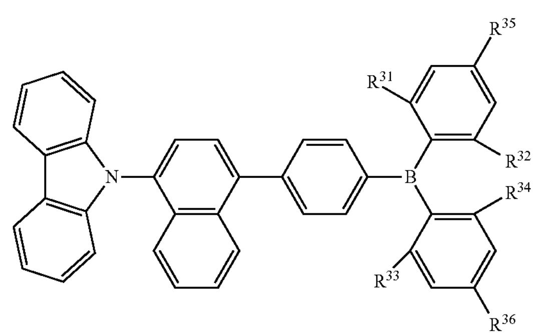

In each of the formulas, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

Among compounds represented by the above general formula (E-4), a compound represented by the following general formula (E-4-2) is preferable, and a compound represented by the following general formula (E-4-2-1) is more preferable.

(E-4-2)

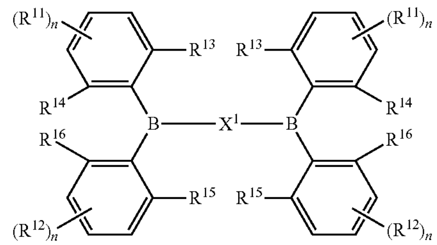

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, $X^1$ represents an optionally substituted arylene having 20 or fewer carbon atoms, and n's each independently represent an integer of 0 to 3.

(E-4-2-1)

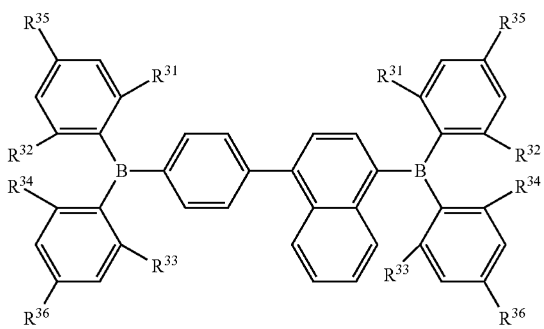

In the formula, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

Among compounds represented by the above general formula (E-4), a compound represented by the following general formula (E-4-3) is preferable, and a compound represented by the following general formula (E-4-3-1) or (E-4-3-2) is more preferable.

(E-4-3)

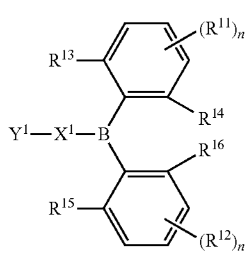

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, $X^1$ represents an optionally substituted arylene having 10 or fewer carbon atoms, $Y^1$ represents an optionally substituted aryl having 14 or fewer carbon atoms, and n's each independently represent an integer of 0 to 3.

(E-4-3-1)

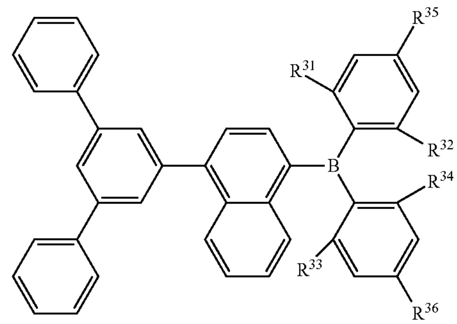

(E-4-3-2)

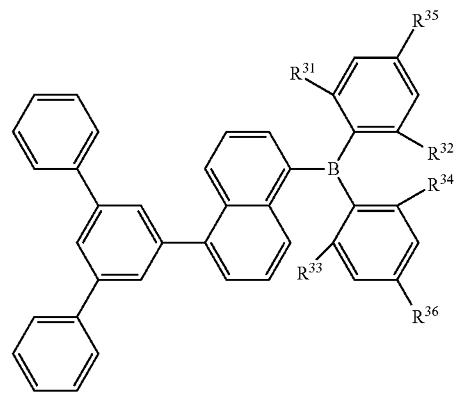

In each of the formulas, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

The benzimidazole derivative is a compound represented by the following general formula (E-5).

(E-5)

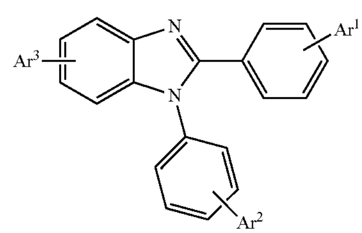

In the formula, $Ar^1$ to $Ar^3$ each independently represent a hydrogen atom or an optionally substituted aryl having 6 to 30 carbon atoms. Particularly, a benzimidazole derivative in which $Ar^1$ represents an anthryl which may be substituted is preferable.

Specific examples of the aryl having 6 to 30 carbon atoms include phenyl, 1-naphthyl, 2-naphthyl, acenaphthylen-1-yl, acenaphthylen-3-yl, acenaphthylen-4-yl, acenaphthylen-5-yl, fluoren-1-yl, fluoren-2-yl, fluoren-3-yl, fluoren-4-yl, fluoren-9-yl, phenalen-1-yl, phenalen-2-yl, 1-phenanthryl, 2-phenanthryl, 3-phenanthryl, 4-phenanthryl, 9-phenanthryl, 1-anthryl, 2-anthryl, 9-anthryl, fluoranthen-1-yl, fluoranthen-2-yl, fluoranthen-3-yl, fluoranthen-7-yl, fluoranthen-8-yl, triphenylen-1-yl, triphenylen-2-yl, pyren-1-yl, pyren-2-yl, pyren-4-yl, chrysen-1-yl, chrysen-2-yl, chrysen-3-yl, chrysen-4-yl, chrysen-5-yl, chrysen-6-yl, naphthacen-1-yl, naphthacen-2-yl, naphthacen-5-yl, perylen-1-yl, perylen-2-yl, perylen-3-yl, pentacen-1-yl, pentacen-2-yl, pentacen-5-yl, and pentacen-6-yl.

Specific examples of the benzimidazole derivative include 1-phenyl-2-(4-(10-phenylanthracen-9-yl)phenyl)-1H-benzo [d]imidazole,
2-(4-(10-(naphthalen-2-yl)anthracen-9-yl)phenyl)-1-phenyl-1H-benzo[d]imidazole,
2-(3-(10-(naphthalen-2-yl)anthracen-9-yl)phenyl)-1-phenyl-1H-benzo[d]imidazole,
5-(10-(naphthlen-2-yl)anthracen-9-yl)-1,2-diphenyl-1H-benzo [d]imidazole,
1-(4-(10-(naphthalen-2-yl)anthracen-9-yl)phenyl)-2-phenyl-1H-benzo[d]imidazole,
2-(4-(9,10-di(naphthalen-2-yl)anthracen-2-yl)phenyl)-1-phen yl-1H-benzo[d]imidazole,
1-(4-(9,10-di(naphthalen-2-yl)anthracen-2-yl)phenyl)-2-phen yl-1H-benzo[d]imidazole, and
5-(9,10-di(naphthalen-2-yl)anthracen-2-yl)-1,2-diphenyl-1H-benzo[d]imidazole.

An electron transport layer or an electron injection layer may further contain a substance capable of reducing a material to form the electron transport layer or the electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV); and an alkaline earth metal such as Ca (work function 2.9 eV), Sr (work function 2.0 to 2.5 eV), or Ba (work function 2.52 eV). A substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

<Negative Electrode Inorganic Electroluminescent Element>

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to a material to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and an alloy thereof (a magnesium-silver alloy, a magnesium-indium alloy, an aluminum-lithium alloy such as lithium fluoride/aluminum, or the like) are preferable. In order to enhance element characteristics by increasing an electron injection efficiency, lithium, sodium, potassium, cesium, calcium, magnesium, or an alloy containing these low work function-metals is effective. However, many of these low work function-metals are generally unstable in air. In order to ameliorate this problem, for example, a method using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. A method for manufacturing these electrodes is not particularly limited as long as being able to obtain conduction, and examples thereof include resistance heating vapor deposition, electron beam vapor deposition, sputtering, ion plating, and coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin, as a polymer binder.

<Method for Manufacturing Organic Electroluminescent Element>

Each layer constituting an organic electroluminescent element can be formed by forming thin films of materials to constitute each layer by a method such as a vapor deposition method, resistance heating vapor deposition, electron beam vapor deposition, sputtering, a molecular lamination method, a printing method, a spin coating method, a casting method, or a coating method. The film thickness of each layer thus formed is not particularly limited, and can be appropriately set according to a property of a material, but is usually within a range of 2 nm to 5000 nm. The film thickness can be usually measured using a crystal oscillation type film thickness measuring apparatus or the like. In a case of forming a thin film using a vapor deposition method, vapor deposition conditions depend on the kind of a material, an intended crystal structure of a film, an association structure, and the like. It is preferable to appropriately set the vapor deposition conditions generally in ranges of a boat heating temperature of +50 to +400° C., a degree of vacuum of $10^{-6}$ to $10^{-3}$ Pa, a rate of vapor deposition of 0.01 to 50 nm/sec, a substrate temperature of −150 to +300° C., and a film thickness of 2 nm to 5 μm.

Next, as an example of a method for manufacturing an organic electroluminescent element, a method for manufacturing an organic electroluminescent element formed of positive electrode/hole injection layer/hole transport layer/light emitting layer including host material and dopant material/electron transport layer/electron injection layer/negative electrode will be described. A thin film of a positive electrode material is formed on an appropriate substrate by a vapor deposition method or the like to manufacture a positive electrode, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is further formed by a vapor deposition method or the like to obtain a negative electrode. An intended organic electroluminescent element is thereby obtained. Incidentally, in manufacturing the above organic electroluminescent element, it is also possible to manufacture the element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic electroluminescent element thus obtained, it is only required to apply the voltage by using a positive electrode as a positive polarity and using a negative electrode as a negative polarity. By applying a voltage of about 2 to 40 V, light emission can be observed from a transparent or semi-transparent electrode side (the positive electrode or the negative electrode, or both the electrodes). This organic electroluminescent element also emits light also in a case where a pulse current or an alternating current is applied. Note that a waveform of an alternating current applied may be any waveform.

<Application Examples of Organic Electroluminescent Element>

The present invention can also be applied to a display apparatus including an organic electroluminescent element, a lighting apparatus including an organic electroluminescent element, or the like.

The display apparatus or lighting apparatus including an organic electroluminescent element can be manufactured by a known method such as connecting the organic electroluminescent element according to the present embodiment to a known driving apparatus, and can be driven by appropriately using a known driving method such as direct driving, pulse driving, or alternating driving.

Examples of the display apparatus include a panel display such as a color flat panel display; and a flexible display such as a flexible color organic electroluminescent (EL) display (see, for example, JP 10-335066 A, JP 2003-321546 A, and JP 2004-281086 A). Examples of a display method of the display include a matrix method and/or a segment method. Note that the matrix display and the segment display may co-exist in the same panel.

In the matrix, pixels for display are arranged two-dimensionally as in a lattice form or a mosaic form, and characters or images are displayed by an assembly of pixels. The shape or size of an pixel depends on intended use. For example, for display of images and characters of a personal computer, a monitor, or a television, square pixels each having a size of 300 μm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green, and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method and the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-119211 A). The backlight is mainly used for enhancing visibility of a display apparatus that is not self-luminous, and is used in a liquid crystal display apparatus, a timepiece, an audio apparatus, an automotive panel, a display plate, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

4. Other Organic Devices

The polycyclic aromatic compound according to the present invention and a dimer thereof can be used for manufacturing an organic field effect transistor, an organic thin film solar cell, or the like, in addition to the organic electroluminescent element described above.

The organic field effect transistor is a transistor that controls a current by means of an electric field generated by voltage input, and is provided with a source electrode, a drain electrode, and a gate electrode. When a voltage is applied to the gate electrode, an electric field is generated, and the organic field effect transistor can control a current by arbitrarily damming a flow of electrons (or holes) that flow between the source electrode and the drain electrode. The field effect transistor can be easily miniaturized compared with a simple transistor (bipolar transistor), and is often used as an element constituting an integrated circuit or the like.

The structure of the organic field effect transistor is usually as follows. That is, a source electrode and a drain electrode are provided in contact with an organic semiconductor active layer formed using the polycyclic aromatic compound according to the present invention and a dimer thereof, and it is only required that a gate electrode is further provided so as to interpose an insulating layer (dielectric layer) in contact with the organic semiconductor active layer. Examples of the element structure include the following structures.

(1) Substrate/gate electrode/insulator layer/source electrode and drain electrode/organic semiconductor active layer (2) Substrate/gate electrode/insulator layer/organic semiconductor active layer/source electrode and drain electrode (3) Substrate/organic semiconductor active layer/source electrode and drain electrode/insulator layer/gate electrode (4) Substrate/source electrode and drain electrode/organic semiconductor active layer/insulator layer/gate electrode An organic field effect transistor thus configured can be applied as a pixel driving switching element of an active matrix driving type liquid crystal display or an organic electroluminescent display, or the like.

An organic thin film solar cell has a structure in which a positive electrode such as ITO, a hole transport layer, a photoelectric conversion layer, an electron transport layer, and a negative electrode are laminated on a transparent substrate of glass or the like. The photoelectric conversion layer has a p-type semiconductor layer on the positive electrode side, and has an n-type semiconductor layer on the negative electrode side. The polycyclic aromatic compound according to the present invention and a dimer thereof can be used as a material for a hole transport layer, a p-type semiconductor layer, an n-type semiconductor layer, or an electron transport layer, depending on physical properties thereof. The polycyclic aromatic compound according to the present invention and a dimer thereof can function as a hole transport material or an electron transport material in an organic thin film solar cell. The organic thin film solar cell may appropriately include a hole blocking layer, an electron blocking layer, an electron injection layer, a hole injection layer, a smoothing layer, and the like, in addition to the members described above. For the organic thin film solar cell, known materials used for an organic thin film solar cell can be appropriately selected and used in combination.

EXAMPLES

Hereinafter, the present invention will be specifically described with reference to Examples, but the present invention is not limited by these Examples in any way. Compounds synthesized in Examples are illustrated below.

(1-1)

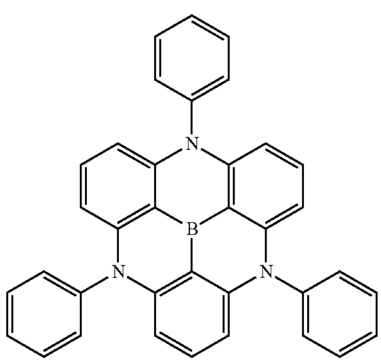

-continued (1-241)

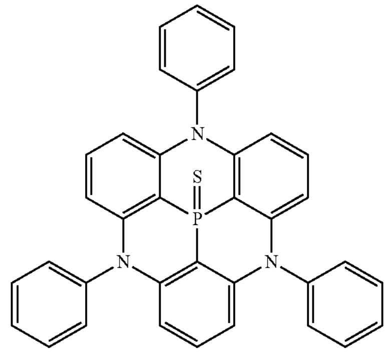

(1-421)

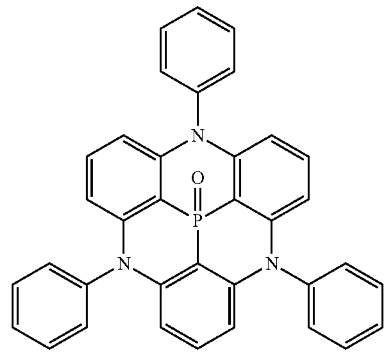

(1-601)

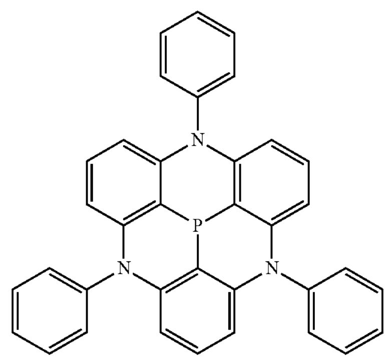

(1-781)

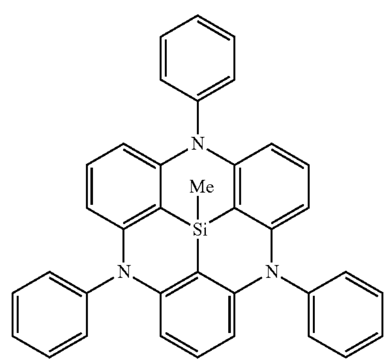

-continued (1-961)

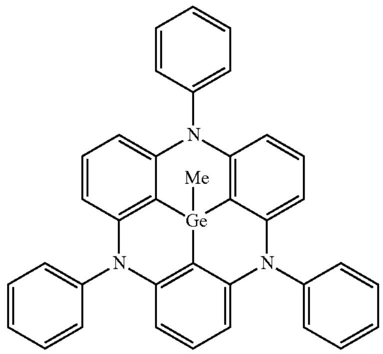

(1-1161)

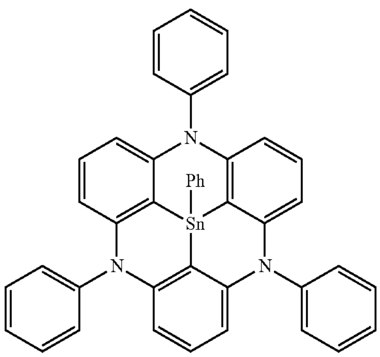

(1-1221)

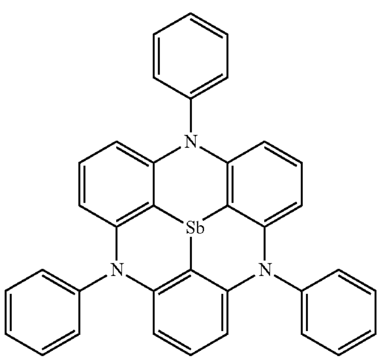

(1-1281)

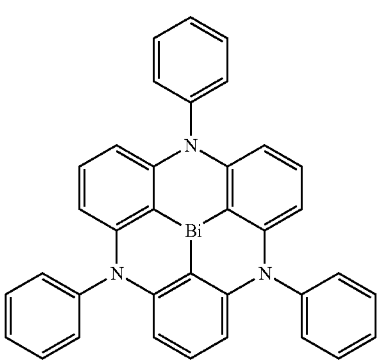

-continued (1-1341)

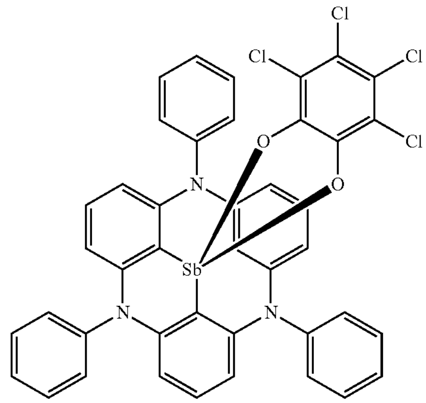

Synthesis Example (1)

N,N',N"-triphenyl-8,12-dihydro-4H-4,8,12-triaza-12c-borazibenzo[cd,mn]pyrene (1-1)

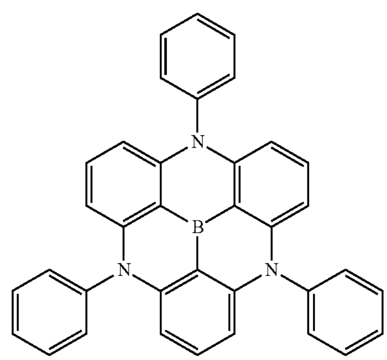

[First Stage]

To 1-bromo-2,3-dichlorobenzene [r-1] (22.6 g, 100 mmol), sodium t-butoxide (29.6 g, 308 mmol), 2,2'-bis (diphenylphosphino)-1,1'-binaphthyl [BINAP] (2.51 g, 4.0 mmol), bis(dibenzylideneacetone) palladium (0) [$Pd_2(dba)_3$] (1.83 g, 2.0 mmol), and toluene (400 ml), aniline [r-2] (18.5 ml, 203 mmol) was added under a nitrogen atmosphere at room temperature, and the resulting mixture was heated and stirred at 100° C. for 26 hours. The reaction solution was cooled to room temperature, and was filtered using silica gel column chromatography, and a solvent was distilled off under reduced pressure to obtain a crude product. Thereafter, the resulting crude product was washed with toluene to obtain 2-chloro-N,N'-diphenyl-1,3-benzenediamine [r-3] (18.4 g, yield 63%) as a white solid.

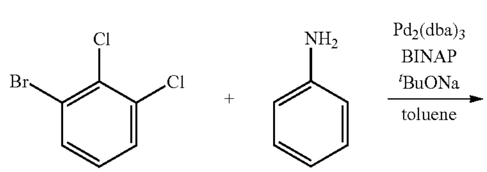

(r-1) (r-2)

-continued

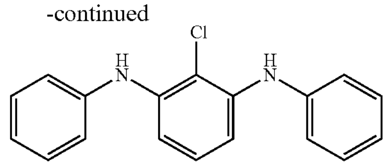

(r-3)

The structure of the compound thus obtained was identified with an NMR spectrum.

$^{1}$H-NMR (400 MHz, $CDCl_3$): δ=6.08 (s, 2H), 6.80 (s, 2H), 6.99 (t, 1H), 7.04 (tt, J=1.1, 7.3 Hz, 2H, $(CH)_2CH(CH_2)_2$), 7.18 (dd, 4H), 7.32 (dd, 4H).

$^{13}$C-NMR (101 MHz, $CDCl_3$): 107.1 (2C), 109.4, 120.4 (4C), 122.5 (2C), 127.0, 129.3 (4C), 141.1 (2C), 141.6 (2C).

[Second Stage]

To the compound obtained in the first step [r-3] (7.37 g, 25 mmol), sodium t-butoxide (7.29 g, 76 mmol), tri-t-butylphosphine (0.212 g, 1.05 mmol), bis(dibenzylideneacetone) palladium(0) [$Pd_2(dba)_3$] (0.465 g, 0.50 mmol), and toluene (100 ml), 1-chloro-3-iodobenzene [r-4] (6.20 g, 50 mmol) was added under a nitrogen atmosphere at 0° C., and the resulting mixture was stirred at room temperature for 21 hours. The reaction solution was filtered using silica gel column chromatography (eluent: toluene), and a solvent was distilled off under reduced pressure to obtain a crude product. Thereafter, the resulting crude product was washed with methanol to obtain 2-chloro-N,N'-bis(3-chlorophenyl)-N,N'-diphenyl-1,3-benzene diamine [r-5] (12.3 g, yield 95%) as a white solid.

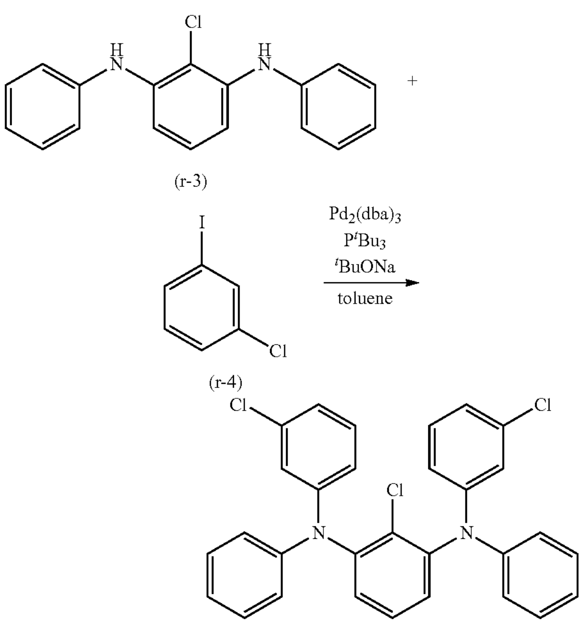

(r-3) (r-4) (r-5)

The structure of the compound thus obtained was identified with an NMR spectrum.

$^{1}$H-NMR (400 MHz, $CDCl_3$): δ=6.67 (ddd, 2H), 6.86-6.90 (m, 4H), 7.03-7.06 (m, 6H), 7.11 (t, 4H), 7.12 (d, 2H), 7.24-7.30 (m, 5H).

$^{13}$C-NMR (101 MHz, $CDCl_3$): 118.9 (2C), 120.6 (2C), 121.7 (2C), 123.1 (4C), 123.4 (2C), 128.2 (2C), 128.6, 129.3 (4C), 130.0 (2C), 132.1, 134.7 (2C), 145.7 (2C), 146.1 (2C), 148.2 (2C).

[Third Stage]

To 2-chloro-N,N'-bis(3-chlorophenyl)-N,N'-diphenyl-1,3-benzene diamine [r-5] (10.3 g, 20 mmol) synthesized in the second step, sodium t-butoxide (5.76 g, 60 mmol), 2-dicyclohexylphosphino-2',6'-dimethoxybiphenyl [SPhos] (0.329 g, 0.80 mmol), bis(dibenzylideneacetone) palladium (0) [$Pd_2(dba)_3$] (0.366 g, 0.40 mmol), and o-xylene (200 ml), aniline [r-2] (1.80 ml, 20 mmol) was added under a nitrogen atmosphere at room temperature, and the resulting mixture was heated and stirred at 60° C. for 3 hours. The reaction solution was cooled to room temperature, and was filtered using silica gel (eluent: toluene), and a solvent was distilled off under reduced pressure. The crude product was purified by silica gel column chromatography (eluent: toluene/hexane=¼ (volume ratio)) to obtain 2-chloro-N-(3-chlorophenyl)-N,N'-diphenyl-N'-(3-chloroamino phenyl)-1,3-benzenediamine [r-6] (5.65 g, yield 49%) as a white solid.

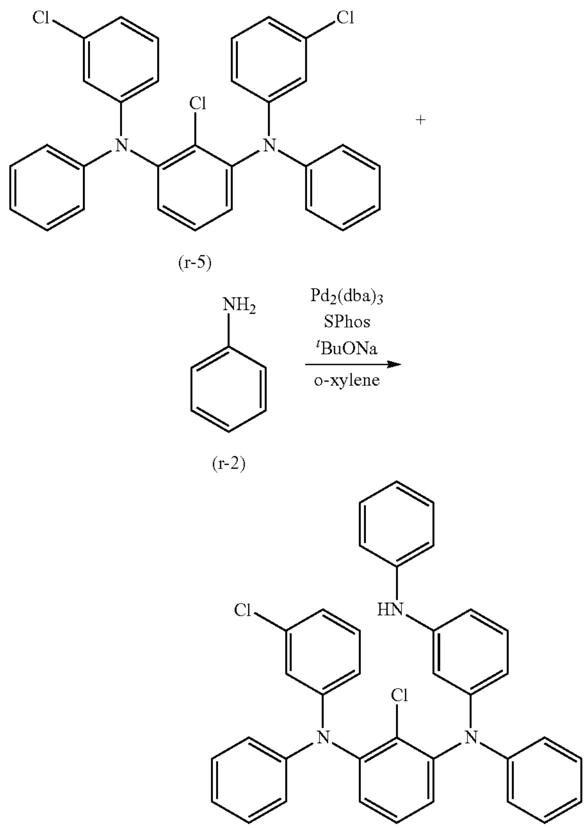

(r-5) (r-2) (r-6)

The structure of the compound thus obtained was identified with an NMR spectrum.

$^{1}$H-NMR (400 MHz, $CDCl_3$): δ=5.63 (s, 1H), 6.53 (dd, 1H), 6.66-6.70 (m, 2H), 6.78 (dd, 1H), 6.84-6.90 (m, 3H), 6.95-7.27 (m, 18H).

$^{13}$C-NMR (101 MHz, $CDCl_3$): 111.2, 111.5, 114.4, 117.6 (2C), 118.8, 120.4, 120.9, 121.5, 122.3 (2C), 122.4, 123.1 (2C), 123.3, 127.9, 128.4, 128.5, 129.1 (2C), 129.2 (2C), 129.3 (2C), 129.3 (2C), 129.8, 129.9, 132.4, 134.6, 142.8, 143.8, 145.5, 146.2, 146.3, 146.7, 148.1, 148.2.

[Fourth Stage]

Under nitrogen atmosphere, a solution of sodium t-butoxide (0.589 g, 6.1 mmol), 2-dicyclohexylphosphino-2',6'-dimethoxybiphenyl (0.135 g, 0.32 mmol), bis(dibenzylideneacetone) palladium(0) (0.149 g, 0.16 mmol), and o-xylene (400 ml) was heated and stirred at 140° C. A solution of 2-chloro-N-(3-chlorophenyl)-N,N'-diphenyl-N'-(3-chloroamino phenyl)-1,3-benzenediamine (2.29 g, 4.0 mmol) and o-xylene (900 ml) was slowly added dropwise thereto over 12 hours. Thereafter, the reaction solution was cooled to room temperature, and was filtered using silica gel (eluent: toluene), and a solvent was distilled off under reduced pressure. The crude product was purified by silica gel column chromatography (eluent: toluene/hexane=¼ (volume ratio)) to obtain N,N',N"-triphenyl-1,3,5-triaza-2$^2$-chloro-2,4,6 (1,3)-tribenzenacyclohexafan (2.73 g, yield 71%) as a white solid.

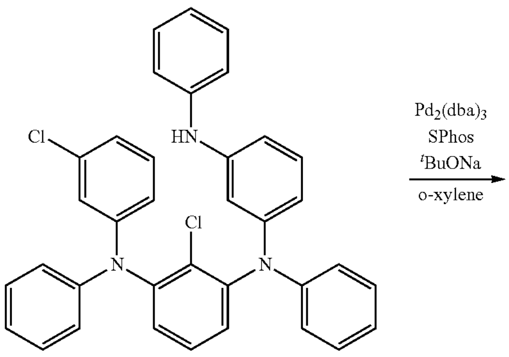

(r-6)

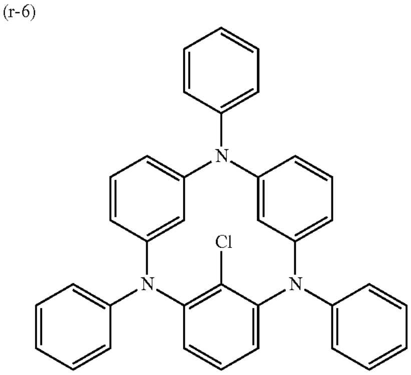

(r-7)

The structure of the compound thus obtained was identified with an NMR spectrum.

$^1$H-NMR (400 MHz, $CDCl_3$): δ=6.71 (d, 2H), 6.75 (t, 2H), 6.94-7.08 (m, 9H), 7.12-7.17 (m, 3H), 7.26-7.33 (m, 10H).

$^{13}$C-NMR (101 MHz, $CDCl_3$): 118.1 (2C), 119.2 (2C), 119.8 (4C), 123.3 (2C), 120.9 (2C), 121.3, 121.6 (2C), 129.4 (2C), 128.3, 129.2 (2C+4C), 129.3 (2C), 132.0, 145.4 (2C), 146.1, 148.8 (2C), 149.0 (2C), 149.4 (2C).

[Fifth Stage]

To a tert-butylbenzene (4.0 ml) solution of N,N',N"-triphenyl-1,3,5-triaza-2$^2$-chloro-2,4,6 (1,3)-tribenzenacyclohexafan [compound (r-7)] (0.104 mg, 0.19 mmol), a 1.6 M tert-butyllithium hexane solution (0.125 ml, 0.20 mmol) was added under a nitrogen atmosphere at −40° C. The resulting mixture was heated and stirred at 50° C. for 30 minutes. Thereafter, the reaction solution was cooled to −40° C., boron tribromide (37.5 μl, 0.40 mmol) was added thereto, and the resulting mixture was stirred for 30 minutes. Thereafter, N,N-diisopropylamine (70.0 μl, 0.41 mmol) was added thereto, and the resulting mixture was heated and stirred at 165° C. for 14 hours. The reaction solution was cooled to room temperature, and was filtered using Florisil (eluent: dichloromethane). A solvent was distilled off under reduced pressure, and then the residue was washed with dichloromethane to obtain a compound (1-1) (45.6 mg, yield 45%) as a white solid.

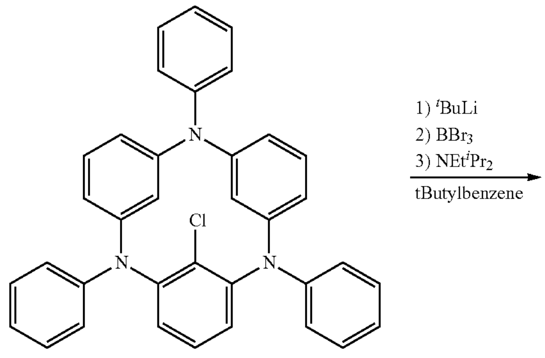

(r-7)

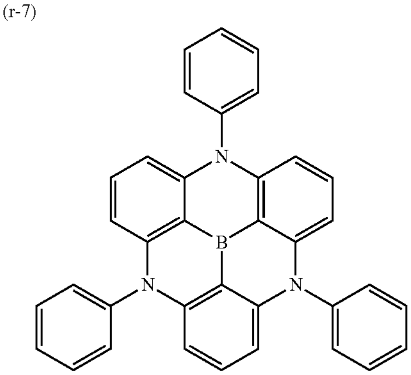

(1-1)

The structure of the compound thus obtained was identified with an NMR spectrum.

$^1$H-NMR (400 MHz, $CDCl_3$): δ=6.01 (d, 6H), 7.23 (t, 3H), 7.44 (d, 6H), 7.60 (t, 3H), 7.71 (t, 6H).

$^{13}$C-NMR (101 MHz, $CDCl_3$): 105.8 (6C), 128.9 (3C), 130.7 (6C), 131.4 (6C), 132.8 (3C), 142.0 (3C), 147.9 (6C).

Note that a carbon atom located at the a position of a boron atom was not observed by NMR measurement.

Synthesis Example (2)

N,N',N"-triphenyl-8,12-dihydro-4H-4,8,12-triaza-12c-phospha sulfide dibenzo[cd,mn]pyrene (1-241)

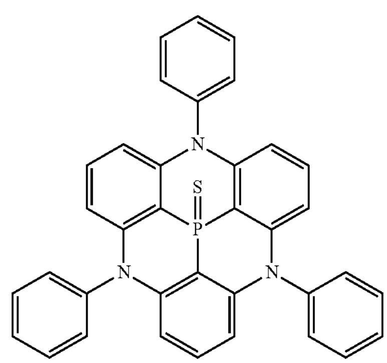

To N,N',N"-triphenyl-1,3,5-triaza-2$^2$-chloro-2,4,6 (1,3)-tribenzenacyclohexafan [compound (r-7)] (0.107 g, 0.20 mmol) and toluene (2.0 mL), 1.9 mol/L tert-butyllithium (0.211 mL, 0.40 mmol) was added under a nitrogen atmosphere at −40° C., and the resulting mixture was heated and stirred at 50° C. for 2 hours. The reaction solution was cooled to −40° C., phosphorus trichloride (34.9 μL, 0.40 mmol) was added thereto, the resulting mixture was heated and stirred at 110° C. for 2 hours, and the solvent was distilled off. After the solvent was distilled off, sulfur (14.0 mg, 1.5 mmol) and o-chlorobenzene (4.0 mL) were added to the residue, and the resulting mixture was heated and stirred at 110° C. for 12 hours. Thereafter, filtration was performed using Florisil (eluent: dichloromethane), and a solvent was distilled off under reduced pressure. The obtained crude product was washed with hexane, and was thereby isolated and purified to obtain a compound (1-241) (67.9 mg, yield 63%) as a yellow solid.

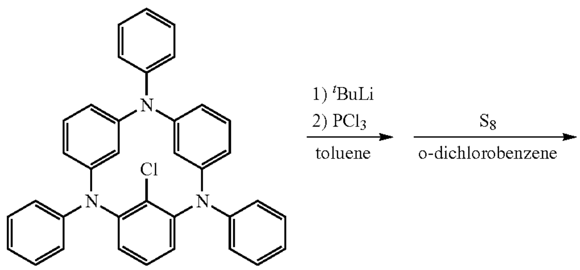

(r-7)

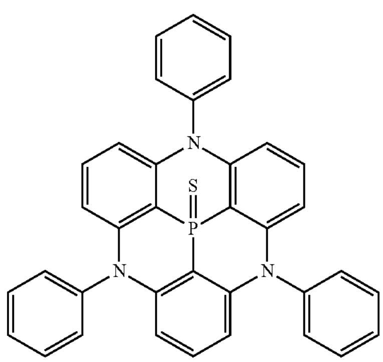

(1-241)

The structure of the compound thus obtained was identified with an NMR spectrum.

$^1$H-NMR (400 MHz, $CDCl_3$): δ=6.21 (dd, 6H), 7.00 (t, 3H), 7.49-7.56 (m, 9H), 7.64 (t, 6H).

$^{13}$C-NMR (101 MHz, $CDCl_3$): 102.2 (d, 3C), 110.1 (d, 6C), 128.8 (3C), 130.5 (6C), 132.8 (9C), 140.4 (3C), 145.1 (6C).

Synthesis Example (3)

N,N',N"-triphenyl-8,12-dihydro-4H-4,8,12-triaza-12c-phospha oxide dibenzo[cd,mn]pyrene (1-421)

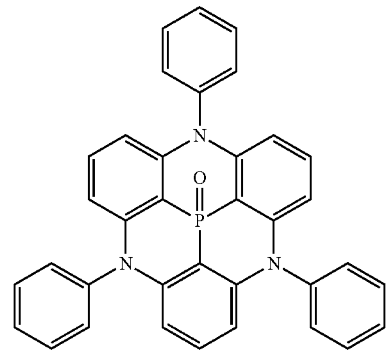

To N,N',N"-triphenyl-8,12-dihydro-4H-4,8,12-triaza-12c-phospha sulfide dibenzo[cd,mn]pyrene [compound (1-241)] (56.0 mg, 0.10 mmol) and dichloromethane (2.0 mL), m-chloroperbenzoic acid (m-CPBA) (90.0 mg, 77.7 wt %, 4.0 mmol) was added under a nitrogen atmosphere at −30° C., and the resulting mixture was stirred for 1 hour. Thereafter, a saturated solution of sodium sulfite (2.0 mL) was added thereto, and the resulting mixture was stirred for 1 hour. An organic layer was extracted with dichloromethane, and a solvent was distilled off under reduced pressure to obtain a compound (1-421) (49.1 mg, yield 90%) as a yellow solid.

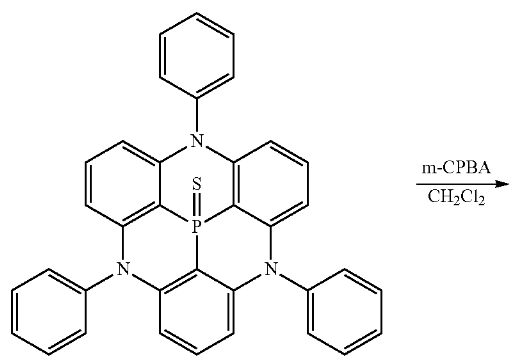

(1-241)

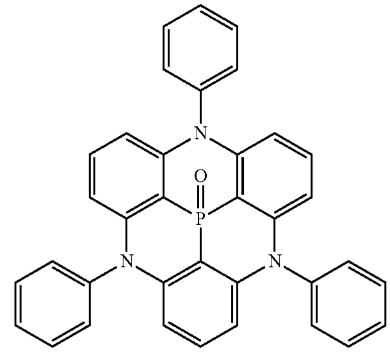

(1-421)

The structure of the compound thus obtained was identified with an NMR spectrum.

$^1$H-NMR (400 MHz, $CDCl_3$): δ=6.21 (dd, 6H), 7.06 (t, 3H), 7.61 (t, 1H), 7.62 (dd, 2H), 8.21 (ddd, 2H).

$^{13}$C-NMR (101 MHz, $CDCl_3$): 103.7 (d, 3C), 109.5 (d, 6C), 128.8 (3C), 130.6 (6C), 130.7 (6C), 131.6 (3C), 140.3 (3C), 146.0 (6C).

Synthesis Example (4)

N,N',N"-triphenyl-8,12-dihydro-4H-4,8,12-triaza-12c-phospha dibenzo[cd,mn]pyrene (1-601)

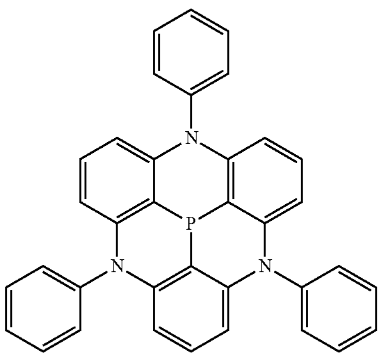

To N,N',N"-triphenyl-8,12-dihydro-4H-4,8,12-triaza-12c-phospha sulfide dibenzo[cd,mn]pyrene [compound (1-241)] (56.2 mg, 0.10 mmol) and o-xylene (2.0 mL), triethylphosphine (53.7 mL, 4.0 mmol) was added under nitrogen atmosphere, and the resulting mixture was heated and stirred at 120° C. for 2 days. Thereafter, a solvent and triethylphosphine sulfide were distilled off under reduced pressure, and were thereby removed to obtain a compound (1-601) (48.6 mg, yield 92%) as a yellow solid.

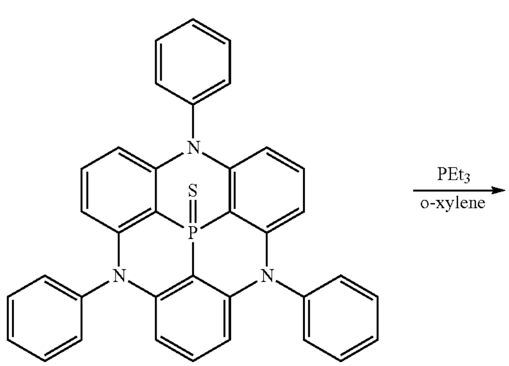

(1-241)

-continued

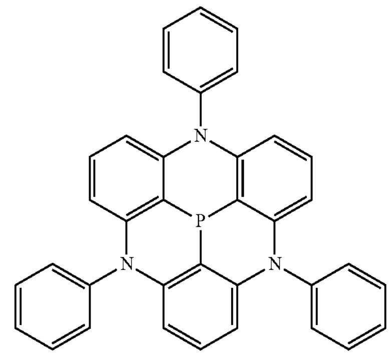

(1-601)

The structure of the compound thus obtained was identified with an NMR spectrum.

$^1$H-NMR (400 MHz, $CDCl_3$): δ=6.01 (dd, 6H), 7.23 (t, 3H), 7.44-7.50 (m, 9H), 7.59 (t, 6H).

$^{13}$C-NMR (101 MHz, $CDCl_3$): 104.5 (d, 3C), 110.0 (d, 6C), 127.8 (3C), 128.1 (3C), 130.2 (6C), 131.1 (6C), 141.4 (3C), 145.0 (6C).

Synthesis Example (5)

N,N',N"-triphenyl-8,12-dihydro-4H-4,8,12-triaza-12c-methyls iladibenzo[cd,mn]pyrene (1-781)

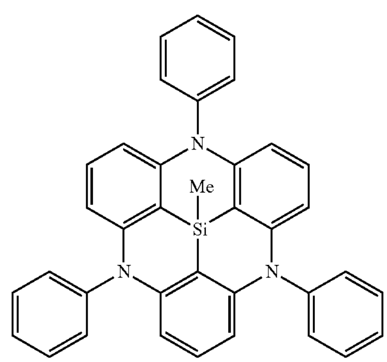

To N,N',N"-triphenyl-1,3,5-triaza-2$^2$-chloro-2,4,6 (1,3)-tribenzenacyclohexafan [compound (r-7)] (80.4 mg, 0.15 mmol) and tert-butylbenzene (3.5 mL), tert-butyllithium [1.9 mol/L] (0.314 mL, 0.60 mmol) was added under nitrogen atmosphere at −40° C., and the resulting mixture was heated and stirred at 50° C. for 30 minutes. The reaction solution was cooled to −40° C., trichloromethylsilane (70.4 μL) was added thereto, and the resulting mixture was heated at 160° C. for 18 hours. Thereafter, filtration was performed using Florisil (eluent: dichloromethane), and a solvent was distilled off under reduced pressure. The obtained crude product was isolated and purified by thin layer silica gel chromatography (developing solution: hexane/toluene=3/1 (volume ratio)) to obtain a compound (1-781) (4.23 mg, yield 52%) as a white solid.

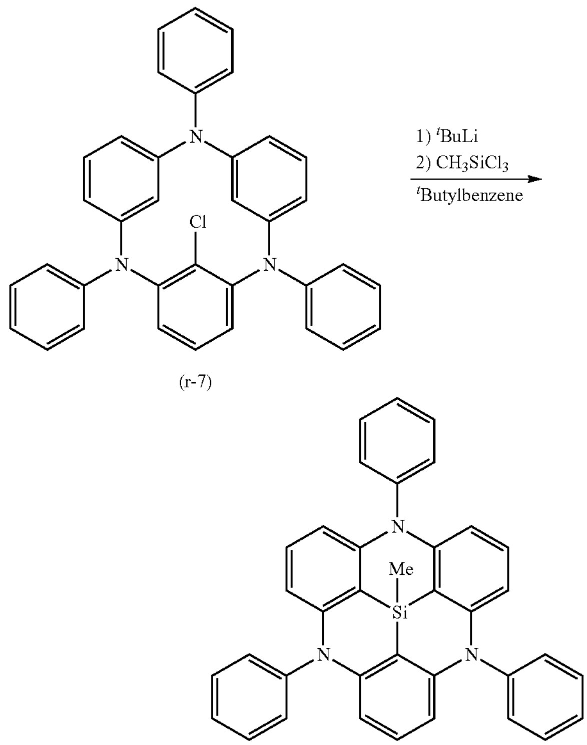

(r-7)

(1-781)

The structure of the compound thus obtained was identified with an NMR spectrum.

$^1$H-NMR (400 MHz, $CDCl_3$): δ=6.28 (d, 8H), 6.90 (t, 3H), 7.45 (t, 9H), 7.58 (t, 6H).

$^{13}$C-NMR (101 MHz, $CDCl_3$): −5.06, 108.9 (3C), 111.1 (6C), 127.5 (3C), 129.0 (3C), 129.9 (6C), 130.6 (6C), 142.6 (3C), 151.5 (6C).

Synthesis Example (6)

N,N',N"-triphenyl-8,12-dihydro-4H-4,8,12-triaza-12c-methylg erma dibenzo[cd,mn]pyrene (1-961)

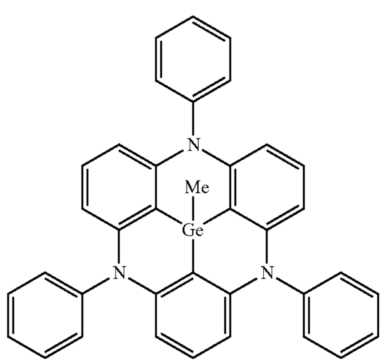

To N,N',N"-triphenyl-1,3,5-triaza-2$^2$-chloro-2,4,6 (1,3)-tribenzenacyclohexafan [compound (r-7)] (80.4 mg, 0.15 mmol) and tert-butylbenzene (3.5 mL), tert-butyllithium [1.9 mol/L] (0.314 mL, 0.60 mmol) was added under nitrogen atmosphere at −40° C., and the resulting mixture was heated and stirred at 50° C. for 30 minutes. The reaction solution was cooled to −40° C., germanium tetrachloride (0.128 mL, 0.60 mmol) was added thereto, and the resulting mixture was heated at 160° C. for 18 hours. Subsequently, the reaction solution was cooled to 0° C., an ether solution of methyl lithium [1.0 mol/L] (2.10 mL, 2.1 mmol) was added thereto, and the resulting mixture was stirred at room temperature for 1 hour. Thereafter, filtration was performed using Florisil (eluent: dichloromethane), and a solvent was distilled off under reduced pressure. The obtained crude product was isolated and purified by thin layer silica gel chromatography (developing solution: hexane/toluene=3/1 (volume ratio)) to obtain a compound (1-961) (27.3 mg, yield 31%) as a white solid.

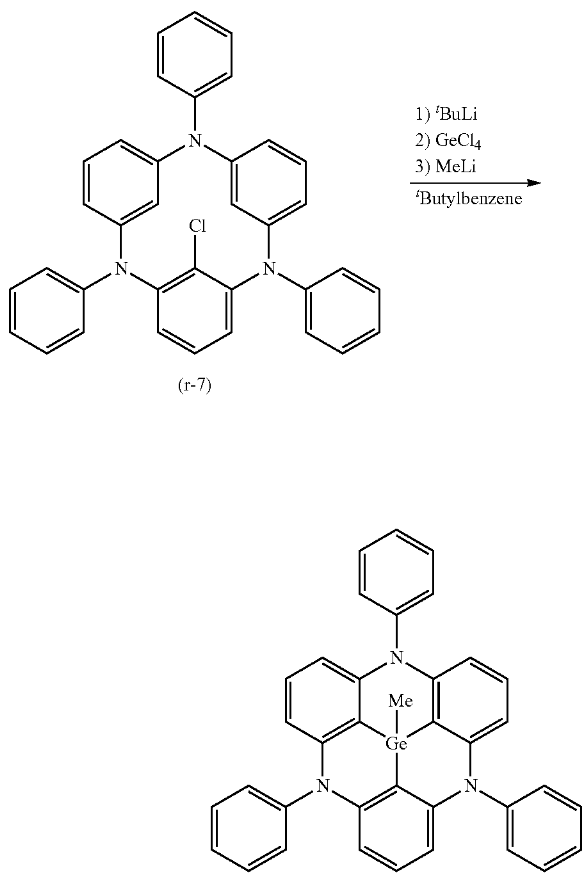

(r-7)

(1-961)

The structure of the compound thus obtained was identified with an NMR spectrum.

$^1$H-NMR (400 MHz, $CDCl_3$): δ=7.03 (t, 3H), 7.12 (dd, 6H), 7.17-7.21 (m, 3H), 7.25-7.36 (m, 12H).

$^{13}$C-NMR (101 MHz, $CDCl_3$): −6.16, 119.3 (6C), 121.6 (3C), 121.9 (6C), 129.2 (9C), 132.0 (3C), 146.0 (6C), 151.0 (3C).

Synthesis Example (7)

N,N',N"-triphenyl-8,12-dihydro-4H-4,8,12-triaza-12c-phenyls tannadibenzo[cd,mn]pyrene (1-1161)

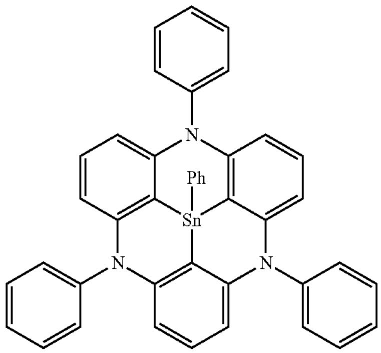

To N,N',N"-triphenyl-1,3,5-triaza-2[2]-chloro-2,4,6 (1,3)-tribenzenacyclohexafan [compound (r-7)] (80.4 mg, 0.15 mmol) and tert-butylbenzene (3.5 mL), tert-butyllithium [1.9 mol/L] (0.314 mL, 0.60 mmol) was added under nitrogen atmosphere at −40° C., and the resulting mixture was heated and stirred at 50° C. for 30 minutes. The reaction solution was cooled to −40° C., and trichlorophenylstannane (98.5 μL, 0.60 mmol) was added thereto. The resulting mixture was heated at room temperature for 2 hours, then the temperature thereof was raised to 60° C., and the mixture was heated and stirred for 2 hours. Thereafter, filtration was performed using Florisil (eluent: dichloromethane), and a solvent was distilled off under reduced pressure. The obtained crude product was isolated and purified by thin layer silica gel chromatography (developing solution: hexane/toluene=2/1 (volume ratio)), and then the purified product was washed with hexane to obtain a compound (1-1161) (18.7 mg, yield 18%) as a white solid.

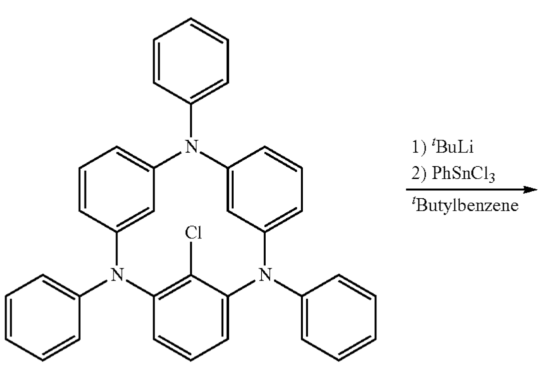

(r-7)

-continued

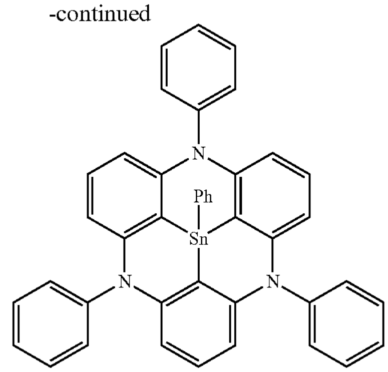

(1-1161)

The structure of the compound thus obtained was identified with an NMR spectrum.

$^{1}$H-NMR (400 MHz, $CDCl_3$): δ=6.80 (t, 3H), 7.00 (t, 2H), 7.12-7.14 (m, 7H), 7.20-7.27 (m, 9H), 7.34-7.40 (q, 6H).

$^{13}$C-NMR (101 MHz, $CDCl_3$): 114.4 (6C), 118.4 (3C), 126.9 (6C), 128.7 (2C), 129.1 (6C), 129.8, 130.7, 137.0 (3C), 136.9 (2C), 147.9 (3C), 149.1 (3C), 153.3 (6C).

Synthesis Example (8)

N,N',N"-triphenyl-8,12-dihydro-4H-4,8,12-triaza-12c-stibabenzo [cd,mn]pyrene (1-1221)

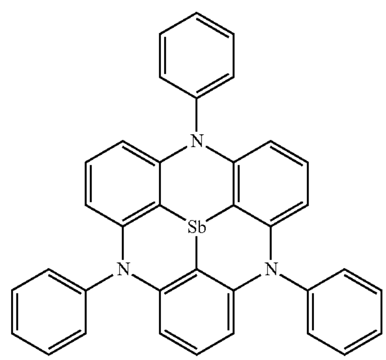

To a tert-butylbenzene (60.0 ml) solution of N,N',N"-triphenyl-1,3,5-triaza-2[2]-chloro-2,4,6 (1,3)-tribenzenacyclohexafan [compound (r-7)] (1.61 g, 3.0 mmol), a tert-butyllithium hexane solution [1.9 mol/L] (6.30 ml, 12 mmol) was added under a nitrogen atmosphere at −40° C. The resulting mixture was heated and stirred at 45° C. for 2 hours. Thereafter, the reaction solution was cooled to −40° C., a dichloromethane solution (10 ml) of antimony trichloride (2.76 g, 12 mmol) was added thereto, and the resulting mixture was stirred at room temperature for 14 hours. Thereafter, N,N-diisopropylamine (4.2 ml, 24 mmol) was added thereto, and the reaction solution was filtered using Florisil (eluent: dichloromethane). A solvent was distilled off under reduced pressure, and then the residue was washed with toluene to obtain a compound (1-1221) (0.870 g, yield 47%) as a white solid.

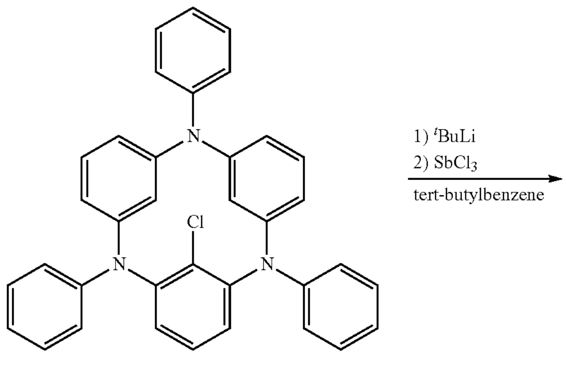

(r-7)

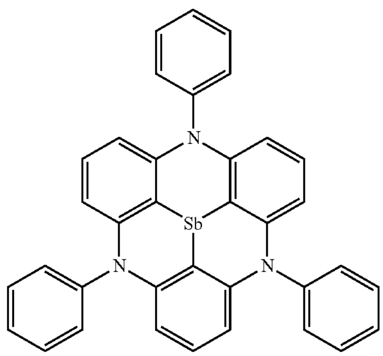

(1-1221)

The structure of the compound thus obtained was identified with an NMR spectrum.

$^1$H-NMR (400 MHz, $CDCl_3$): δ=6.89 (t, 3H), 7.26-7.32 (m, 15H), 7.45 (d, 6H).

$^{13}$C-NMR (101 MHz, $CDCl_3$): 113.8 (6C), 119.2 (3C), 125.2 (6C), 129.2 (6C), 129.5 (3C), 144.6 (3C), 145.5 (6C), 147.1 (6C).

Synthesis Example (9)

N,N',N"-triphenyl-8,12-dihydro-4H-4,8,12-triaza-12c-bismabenzo[cd,mn]pyrene (1-1281)

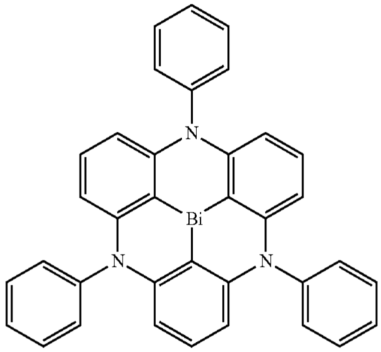

To a tert-butylbenzene (4.0 ml) solution of N,N',N"-triphenyl-1,3,5-triaza-2$^2$-chloro-2,4,6 (1,3)-tribenzenacyclohexafan [compound (r-7)] (1.61 g, 3.0 mmol), a tert-butyllithium hexane solution [1.9 mol/L] (6.30 ml, 12 mmol) was added under a nitrogen atmosphere at −40° C. The resulting mixture was heated and stirred at 45° C. for 2 hours. Thereafter, the reaction solution was cooled to −40° C., and bismuth trichloride (3.79 g, 12 mmol) was added thereto. The resulting mixture was stirred for 3 hours, and then was stirred at room temperature for 14 hours. The reaction solution was filtered using Florisil (eluent: dichloromethane). A solvent was distilled off under reduced pressure, and then the residue was washed with toluene to obtain a compound (1-1281) (0.877 g, yield 41%) as a white solid.

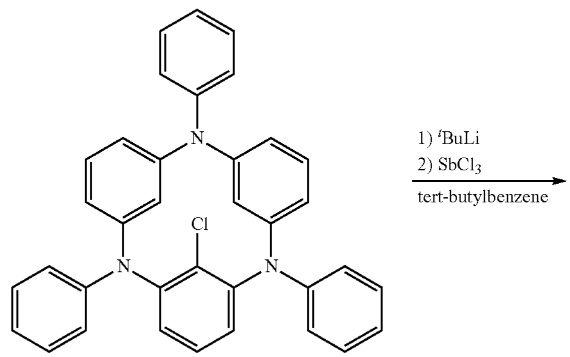

(r-7)

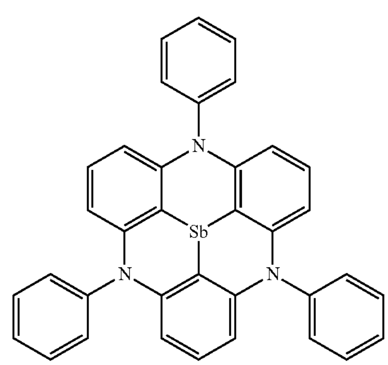

(1-1281)

The structure of the compound thus obtained was identified with an NMR spectrum.

$^1$H-NMR (400 MHz, $CDCl_3$): δ=6.82 (t, 3H), 7.23-7.32 (m, 15H), 7.59 (d, 6H).

$^{13}$C-NMR (101 MHz, $CDCl_3$): 113.5 (6C), 118.7 (3C), 125.9 (6C), 129.1 (6C), 129.5 (3C), 146.0 (3C), 147.0 (6C), 153.3 (3C).

Synthesis Example (10)

o-chloranil substitution product of N,N',N"-triphenyl-8,12-dihydro-4H-4,8,12-triaza-12c-stibabenzo[cd,mn]pyrene (1-1341)

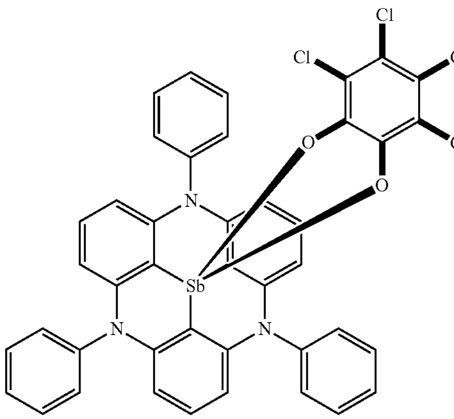

To a dichloromethane (8.0 ml) solution of N,N',N"-triphenyl-8,12-dihydro-4H-4,8,12-triaza-12c-stibabenzo[cd,mn]pyrene [compound (1-1221)] (30.7 mg, 0.050 mmol), a dichloromethane (1.0 ml) solution of o-chloranil (14.5 mg, 0.060 mmol) was added under a nitrogen atmosphere. The resulting mixture was stirred at room temperature for 3 hours. Thereafter, a solvent was distilled off, and the crude product was washed with methanol and hexane to obtain a compound (1-1341) (41.4 mg, yield 90%) as a yellow solid.

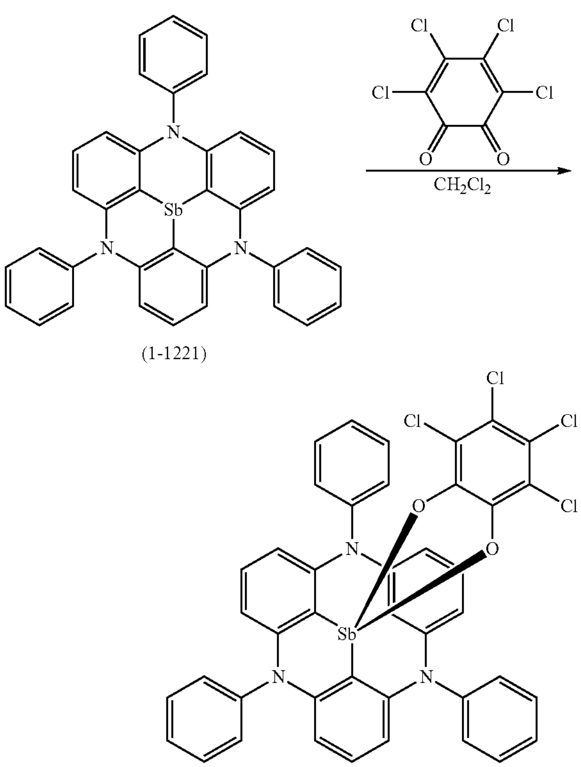

(1-1341)

The structure of the compound thus obtained was identified with an NMR spectrum.

$^1$H-NMR (400 MHz, $CDCl_3$): δ=7.29-7.38 (m, 15H), 7.51 (d, 6H).

$^{13}$C-NMR (101 MHz, $CDCl_3$): 116.0 (6C), 116.9 (2C), 120.8 (3C+2C), 126.7 (6C), 129.7 (6C), 131.8 (3C), 140.7 (3C), 140.7 (3C), 143.8 (2C), 145.7 (2C), 150.5 (6C).

Other compounds of the present invention can be synthesized by a method in accordance with those in Synthesis Examples described above, by appropriately changing the compounds of raw materials.

Next, evaluation of basic physical properties of the compounds of the present invention, and manufacturing and evaluation of an organic EL element using the compounds of the present invention will be described.

<Evaluation of Basic Physical Properties>

Preparation of Sample

When absorption characteristics and luminescence characteristics (fluorescence and phosphorescence) of a compound to be evaluated are evaluated, there are a case where the compound to be evaluated is dissolved in a solvent and evaluated in a solvent and a case where the compound to be evaluated is evaluated in a thin film state. Furthermore, in the case of evaluation in a thin film state, depending on a mode of use of a compound to be evaluated in an organic EL element, there are a case where only the compound to be evaluated is formed into a thin film to be evaluated and a case where the compound to be evaluated is dispersed in an appropriate matrix material, and is formed into a thin film to be evaluated. As the matrix material, commercially available PMMA (polymethyl methacrylate) or the like can be used. For example, a thin film sample dispersed in PMMA can be manufactured by dissolving PMMA and a compound to be evaluated in toluene and then forming a thin film on a quartz transparent support substrate (10 mm×10 mm) by a spin coating method. A method for manufacturing a thin film sample when the matrix material is a host material will be described below. A quartz transparent support substrate (10 mm×10 mm×1.0 mm) is fixed to a substrate holder of a commercially available vapor deposition apparatus (manufactured by Showa Shinku Co., Ltd.), and a molybdenum vapor deposition boat containing a host material and a molybdenum vapor deposition boat containing a dopant material are attached thereto. Subsequently, a vacuum chamber is depressurized to $5\times10^{-4}$ Pa, and the vapor deposition boat containing the host material and the vapor deposition boat containing the dopant material are heated simultaneously to perform vapor deposition so as to obtain an appropriate film thickness, and a mixed thin film of the host material and the dopant material is formed. The deposition rate is controlled according to a set weight ratio between the host material and the dopant material.

Evaluation of Absorption Characteristics and Luminescence Characteristics

An absorption spectrum of the sample was measured using an ultraviolet-visible near-infrared spectrophotometer (manufactured by Shimadzu Corporation, UV-2600). A fluorescence spectrum or a phosphorescence spectrum of the sample was measured using a spectrofluorophotometer (manufactured by Hitachi High-Technologies Corporation, F-7000). For measurement of the fluorescence spectrum, photoluminescence was measured by excitation at an appropriate excitation wavelength at room temperature. For measurement of the phosphorescence spectrum, the sample was measured while being immersed in liquid nitrogen (temperature 77 K) using an attached cooling unit. In order to observe the phosphorescence spectrum, delay time from excitation light irradiation to start of measurement was adjusted using an optical chopper. The sample was excited with an appropriate excitation wavelength and photoluminescence was measured.

Evaluation of Delayed Fluorescence

A fluorescence lifetime is measured at 300 K using a fluorescence lifetime measuring apparatus (manufactured by Hamamatsu Photonics K.K., C11367-01). Fast and slow components of a fluorescence lifetime are observed at a maximum emission wavelength measured at an appropriate excitation wavelength. In fluorescence lifetime measurement of a general organic EL material that emits fluorescence at room temperature, a slow component involving a triplet component derived from phosphorescence is rarely observed due to deactivation of the triplet component due to heat. A case where a slow component is observed in a compound to be evaluated indicates that triplet energy having a long excitation lifetime has moved to singlet energy due to thermal activation and is observed as delayed fluorescence.

<Evaluation of Organic EL Element>

The compound of the present invention is characterized by an appropriate band gap (Eg), high triplet excitation energy ($E_T$), and small $\Delta E_{ST}$ (energy difference between triplet excited state (T1) and singlet excited state (S1)). Therefore, particularly, application thereof to a light emitting layer and a charge transport layer can be expected.

Configuration of Organic EL Element

Examples of a configuration of an organic EL element using the compound of the present invention include the following configuration A and configuration B.

(Element Configuration A)

An example of a constituent material serving as a reference for each layer is indicated in the following Table 1. By replacing at least one of a material for a hole transport layer, a material for an electron blocking layer, a host material for a light emitting layer, a dopant material for a light emitting layer, and a material for an electron transport layer with the compound of the present invention, further improvement in characteristics can be expected. Note that a film thickness of each layer and a constituent material therefor can be appropriately changed according to basic physical properties of the compound of the present invention.

TABLE 1

| Hole injection layer (40 nm) | Hole transport layer (15 nm) | Electron blocking layer (15 nm) | Light emitting layer (30 nm) | | Electron transport layer (40 nm) | Negative electrode (1 nm/ 100 nm) |
|---|---|---|---|---|---|---|
| | | | Host | Dopant | | |
| HI | HT | EB | EM-H | Firpic | ET | LiF/Al |

In Table 1, "HI" (hole injection layer material) represents N,N'-diphenyl-N,N'-dinaphthyl-4,4'-diaminobiphenyl, "HT" (hole transport layer material) represents 4,4',4"-tris (N-carbazolyl) triphenylamine, "EB" (electron blocking layer material) represents 1,3-bis(N-carbazolyl) benzene, "EM-H" (light emitting layer host material) represents 3,3'-bis(N-carbazolyl)-1,1'-biphenyl, "Firpic" (light emitting layer dopant material) represents bis[2-(4,6-difluorophenyl) pyridinato-N,$C^2$] (picolinato) iridium(III), and "ET" (electron transport layer material) represents diphenyl [4-(triphenylsilyl) phenyl] phosphine oxide. Chemical structures thereof are illustrated below.

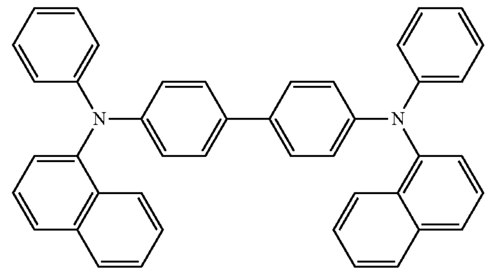

(HI)

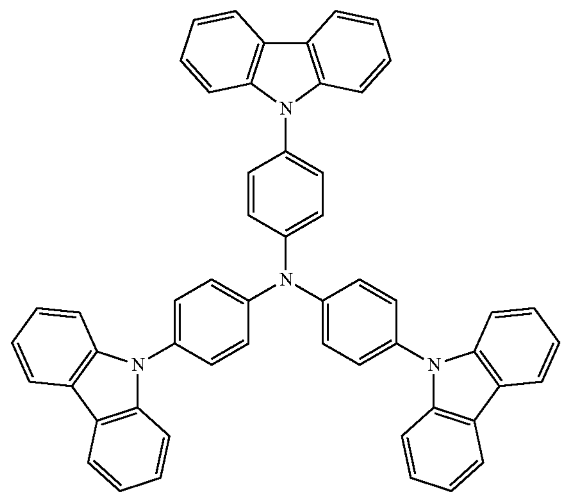

(HT)

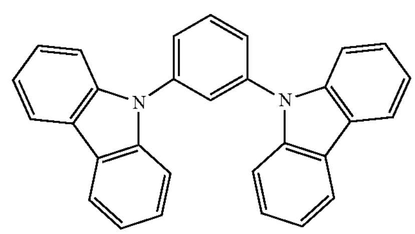

(EB)

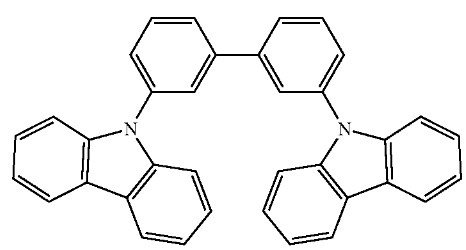

(EM-H)

-continued

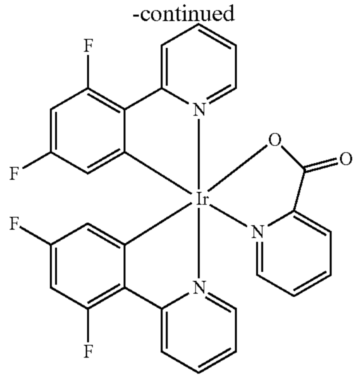

(Firpic)

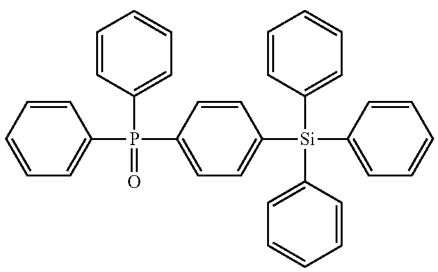

(ET)

(Element Configuration B)

An example of a constituent material serving as a reference for each layer is indicated in the following Table 2. By replacing at least one of a material for a hole transport layer 1, a material for a hole transport layer 2, a host material for a light emitting layer, a dopant material for a light emitting layer, and a material for an electron transport layer with the compound of the present invention, further improvement in characteristics can be expected. Note that a film thickness of each layer and a constituent material therefor can be appropriately changed according to basic physical properties of the compound of the present invention.

TABLE 2

| Hole injection layer 1 (40 nm) | Hole injection layer 2 (5 nm) | Hole transport layer 1 (15 nm) | Hole transport layer 2 (10 nm) | Light emitting layer (25 nm) | | Electron transport layer (30 nm) | Negative electrode (1 nm/ 100 nm) |
|---|---|---|---|---|---|---|---|
| | | | | Host | Dopant | | |
| HI | HAT-CN | HT-1 | HT-2 | EM-H | BD1 | ET | Liq/ MgAg |

In Table 2, "HI" (hole injection layer material) represents $N^4$,$N^{4'}$-diphenyl-$N^4$,$N^{4'}$-bis(9-phenyl-9H-carbazol-3-yl)-[1,1'-b iphenyl]-4,4'-diamine, "HAT-CN" (hole injection layer material) represents 1,4,5,8,9,12-hexaazatriphenylene hexacarbonitrile, "HT-1" (hole transport layer material) represents N-([1,1'-biphenyl]-4-yl)-9,9-dimethyl-N-(4-(9-phenyl-9H-car bazol-3-yl) phenyl)-9H-fluorene-2-amine, "HT-2" (hole transport layer material) represents N,N-bis(4-(dibenzo[b,d]furan-4-yl) phenyl)-[1,1':4',1"-terphenyl]-4-amine, "EM-H" (light emitting layer host material) represents 9-phenyl-10-(4-phenylnaphthalen-1-yl) anthracene, "BD1" (light emitting layer dopant material) represents 7,7,-dimethyl-$N^5$,$N^9$-diphenyl-$N^5$,$N^9$-bis(4-(trimethylsilyl) phenyl)-7H-benzo[c]fluorene-5,9-diamine, and "ET" (electron transport layer material) represents 4,4'-((2-phenylanthracene-9,10-diyl) bis(4,1-phenylene)) dipyridine. Chemical structures thereof are indicated below together with "Liq".

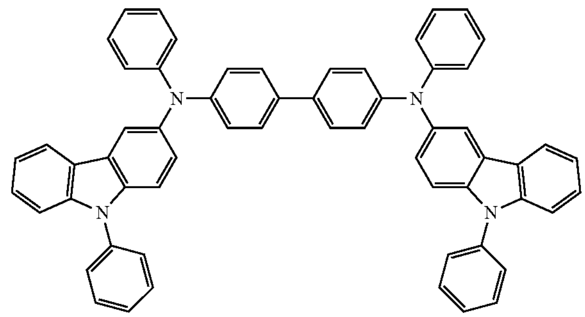

(HI)

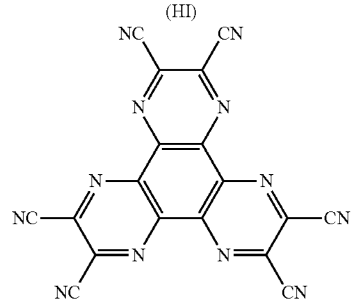

(HAT-CN)

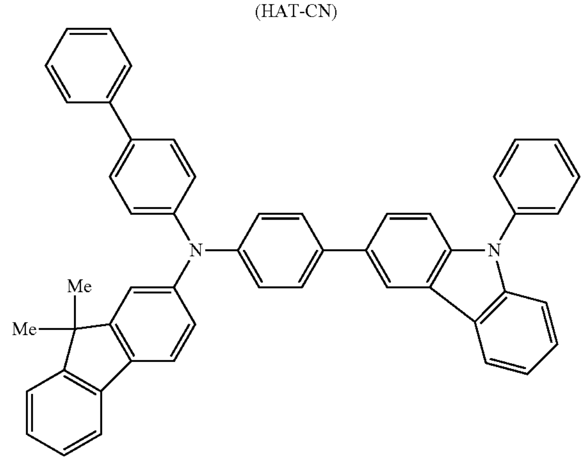

(HT-1)

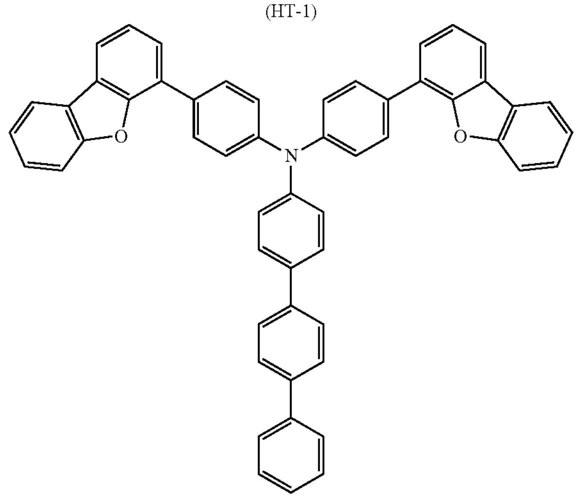

(HT-2)

-continued

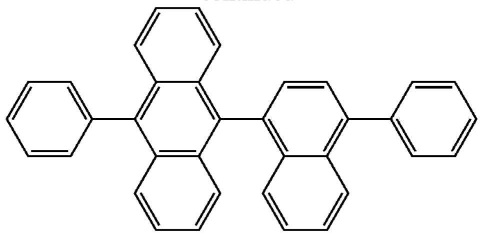

(EM-H)

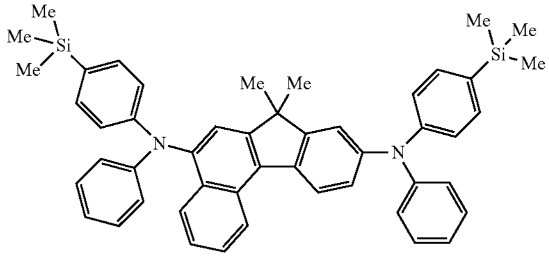

(BD1)

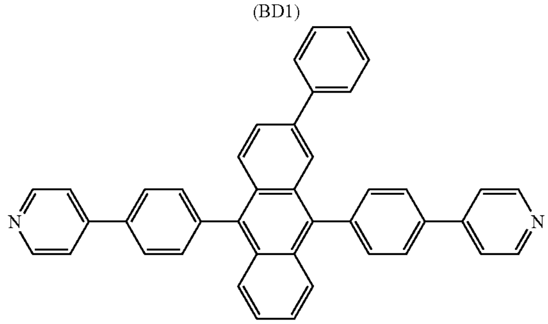

(ET)

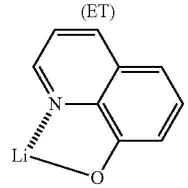

(Liq)

<Manufacturing Organic EL Element>

A method for manufacturing the element configuration A will be described below. A glass substrate (manufactured by Opto Science, Inc.) having a size of 26 mm×28 mm×0.7 mm, obtained by forming a film of ITO having a thickness of 100 nm by sputtering and polishing the ITO film to 50 nm, was used as a transparent support substrate. This transparent support substrate was fixed to a substrate holder of a commercially available vapor deposition apparatus (manufactured by Showa Shinku Co., Ltd.). Molybdenum vapor deposition boats each containing HI (hole injection layer material), HT (hole transport layer material), EB (electron blocking layer material), EM-H (host material), Firpic (dopant material), ET (electron transport layer material), or LiF (electron injection layer material), and a tungsten vapor deposition boat containing aluminum were attached thereto.

Layers as described below were formed sequentially on the ITO film of the transparent support substrate. A vacuum chamber was depressurized to $5\times10^{-4}$ Pa. First, HI was heated, and vapor deposition was performed so as to obtain a film thickness of 40 nm. Thus, hole injection layer was formed. Subsequently, HT was heated, and vapor deposition was performed so as to obtain a film thickness of 15 nm. Thus, a hole transport layer was formed. Subsequently, EB was heated, and vapor deposition was performed so as to obtain a film thickness of 15 nm. Thus, an electron blocking layer was formed. Subsequently, EM-H and Firpic (dopant material) were simultaneously heated, and vapor deposition was performed so as to obtain a film thickness of 30 nm. Thus, a light emitting layer was formed. A vapor deposition rate was adjusted such that a weight ratio between EM-H and Firpic was approximately 95:5. Subsequently, ET was heated, and vapor deposition was performed so as to obtain a film thickness of 40 nm. Thus, an electron transport layer was formed. A vapor deposition rate for each layer was 0.01 to 1 nm/sec.

Thereafter, LiF was heated, and vapor deposition was performed at a vapor deposition rate of 0.01 to 0.1 nm/sec so as to obtain a film thickness of 1 nm. Subsequently, aluminum was heated, and vapor deposition was performed so as to obtain a film thickness of 100 nm. Thus, a negative electrode was formed to obtain an organic EL element. At this time, a vapor deposition rate of aluminum was adjusted so as to be 1 nm to 10 nm/sec.

The element configuration B can be manufactured by optimizing conditions in a similar manner to the element configuration A.

Evaluation Items and Evaluation Method

Examples of an evaluation item include a driving voltage (V), an emission wavelength (nm), CIE chromaticity (x, y), an external quantum efficiency (%), a maximum wavelength (nm) of an emission spectrum, and a half width (nm) thereof. For these evaluation items, for example, a value at 10 cd/$m^2$ light emission can be used.

A quantum efficiency of a luminescent element includes an internal quantum efficiency and an external quantum efficiency. The internal quantum efficiency indicates a ratio at which external energy injected as electrons (or holes) into a light emitting layer of the luminescent element is purely converted into photons. Meanwhile, the external quantum efficiency is calculated based on the amount of these photons emitted to an outside of the luminescent element. A part of the photons generated in the light emitting layer is absorbed or reflected continuously inside the luminescent element, and is not emitted to the outside of the luminescent element. Therefore, the external quantum efficiency is lower than the internal quantum efficiency.

A method for measuring spectral radiance (emission spectrum) and an external quantum efficiency are as follows. Using a voltage/current generator R6144 manufactured by Advantest Corporation, a voltage at which luminance of an element was 10 cd/$m^2$ was applied to cause the element to emit light. Using a spectral radiance meter SR-3AR manufactured by TOPCON Co., spectral radiance in a visible light region was measured from a direction perpendicular to a light emitting surface. Assuming that the light emitting surface is a perfectly diffusing surface, a numerical value obtained by dividing a spectral radiance value of each measured wavelength component by wavelength energy and multiplying the obtained value by $\pi$ is the number of photons at each wavelength. Subsequently, the number of photons is integrated in the observed entire wavelength region, and this number is taken as the total number of photons emitted from the element. A numerical value obtained by dividing an applied current value by an elementary charge is taken as the number of carriers injected into the element. The external quantum efficiency is a numerical value obtained by dividing the total number of photons emitted from the element by the number of carriers injected into the element. Note that the half width of an emission spectrum is obtained as a width between upper and lower wavelengths where the intensity is 50% with a maximum emission wavelength as the center.

Examples of Compound (1-1)

<Evaluation of Basic Physical Properties>

[Absorption Characteristics]

Figure 2:
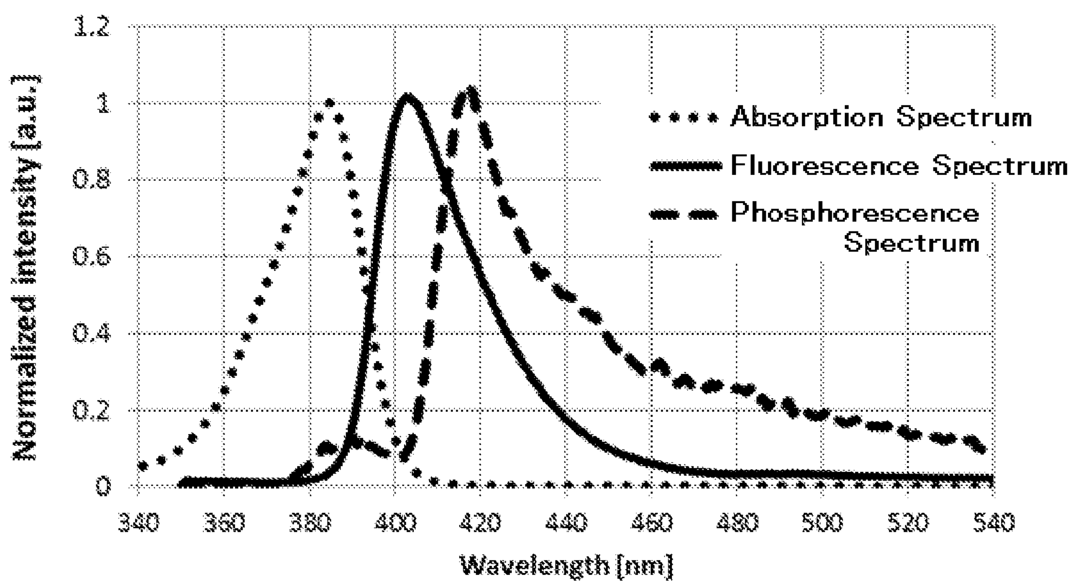
FIG. 2 illustrates an absorption, fluorescence, and phosphorescence spectrum of compound (1-1).

Compound (1-1) was dissolved in a solvent $CH_2Cl_2$ at a concentration of $2.0\times10^{-5}$ mol/l and an absorption spectrum was measured. As a result, an absorption edge wavelength was 400 nm, an absorption maximum wavelength was 384 nm, and a molar absorbance coefficient at the absorption maximum wavelength was 32164 $cm^{-1}M^{-1}$ (FIG. 2). An energy gap calculated from the absorption edge wavelength was 3.10 eV.

[Luminescence Characteristics]

A fluorescence spectrum was measured at room temperature by dissolving compound (1-1) in a solvent $CH_2Cl_2$ at a concentration of $2.0\times10^{-5}$ mol/l. A sample was excited at an excitation wavelength of 340 nm and photoluminescence was measured. As a result, a maximum emission wavelength was 403 nm (FIG. 2).

A phosphorescence spectrum was measured by dissolving compound (1-1) in 3-methylpentane. A sample was excited at an excitation wavelength of 340 nm and photoluminescence was measured. As a result, a maximum emission wavelength was 415 nm (FIG. 2).

A difference $\Delta E_{ST}$ between lowest singlet excitation energy (3.08 eV) and lowest triplet excitation energy (2.99 eV) estimated from the maximum emission wavelengths of the measured fluorescence spectrum and phosphorescence spectrum was 0.09 eV.

As described above, compound (1-1) has an appropriate energy gap and high triplet excitation energy, and therefore is the most suitable as a material for a light emitting layer. Furthermore, compound (1-1) can be expected as a thermally activated delayed fluorescent material for a light emitting layer because of having small $\Delta E_{ST}$.

<Evaluation of Organic EL Element>

An organic EL element in which compound (1-1) is used as a host of a light emitting layer in the element configuration A or the element configuration B can be manufactured by the above procedure and can be evaluated.

<Evaluation of Actual Organic EL Element>

Organic EL elements according to Examples 1 and 2 were manufactured, and an external quantum efficiency obtained when each of the organic EL elements was driven at a current density that could give luminance of 1000 cd/$m^2$, was measured. The following Table 3 indicates a material configuration of each of layers in the organic EL elements thus manufactured.

TABLE 3

| | Hole injection layer | Hole transport layer 1 | Hole transport layer 2 | Light emitting layer (30 nm) | | Electron transport layer | Negative electrode |
|---|---|---|---|---|---|---|---|
| | (5 nm) | (65 nm) | (10 nm) | Host | Dopant | (50 nm) | (1 nm/100 nm) |
| Example 1 | HAT-CN | TBB | TcTa | Compound (1-1) | $Ir(PPy)_3$ | TPBi | LiF/Al |
| Example 2 | HAT-CN | TBB | TcTa | Compound (1-241) | $Ir(PPy)_3$ | TPBi | LiF/Al |

In Table 3, "HAT-CN" represents 1,4,5,8,9,12-hexaazatriphenylene hexacarbonitrile, "TBB" represents $N^4,N^4,N^{4'}$,$N^{4'}$-tetra([1,1'-biphenyl]-4-yl)-[1,1'-biphenyl]-4, 4'-diamine, "TcTa" represents tris(4-carbazolyl-9-ylphenyl) amine, "Ir $(PPy)_3$" represents tris(2-phenylpyridine) iridium(III), "TPBi" represents 1,3,5-tris(1-phenyl-1H-benzo[d]imidazol-2-yl) benzene. Chemical structures thereof are illustrated below.

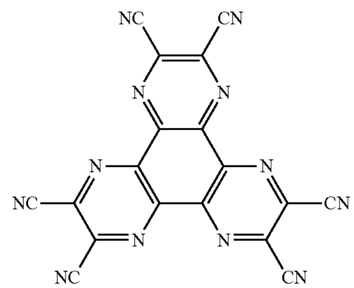

HAT-CN

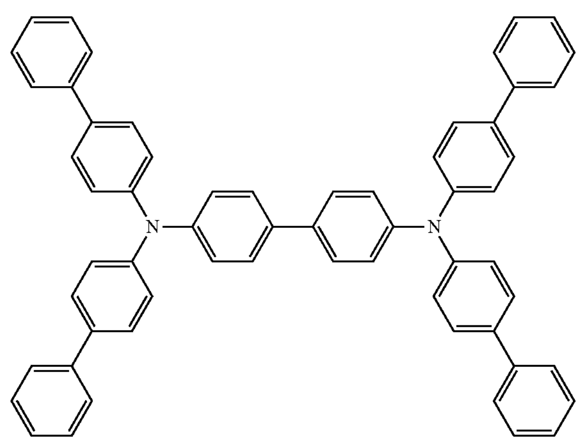

TBB

-continued

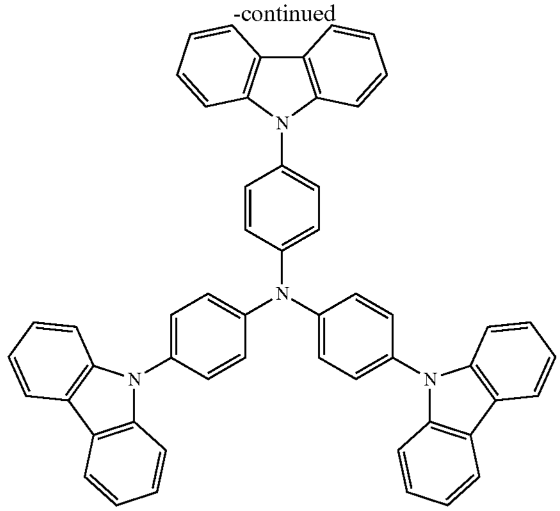

TcTa

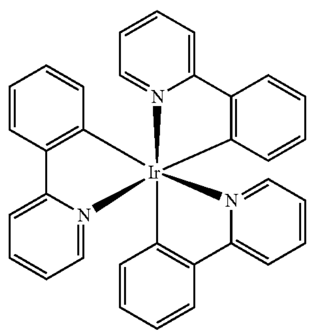

$Ir(PPy)_3$

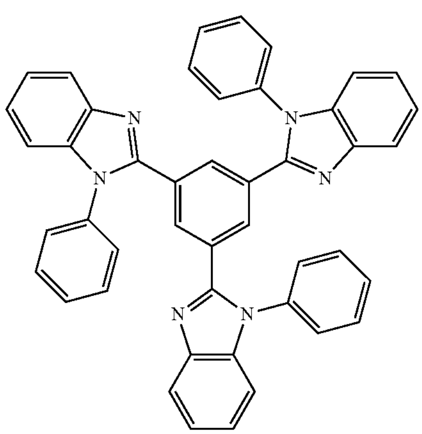

TPBi

Example 1

<Element in which Compound (1-1) is Used as Host Material for Light Emitting Layer>

A glass substrate (manufactured by Opto Science, Inc.) having a size of 26 mm×28 mm×0.7 mm, obtained by forming a film of ITO by sputtering and polishing the ITO film to 50 nm, was used as a transparent support substrate. This transparent support substrate was fixed to a substrate holder of a commercially available vapor deposition apparatus (manufactured by Choshu Industry). Tantalum vapor deposition crucibles each containing HAT-CN, TBB, TcTa, compound (1-1) of the present invention, $Ir(PPy)_3$, TPBi, or LiF, and an aluminum nitride vapor deposition crucible containing aluminum were attached thereto.

Layers as described below were formed sequentially on the ITO film of the transparent support substrate. A vacuum chamber was depressurized to $2.0\times10^{-4}$ Pa. First, HAT-CN was heated, and vapor deposition was performed so as to obtain a film thickness of 5 nm. Subsequently, TBB was heated, and vapor deposition was performed so as to obtain a film thickness of 65 nm. Furthermore, TcTa was heated, and vapor deposition was performed so as to obtain a film thickness of 10 nm. Thus, a hole injection layer and hole transport layers formed of three layers were formed. Subsequently, compound (1-1) of the present invention and $Ir(PPy)_3$ were simultaneously heated, and vapor deposition was performed so as to obtain a film thickness of 30 nm. Thus, a light emitting layer was formed. A vapor deposition rate was adjusted such that a weight ratio between compound (1-1) of the present invention and $Ir(PPy)_3$ was approximately 95:5. Subsequently, TPBi was heated, and vapor deposition was performed so as to obtain a film thickness of 50 nm. Thus, an electron transport layer was formed. A vapor deposition rate for each layer was 0.01 to 1 nm/sec.

Thereafter, LiF was heated, and vapor deposition was performed at a vapor deposition rate of 0.01 to 0.1 nm/sec so as to obtain a film thickness of 1 nm. Subsequently, aluminum was heated, and vapor deposition was performed so as to obtain a film thickness of 100 nm. Thus, a negative electrode was formed. At this time, vapor deposition was performed such that a vapor deposition rate was 0.1 nm to 2 nm/sec. Thus, a negative electrode was formed, and an organic electroluminescent element was obtained.

When a direct current voltage was applied to the ITO electrode as a positive electrode and the LiF/aluminum electrode as a negative electrode, green light emission having a peak top at about 510 nm was obtained. An external quantum efficiency at luminance of 1000 cd/m$^2$ was 4.0%.

Example 2

<Element Using Compound (1-241) as Host Material for Light Emitting Layer>

An organic EL element was obtained by a method in accordance with that in Example 1 except that compound (1-1) as a host material for a light emitting layer was replaced with compound (1-241). When a direct current voltage was applied to the two electrodes, green light emission having a peak top at about 514 nm was obtained. An external quantum efficiency at luminance of 1000 cd/m$^2$ was 8.3%.

Subsequently, organic EL elements according to Examples 3 and 4 and Comparative Examples 1 and 2 were manufactured, and an external quantum efficiency obtained when each of the organic EL elements was driven at a current density that could give luminance of 1000 cd/m$^2$, was measured. The following Table 4 indicates a material configuration of each of layers in the organic EL elements thus manufactured.

TABLE 4

| | Hole injection layer (5 nm) | Hole transport layer 1 | Hole transport layer 2 | Light emitting layer (30 nm) Host | Light emitting layer (30 nm) Dopant | Electron transport layer (50 nm) | Negative electrode (1 nm/100 nm) |
|---|---|---|---|---|---|---|---|
| Example 3 | HAT-CN | TBB (65 nm) | Compound (1-1) (10 nm) | DOBNA | $Ir(PPy)_3$ | TPBi | LiF/Al |
| Example 4 | HAT-CN | TBB (65 nm) | Compound (1-241) (10 nm) | DOBNA | $Ir(PPy)_3$ | TPBi | LiF/Al |
| Comparative Example 1 | HAT-CN | TBB (65 nm) | TcTa (10 nm) | DOBNA | $Ir(PPy)_3$ | TPBi | LiF/Al |
| Comparative Example 2 | HAT-CN | TBB (75 nm) | None | DOBNA | $Ir(PPy)_3$ | TPBi | LiF/Al |

In Table 4, "DOBNA" represents 6,8-biphenyl-5,9-dioxa-13b-boranaphtho[3,2,1-de]anthracene. A chemical structure thereof is illustrated below.

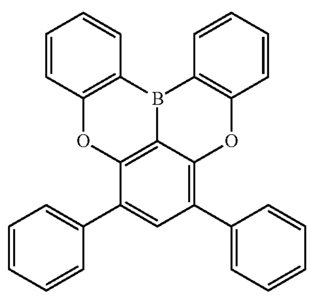

DOBNA

Example 3

<Element in which Compound (1-1) is Used for Hole Transport Layer 2>

A glass substrate (manufactured by Opto Science, Inc.) having a size of 26 mm×28 mm×0.7 mm, obtained by forming a film of ITO by sputtering and polishing the ITO film to 50 nm, was used as a transparent support substrate. This transparent support substrate was fixed to a substrate holder of a commercially available vapor deposition apparatus (manufactured by Choshu Industry). Tantalum vapor deposition crucibles each containing HAT-CN, TBB, compound (1-1) of the present invention, DOBNA, $Ir(PPy)_3$, TPBi, or LiF, and an aluminum nitride vapor deposition crucible containing aluminum were attached thereto Layers as described below were formed sequentially on the ITO film of the transparent support substrate. A vacuum chamber was depressurized to $2.0\times10^4$ Pa. First, HAT-CN was heated, and vapor deposition was performed so as to obtain a film thickness of 5 nm. Subsequently, TBB was heated, and vapor deposition was performed so as to obtain a film thickness of 65 nm. Furthermore, compound (1-1) of the present invention was heated, and vapor deposition was performed so as to obtain a film thickness of 10 nm. Thus, a hole injection layer and hole transport layers formed of three layers were formed. Subsequently, DOBNA and $Ir(PPy)_3$ were simultaneously heated, and vapor deposition was performed so as to obtain a film thickness of 30 nm. Thus, a light emitting layer was formed. A vapor deposition rate was adjusted such that a weight ratio between DOBNA and $Ir(PPy)_3$ was approximately 95:5. Subsequently, TPBi was heated, and vapor deposition was performed so as to obtain a film thickness of 50 nm. Thus, an electron transport layer was formed. A vapor deposition rate for each layer was 0.01 to 1 nm/sec.

Thereafter, LiF was heated, and vapor deposition was performed at a vapor deposition rate of 0.01 to 0.1 nm/sec so as to obtain a film thickness of 1 nm. Subsequently, aluminum was heated, and vapor deposition was performed so as to obtain a film thickness of 100 nm. Thus, a negative electrode was formed. At this time, vapor deposition was performed such that a vapor deposition rate was 0.1 nm to 2 nm/sec. Thus, a negative electrode was formed to obtain an organic electroluminescent element.

When a direct current voltage was applied to the ITO electrode as a positive electrode and the LiF/aluminum electrode as a negative electrode, green light emission having a peak top at about 514 nm was obtained. An external quantum efficiency at luminance of 1000 cd/$m^2$ was 18.0%.

Example 4

<Element Using Compound (1-241) as Hole Transport Layer 2>

An organic EL element was obtained by a method in accordance with that in Example 3 except that compound (1-1) as a material for the hole transport layer 2 was replaced with compound (1-241). When a direct current voltage was applied to the two electrodes, green light emission having a peak top at about 514 nm was obtained. An external quantum efficiency at luminance of 1000 cd/$m^2$ was 20.2%.

Comparative Example 1

<Element Using TcTa as Hole Transport Layer 2>

An organic EL element was obtained by a method in accordance with that in Example 3 except that compound (1-1) as a material for the hole transport layer 2 was replaced with TcTa. When a direct current voltage was applied to the two electrodes, green light emission having a peak top at about 514 nm was obtained. An external quantum efficiency at luminance of 1000 cd/$m^2$ was 19.0%.

Comparative Example 2

<Element not Using Hole Transport Layer 2>

An organic EL element was obtained by a method in accordance with that in Example 3 except that the film thickness of the hole transport layer 1 was changed from 65 nm to 75 nm and the hole transport layer 2 was not vapor-deposited (changed from 10 nm to 0 nm). When a direct current voltage was applied to the two electrodes, green light emission having a peak top at about 514 nm was obtained. An external quantum efficiency at luminance of 1000 cd/m$^2$ was 11.8%.

Subsequently, organic EL elements according to Example 5 and 6 were manufactured, and the external quantum efficiency obtained when each of the organic EL elements was driven at a current density that could give luminance of 100 cd/m$^2$, was measured. The following Table 5 indicates a material configuration of each of layers in the organic EL elements thus manufactured.

TABLE 5

| | Hole injection layer (5 nm) | Hole transport layer 1 (65 nm) | Hole transport layer 2 (10 nm) | Light emitting layer (30 nm) | | Electron transport layer (50 nm) | Negative electrode (1 nm/100 nm) |
|---|---|---|---|---|---|---|---|
| | | | | Host | Dopant | | |
| Example 5 | HAT-CN | TBB | TcTa | Compound (1-1) | Firpic | TPB1 | LiF/Al |
| Example 6 | HAT-CN | TBB | TcTa | Compound (1-241) | Firpic | TPB1 | LiF/Al |

Example 5

<Element in which Compound (1-1) is Used as Host Material for Light Emitting Layer>

A glass substrate (manufactured by Opto Science, Inc.) having a size of 26 mm×28 mm×0.7 mm, obtained by forming a film of ITO by sputtering and polishing the ITO film to 50 nm, was used as a transparent support substrate. This transparent support substrate was fixed to a substrate holder of a commercially available vapor deposition apparatus (manufactured by Choshu Industry). Tantalum vapor deposition crucibles each containing HAT-CN, TBB, TcTa, compound (1-1) of the present invention, Firpic, TPBi, or LiF, and an aluminum nitride vapor deposition crucible containing aluminum were attached thereto Layers as described below were formed sequentially on the ITO film of the transparent support substrate. A vacuum chamber was depressurized to $2.0\times10^{-4}$ Pa. First, HAT-CN was heated, and vapor deposition was performed so as to obtain a film thickness of 5 nm. Subsequently, TBB was heated, and vapor deposition was performed so as to obtain a film thickness of 65 nm. Furthermore, TcTa was heated, and vapor deposition was performed so as to obtain a film thickness of 10 nm. Thus, a hole injection layer and hole transport layers formed of three layers were formed. Subsequently, compound (1-1) of the present invention and Firpic were simultaneously heated, and vapor deposition was performed so as to obtain a film thickness of 30 nm. Thus, a light emitting layer was formed. A vapor deposition rate was adjusted such that a weight ratio between compound (1-1) of the present invention and Firpic was approximately 95:5. Subsequently, TPBi was heated, and vapor deposition was performed so as to obtain a film thickness of 50 nm. Thus, an electron transport layer was formed. A vapor deposition rate for each layer was 0.01 to 1 nm/sec.

Thereafter, LiF was heated, and vapor deposition was performed at a vapor deposition rate of 0.01 to 0.1 nm/sec so as to obtain a film thickness of 1 nm. Subsequently, aluminum was heated, and vapor deposition was performed so as to obtain a film thickness of 100 nm. Thus, a negative electrode was formed. At this time, vapor deposition was performed such that a vapor deposition rate was 0.1 nm to 2 nm/sec. Thus, a negative electrode was formed, and an organic electroluminescent element was obtained.

When a direct current voltage was applied to the ITO electrode as a positive electrode and the LiF/aluminum electrode as a negative electrode, blue light emission having a peak top at about 472 nm was obtained. An external quantum efficiency at luminance of 100 cd/m$^2$ was 7.8%.

Example 6

<Element Using Compound (1-241) as Host Material for Light Emitting Layer>

An organic EL element was obtained by a method in accordance with that in Example 5 except that compound (1-1) as a material for the host material for light emitting layer was replaced with compound (1-241). When a direct current voltage was applied to the two electrodes, blue light emission having a peak top at about 471 nm was obtained. An external quantum efficiency at luminance of 100 cd/m$^2$ was 17.3%.

In the present invention, by providing a novel polycyclic aromatic compound, it is possible to increase options of a material for an organic EL element. Furthermore, by using a novel polycyclic aromatic compound as a material for an organic electroluminescent element, it is possible to provide an excellent organic EL element, a display apparatus including the organic EL element, a lighting apparatus including the organic EL element, and the like.

100: an organic electroluminescent element

101: a substrate

102: a positive electrode

103: a hole injection layer

104: a hole transport layer

105: a light emitting layer

106: an electron transport layer

107: an electron injection layer

108: a negative electrode

The invention claimed is:

1. A polycyclic aromatic compound represented by the following general formula (1) or a dimer of a polycyclic aromatic compound, comprising two structures each represented by the following general formula (1),

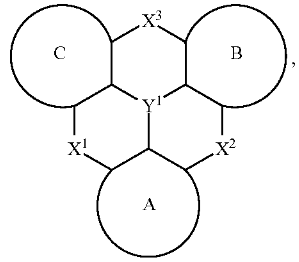

(1)

in the above formula (1), ring A, ring B, and ring C each independently represent an aryl ring or a heteroaryl ring, and at least one hydrogen atom in these rings may be substituted, $Y^1$ represents B, P═S, P(—R)$_2$, Al, Ga, Si—R, Ge—R, Sn—R, Sb═S, Sb(—R)$_2$, Sb to which orthochloranil is bonded, Bi, Bi═O, Bi═S, Bi(—R)$_2$, or Bi to which orthochloranil is bonded, R of the moieties P(—R)$_2$, Si—R, Ge—R, Sn—R, Sb(—R)$_2$, and Bi(—R)$_2$ represents an aryl, an alkyl, an alkoxy, an aryloxy, or a halogen atom, and two Rs among the moieties P(—R)$_2$, Sb(—R)$_2$ and Bi(—R)$_2$ may be bonded to each other via a single bond or by fusing to form a ring, $X^1$, $X^2$, and $X^3$ each independently represent O, N—R, S, or Se, R of the moiety N—R represents an aryl which may be substituted, a heteroaryl which may be substituted, an alkyl, or a cycloalkyl, at least one of $X^1$, $X^2$, and $X^3$ represents N—R, and R of the moiety N—R may be bonded to the ring A, ring B, and/or ring C via a linking group or a single bond or by fusing, at least one hydrogen atom in the polycyclic aromatic compound or structure represented by formula (1) may be substituted by cyano, a halogen atom, or a deuterium atom, and the polycyclic aromatic compound represented by formula (1) has at least one halogen as a substituent.

2. The polycyclic aromatic compound described in claim 1 or a dimer thereof, in which the ring A, ring B, and ring C each independently represent an aryl ring or a heteroaryl ring, at least one hydrogen atom in the ring A, ring B, and ring C may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine oxide, or a substituted or unsubstituted diarylphosphine sulfide, the ring A, ring B, and ring C each have a 5-membered or a 6-membered ring sharing a bond with a fused tricyclic structure at the center of the above formula (1) constituted by Y', $X^2$, and $X^3$, $Y^1$ represents B, P═S, P(—R)$_2$, Al, Ga, Si—R, Ge—R, Sn—R, Sb═S, Sb(—R)$_2$, Sb to which orthochloranil is bonded, Bi, Bi═O, Bi═S, Bi(—R)$_2$, or Bi to which orthochloranil is bonded, R of the moieties P(—R)$_2$, Si—R, Ge—R, Sn—R, Sb(—R)$_2$, and Bi(—R)$_2$ represents an aryl, an alkyl, an alkoxy, an aryloxy, or a halogen atom, and two Rs among the moieties P(—R)$_2$, Sb(—R)$_2$ and Bi(—R)$_2$ may be bonded to each other via a single bond or by fusing to form a ring, $X^1$, $X^2$, and $X^3$ each independently represent O, N—R, S, or Se, R of the moiety N—R represents an aryl which may be substituted by an alkyl, a heteroaryl which may be substituted by an alkyl, an alkyl, or a cycloalkyl, at least one of $X^1$, $X^2$, and $X^3$ represents N—R, R of the moiety N—R may be bonded to the ring A, ring B, and/or ring C via —O—, —S—, >N—R, an arylene having 6 to 30 carbon atoms, or a single bond, or by fusing, R of the moiety —C(—R)$_2$-represents a hydrogen atom, an alkyl, or an aryl, and R of the moiety>N—R represents an alkyl or an aryl which may be substituted by an alkyl, at least one hydrogen atom in the polycyclic aromatic compound or structure represented by formula (1) may be substituted by cyano, a halogen atom, or a deuterium atom, and the polycyclic aromatic compound represented by formula (1) has at least one halogen as a substituent.

3. The polycyclic aromatic compound described in claim 1 or a dimer thereof, wherein the general formula (1) is represented by the following general formula (2)

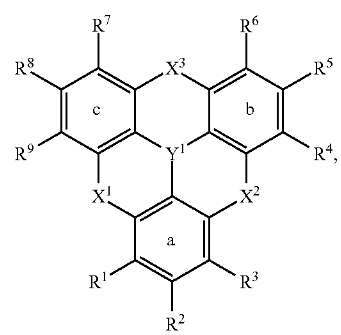

(2)

in the above formula (2), $R^1$ to $R^9$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these may be substituted by an aryl, a heteroaryl, or an alkyl, adjacent groups among $R^1$ to $R^9$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these substituents may be substituted by an aryl, a heteroaryl, or an alkyl, $Y^1$ represents B, P═S, P(—R)$_2$, Al, Ga, Si—R, Ge—R, Sn—R, Sb═S, Sb(—R)$_2$, Sb to which orthochloranil is bonded, Bi, Bi═O, Bi═S, Bi(—R)$_2$, or Bi to which orthochloranil is bonded, R of the moieties P(—R)$_2$, Si—R, Ge—R, Sn—R, Sb(—R)$_2$, and Bi(—R)$_2$ represents an aryl having 6 to 12 carbon atoms, an alkyl having 1 to 6 carbon atoms, an alkoxy having 1 to 6 carbon atoms, an aryloxy having 6 to 12 carbon atoms, or a halogen atom, and two Rs among the moieties $P(—R)_2$, $Sb(—R)_2$ and $Bi(—R)_2$ may be bonded to each other via a single bond or by fusing to form a ring, $X^1$, $X^2$, and $X^3$ each independently represent O, N—R, S, or Se, R of the moiety N—R represents an aryl having 6 to 12 carbon atoms, a heteroaryl having 2 to 15 carbon atoms, an alkyl having 1 to 6 carbon atoms, or a cycloalkyl having 3 to 6 carbon atoms, at least two of $X^1$, $X^2$, and $X^3$ represent N—R, R of the moiety N—R may be bonded to the ring a, ring b, or ring c via —O—, —S—, $—C(—R)_2—$, >N—R, an arylene having 6 to 12 carbon atoms, or a single bond, or by fusing, R of the moiety $—C(—R)_2—$ represents an alkyl having 1 to 6 carbon atoms or an aryl having 6 to 12 carbon atoms, and R of the moiety>N—R represents an alkyl having 1 to 6 carbon atoms or an aryl having 6 to 12 carbon atoms which may be substituted by an alkyl having 1 to 6 carbon atoms, at least one hydrogen atom in the polycyclic aromatic compound or structure represented by formula (2) may be substituted by cyano, a halogen atom, or a deuterium atom, and the polycyclic aromatic compound represented by formula (2) has at least one halogen as a substituent.

4. The polycyclic aromatic compound described in claim 3 or a dimer thereof, in which $R^1$ to $R^9$ each independently represent a hydrogen atom, an aryl having 6 to 30 carbon atoms, a heteroaryl having 2 to 30 carbon atoms, or a diarylamino (the aryl is an aryl having 6 to 12 carbon atoms), adjacent groups among $R^1$ to $R^9$ may be bonded to each other to form an aryl ring having 9 to 16 carbon atoms or a heteroaryl ring having 6 to 15 carbon atoms together with the ring a, ring b, or ring c, and at least one hydrogen atom in the ring thus formed may be substituted by an aryl having 6 to 10 carbon atoms, $Y^1$ represents B, P═S, Si—R, Sb═S, Sb to which orthochloranil is bonded, Bi, Bi═O, Bi═S, or Bi to which orthochloranil is bonded, R of the moiety Si—R represents an aryl having 6 to 10 carbon atoms or an alkyl having 1 to 4 carbon atoms, $X^1$, $X^2$, and $X^3$ each independently represent O, N—R, or S, R of the moiety N—R represents an aryl having 6 to 10 carbon atoms or an alkyl having 1 to 4 carbon atoms, and at least two of $X^1$, $X^2$, and $X^3$ represent N—R, at least one hydrogen atom in the polycyclic aromatic compound or structure represented by formula (2) may be substituted by cyano, a halogen atom, or a deuterium atom, and the polycyclic aromatic compound represented by formula (2) has at least one halogen as a substituent(s).

5. The polycyclic aromatic compound described in claim 1 or a dimer thereof, in which the halogen atom is a fluorine atom.

6. The polycyclic aromatic compound described in claim 1, represented by the following chemical structural formula (1-1341)

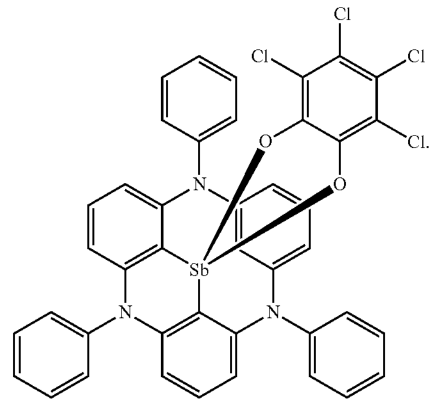

7. A material for an organic device, comprising the polycyclic aromatic compound described in claim 1 or a dimer thereof.

8. The material for an organic device described in claim 7, in which the material for an organic device is a material for an organic electroluminescent element, a material for an organic field effect transistor, or a material for an organic thin film solar cell.

9. The material for an organic electroluminescent element described in claim 8, in which the material for an organic electroluminescent element is a material for a light emitting layer.

10. The material for an organic electroluminescent element described in claim 8, in which the material for an organic electroluminescent element is a material for an electron injection layer or a material for an electron transport layer.

11. The material for an organic electroluminescent element described in claim 8, in which the material for an organic electroluminescent element is a material for a hole injection layer or a material for a hole transport layer.

12. An organic electroluminescent element, comprising: a pair of electrodes composed of a positive electrode and a negative electrode; and a light emitting layer disposed between the pair of electrodes and containing the material for a light emitting layer described in claim 9.

13. An organic electroluminescent element, comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer described in claim 10.

14. An organic electroluminescent element, comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer described in claim 11.

15. The organic electroluminescent element described in claim 12, further comprising an electron transport layer and/or an electron injection layer disposed between the negative electrode and the light emitting layer, in which at least one of the electron transport layer and the electron injection layer contains at least one selected from the group consisting of a quinolinol-based metal complex, a pyridine derivative, a phenanthroline derivative, a borane derivative, and a benzimidazole derivative.

16. The organic electroluminescent element described in claim 15, in which the electron transport layer and/or the electron injection layer further comprise/comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

17. A display apparatus comprising the organic electroluminescent element described in claim 12.

18. A lighting apparatus comprising the organic electroluminescent element described in claim 12.

* * * * *